US007118988B2

(12) United States Patent
Buerger, Jr. et al.

(10) Patent No.: US 7,118,988 B2
(45) Date of Patent: Oct. 10, 2006

(54) VERTICALLY WIRED INTEGRATED CIRCUIT AND METHOD OF FABRICATION

(76) Inventors: Walter Richard Buerger, Jr., 20769 Mesarica Rd., Covina, CA (US) 91724; Jakob Hans Hohl, 10249 E. Placita Cresta Feliz, Tuscon, AZ (US) 85749; Mary Lundgren Long, 14416 S. Canyon Dr., Pheonix, AZ (US) 85048; Kent Ridgeway, 8617 W. Cavalier Dr., Glendale, AZ (US) 85305

( * ) Notice: Subject to any disclaimer, the term of this patent is extended or adjusted under 35 U.S.C. 154(b) by 0 days.

(21) Appl. No.: 10/424,022

(22) Filed: Apr. 25, 2003

(65) Prior Publication Data

US 2005/0079721 A1 Apr. 14, 2005

Related U.S. Application Data

(63) Continuation-in-part of application No. 10/223,446, filed on Aug. 19, 2002, now abandoned, which is a continuation-in-part of application No. 10/035,871, filed on Dec. 26, 2001, now abandoned, which is a continuation-in-part of application No. 09/821,957, filed on Mar. 30, 2001, now abandoned, which is a continuation-in-part of application No. 09/223,493, filed on Dec. 30, 1998, now abandoned, which is a continuation-in-part of application No. 08/639,887, filed on Apr. 26, 1996, now abandoned, which is a continuation-in-part of application No. 08/453,834, filed on May 30, 1995, now abandoned, which is a continuation-in-part of application No. 08/290,489, filed on Aug. 15, 1994, now abandoned.

(51) Int. Cl.
*H01L 21/76* (2006.01)

(52) U.S. Cl. .................. 438/437; 438/435; 257/E21.54

(58) Field of Classification Search .......... 257/E21.54; 438/400, 424, 435, 437
See application file for complete search history.

(56) References Cited

U.S. PATENT DOCUMENTS

| | | | | |
|---|---|---|---|---|
| 4,876,223 A * | 10/1989 | Yoda et al. | ................. | 438/643 |
| 5,013,680 A | 5/1991 | Lowrey et al. | | |
| 5,266,526 A * | 11/1993 | Aoyama et al. | ............ | 438/642 |
| 5,328,810 A | 7/1994 | Lowrey et al. | | |

* cited by examiner

*Primary Examiner*—Bradley K. Smith

(57) ABSTRACT

A static random access memory (SRAM) cell structure is created in a three-dimensional format as a vertical stack of wired transistors. These transistors are fabricated from crystalline silicon, and supplemental wiring structure features are fabricated to comprise a circuit along the walls of a vertical pillar. The three-dimensional cell integrated circuit can be created by a single mask step. Various structural features and methods of fabrication are described in detail. Peripheral interface, a two pillar version and other supplemental techniques are also described.

2 Claims, 382 Drawing Sheets

PER54B

PISTON-SLEEVE PROCESS SCHEMATIC

PS.1

PISTON-SLEEVE PROCESS SCHEMATIC

PS.2

PISTON-SLEEVE PROCESS SCHEMATIC

PS.3

PISTON-SLEEVE PROCESS SCHEMATIC

PS.4

PISTON-SLEEVE PROCESS SCHEMATIC

PS.5

PISTON-SLEEVE PROCESS SCHEMATIC

PS.6

PISTON-SLEEVE PROCESS SCHEMATIC

PS.7

PISTON-SLEEVE PROCESS SCHEMATIC

PS.8

PISTON-SLEEVE
PROCESS SCHEMATIC

PS.9

C TRENCH
PROCESS SCHEMATIC

LB4.1C

B - TRENCH - A
PROCESS SCHEMATIC

LB4.1BA

C TRENCH
PROCESS SCHEMATIC

LB4.2C

B - TRENCH - A
PROCESS SCHEMATIC

LB4.2BA

C TRENCH PROCESS SCHEMATIC

LB4.3C

B - TRENCH - A PROCESS SCHEMATIC

LB4.3BA

C TRENCH PROCESS SCHEMATIC

LB4.4C

B - TRENCH - A PROCESS SCHEMATIC

LB4.4BA

C TRENCH
PROCESS SCHEMATIC

LB4.7C

B - TRENCH - A
PROCESS SCHEMATIC

LB4.7BA

C TRENCH
PROCESS SCHEMATIC

LB4.8C

B - TRENCH - A
PROCESS SCHEMATIC

LB4.8BA

C TRENCH
PROCESS SCHEMATIC

LB4.9C

B - TRENCH - A
PROCESS SCHEMATIC

LB4.9BA

C TRENCH
PROCESS SCHEMATIC

LB4.10C

B - TRENCH - A
PROCESS SCHEMATIC

LB4.10BA

B - TRENCH - A
PROCESS SCHEMATIC

LB4.12BA

C TRENCH
PROCESS SCHEMATIC

LB4.12C

B - TRENCH - A
PROCESS SCHEMATIC

LB4.11BA

C TRENCH
PROCESS SCHEMATIC

LB4.11C

C TRENCH
PROCESS SCHEMATIC

LB4.13C

B - TRENCH - A
PROCESS SCHEMATIC

LB4.13BA

C TRENCH
PROCESS SCHEMATIC

LB4.14C

B - TRENCH - A
PROCESS SCHEMATIC

LB4.14BA

C TRENCH
PROCESS SCHEMATIC

LB4.15C

B - TRENCH - A
PROCESS SCHEMATIC

LB4.15BA

C TRENCH
PROCESS SCHEMATIC

LB4.16C

B - TRENCH - A
PROCESS SCHEMATIC

LB4.16BA

C TRENCH
PROCESS SCHEMATIC

LBB.1

C TRENCH
PROCESS SCHEMATIC

LBB.2

C TRENCH
PROCESS SCHEMATIC

LBB.3

C TRENCH
PROCESS SCHEMATIC

LBB.4

C TRENCH
PROCESS SCHEMATIC
LBB.5

C TRENCH
PROCESS SCHEMATIC
LBB.6

C TRENCH
PROCESS SCHEMATIC
LBB.7

C TRENCH
PROCESS SCHEMATIC
LBB.8

C TRENCH
PROCESS SCHEMATIC

LB9.1

C TRENCH
PROCESS SCHEMATIC

LB9.2

C TRENCH PROCESS SCHEMATIC

LB10.1

C TRENCH PROCESS SCHEMATIC

LB10.2

C TRENCH PROCESS SCHEMATIC

LB10.3

C TRENCH PROCESS SCHEMATIC

LB10.4

C TRENCH PROCESS SCHEMATIC

LB10.6

C TRENCH PROCESS SCHEMATIC

LB10.5

B TRENCH PROCESS SCHEMATIC

LV5.5

B TRENCH PROCESS SCHEMATIC

LV5.6

B TRENCH PROCESS SCHEMATIC

LV5.7

B TRENCH PROCESS SCHEMATIC

LV5.8

B TRENCH
PROCESS SCHEMATIC

LV6.1

B TRENCH
PROCESS SCHEMATIC

LV6.2

B TRENCH
PROCESS SCHEMATIC

LV6.3

B TRENCH
PROCESS SCHEMATIC

LV6.4

B TRENCH
PROCESS SCHEMATIC

LV6.5

B TRENCH
PROCESS SCHEMATIC

LV6.6

C TRENCH
PROCESS SCHEMATIC

LV7.1C

B - TRENCH - A
PROCESS SCHEMATIC

LV7.1BA

C TRENCH
PROCESS SCHEMATIC

LV7.2C

B - TRENCH - A
PROCESS SCHEMATIC

LV7.2BA

C TRENCH
PROCESS SCHEMATIC

LV7.3C

B - TRENCH - A
PROCESS SCHEMATIC

LV7.3A

C TRENCH
PROCESS SCHEMATIC

LV7.4C

B - TRENCH - A
PROCESS SCHEMATIC

LV7.4A

C TRENCH
PROCESS SCHEMATIC

LV7.5C

B - TRENCH - A
PROCESS SCHEMATIC

LV7.5BA

C TRENCH
PROCESS SCHEMATIC

LV7.6C

B - TRENCH - A
PROCESS SCHEMATIC

LV7.6BA

C TRENCH
PROCESS SCHEMATIC

LVB.1C

B - TRENCH - A
PROCESS SCHEMATIC

LVB.1BA

C TRENCH
PROCESS SCHEMATIC

LVB.2C

B - TRENCH - A
PROCESS SCHEMATIC

LVB.2BA

C TRENCH
PROCESS SCHEMATIC

LV9.1

C TRENCH
PROCESS SCHEMATIC

LV9.2

C TRENCH
PROCESS SCHEMATIC

LV9.3

C TRENCH
PROCESS SCHEMATIC

LV9.4

C TRENCH
PROCESS SCHEMATIC

LV10.1C

B - TRENCH - A
PROCESS SCHEMATIC

LV10.1BA

C TRENCH
PROCESS SCHEMATIC

LV10.2C

B - TRENCH - A
PROCESS SCHEMATIC

LV10.2BA

C TRENCH
PROCESS SCHEMATIC
LV10.3C

B - TRENCH - A
PROCESS SCHEMATIC
LV10.3BA

C TRENCH
PROCESS SCHEMATIC
LV10.4C

B - TRENCH - A
PROCESS SCHEMATIC
LV10.4BA

B TRENCH
PROCESS SCHEMATIC

B8

B TRENCH
PROCESS SCHEMATIC

B7

B TRENCH
PROCESS SCHEMATIC

B6

B TRENCH
PROCESS SCHEMATIC

B5

B TRENCH
PROCESS SCHEMATIC

B16

B TRENCH
PROCESS SCHEMATIC

B15

B TRENCH
PROCESS SCHEMATIC

B14

B TRENCH
PROCESS SCHEMATIC

B13

B TRENCH
PROCESS SCHEMATIC

B17

B TRENCH
PROCESS SCHEMATIC

B18

B TRENCH
PROCESS SCHEMATIC

B19

B TRENCH
PROCESS SCHEMATIC

B20

B TRENCH
PROCESS SCHEMATIC

B21

B TRENCH
PROCESS SCHEMATIC

B22

B TRENCH
PROCESS SCHEMATIC

B23

B TRENCH
PROCESS SCHEMATIC

B24

B TRENCH
PROCESS SCHEMATIC

B25

B TRENCH
PROCESS SCHEMATIC

B26

B TRENCH
PROCESS SCHEMATIC

B27

B TRENCH
PROCESS SCHEMATIC

B28

B TRENCH
PROCESS SCHEMATIC

B29

B TRENCH
PROCESS SCHEMATIC

B30

B TRENCH
PROCESS SCHEMATIC

B31

B TRENCH
PROCESS SCHEMATIC

B32

B TRENCH
PROCESS SCHEMATIC

B37

B TRENCH
PROCESS SCHEMATIC

B38

B TRENCH
PROCESS SCHEMATIC

B39

B TRENCH
PROCESS SCHEMATIC

B40

B TRENCH PROCESS SCHEMATIC

BT1.1

B TRENCH PROCESS SCHEMATIC

BT1.2

B TRENCH PROCESS SCHEMATIC

BT1.3

B TRENCH PROCESS SCHEMATIC

BT1.4

C TRENCH
PROCESS SCHEMATIC

BT2.1C

B - TRENCH - A
PROCESS SCHEMATIC

BT2.1BA

C TRENCH
PROCESS SCHEMATIC

BT2.2C

B - TRENCH - A
PROCESS SCHEMATIC

BT2.2BA

C TRENCH
PROCESS SCHEMATIC

T2.1C

B - TRENCH - A
PROCESS SCHEMATIC

T2.1BA

C TRENCH
PROCESS SCHEMATIC

T2.2C

B - TRENCH - A
PROCESS SCHEMATIC

T2.2BA

C TRENCH PROCESS SCHEMATIC

T2.3C

B - TRENCH - A PROCESS SCHEMATIC

T2.3BA

C TRENCH PROCESS SCHEMATIC

T2.4C

B - TRENCH - A PROCESS SCHEMATIC

T2.4BA

B - TRENCH - A
PROCESS SCHEMATIC

T2.5BA

C TRENCH
PROCESS SCHEMATIC

T2.5C

A TRENCH
PROCESS SCHEMATIC
A4

A TRENCH
PROCESS SCHEMATIC
A3

A TRENCH
PROCESS SCHEMATIC
A2

A TRENCH
PROCESS SCHEMATIC
A1

A TRENCH PROCESS SCHEMATIC

A TRENCH PROCESS SCHEMATIC

A9

A TRENCH PROCESS SCHEMATIC

A10

A TRENCH PROCESS SCHEMATIC

A11

A TRENCH PROCESS SCHEMATIC

A12

A TRENCH
PROCESS SCHEMATIC

A13

A TRENCH
PROCESS SCHEMATIC

A14

A TRENCH
PROCESS SCHEMATIC

A15

A TRENCH
PROCESS SCHEMATIC

A16

A TRENCH
PROCESS SCHEMATIC

A17

A TRENCH
PROCESS SCHEMATIC

A18

A TRENCH
PROCESS SCHEMATIC

A21

A TRENCH
PROCESS SCHEMATIC

A22

A TRENCH
PROCESS SCHEMATIC

A23

A TRENCH
PROCESS SCHEMATIC

A24

A TRENCH
PROCESS SCHEMATIC

A25

A TRENCH
PROCESS SCHEMATIC

A26

A TRENCH
PROCESS SCHEMATIC

A28

A TRENCH
PROCESS SCHEMATIC

A29

A TRENCH
PROCESS SCHEMATIC

A30

A TRENCH
PROCESS SCHEMATIC

A31

A TRENCH
PROCESS SCHEMATIC

A32

A TRENCH
PROCESS SCHEMATIC

A33

A TRENCH
PROCESS SCHEMATIC

A34

A TRENCH
PROCESS SCHEMATIC

A35

A TRENCH
PROCESS SCHEMATIC

A36

A TRENCH
PROCESS SCHEMATIC

A37

A TRENCH
PROCESS SCHEMATIC

A38

A TRENCH
PROCESS SCHEMATIC

A39

A TRENCH
PROCESS SCHEMATIC

A40

A TRENCH
PROCESS SCHEMATIC

A41

A TRENCH
PROCESS SCHEMATIC

A42

C TRENCH
PROCESS SCHEMATIC

AT2.1C

B - TRENCH - A
PROCESS SCHEMATIC

AT2.1BA

C TRENCH
PROCESS SCHEMATIC

AT2.2C

B - TRENCH - A
PROCESS SCHEMATIC

AT2.2BA

C TRENCH
PROCESS SCHEMATIC

T3.1C

B - TRENCH - A
PROCESS SCHEMATIC

T3.1BA

C TRENCH
PROCESS SCHEMATIC

T3.2C

B - TRENCH - A
PROCESS SCHEMATIC

T3.2BA

C TRENCH
PROCESS SCHEMATIC

T3.3C

B - TRENCH - A
PROCESS SCHEMATIC

T3.3BA

C TRENCH
PROCESS SCHEMATIC

CS5.1C

B - TRENCH - A
PROCESS SCHEMATIC

CS5.1BA

C TRENCH
PROCESS SCHEMATIC

CS5.2C

B - TRENCH - A
PROCESS SCHEMATIC

CS5.2BA

C TRENCH
PROCESS SCHEMATIC
CSS.3C

B - TRENCH - A
PROCESS SCHEMATIC
CSS.3BA

C TRENCH
PROCESS SCHEMATIC
CSS.4C

B - TRENCH - A
PROCESS SCHEMATIC
CSS.4BA

C TRENCH
PROCESS SCHEMATIC

CS5.5C

B - TRENCH - A
PROCESS SCHEMATIC

CS5.5BA

C TRENCH
PROCESS SCHEMATIC

CS5.6C

B - TRENCH - A
PROCESS SCHEMATIC

CS5.6BA

C TRENCH
PROCESS SCHEMATIC

CSS.7C

B - TRENCH - A
PROCESS SCHEMATIC

CSS.7BA

C TRENCH
PROCESS SCHEMATIC

CSS.8C

B - TRENCH - A
PROCESS SCHEMATIC

CSS.8BA

C TRENCH PROCESS SCHEMATIC

C1.4

C TRENCH PROCESS SCHEMATIC

C1.3

C TRENCH PROCESS SCHEMATIC

C1.2

C TRENCH PROCESS SCHEMATIC

C1.1

C TRENCH PROCESS SCHEMATIC

C1.5

C TRENCH PROCESS SCHEMATIC

C1.6

C TRENCH PROCESS SCHEMATIC

C1.7

C TRENCH PROCESS SCHEMATIC

C1.8

C TRENCH PROCESS SCHEMATIC

C1.12

C TRENCH PROCESS SCHEMATIC

C1.11

C TRENCH PROCESS SCHEMATIC

C1.10

C TRENCH PROCESS SCHEMATIC

C1.9

C TRENCH PROCESS SCHEMATIC

C1.16

C TRENCH PROCESS SCHEMATIC

C1.15

C TRENCH PROCESS SCHEMATIC

C1.14

C TRENCH PROCESS SCHEMATIC

C1.13

C TRENCH
PROCESS SCHEMATIC

C1.17

C TRENCH
PROCESS SCHEMATIC

C1.18

C TRENCH
PROCESS SCHEMATIC

C1.19

C TRENCH
PROCESS SCHEMATIC

C1.20

C TRENCH
PROCESS SCHEMATIC

C1.21

C TRENCH
PROCESS SCHEMATIC

C1.22

C TRENCH
PROCESS SCHEMATIC

C2.1C

B - TRENCH - A
PROCESS SCHEMATIC

C2.1BA

C TRENCH
PROCESS SCHEMATIC

C2.2C

B - TRENCH - A
PROCESS SCHEMATIC

C2.2BA

C TRENCH
PROCESS SCHEMATIC

C2.3C

B - TRENCH - A
PROCESS SCHEMATIC

C2.3BA

C TRENCH
PROCESS SCHEMATIC

C2.4C

B - TRENCH - A
PROCESS SCHEMATIC

C2.4BA

C TRENCH
PROCESS SCHEMATIC

C3.1C

B - TRENCH - A
PROCESS SCHEMATIC

C3.1BA

C TRENCH
PROCESS SCHEMATIC

C3.2C

B - TRENCH - A
PROCESS SCHEMATIC

C3.2BA

C TRENCH
PROCESS SCHEMATIC

C3.3C

B - TRENCH - A
PROCESS SCHEMATIC

C3.3BA

C TRENCH
PROCESS SCHEMATIC

C3.4C

B - TRENCH - A
PROCESS SCHEMATIC

C3.4BA

C TRENCH
PROCESS SCHEMATIC

C3.5C

B - TRENCH - A
PROCESS SCHEMATIC

C3.5BA

C TRENCH
PROCESS SCHEMATIC

T4.3C

B - TRENCH - A
PROCESS SCHEMATIC

T4.3BA

C TRENCH
PROCESS SCHEMATIC

T4.4C

B - TRENCH - A
PROCESS SCHEMATIC

T4.4BA

C TRENCH
PROCESS SCHEMATIC

T4.5C

B - TRENCH - A
PROCESS SCHEMATIC

T4.5BA

UN2.1H PROCESS SCHEMATIC

UN2.1C PROCESS SCHEMATIC

UN2.1BA PROCESS SCHEMATIC

UN2.2H
PROCESS
SCHEMATIC

UN2.2C
PROCESS
SCHEMATIC

UN2.2BA
PROCESS
SCHEMATIC

UV2.3H
PROCESS
SCHEMATIC

UV2.3C
PROCESS
SCHEMATIC

UV2.3BA
PROCESS
SCHEMATIC

UV2.4H PROCESS SCHEMATIC

UV2.4C PROCESS SCHEMATIC

UV2.4BA PROCESS SCHEMATIC

UN2.5H PROCESS SCHEMATIC

UN2.5C PROCESS SCHEMATIC

UN2.5BA PROCESS SCHEMATIC

UV2.6H PROCESS SCHEMATIC

UV2.6C PROCESS SCHEMATIC

UV2.6BA PROCESS SCHEMATIC

UN2.7H PROCESS SCHEMATIC

UN2.7C PROCESS SCHEMATIC

UN2.7BA PROCESS SCHEMATIC

UN2.8H PROCESS SCHEMATIC

UN2.8C PROCESS SCHEMATIC

UN2.8BA PROCESS SCHEMATIC

UN2.9H
PROCESS
SCHEMATIC

UN2.9C
PROCESS
SCHEMATIC

UN2.9BA
PROCESS
SCHEMATIC

UN2.10H
PROCESS
SCHEMATIC

UN2.10C
PROCESS
SCHEMATIC

UN2.10BA
PROCESS
SCHEMATIC

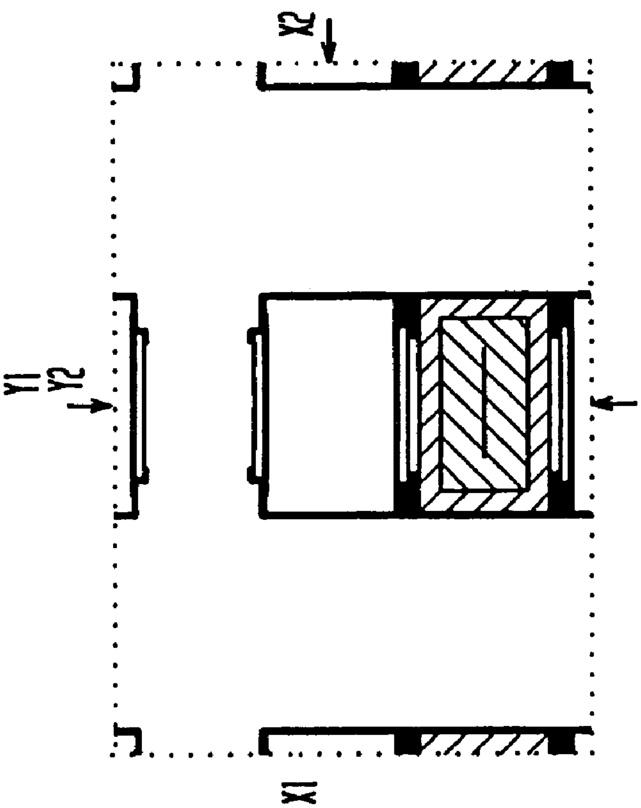
FIG. 422 UN2.11H PROCESS SCHEMATIC
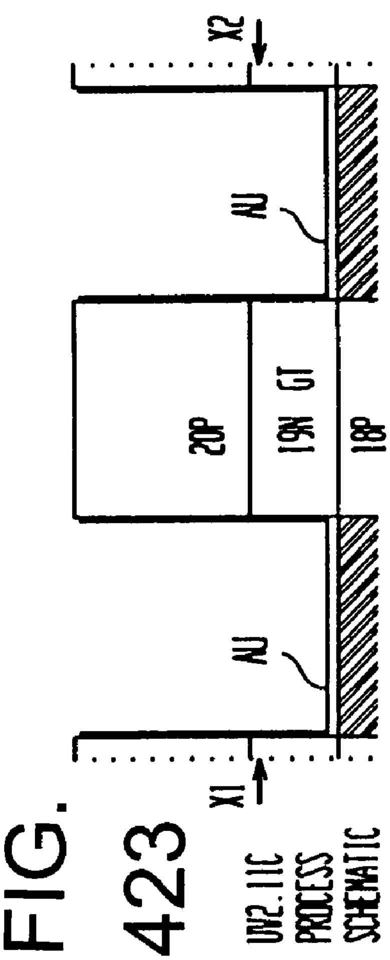
FIG. 423 UN2.11C PROCESS SCHEMATIC
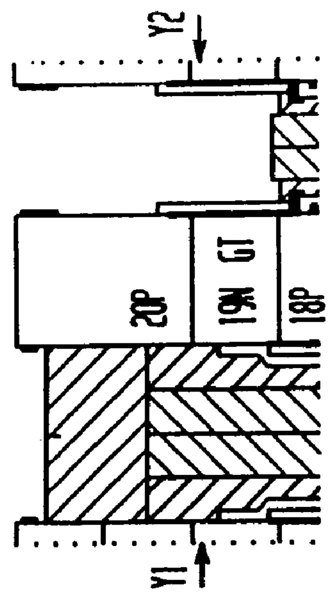
FIG. 424 UN2.11BA PROCESS SCHEMATIC

UN2.12C PROCESS SCHEMATIC

UN2.12BA PROCESS SCHEMATIC

UN2.13BA PROCESS SCHEMATIC

UN2.13C PROCESS SCHEMATIC

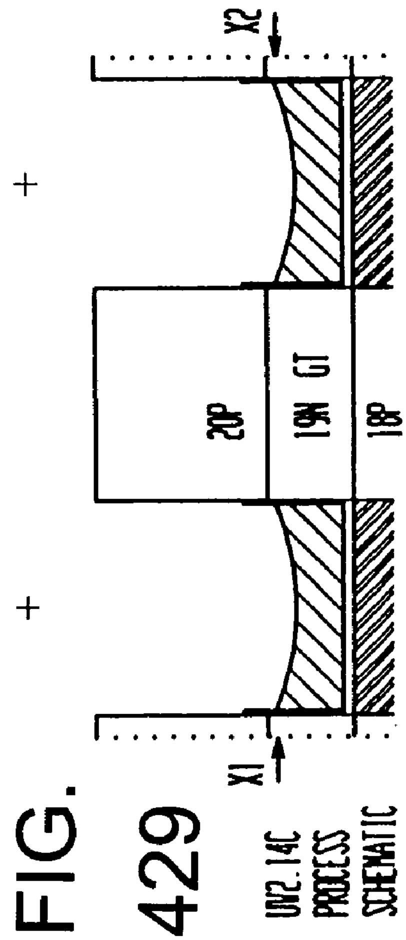
FIG. 429 UV2.14C PROCESS SCHEMATIC
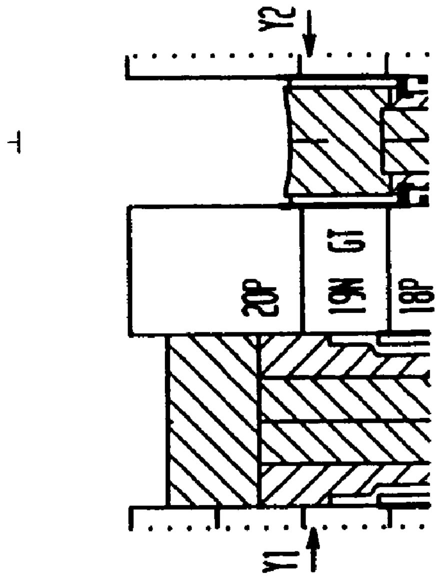
FIG. 430 UV2.14BA PROCESS SCHEMATIC
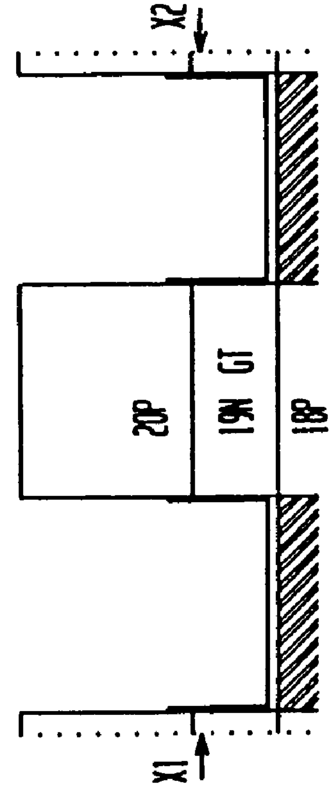
FIG. 431 UV2.15C PROCESS SCHEMATIC
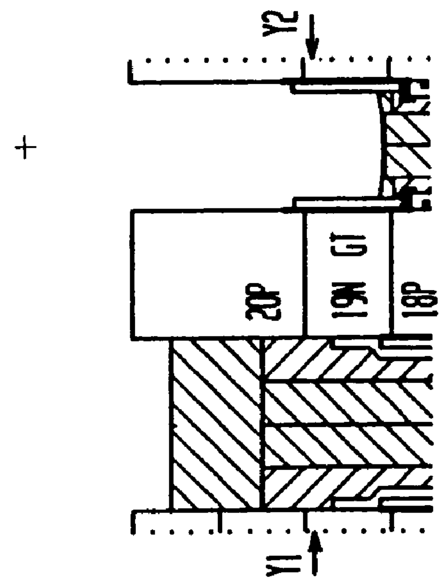
FIG. 432 UV2.15BA PROCESS SCHEMATIC

C TRENCH
PROCESS SCHEMATIC

UV3.1C

B - TRENCH - A
PROCESS SCHEMATIC

UV3.1BA

C TRENCH
PROCESS SCHEMATIC

UV3.2C

B - TRENCH - A
PROCESS SCHEMATIC

UV3.2BA

C TRENCH
PROCESS SCHEMATIC
UV3.3C

B - TRENCH - A
PROCESS SCHEMATIC
UV3.3BA

C TRENCH
PROCESS SCHEMATIC
UV3.4C

B - TRENCH - A
PROCESS SCHEMATIC
UV3.4BA

C TRENCH
PROCESS SCHEMATIC

UV3.5C

B - TRENCH - A
PROCESS SCHEMATIC

UV3.5BA

C TRENCH
PROCESS SCHEMATIC

UV3.6C

B - TRENCH - A
PROCESS SCHEMATIC

UV3.6BA

C TRENCH PROCESS SCHEMATIC

UV4.1C

B - TRENCH - A PROCESS SCHEMATIC

UV4.1DA

C TRENCH PROCESS SCHEMATIC

UV4.2C

B - TRENCH - A PROCESS SCHEMATIC

UV4.2DA

P3D1

PER4

PER3

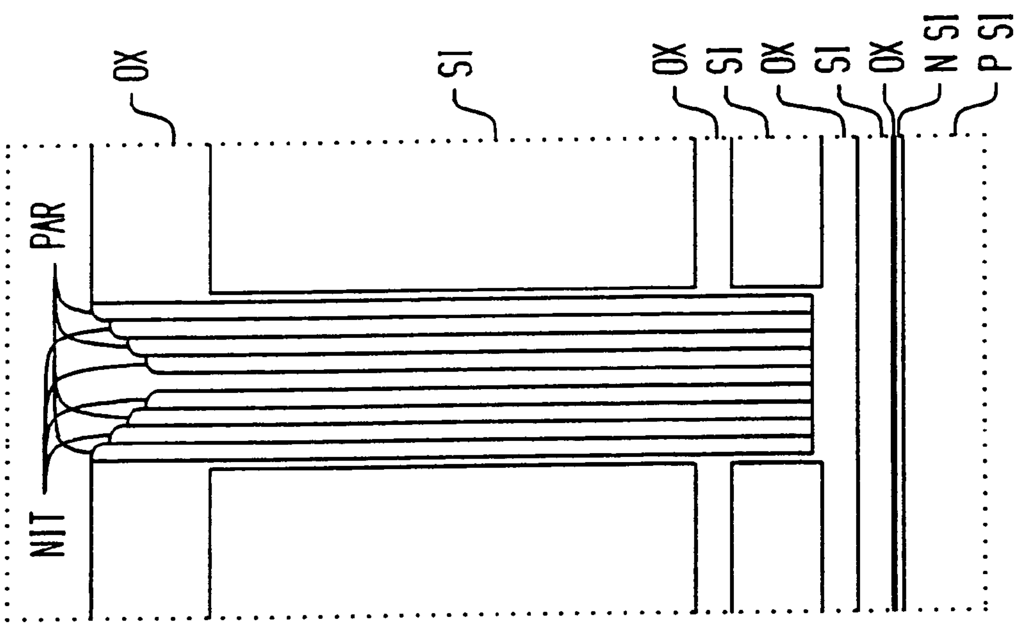
PER7 FIG. 484
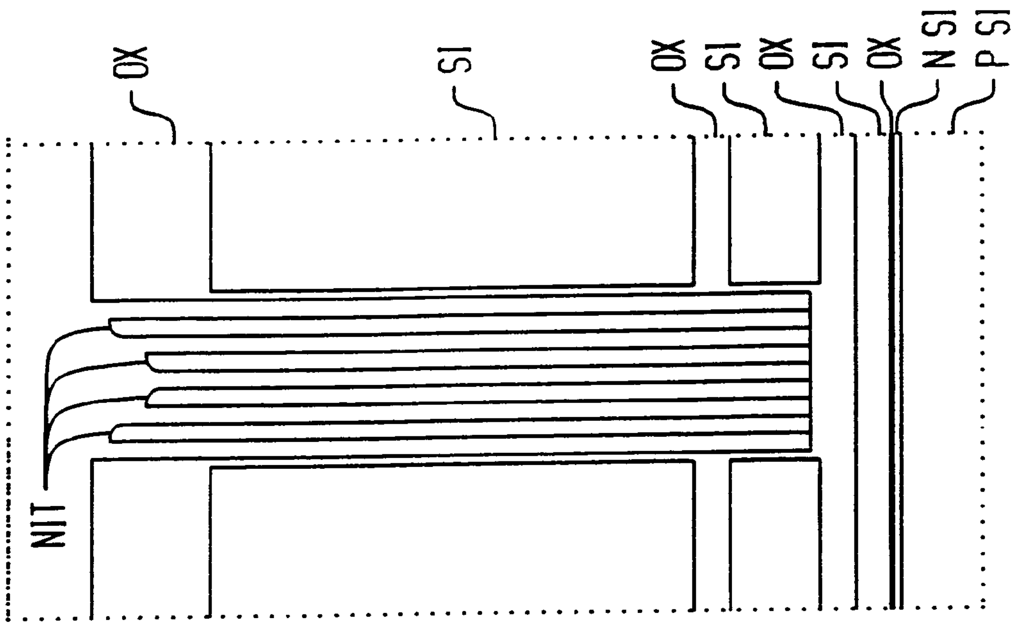
PER8 FIG. 485

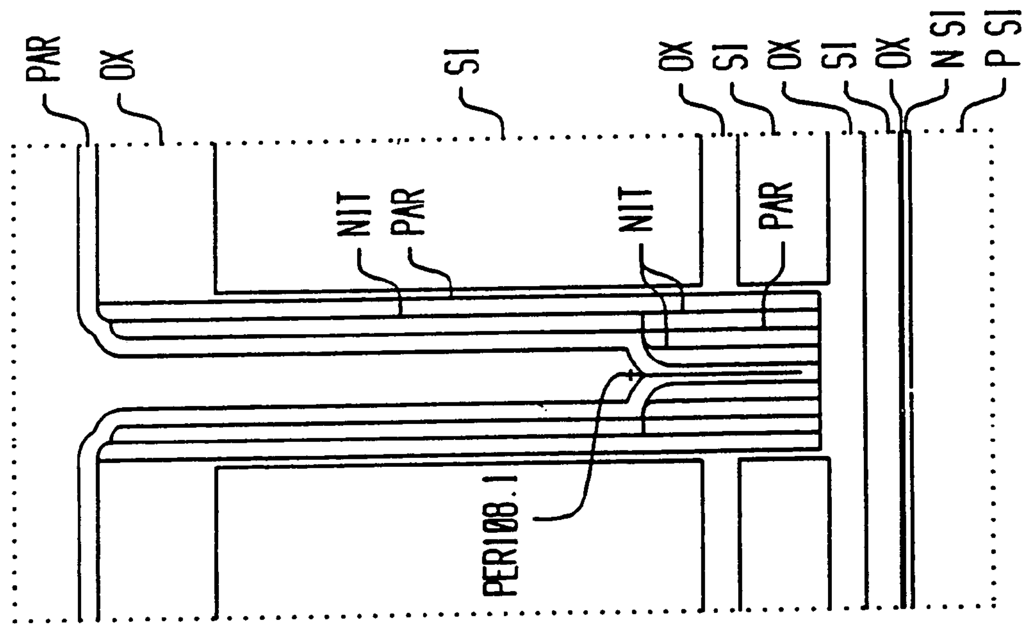
PER108 FIG. 488
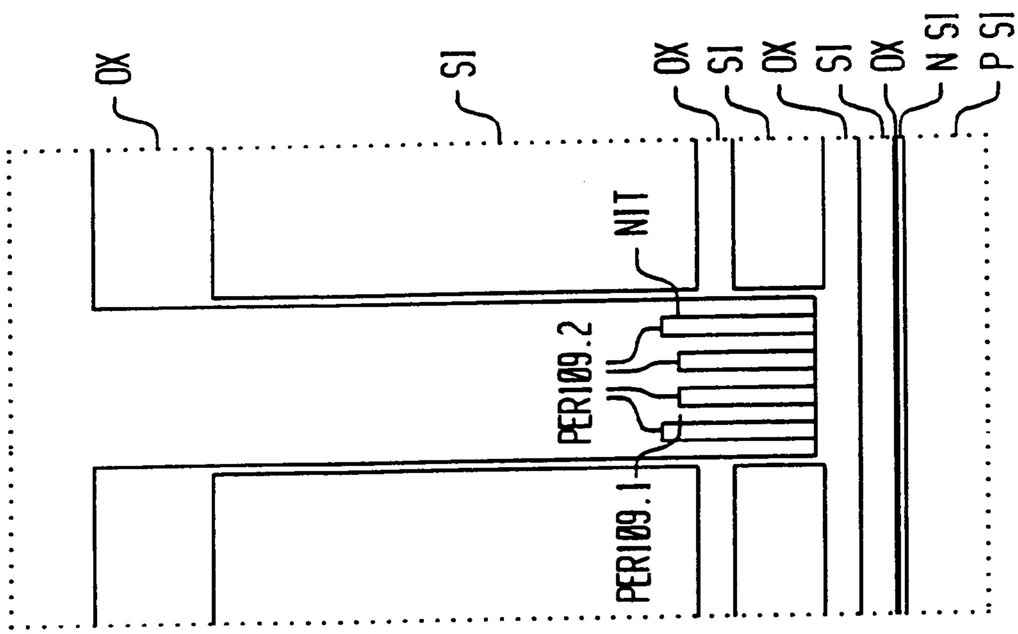
PER109 FIG. 489

PERI2

PERI1

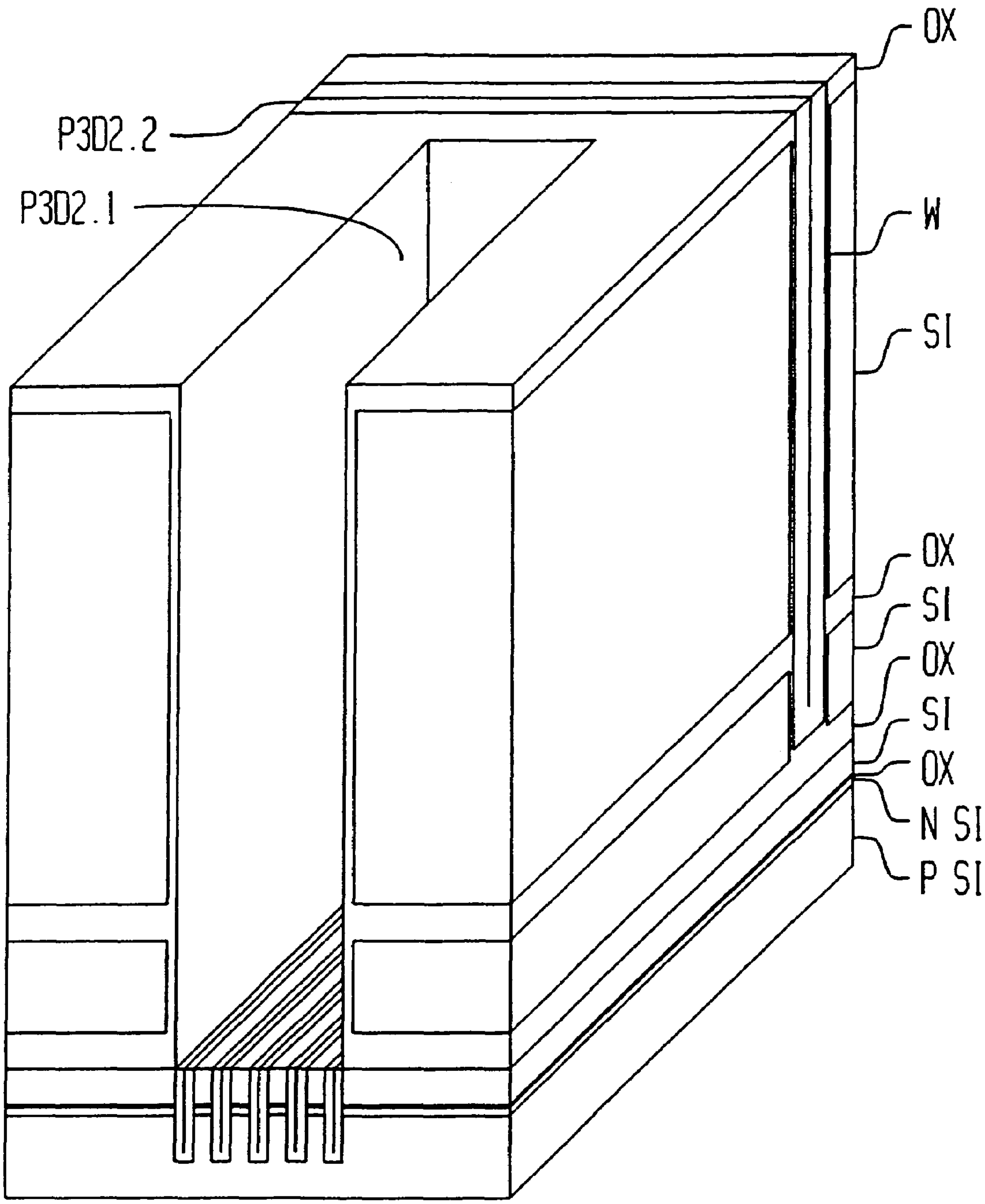
P3D2 FIG. 496

PER17

PER18

PER19A FIG. 502

PER19B

PER21

PER22

PER24A FIG. 508

PER24B

PER26A FIG. 510

PER26B

PER27A FIG. 512

PER27B FIG. 513

PER28A FIG. 514

PER28B

PER29A FIG. 516

PER29B

PER30A FIG. 518

PER31A FIG. 520

PER31B

PER32A FIG. 522

PER32B

PER33A FIG. 524

PER33B

PER34A FIG. 526

PER34B

PER35A FIG. 528

PER35B

PER36A FIG. 530

PER37A FIG. 532

PER37B

PER38A FIG. 534

PER38B

PER39A FIG. 536

PER39B

PER40A FIG. 538

PER40B

PER41A FIG. 540

PER42A

PER42B

PER43A FIG. 544

PER43B

PER44A FIG. 546

PER44B

PER45A FIG. 548

PER45B

PER48A

PER48B

PER49A FIG. 552

PER49B

PER50A

PER50B

PER51A FIG. 556

PER51B

PER52A FIG. 558

PER52B

PER53A FIG. 560

PER53B

PER54A FIG. 562

PER55A FIG. 564

PER56A FIG. 566

PER56B

PER57A FIG. 568

PER57B

PER58B

PER59B

PER60B

PER60C

END17B

END17A

END19B

END19A

END21

FAN9B

FAN1ØB

FAN14A

FAN14B

FAN15B

FAN16B

HORIZONTAL
PROCESS SCHEMATIC
BP-DC.H

D - TRENCH - C
PROCESS SCHEMATIC

BP-DC.DC

B - TRENCH - A
PROCESS SCHEMATIC

BP-DC.BA

XO.H PROCESS SCHEMATIC

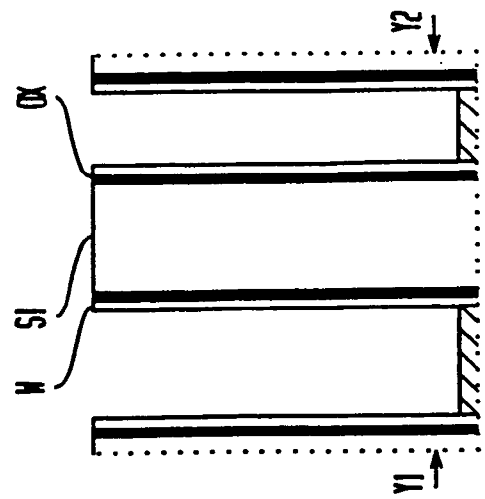
FIG. 639 X0.BA PROCESS SCHEMATIC
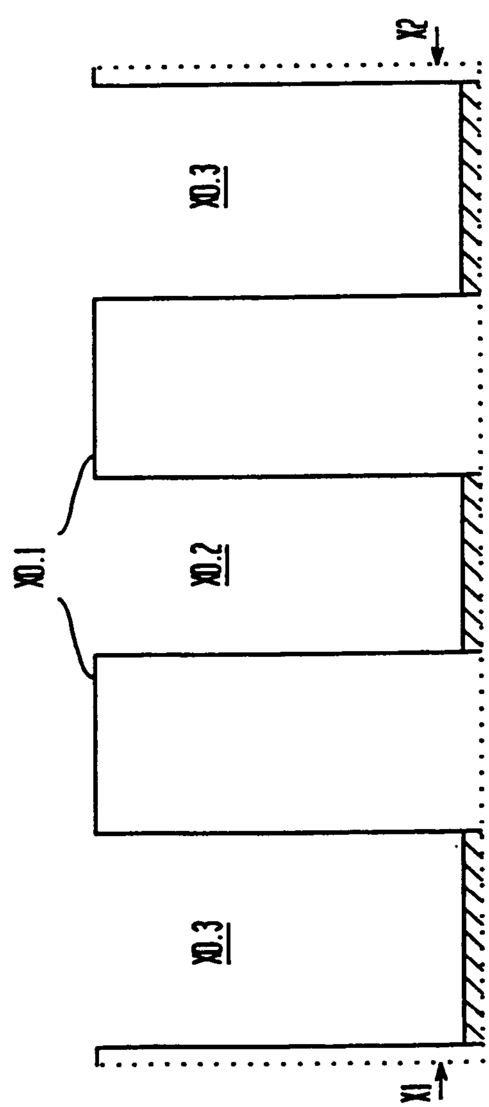
FIG. 638 X0.DC PROCESS SCHEMATIC

XUI.H
PROCESS
SCHEMATIC

XU1.BA PROCESS SCHEMATIC

XU1.DC PROCESS SCHEMATIC

XUP.H
PROCESS
SCHEMATIC

XTC1.H
PROCESS
SCHEMATIC

XTC2.H PROCESS SCHEMATIC

XTC2.BA PROCESS SCHEMATIC

XTC2.DC PROCESS SCHEMATIC

XTC3.H
PROCESS
SCHEMATIC

XTC3.8A PROCESS SCHEMATIC

XTC3.DC PROCESS SCHEMATIC

XTC4.H PROCESS SCHEMATIC

XWR1.H
PROCESS
SCHEMATIC

XWR2.H
PROCESS
SCHEMATIC

XMR3.H
PROCESS
SCHEMATIC

XWR3.BA PROCESS SCHEMATIC

XWR3.DC PROCESS SCHEMATIC

XWR4.H PROCESS SCHEMATIC

XVR5.H
PROCESS
SCHEMATIC

XWR5.BA PROCESS SCHEMATIC

XWR5.DC PROCESS SCHEMATIC

XVR6.H
PROCESS
SCHEMATIC

XNR7.H
PROCESS
SCHEMATIC

XVR7.BA PROCESS SCHEMATIC

XVR7.DC PROCESS SCHEMATIC

XVR0.H
PROCESS
SCHEMATIC

XML.H PROCESS SCHEMATIC

XA01.H PROCESS SCHEMATIC

XAIR PROCESS SCHEMATIC

FIG. 689 XAD3 PROCESS SCHEMATIC

XAD4.H
PROCESS
SCHEMATIC

XA04.BA PROCESS SCHEMATIC

XA04.DC PROCESS SCHEMATIC

XA05.H
PROCESS
SCHEMATIC

XAD5.BA PROCESS SCHEMATIC

XAD5.DC PROCESS SCHEMATIC

XTP.H
PROCESS
SCHEMATIC

XTP.BA PROCESS SCHEMATIC

XTP.DC PROCESS SCHEMATIC

XPC1.H
PROCESS
SCHEMATIC

XPC4.H PROCESS SCHEMATIC

XPC4.BA PROCESS SCHEMATIC

XPC4.DC PROCESS SCHEMATIC

XF1.H
PROCESS
SCHEMATIC

XF1.BA PROCESS SCHEMATIC

XF1.DC PROCESS SCHEMATIC

XF2.H
PROCESS
SCHEMATIC

XF2.BA PROCESS SCHEMATIC

XF2.DC PROCESS SCHEMATIC

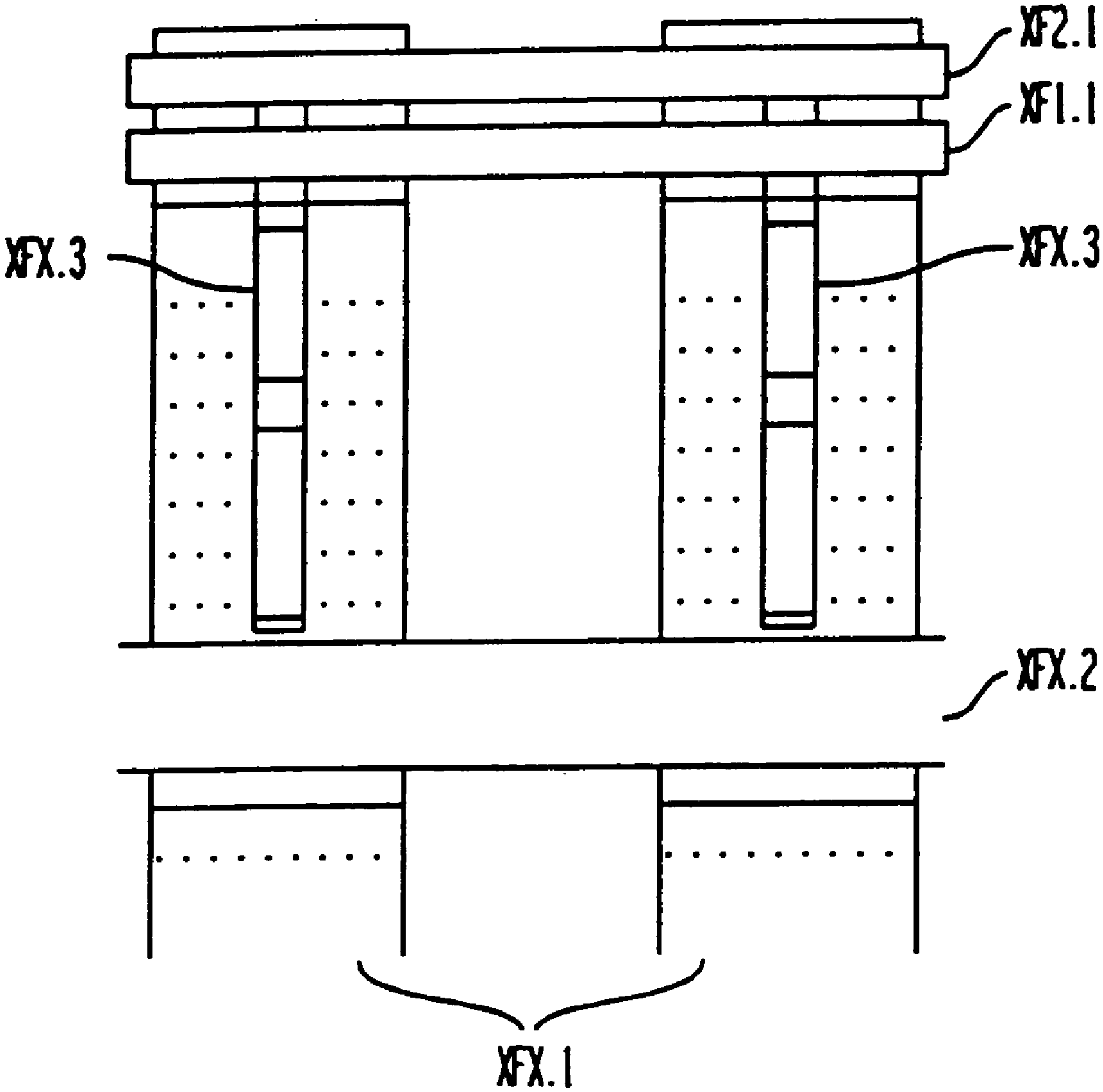
FIG. 711 XFX PROCESS SCHEMATIC

VERTICALLY WIRED INTEGRATED CIRCUIT AND METHOD OF FABRICATION

This application is a continuation-in-part of application Ser. No. 10/223,446, filed Aug. 19, 2002, now abandoned, which is a continuation-in-part of application Ser. No. 10/035,871, filed Dec. 26, 2001, now abandoned, which is a continuation-in-part of application Ser. No. 09/821,957, filed Mar. 30, 2001, now abandoned, which is a continuation-in-part of application Ser. No. 09/223,493, filed Dec. 30, 1998, now abandoned, which is a continuation-in-part of application Ser. No. 08/639,887 filed Apr. 26, 1996, now abandoned, which is a continuation-in-part of application Ser. No. 08/453,834, filed May 30, 1995, now abandoned, which is a continuation-in-part of original application Ser. No. 08/290,489, filed Aug. 15, 1994, now abandoned.

FIELD OF INVENTION

The invention relates to structures and methods of fabrication for static random access memory (SRAM) integrated circuits, as well as for other integrated circuit applications, particularly those incorporating iterative arrays of like structures, such as other types of semiconductor memory, programmable logic, application specific integrated circuit (ASIC) underlays, and analogous applications.

BACKGROUND OF THE INVENTION

Various three-dimensional integrated circuits structures have been disclosed for DRAM cell structures. An integrated circuit structure incorporating multiple vertical components was disclosed in a co-pending U.S. patent application Ser. No. 07/769,850 (with subsequent continuations-in-part).

These earlier vertical integrated circuit structures do not conveniently lend themselves to incorporation of crystalline silicon regions in the various components of a multiple semiconductor component stack, particularly where a large number of such semiconductor components are present. Fabrication of these earlier integrated circuit structures typically require a large number of photolithographic steps.

SUMMARY OF THE INVENTION

This invention addresses the ability to fabricate such vertical stacks of components, as well as the ability to maintain crystalline regions where desired in the various components. These structures can be fabricated with as little as a single mask step.

As an object of the invention, a complex three-dimensional integrated circuit can be constructed of groups of components which include multiple transistors whose alternately doped regions are made from continuous crystal, these multiple transistors being arranged in a first axis, this first axis extending into a first dimension, where these components are interconnected by conductive circuitry extending in a plurality of axes, said plurality of axes extending into second and third dimensions.

As an object of the invention, a three-dimensional integrated circuit can be created by as little as one mask step.

As an object of the invention, features may be fabricated at various locations on one or two vertical pillars which form elements of components of a larger integrated circuit.

It is an object of the invention to provide new capabilities for interconnecting and accessing circuitry formed below the photolithographic limit to conventional circuitry formed at or above the photolithographic limit.

BRIEF DESCRIPTION OF THE DRAWINGS

FIGS. 15, 16 and 17 depict three mutually orthogonal cross-sections, with vertical trenches of three different widths below the windows in the masking layer, reaching down into the second-lowest semiconductor layer and leaving rectangular semiconductor pillars in between.

FIG. 182 depicts the right wall, with the thick layer of second insulating material removed from the horizontal surfaces.

FIG. 183 depicts the right wall, with the exposed first metal removed.

FIG. 184 depicts the right wall, with the exposed first insulating material removed.

FIG. 185 depicts the right wall, cleared of all second insulating material.

FIG. 186 depicts the right wall, with a window in the first metal layer, delineated by an upper masking layer of first insulating material and a lower masking plug of second insulating material.

FIG. 187 depicts the right wall, with a window in the layer of first insulating material, delineated by the window in the first metal layer.

FIG. 188 depicts the right wall, with the layer of first metal removed above a masking plug of second insulating material.

FIG. 189 depicts the right wall, with the layer of first insulating material removed above the masking plug of second insulating material.

FIG. 190 depicts the right wall, with a window in the thin semiconductor material layer above a masking plug of second insulating material.

FIG. 191 depicts the right wall, with a window in the thin layer of first insulating material, delineated by the window in the semiconductor material layer.

FIG. 192 depicts the right wall, with the thin semiconductor material layer removed above a masking plug of second insulating material.

FIG. 193 depicts the right wall, with the thin layer of first insulating material removed above the masking plug of second insulating material.

Figure 194:
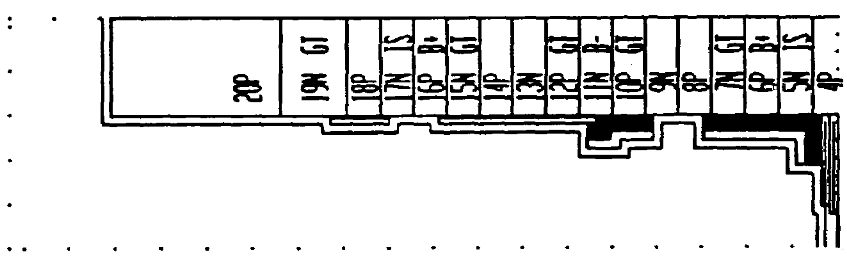
Figure 195:
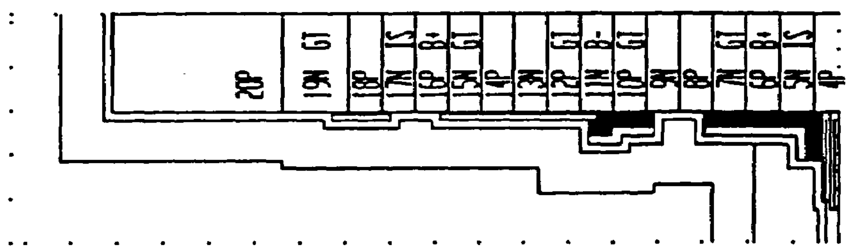

FIG. 194 depicts the right wall, with a plug of second insulating material at the bottom, and with a layer of first metal covering all surfaces FIG. 195 depicts the right wall, with a thick layer of first insulating material covering all surfaces above a lower masking plug of second insulating material.

Figure 196:
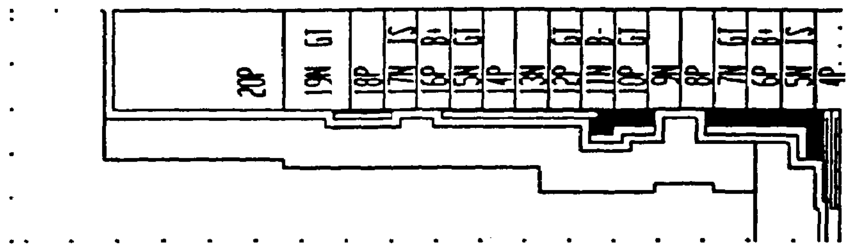

FIG. 196 depicts the right wall, with the thick layer of first insulating material removed from the horizontal surfaces.

Figure 197:
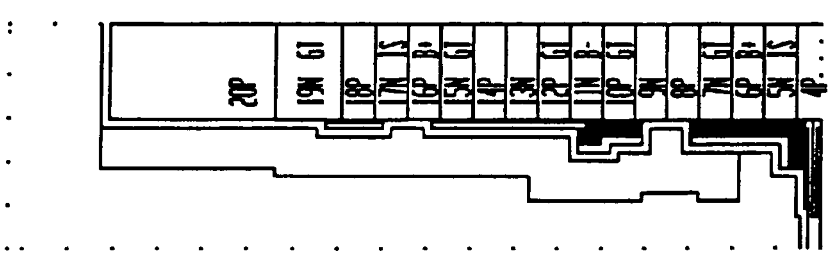

FIG. 197 depicts the right wall, with the lower masking plug removed.

Figure 198:
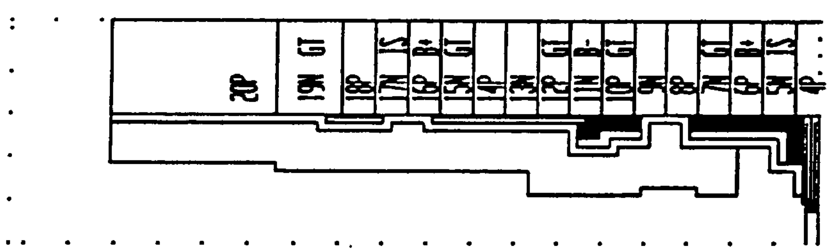

FIG. 198 depicts the right wall, with all vertically exposed first metal removed.

Figure 199:
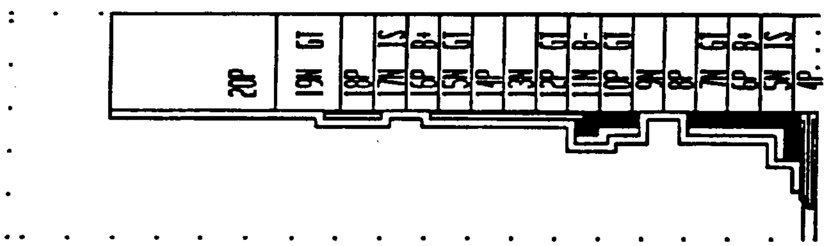

FIG. 199 depicts the right wall, with all first insulating material removed.

Figure 200:
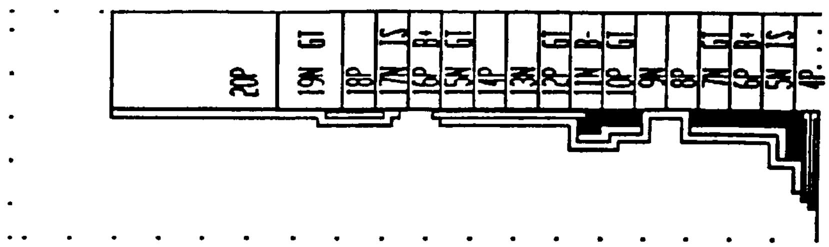

FIG. 200 depicts the right wall, with a window in the layer of first metal.

Figure 201:
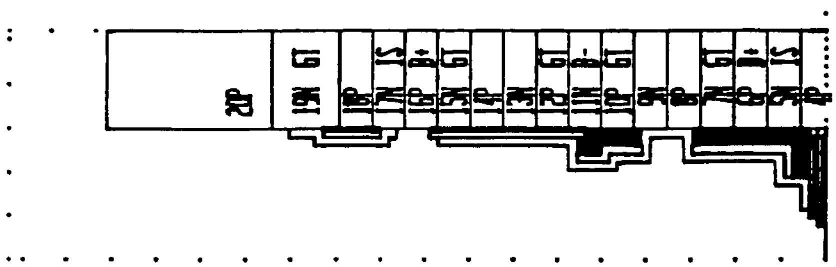

FIG. 201 depicts the right wall, with the top portion of the layer of first metal removed from the wall.

Figure 202:
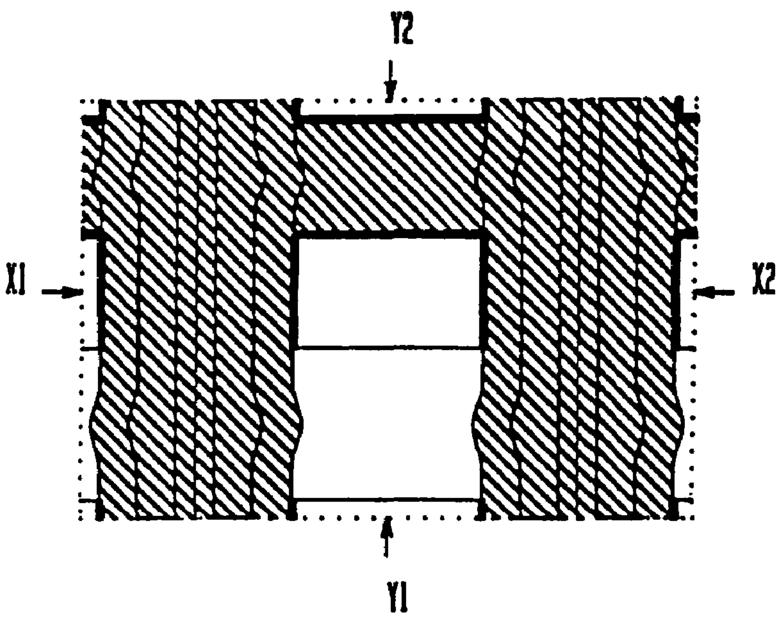
Figure 203:
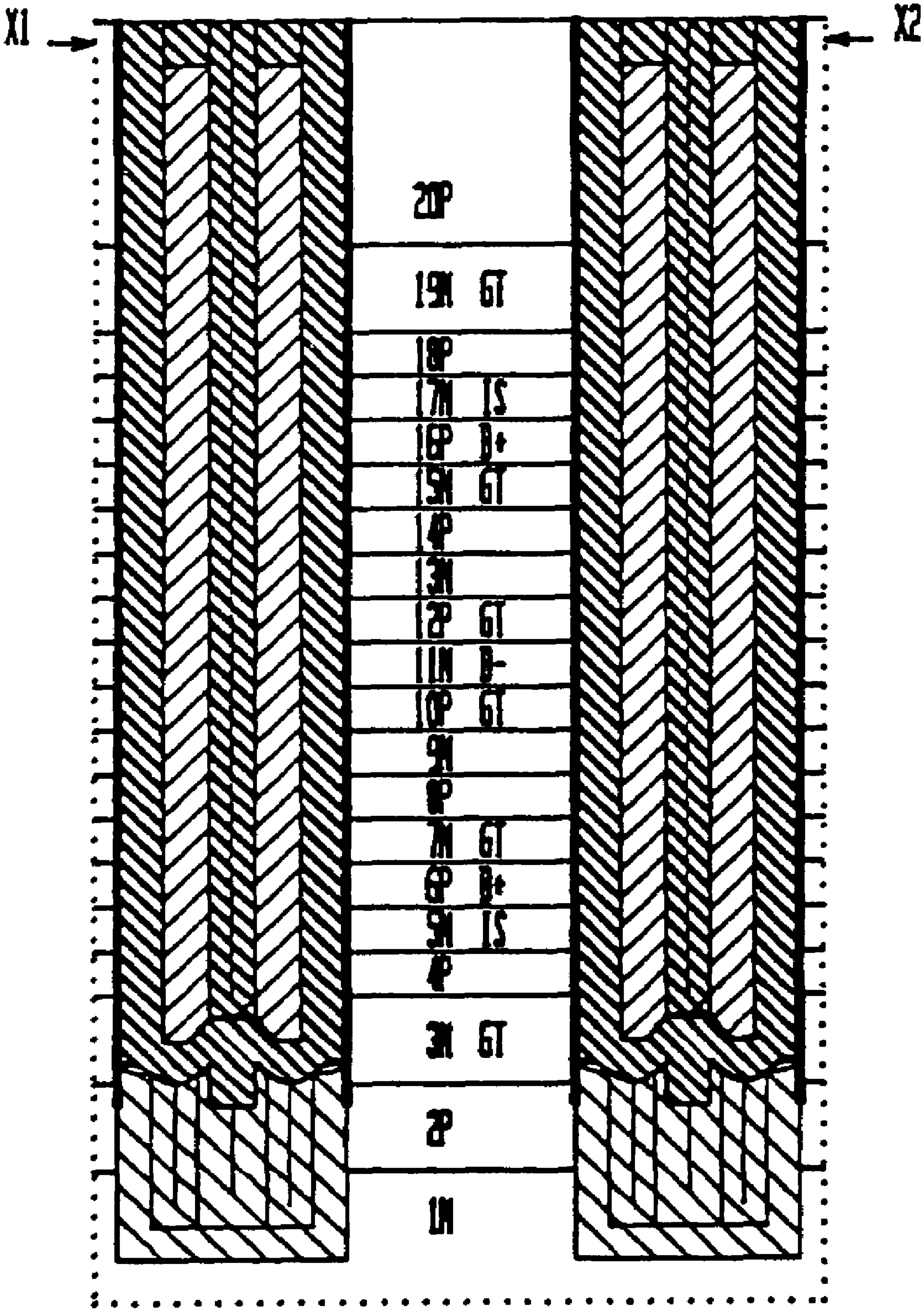
Figure 204:
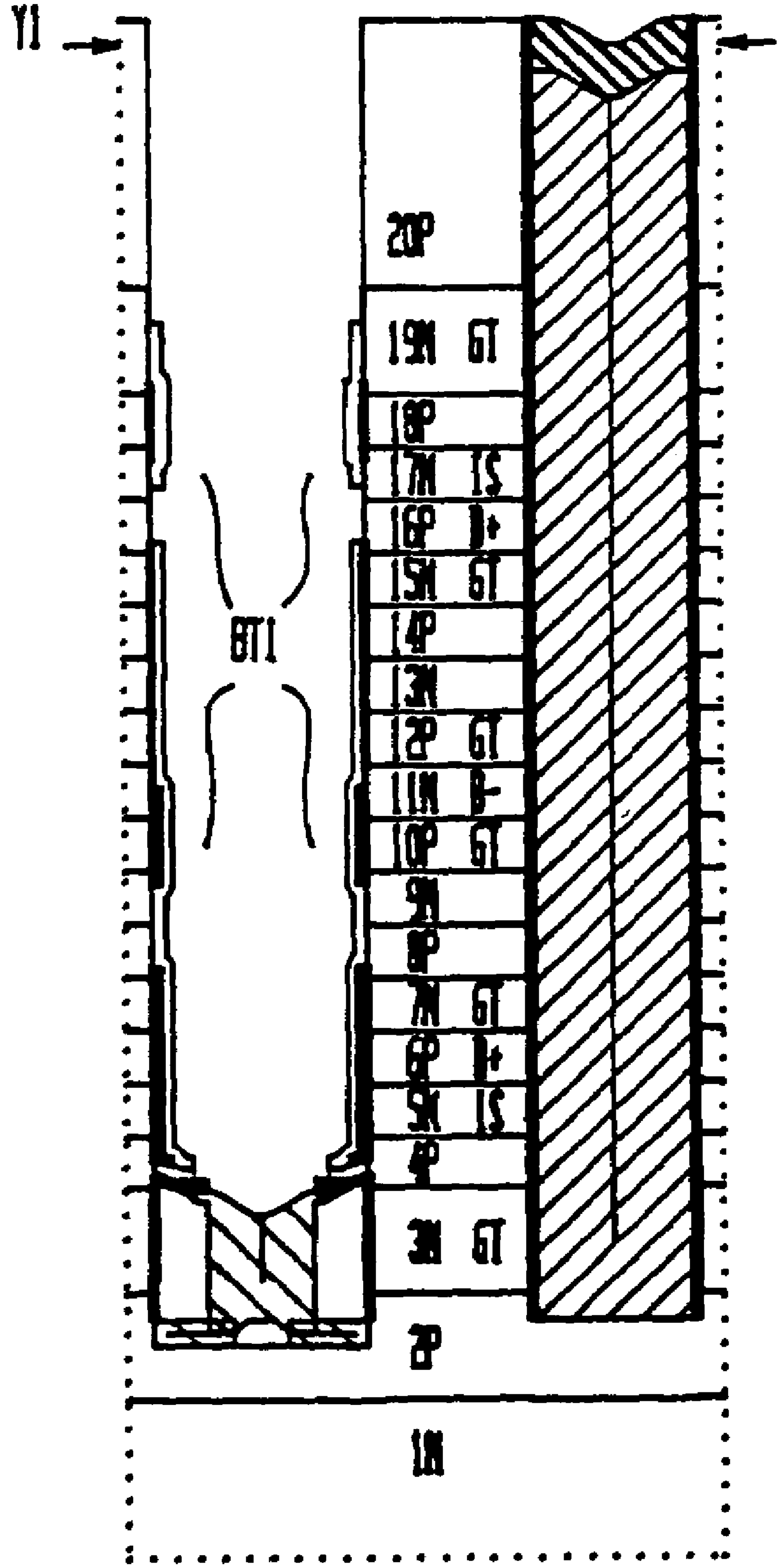

FIGS. 202, 203 and 204 depict three mutually orthogonal cross-sections of the structure of FIG. 201 more completely and detailed.

Figure 205:
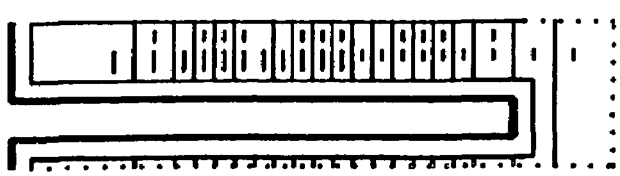

FIG. 205 depicts the vertical cross-section of the intermediate-width trench, with a layer of first insulating material covering all surfaces.

Figure 206:
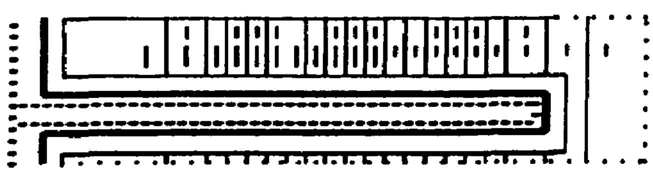

FIG. 206 depicts the vertical cross-section of the intermediate-width trench, with all surfaces covered and the trench closed out by a layer of second insulating material.

Figure 207:
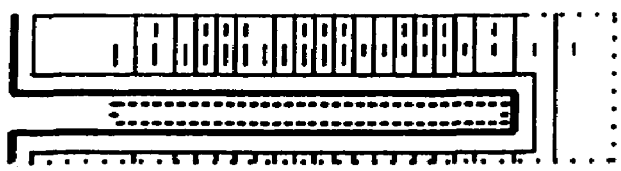

FIG. 207 depicts the vertical cross-section of the intermediate-width trench, with the second insulating material cleared from all surfaces and down to a preferred height in the trench.

Figure 208:
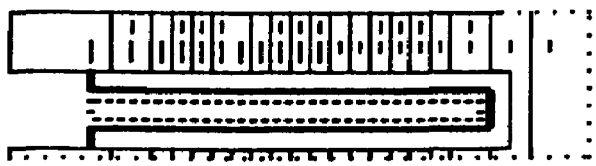

FIG. 208 depicts the vertical cross-section of the intermediate-width trench, with the first insulating material cleared from all surfaces and down to the preferred height in the trench.

Figure 209:
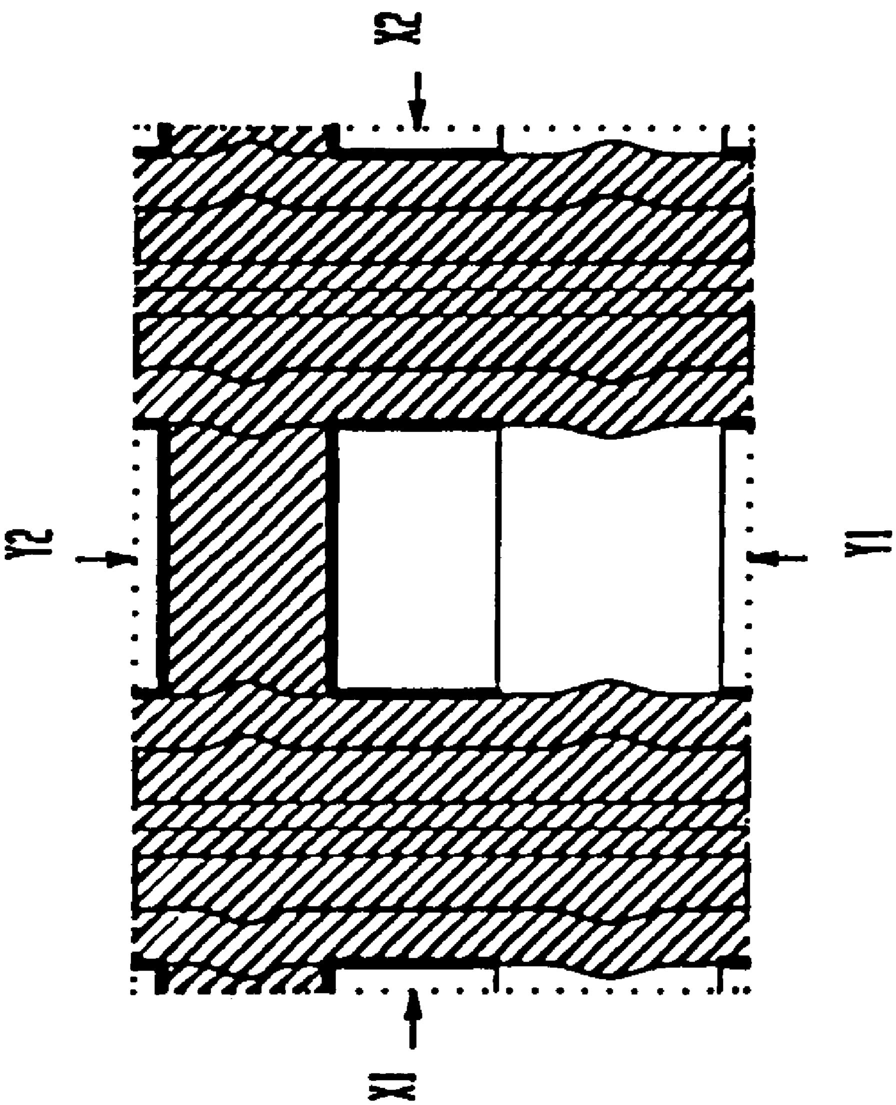
Figure 211:
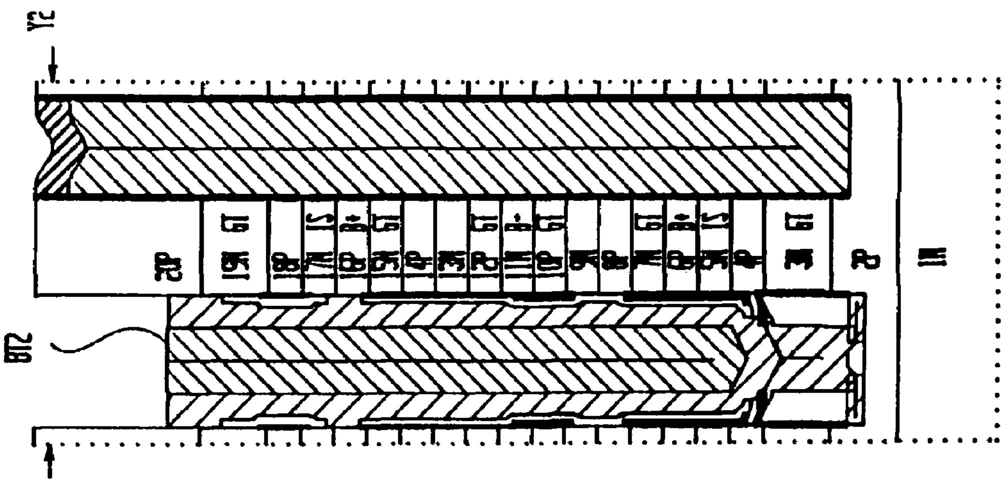
Figure 210:
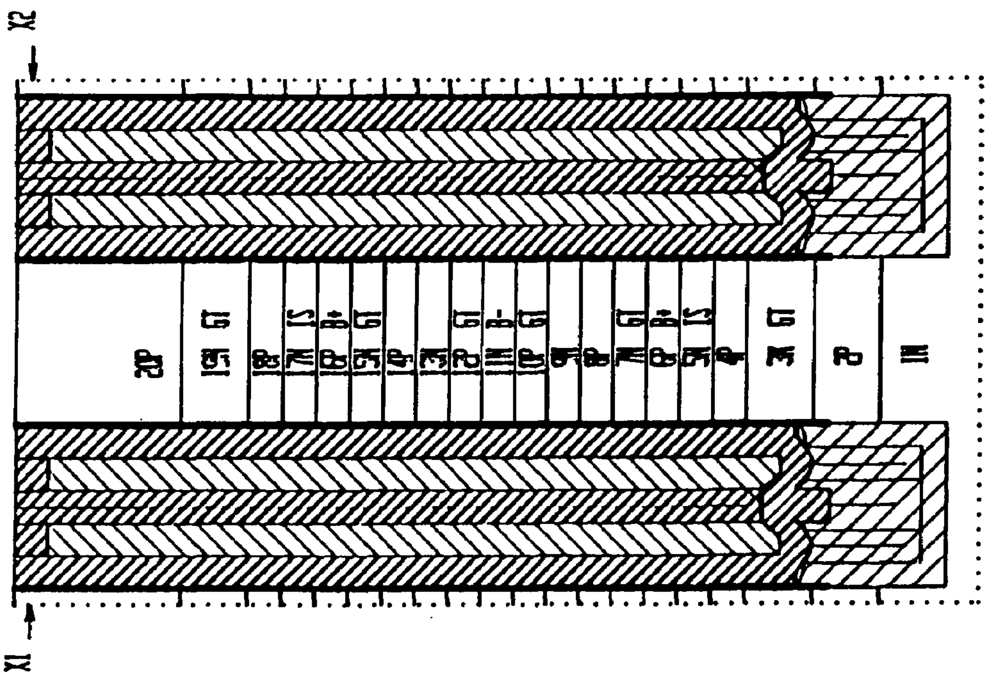

FIGS. 209, 210 and 211 depict three mutually orthogonal cross-sections of the structure of FIG. 208 more completely and detailed.

Figure 212:
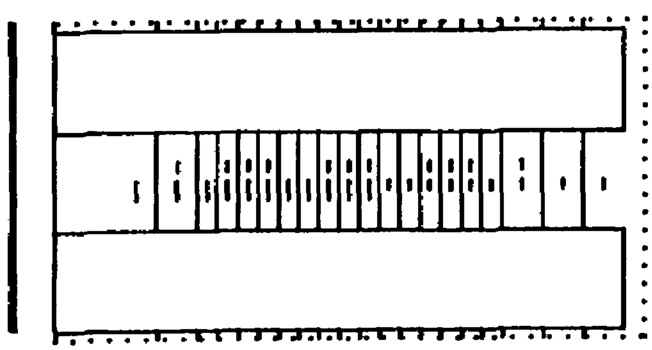
Figure 213:
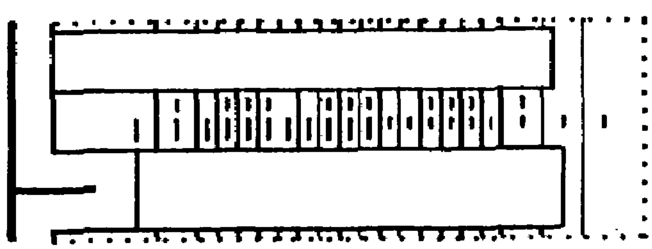

FIGS. 212 and 213 depict the two vertical cross-sections, with a layer of third insulating material covering all surfaces and closing the intermediate-width trench.

Figure 214:
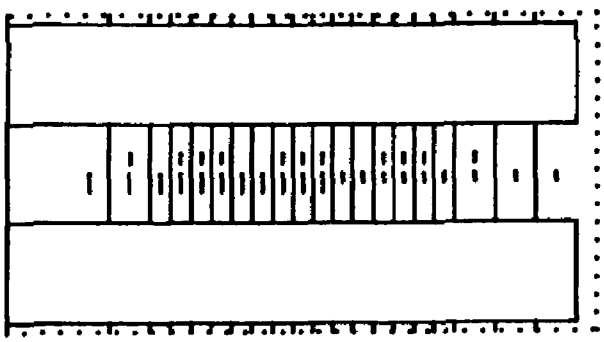
Figure 215:
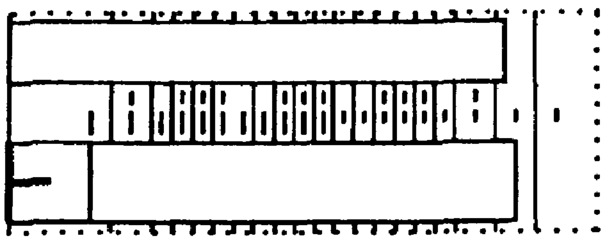

FIGS. 214 and 215 depict the two vertical cross-sections, with a plug of third insulating material left at the top of the intermediate-width trench.

Figure 216:
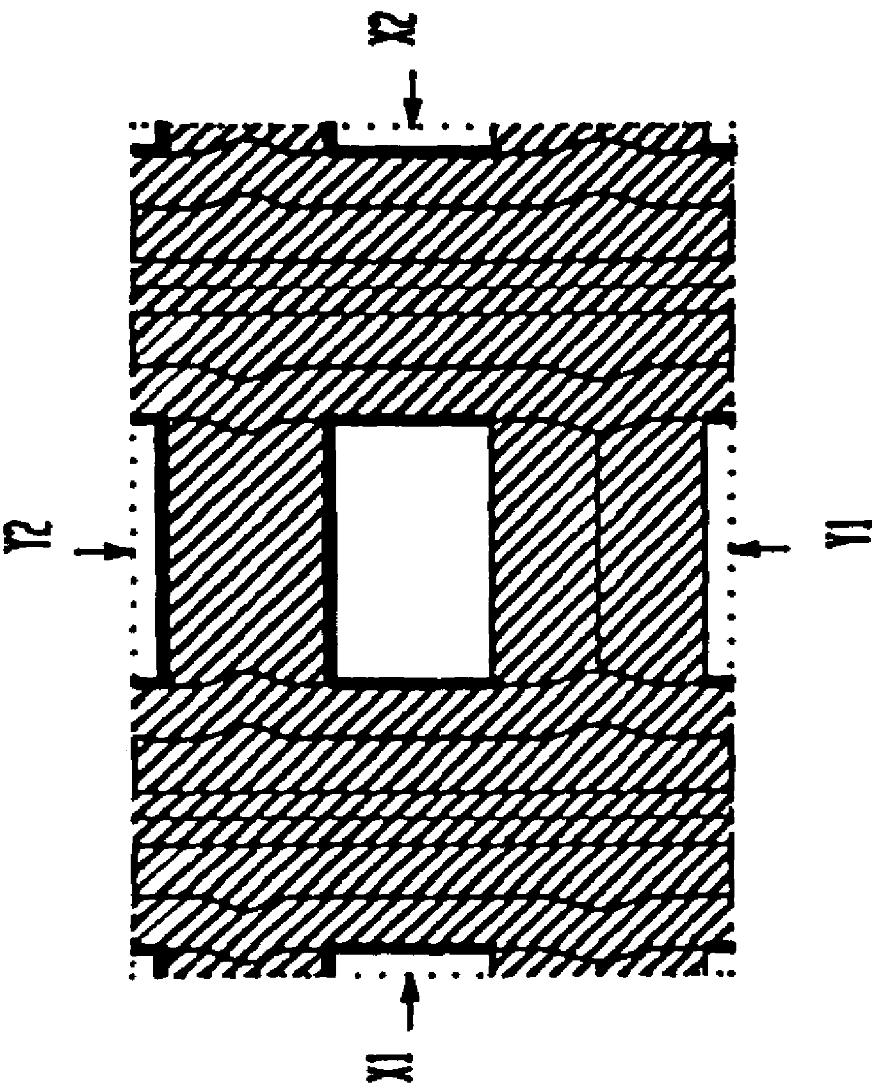
Figure 218:
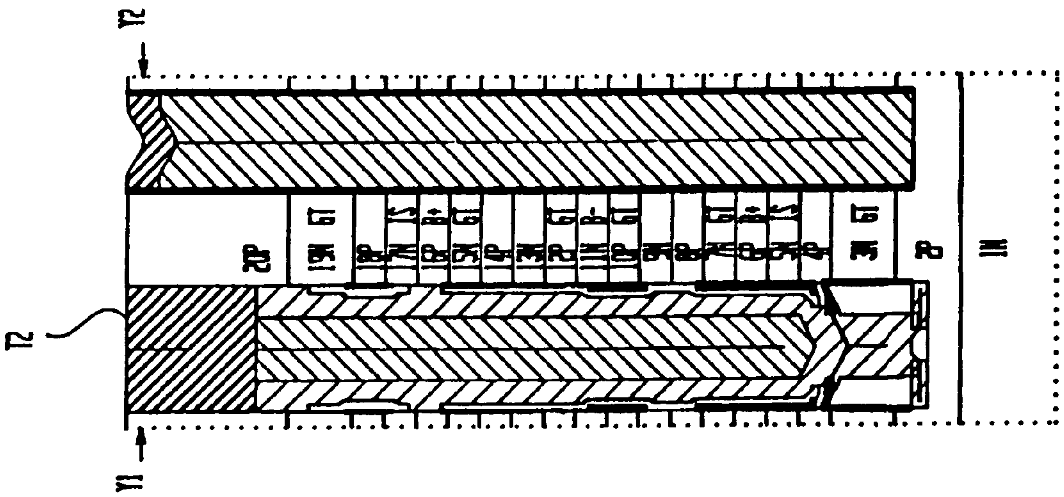
Figure 217:
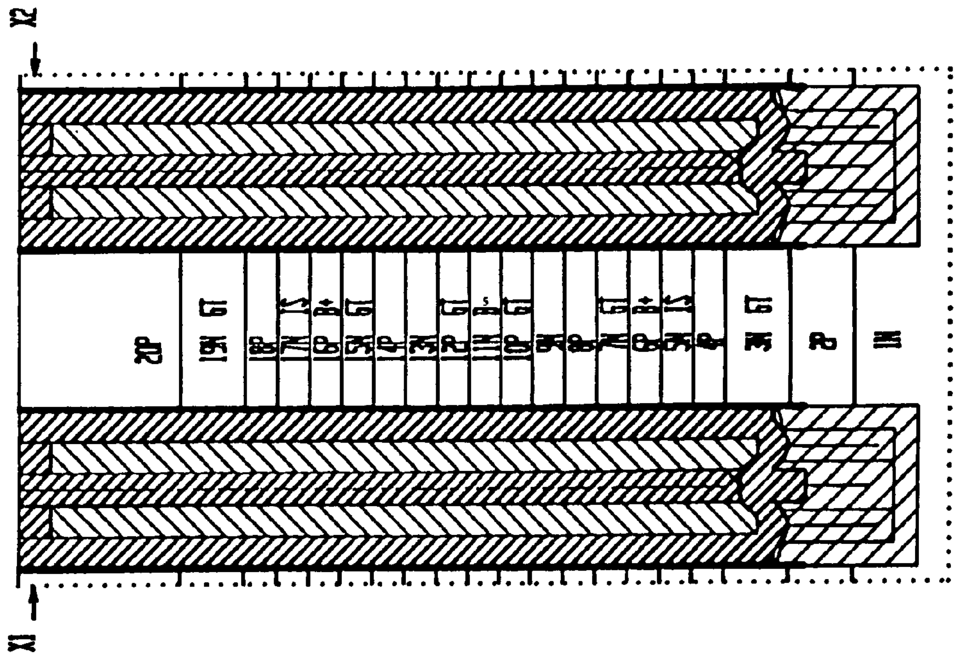

FIGS. 216, 217 and 218 depict three mutually orthogonal cross-sections of the structure of FIGS. 214 and 215 more completely and detailed.

Figure 219:
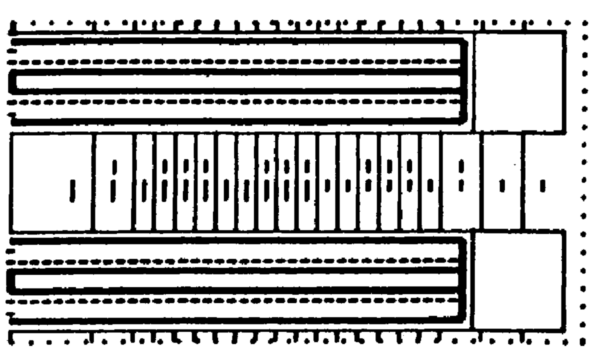
Figure 220:
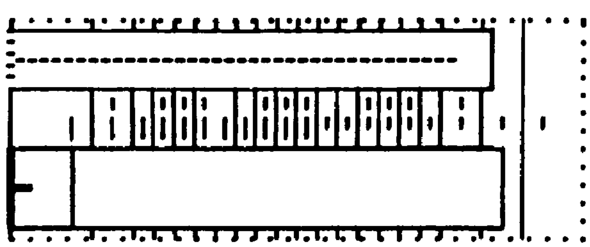

FIGS. 219 and 220 depict the two vertical cross-sections, with the second insulating material tops in the widest and narrowest trenches uncovered.

Figure 221:
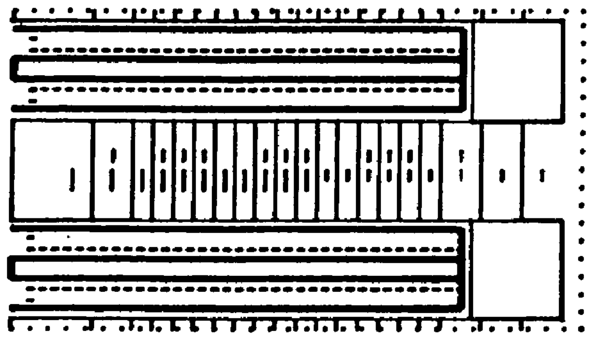
Figure 222:
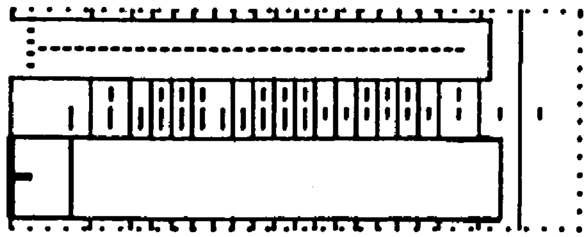

FIGS. 221 and 222 depict the two vertical cross-sections, with the second insulating material tops slightly below the height of the semiconductor top surface.

Figure 223:
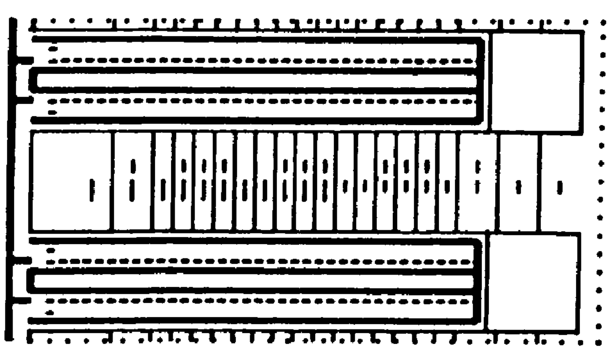
Figure 224:
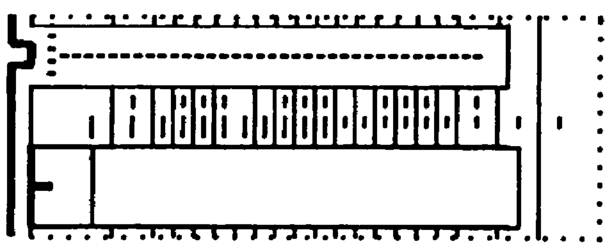

FIGS. 223 and 224 depict the two vertical cross-sections, with a layer of a third insulating material covering all surfaces.

Figure 225:
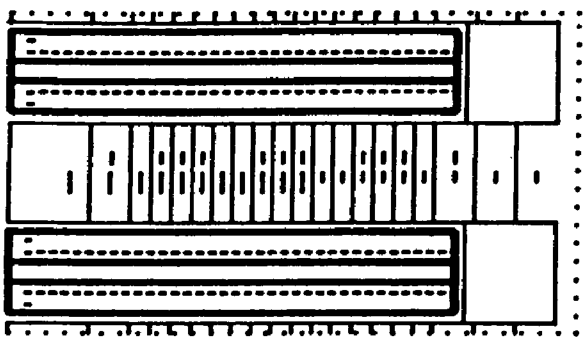
Figure 226:
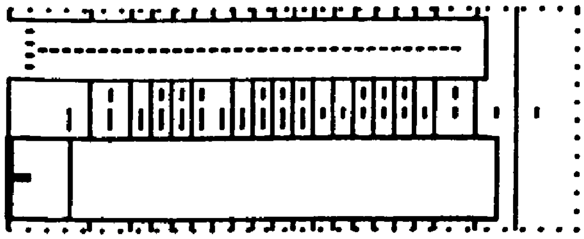

FIGS. 225 and 226 depict the two vertical cross-sections, with third insulating material covering only the tops of the widest and intermediate-width trenches.

Figure 228:
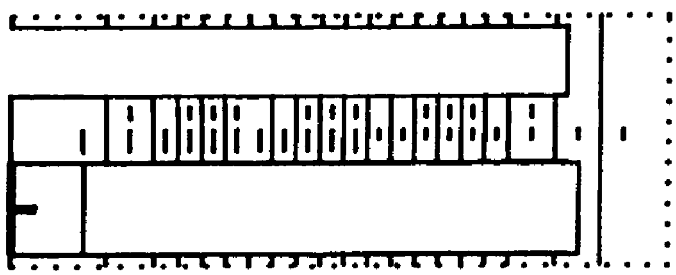
Figure 227:
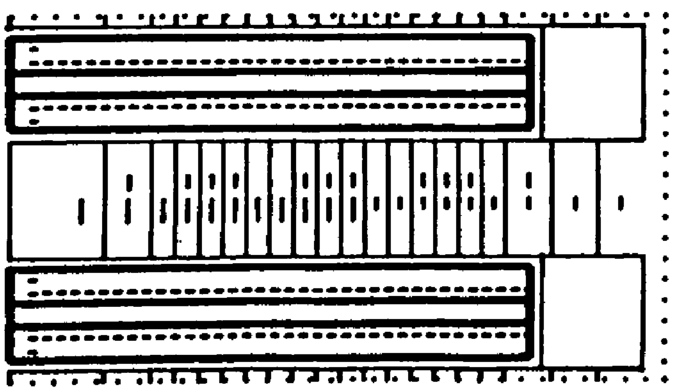

FIGS. 227 and 228 depict the two vertical cross-sections, with the narrowest trench cleared.

Figure 229:
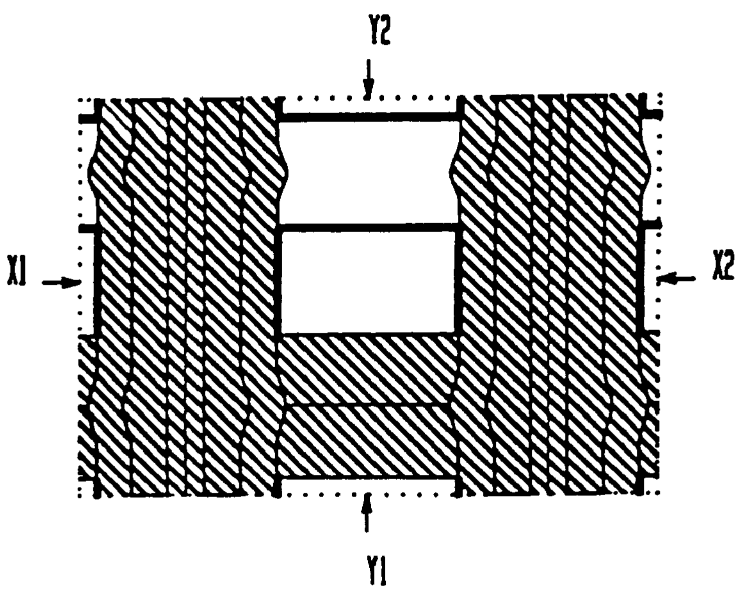
Figure 230:
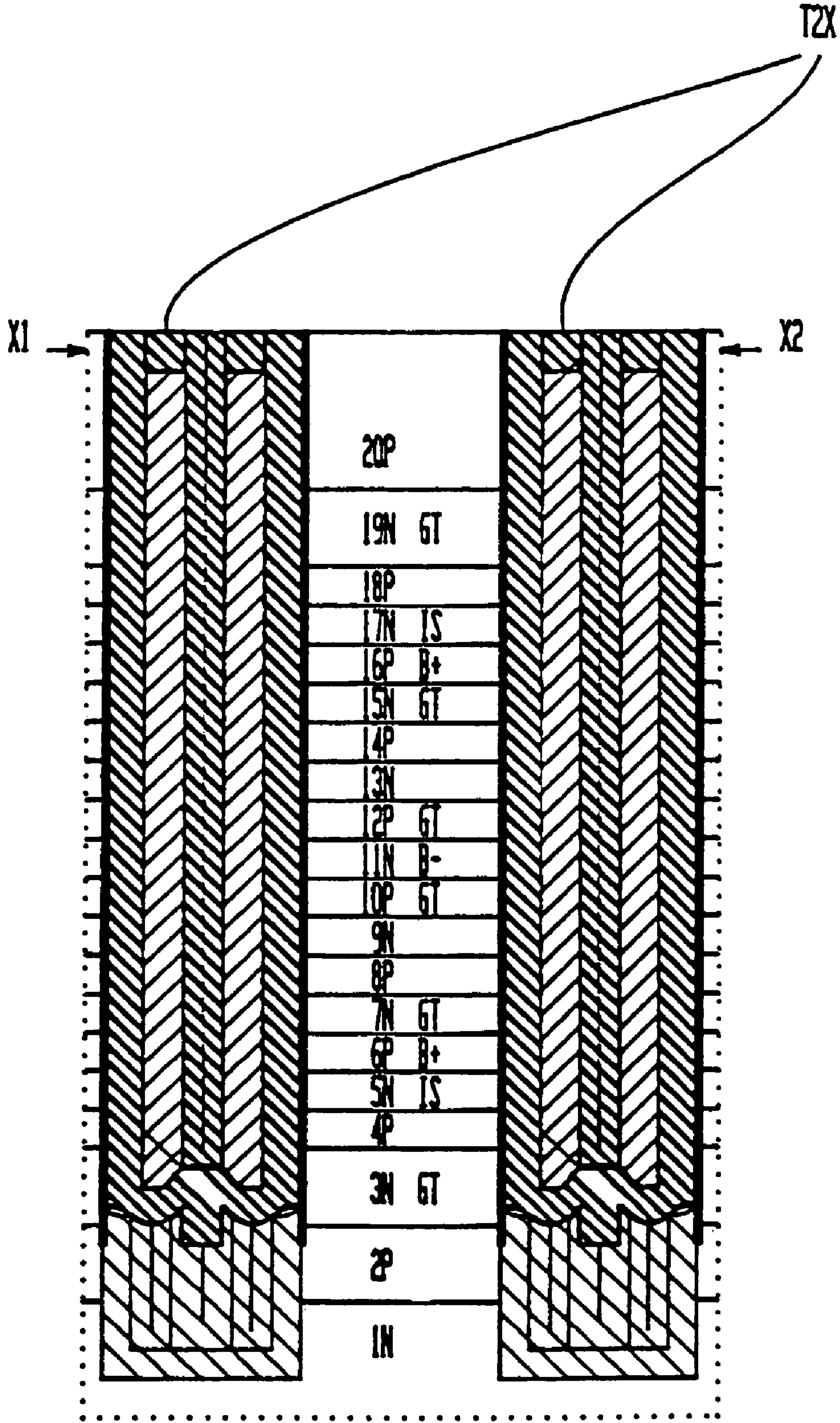
Figure 231:
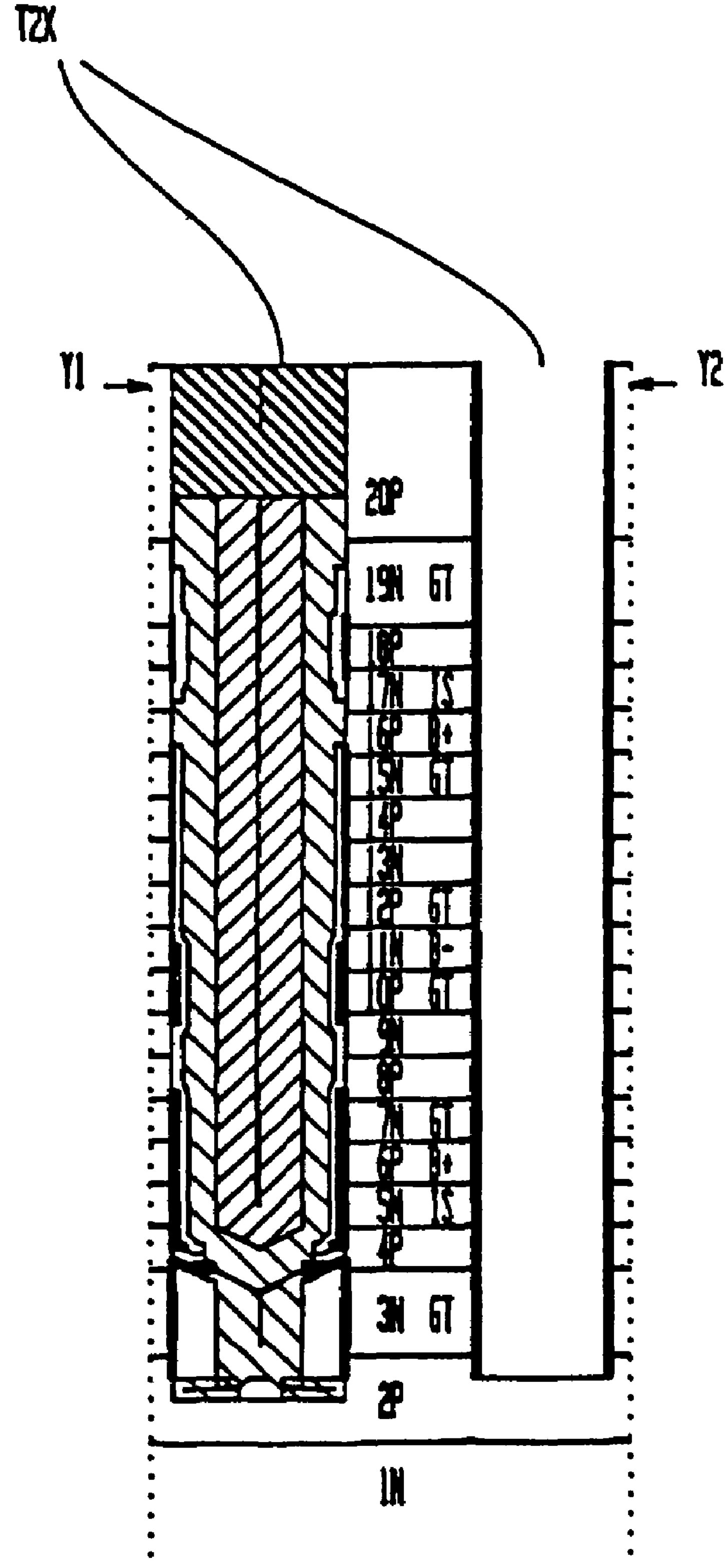

FIGS. 229, 230 and 231 depict three mutually orthogonal cross-sections of the structure of FIGS. 227 and 228 more completely and detailed.

Figure 232:
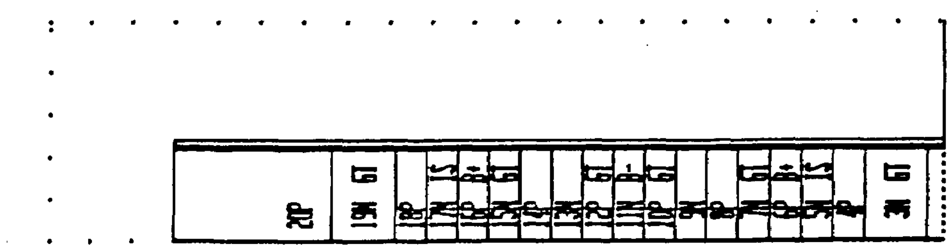

FIG. 232 depicts the vertical cross-section of the left-hand wall of the narrowest trench, in subsequent paragraphs simply called "the left wall," with the thin layer of semiconductor material on top of the thin layer of first insulating material covering the wall now shown explicitly.

Figure 233:
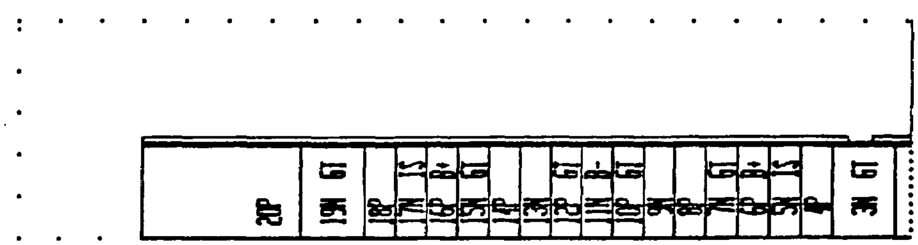

FIG. 233 depicts the left wall, with a window in the layer of semiconductor material.

Figure 234:
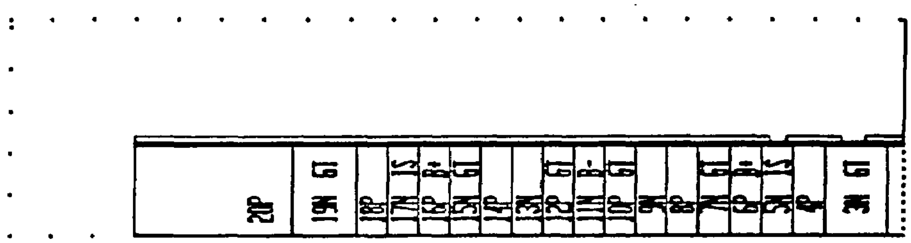

FIG. 234 depicts the left wall, with two windows in the layer of semiconductor material.

Figure 235:
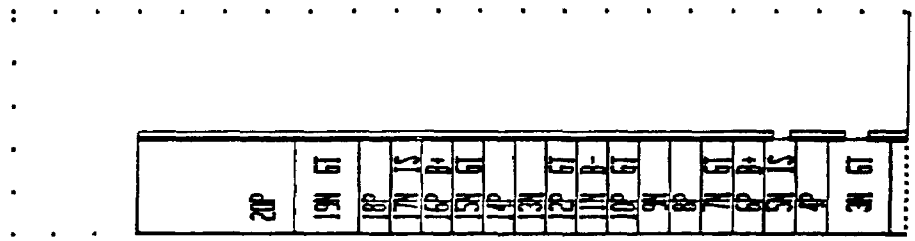

FIG. 235 depicts the left wall, with the thin layer of insulating material in the windows removed.

Figure 236:
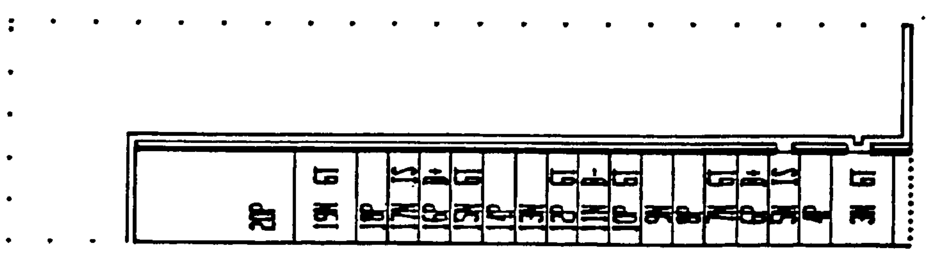

FIG. 236 depicts the left wall, covered with a layer of first metal.

Figure 237:
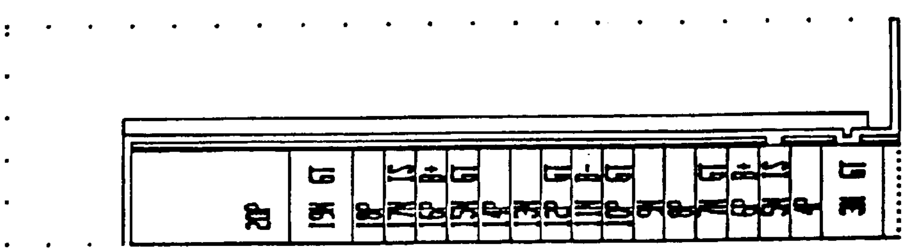

FIG. 237 depicts the left wall, covered with a layer of third insulating material above a preferred height.

Figure 238:
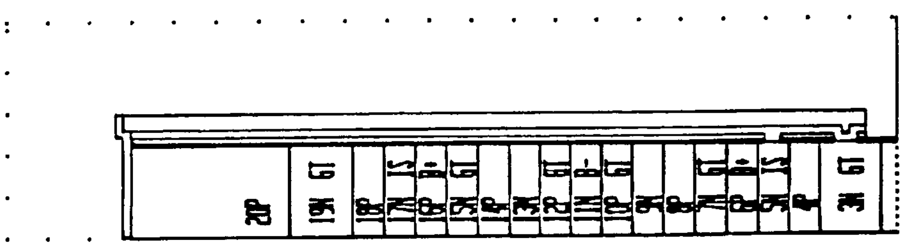

FIG. 238 depicts the left wall, with the layers of first metal and semiconductor material only left beneath the layer of third insulating material, and with a protective layer covering the top surface.

Figure 239:
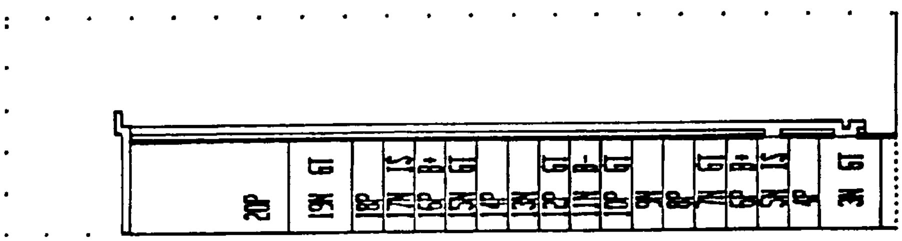

FIG. 239 depicts the left wall, cleared of the layer of third insulating material.

Figure 240:
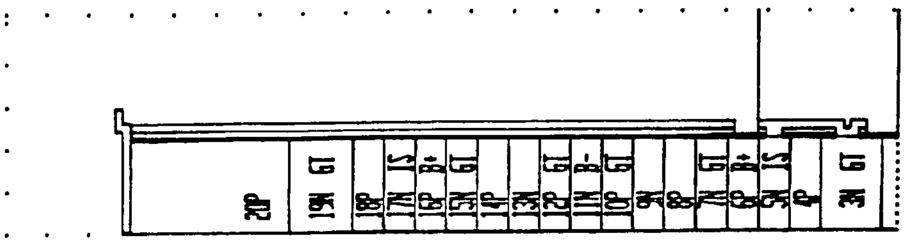

FIG. 240 depicts the left wall, with a window in the layers of first metal and semiconductor material adjacent to a plug of second insulating material.

Figure 241:
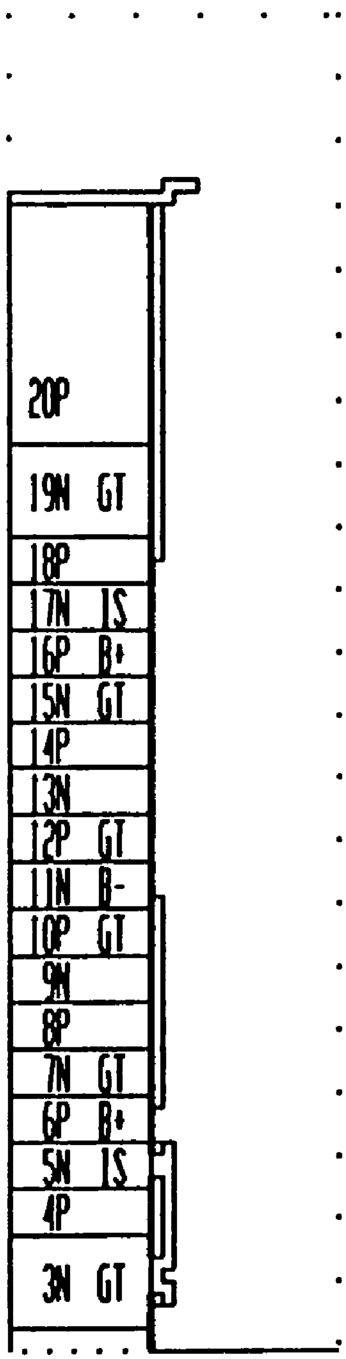

FIG. 241 depicts the left wall, with two upper windows in the layer of semiconductor material exposing the thin layer of first insulating material.

Figure 242:
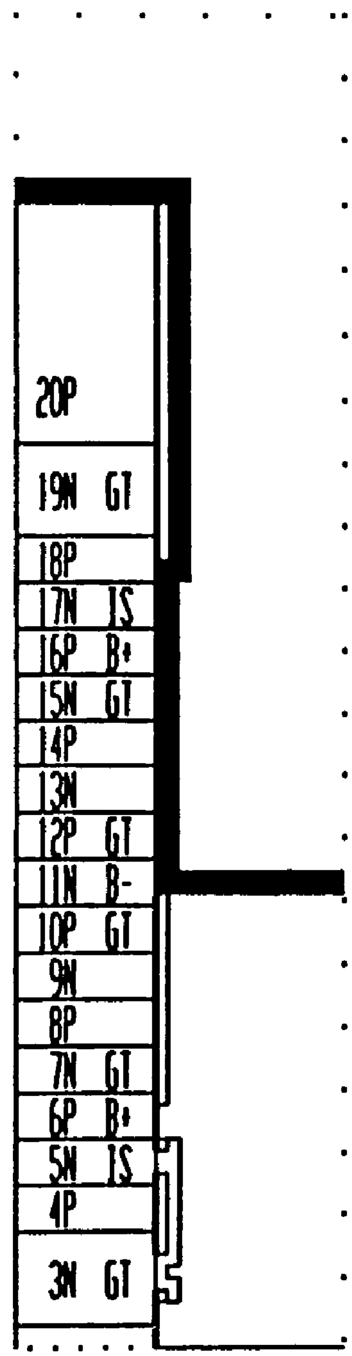

FIG. 242 depicts the left wall, with the protective layer removed from the top surface, and a thick layer of first insulating material covering all surfaces above a plug of second insulating material.

Figure 243:
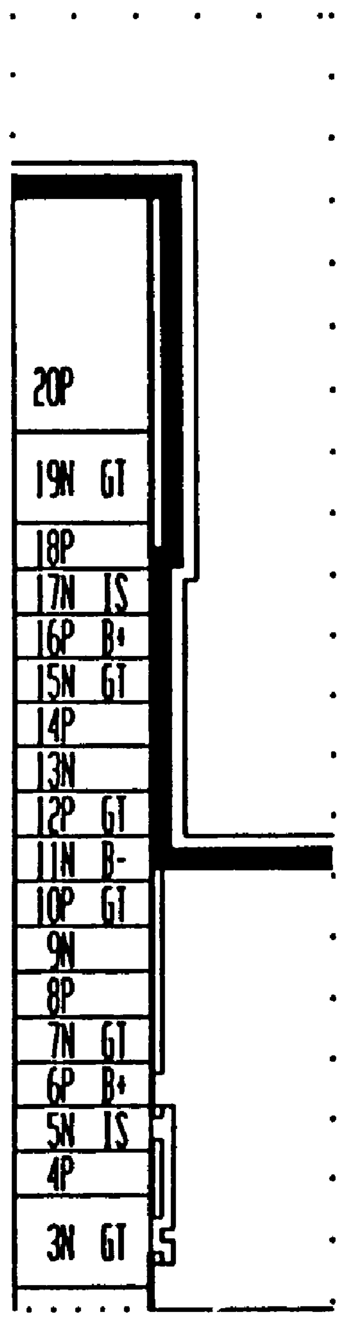

FIG. 243 depicts the left wall, with a layer of first metal covering all surfaces.

Figure 244:
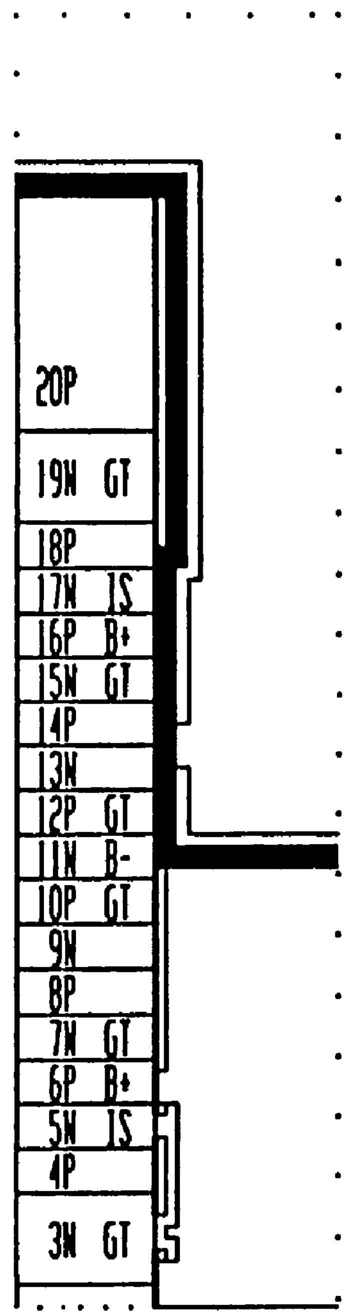

FIG. 244 depicts the left wall, with a window in the layer of first metal.

Figure 245:
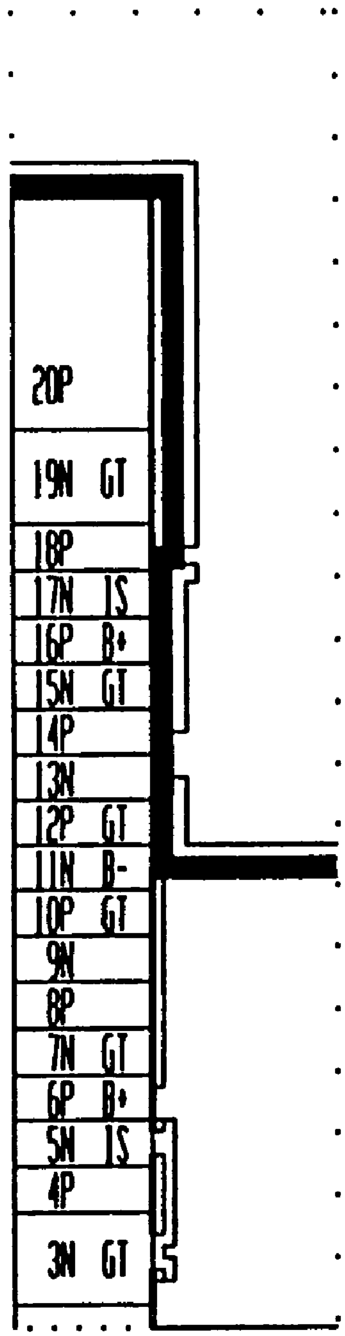

FIG. 245 depicts the left wall, with two windows in the layer of first metal.

Figure 246:
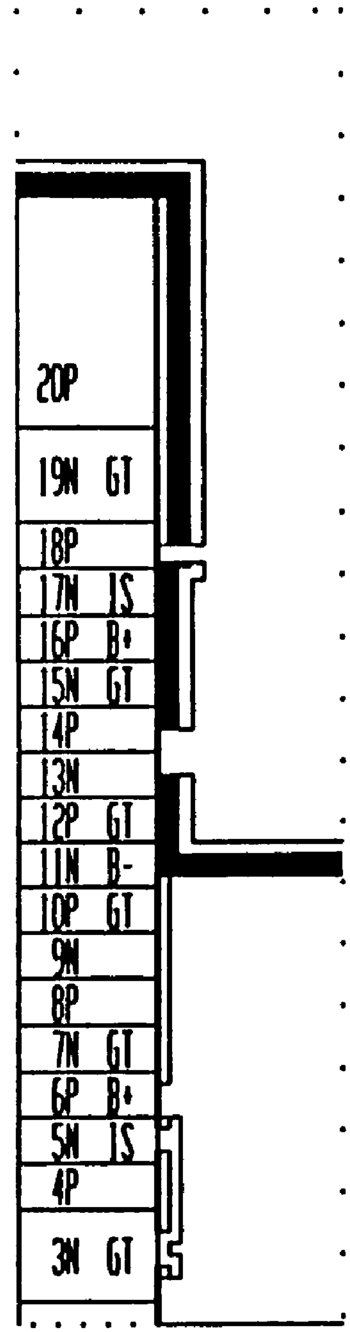

FIG. 246 depicts the left wall, with two windows cut into the layer of first insulating material through the windows in the layer of first metal.

Figure 247:
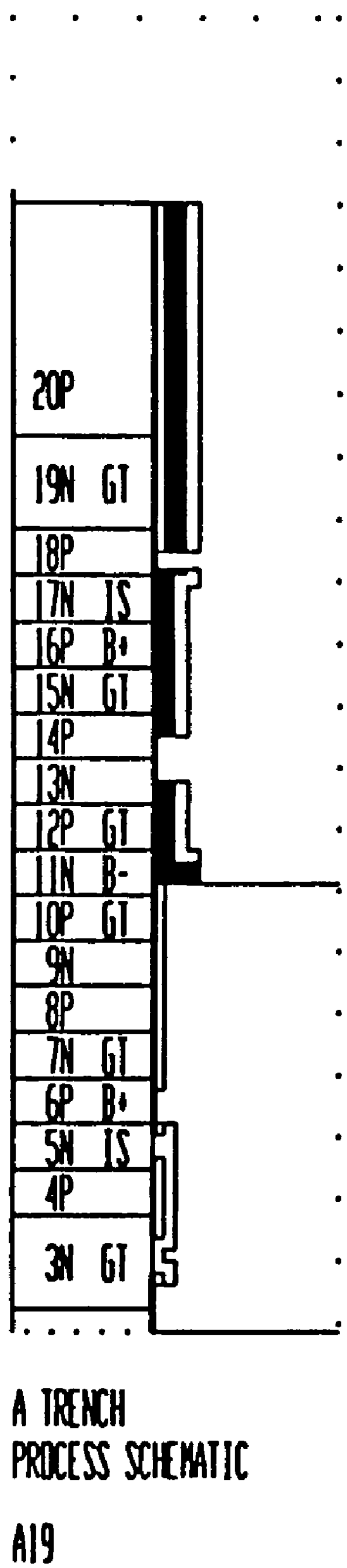

FIG. 247 depicts the left wall, with the non-vertical surfaces cleared of first metal and first insulating material.

Figure 248:
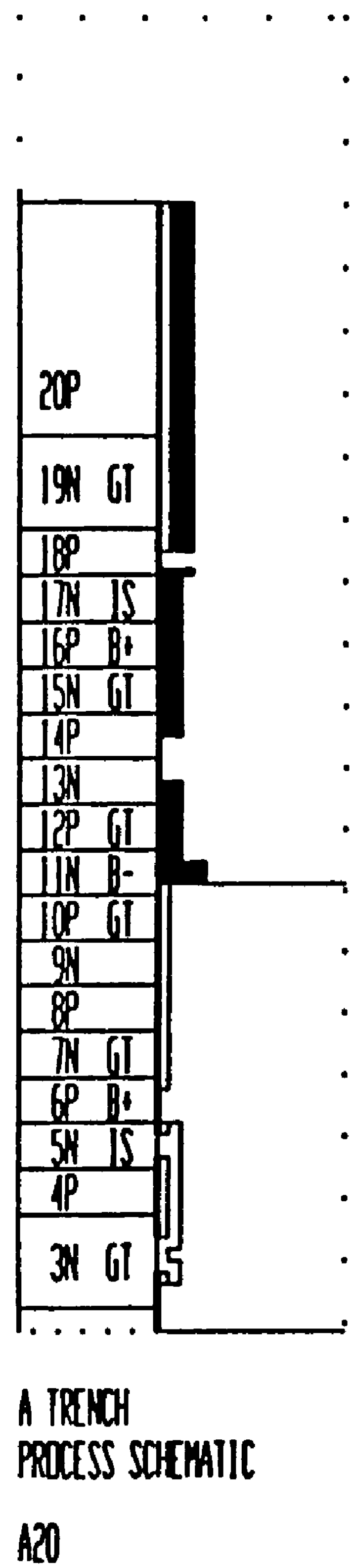

FIG. 248 depicts the left wall, with the first metal layer removed.

Figure 249:
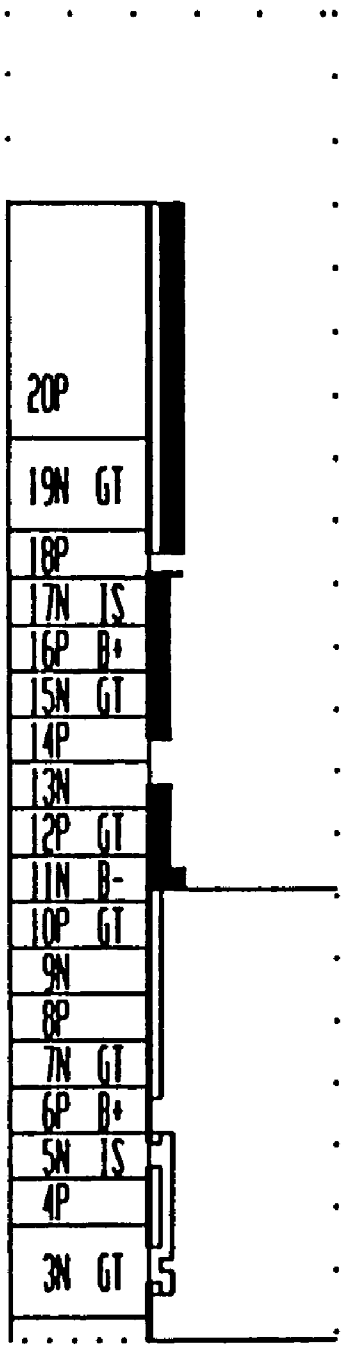

FIG. 249 depicts the left wall, with a shorter tab of first insulating material.

Figure 250:
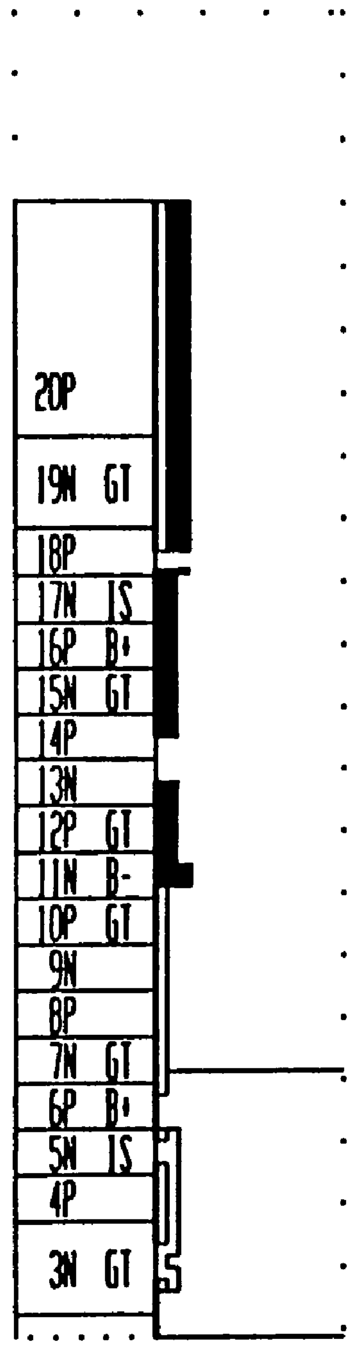

FIG. 250 depicts the left wall, with the plug of second insulating material at a lower level.

Figure 251:
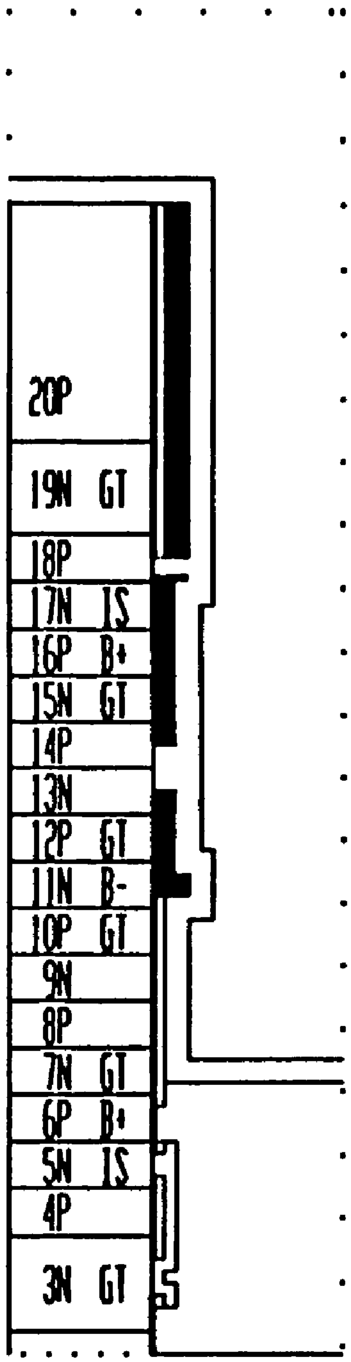

FIG. 251 depicts the left wall, with a layer of first metal covering all surfaces.

Figure 252:
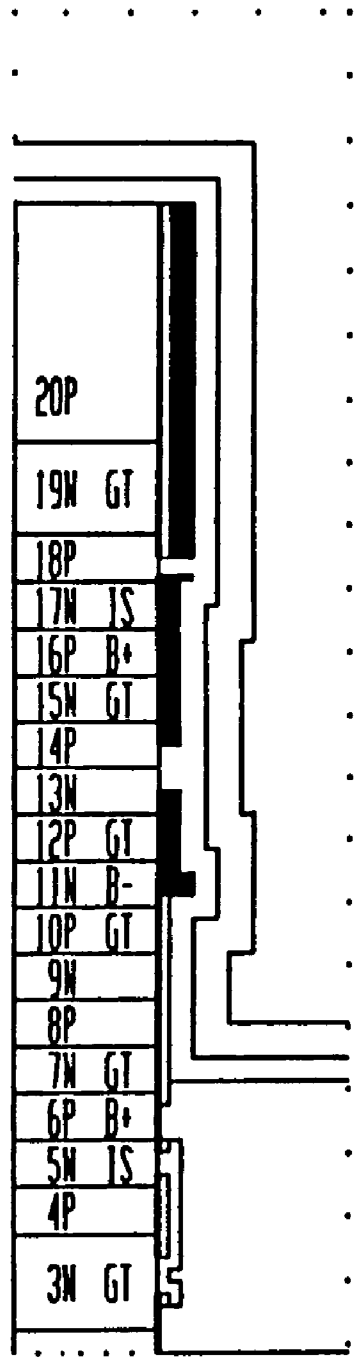

FIG. 252 depicts the left wall, with a further layer of second insulating material covering all surfaces.

Figure 253:
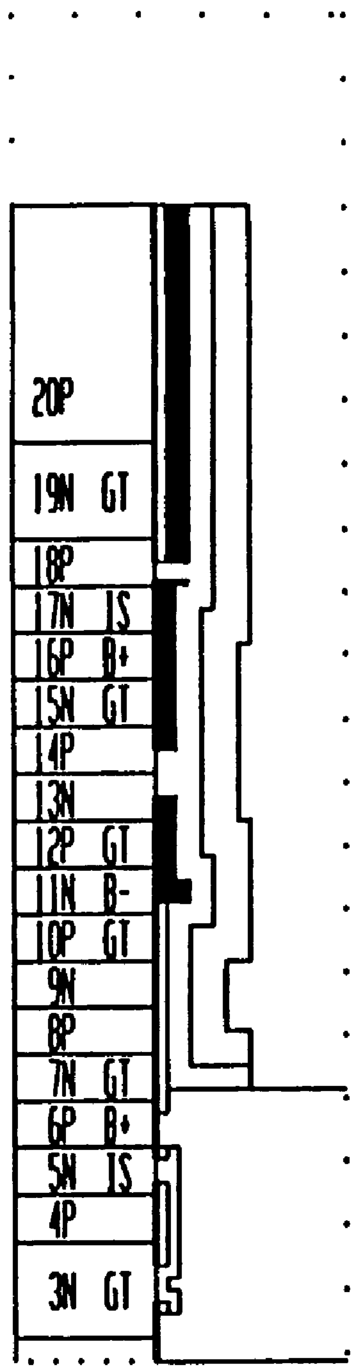

FIG. 253 depicts the left wall, with the layers of second insulating material and first metal removed from the non-vertical surfaces.

Figure 254:
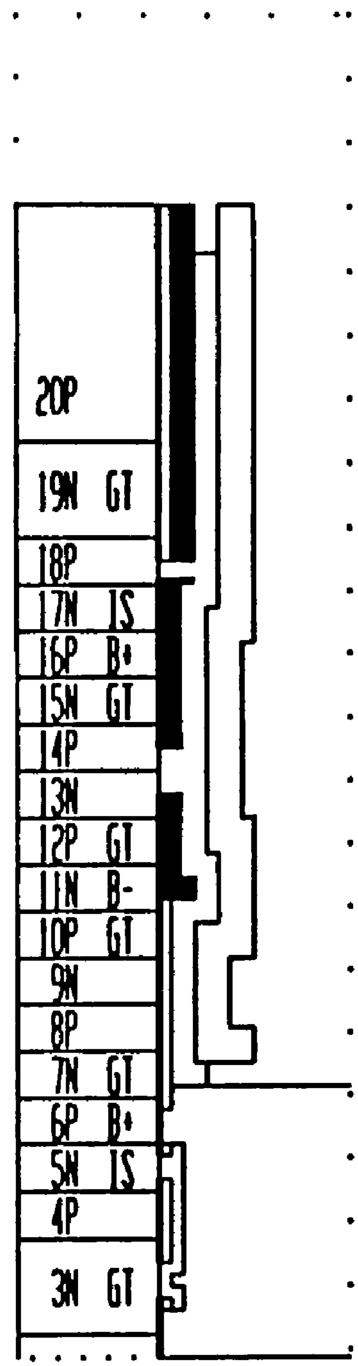

FIG. 254 depicts the left wall, with the layer of first metal receded beneath the layer of second insulating material.

Figure 255:
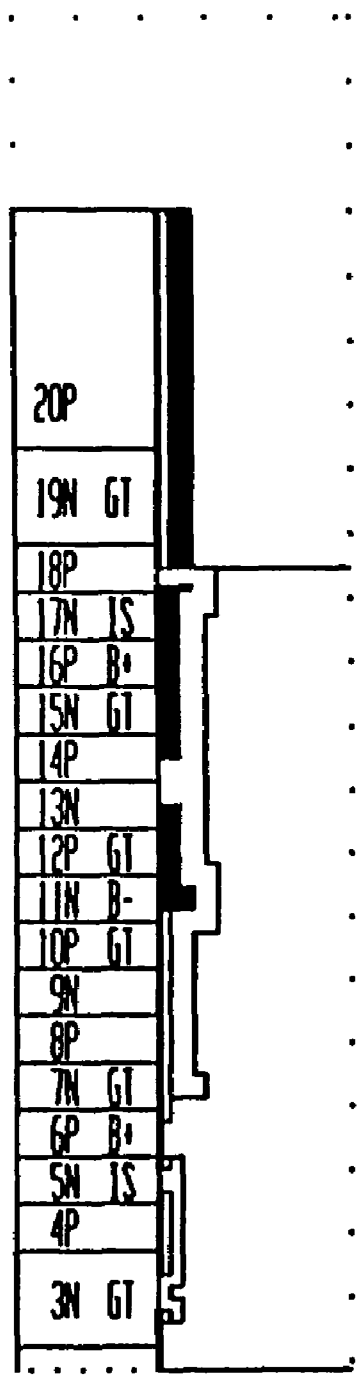

FIG. 255 depicts the left wall, with the layer of first metal removed above a plug of second insulating material.

Figure 256:
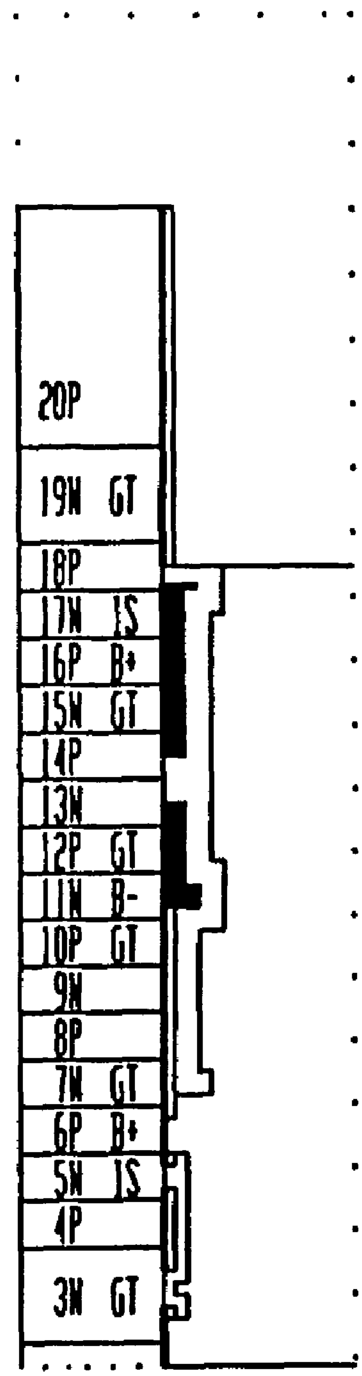

FIG. 256 depicts the left wall, with the layer of first insulating material removed above the plug of second insulating material.

Figure 257:
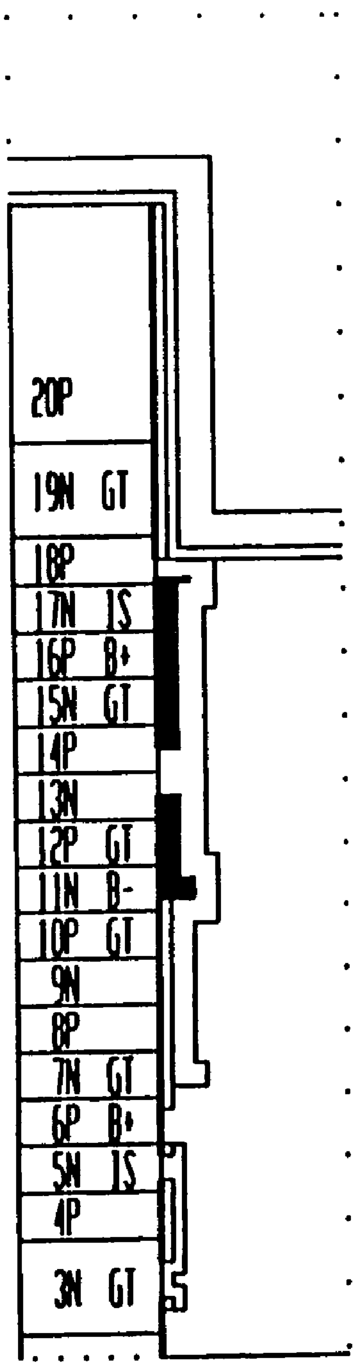

FIG. 257 depicts the left wall, with a thick layer of first metal above a thin layer of second insulating material covering all surfaces.

Figure 258:
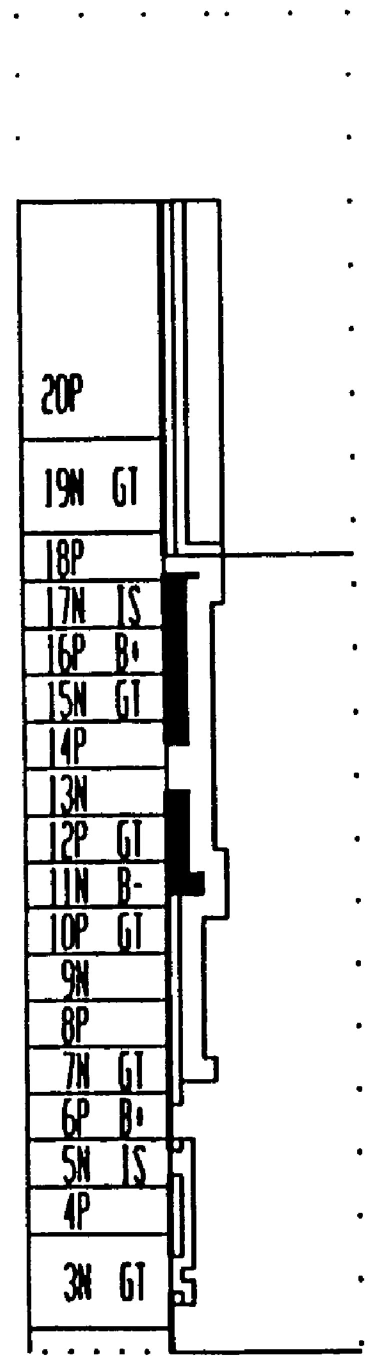

FIG. 258 depicts the left wall, with the layers of first metal and second insulating material removed from the non-vertical surfaces.

Figure 259:
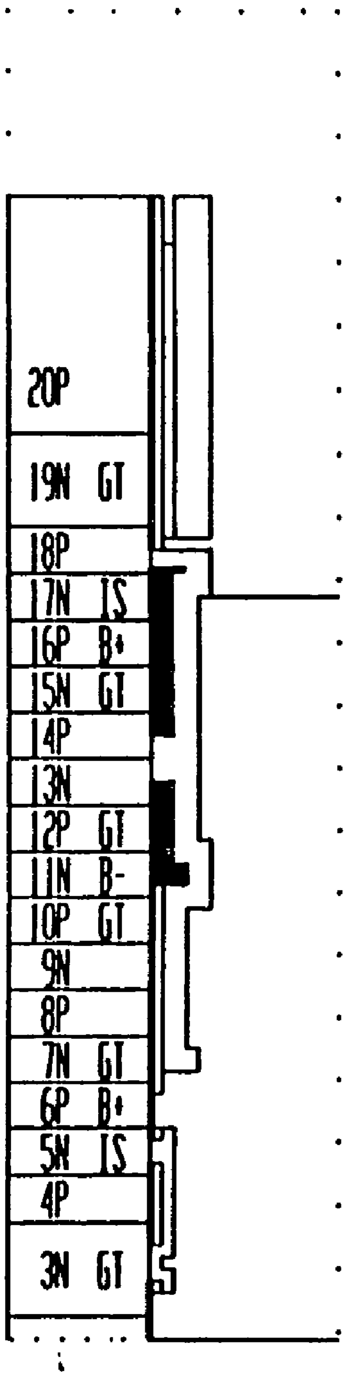

FIG. 259 depicts the left wall, with the layer of second insulating material receded beneath the layer of first metal to expose the semiconductor material layer.

Figure 260:
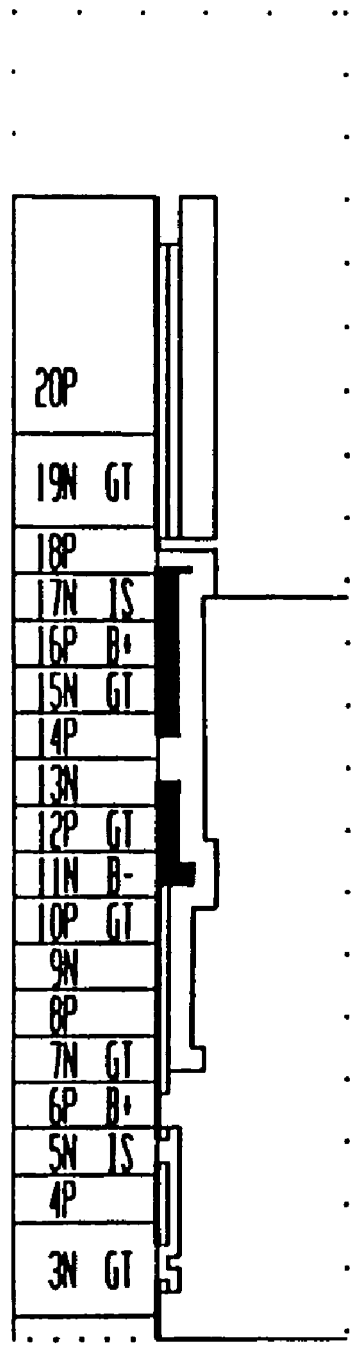

FIG. 260 depicts the left wall, with the layer of semiconductor material in the recess removed.

Figure 261:
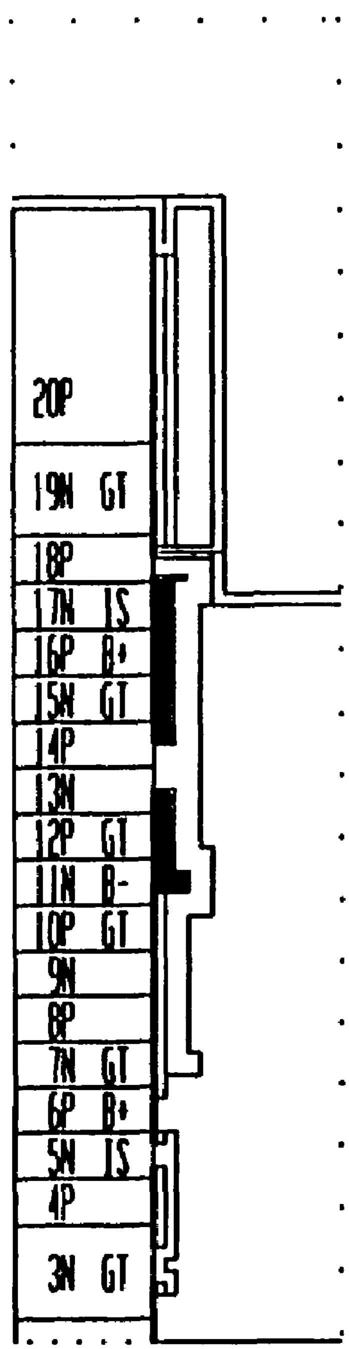

FIG. 261 depicts the left wall, with a layer of first insulating material covering all surfaces and filling all recesses.

Figure 262:
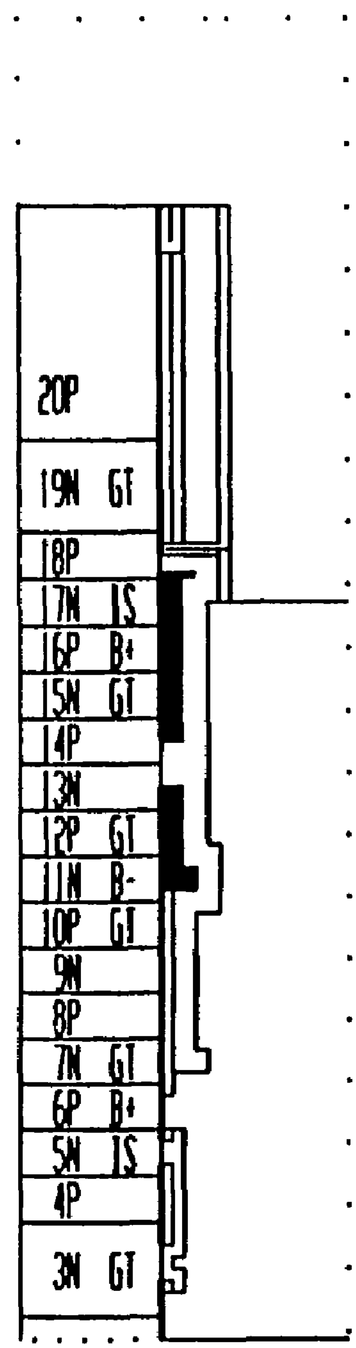

FIG. 262 depicts the left wall, with all non-vertical surfaces cleared of first insulating material.

Figure 263:
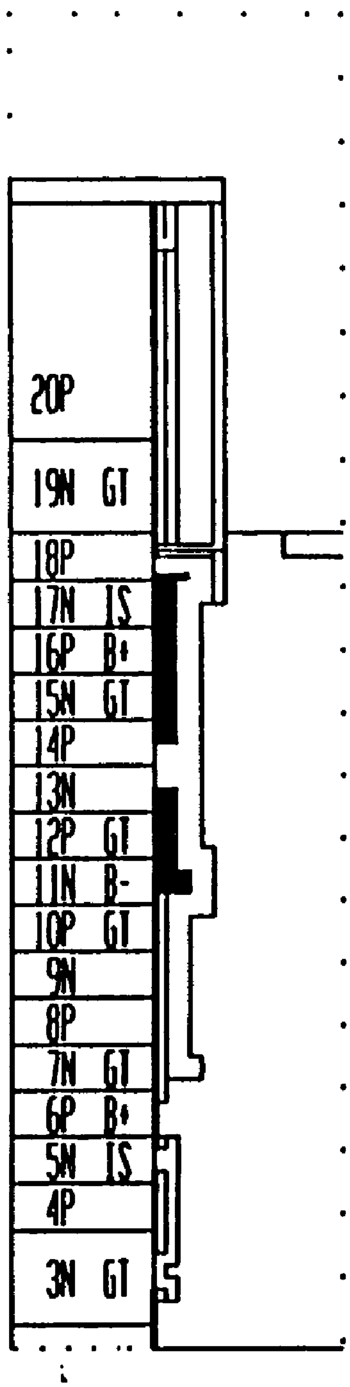

FIG. 263 depicts the left wall, with a protective layer covering the top surface and with the plug of second insulating material higher.

Figure 264:
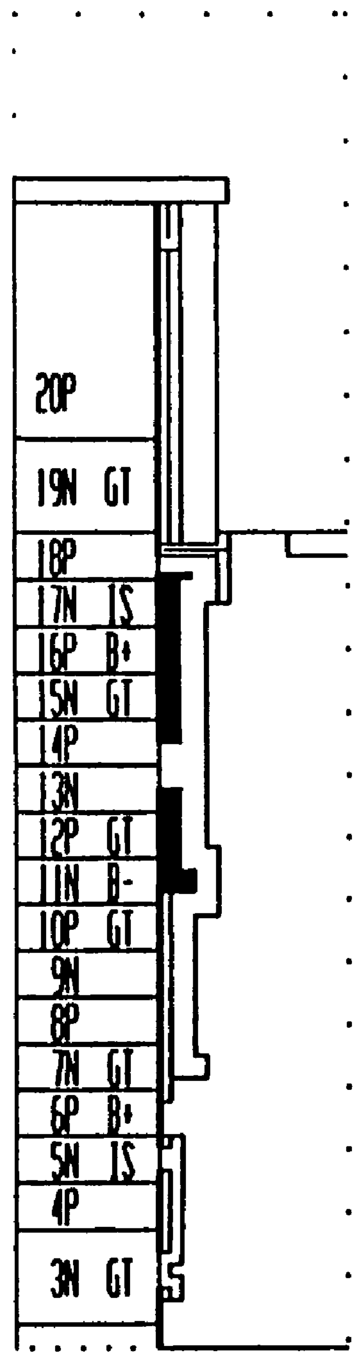

FIG. 264 depicts the left wall, cleared of exposed first insulating material.

Figure 265:
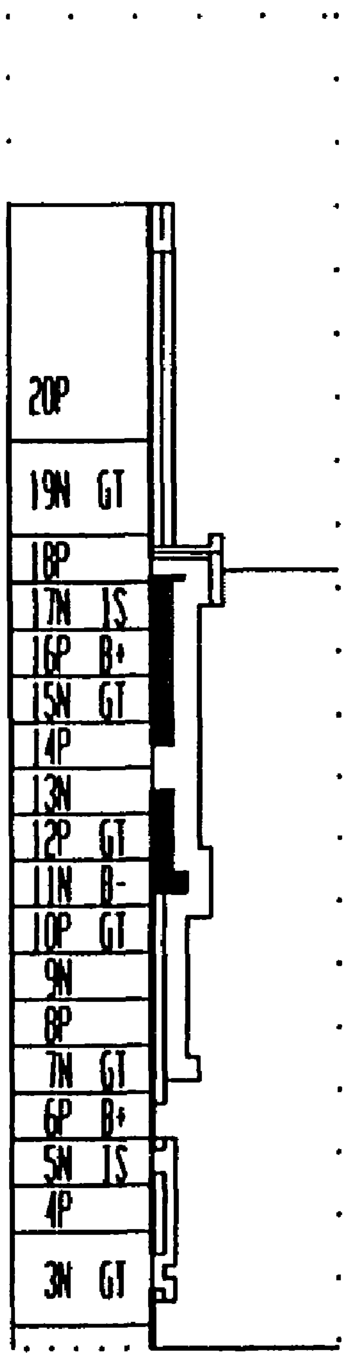

FIG. 265 depicts the left wall, with the protective layer at the top and all exposed first metal removed.

Figure 266:
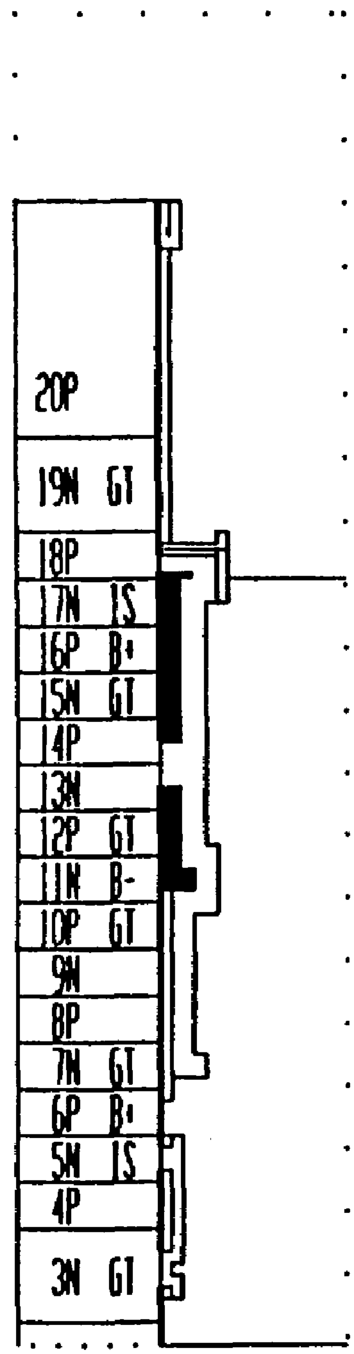

FIG. 266 depicts the left wall, cleared of exposed second insulating material and with the plug of second insulating material slightly lowered.

Figure 267:
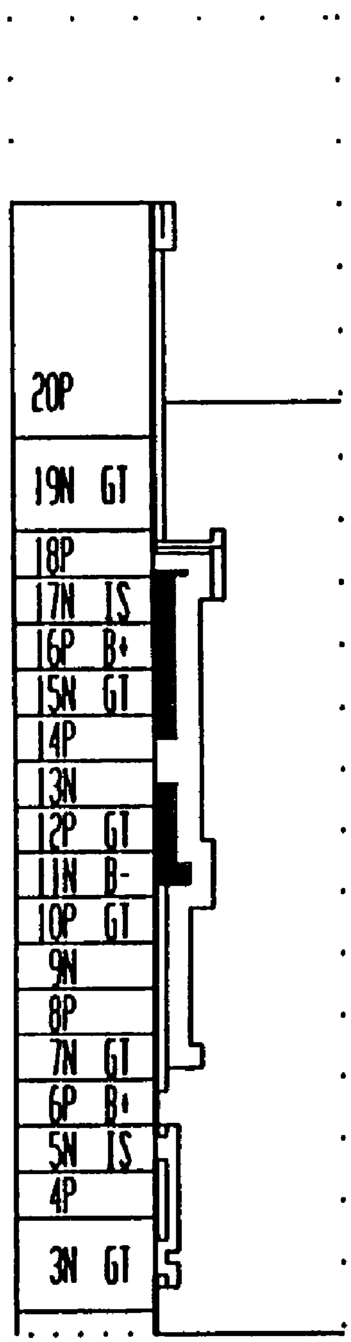

FIG. 267 depicts the left wall, with the plug of second insulating material at a higher level.

Figure 268:
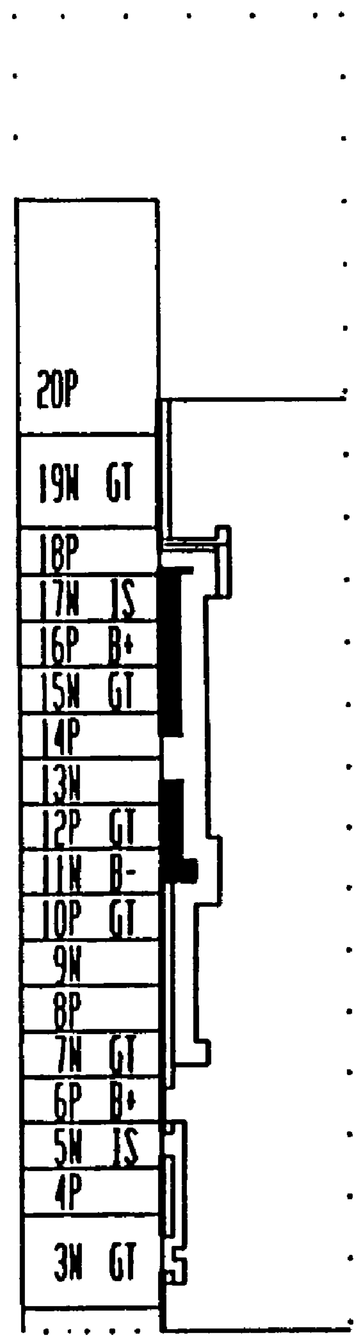

FIG. 268 depicts the left wall, cleared of the layers of semiconductor and first insulating materials above the plug.

Figure 269:
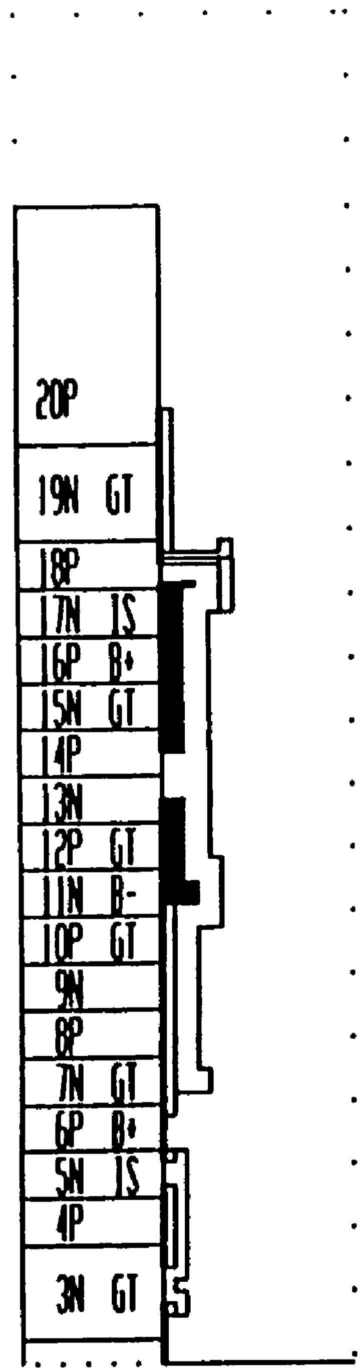

FIG. 269 depicts the left wall, cleared of the plug of second insulating material.

Figure 270:
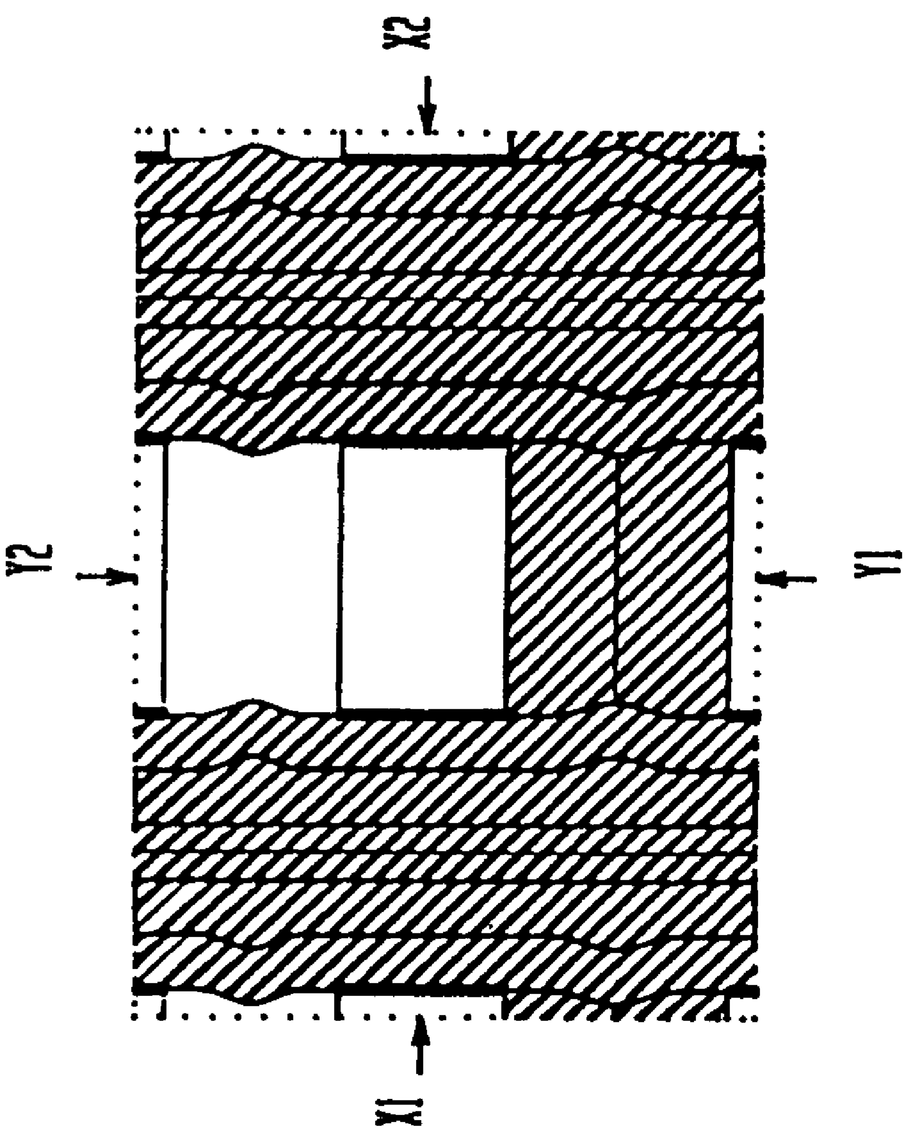
Figure 272:
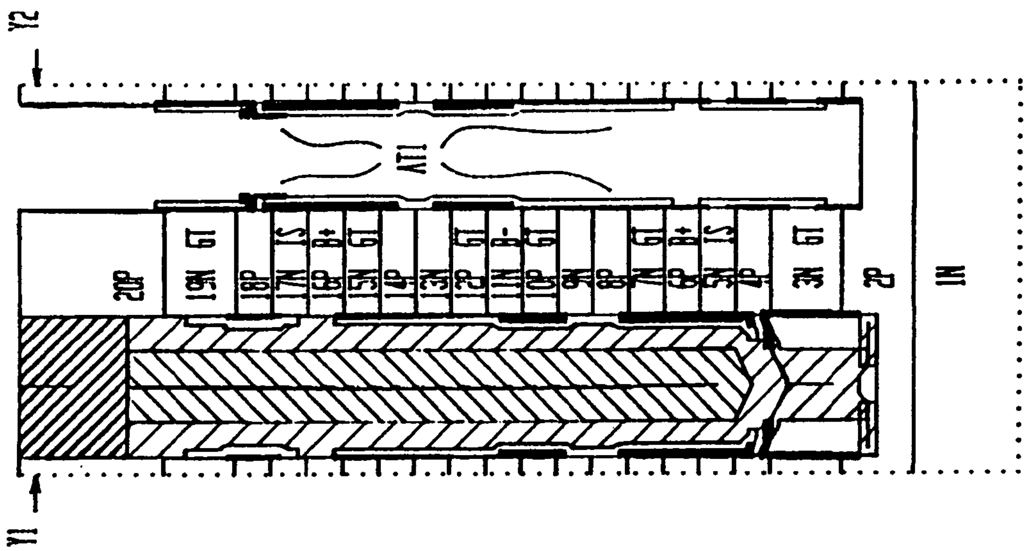
Figure 271:
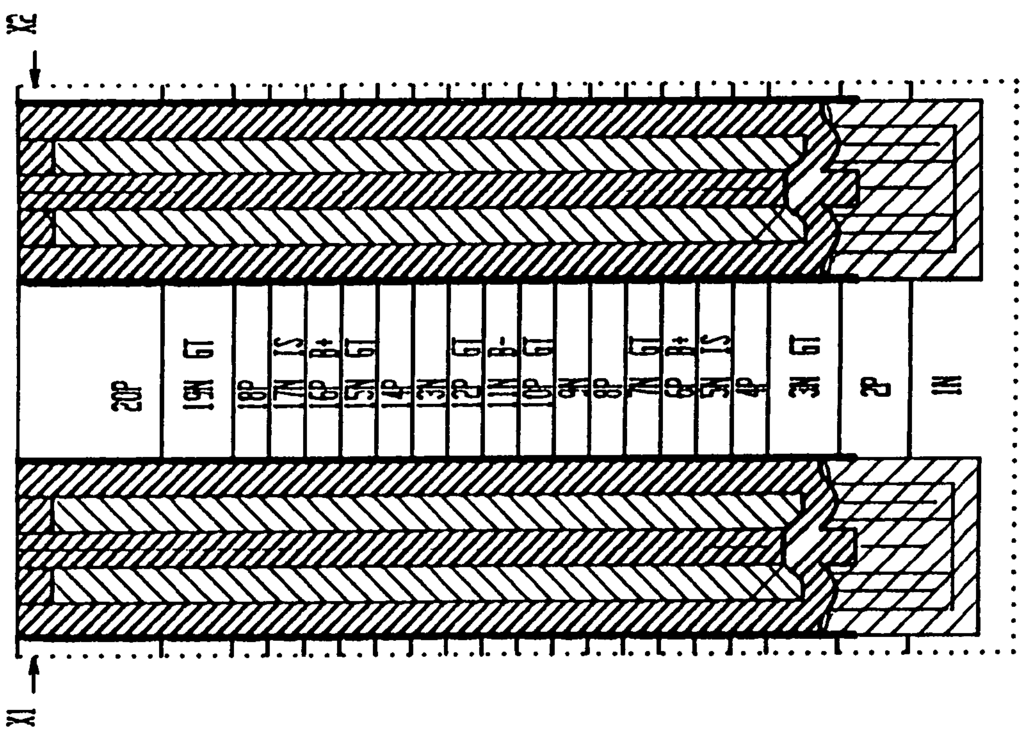

FIGS. 270, 271 and 272 depict three mutually orthogonal cross-sections of the structure of FIG. 269 more completely and detailed.

Figure 273:
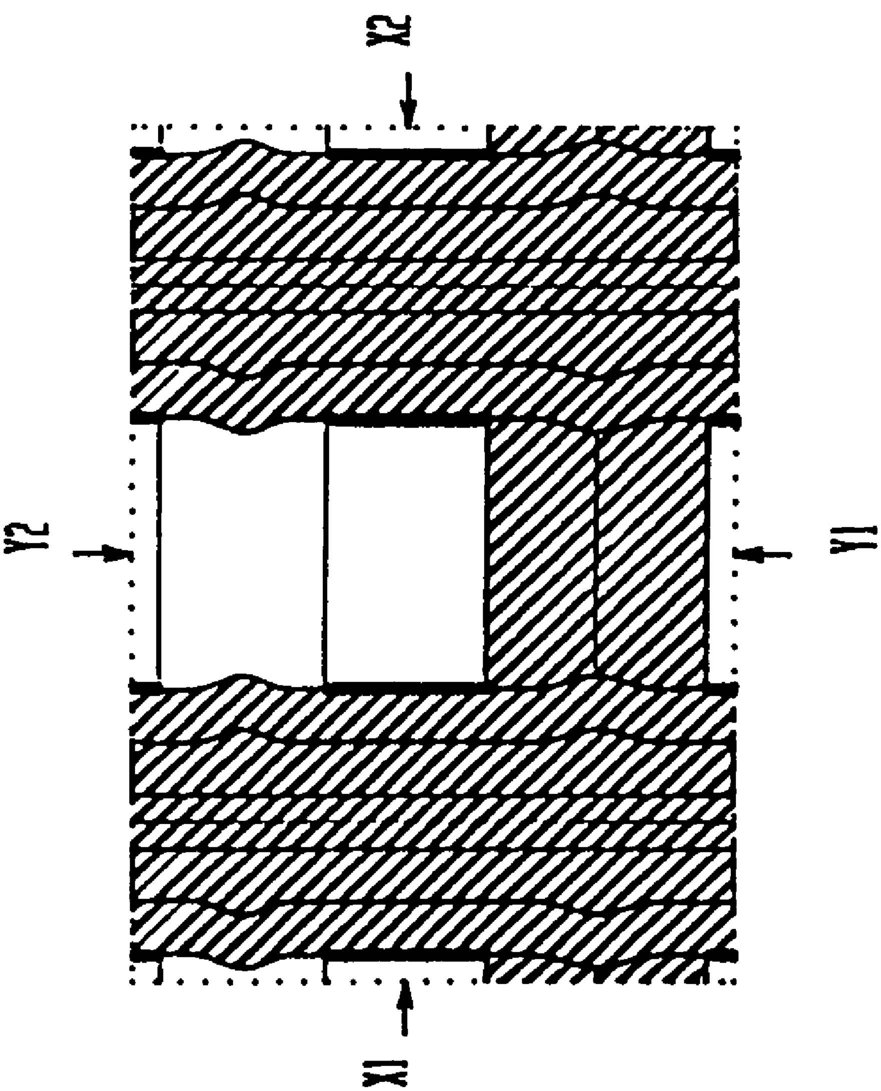
Figure 275:
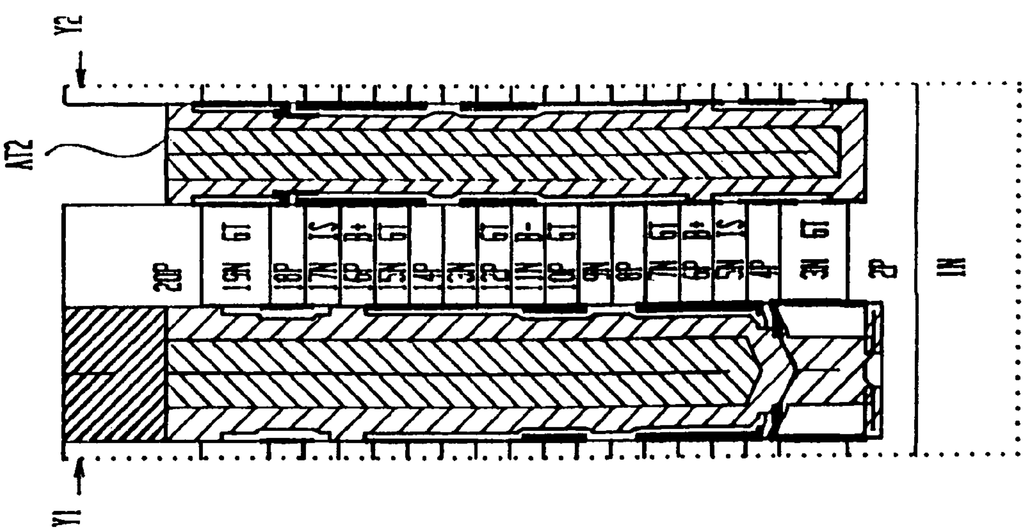
Figure 274:
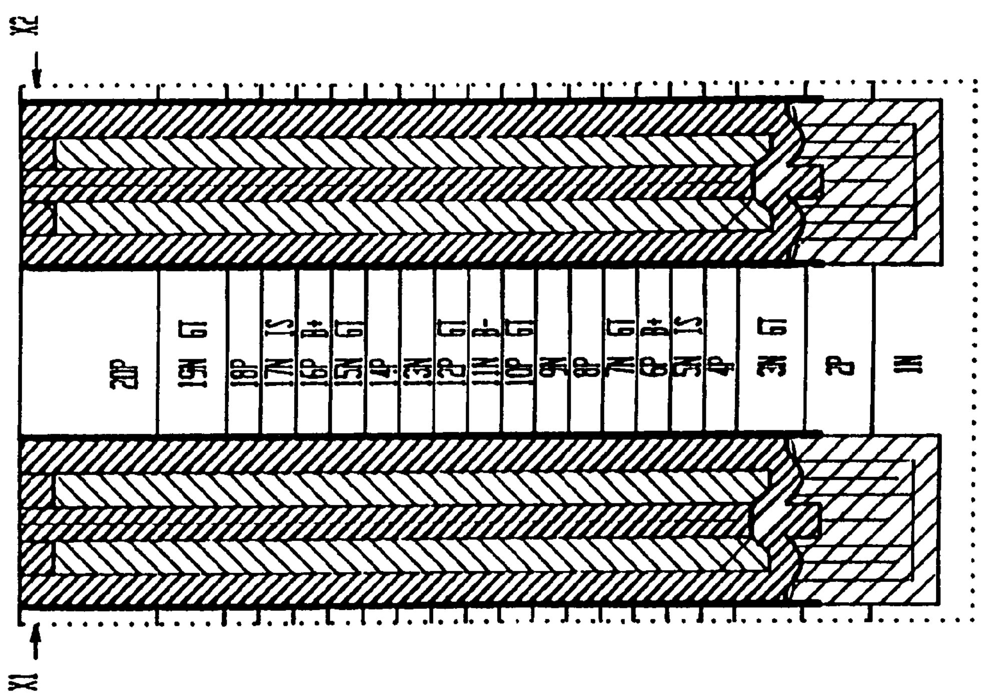

FIGS. 273, 274 and 275 depict three mutually orthogonal cross-sections with the narrowest trench filled up to a preferred height with a thick layer of first insulating material and a core of second insulating material.

Figure 276:
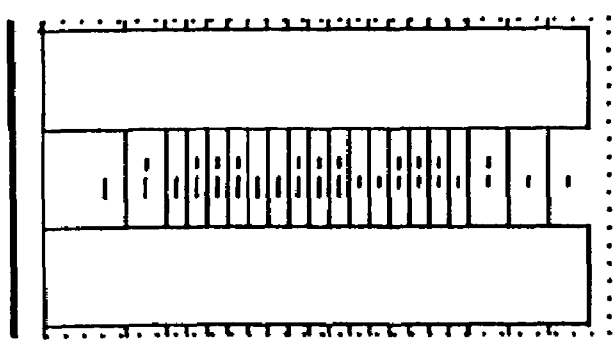
Figure 277:
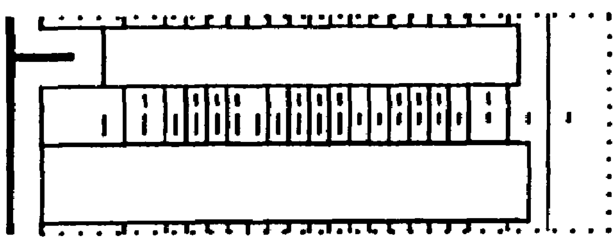

FIGS. 276 and 277 depict the two vertical cross-sections, with a layer of third insulating material covering all surfaces and closing the narrowest trench.

Figure 278:
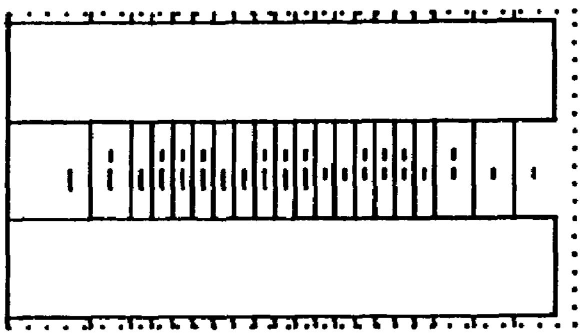
Figure 279:
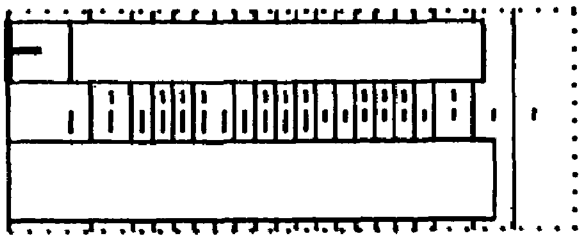

FIGS. 278 and 279 depict the two vertical cross-sections, with a plug of third insulating material left at the top of the narrowest trench.

Figure 280:
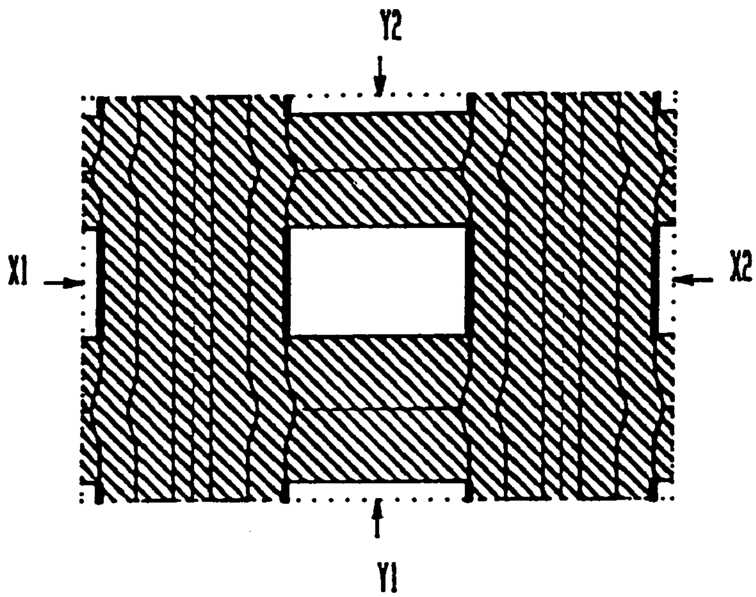
Figure 281:
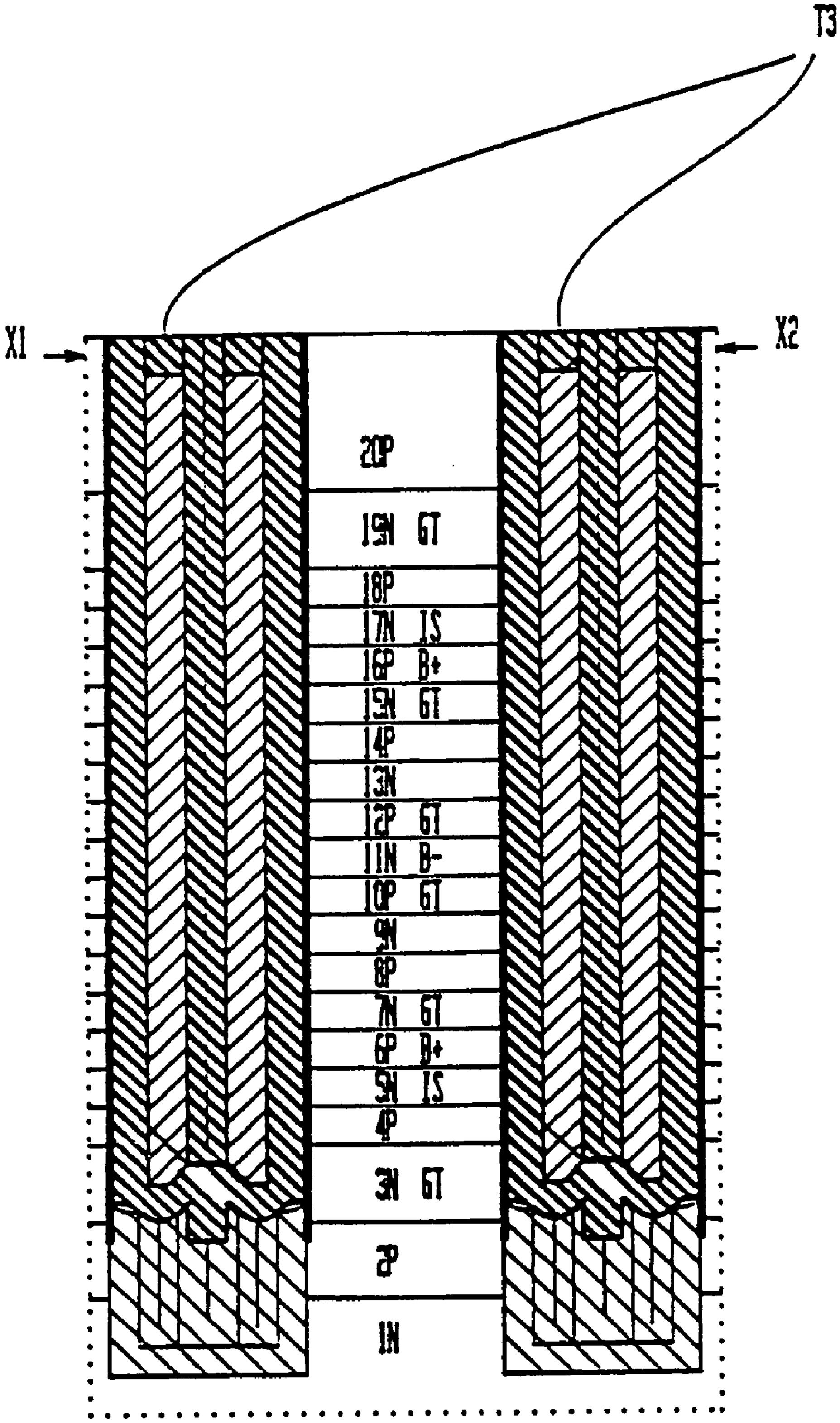
Figure 282:
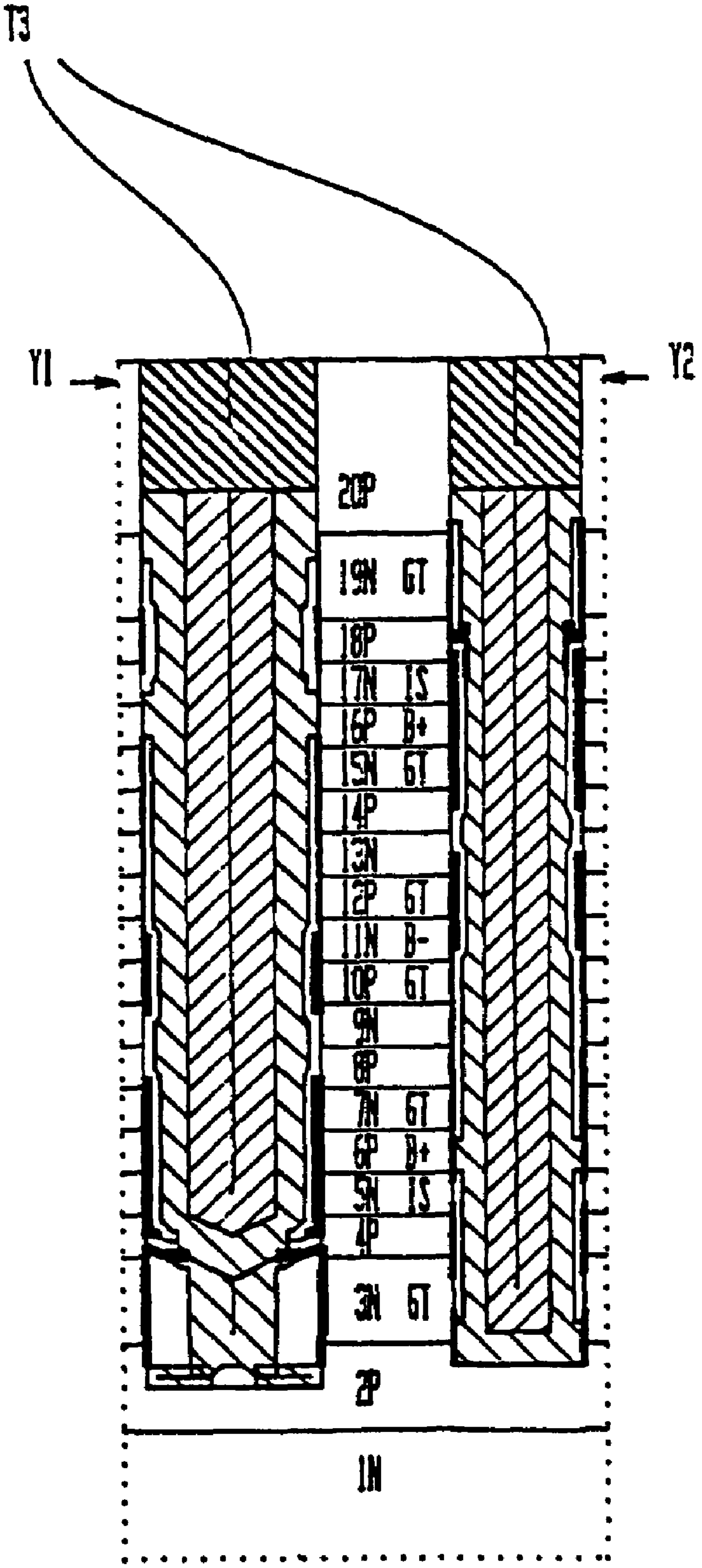

FIGS. 280, 281 and 282 depict three mutually orthogonal cross-sections of the structure of FIGS. 278 and 279 more completely and detailed.

Figure 283:
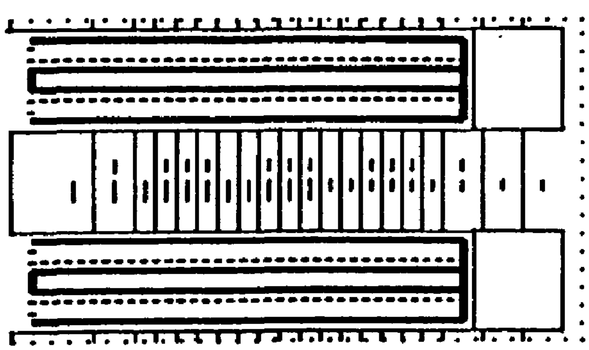
Figure 284:
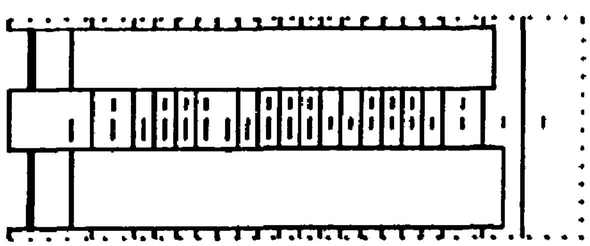

FIGS. 283 and 284 depict the two vertical cross-sections, with third insulating material covering only the tops of the narrower trenches.

Figure 285:
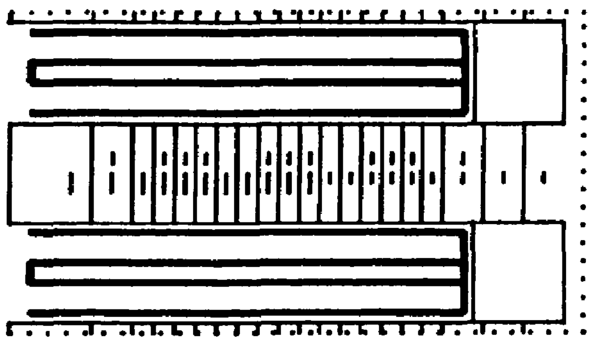
Figure 286:
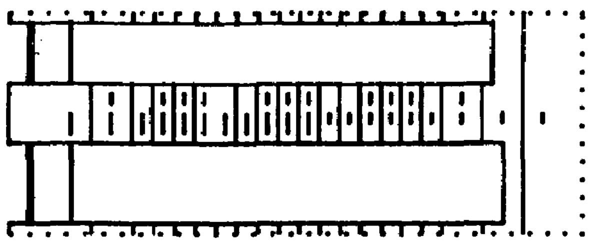

FIGS. 285 and 286 depict the two vertical cross-sections, with the widest trench cleared of second insulating material.

Figure 287:
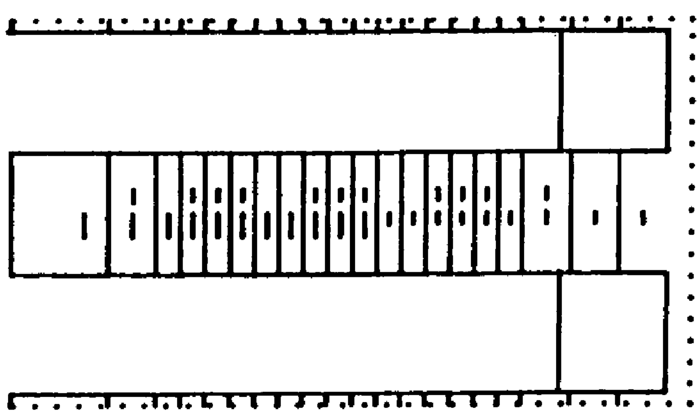
Figure 288:
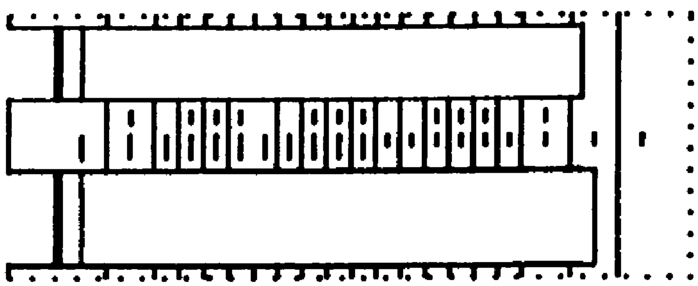

FIGS. 287 and 288 depict the two vertical cross-sections, with the widest trench cleared.

Figure 289:
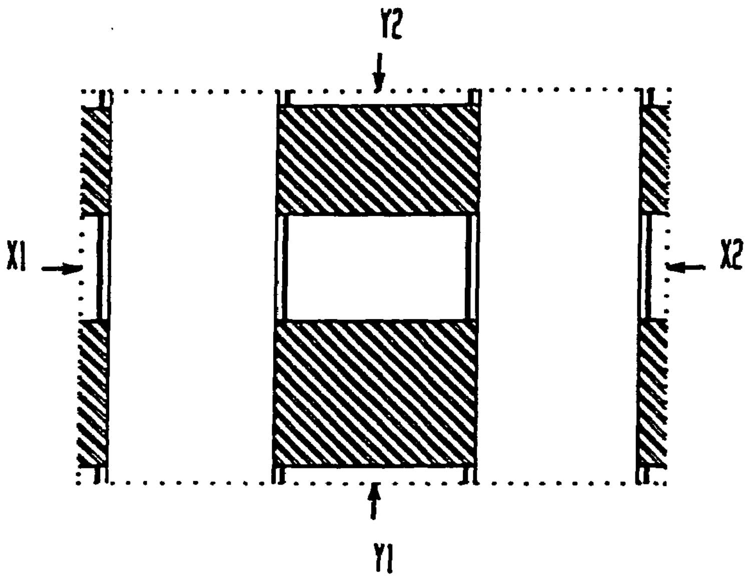
Figure 290:
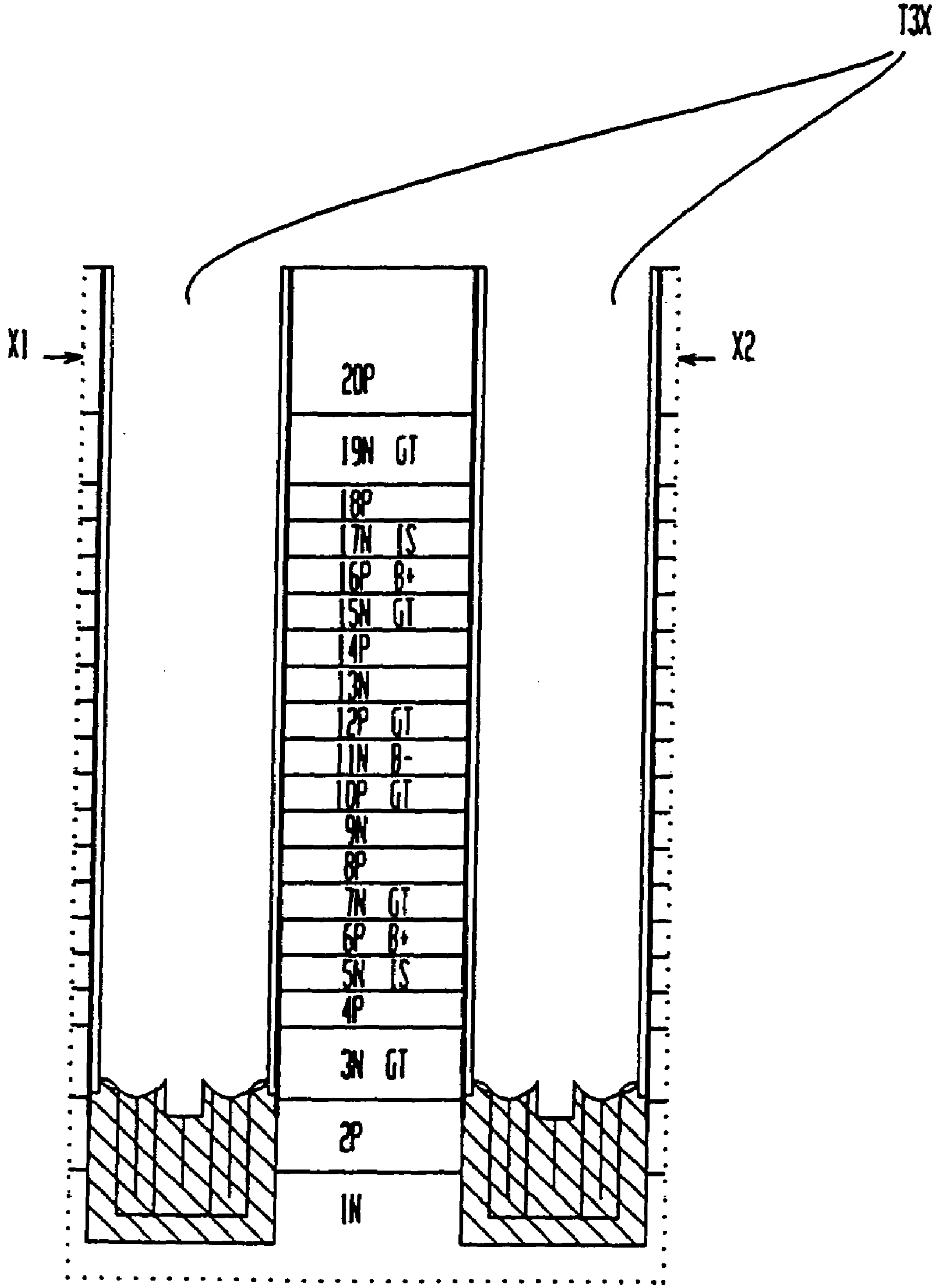
Figure 291:
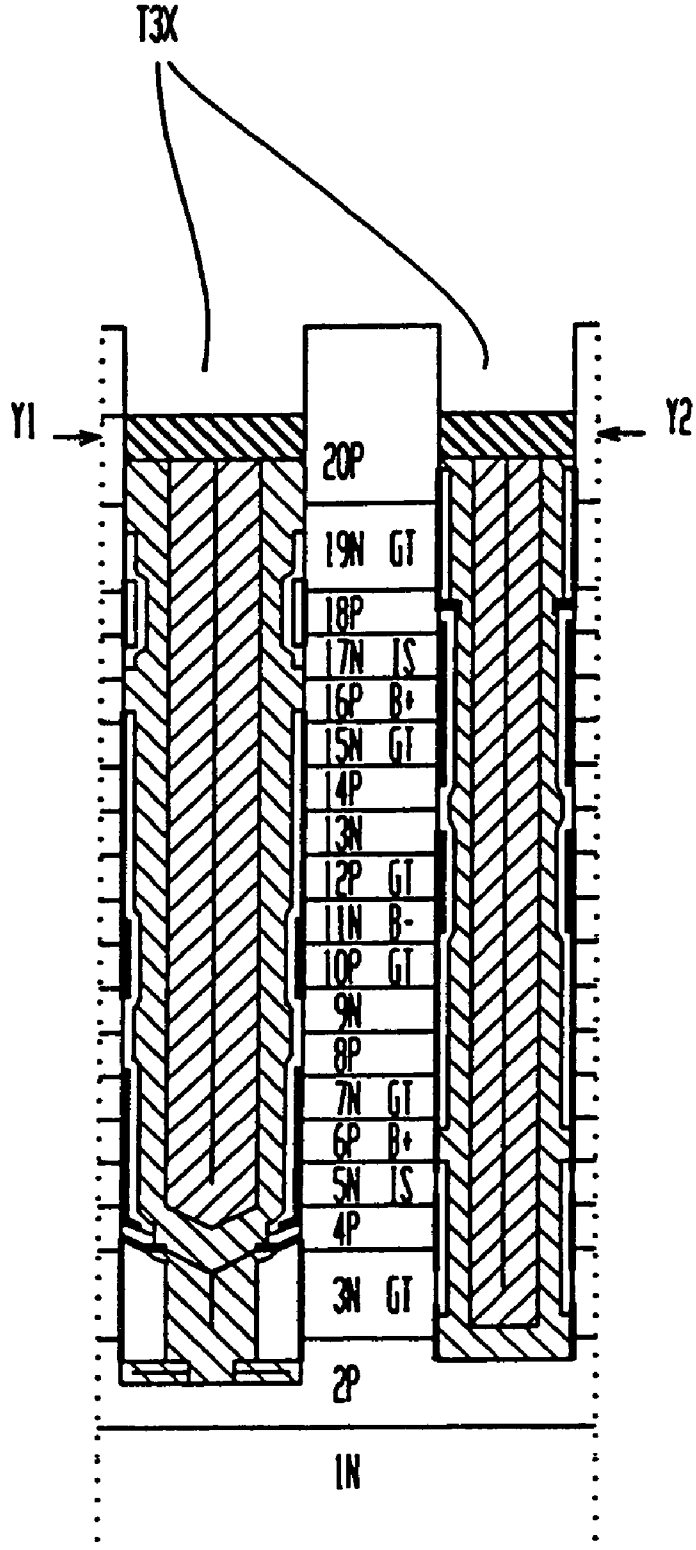

FIGS. 289, 290 and 291 depict three mutually orthogonal cross-sections of the structure of FIGS. 287 and 288 more completely and detailed.

Figure 292:
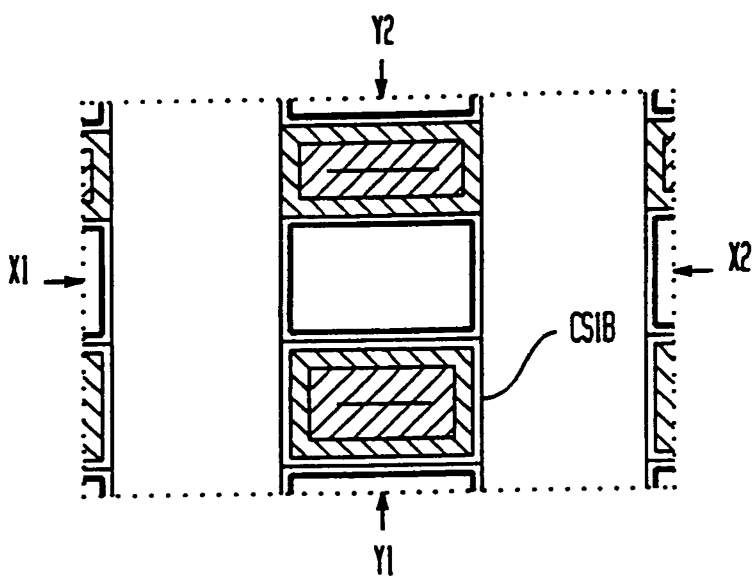
Figure 293:
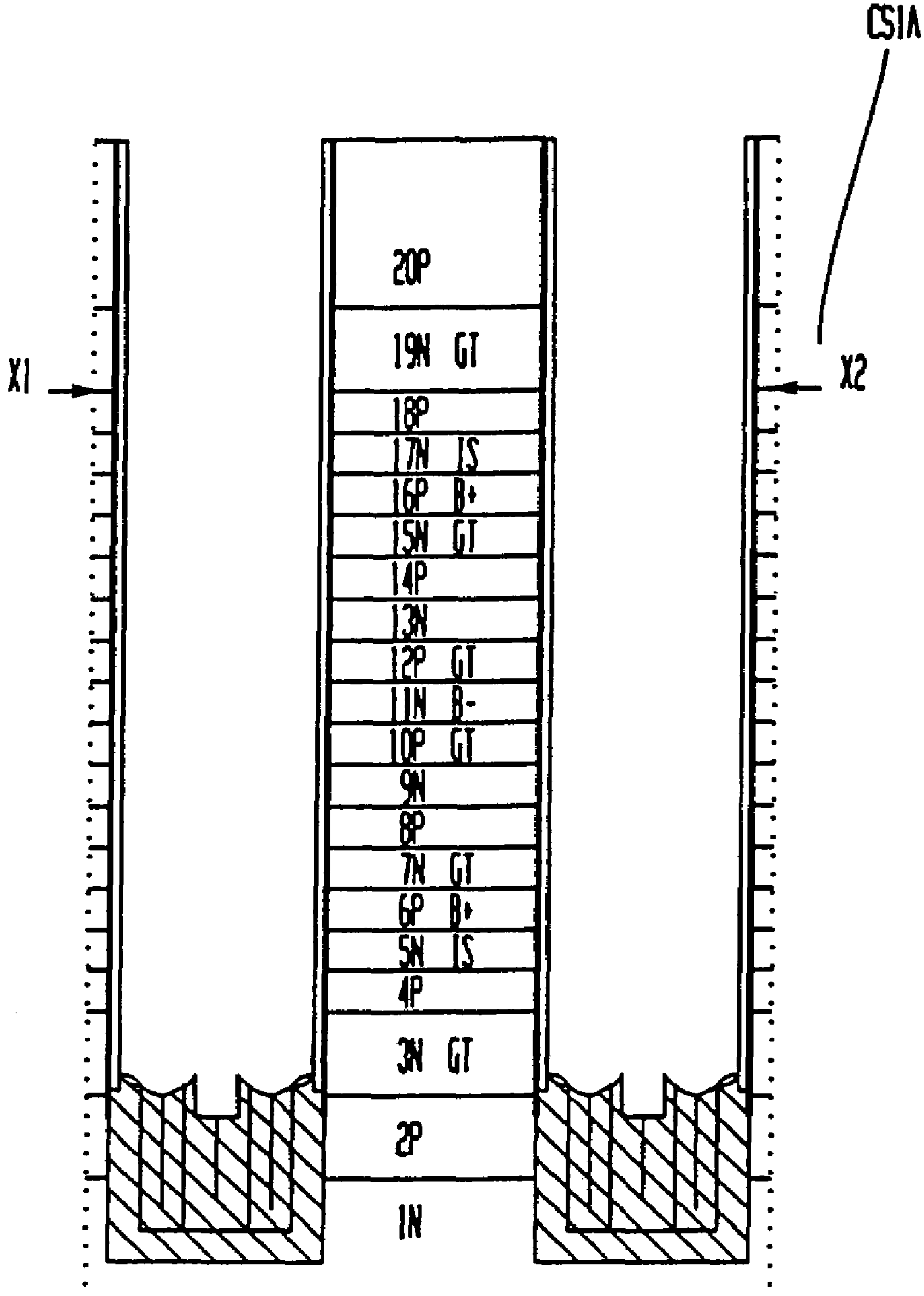
Figure 294:
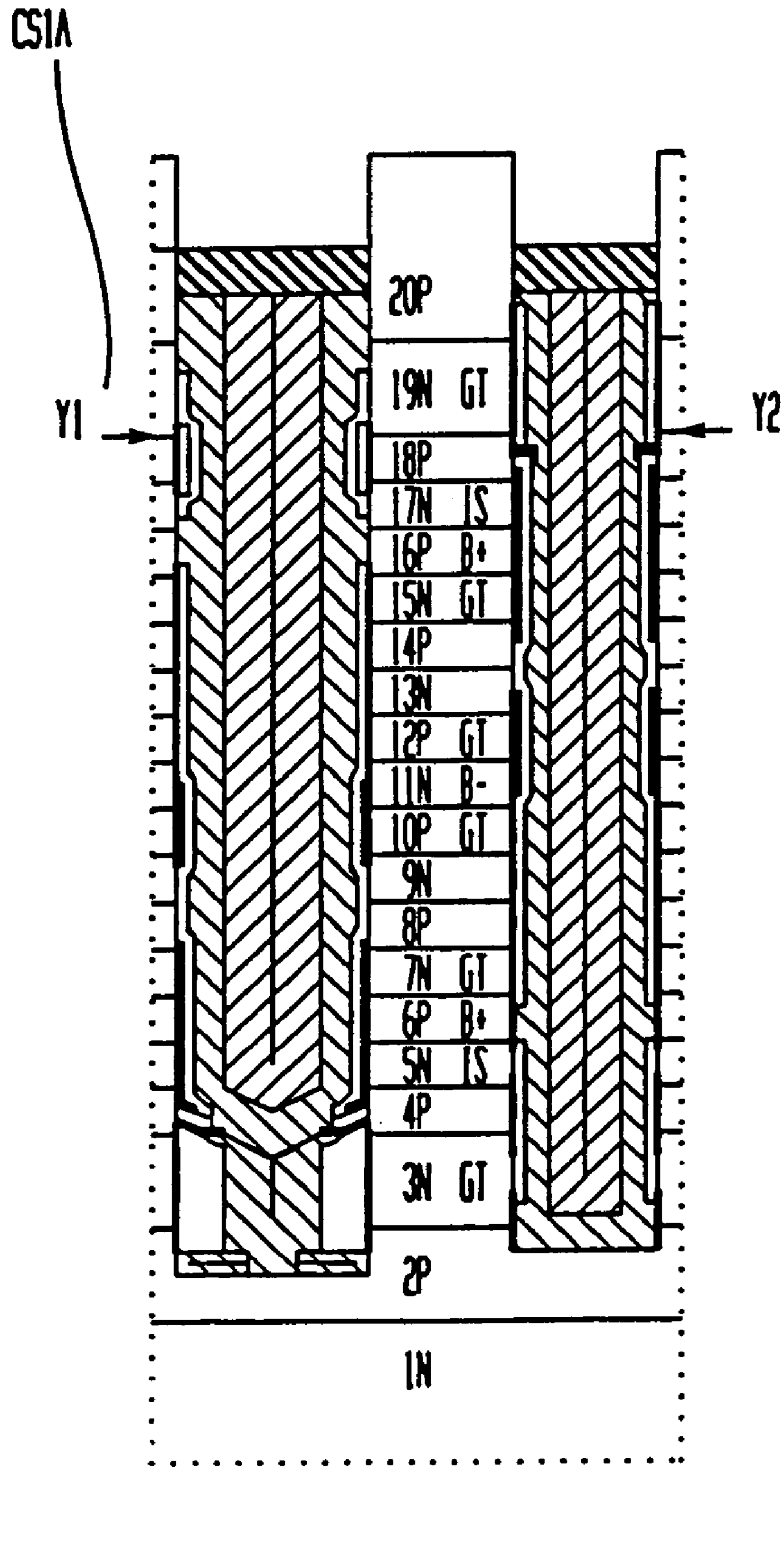

FIGS. 292, 293 and 294 depict three mutually orthogonal cross-sections, with the horizontal cross-section at a different height.

Figure 295:
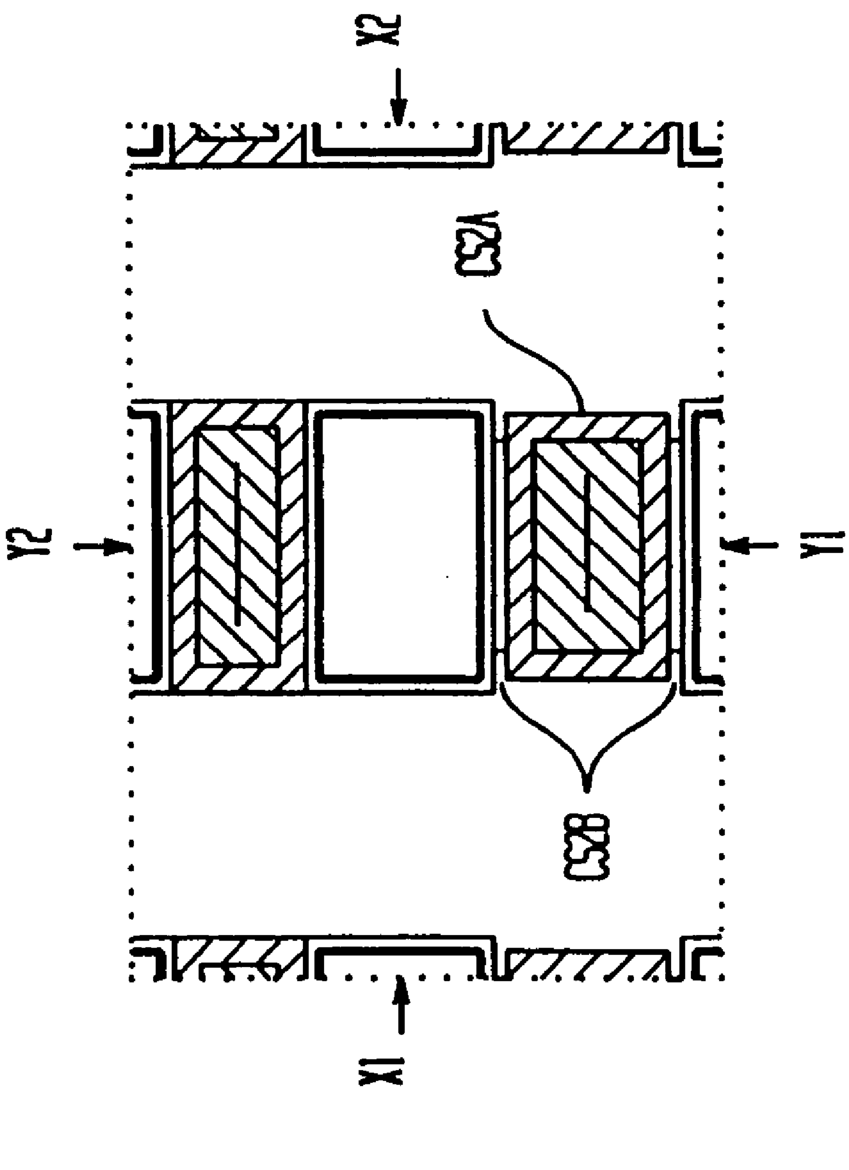
Figure 297:
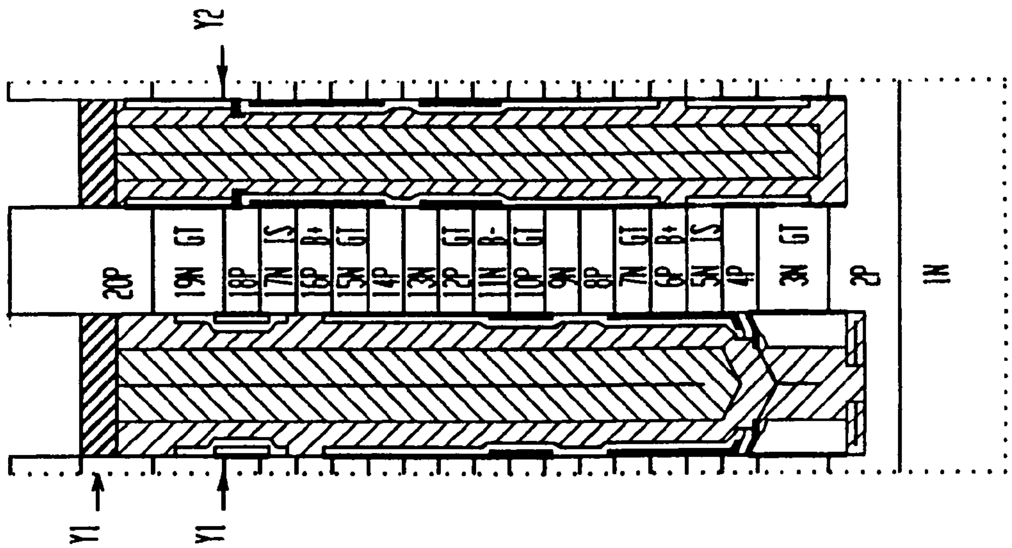
Figure 296:
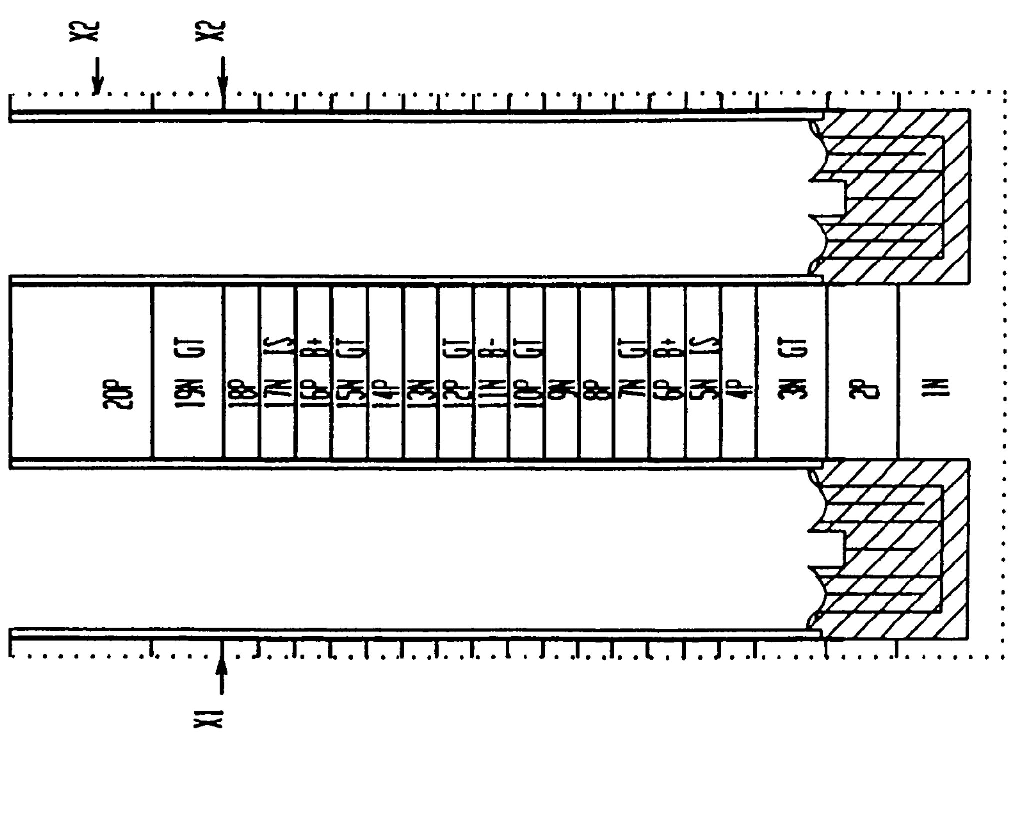

FIGS. 295, 296 and 297 depict three mutually orthogonal cross-sections, with the walls of the widest trench cleared of some layers.

Figure 298:
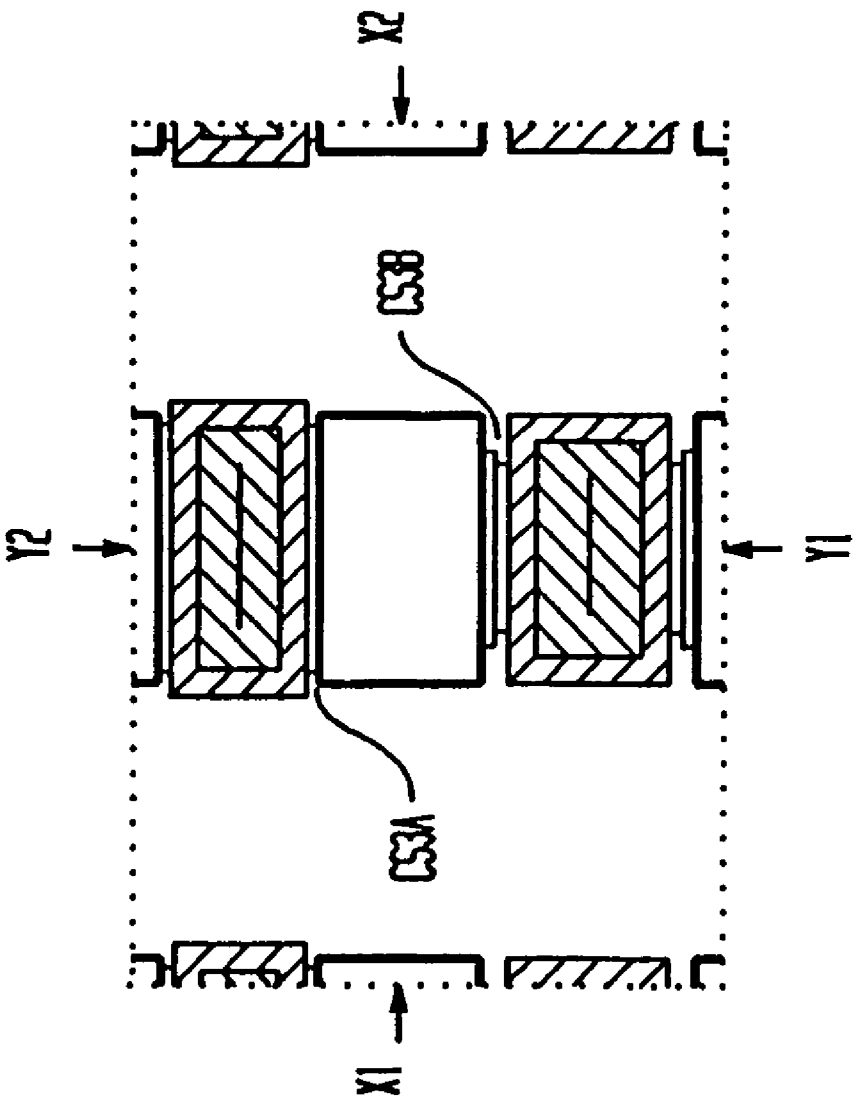
Figure 300:
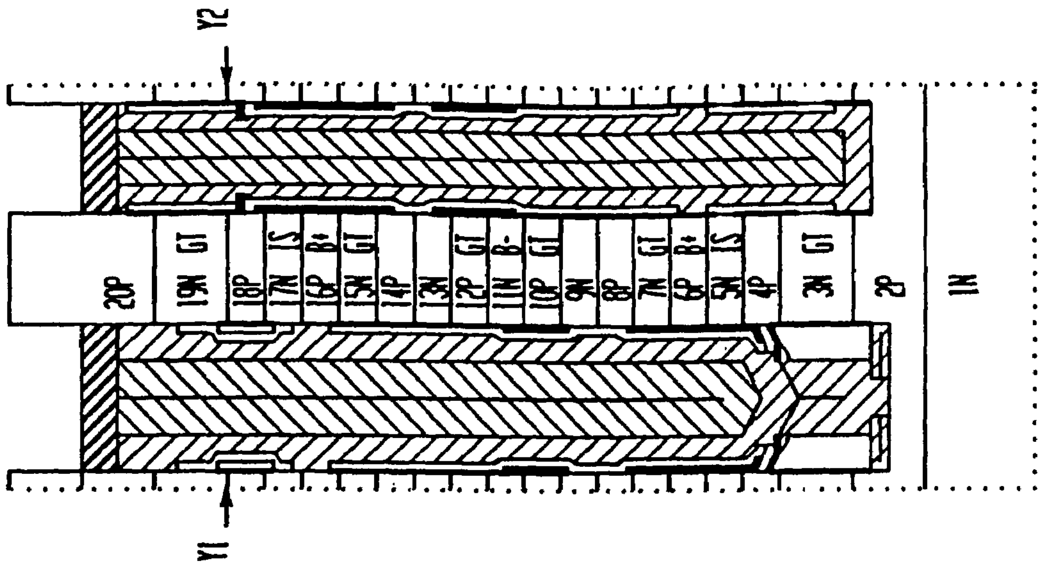
Figure 299:
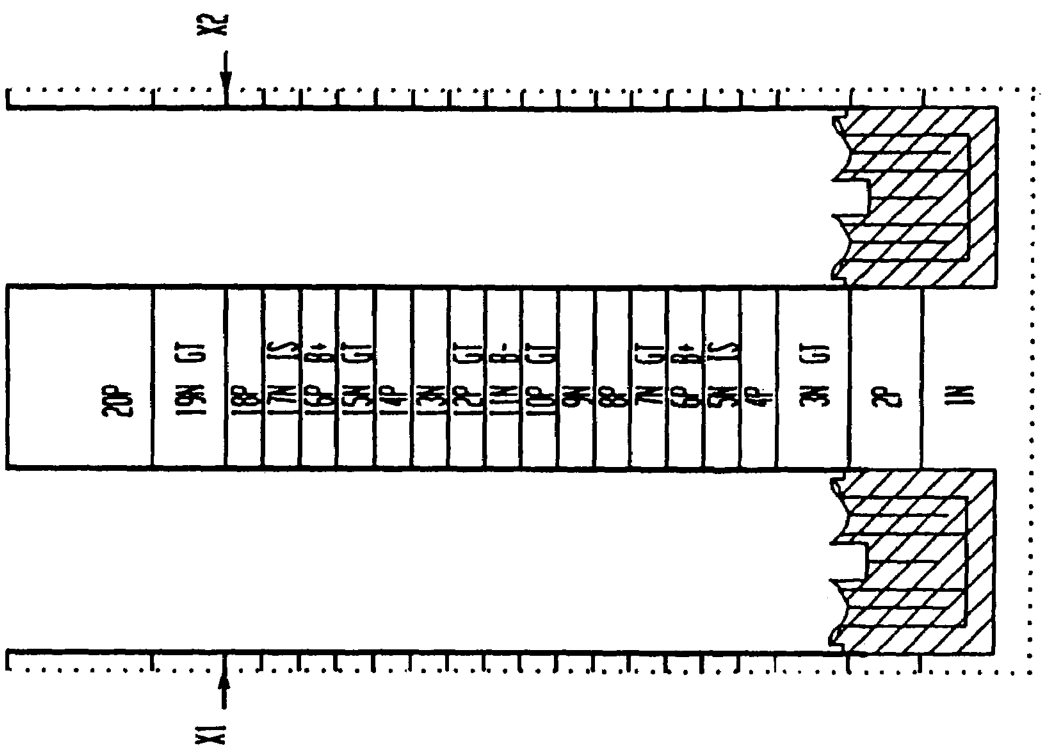

FIGS. 298, 299 and 300 depict three mutually orthogonal cross-sections, with the walls of the widest trench cleared another layer and with some layers receded into the walls of the widest trench.

Figure 301:
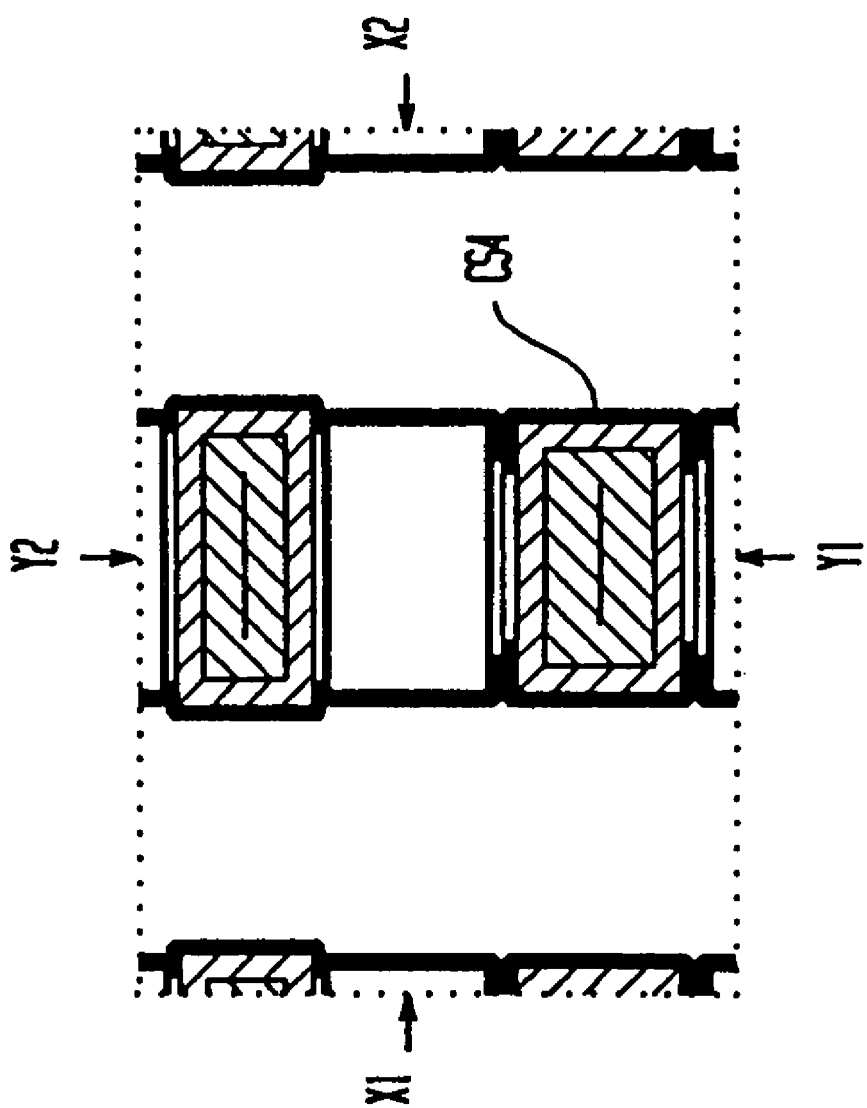
Figure 303:
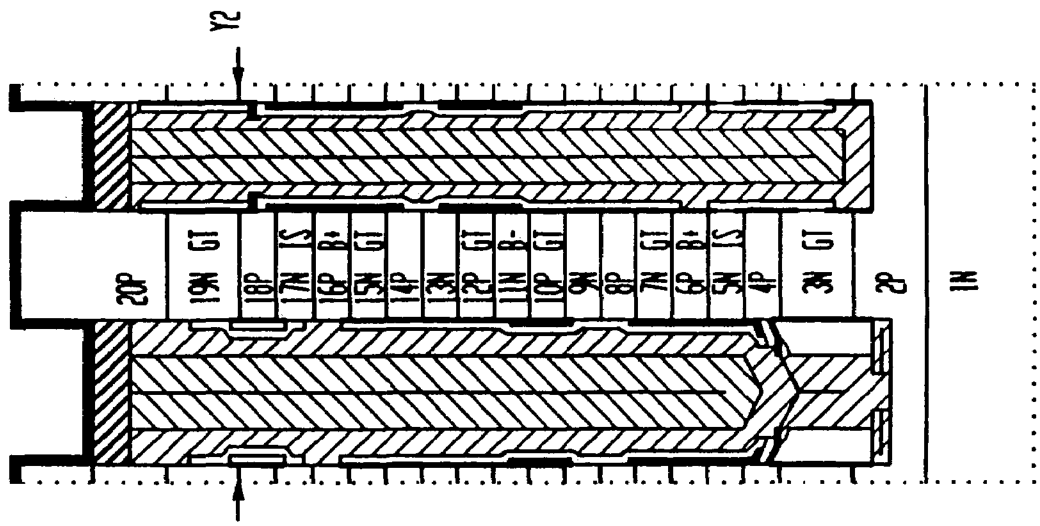
Figure 302:
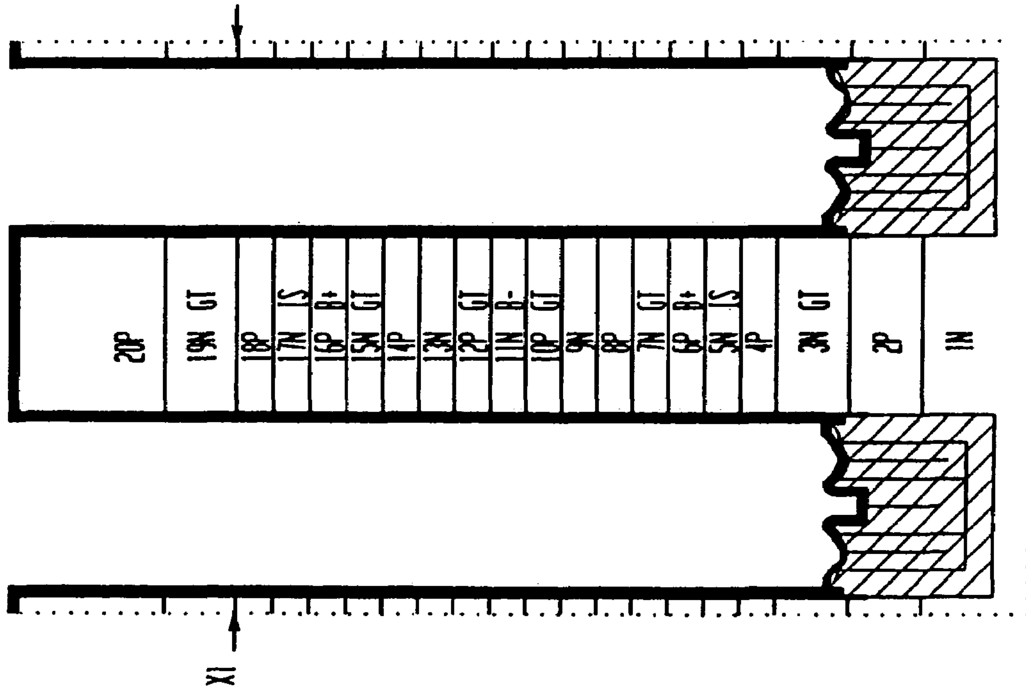

FIGS. 301, 302 and 303 depict three mutually orthogonal cross-sections, with all surfaces covered with a layer of first insulating material which fills the recesses in the walls of the widest trench.

Figure 304:
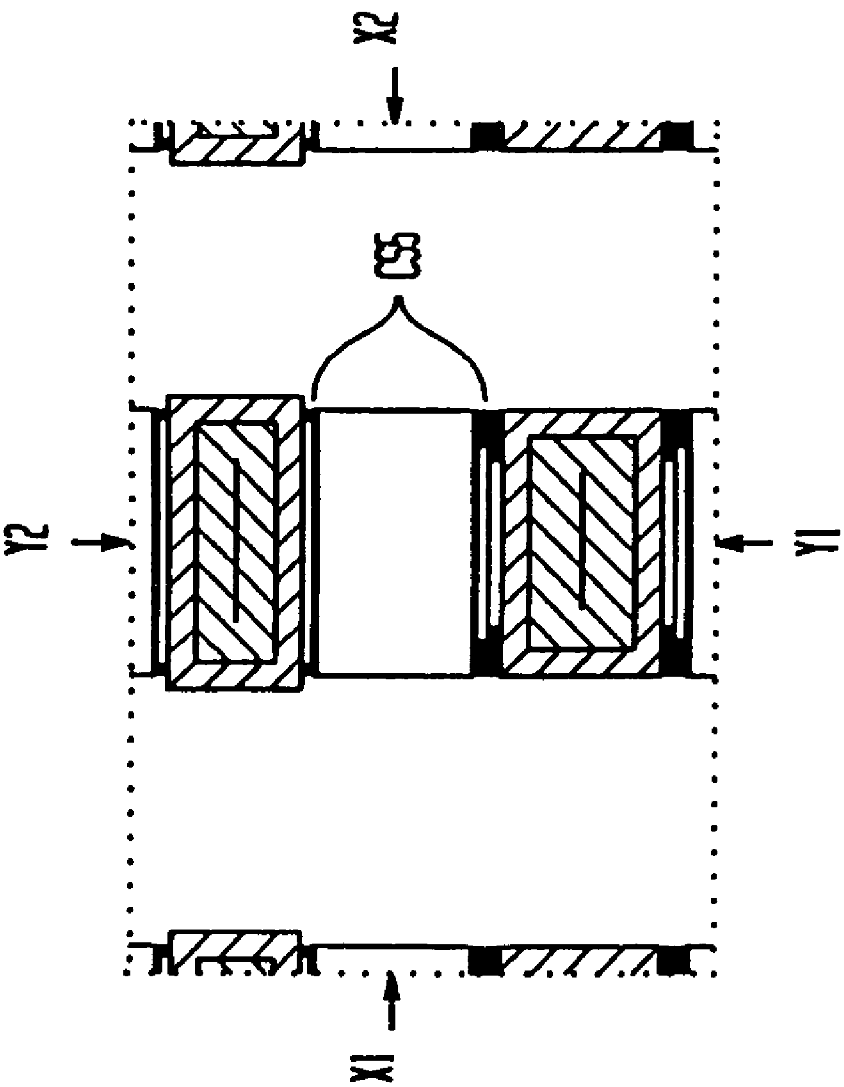
Figure 306:
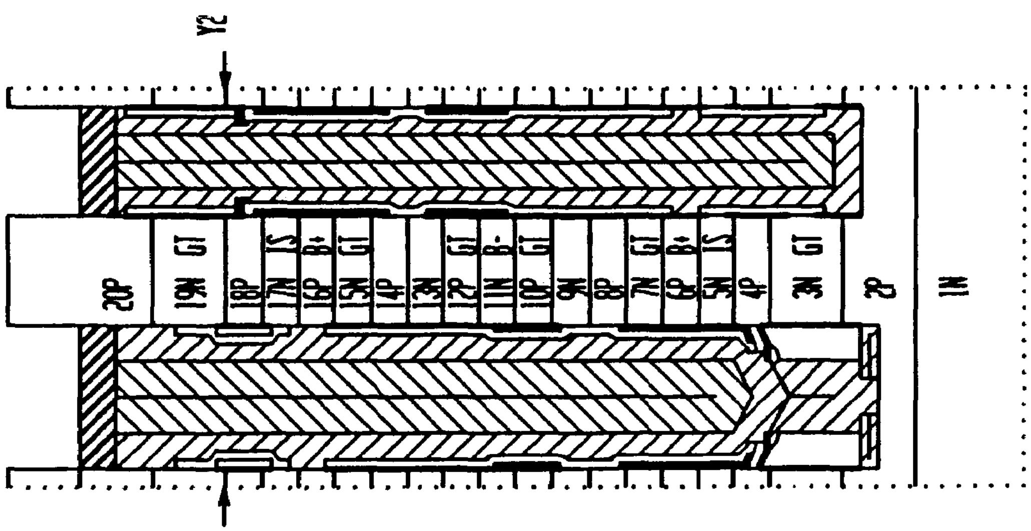
Figure 305:
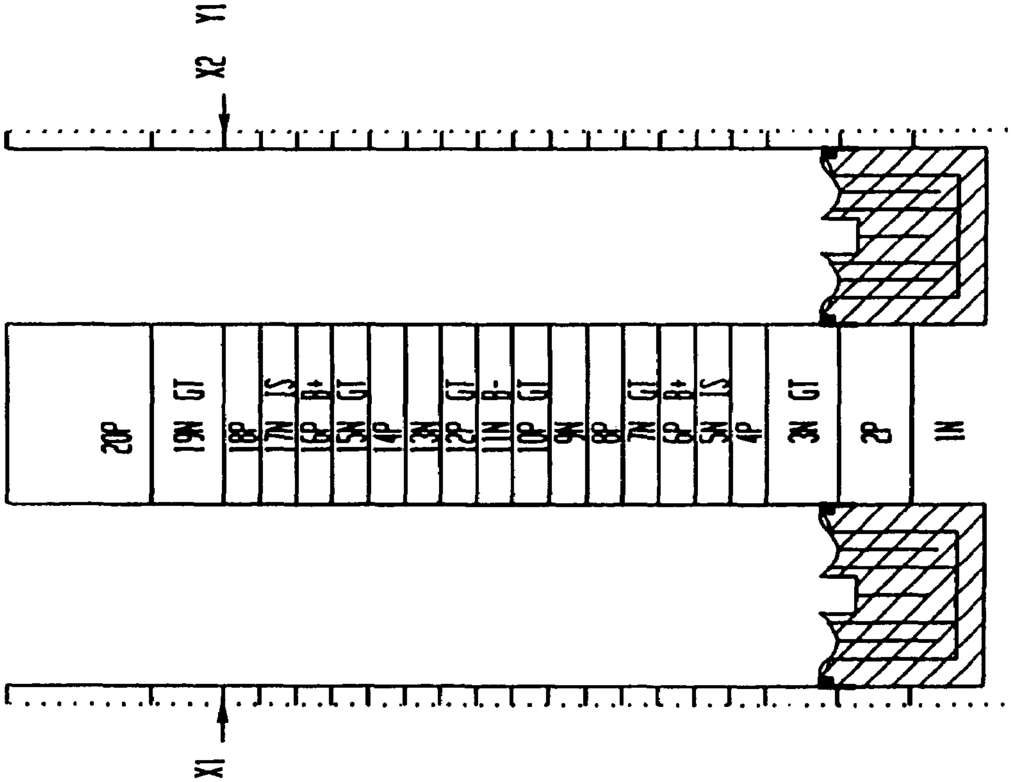

FIGS. 304, 305 and 306 depict three mutually orthogonal cross-sections, with all surfaces cleared of the layer of first insulating material but the recesses in the walls of the widest trench still filled.

Figure 307:
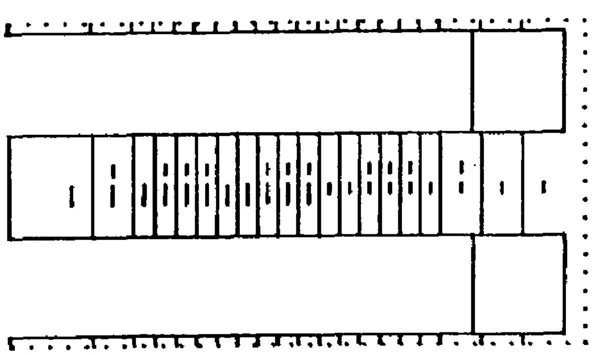
Figure 308:
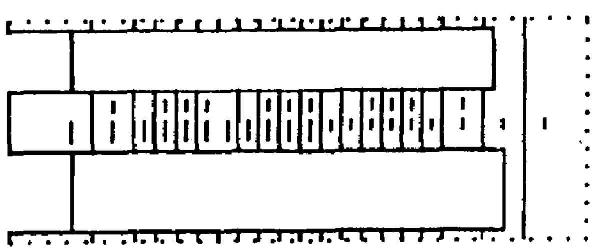

FIGS. 307 and 308 depict the two vertical cross-sections, with all third insulating material removed only from the widest trenches.

Figure 309:
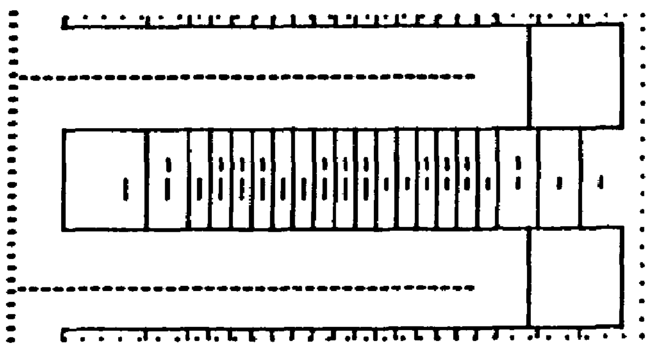
Figure 310:
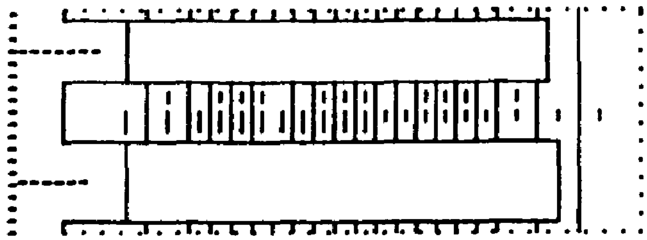

FIGS. 309 and 310 depict the two vertical cross-sections, with a layer of second insulating material covering all surfaces and filling all trenches.

Figure 311:
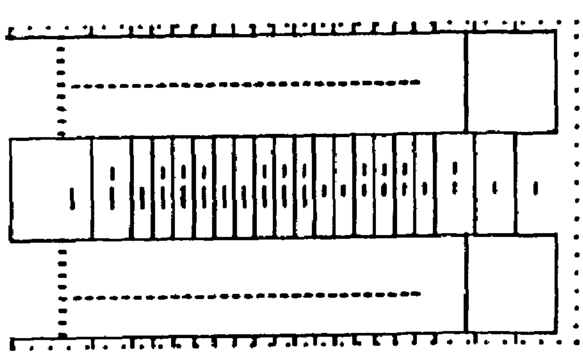
Figure 312:
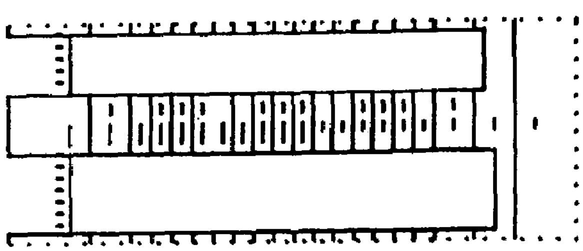

FIGS. 311 and 312 depict the two vertical cross-sections, with the second insulating material removed to a preferred height in all trenches.

Figure 313:
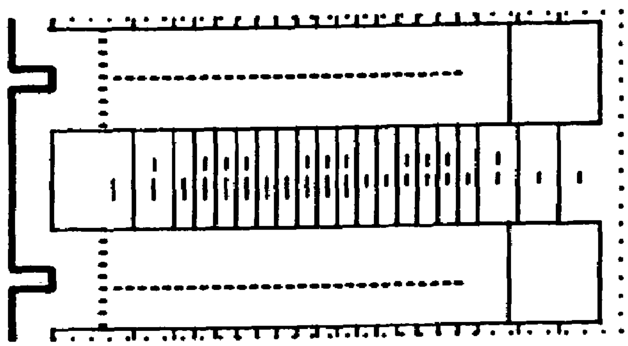
Figure 314:
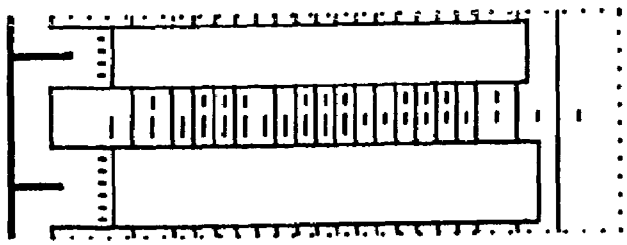

FIGS. 313 and 314 depict the two vertical cross-sections, with a layer of first insulating material covering all surfaces and filling the narrower trenches.

Figure 315:
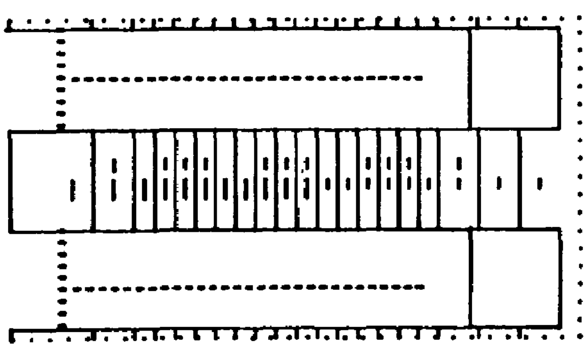
Figure 316:
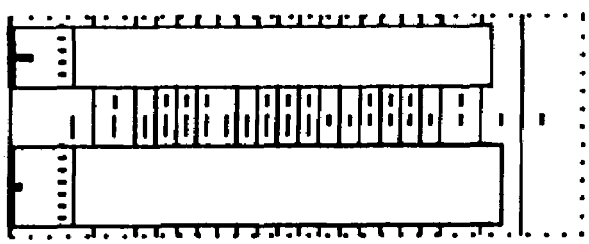

FIGS. 315 and 316 depict the two vertical cross-sections, with the first insulating material removed from the widest trenches.

Figure 317:
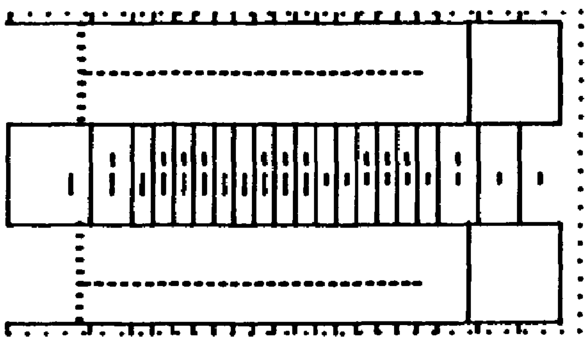
Figure 318:
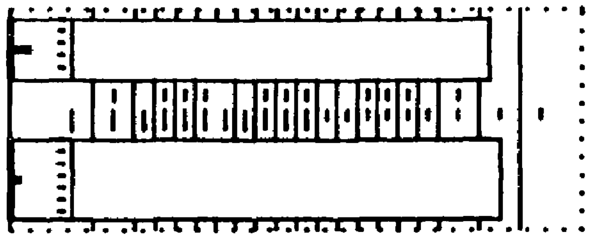

FIGS. 317 and 318 depict the two vertical cross-sections, with the second insulating material surface in the widest trenches lowered.

Figure 319:
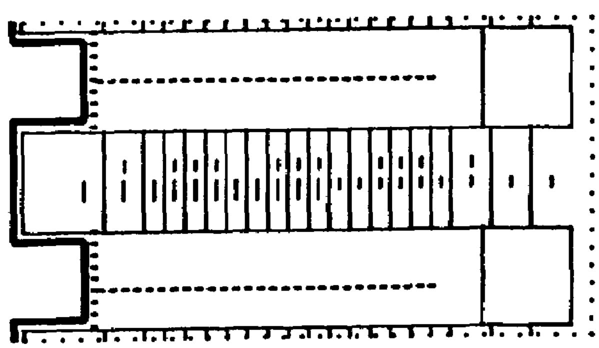
Figure 320:
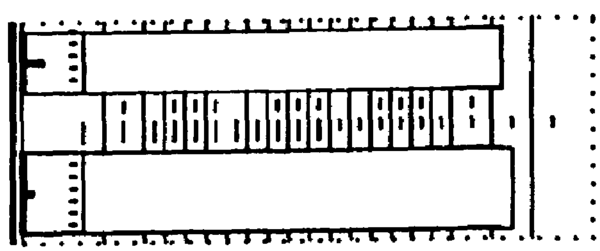

FIGS. 319 and 320 depict the two vertical cross-sections, with a thin layer of third insulating material covering all surfaces.

Figure 321:
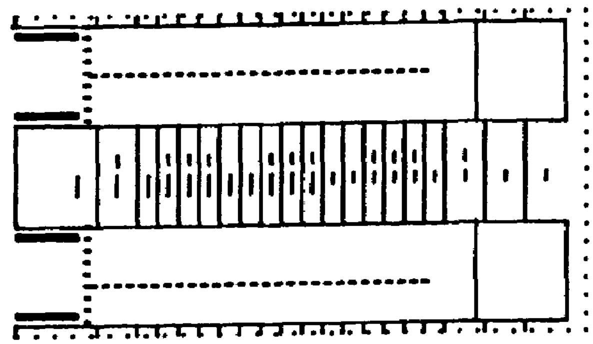
Figure 322:
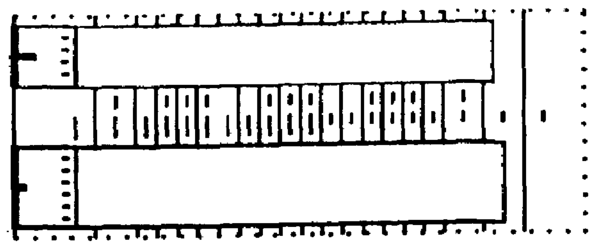

FIGS. 321 and 322 depict the two vertical cross-sections, with the layer of third insulating material removed from all non-vertical surfaces.

Figure 323:
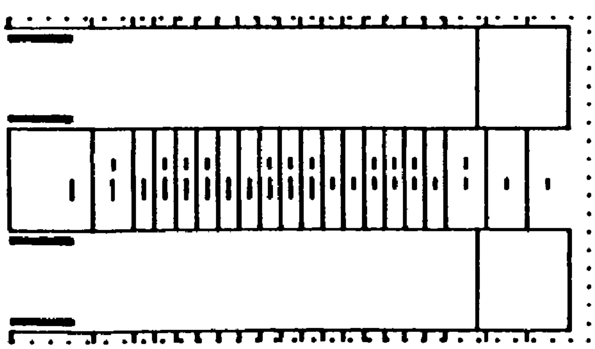
Figure 324:
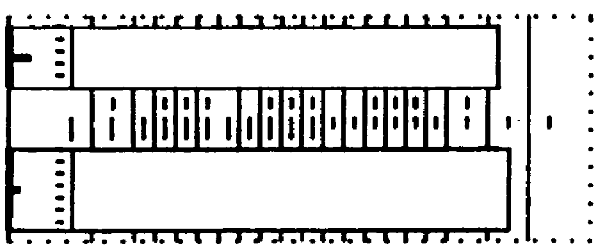

FIGS. 323 and 324 depict the two vertical cross-sections, with the widest trenches cleared of all second insulating material.

Figure 325:
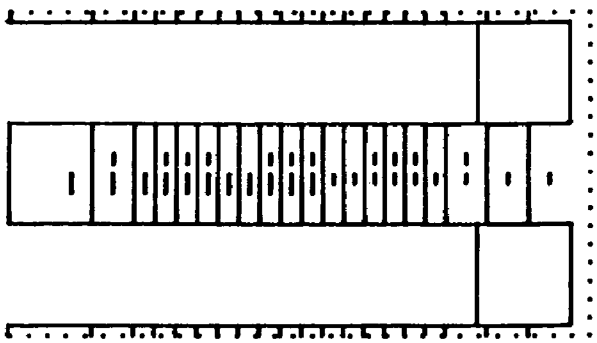
Figure 326:
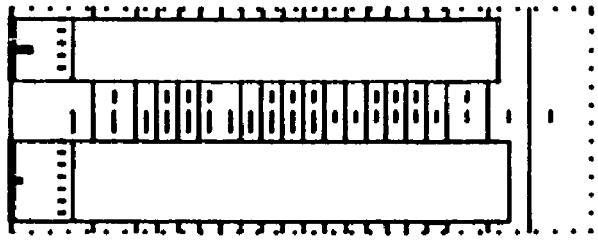

FIGS. 325 and 326 depict the two vertical cross-sections, with all third insulating material removed from the widest trenches.

Figure 327:
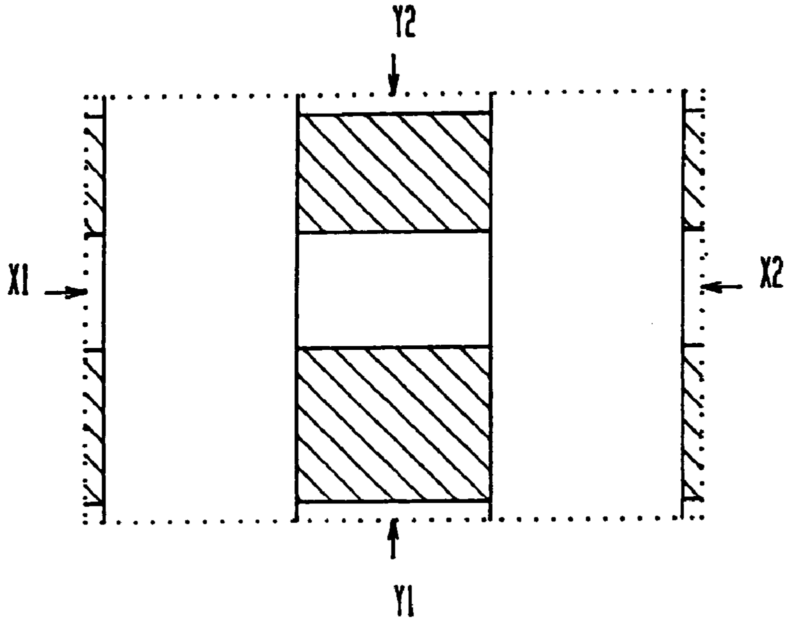
Figure 328:
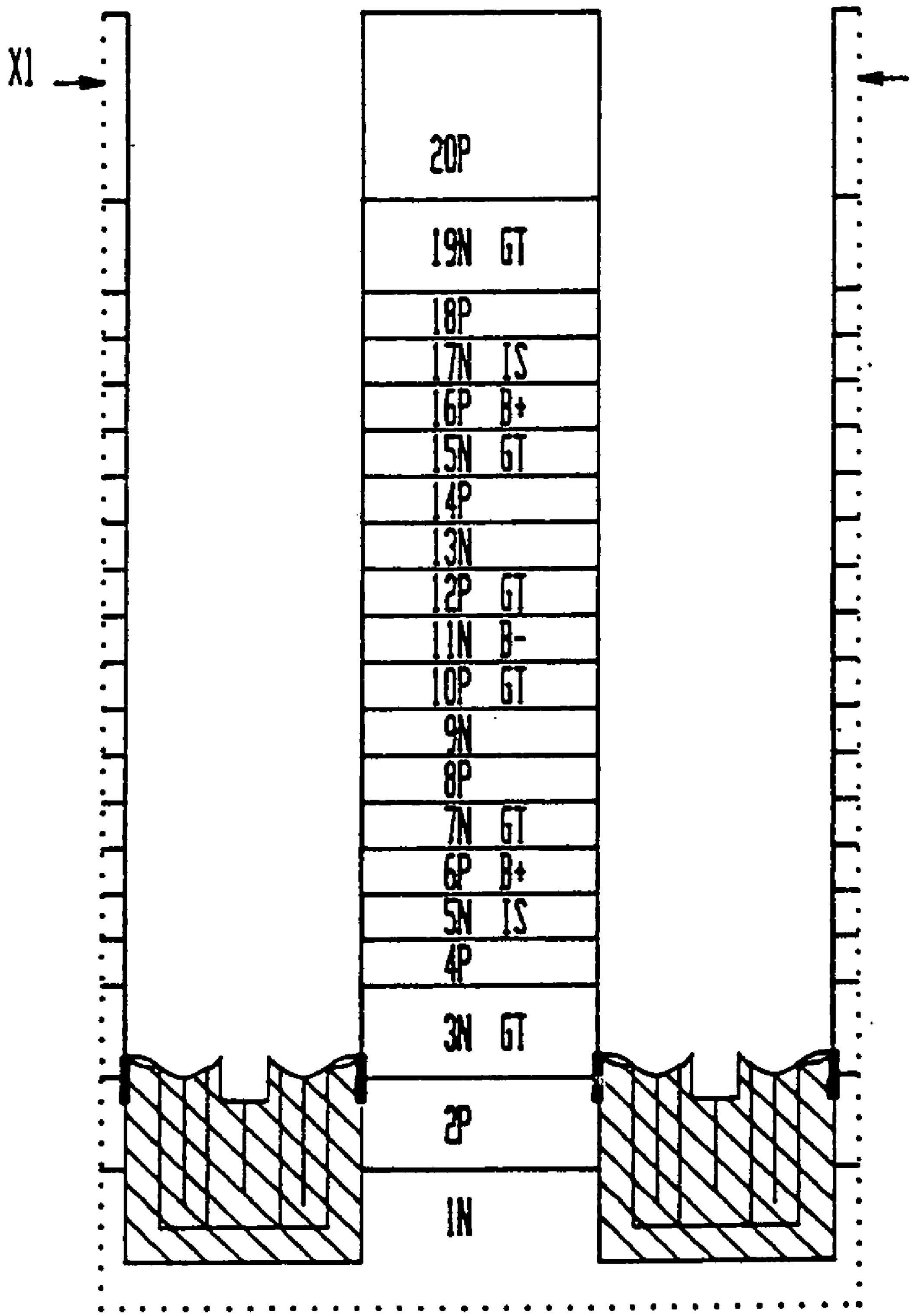
Figure 329:
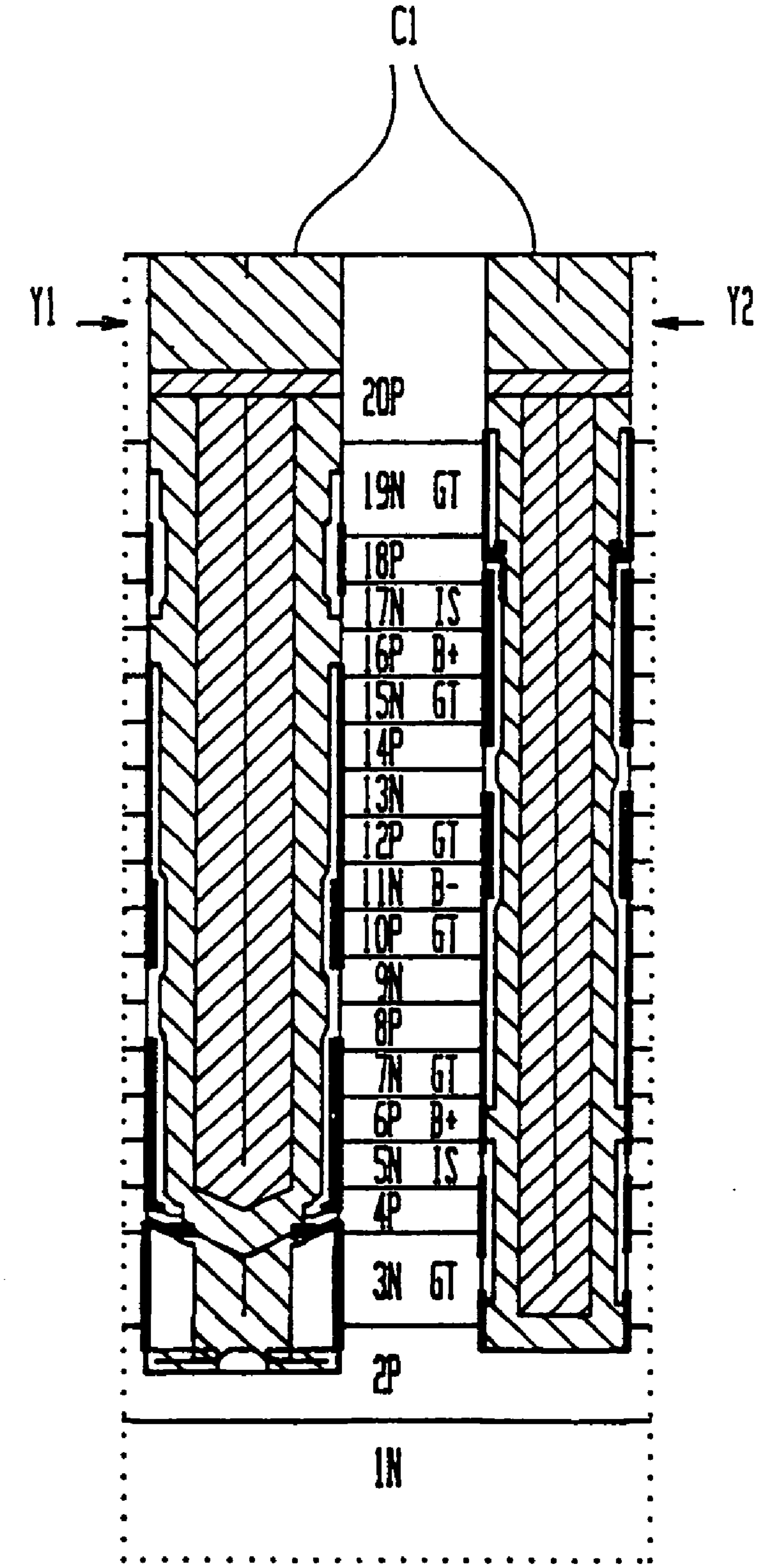

FIGS. 327, 328 and 329 depict three mutually orthogonal cross-sections of the structure of FIGS. 325 and 326 more completely and detailed.

Figure 330:
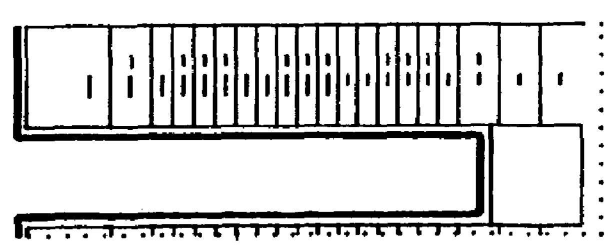

FIG. 330 depicts the vertical cross-section of the widest trench with all surfaces coated with a layer of third insulating material.

Figure 331:
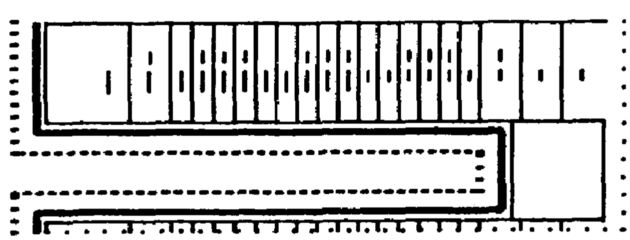

FIG. 331 depicts the vertical cross-section of the widest trench with all surfaces further coated with a layer of second insulating material.

Figure 332:
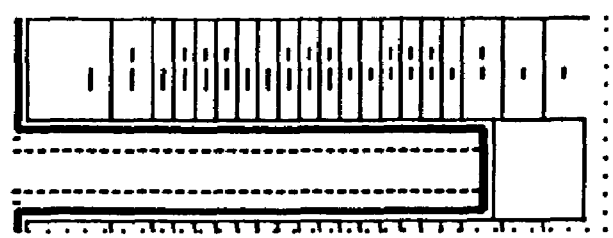

FIG. 332 depicts the vertical cross-section of the widest trench with the second insulating material removed from all non-vertical surfaces.

Figure 333:
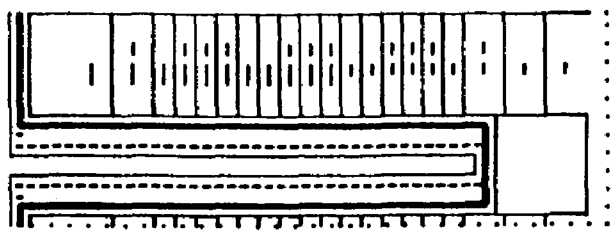

FIG. 333 depicts the vertical cross-section of the widest trench with all surfaces further coated with a layer of first metal.

Figure 334:
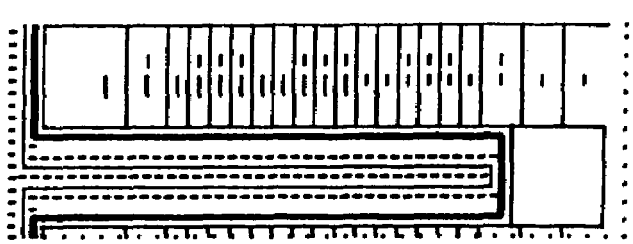

FIG. 334 depicts the vertical cross-section of the widest trench, with all surfaces covered and the trench closed out by second insulating material.

Figure 335:
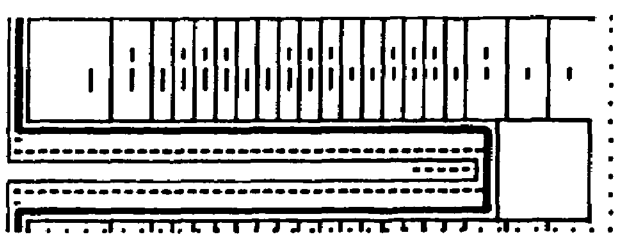

FIG. 335 depicts the vertical cross-section of the widest trench, with the top layer of second insulating material removed, except for a plug in the trench.

Figure 336:
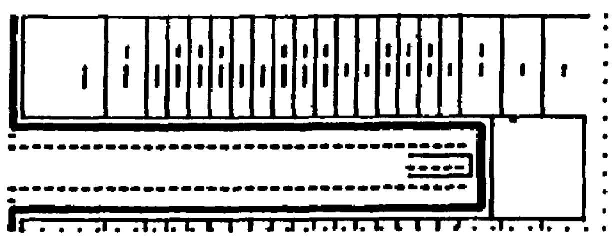

FIG. 336 depicts the vertical cross-section of the widest trench, with the first metal layer removed from all surfaces above the plug.

Figure 337:
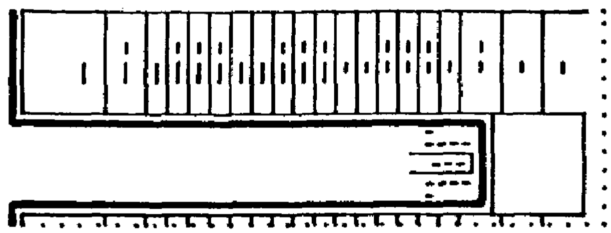

FIG. 337 depicts the vertical cross-section of the widest trench, with the layer of second insulating material removed from the trench walls down to the edge of the layer of first metal.

Figure 338:
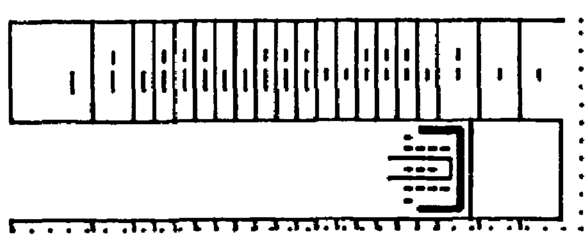

FIG. 338 depicts the vertical cross-section of the widest trench, with the layer of third insulating material removed from the trench walls down to the edge of the layer of second insulating material.

Figure 339:
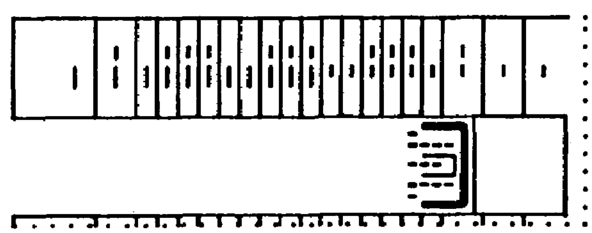

FIG. 339 depicts the vertical cross-section of the widest trench, with the first metal layer receded between the second insulating material layers.

Figure 340:
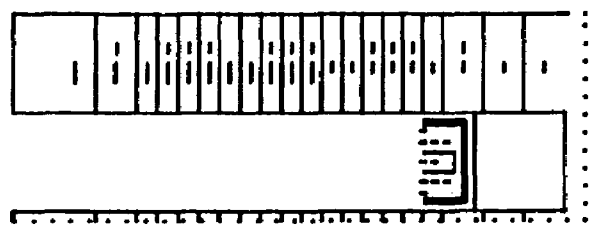

FIG. 340 depicts the vertical cross-section of the widest trench, with the top edges of all layers at the bottom of the trench aligned.

Figure 341:
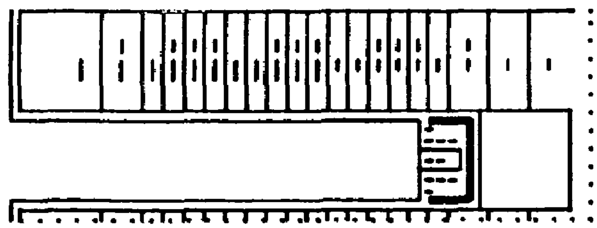

FIG. 341 depicts the vertical cross-section of the widest trench with all surfaces coated with a layer of first metal.

Figure 342:
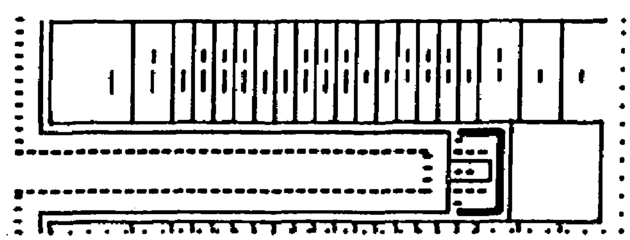

FIG. 342 depicts the vertical cross-section of the widest trench with all surfaces further coated with a layer of second insulating material.

Figure 343:
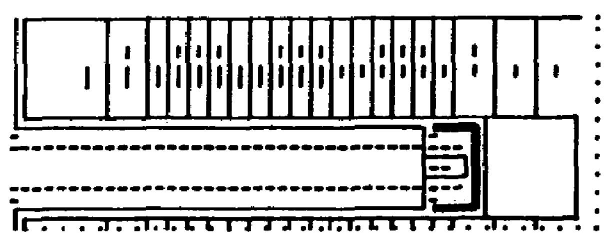

FIG. 343 depicts the vertical cross-section of the widest trench with the second insulating material removed from all non-vertical surfaces.

Figure 344:
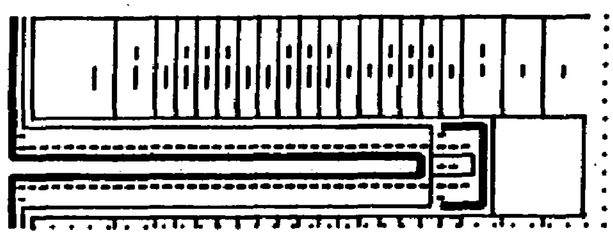

FIG. 344 depicts the vertical cross-section of the widest trench with all surfaces further coated with a layer of third insulating material.

Figure 345:
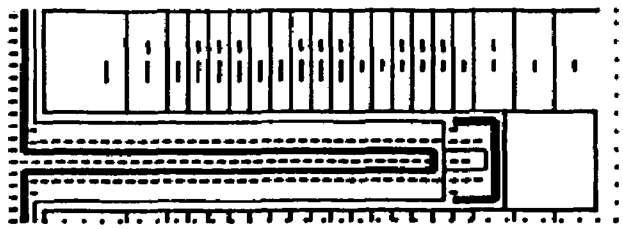

FIG. 345 depicts the vertical cross-section of the widest trench, with all surfaces covered and the trench closed out by second insulating material.

Figure 346:
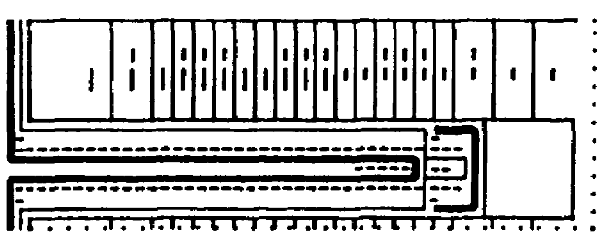

FIG. 346 depicts the vertical cross-section of the widest trench, with the top layer of second insulating material removed, except for a plug in the trench.

Figure 347:
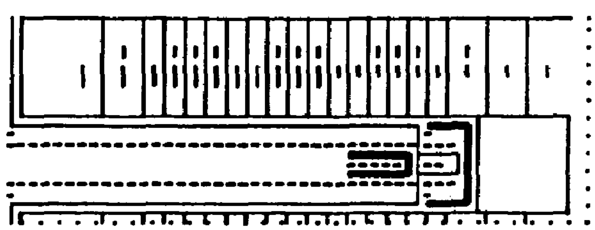

FIG. 347 depicts the vertical cross-section of the widest trench, with the layer of third insulating material removed from all surfaces above the plug.

Figure 348:
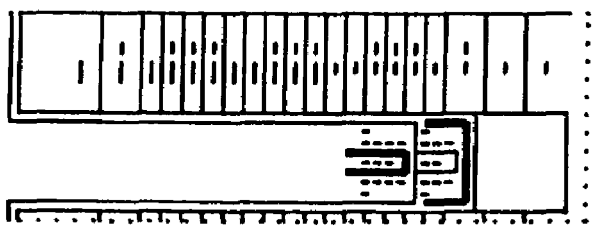

FIG. 348 depicts the vertical cross-section of the widest trench, with the layer of second insulating material removed from the trench walls down to the edge of the layer of third insulating material.

Figure 349:
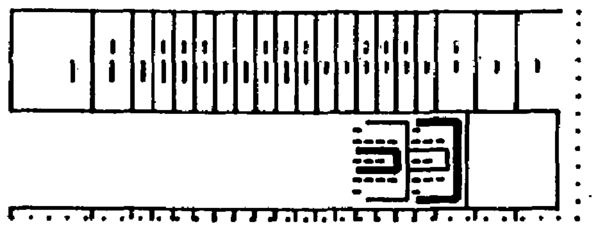

FIG. 349 depicts the vertical cross-section of the widest trench, with the layer of first metal removed from the all surfaces down to the edge of the layer of third insulating material.

Figure 350:
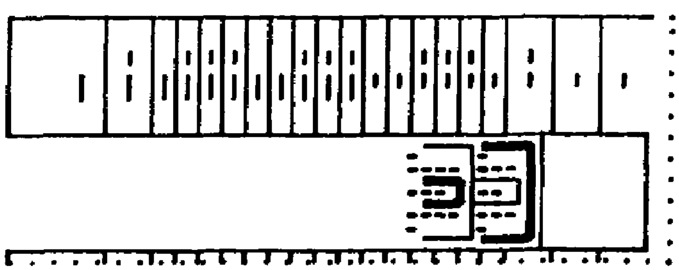

FIG. 350 depicts the vertical cross-section of the widest trench, with the layer of third insulating material receded between the second insulating material layers.

Figure 351:
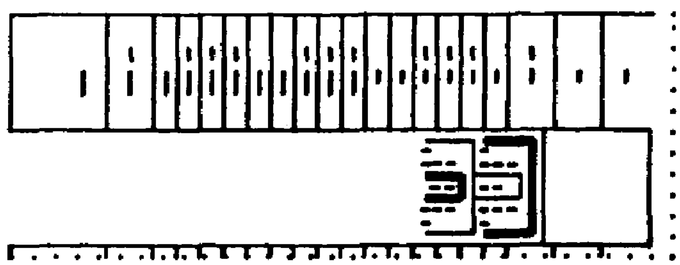

FIG. 351 depicts the vertical cross-section of the widest trench, with the top edges of all layers at the bottom of the trench aligned.

Figure 352:
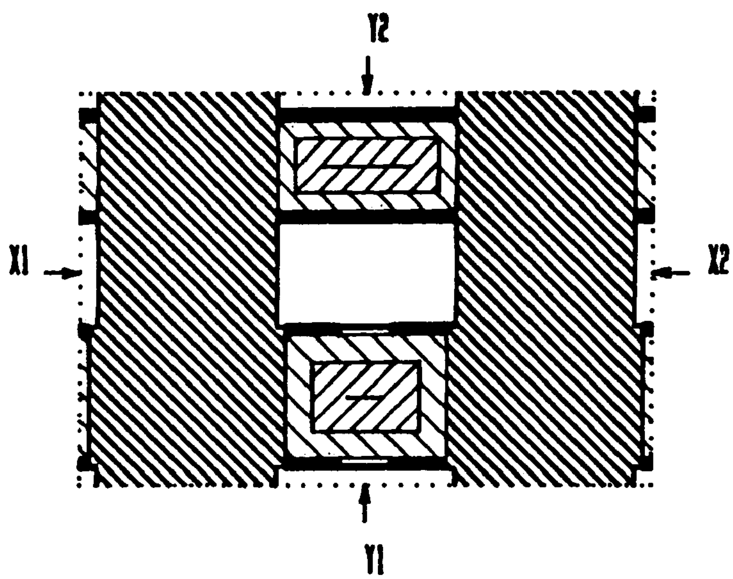
Figure 353:
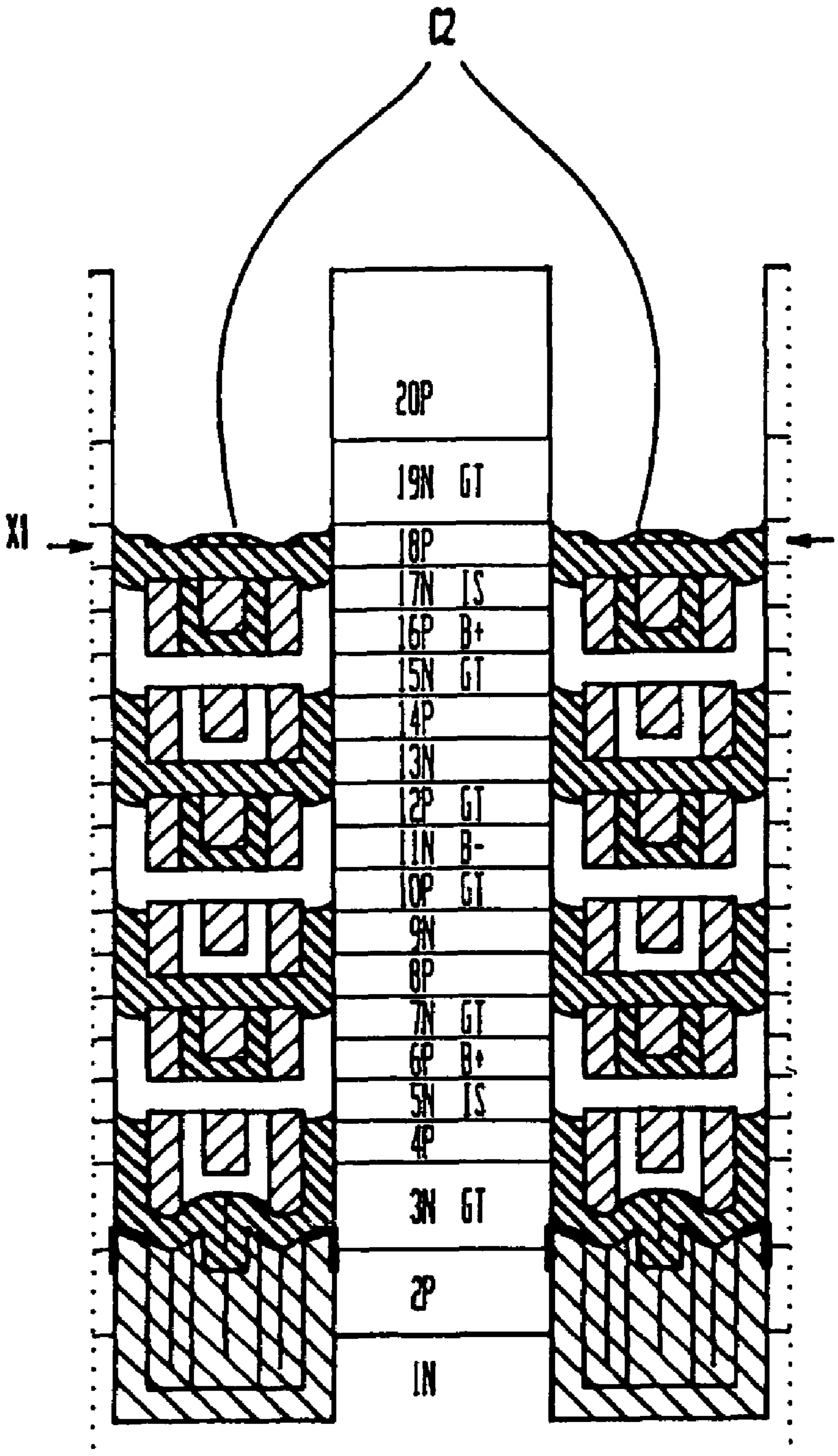
Figure 354:
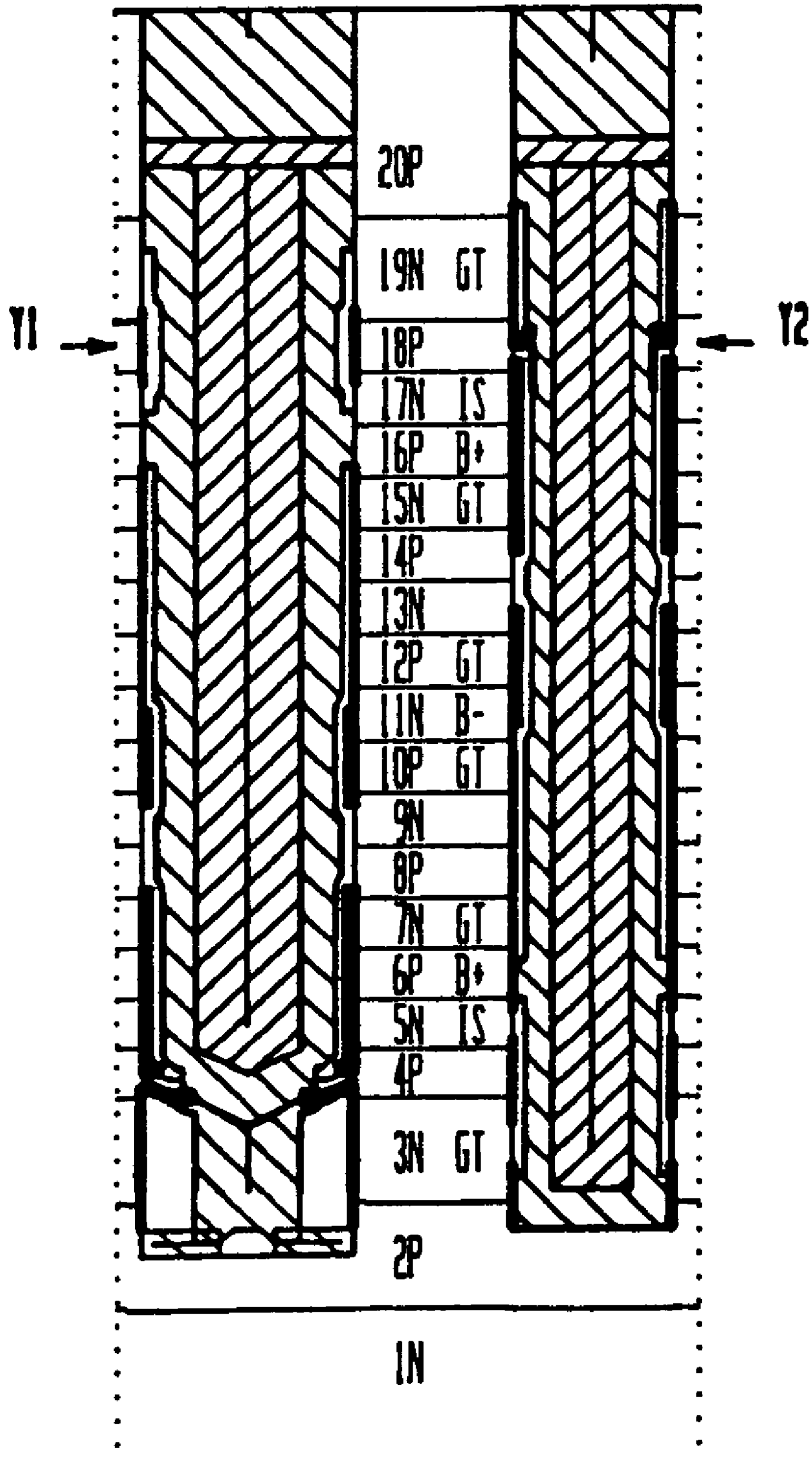

FIGS. 352, 353 and 354 depict three mutually orthogonal cross-sections of the structure of FIG. 351 with more detail and more completely, and with three identical pairs of alternating structures added to the widest trench.

Figure 355:
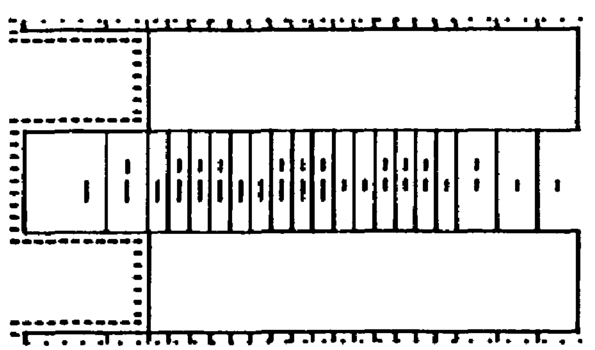
Figure 356:
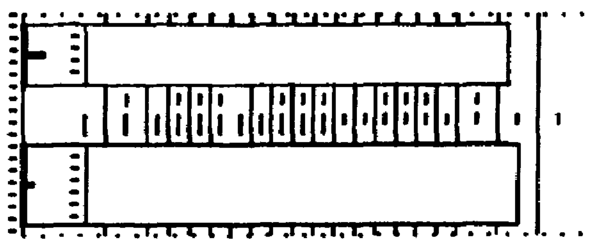

FIGS. 355 and 356 depict the two vertical cross-sections, with a thin layer of second insulating material covering all surfaces.

Figure 357:
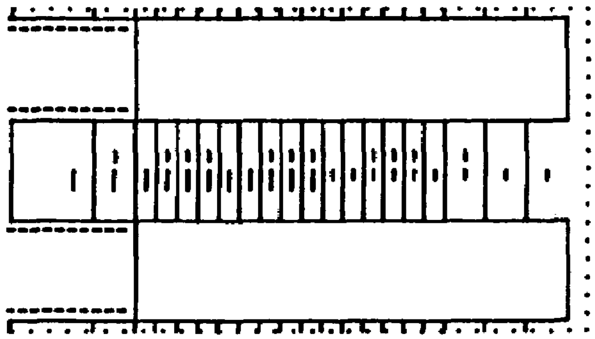
Figure 358:
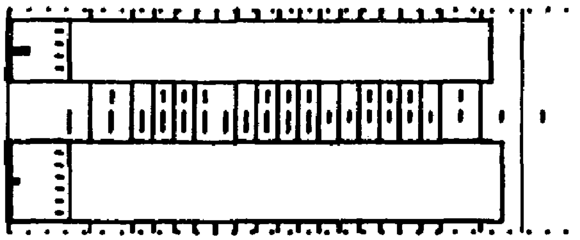

FIGS. 357 and 358 depict the two vertical cross-sections, with the layer of second insulating material removed from all non-vertical surfaces.

Figure 359:
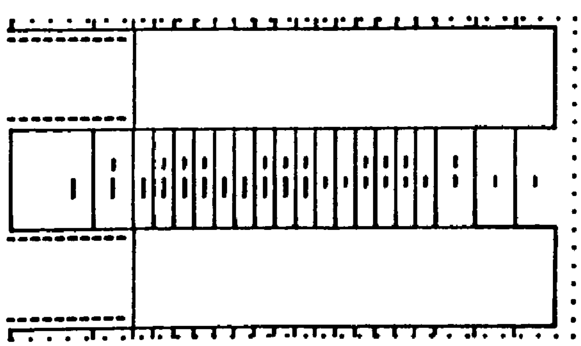
Figure 360:
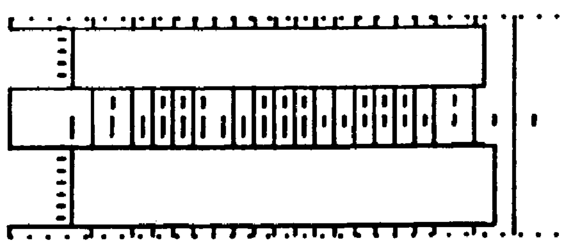

FIGS. 359 and 360 depict the two vertical cross-sections, with the tops of the narrower trenches cleared of all first insulating material.

Figure 361:
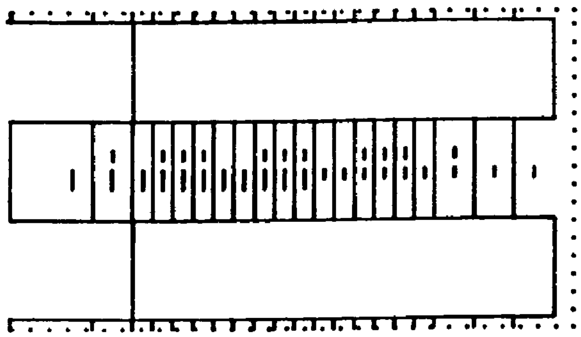
Figure 362:
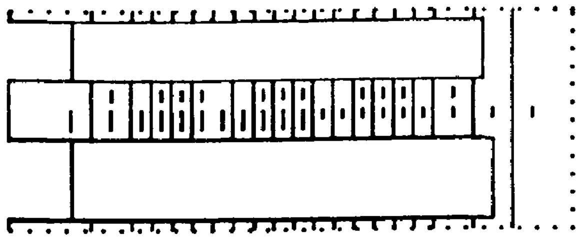

FIGS. 361 and 362 depict the two vertical cross-sections, with the layers of second insulating material removed from the trenches.

Figure 363:
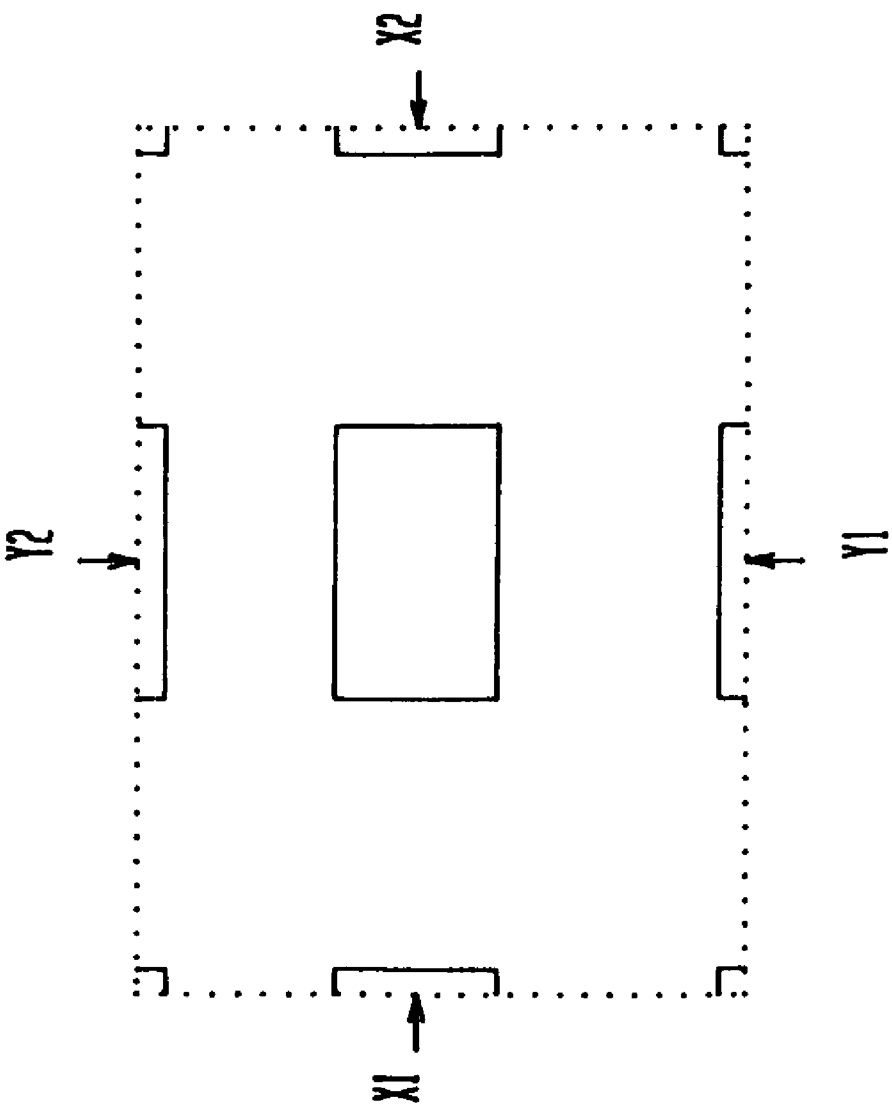
Figure 365:
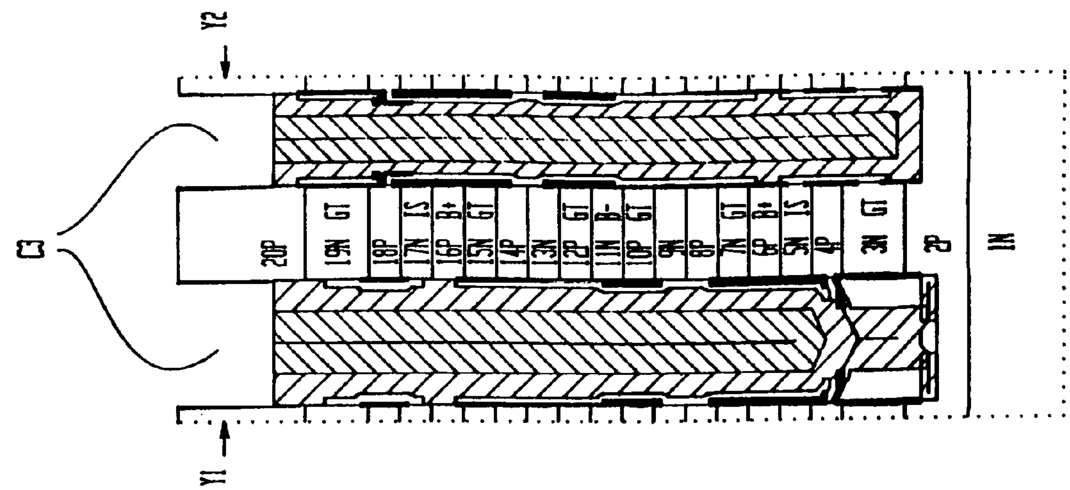
Figure 364:
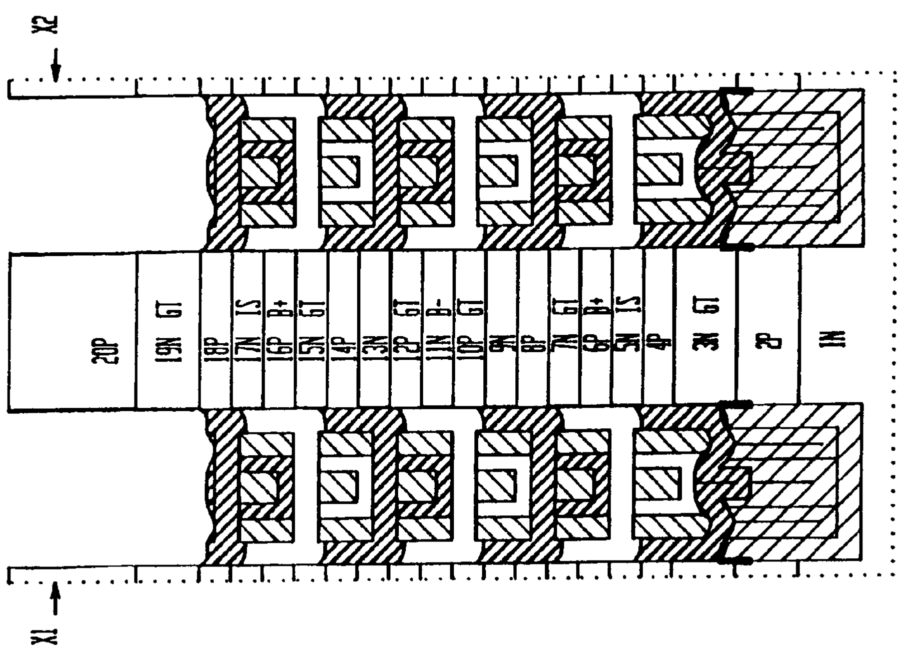

FIGS. 363, 364 and 365 depict three mutually orthogonal cross-sections of the structure of FIGS. 361 and 362 more completely and detailed.

Figure 366:
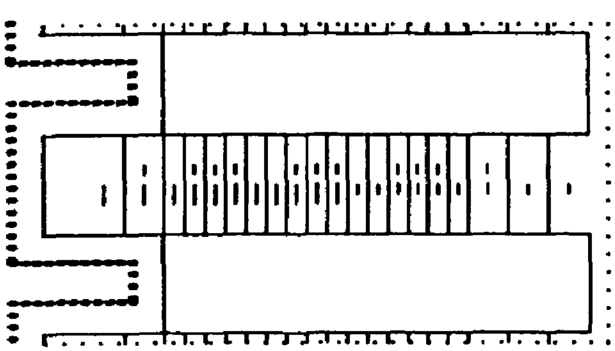
Figure 367:
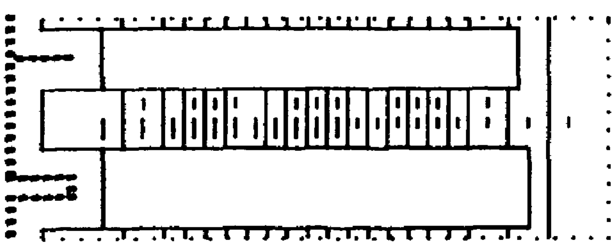

FIGS. 366 and 367 depict the two vertical cross-sections, with a layer of second insulating material covering all surfaces and filling the narrowest trench.

Figure 368:
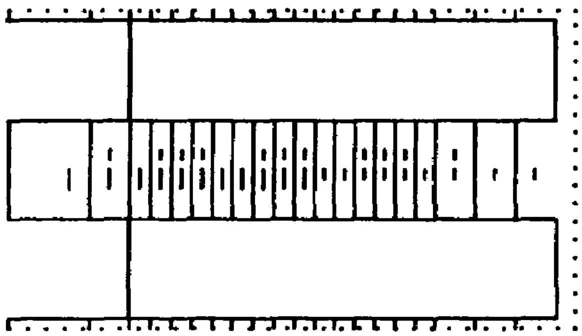
Figure 369:
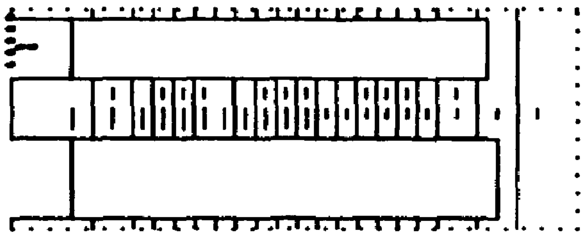

FIGS. 368 and 369 depict the two vertical cross-sections, with all surfaces except the top of the narrowest trench cleared of first insulating material.

Figure 370:
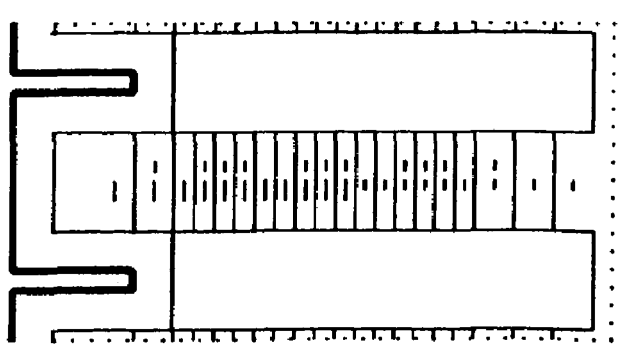
Figure 371:
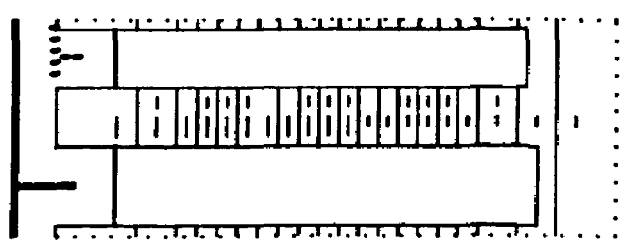

FIGS. 370 and 371 depict the two vertical cross-sections, with a layer of first insulating material covering all surfaces and filling the intermediate-width trench.

Figure 372:
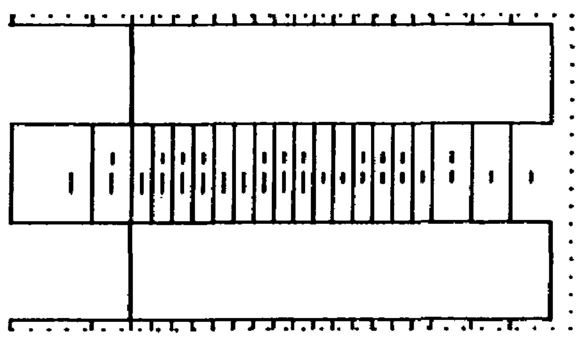
Figure 373:
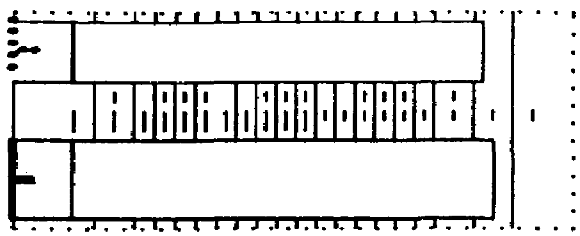

FIGS. 372 and 373 depict the two vertical cross-sections, with first insulating material left only in the intermediate-width trench.

Figure 374:
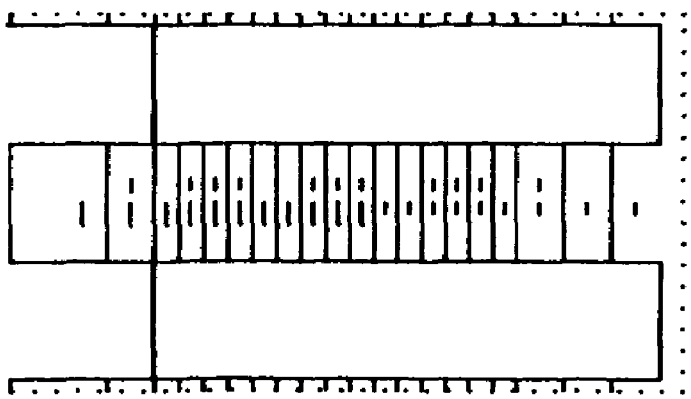
Figure 375:
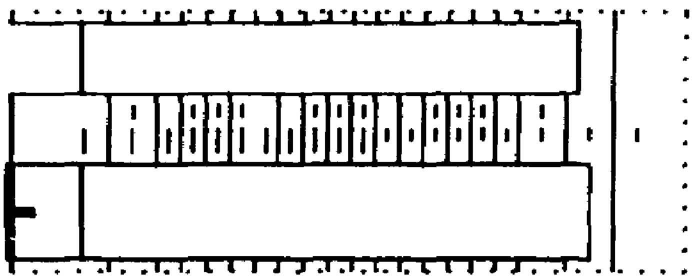

FIGS. 374 and 375 depict the two vertical cross-sections, with the narrowest trench cleared of the top layer of second insulating material.

Figure 376:
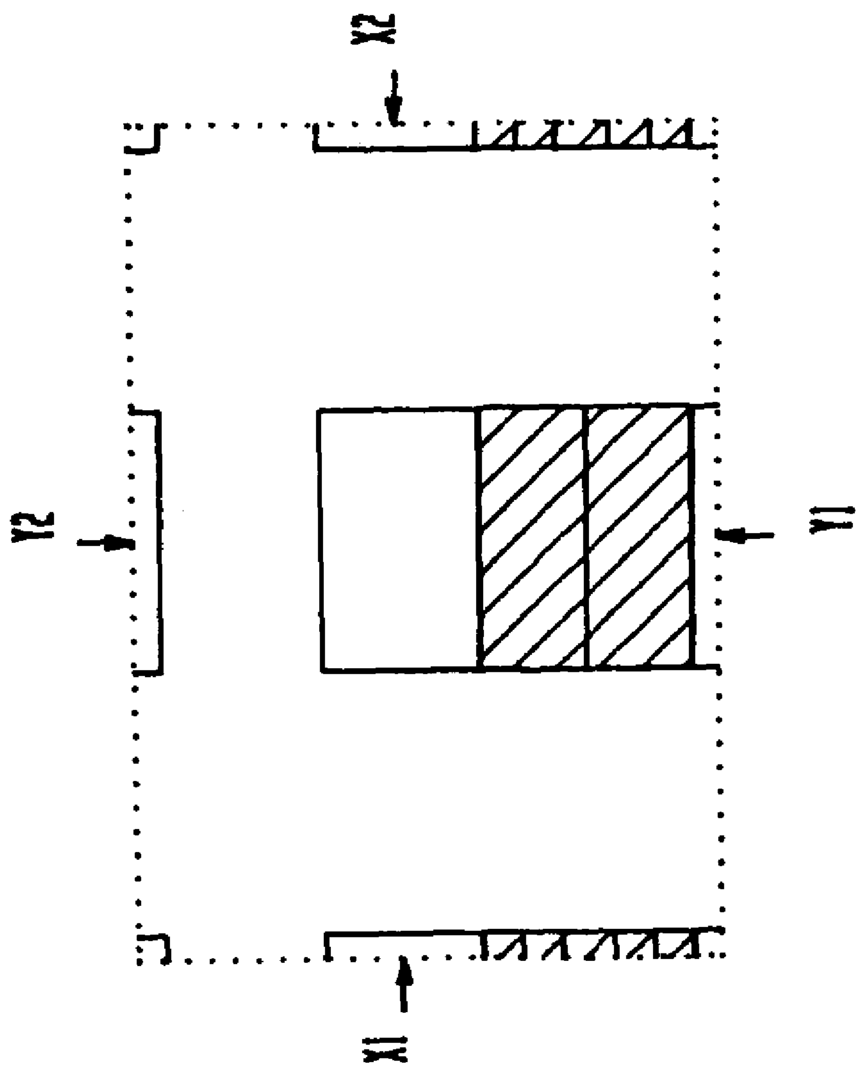
Figure 377:
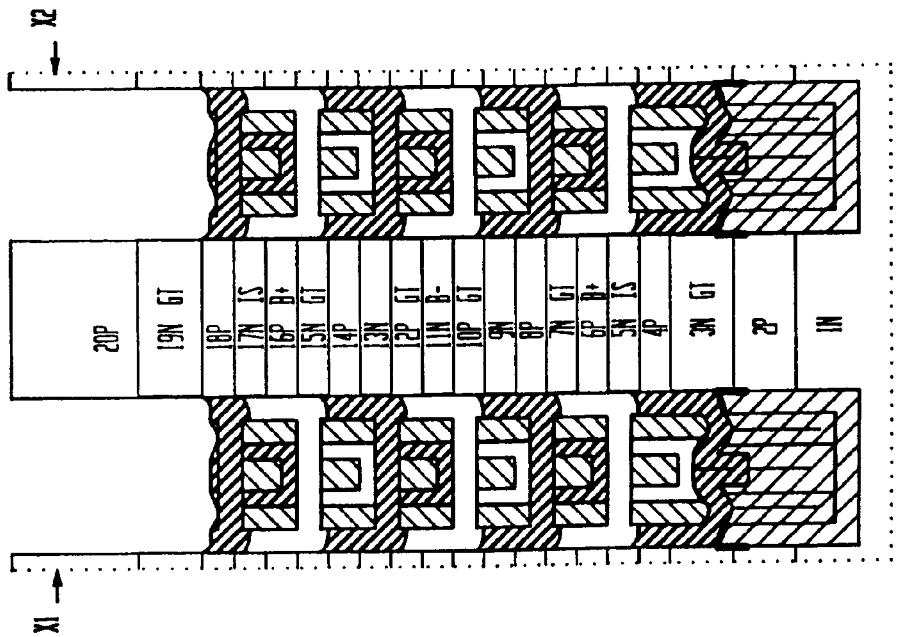
Figure 378:
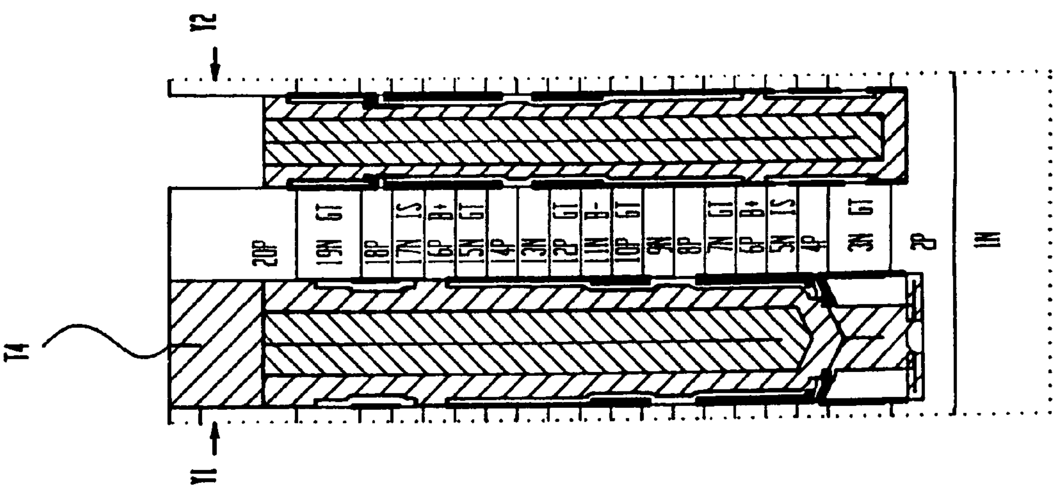

FIGS. 376, 377 and 378 depict three mutually orthogonal cross-sections of the structure of FIGS. 374 and 375 more completely and detailed.

Figure 379:
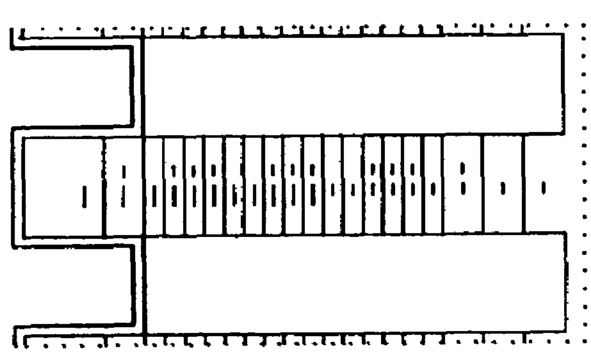
Figure 380:
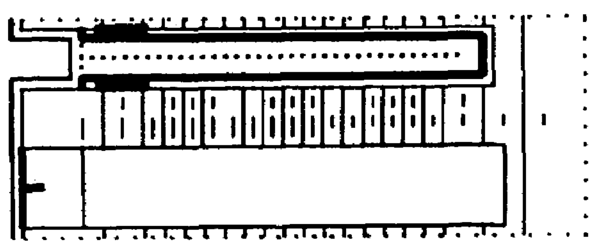

FIGS. 379 and 380 depict the two vertical cross-sections, with a thin layer of first metal covering all surfaces.

Figure 381:
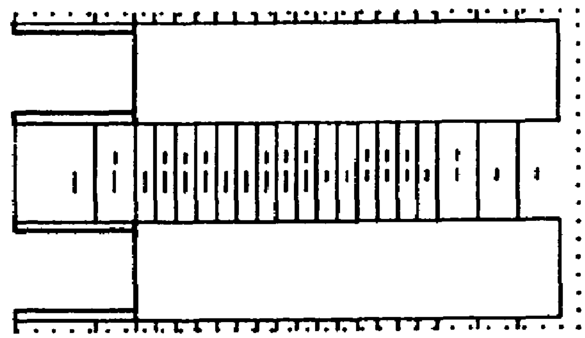
Figure 382:
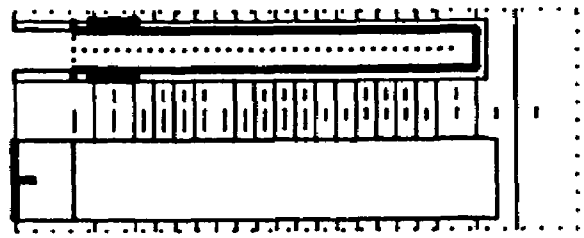

FIGS. 381 and 382 depict the two vertical cross-sections, with the layer of first metal removed from all non-vertical surfaces.

Figure 383:
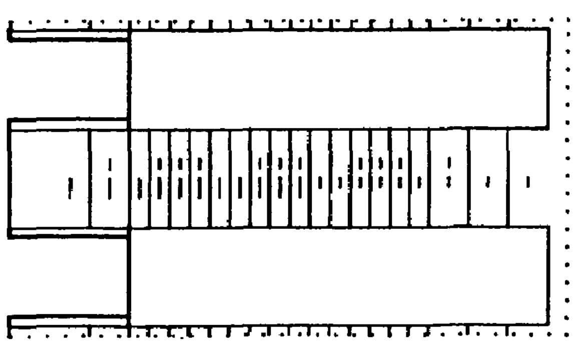
Figure 384:
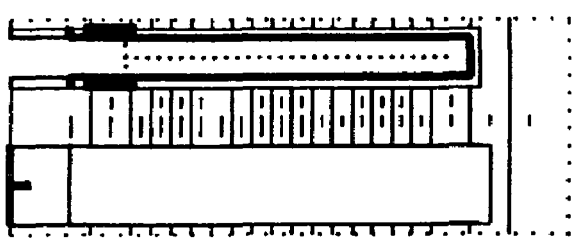

FIGS. 383 and 384 depict the two vertical cross-sections, with the core of second insulating material in the narrowest trench lowered to a preferred height.

Figure 385:
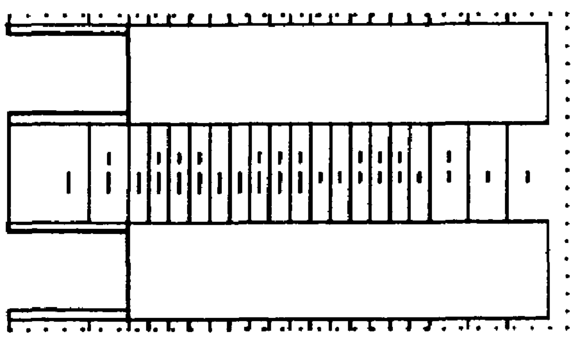
Figure 386:
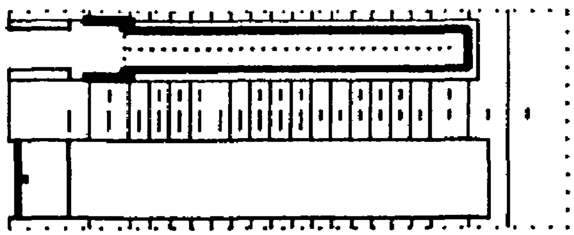

FIGS. 385 and 386 depict the two vertical cross-sections, with the layer of first insulating material above the core in the narrowest trench removed.

Figure 387:
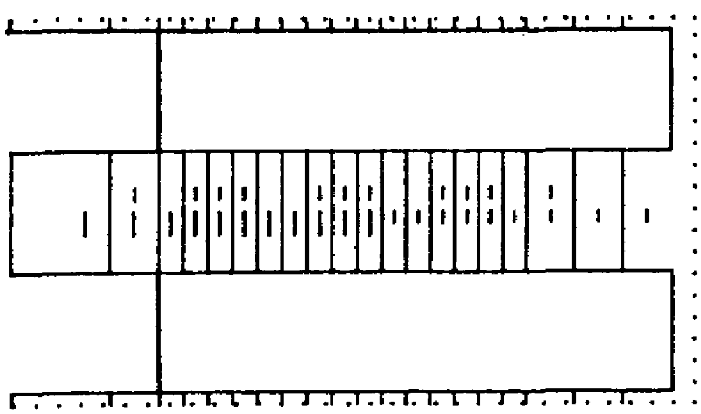
Figure 388:
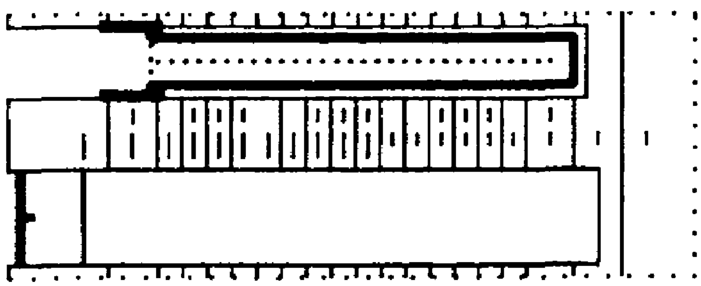

FIGS. 387 and 388 depict the two vertical cross-sections, with the layer of first metal cleared from the walls at the top of the narrowest trench.

Figure 389:
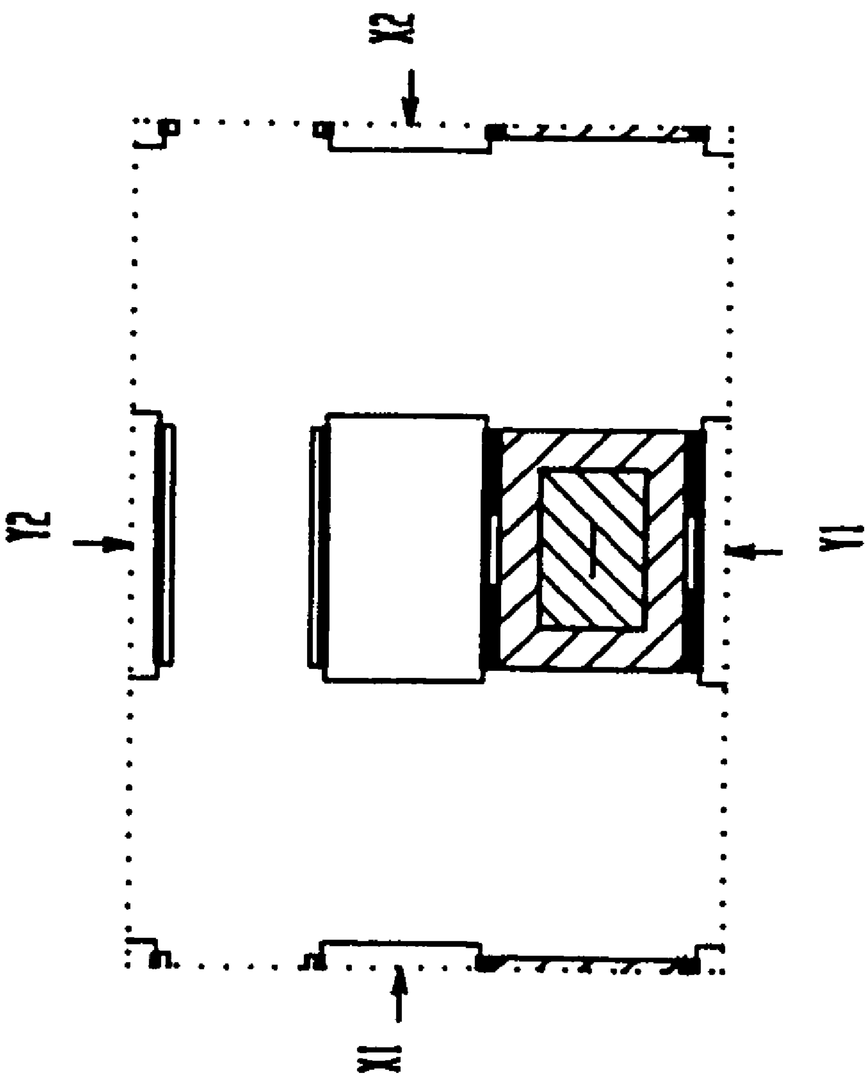
Figure 391:
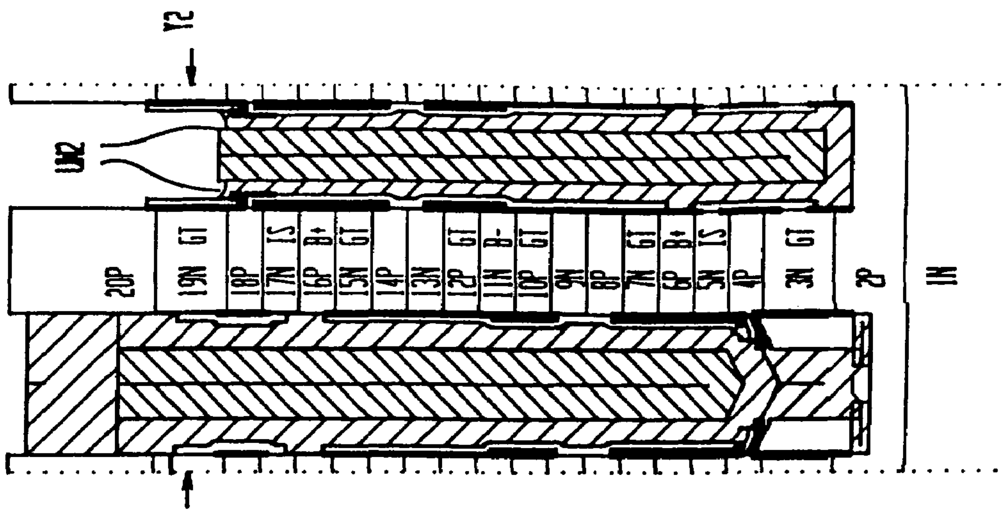
Figure 390:
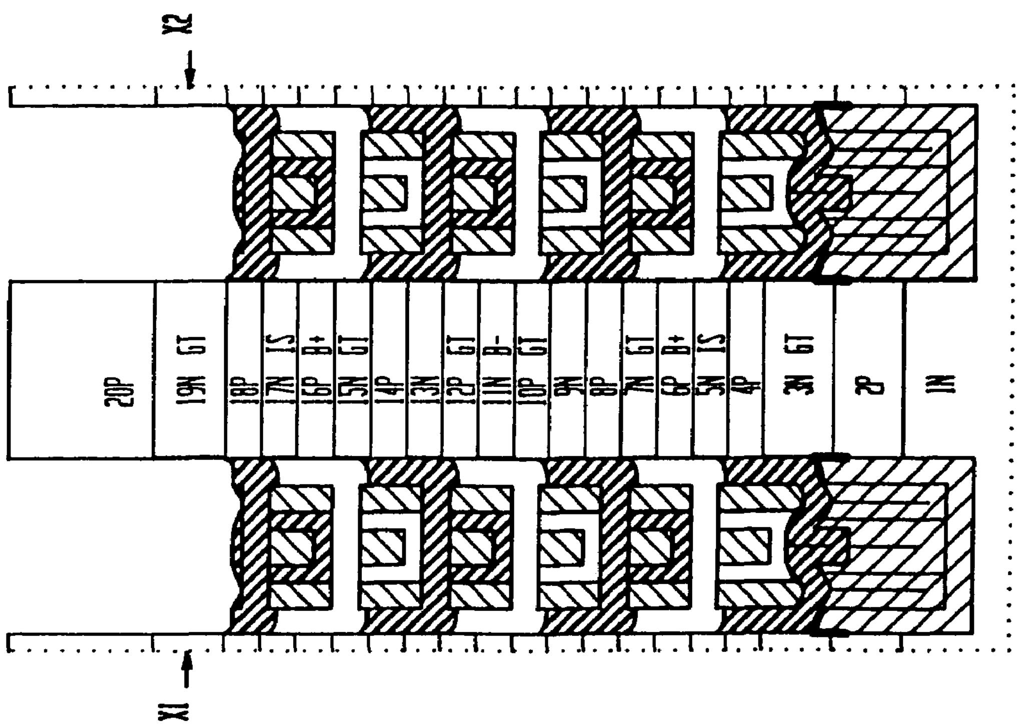

FIGS. 389, 390 and 391 depict three mutually orthogonal cross-sections of the structure of FIGS. 387 and 388 more completely and detailed.

Figure 392:
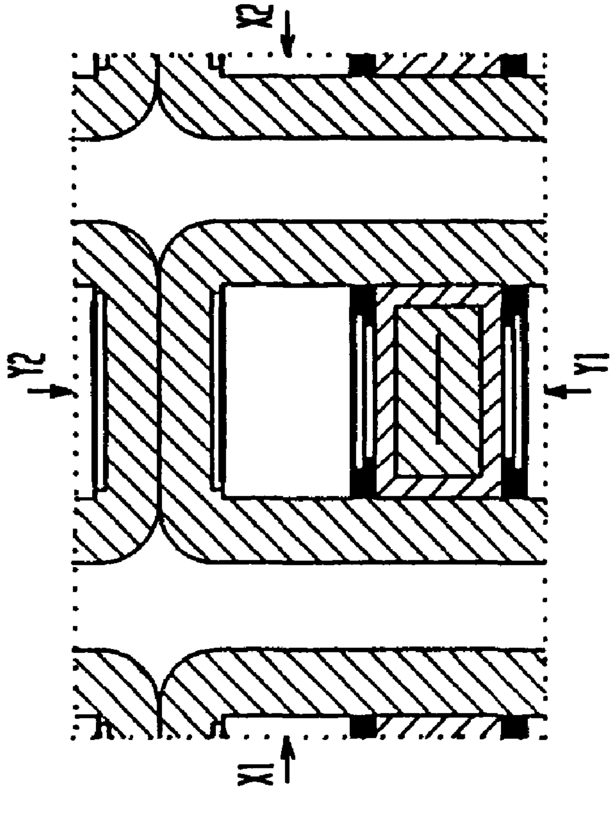
Figure 393:
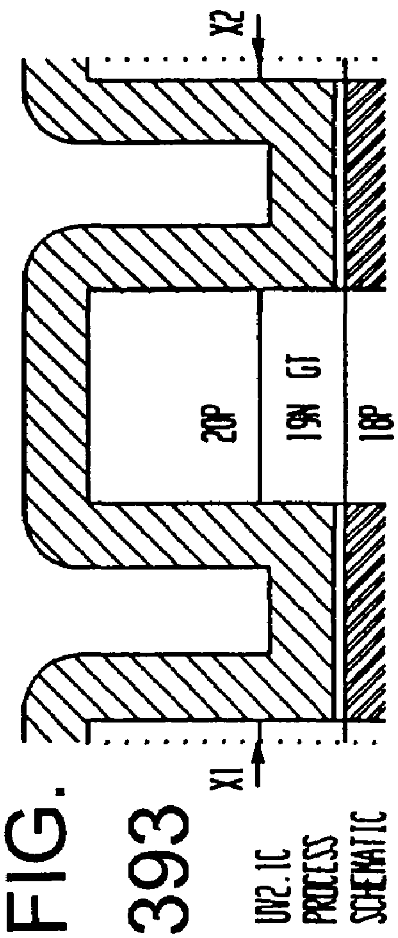
Figure 394:
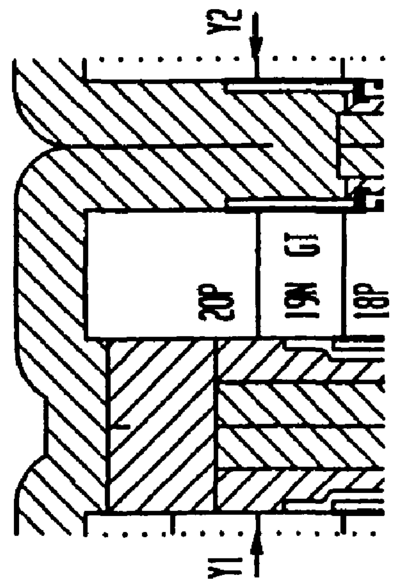

FIGS. 392, 393 and 394 depict three mutually orthogonal cross-sections, with a thin layer of a second metal in the widest trenches underneath a thick layer of second insulating material covering all surfaces and filling the narrowest trench.

Figure 395:
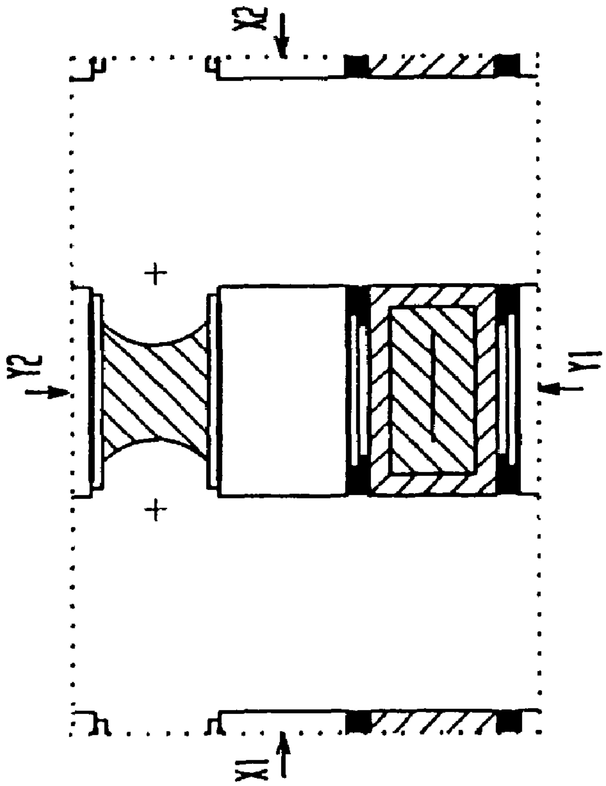
Figure 396:
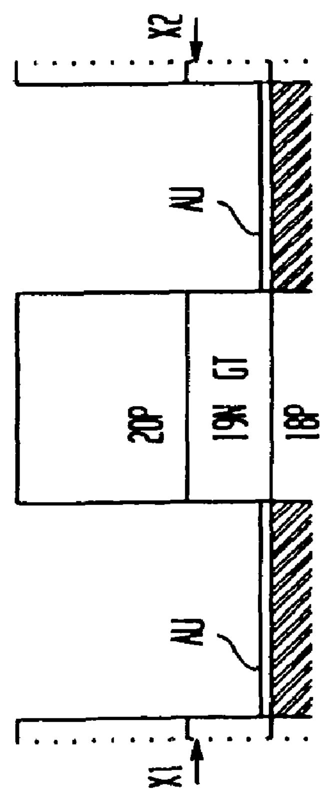
Figure 397:
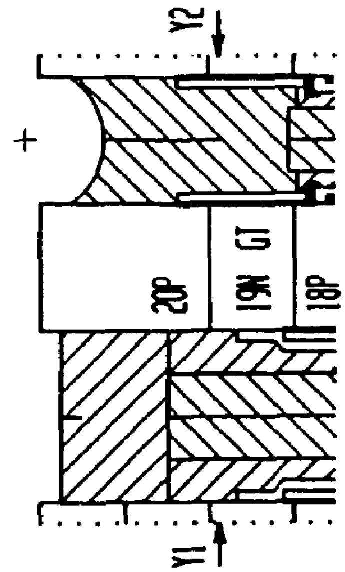

FIGS. 395, 396 and 397 depict three mutually orthogonal cross-sections, with all surfaces cleared of the layer of first insulating material, except for a bridge in the narrowest trench.

Figure 398:
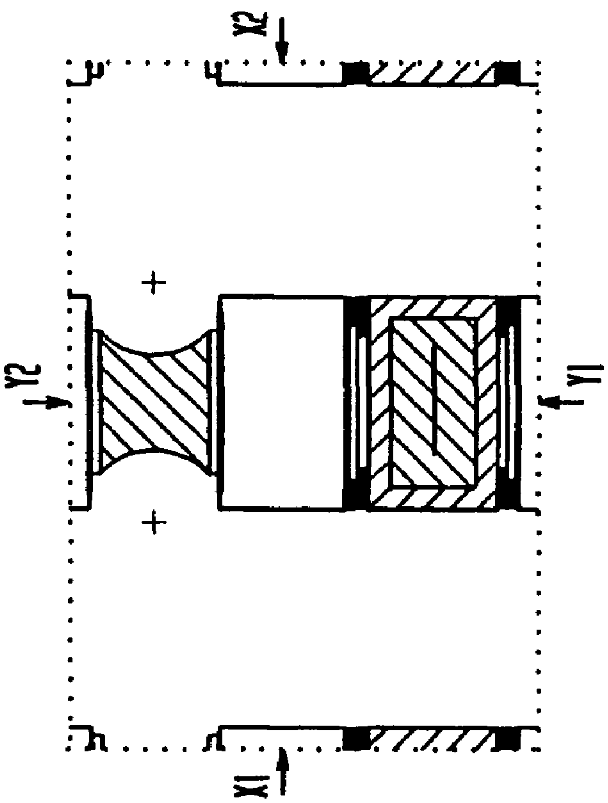
Figure 399:
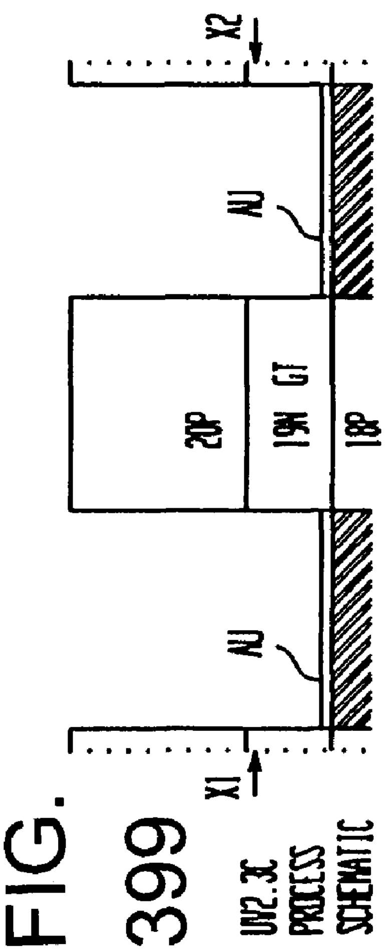
Figure 400:
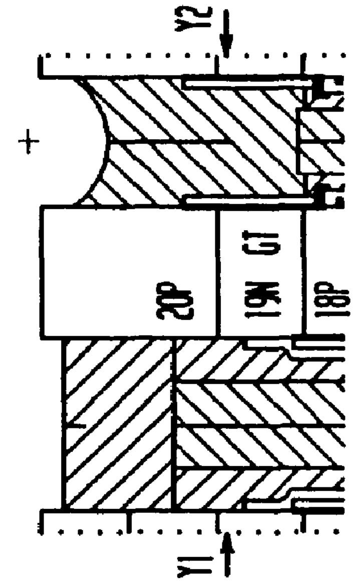

FIGS. 398, 399 and 400 depict three mutually orthogonal cross-sections, with the walls around the bridge in the narrowest trench cleared of the layer of semiconductor material.

Figure 401:
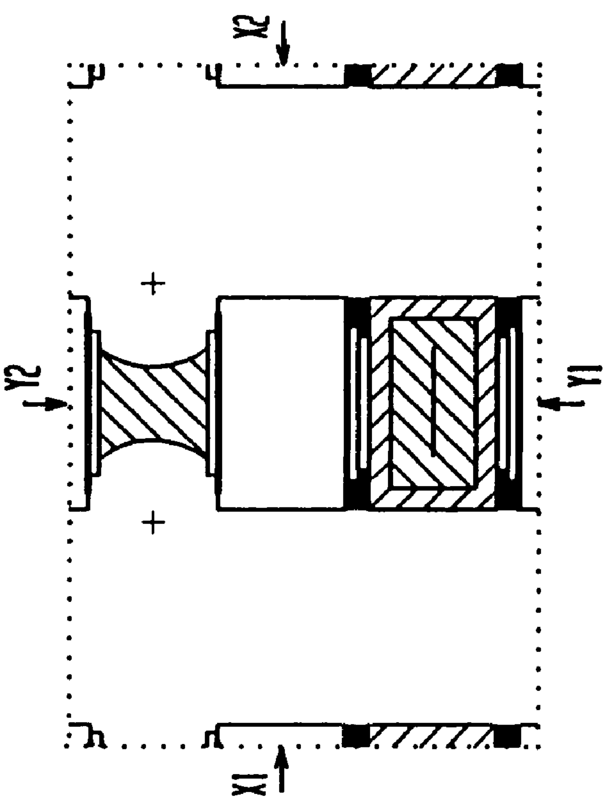
Figure 402:
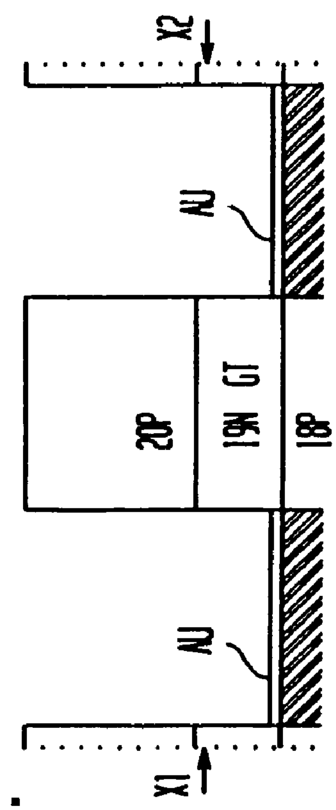
Figure 403:
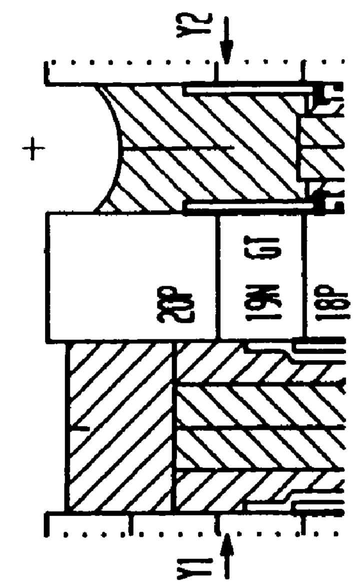

FIGS. 401, 402 and 403 depict three mutually orthogonal cross-sections, with the bridge in the narrowest trench shrunk.

Figure 404:
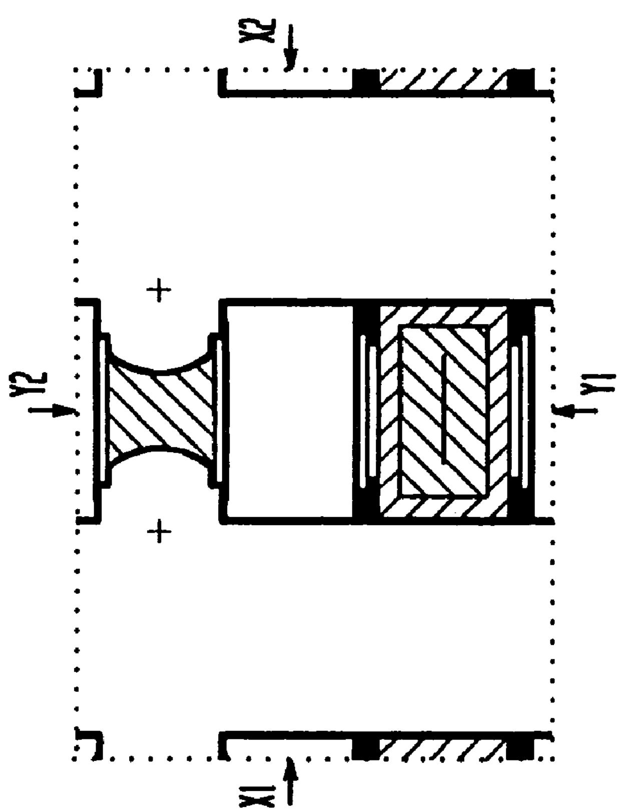
Figure 405:
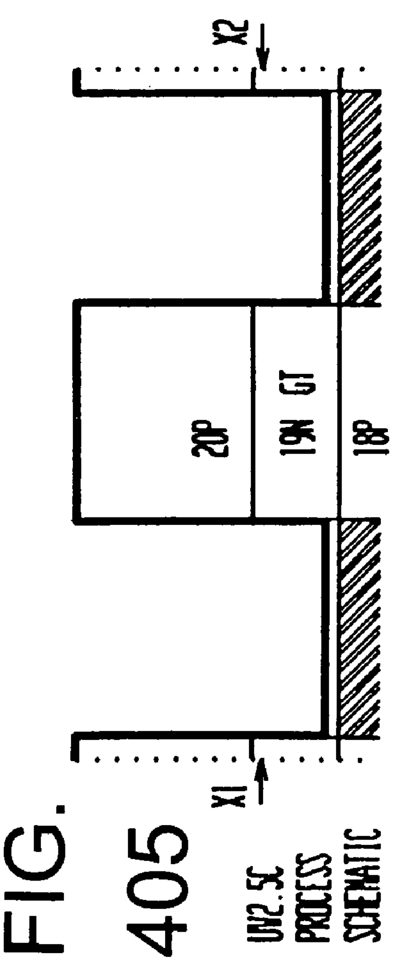
Figure 406:
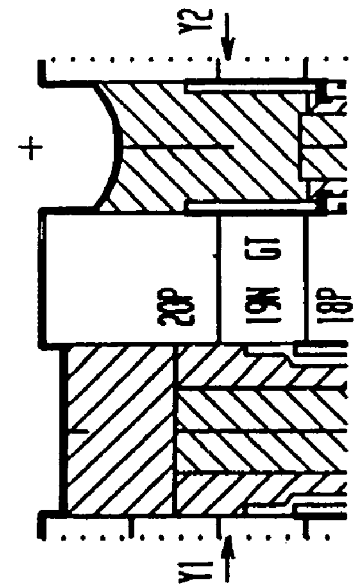

FIGS. 404, 405 and 406 depict three mutually orthogonal cross-sections, with a layer of first insulating material covering all surfaces.

Figure 407:
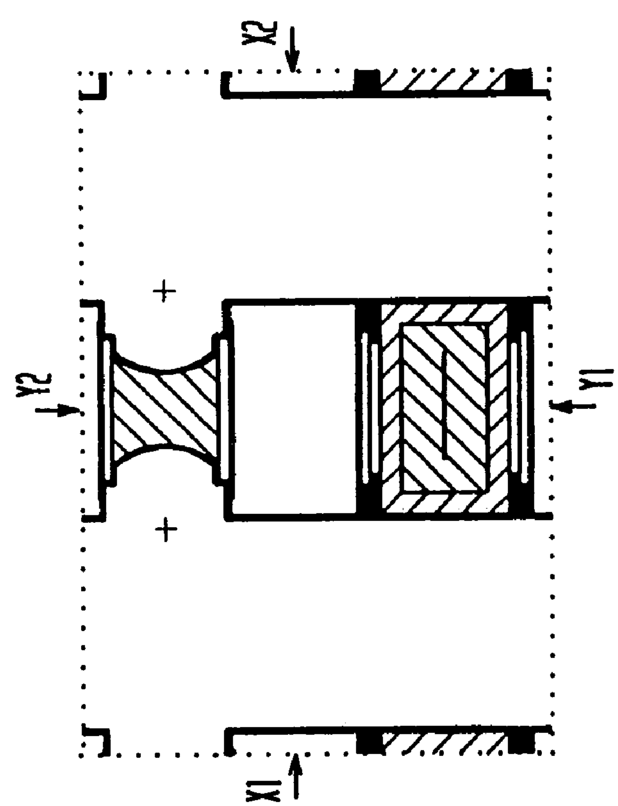
Figure 408:
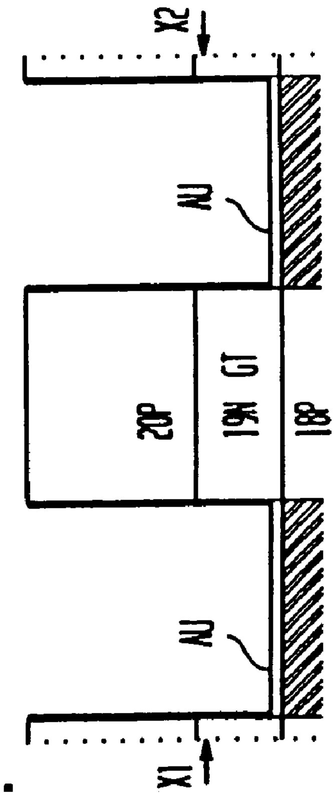
Figure 409:
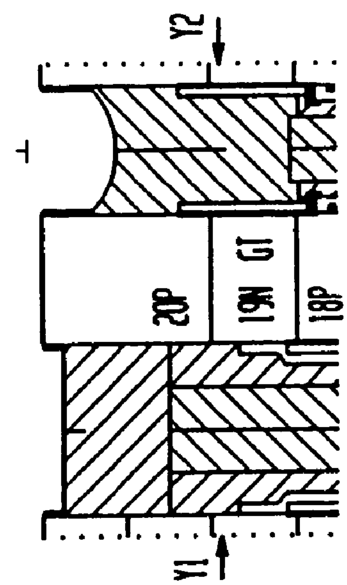

FIGS. 407, 408 and 409 depict three mutually orthogonal cross-sections, with the layer of first insulating material removed from all non-vertical surfaces.

Figure 410:
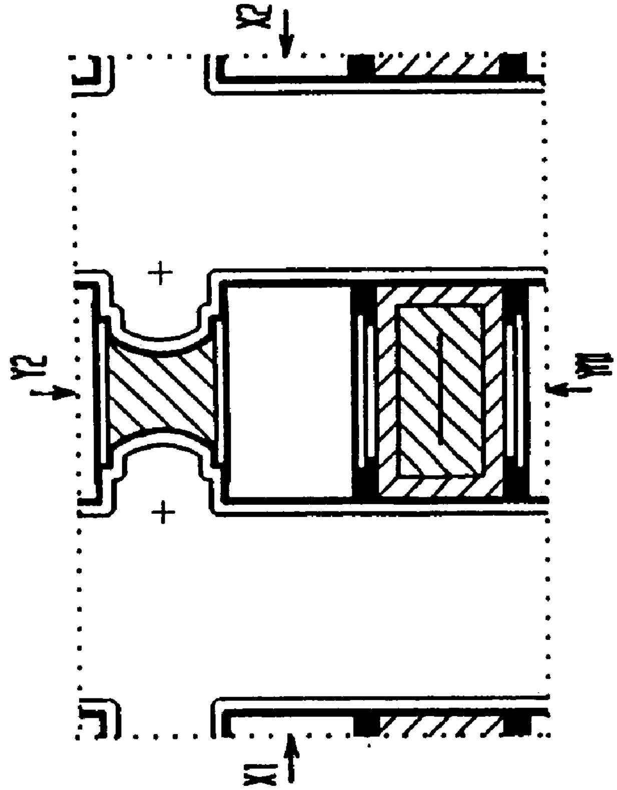
Figure 411:
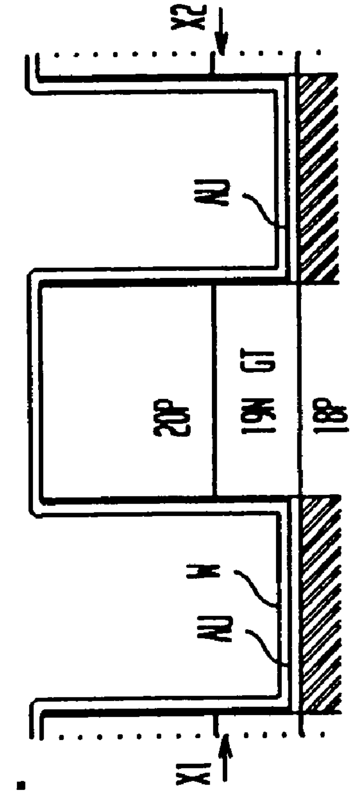
Figure 412:
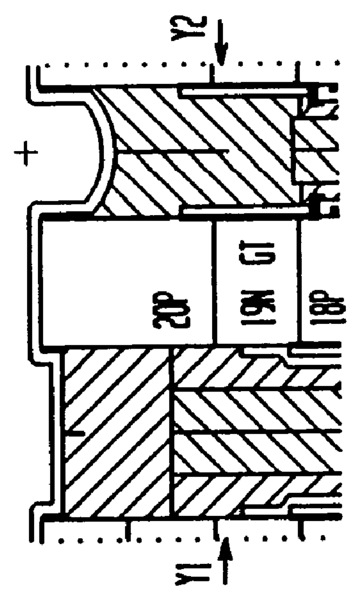

FIGS. 410, 411 and 412 depict three mutually orthogonal cross-sections, with a layer of first metal covering all surfaces.

Figure 413:
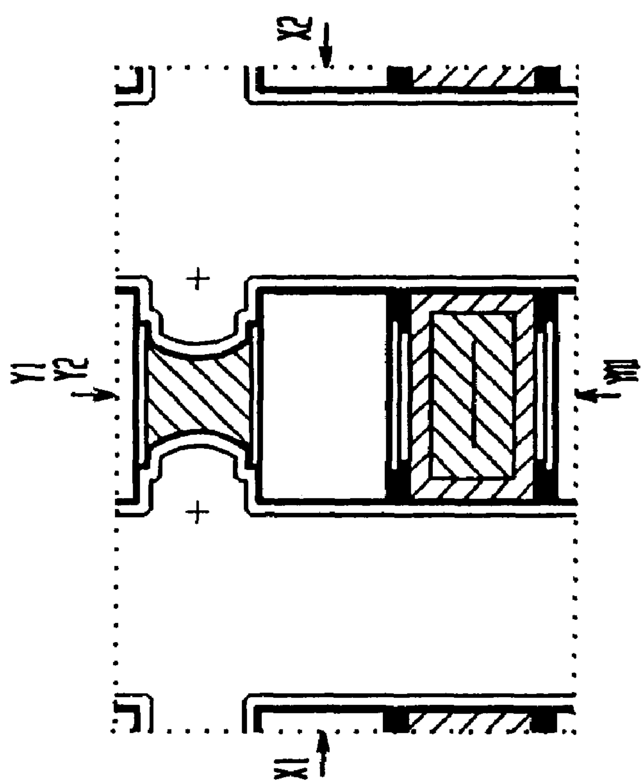
Figure 414:
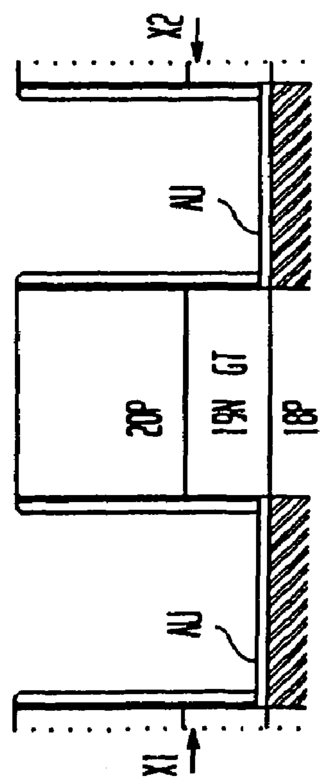
Figure 415:
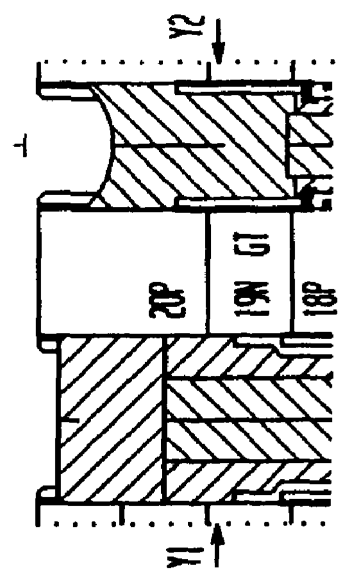

FIGS. 413, 414 and 415 depict three mutually orthogonal cross-sections, with the layer of first metal removed from all non-vertical surfaces.

Figure 416:
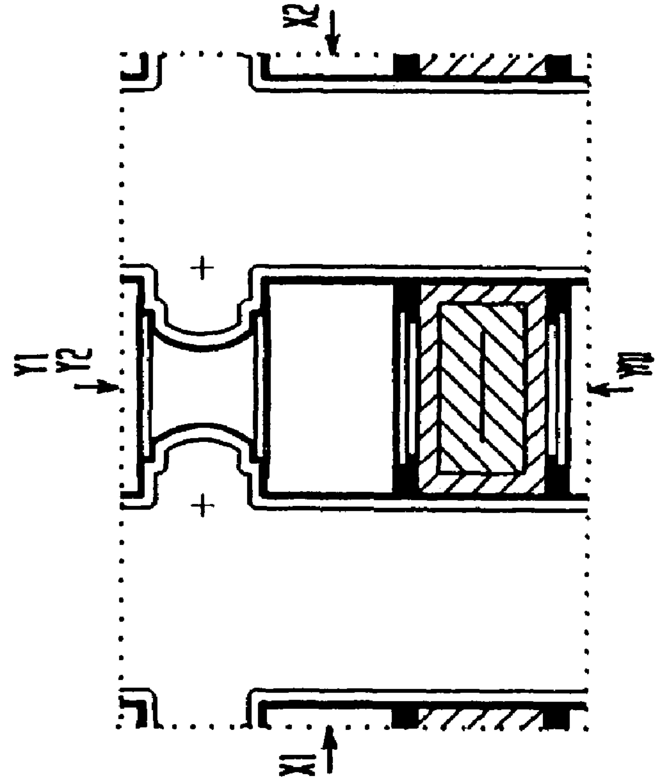
Figure 417:
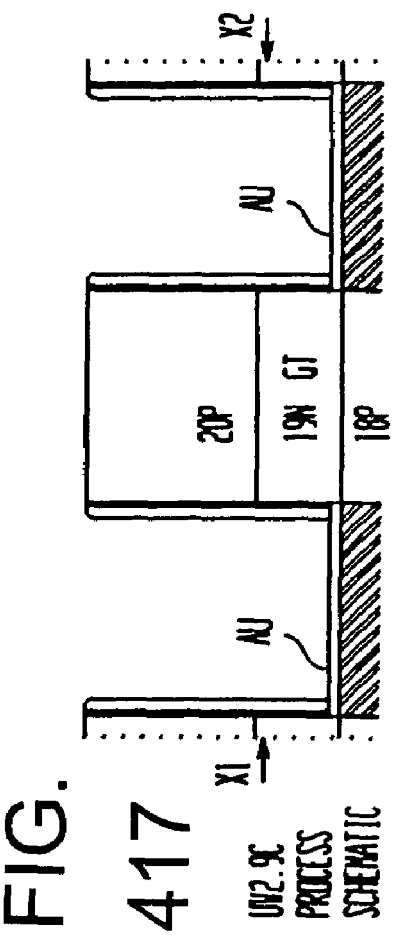
Figure 418:
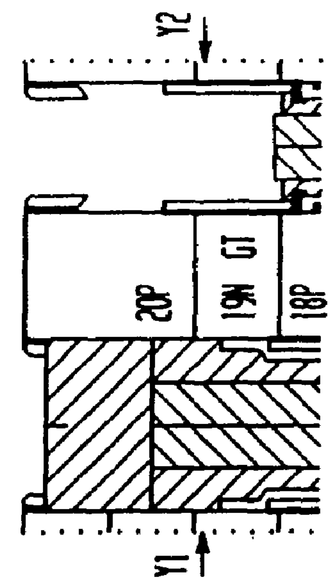

FIGS. 416, 417 and 418 depict three mutually orthogonal cross-sections, with the bridge of second insulating material removed.

Figure 419:
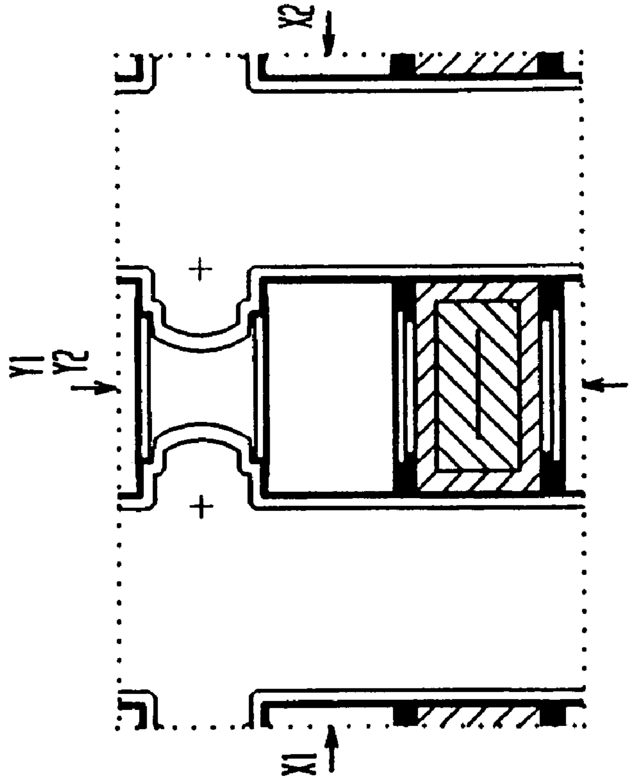
Figure 420:
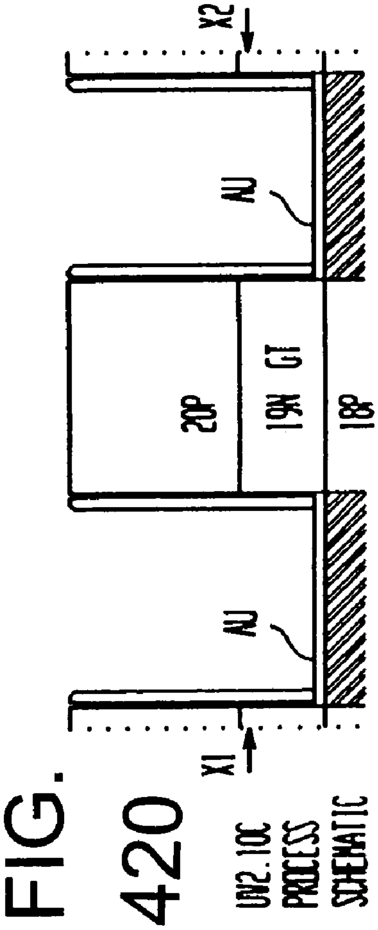
Figure 421:
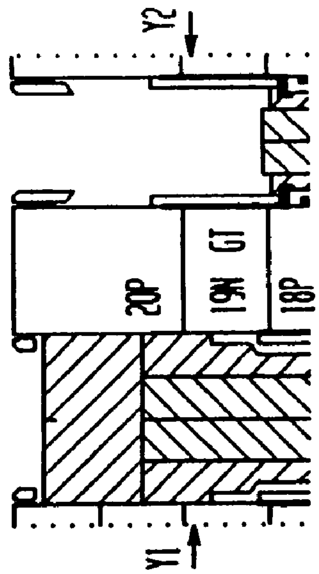

FIGS. 419, 420 and 421 depict three mutually orthogonal cross-sections, with the exposed bridges of first insulating material removed.

FIGS. 422, 423 and 424 depict three mutually orthogonal cross-sections, with the layer of first metal removed.

Figure 425:
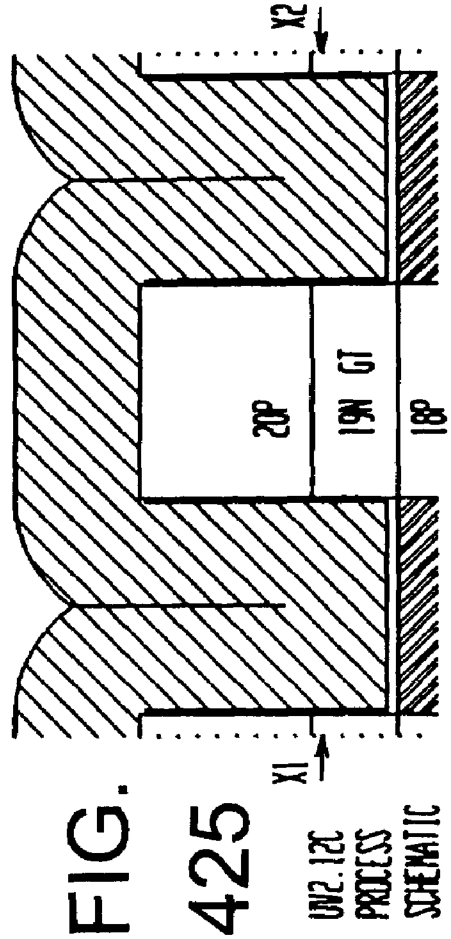
Figure 426:
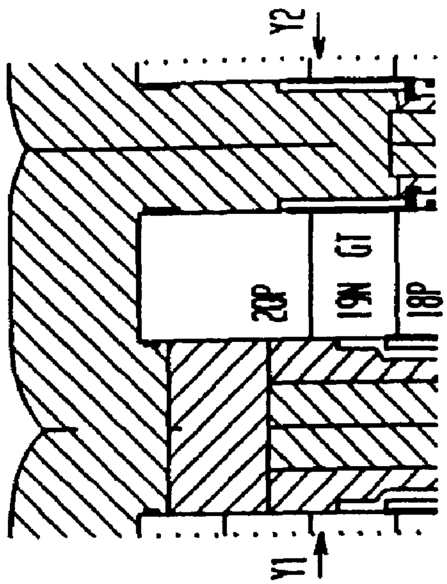

FIGS. 425 and 426 depict the two vertical cross-sections, with a layer of second insulating material covering all surfaces and filling all trenches.

Figure 428:
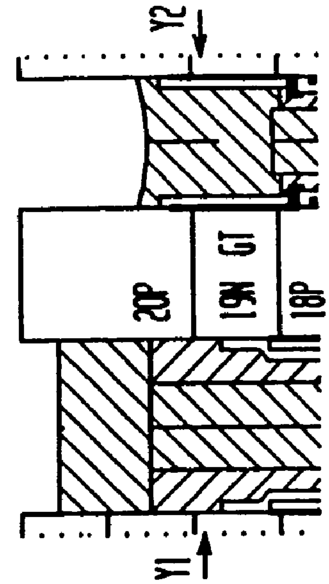
Figure 427:
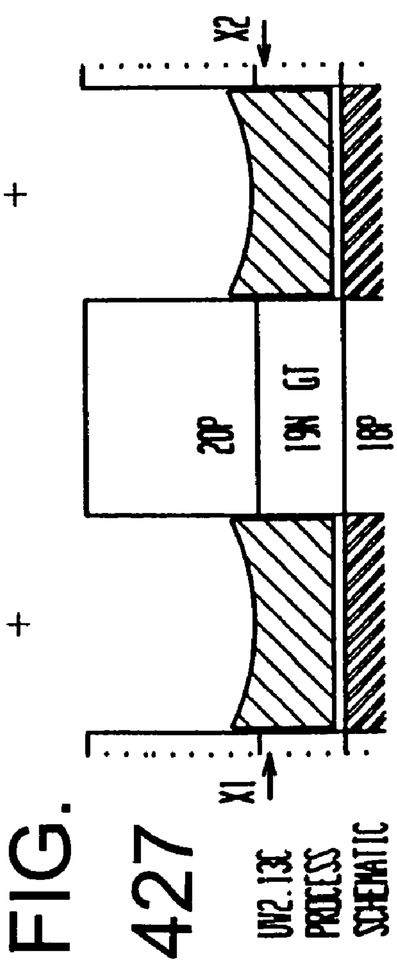

FIGS. 427 and 428 depict the two vertical cross-sections, with the second insulating material removed down to a preferred height in the widest and narrowest trenches and the layer of first insulating material removed above this height.

FIGS. 429 and 430 depict the two vertical cross-sections, with the second insulating material lowered and the exposed border of semiconductor material in the narrowest trench removed.

FIGS. 431 and 432 depict the two vertical cross-sections, with the surfaces of the second insulating material in the widest and narrowest trenches lowered to the height where the widest trench is cleared of it.

Figure 433:
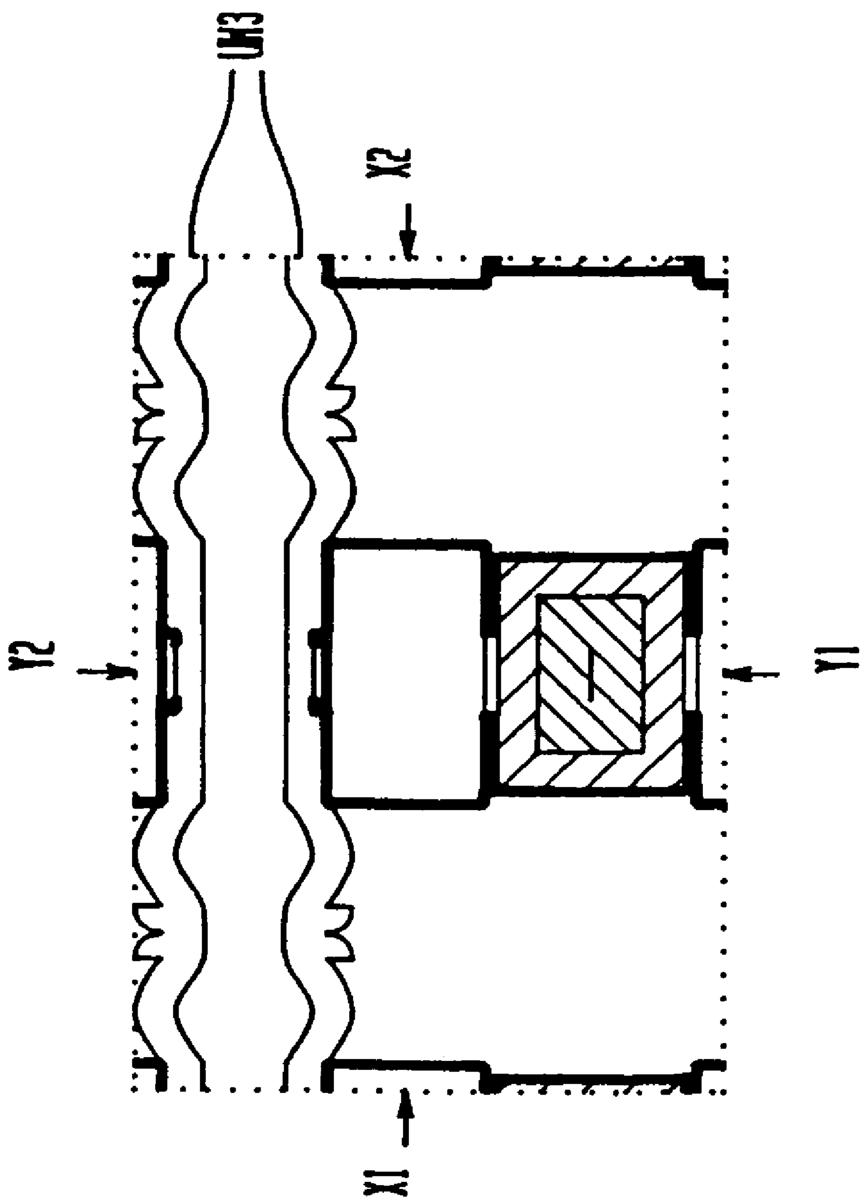
Figure 435:
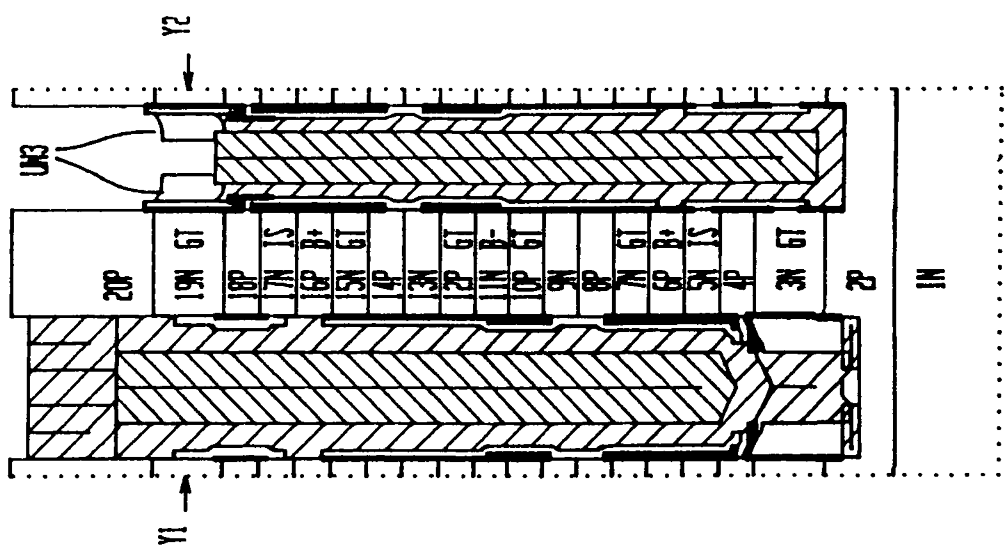
Figure 434:
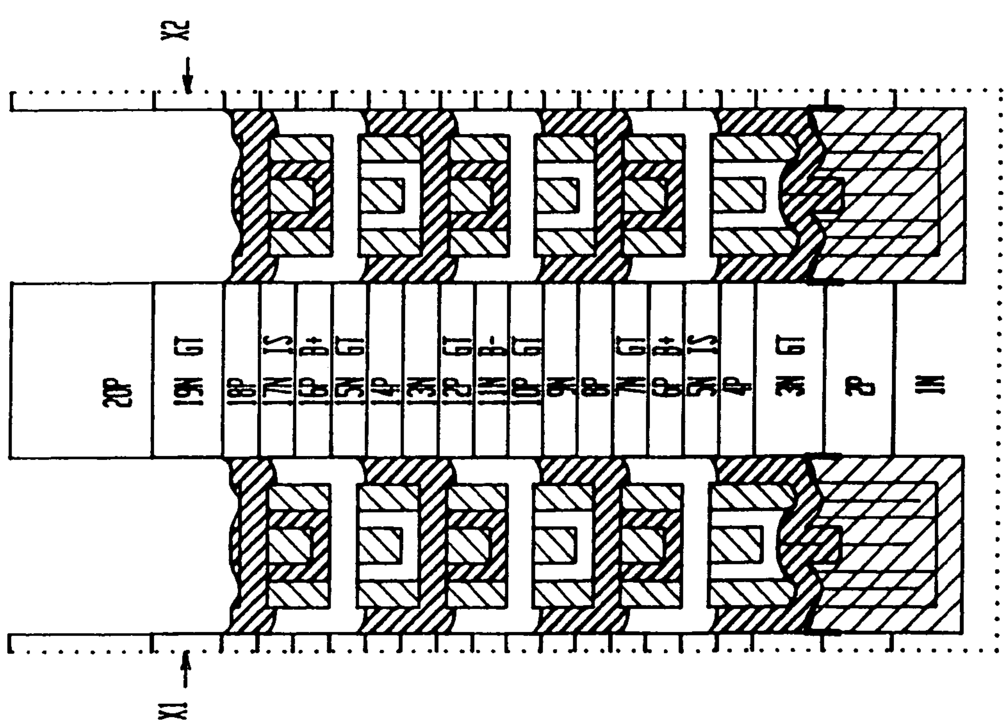

FIGS. 433, 434 and 435 depict three mutually orthogonal cross-sections of the structure of FIGS. 389, 390 and 391 with a layer of first insulating material covering the upper portions of the pillar walls and with two traces of first metal running along the narrowest trench.

Figure 436:
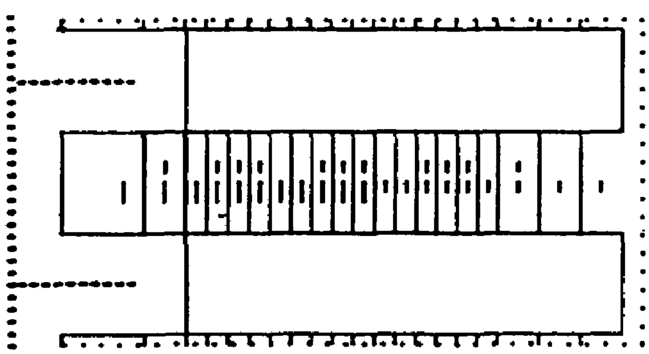
Figure 437:
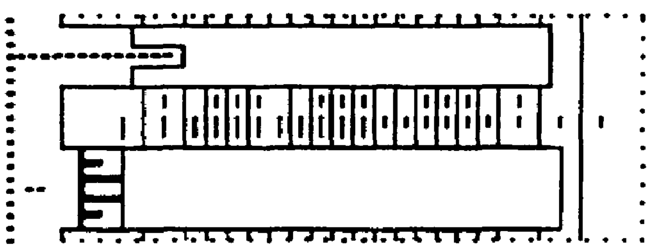

FIGS. 436 and 437 depict the two vertical cross-sections, with a layer of second insulating material covering all surfaces and filling the trenches.

Figure 438:
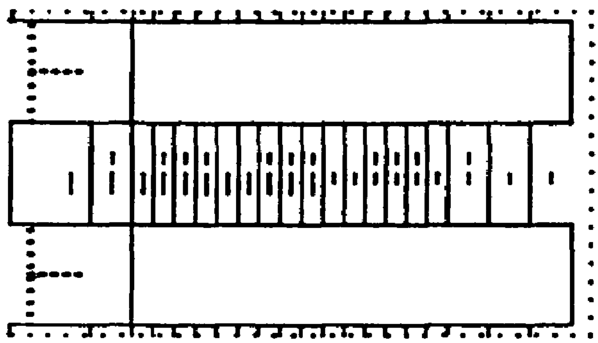
Figure 439:
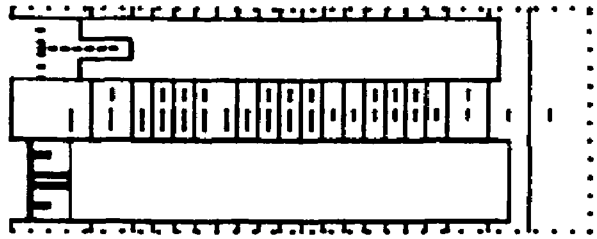

FIGS. 438 and 439 depict the two vertical cross-sections, with the top surfaces of the second insulating material even with the top surface of first insulating material in the intermediate-width trench.

Figure 440:
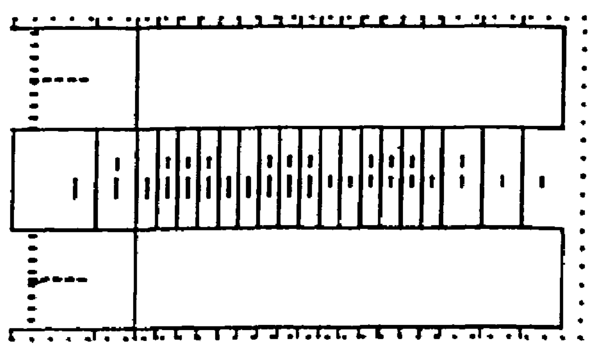
Figure 441:
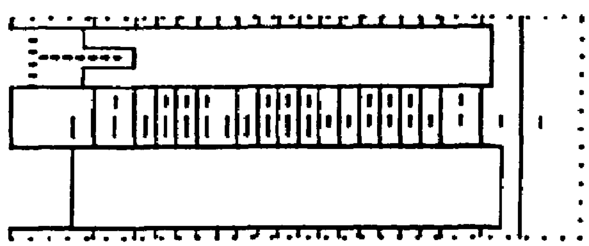

FIGS. 440 and 441 depict the two vertical cross-sections, with the intermediate-width trench cleared of the top layer of first insulating material.

Figure 442:
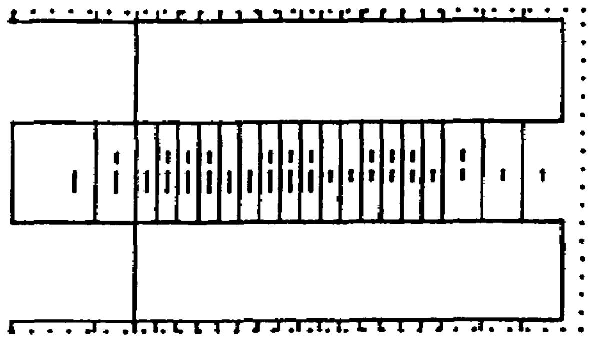
Figure 443:
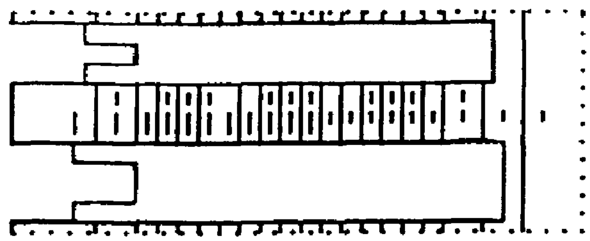

FIGS. 442 and 443 depict the two vertical cross-sections, with cores of second insulating material in the narrower trenches lowered.

Figure 444:
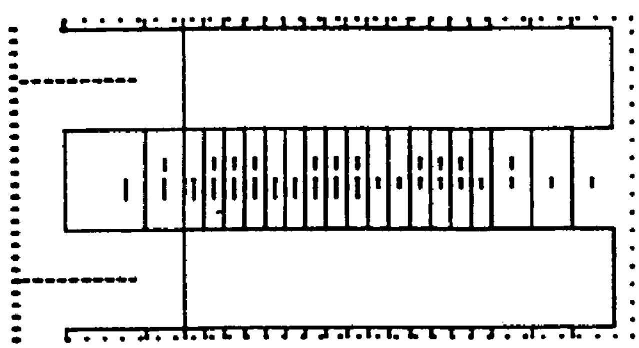
Figure 445:
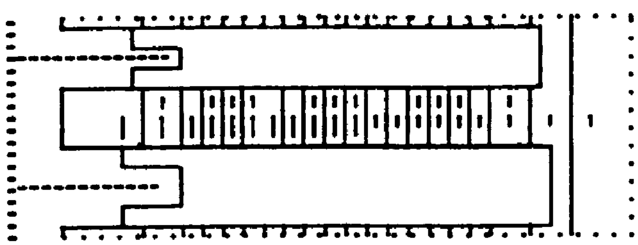

FIGS. 444 and 445 depict the two vertical cross-sections, with a layer of second insulating material covering all surfaces and filling the trenches.

Figure 446:
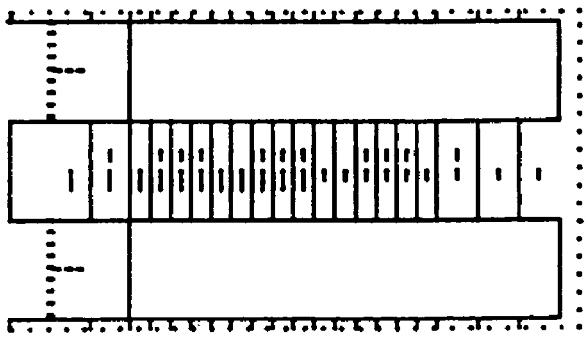
Figure 447:
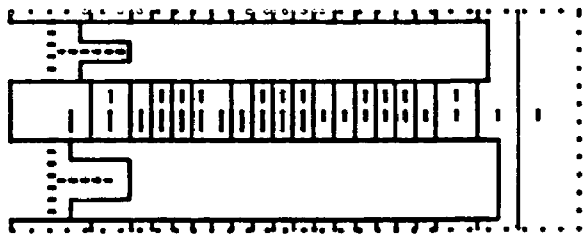

FIGS. 446 and 447 depict the two vertical cross-sections, with the surface of second insulating material lowered into the trenches.

Figure 448:
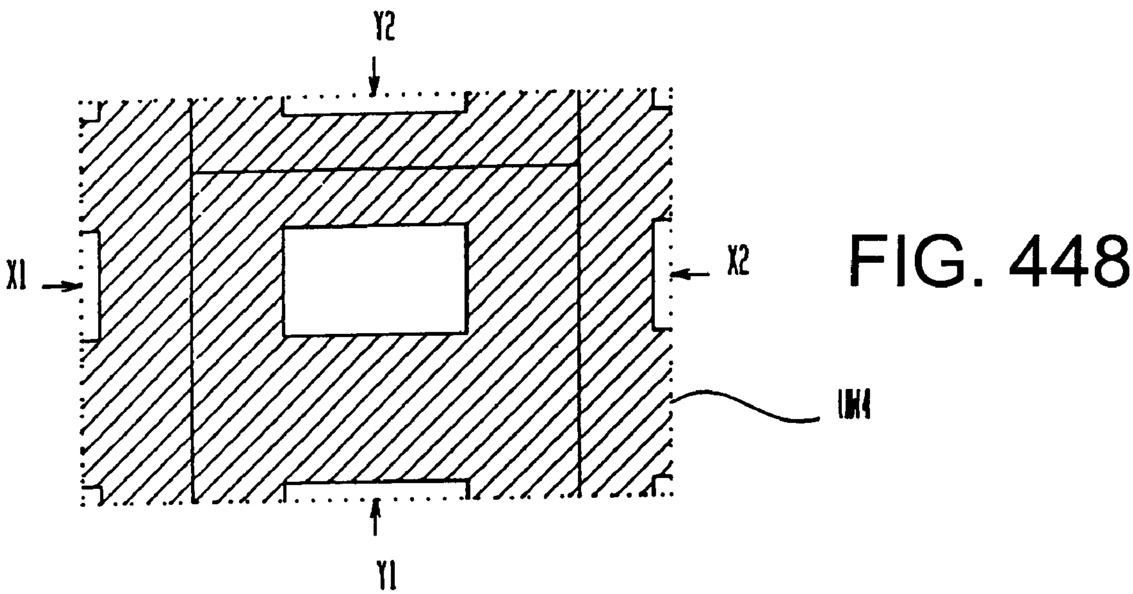
Figure 449:
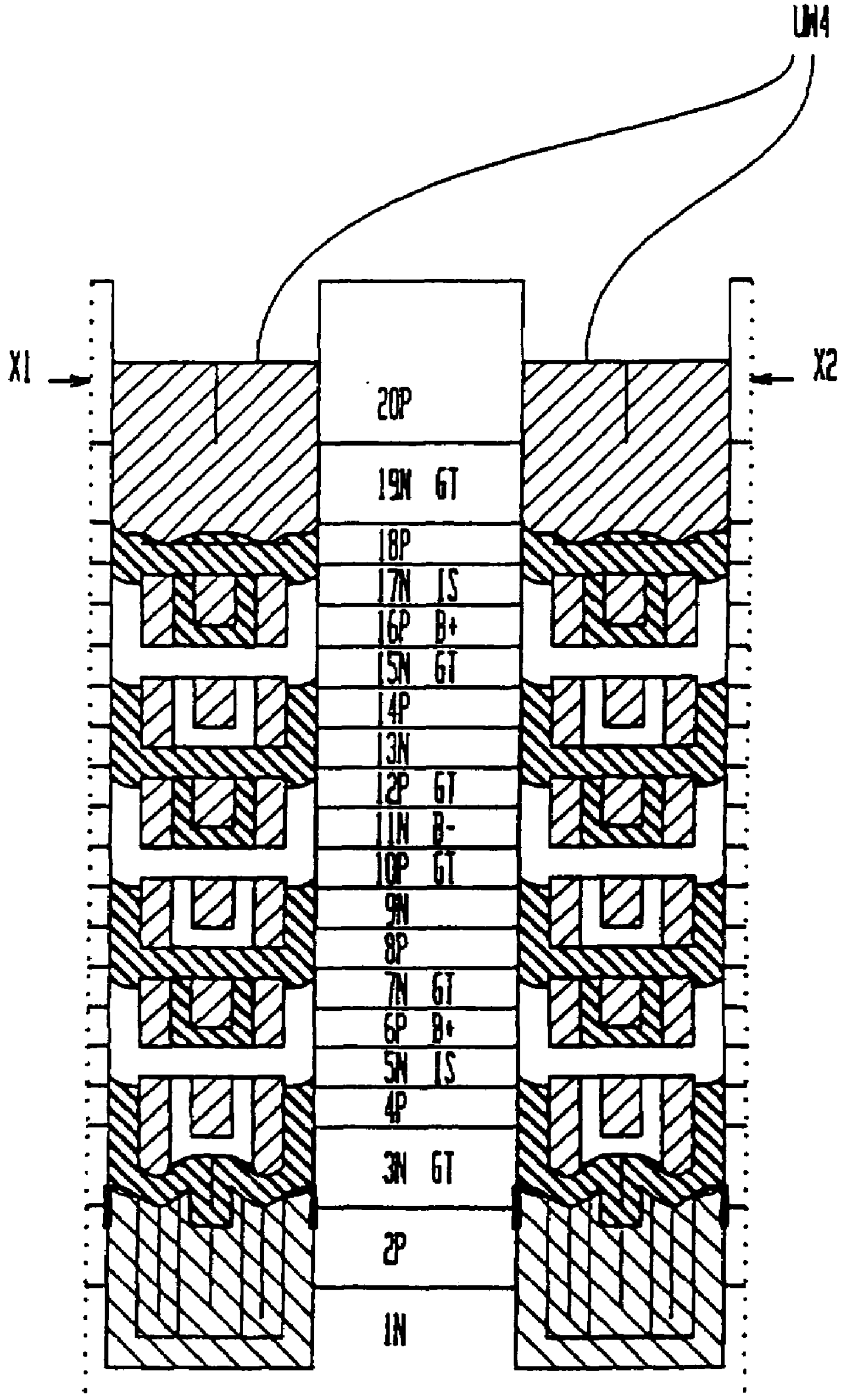
Figure 450:
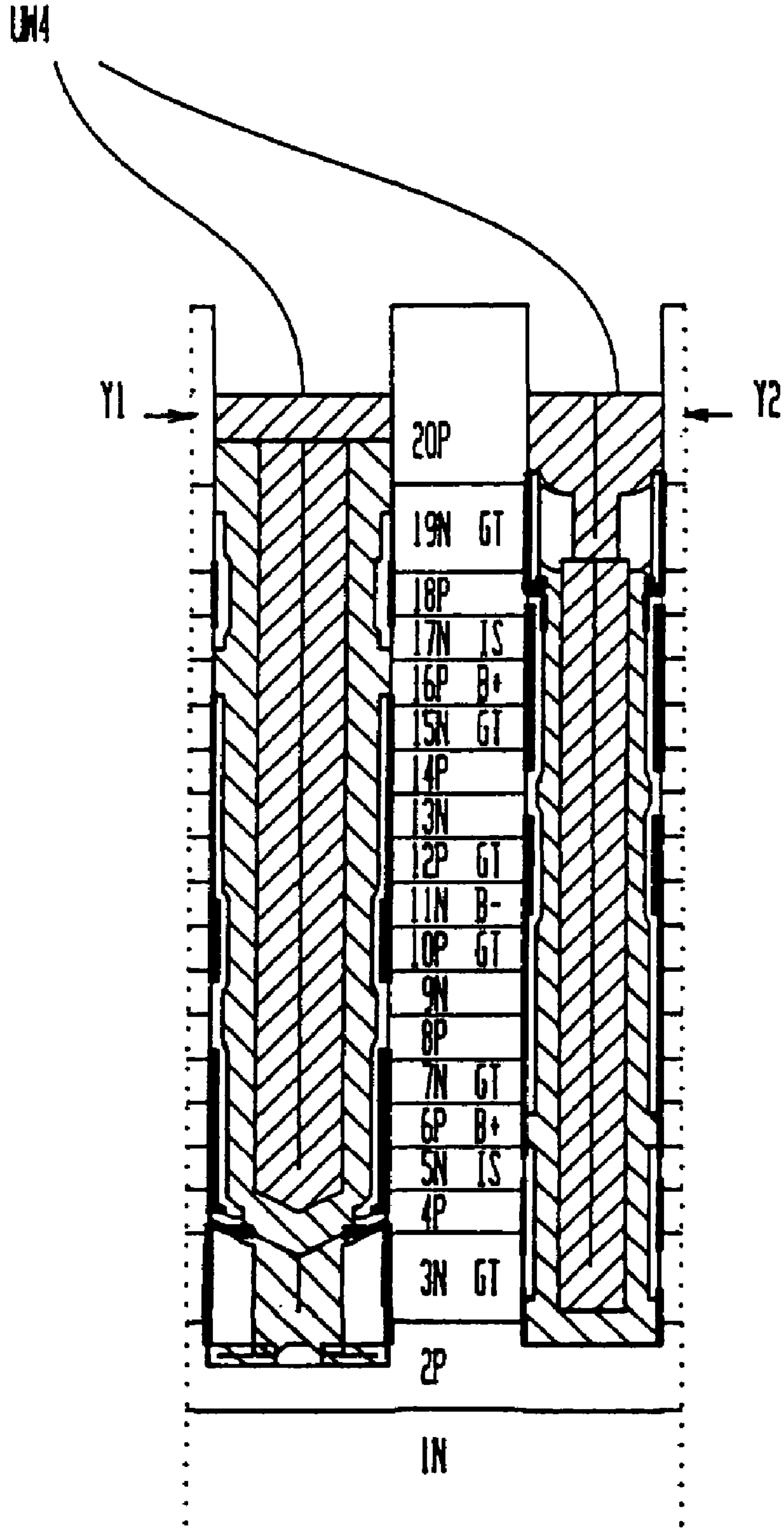

FIGS. 448, 449 and 450 depict three mutually orthogonal cross-sections of the structure of FIGS. 446 and 447 more completely and detailed.

Figure 451:
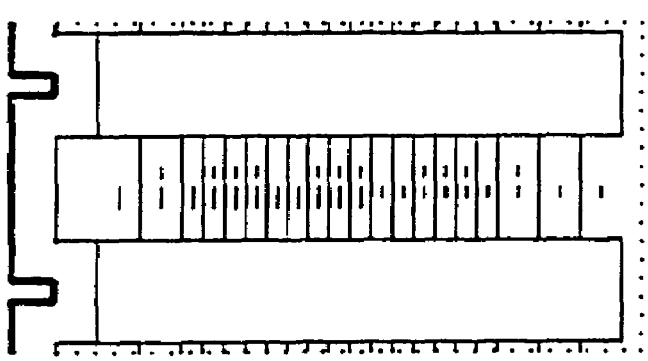
Figure 452:
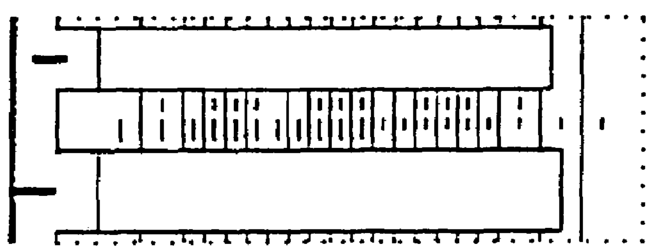

FIGS. 451 and 452 depict the two vertical cross-sections, with a layer of first metal covering all surfaces and filling the narrower trenches.

Figure 453:
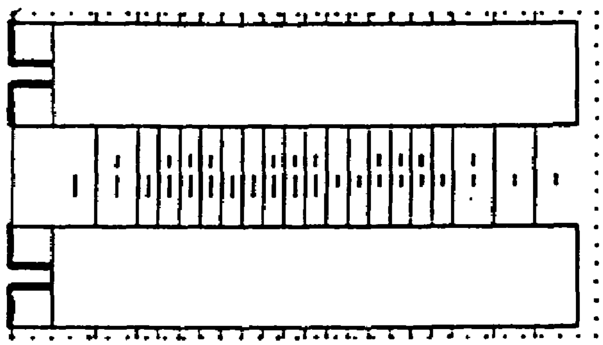
Figure 454:
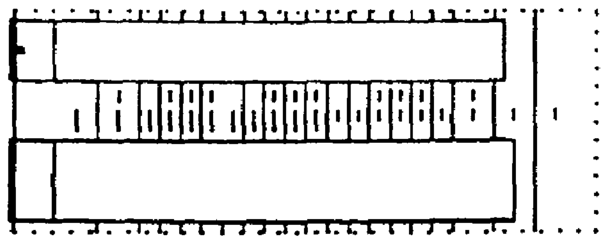

FIGS. 453 and 454 depict the two vertical cross-sections, with split layers of first metal in the widest trenches and the narrower trenches topped with first metal layers.

Figure 2:
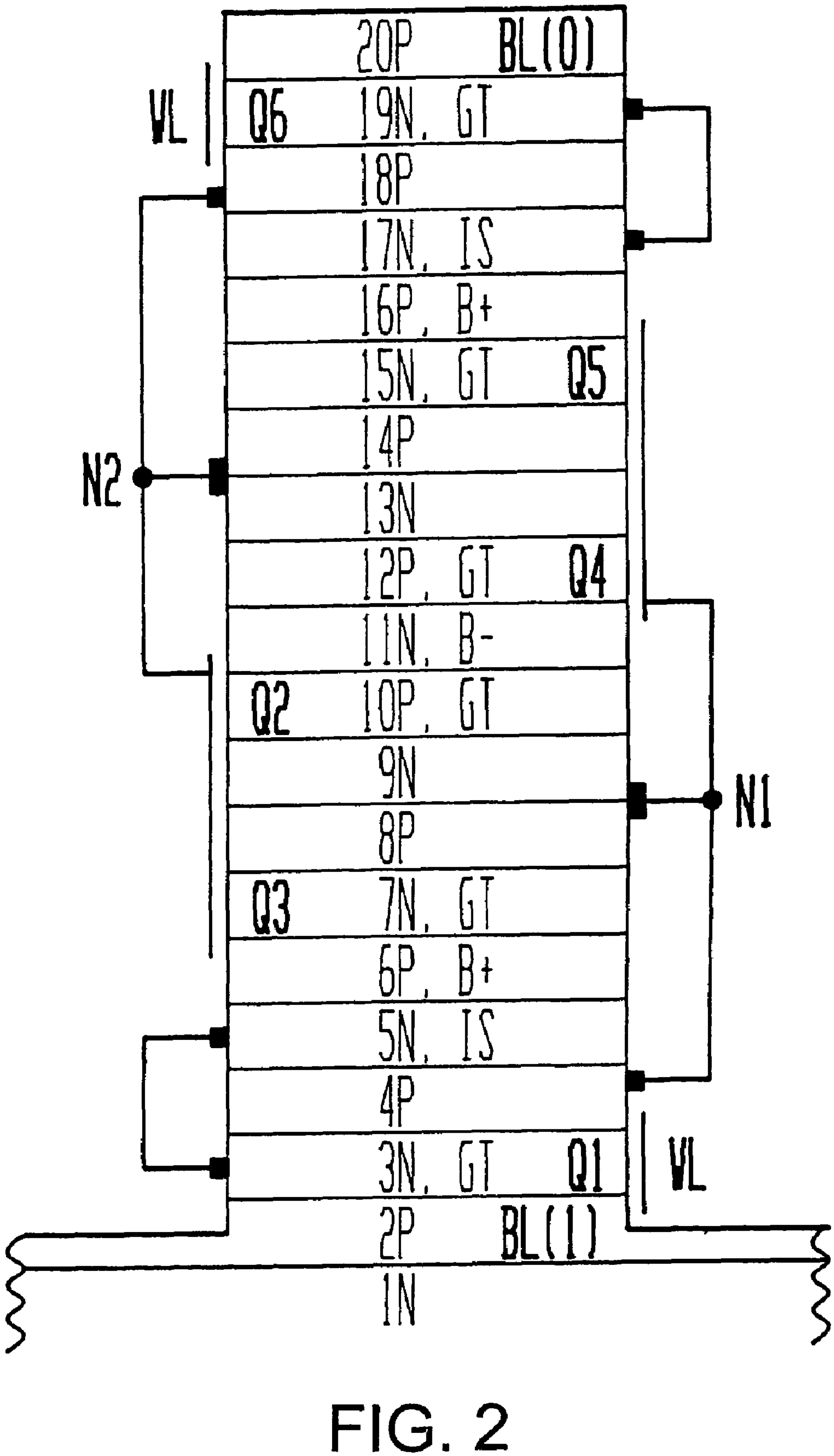
FIG. 2 depicts the schematic of FIG. 1 in the format of the subsequently described SRAM cell.
Figure 455:
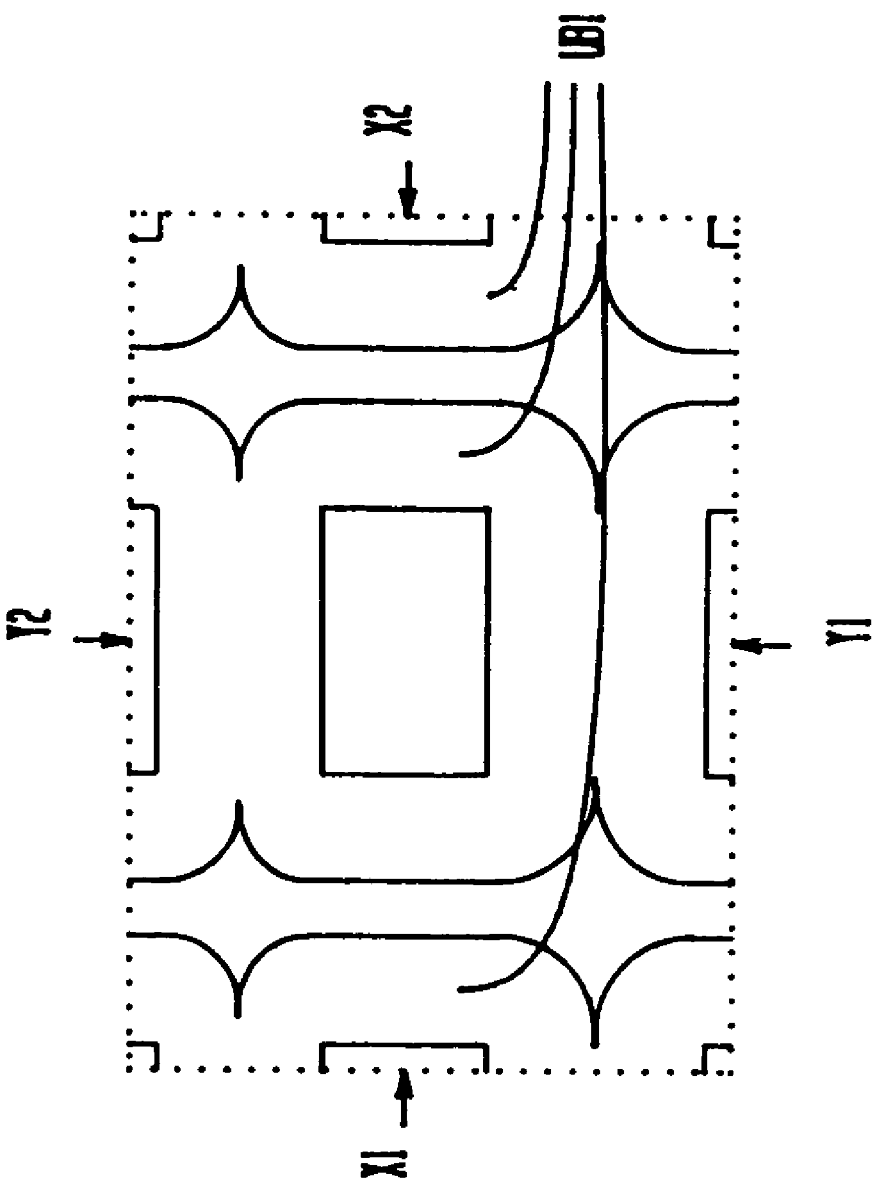
Figures 456, 457:
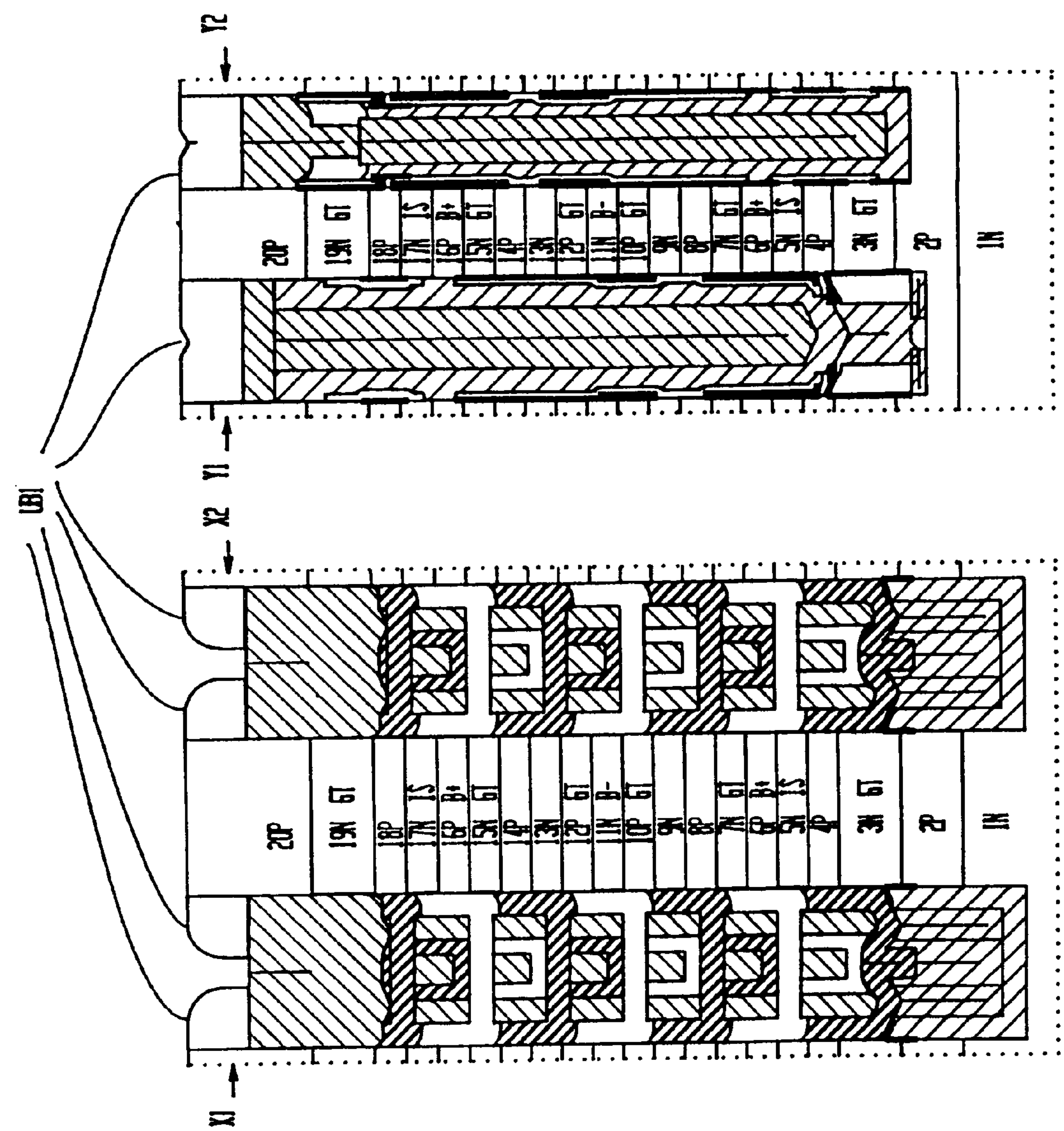

FIGS. 455, 456 and 457 depict three mutually orthogonal cross-sections of the structure of FIGS. 453 and 454, which is the implementation of the structure of FIG. 2, more completely and detailed.

Figure 458:
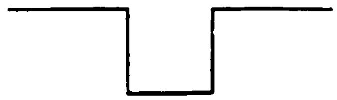

FIG. 458 depicts the cross-section of one of a set of repeating trenches in a first material.

Figure 459:

FIG. 459 depicts the same cross-section, with a layer of a second material covering all surfaces.

Figure 460:

FIG. 460 depicts the same cross-section, with a further layer of first material covering all surfaces.

Figure 461:

FIG. 461 depicts the same cross-section, with the layer of first material removed from all non-vertical surfaces.

Figure 462:

FIG. 462 depicts the same cross-section, with a further layer of second material covering all surfaces and closing the last gap in the trench.

Figure 463:

FIG. 463 depicts the same cross-section, with ribbons of second material alternating with ribbons of first material left in the trench.

Figure 464:
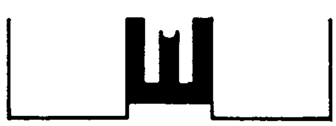

FIG. 464 depicts the same cross-section, with the first material surface below the bottom of the structures of second material, and the blades of first material removed.

Figure 465:
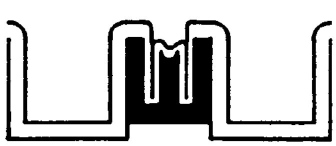

FIG. 465 depicts the same cross-section, with a new layer of first material covering all surfaces.

Figure 466:
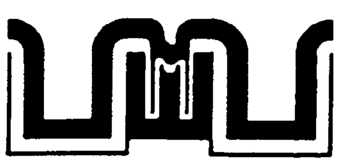

FIG. 466 depicts the same cross-section, with a new layer of second material covering all surfaces.

Figure 467:
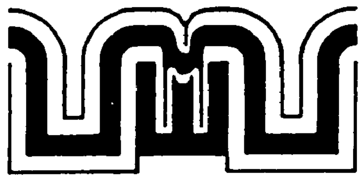

FIG. 467 depicts the same cross-section, with a further layer of first material covering all surfaces.

Figure 468:
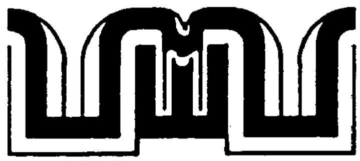

FIG. 468 depicts the same cross-section, with the layer of first material removed from all non-vertical surfaces.

Figure 469:
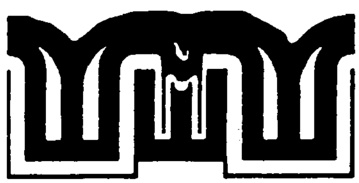

FIG. 469 depicts the same cross-section, with a further layer of second material covering all surfaces and closing the last gap.

Figure 470:

FIG. 470 depicts the same cross-section, with ribbons of second material alternating with interstices of first material.

Figure 471:
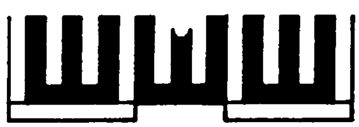

FIG. 471 depicts the same cross-section, with the first material removed from the interstices.

Figure 472:
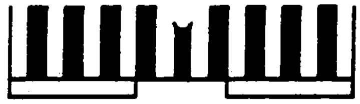

FIG. 472 depicts the same cross-section, with the bridges of second material at the bottom of the ribbons removed.

Figure 473:

FIG. 473 depicts the same cross-section, with the interstices between the ribbons deepened into the first material at the bottom.

Figure 474:

FIG. 474 depicts the same cross-section, with the ribbons of second material removed.

Figure 475:
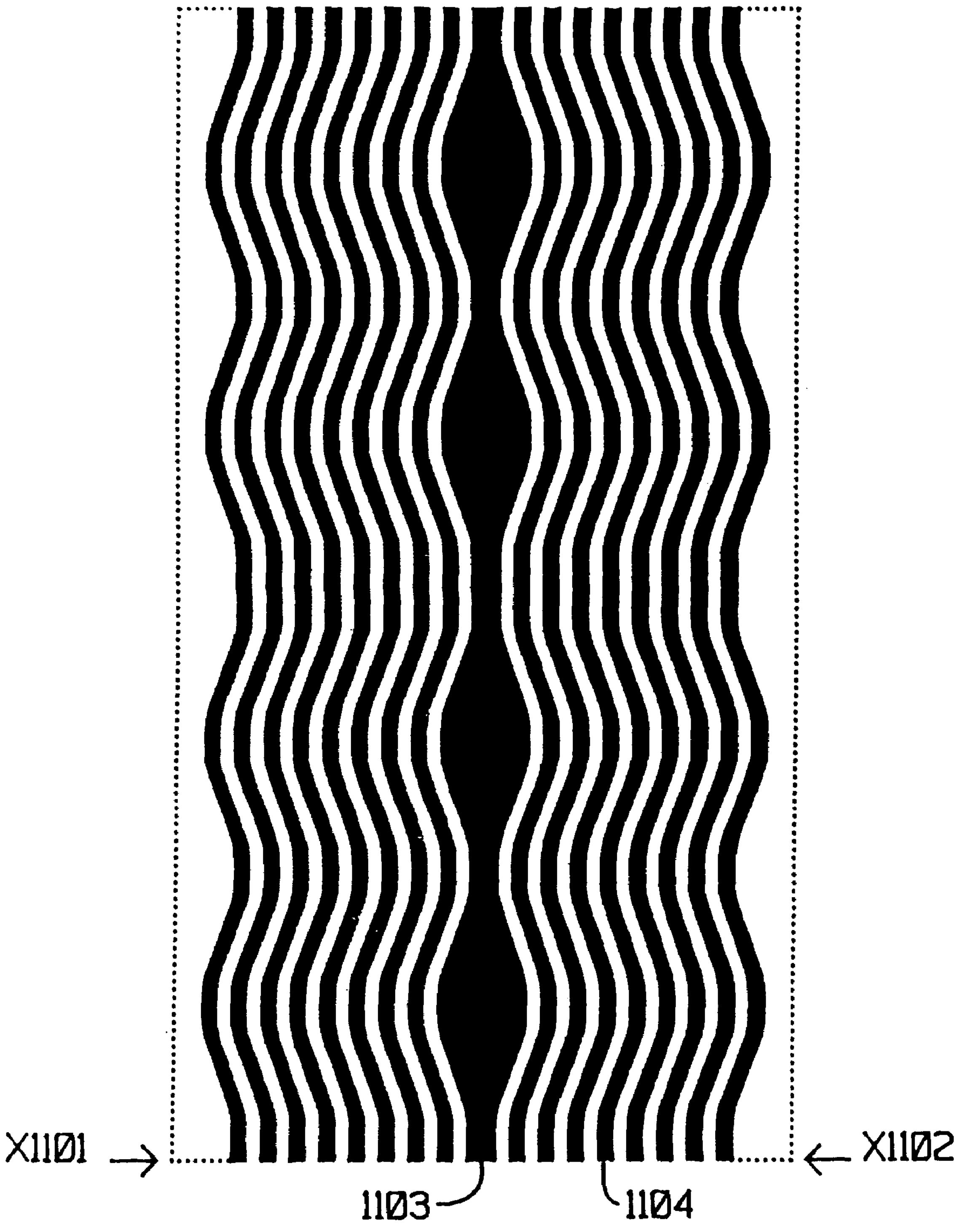
Figure 476:
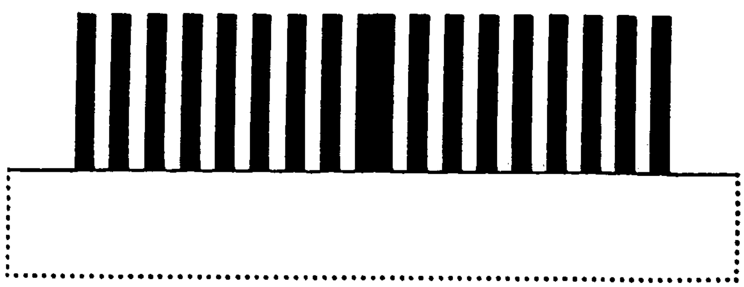

FIG. 475 and FIG. 476 depict a top view and a cross-section, respectively, of a group of ribbons of a second material on top of a substrate of a first material.

Figure 477:
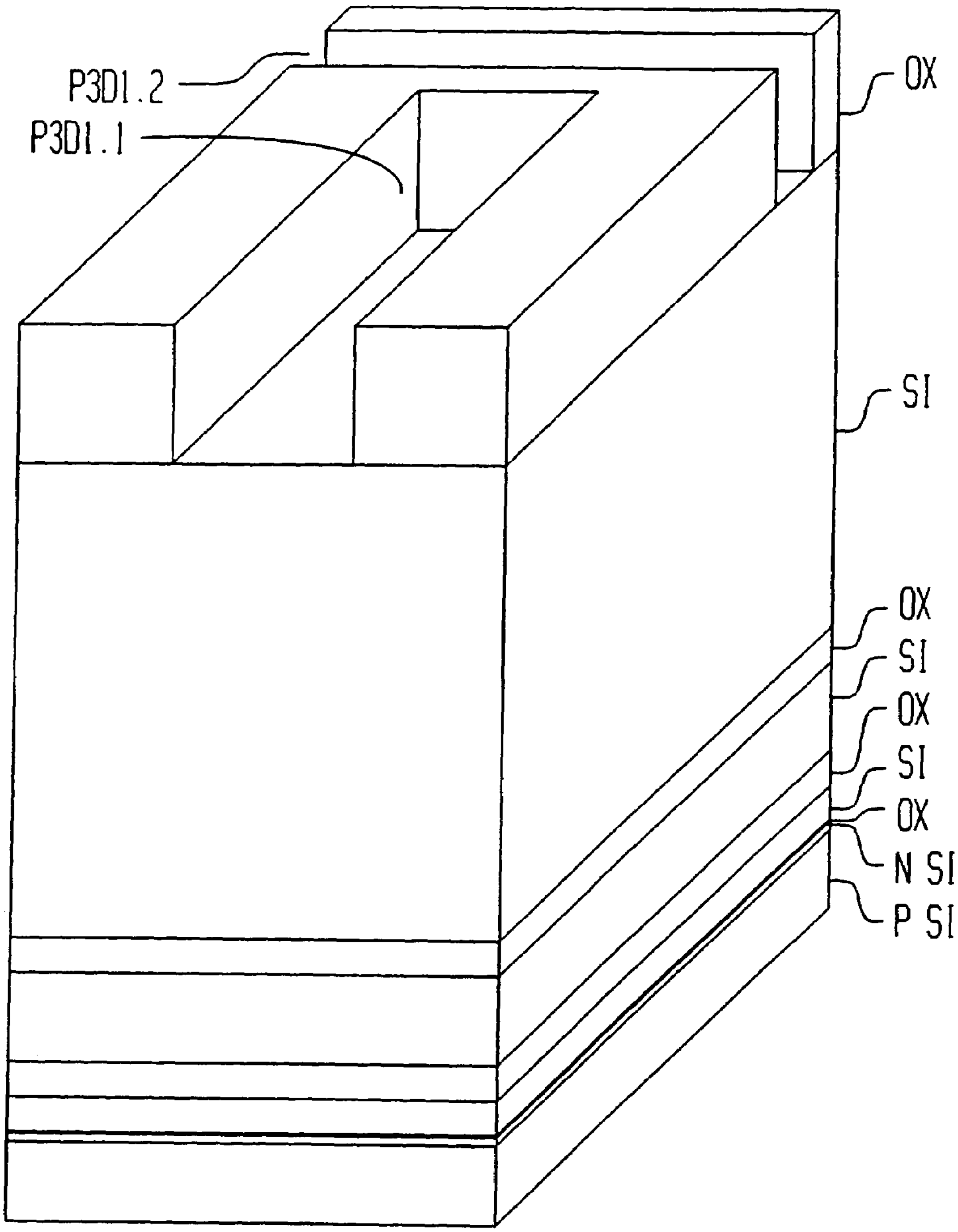

FIG. 477 is a three-dimensional depiction of a small cutaway section of an integrated circuit wafer with two openings in the top layer for forming a forward trench and a second, orthogonal trench.

Figure 478:
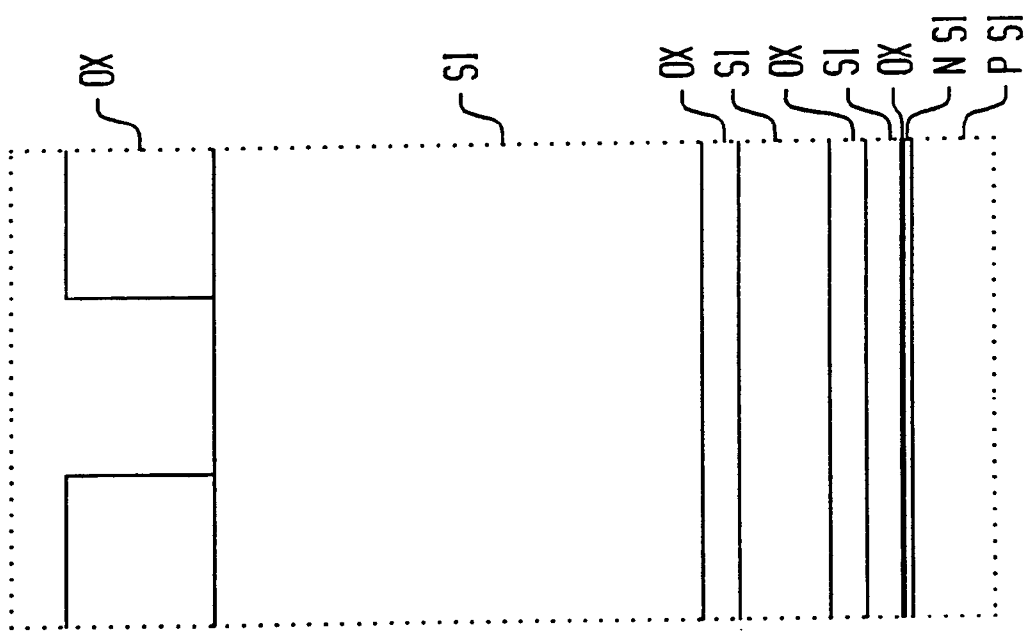

FIG. 478 is a two-dimensional depiction of the front end of FIG. 477 (P3D1), i.e., the cross-section of the forward trench mask.

Figure 479:
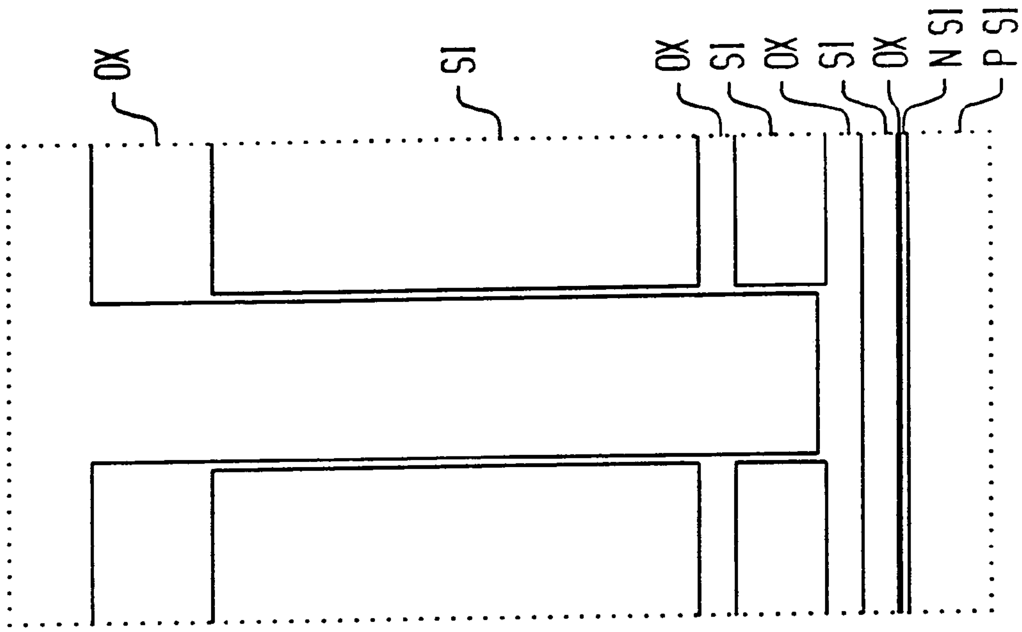

FIG. 479 illustrates the cross-section of the forward trench etched through the opening in the top layer and coated with a layer of first insulating material.

Figure 480:
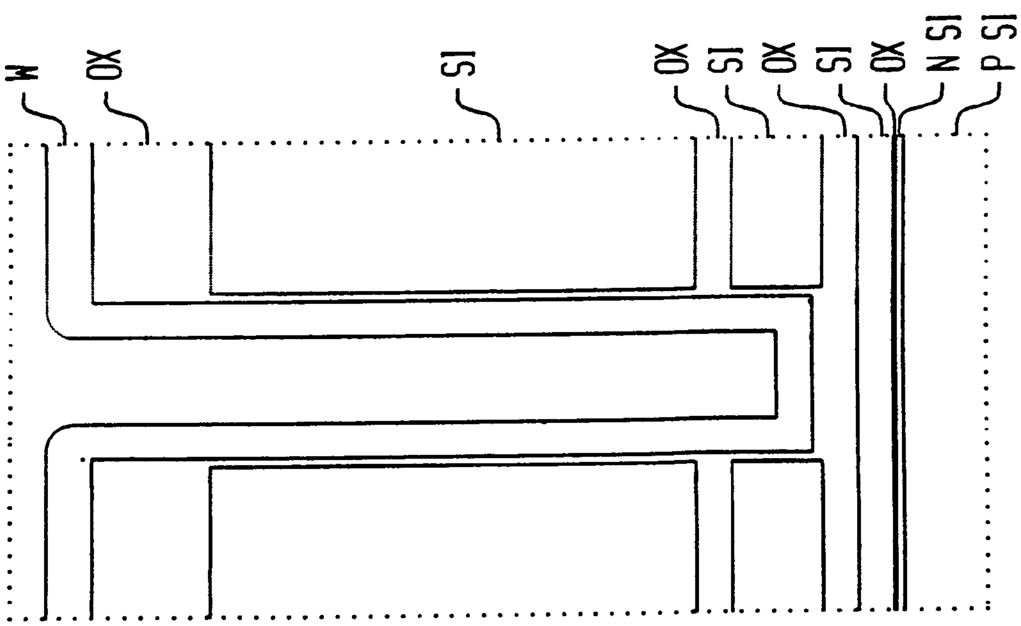

FIG. 480 illustrates the cross-section of the forward trench further coated with a metal layer.

Figure 481:
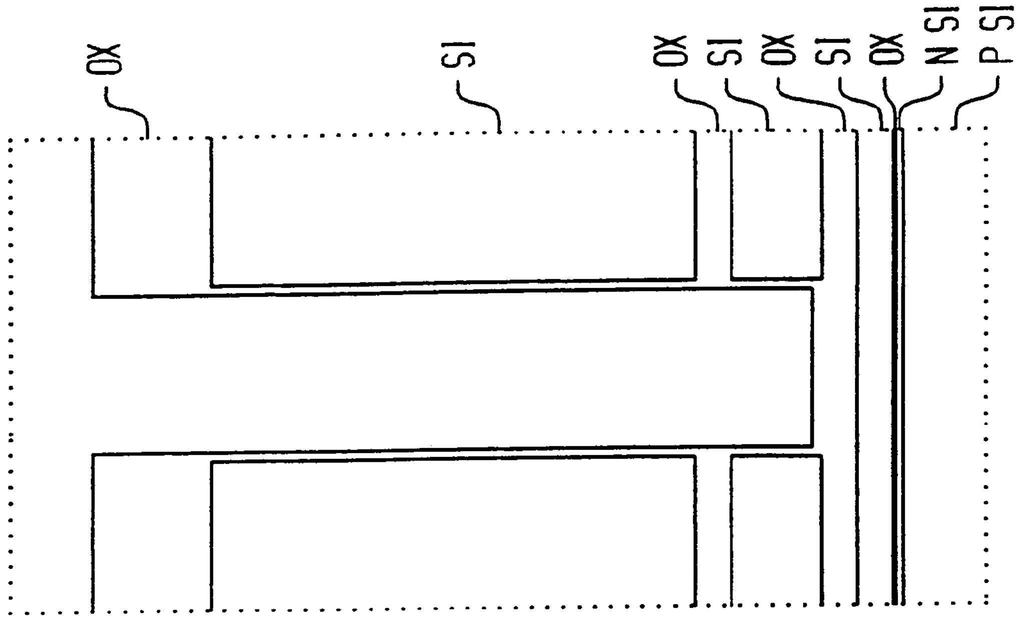

FIG. 481 illustrates the cross-section of the forward trench with the metal layer removed.

Figure 482:
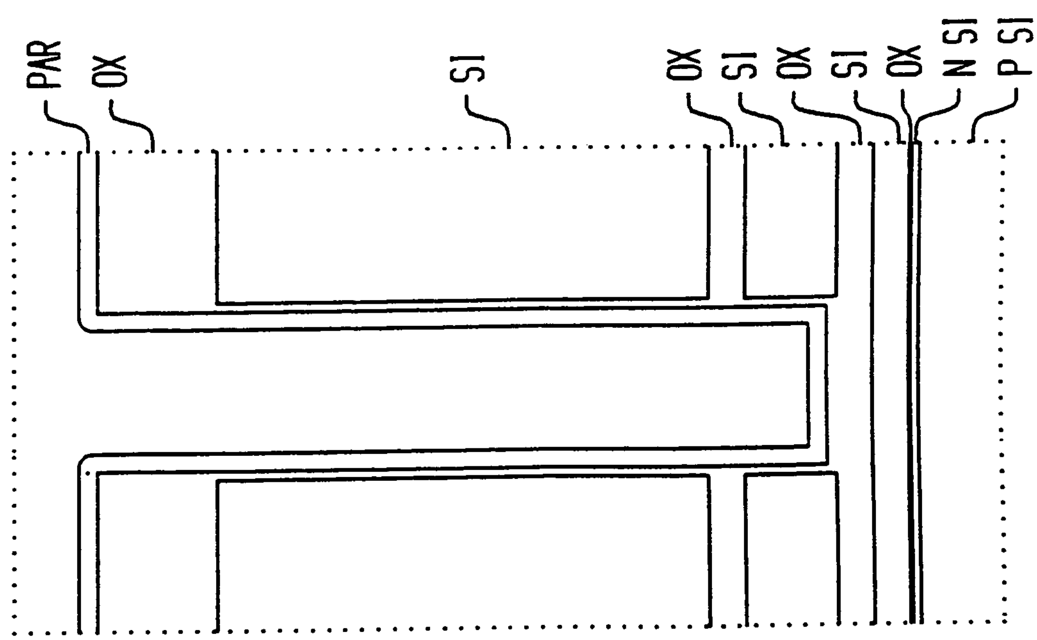

FIG. 482 illustrates the cross-section of the forward trench coated with a second insulating material.

Figure 483:
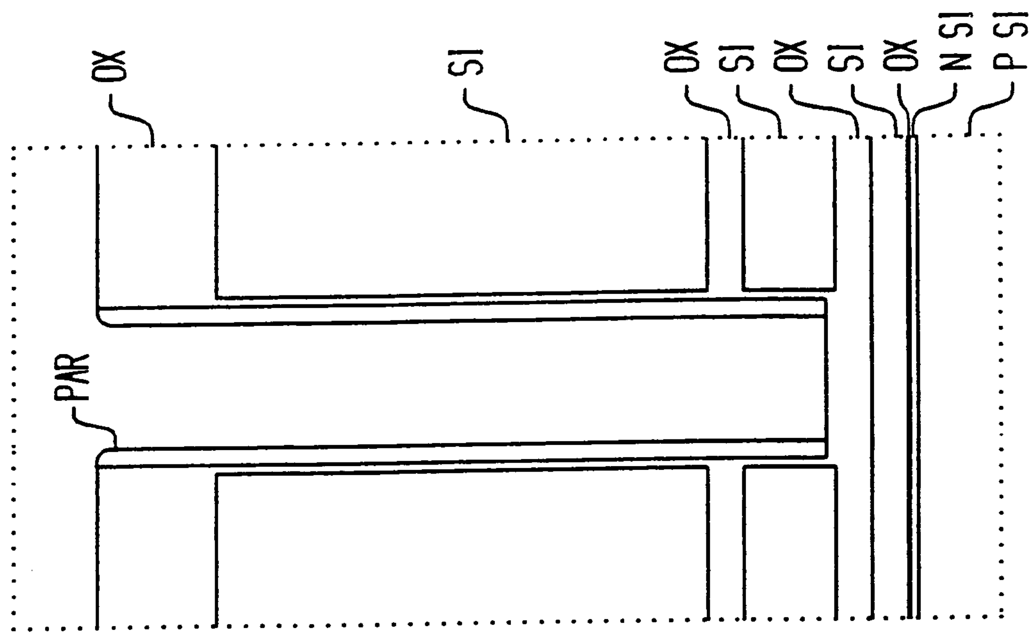

FIG. 483 illustrates the cross-section of the forward trench with the second insulating material removed from the horizontal surfaces.

FIG. 484 illustrates the cross-section of the forward trench with its walls coated with alternating layers of the second and a third insulating material.

FIG. 485 illustrates the cross-section of the forward trench with all layers of the second insulating material removed.

Figure 486:
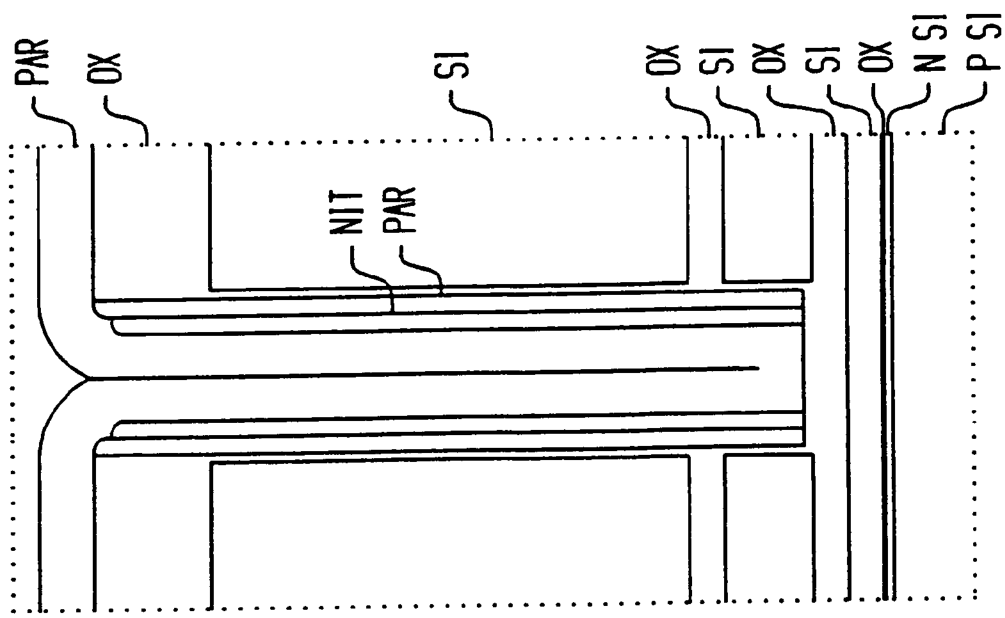

FIG. 486 illustrates the cross-section of the forward trench with the walls coated with a thin layer each of the second and third insulating materials and covered with a thick layer of the second insulating material which fills the forward trench.

Figure 487:
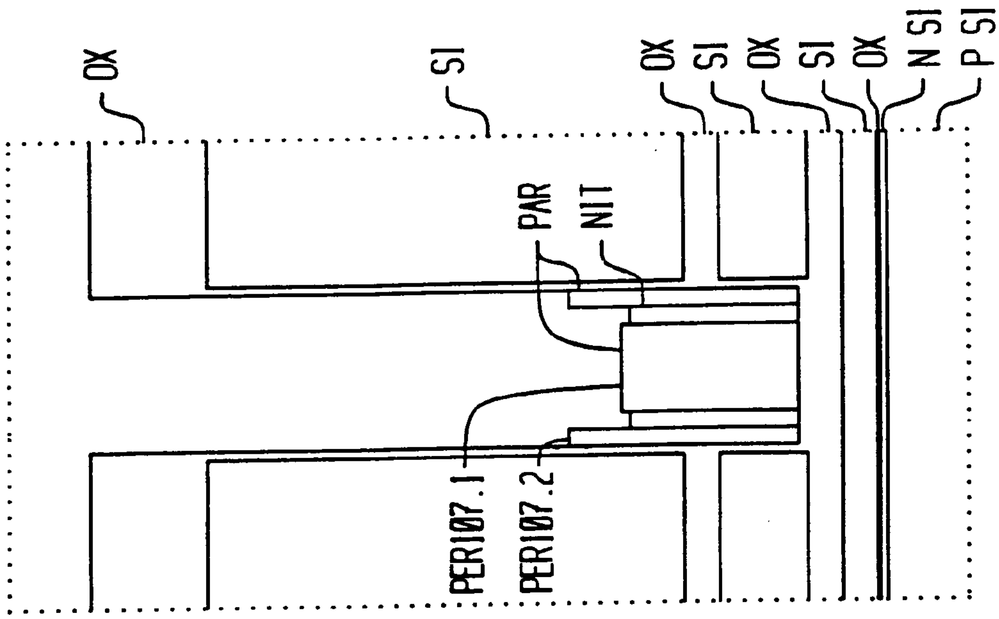

FIG. 487 illustrates the cross-section of the forward trench with the alternating layers etched down to various heights.

FIG. 488 illustrates the cross-section of the forward trench with the walls further coated with alternating layers of the second and third insulating materials and closed out at the bottom.

FIG. 489 illustrates the cross-section of the forward trench with all layers of the second insulating material removed.

Figure 490:
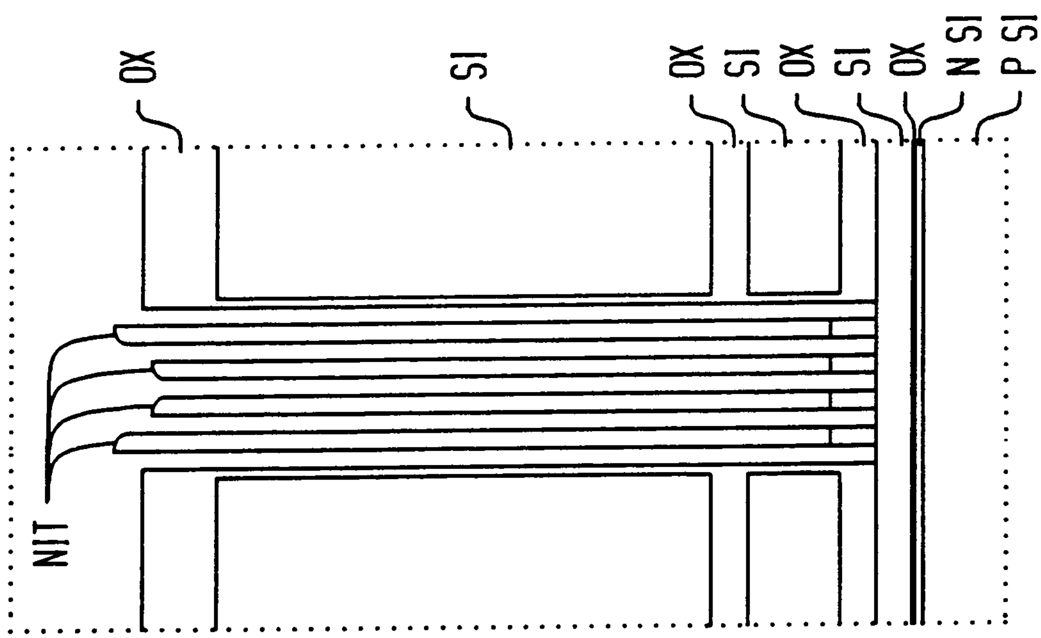

FIG. 490 illustrates the cross-section of the forward trench with the first bottom layer etched vertically where it was exposed between the blades of third insulating material.

Figure 491:
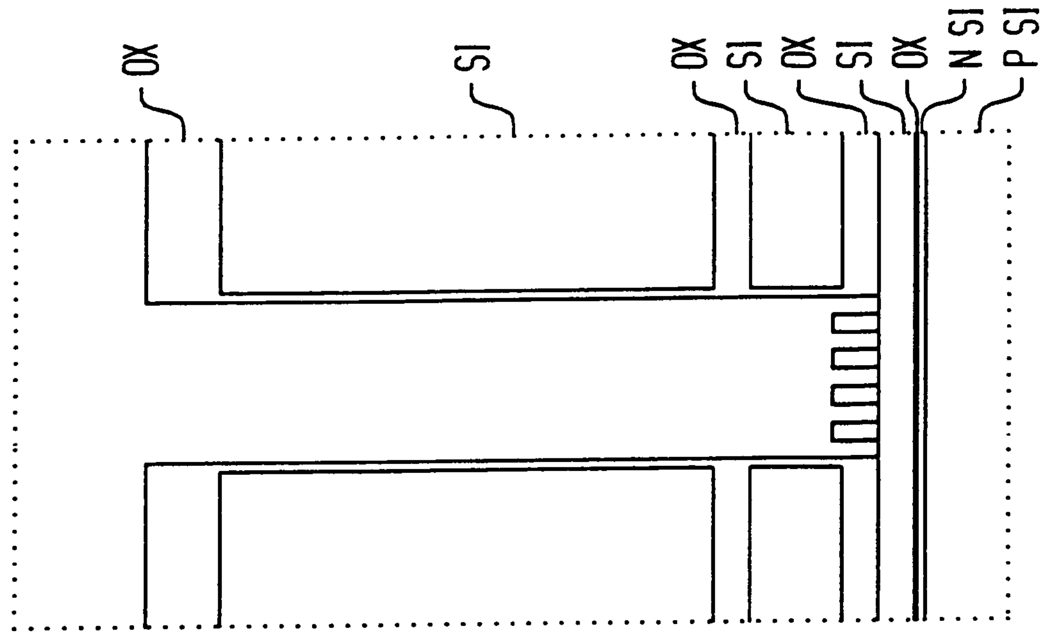

FIG. 491 illustrates the cross-section of the forward trench with the blades of third insulating material removed.

Figure 492:
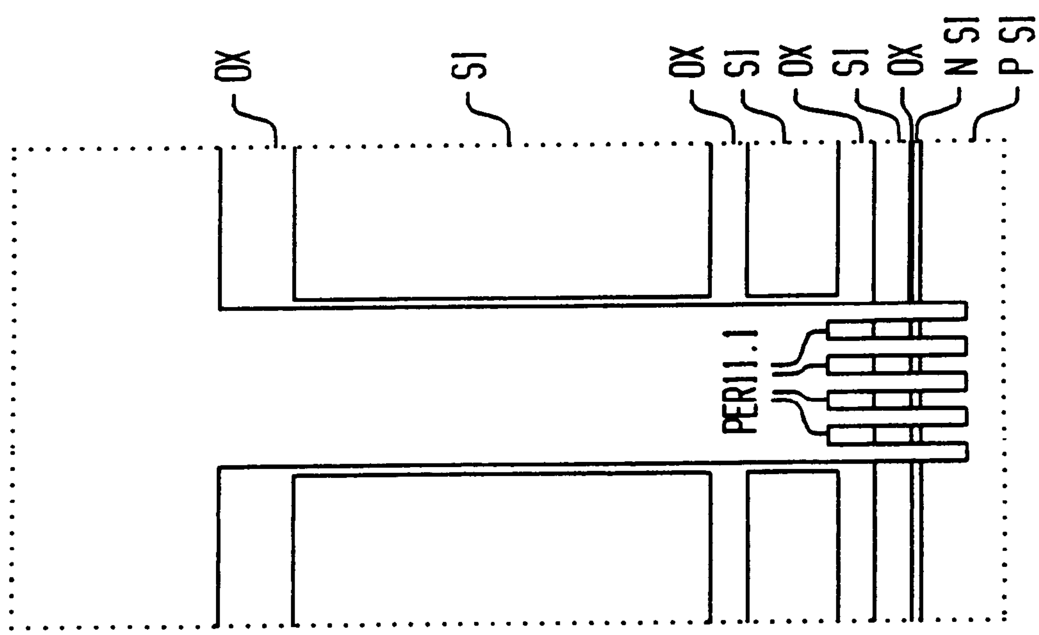

FIG. 492 illustrates the cross-section of the forward trench with the small trenches at its bottom deepened into the fifth layer down.

Figure 493:
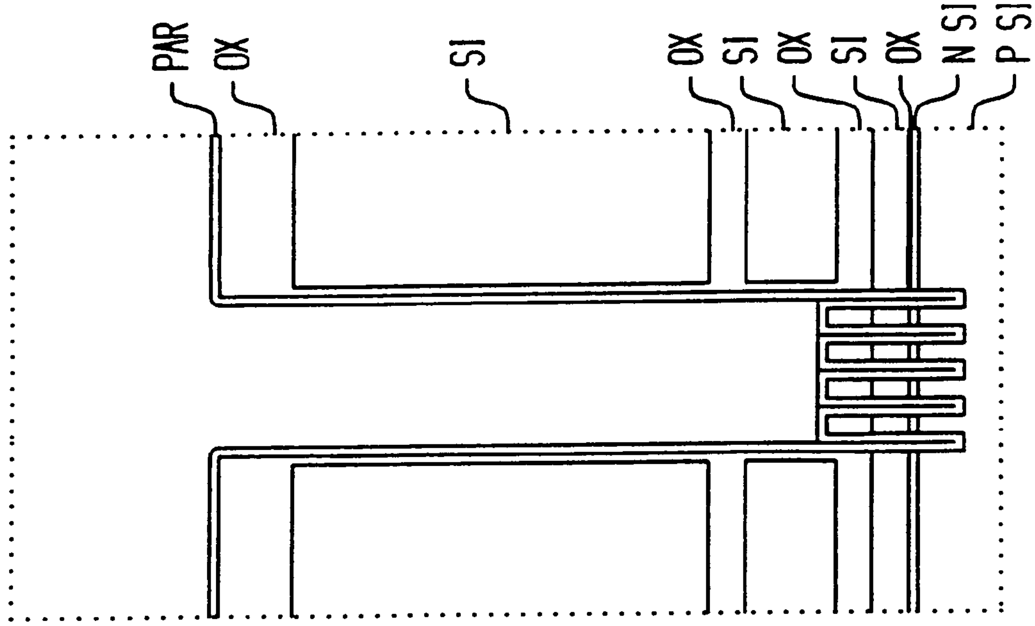

FIG. 493 illustrates the cross-section of the forward trench with the small trenches at its bottom filled, and with the other surfaces coated, with the second insulating material.

Figure 494:
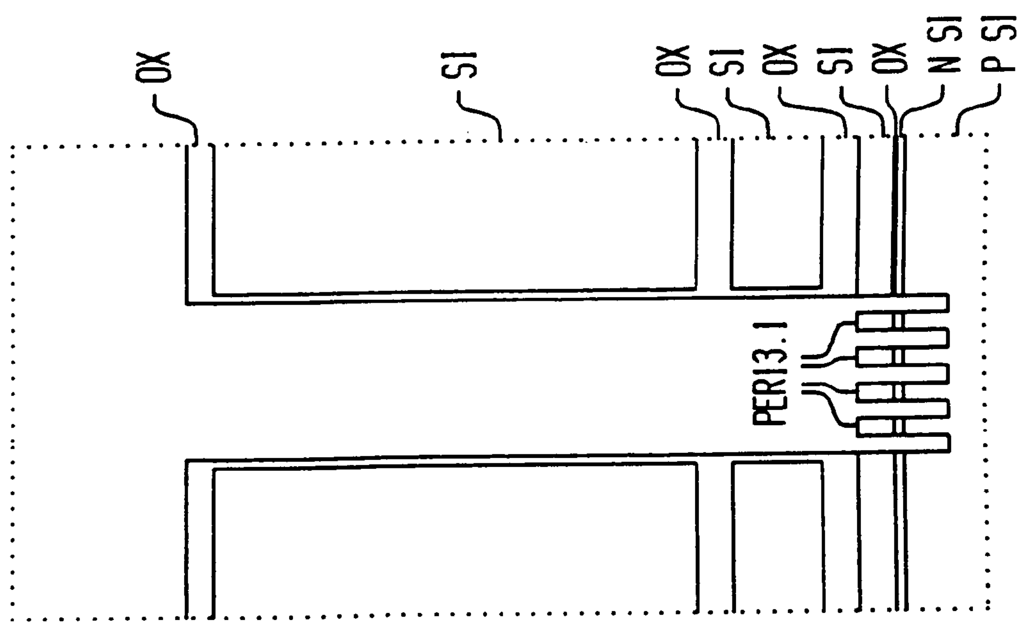

FIG. 494 illustrates the cross-section of the forward trench with all second insulating material as well as the top layer of the blades at the bottom of the forward trench removed.

Figure 495:
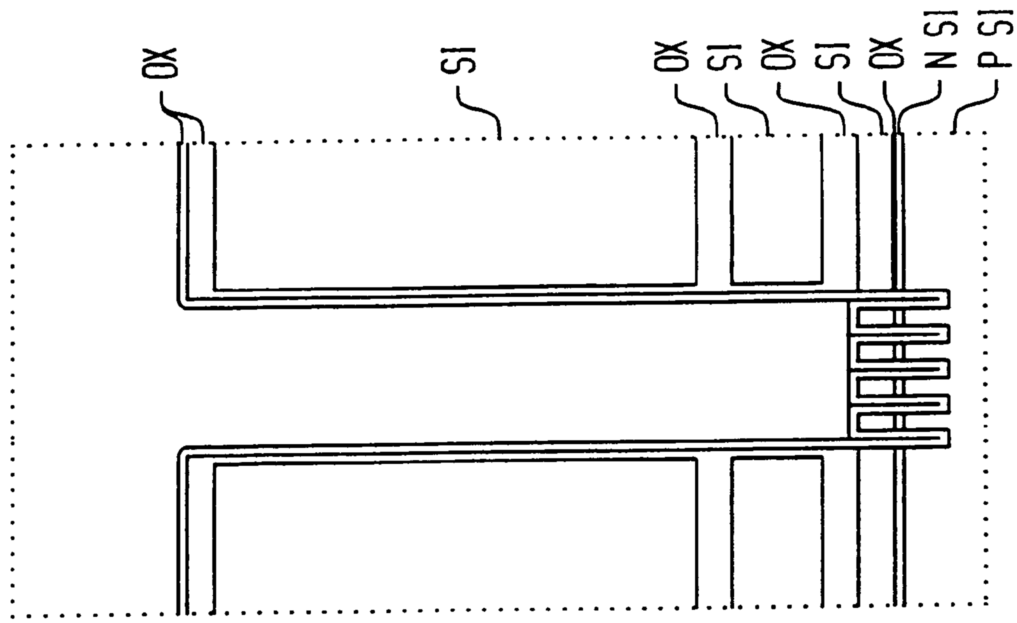

FIG. 495 illustrates the cross-section of the forward trench with the small trenches at its bottom filled, and the other surfaces coated, with the first insulating material.

FIG. 496 is a three-dimensional depiction of the small cutaway section of the wafer illustrating the metal layer filling the orthogonal trench, and the laterally insulated blades at the bottom of the forward trench, with the layer of first insulating material removed, except in the small trenches between the blades.

Figure 497:
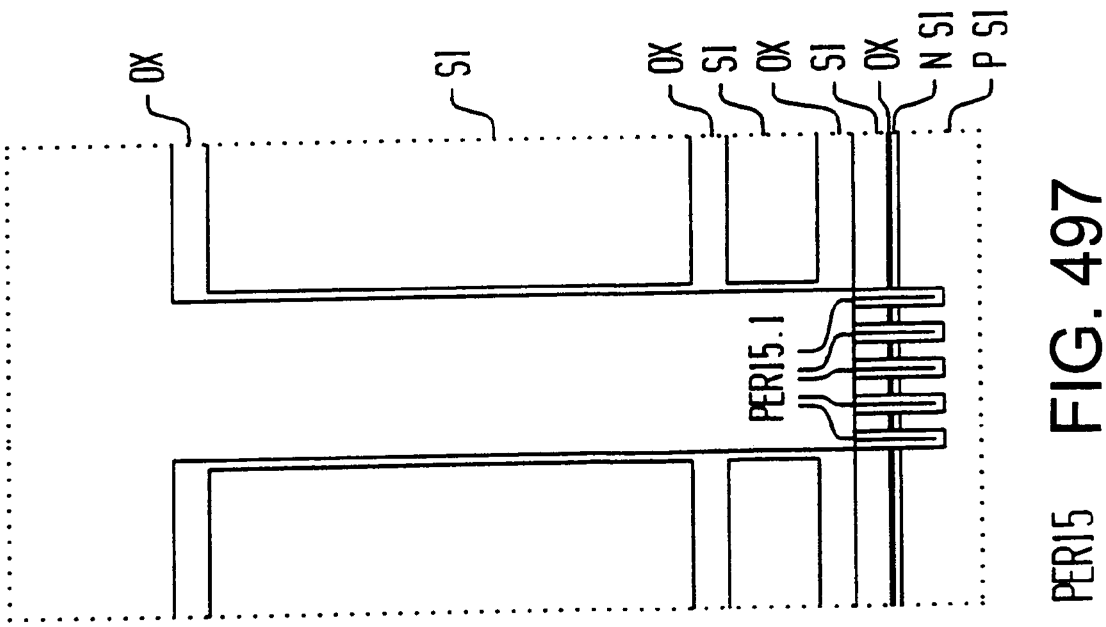

FIG. 497 illustrates the cross-section of the forward trench of FIG. 496.

Figure 498:
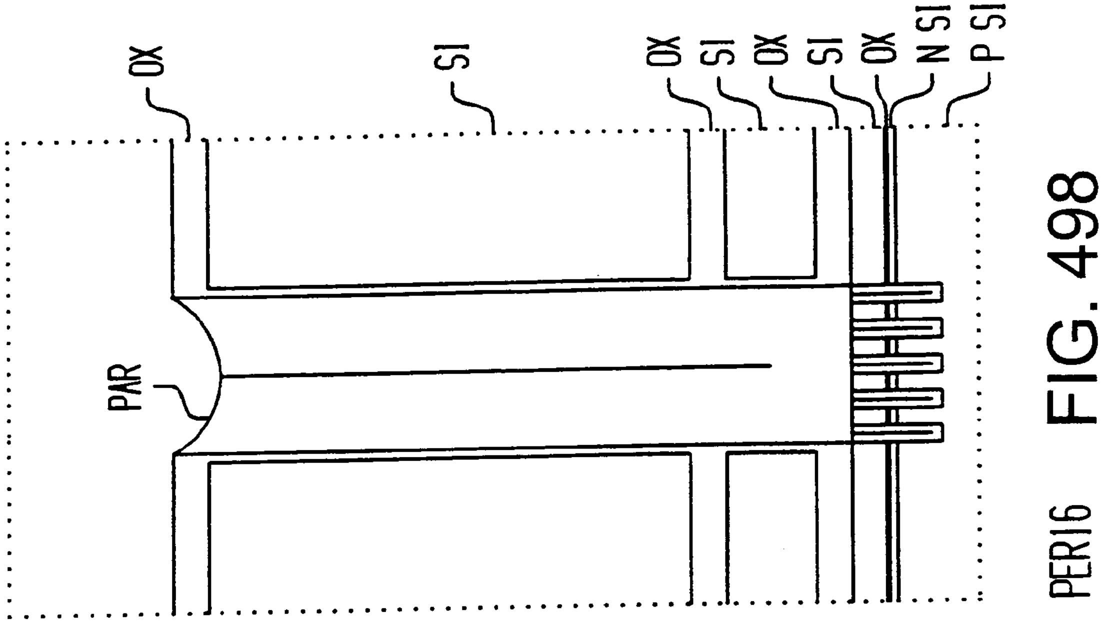

FIG. 498 illustrates the cross-section of the forward trench filled with second insulating material.

Figure 499:
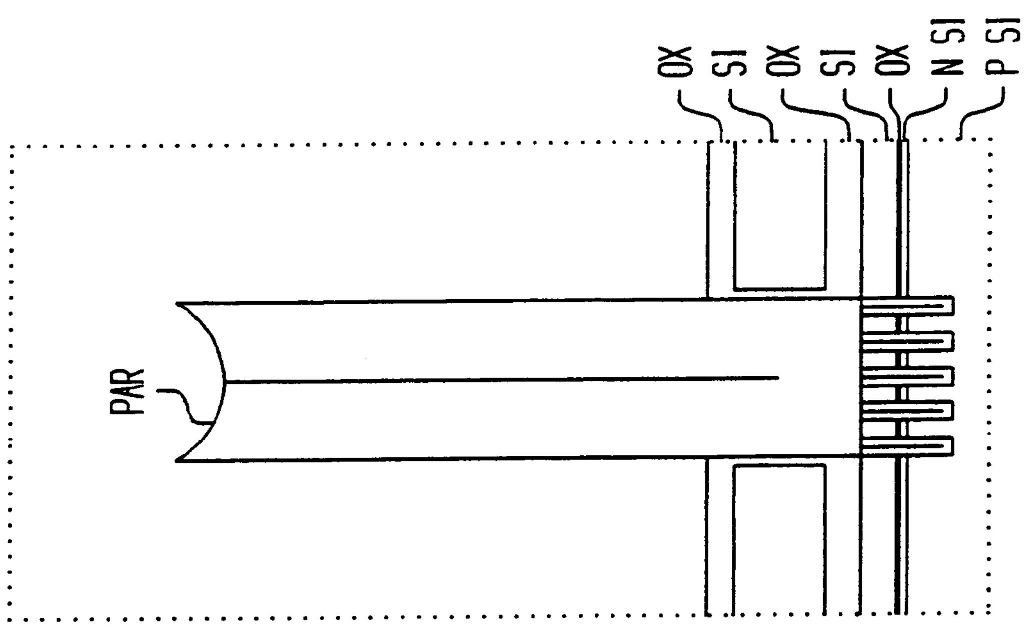

FIG. 499 illustrates the cross-section of the forward trench with the top two layers of surrounding materials removed, but with the plug of second insulating material left standing.

Figure 500:
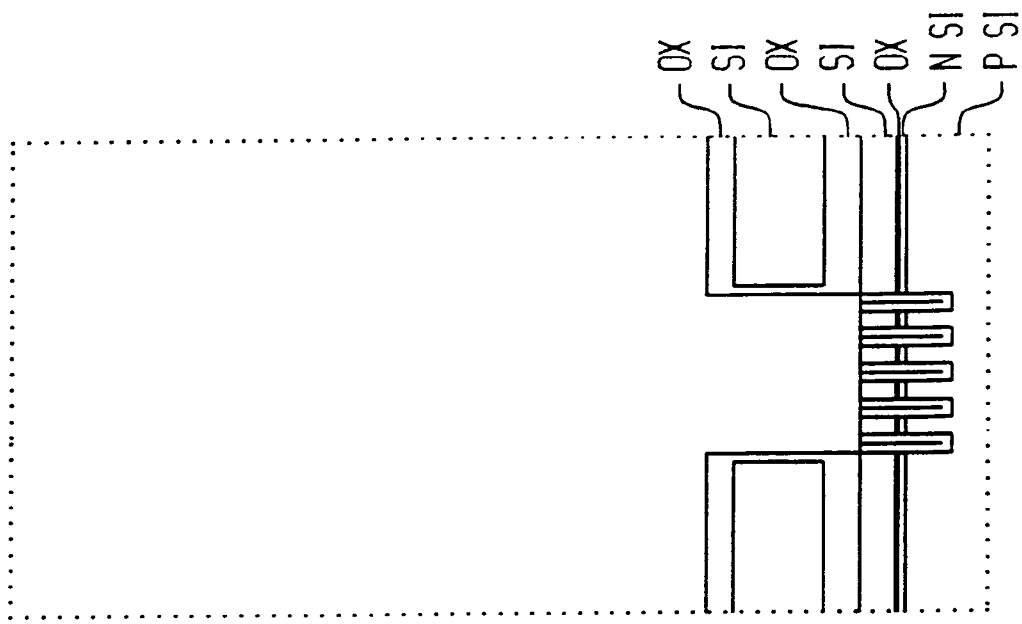

FIG. 500 illustrates the cross-section of the forward trench cleared of the plug of second insulating material.

Figure 501:
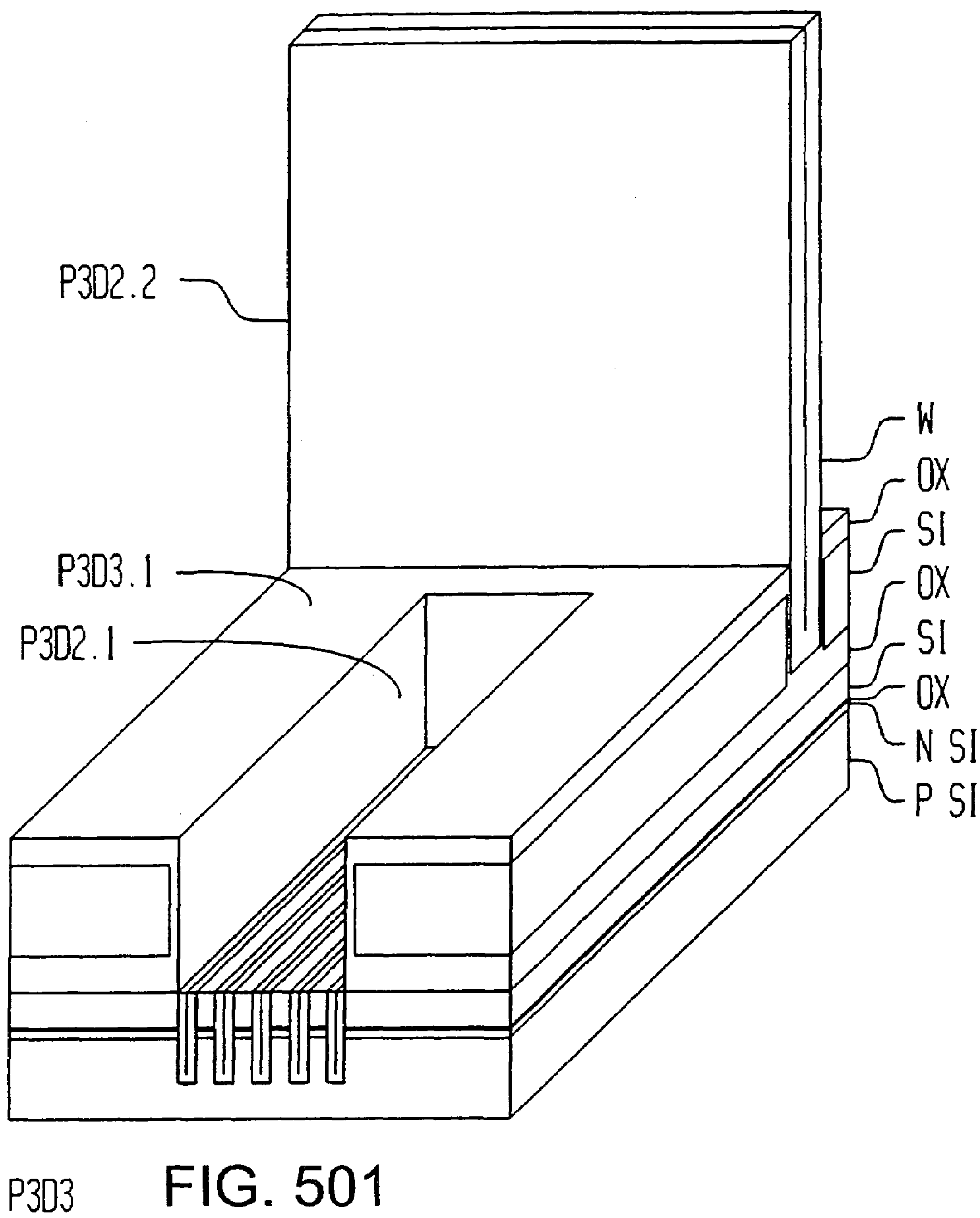

FIG. 501 is a three-dimensional depiction of the small cutaway section of the wafer illustrating the lowered forward trench and the metal layer filling the orthogonal trench standing at its original height, forming a wall.

Figure 502:
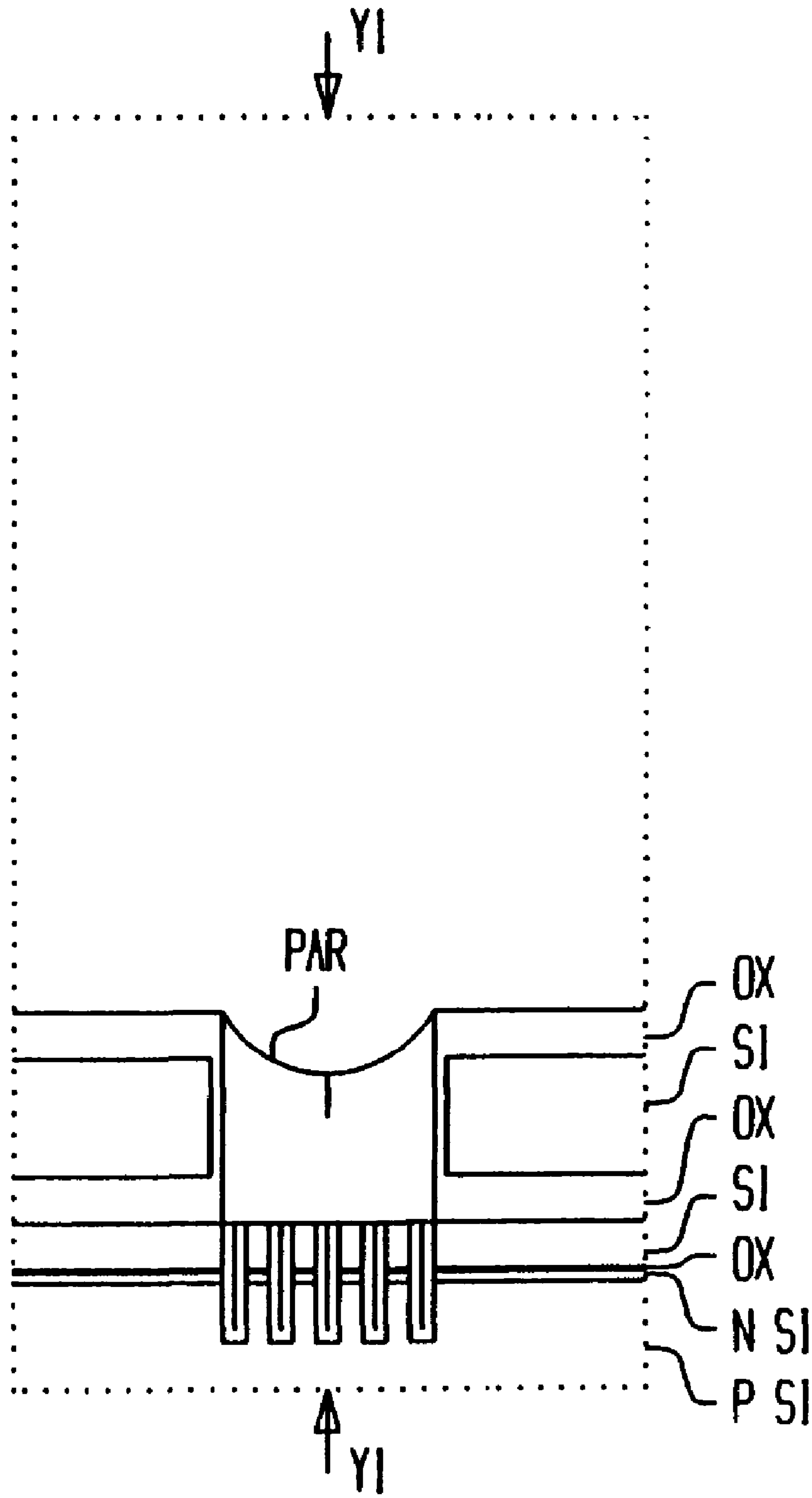
Figure 503:
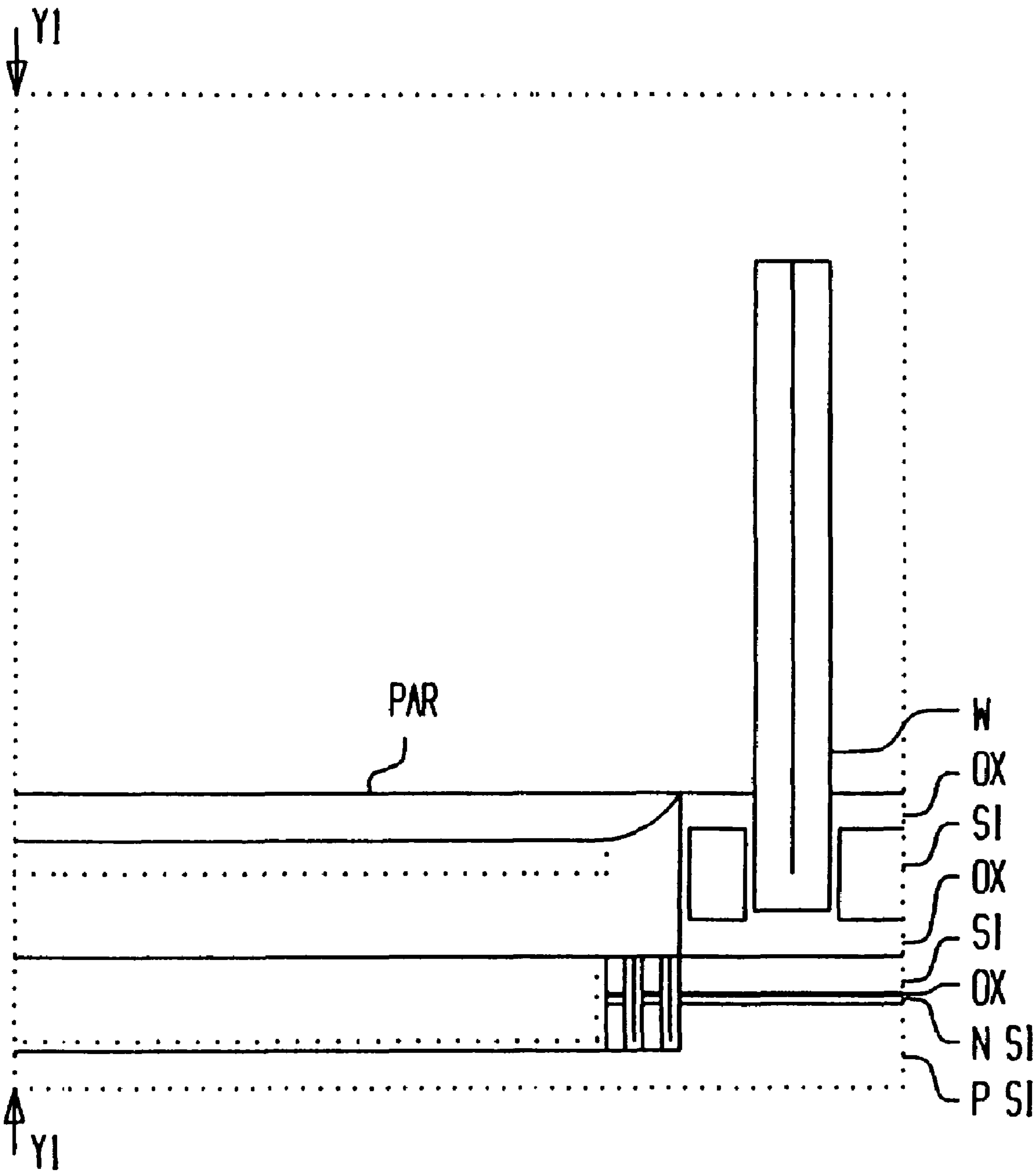

FIG. 502 illustrates the cross-section as before, and FIG. 503 illustrates a length-section, along the center of the forward trench and through the wall, with the forward trench filled with second insulating material.

Figure 504:
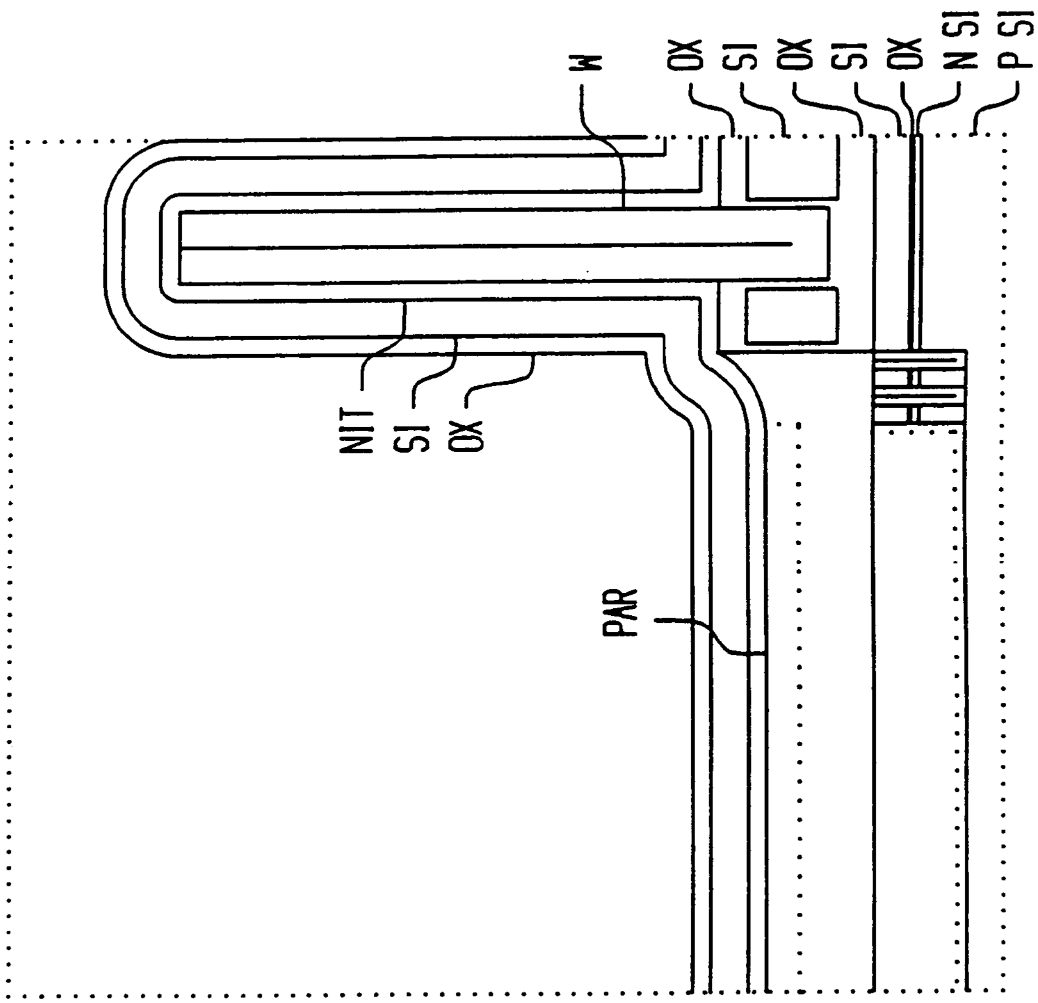

FIG. 504 illustrates the length-section with the surfaces covered with successive layers of the third insulating material, semiconductor material and the first insulating material, to widen the wall by a controlled amount.

Figure 505:
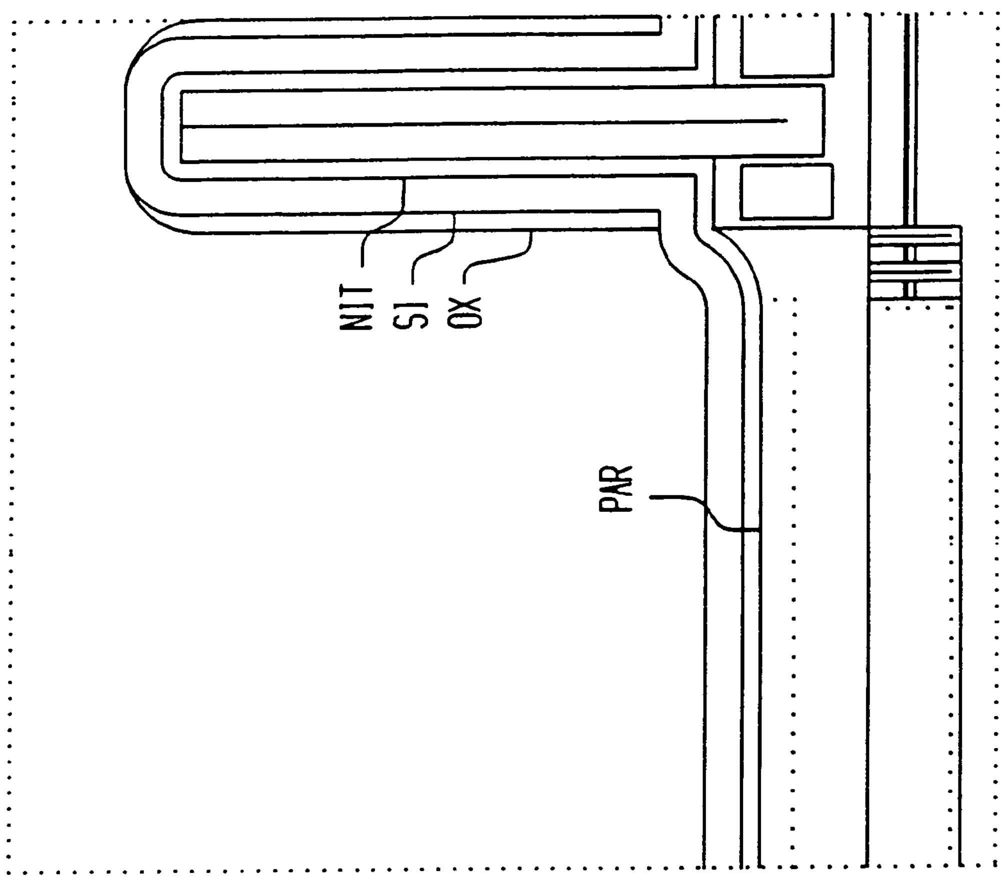

FIG. 505 illustrates the length-section with the layer of first insulating material directionally removed from all non-vertical surfaces.

Figure 506:
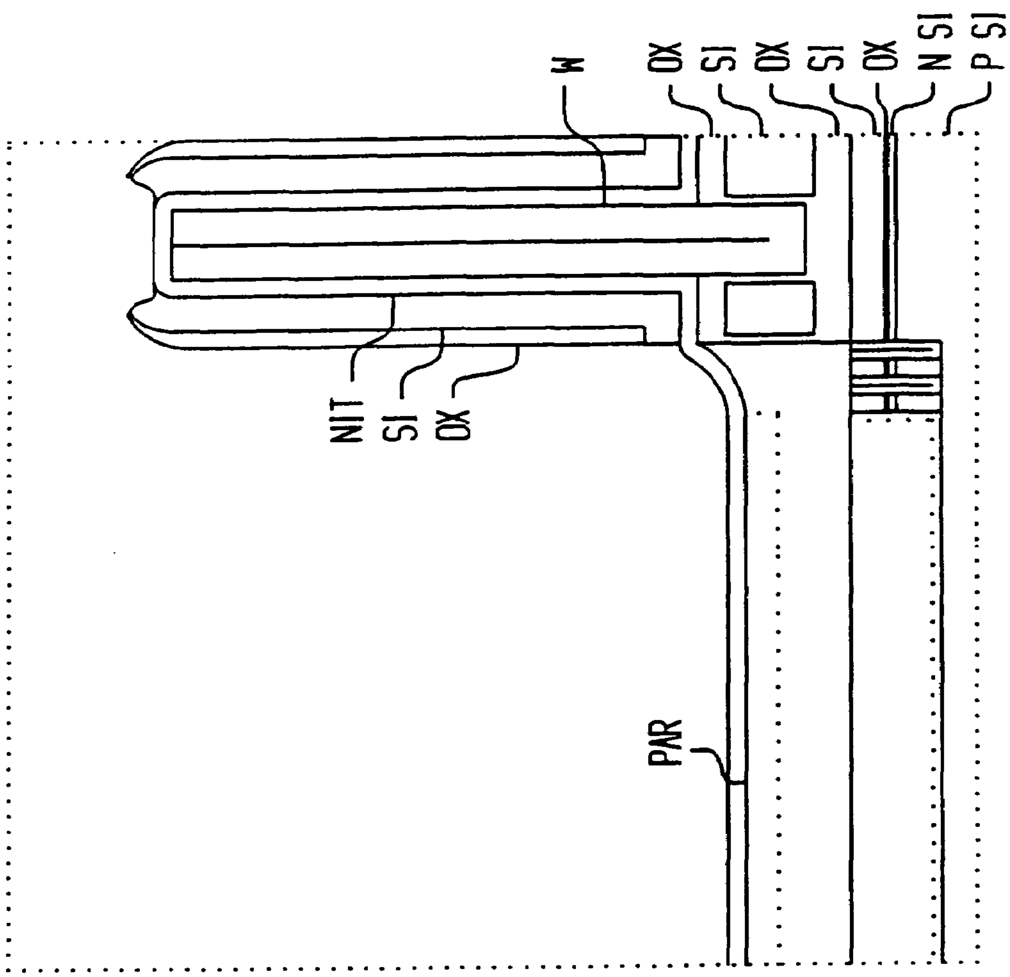

FIG. 506 illustrates the length-section with the layer of exposed semiconductor material directionally removed from all non-vertical surfaces.

Figure 507:
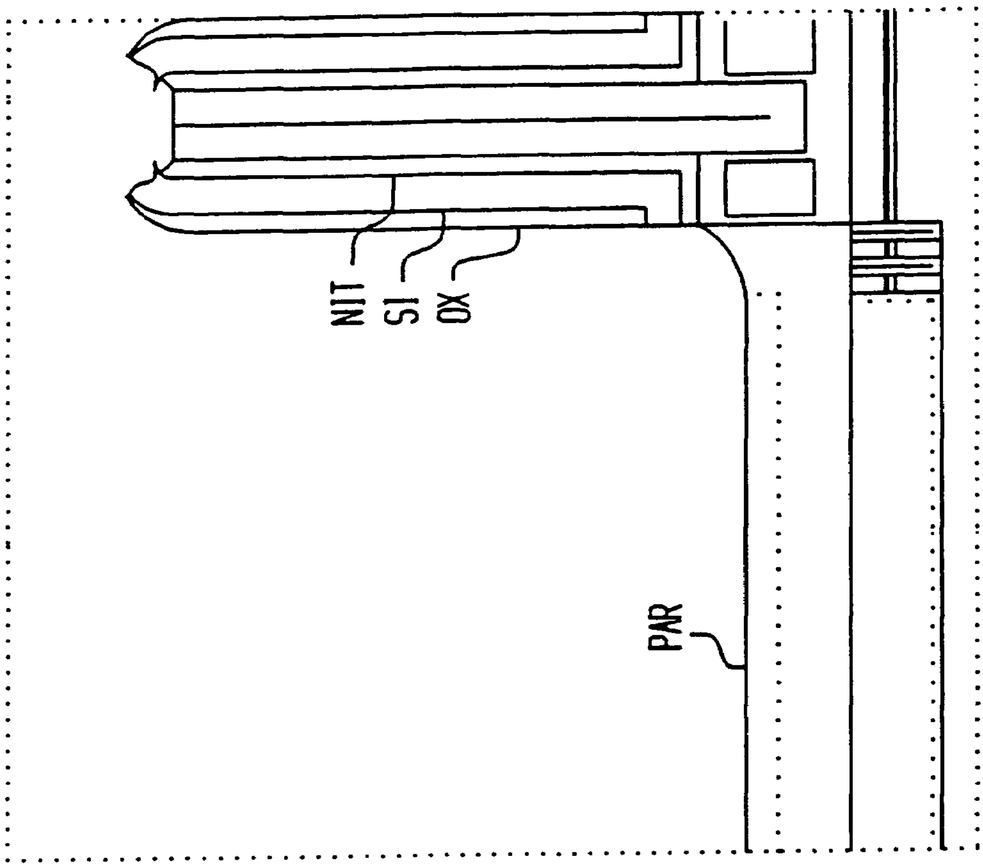

FIG. 507 illustrates the length-section with the exposed layer of third insulating material removed.

Figure 508:
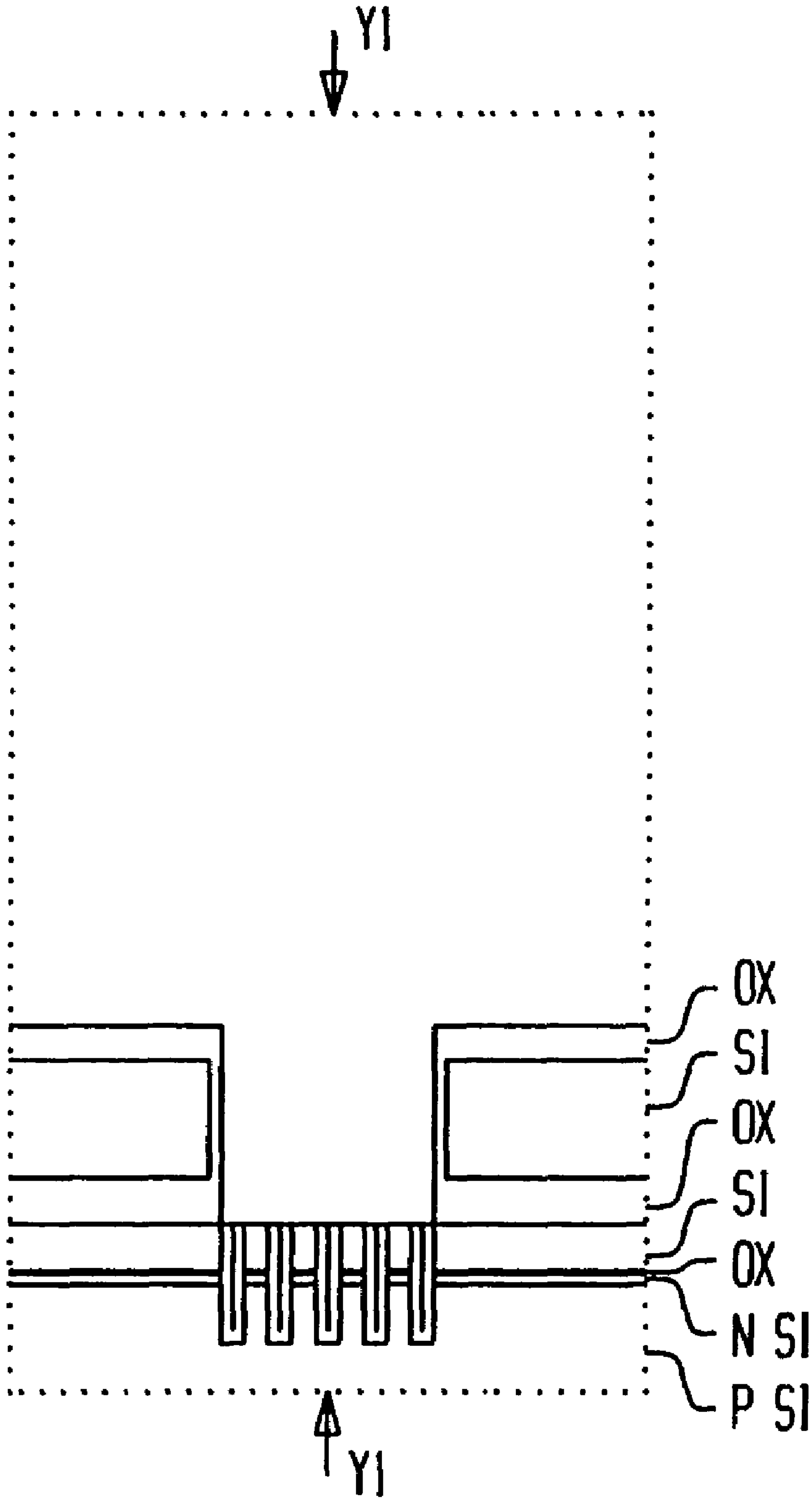
Figure 509:
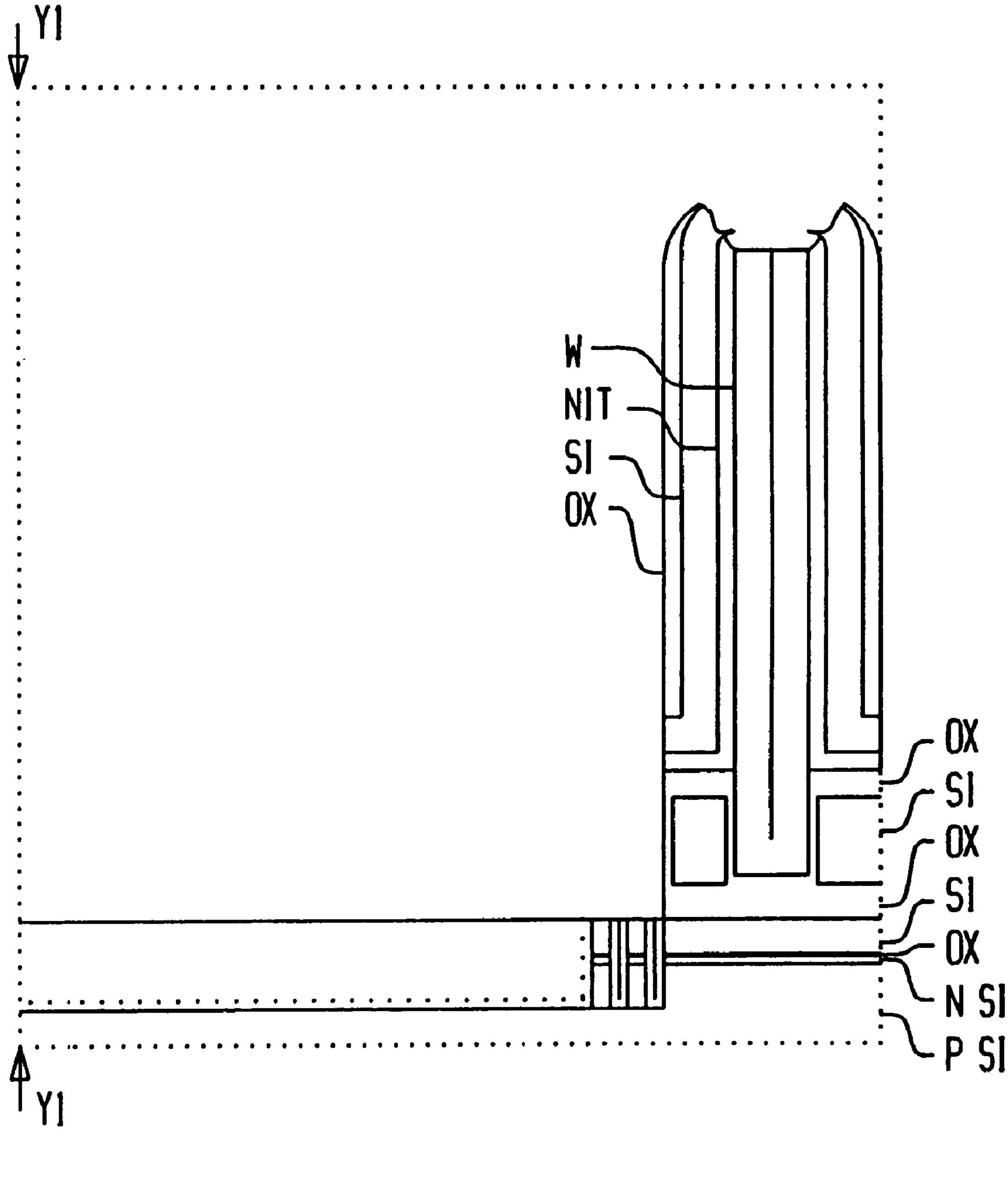

FIG. 508 and FIG. 509 illustrate a cross-section and length-section, respectively, with the second insulating material removed from the forward trench.

Figure 510:
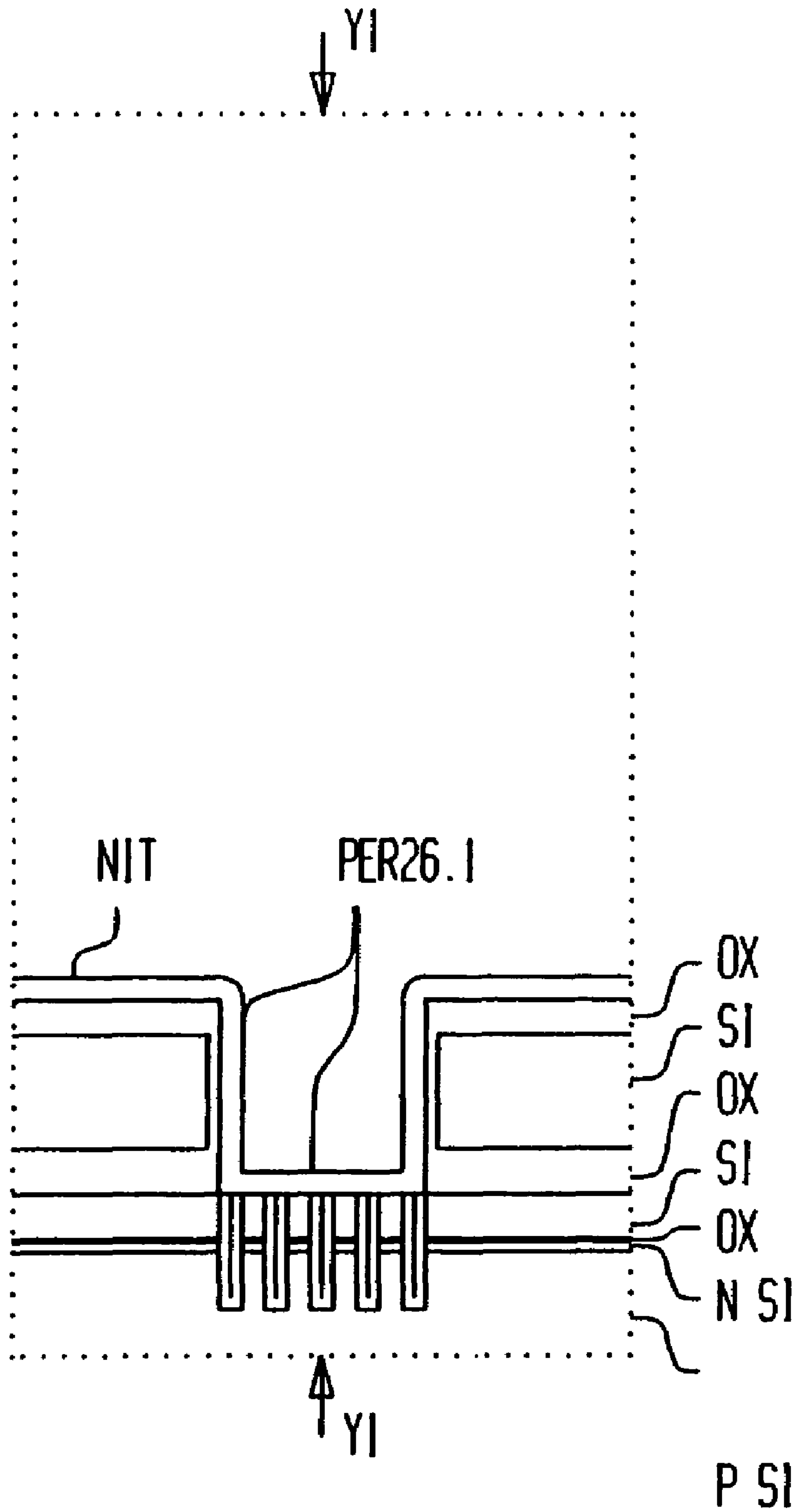
Figure 511:
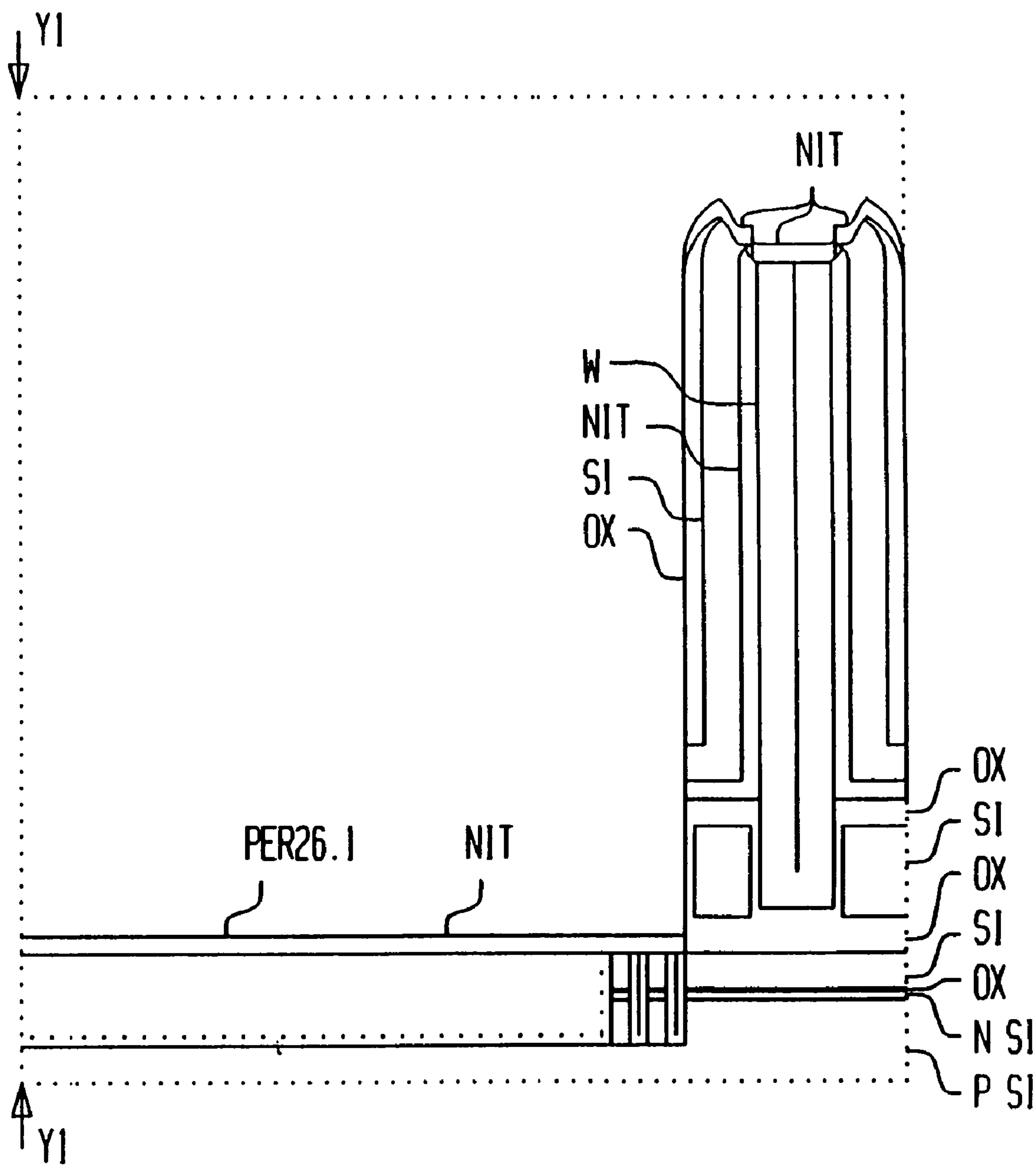

FIG. 510 and FIG. 511 illustrate a cross-section and length-section, respectively, with a layer of third insulating material directionally deposited from various angles, to cover all surfaces except the sides of the wall.

Figure 512:
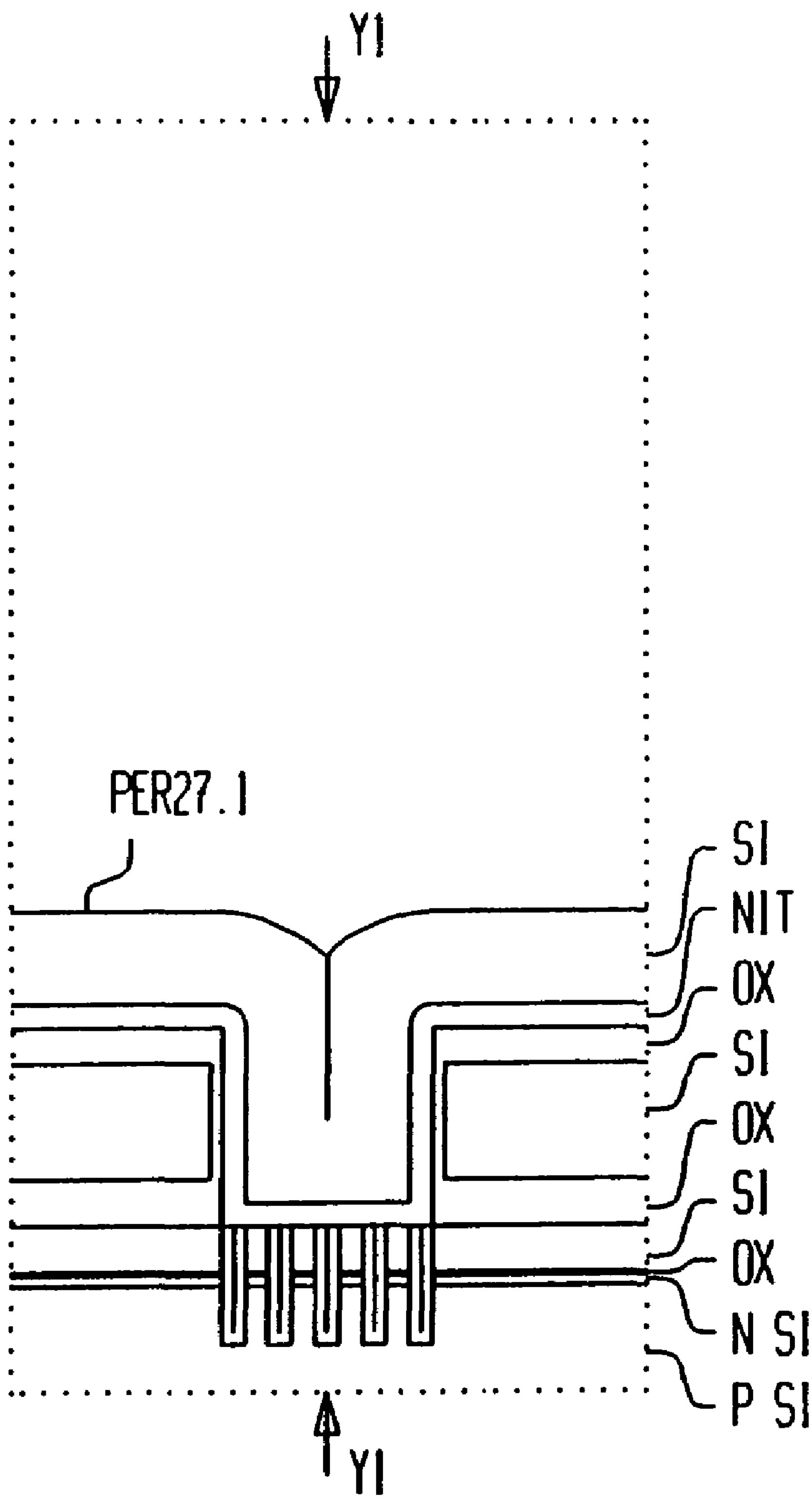
Figure 513:
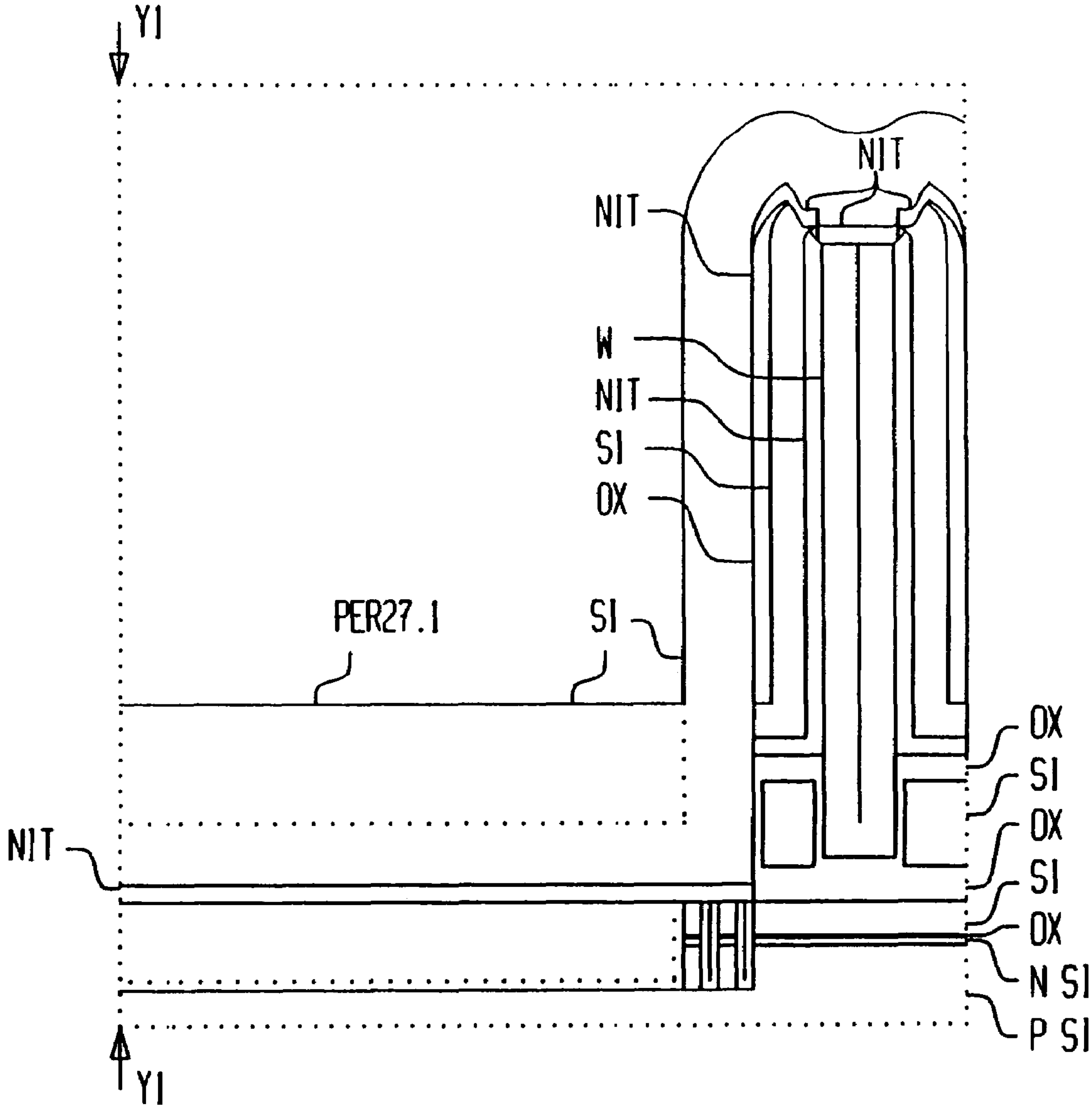

FIG. 512 and FIG. 513 illustrate a cross-section and length-section, respectively, with the forward trench filled and the wall covered by a layer of semiconductor material of controlled thickness.

Figure 514:
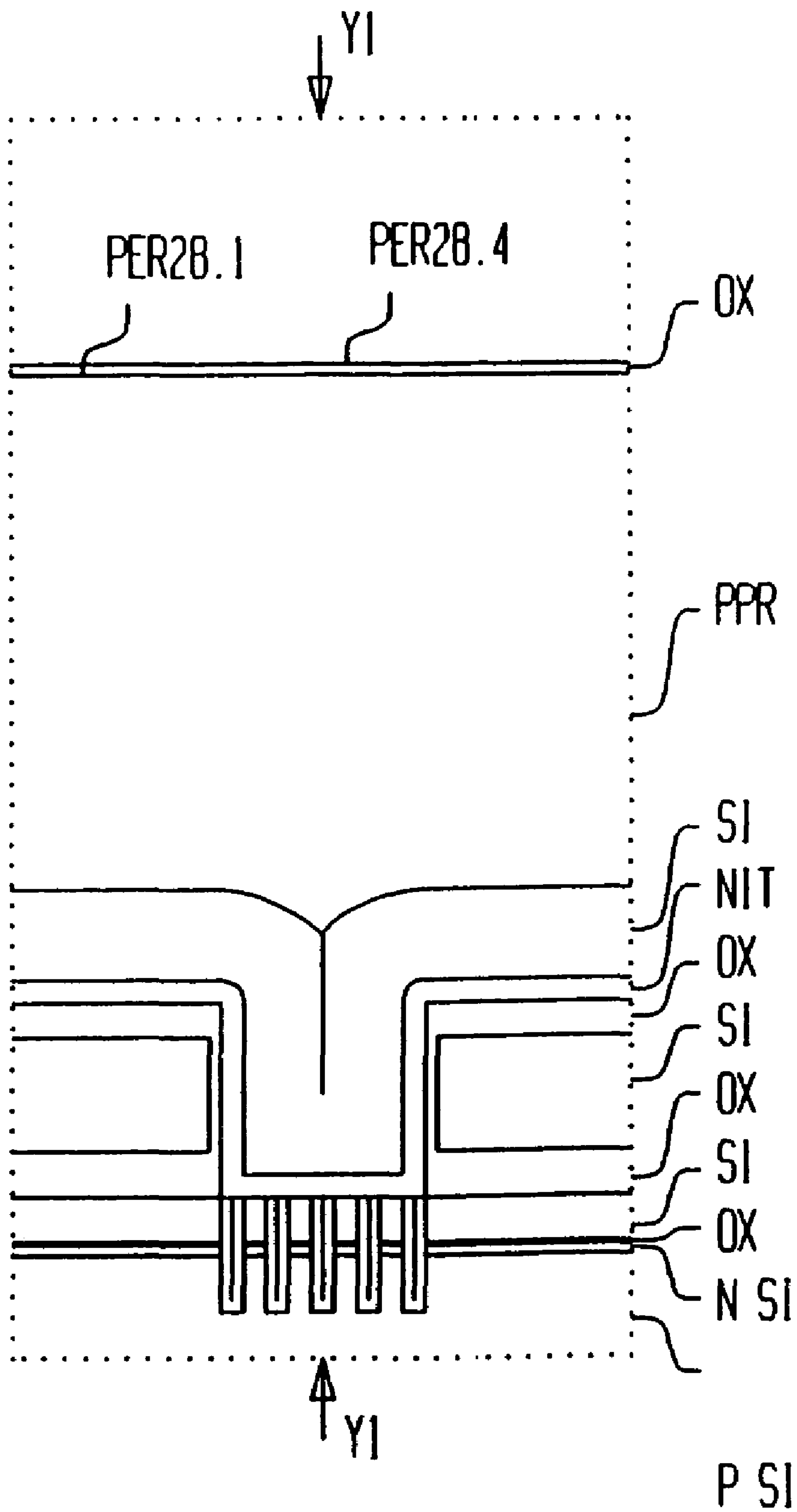
Figure 515:
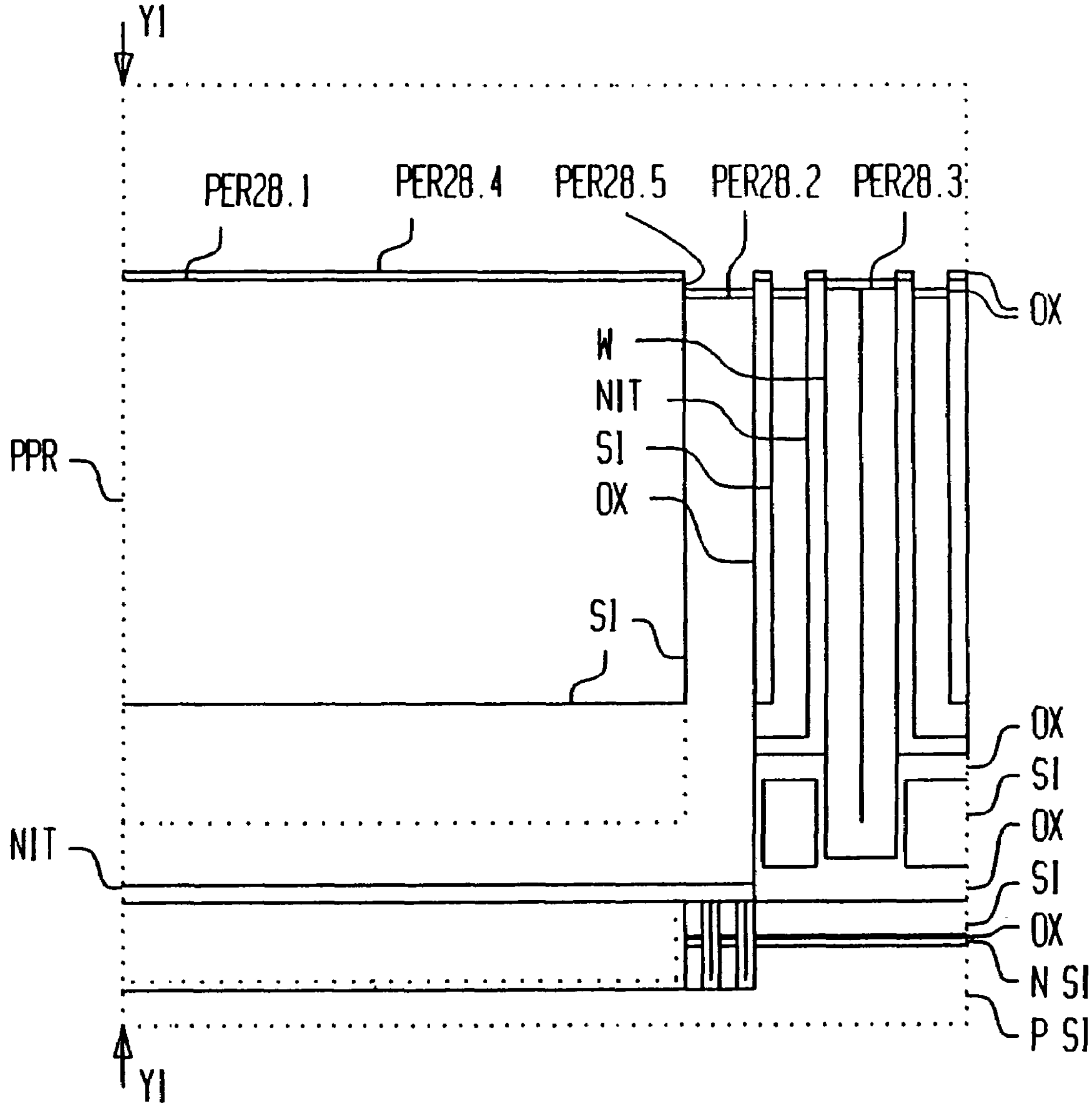

FIG. 514 and FIG. 515 illustrate a cross-section and length-section, respectively, with the region surrounding the wall filled with a filler material, the top surface planarized, the exposed semiconductor material and metal surfaces etched back and all top surfaces vertically covered with first insulating material.

Figure 516:
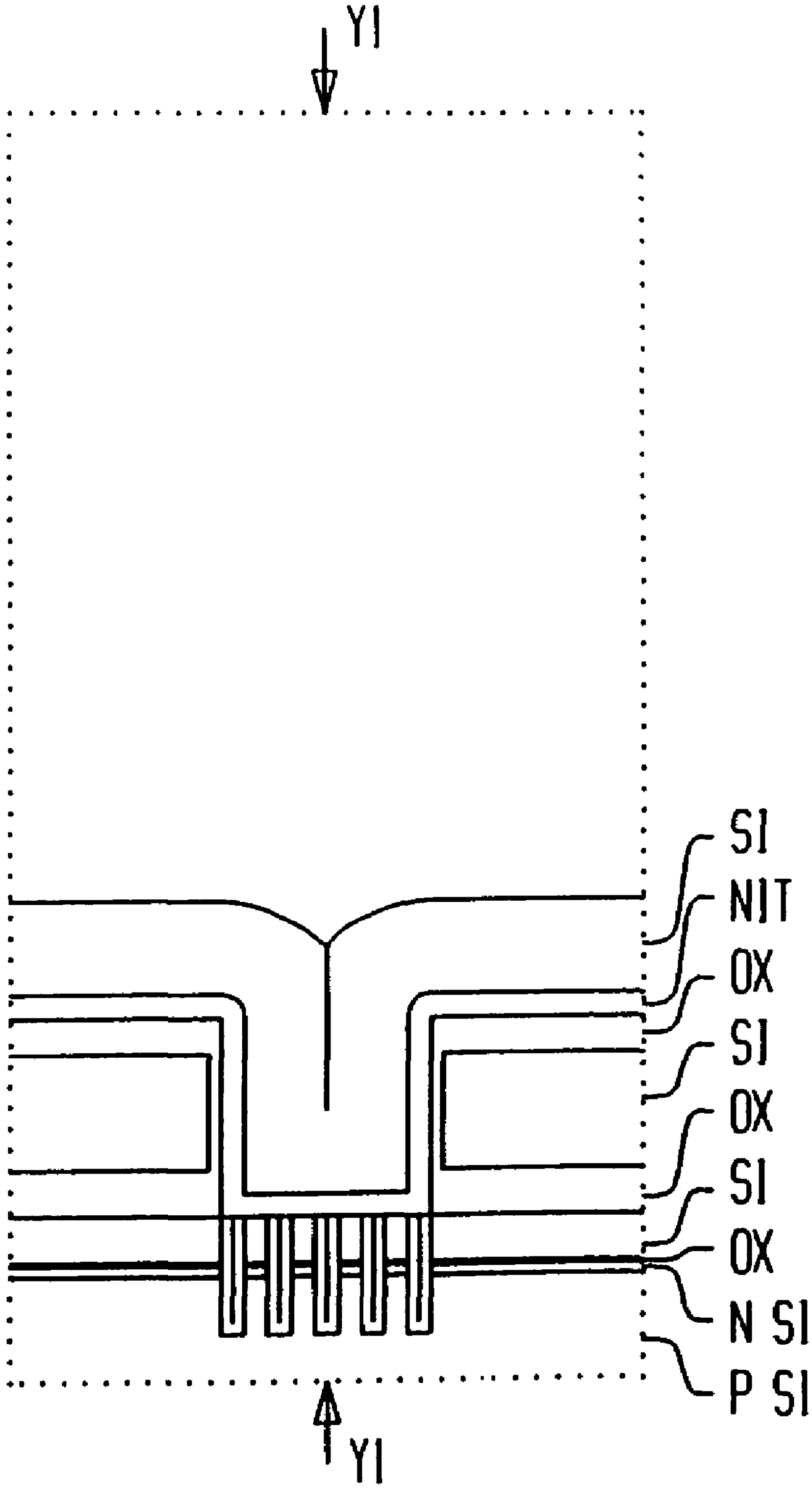
Figure 517:
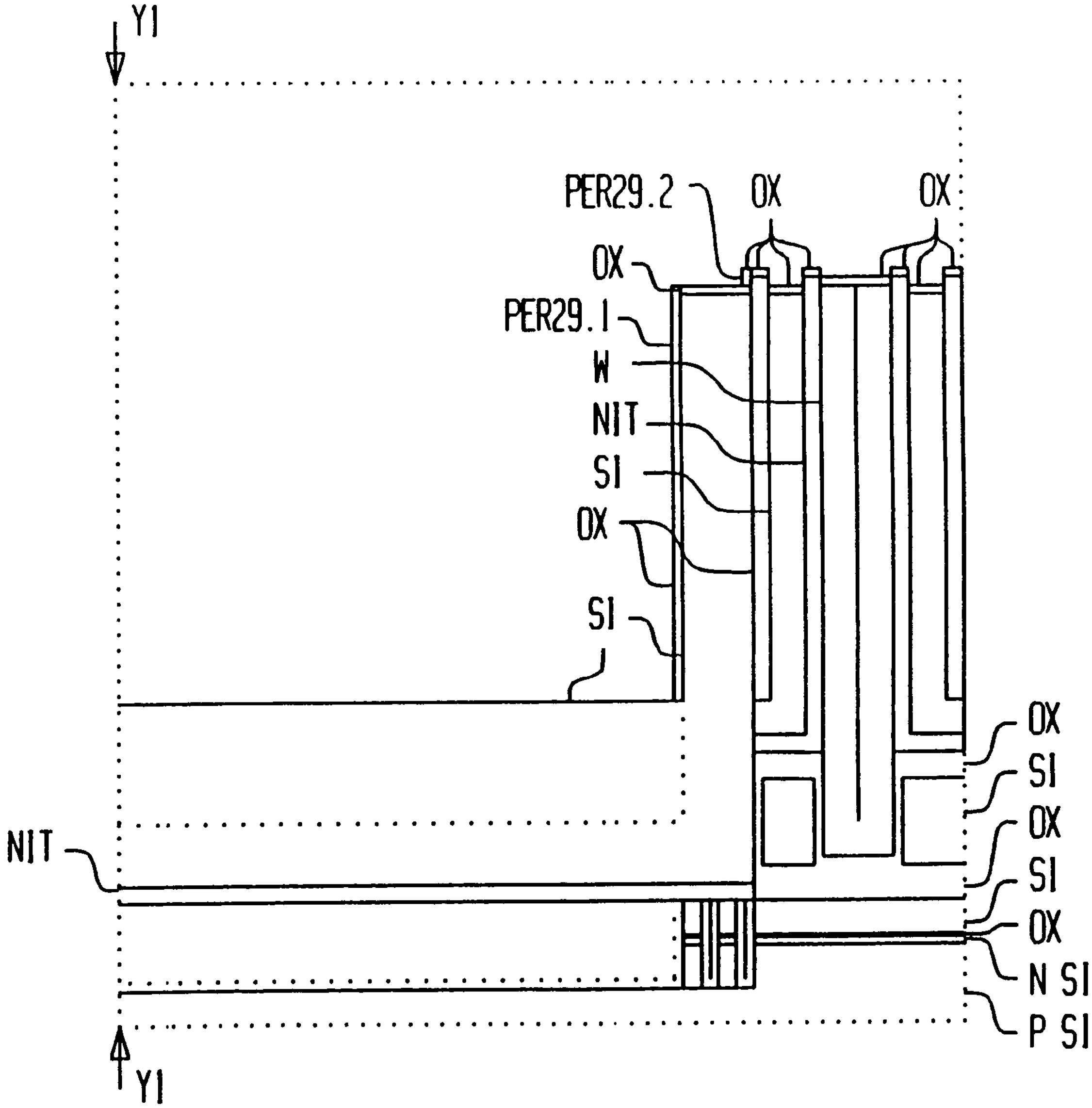

FIG. 516 and FIG. 517 illustrate a cross-section and length-section, respectively, with the filler material removed and the left side of the wall coated with first insulating material.

Figure 518:
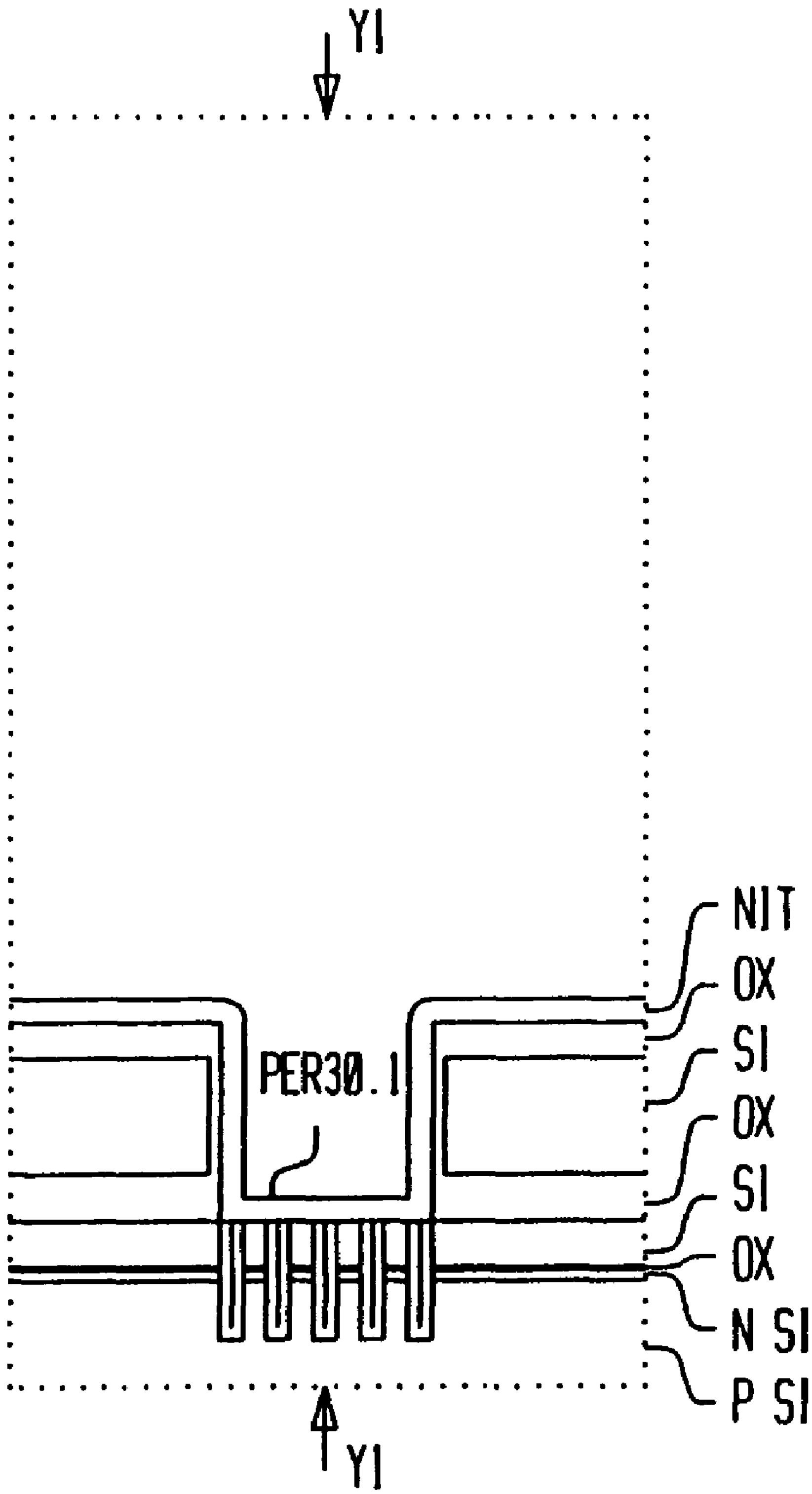
Figure 519:
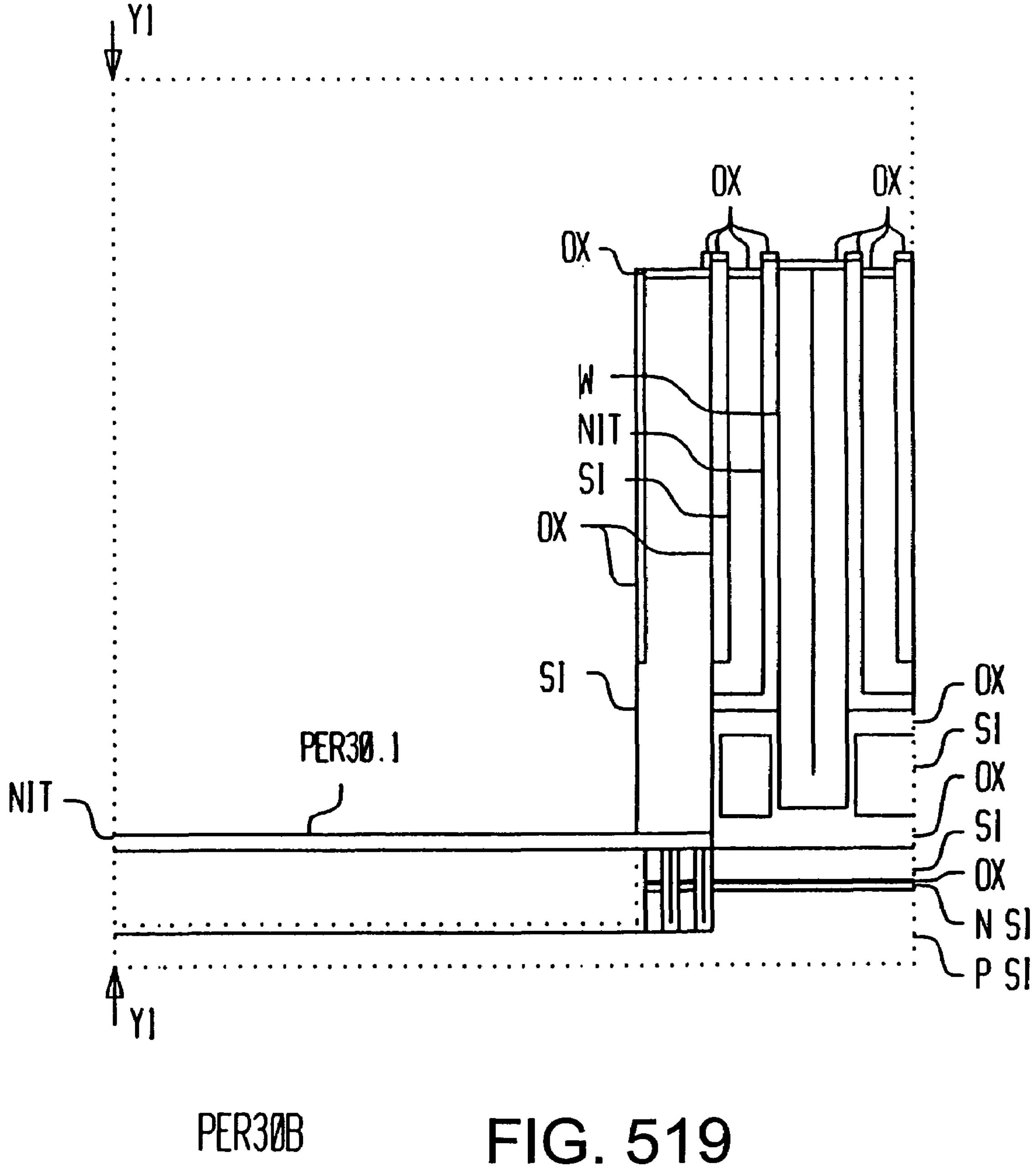

FIG. 518 and FIG. 519 illustrate a cross-section and length-section, respectively, with the semiconductor material directionally removed from all non-vertical surfaces.

Figure 520:
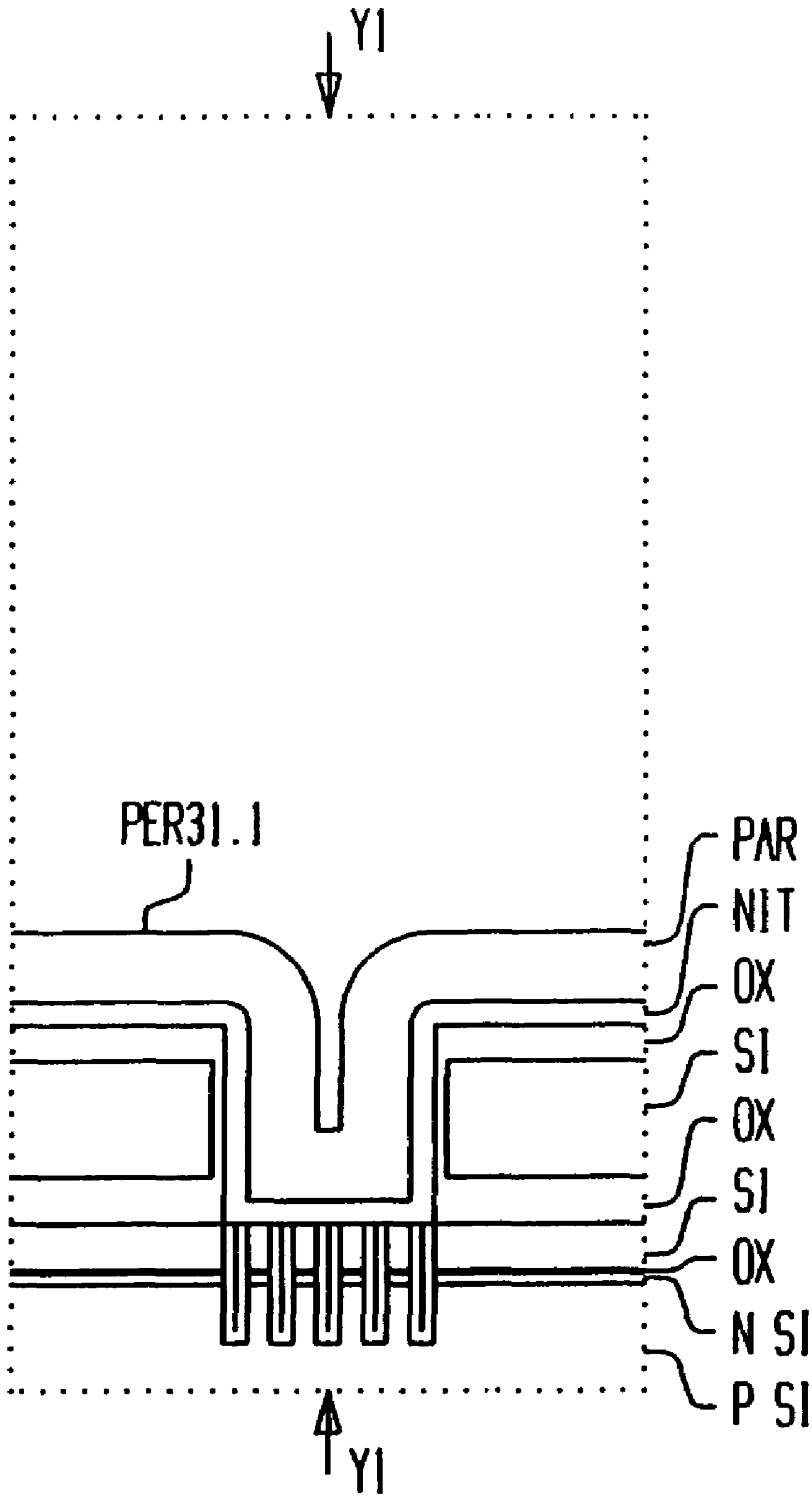
Figure 521:
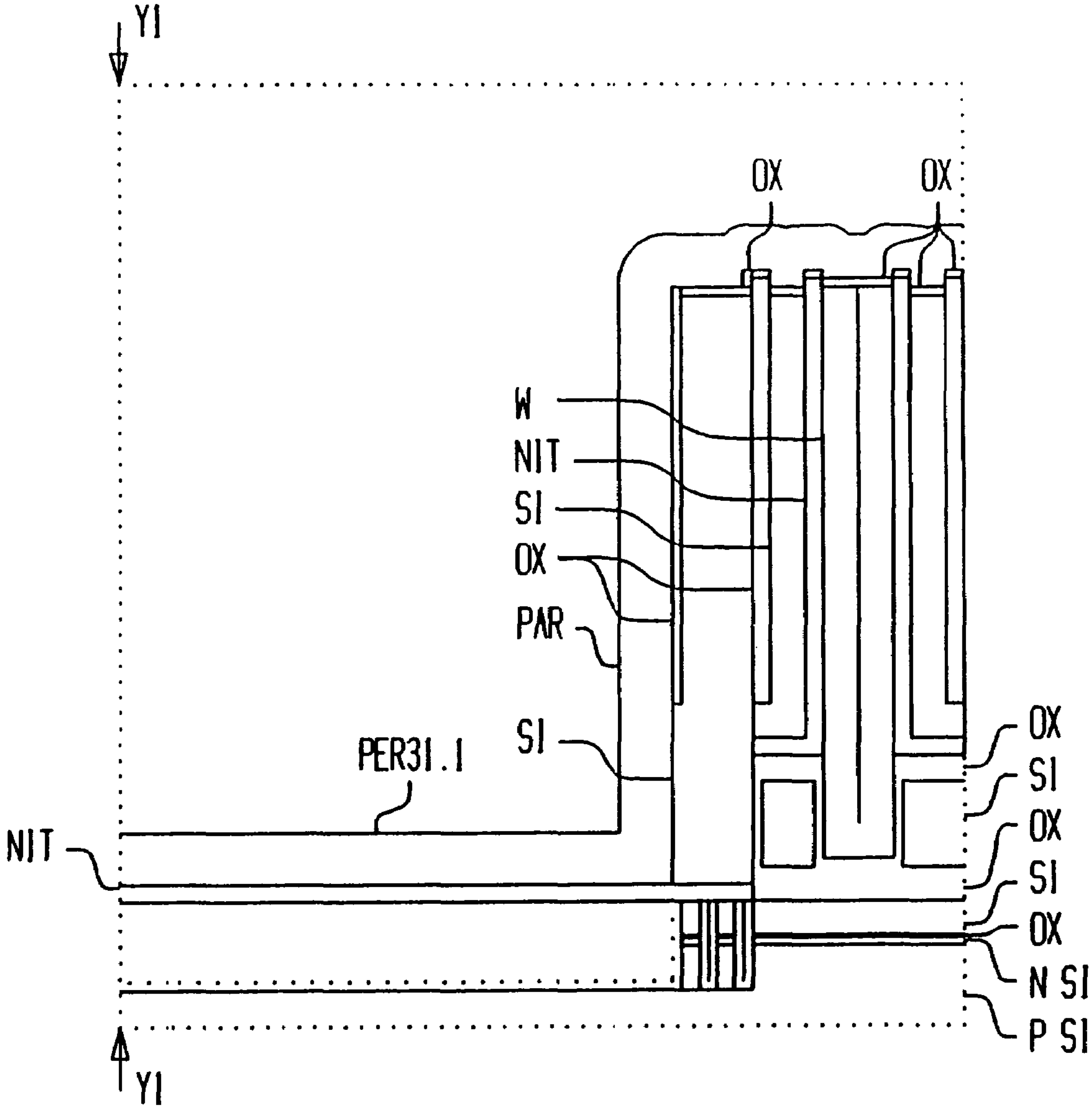

FIG. 520 and FIG. 521 illustrate a cross-section and length-section, respectively, with a layer of controlled thickness of second insulating material deposited.

Figure 522:
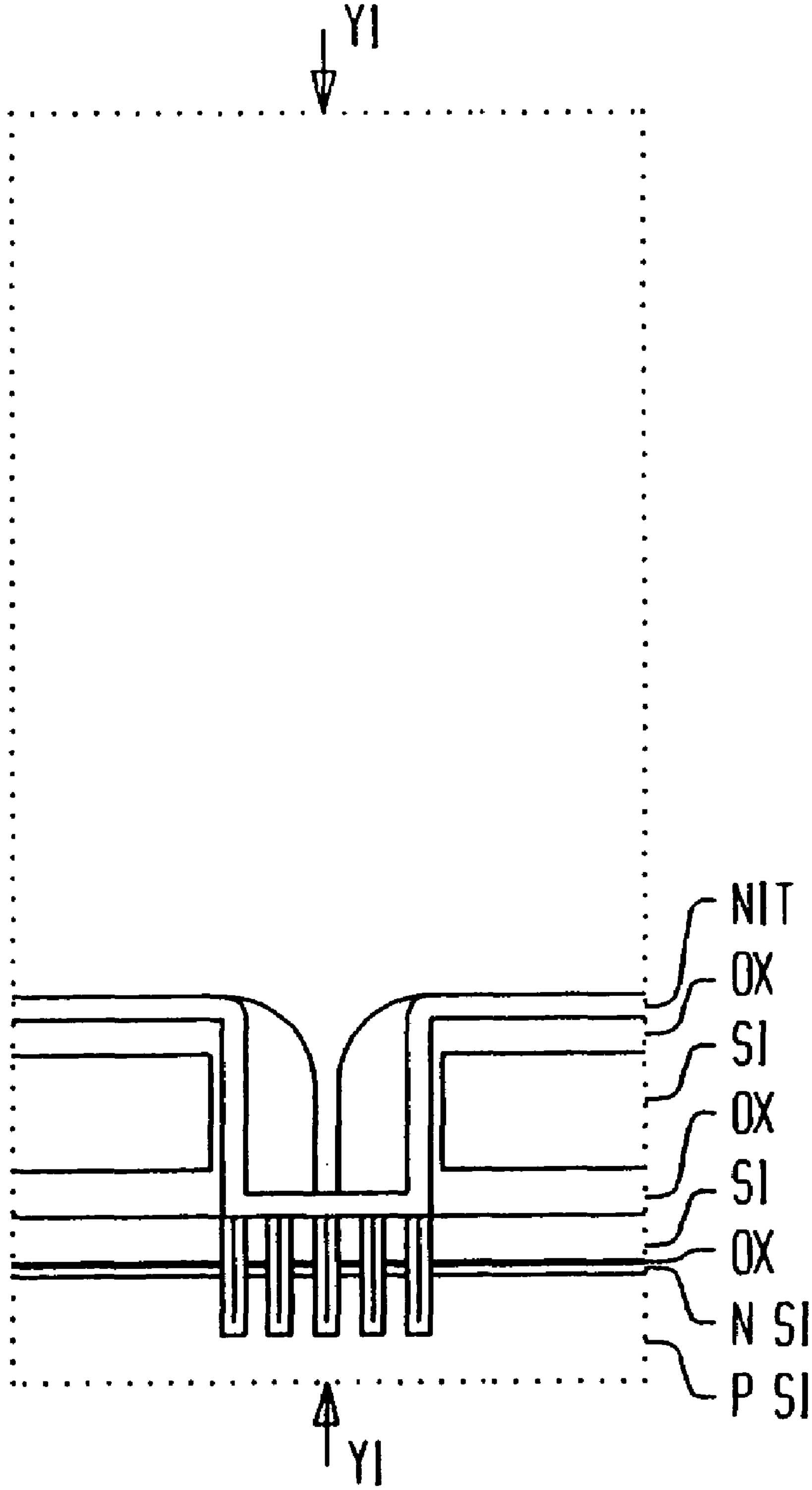
Figure 523:
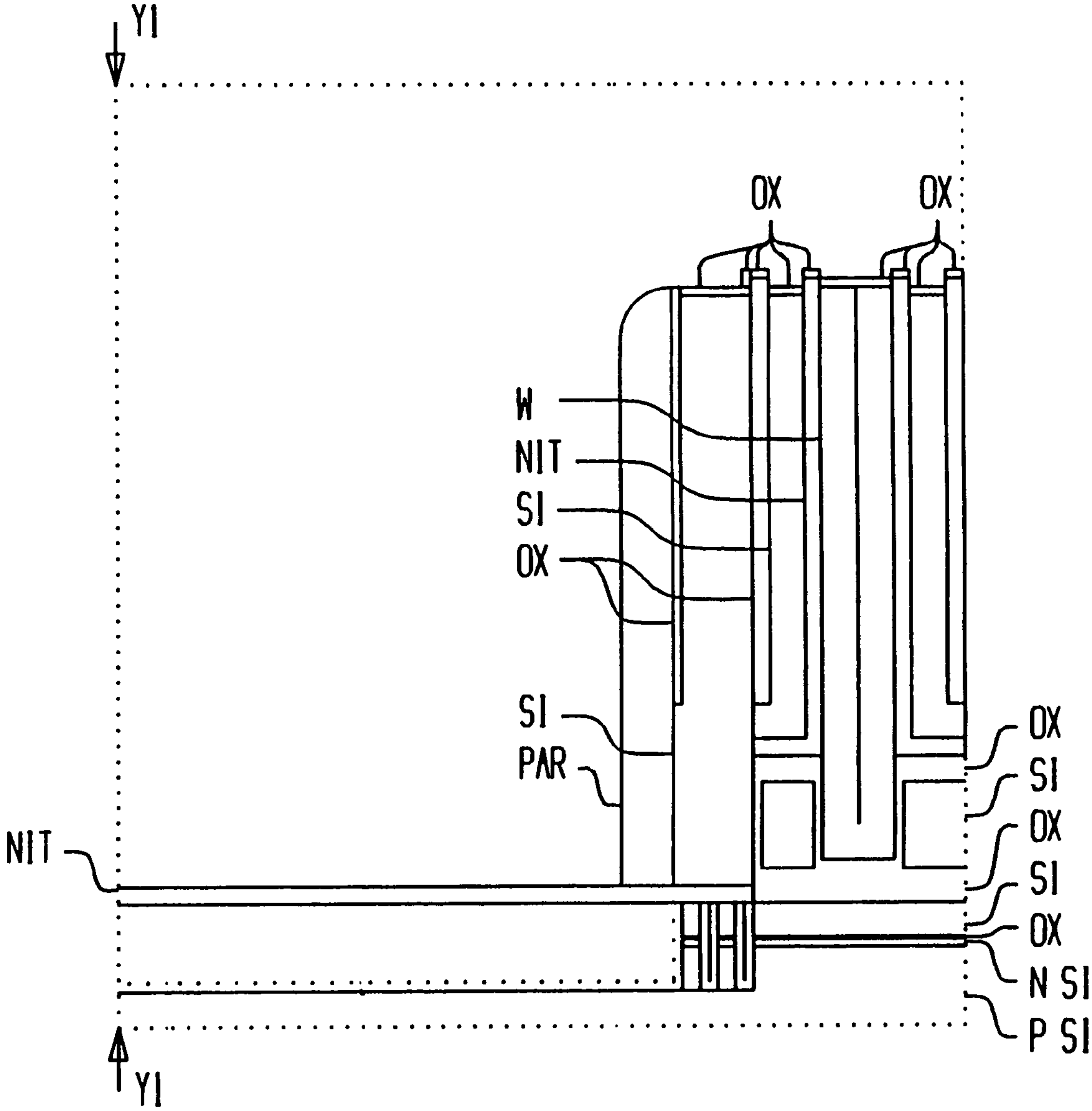

FIG. 522 and FIG. 523 illustrate a cross-section and length-section, respectively, with the layer of second insulating material removed, except from the sides of the wall and of the forward trench.

Figure 524:
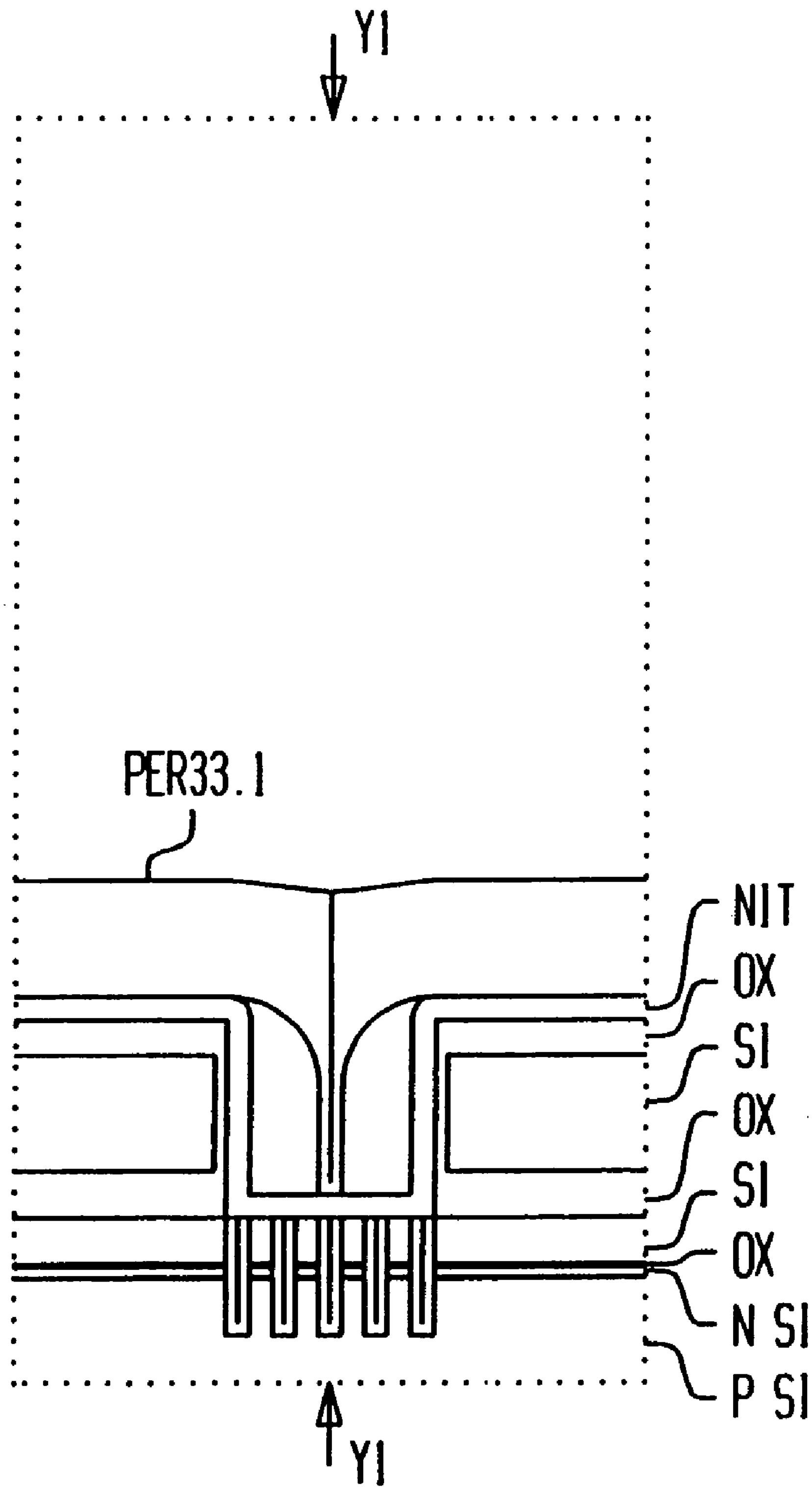
Figure 525:
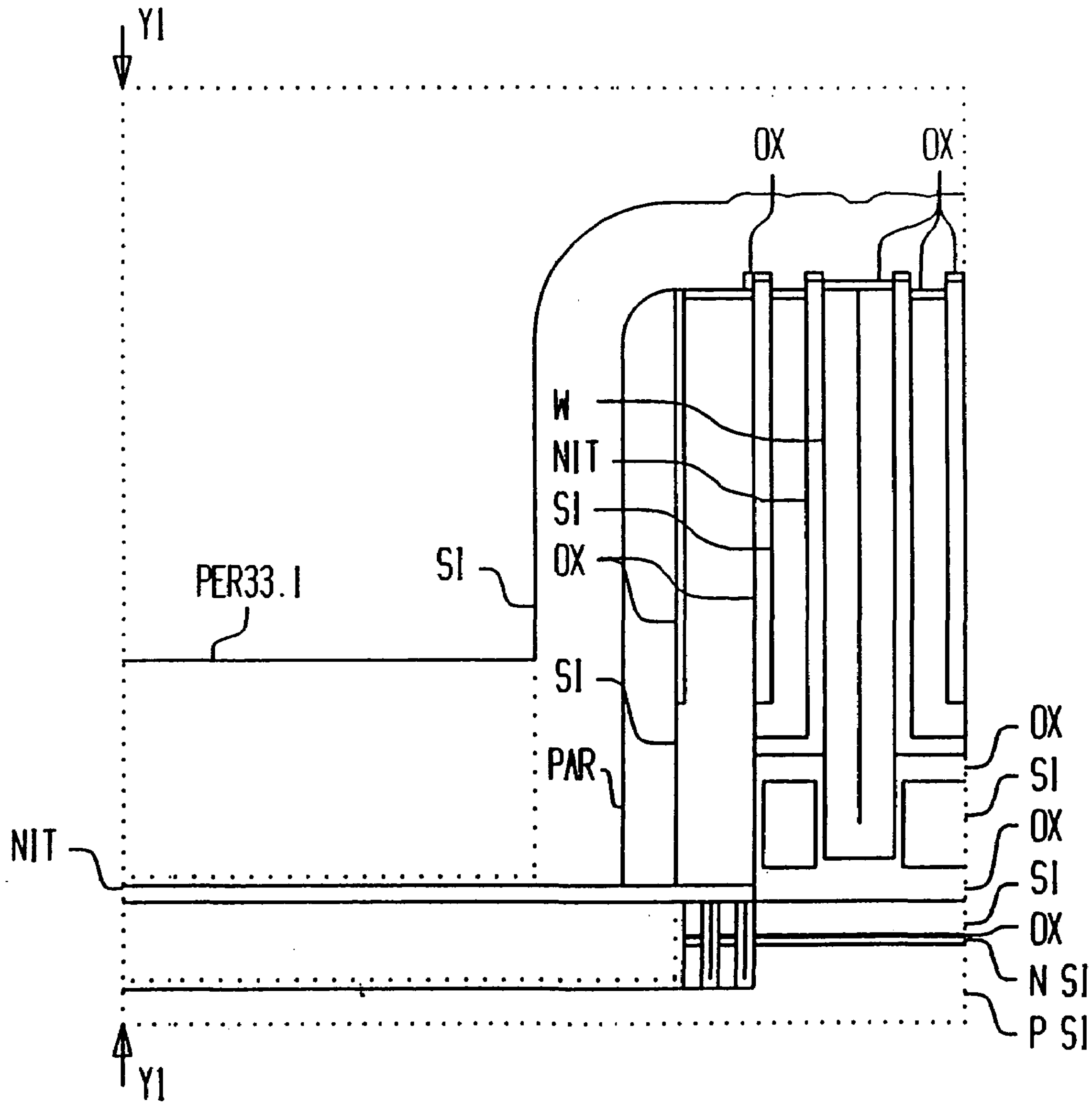

FIG. 524 and FIG. 525 illustrate a cross-section and length-section, respectively, with a layer of controlled thickness of semiconductor material deposited.

Figure 526:
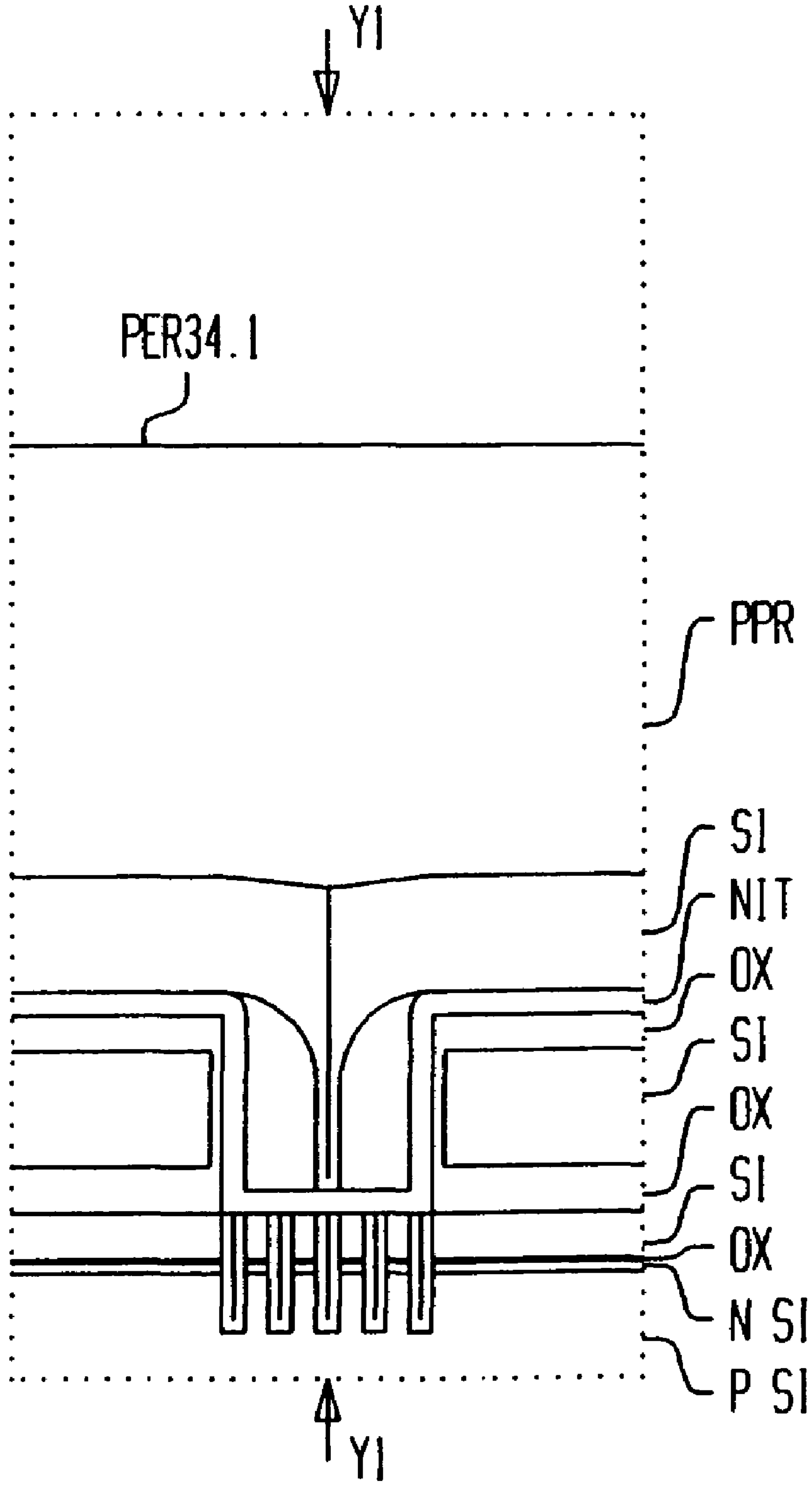
Figure 527:
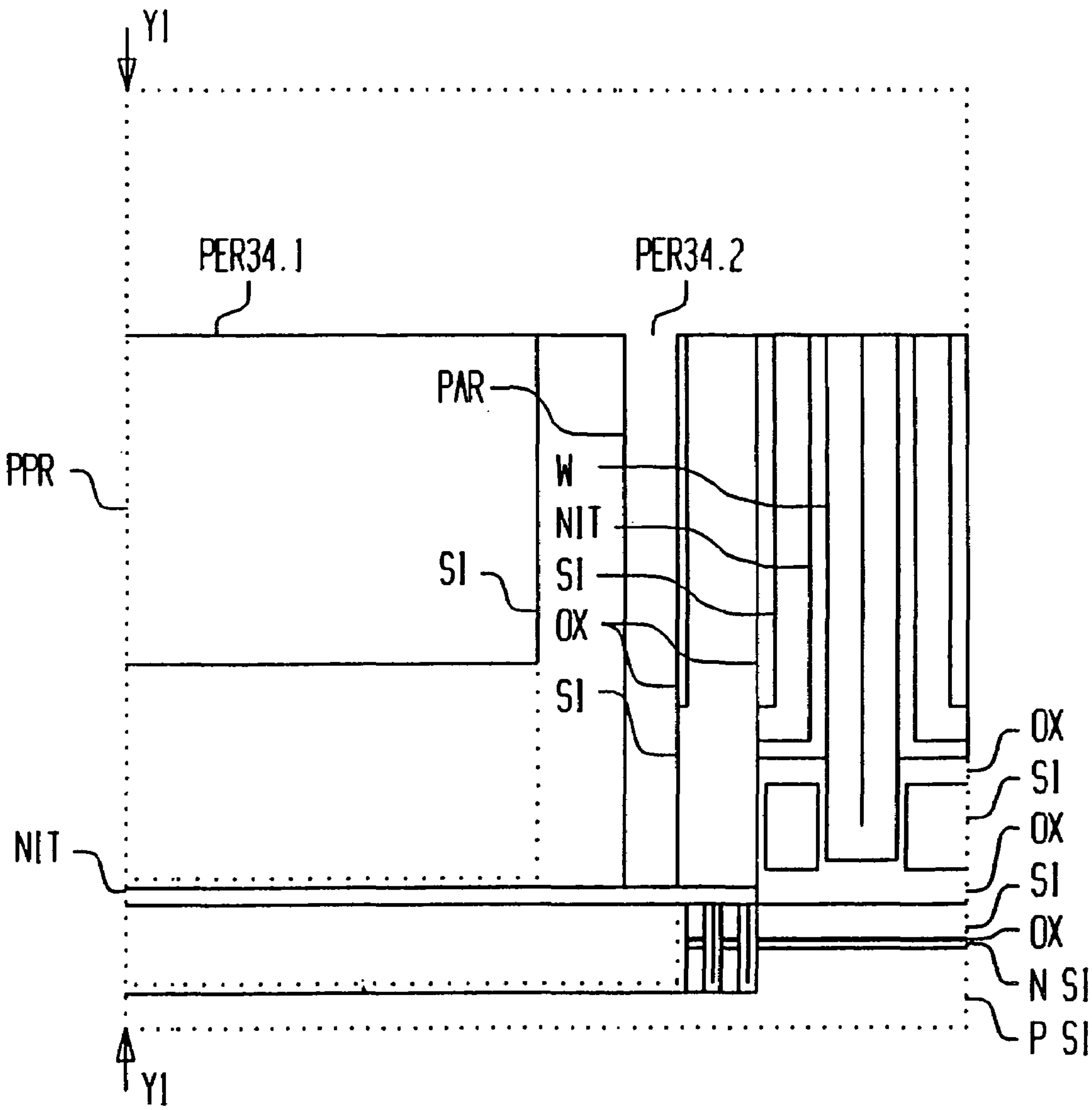

FIG. 526 and FIG. 527 illustrate a cross-section and length-section, respectively, with the region surrounding the wall filled with the filler material, the top surface planarized, and the exposed second insulating material removed, forming a trench within the wall.

Figure 528:
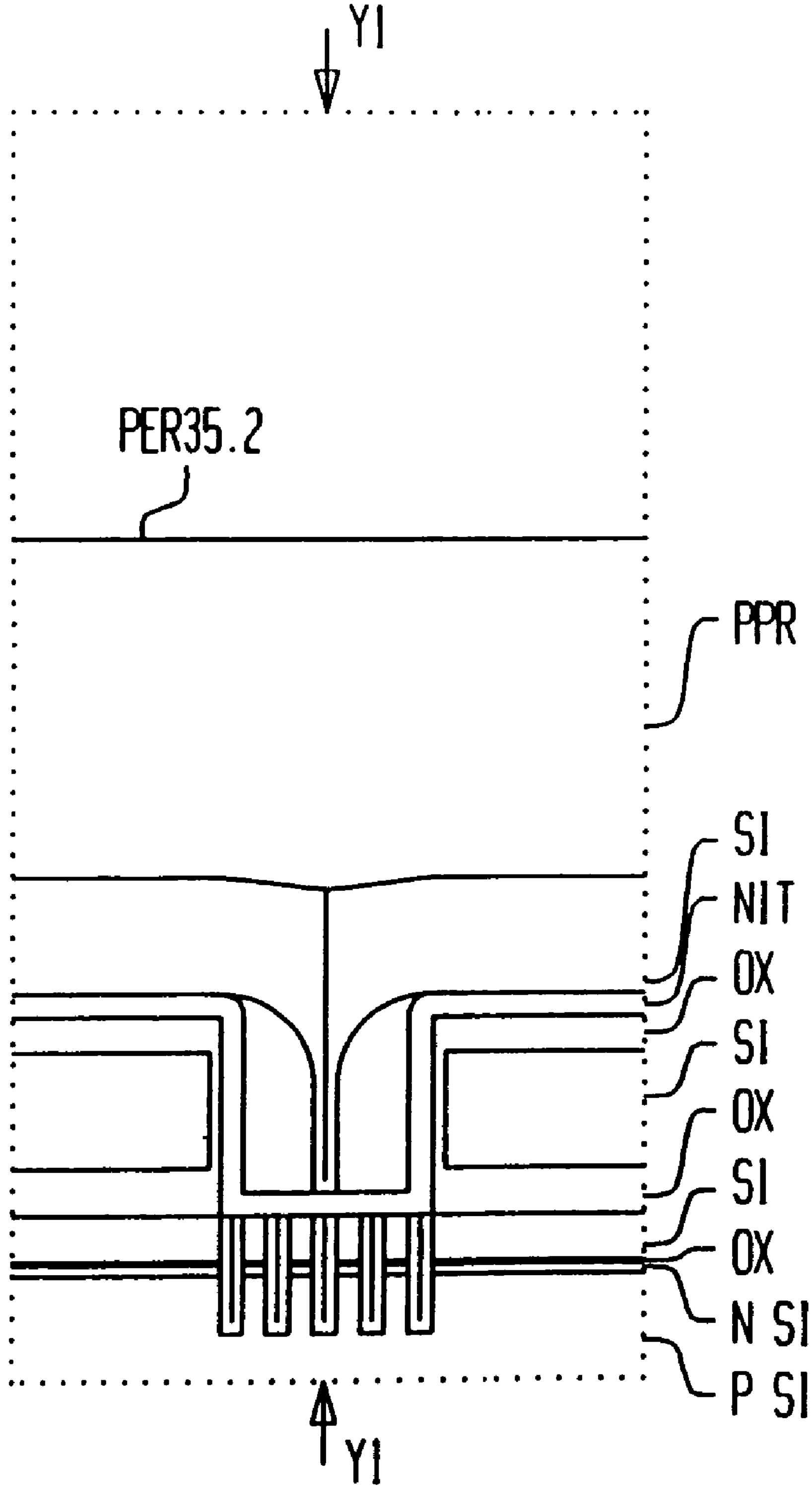
Figure 529:
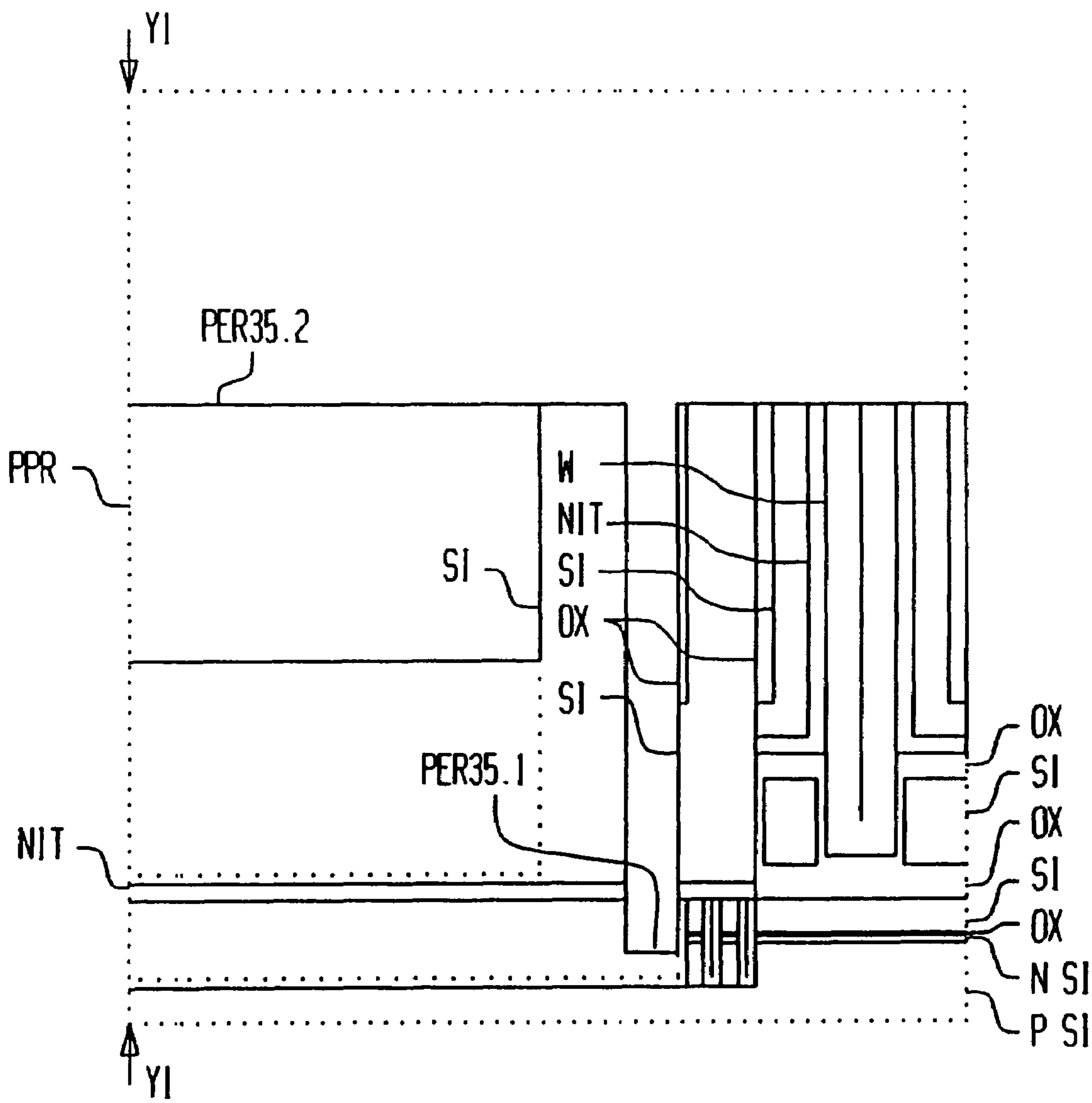

FIG. 528 and FIG. 529 illustrate a cross-section and length-section, respectively, with the trench within the wall deepened into the fifth layer at the bottom of the forward trench.

Figure 530:
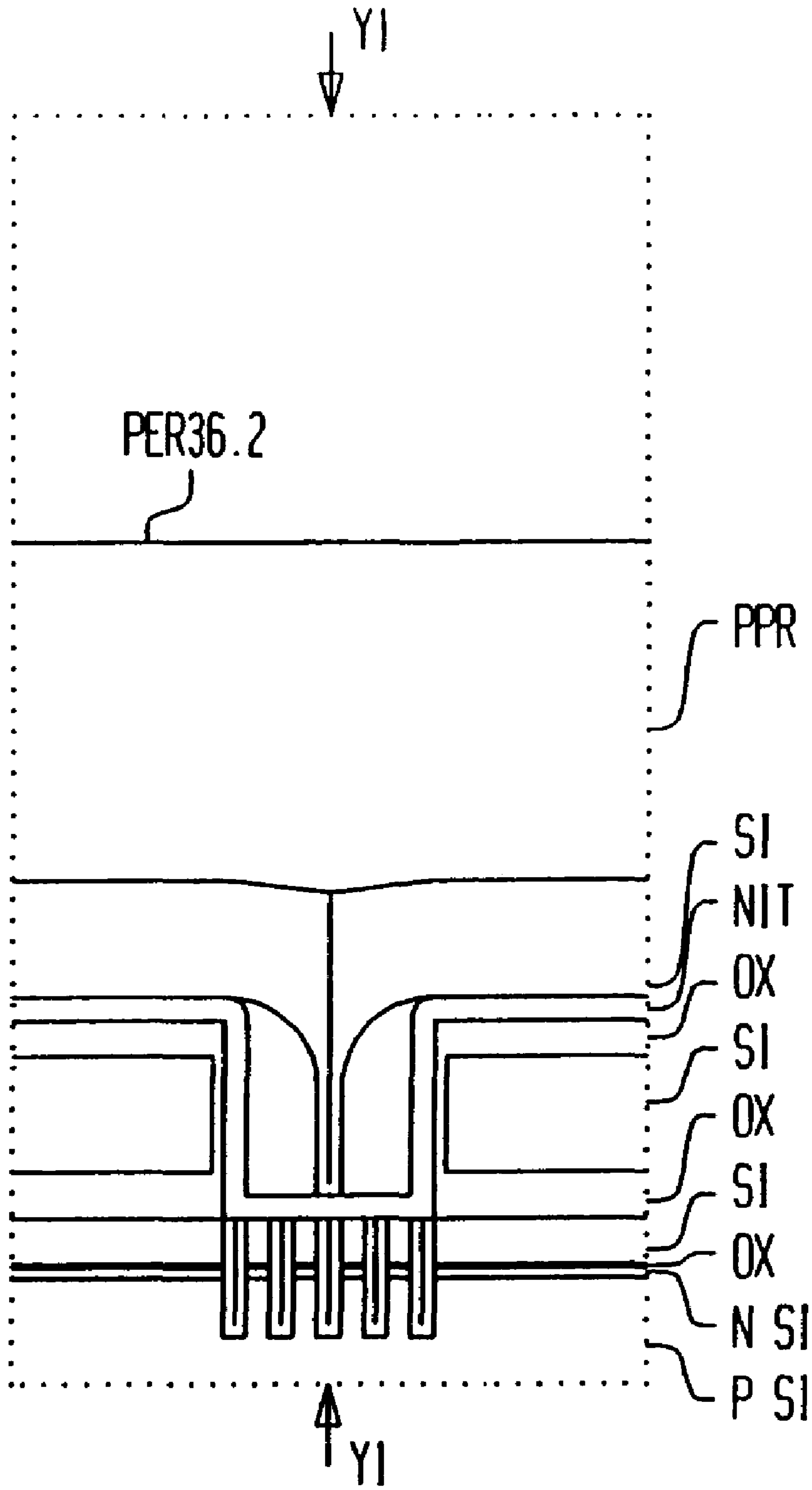
Figure 531:
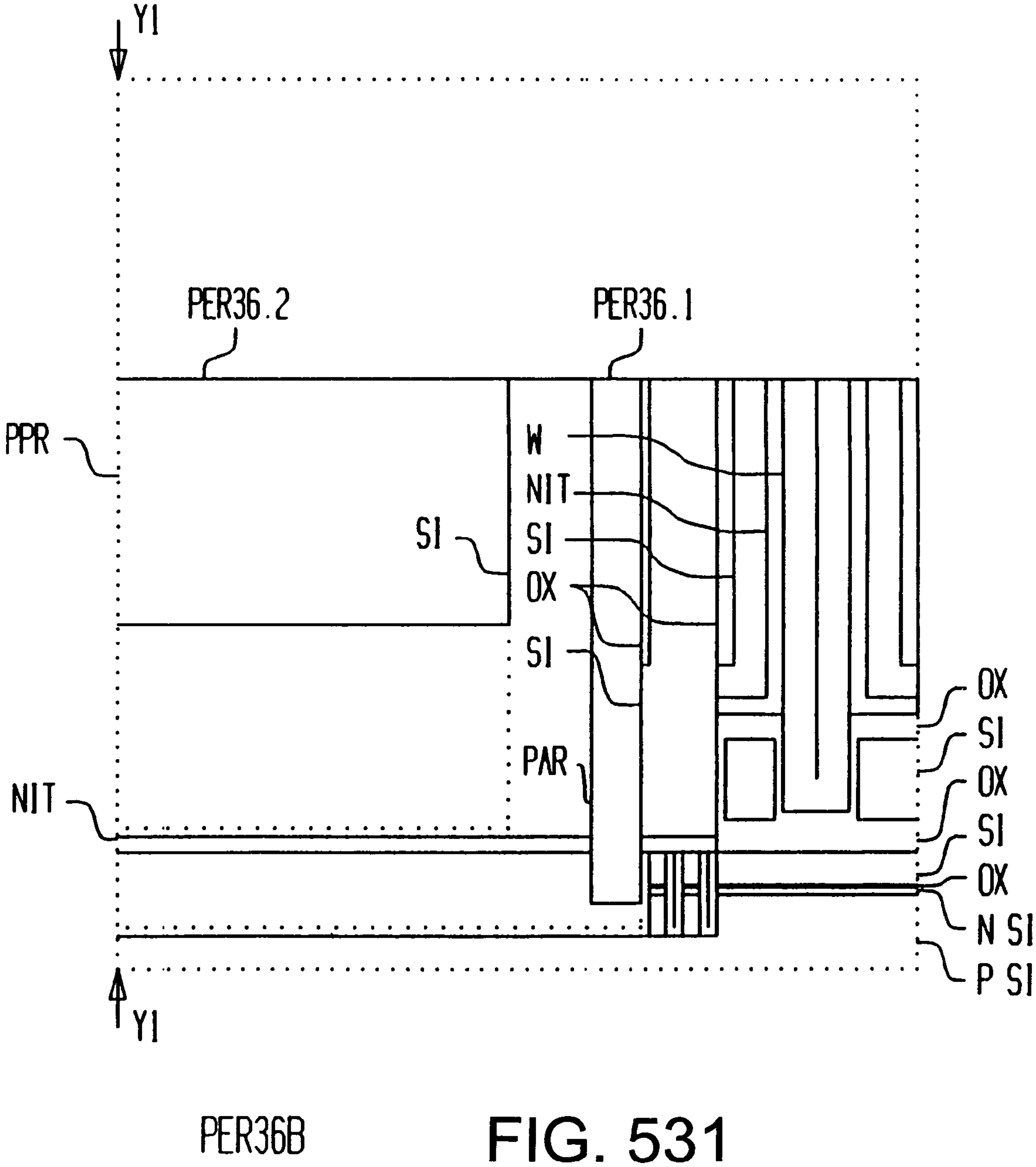

FIG. 530 and FIG. 531 illustrate a cross-section and length-section, respectively, with the trench within the wall filled again with second insulating material.

Figure 532:
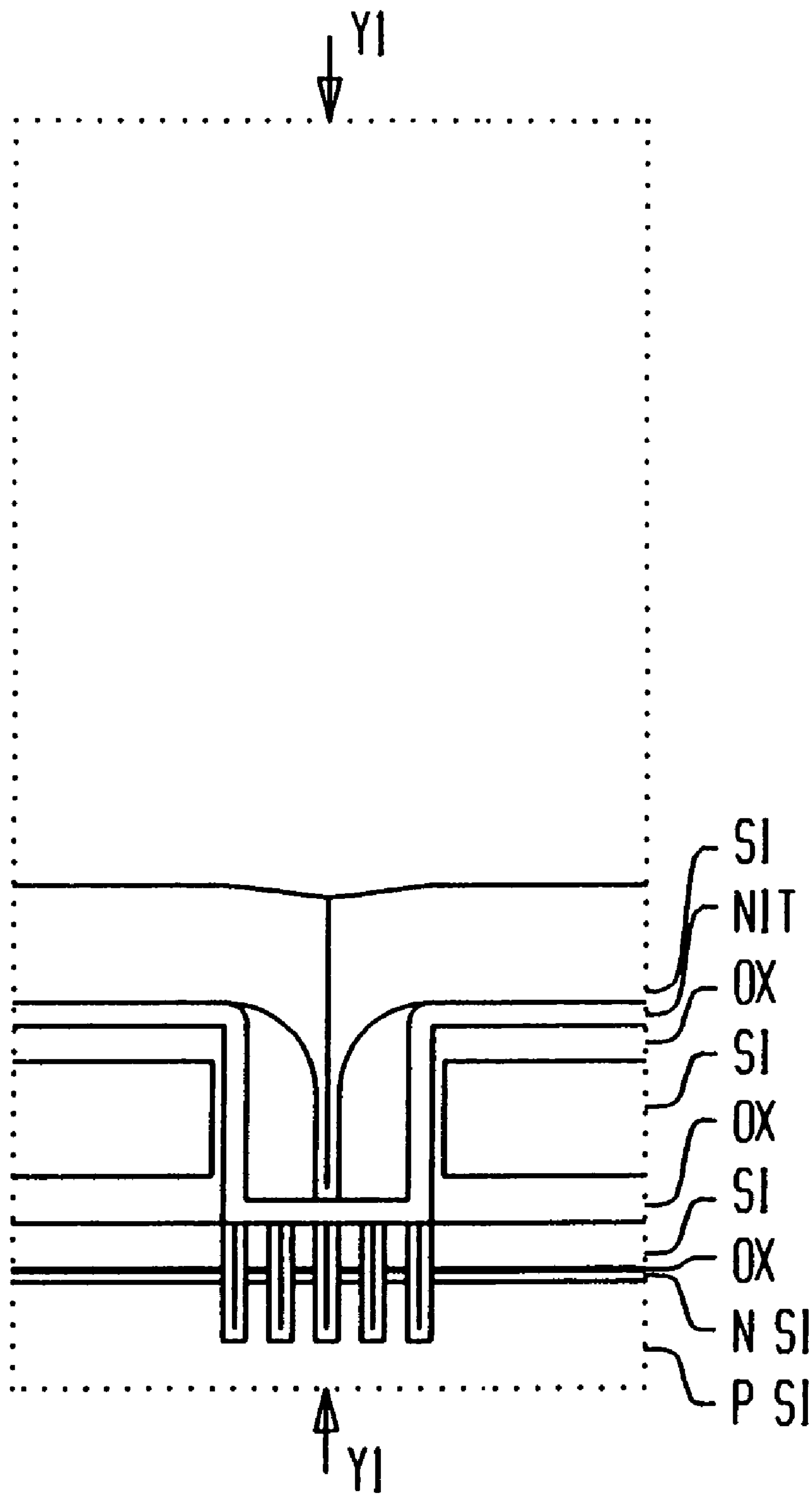
Figure 533:
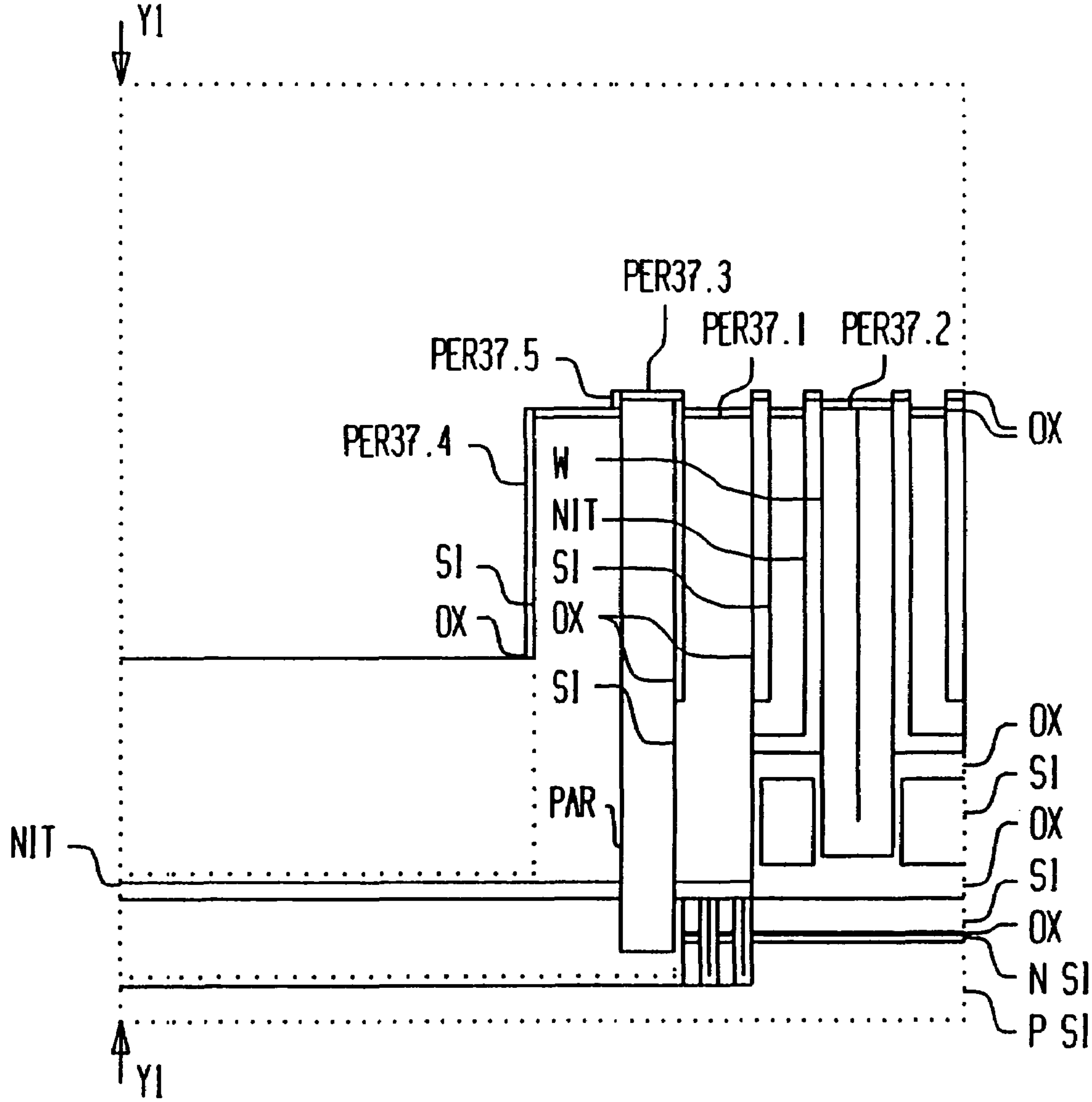

FIG. 532 and FIG. 533 illustrate a cross-section and length-section, respectively, with the exposed semiconductor material and metal surfaces etched back and all top surfaces vertically covered with first insulating material, with the filler material removed, and with the left side of the wall coated with first insulating material.

Figure 534:
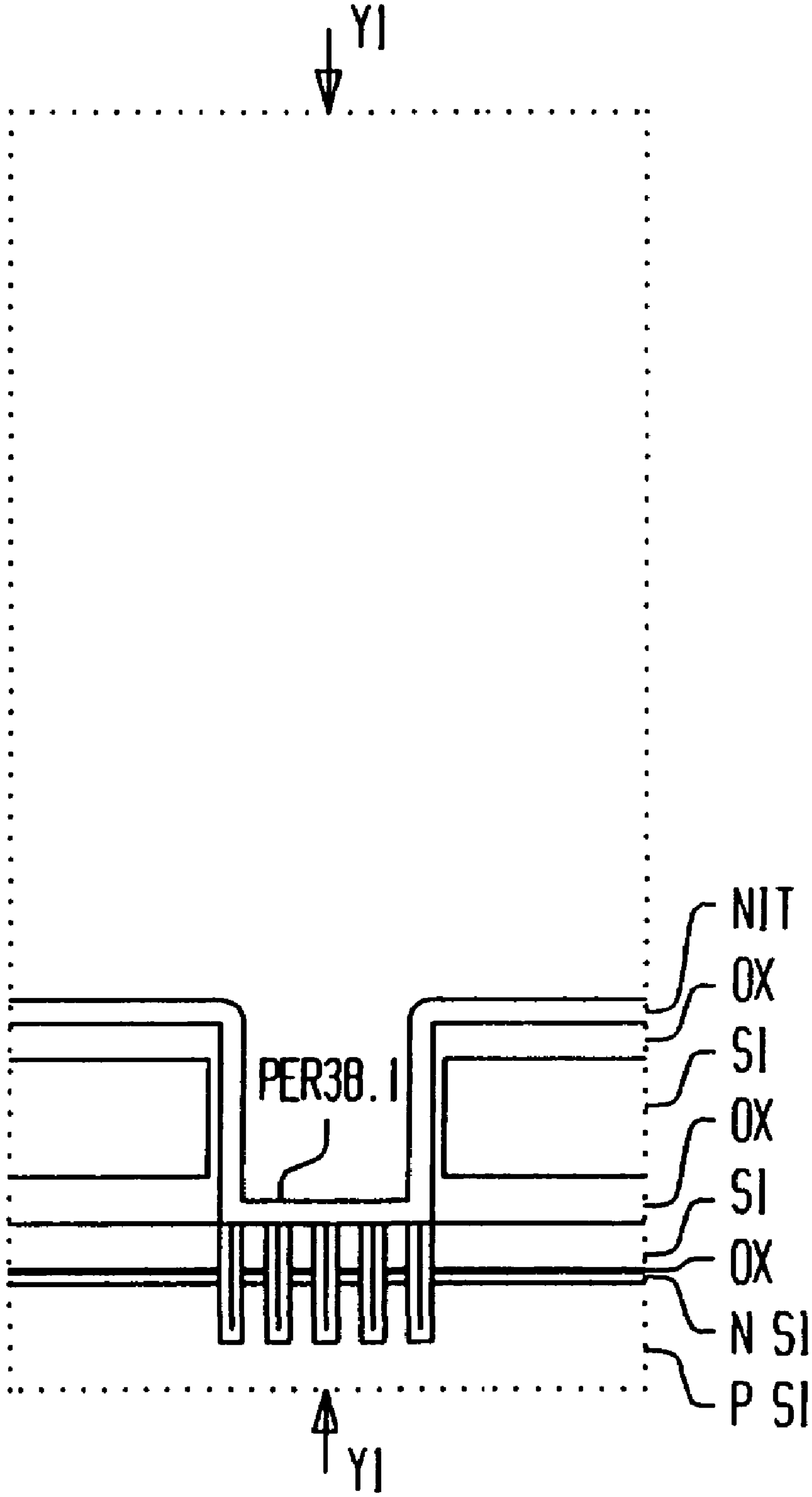
Figure 535:
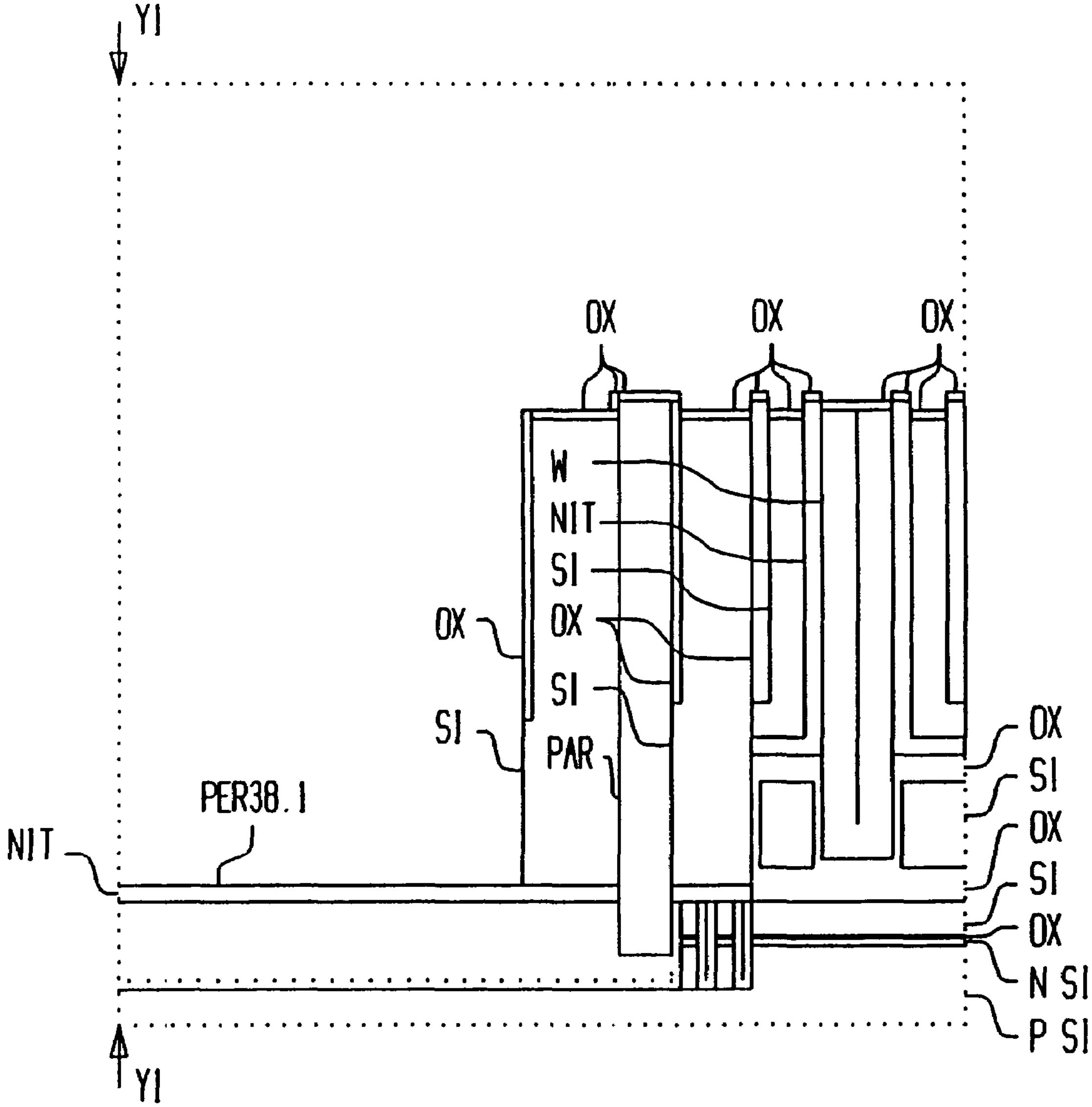

FIG. 534 and FIG. 535 illustrate a cross-section and length-section, respectively, with the exposed semiconductor material vertically removed and all exposed second insulating material removed in sequence.

Figure 536:
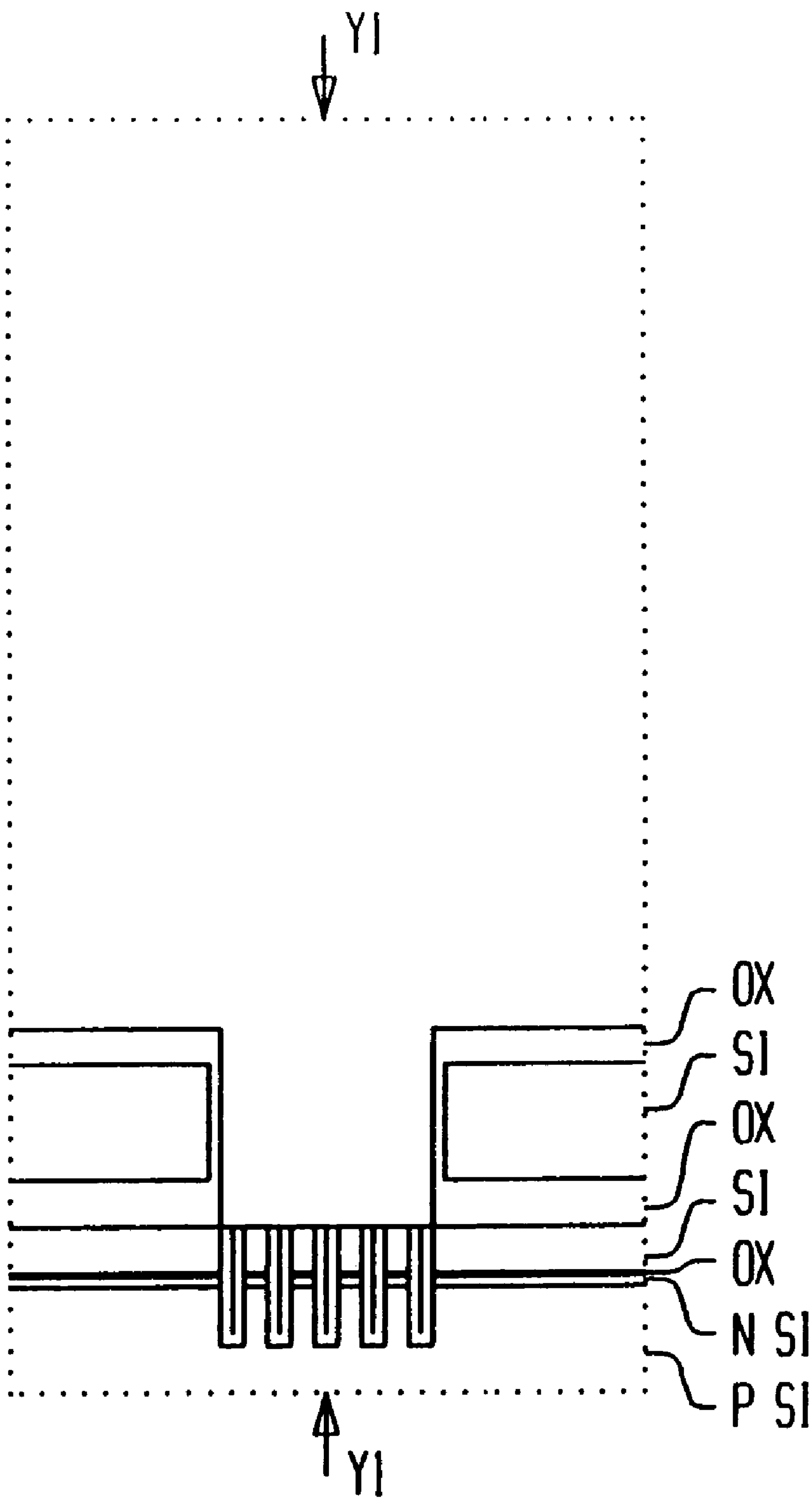
Figure 537:
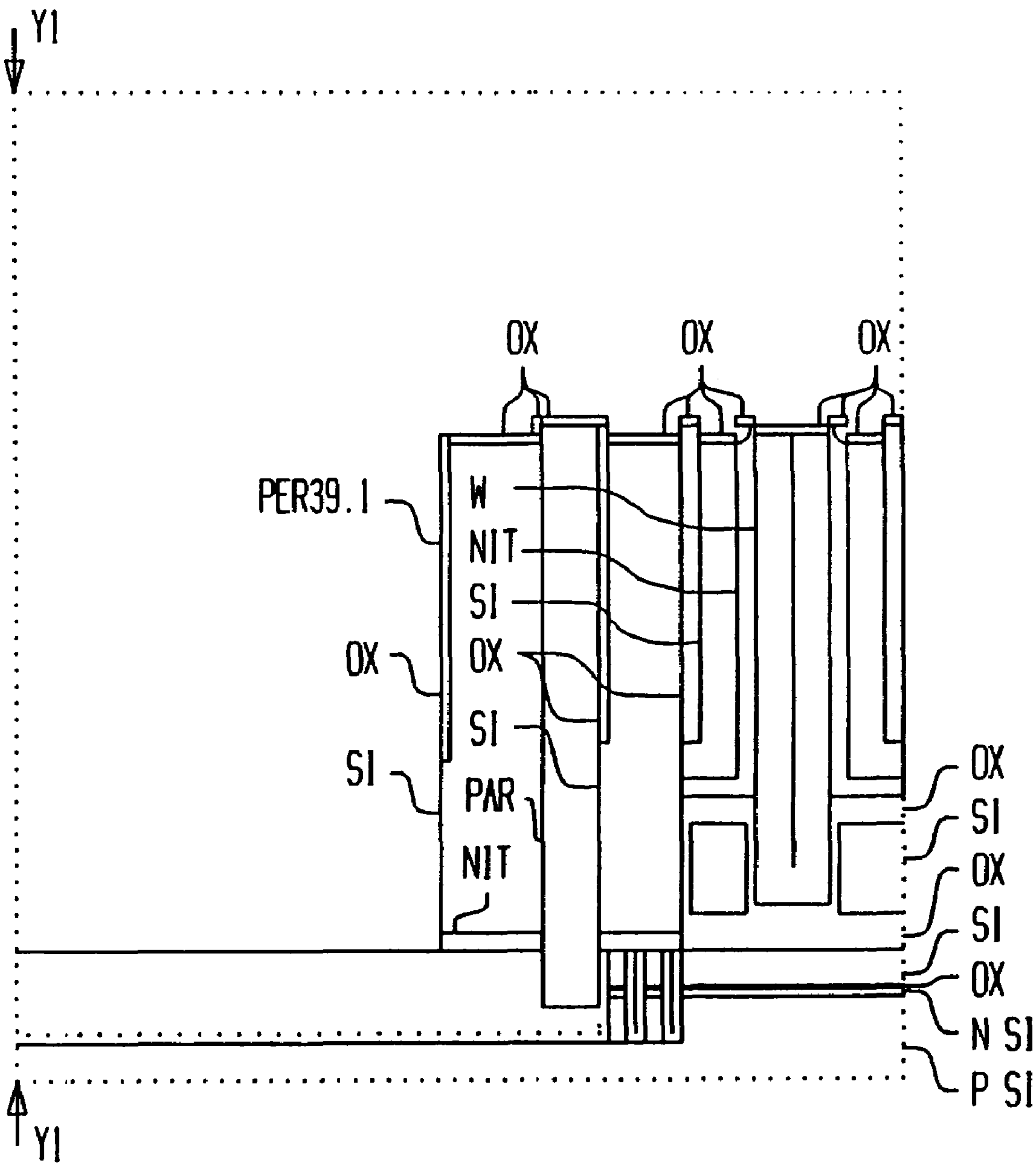

FIG. 536 and FIG. 537 illustrate a cross-section and length-section, respectively, with the exposed third insulating material removed.

Figure 538:
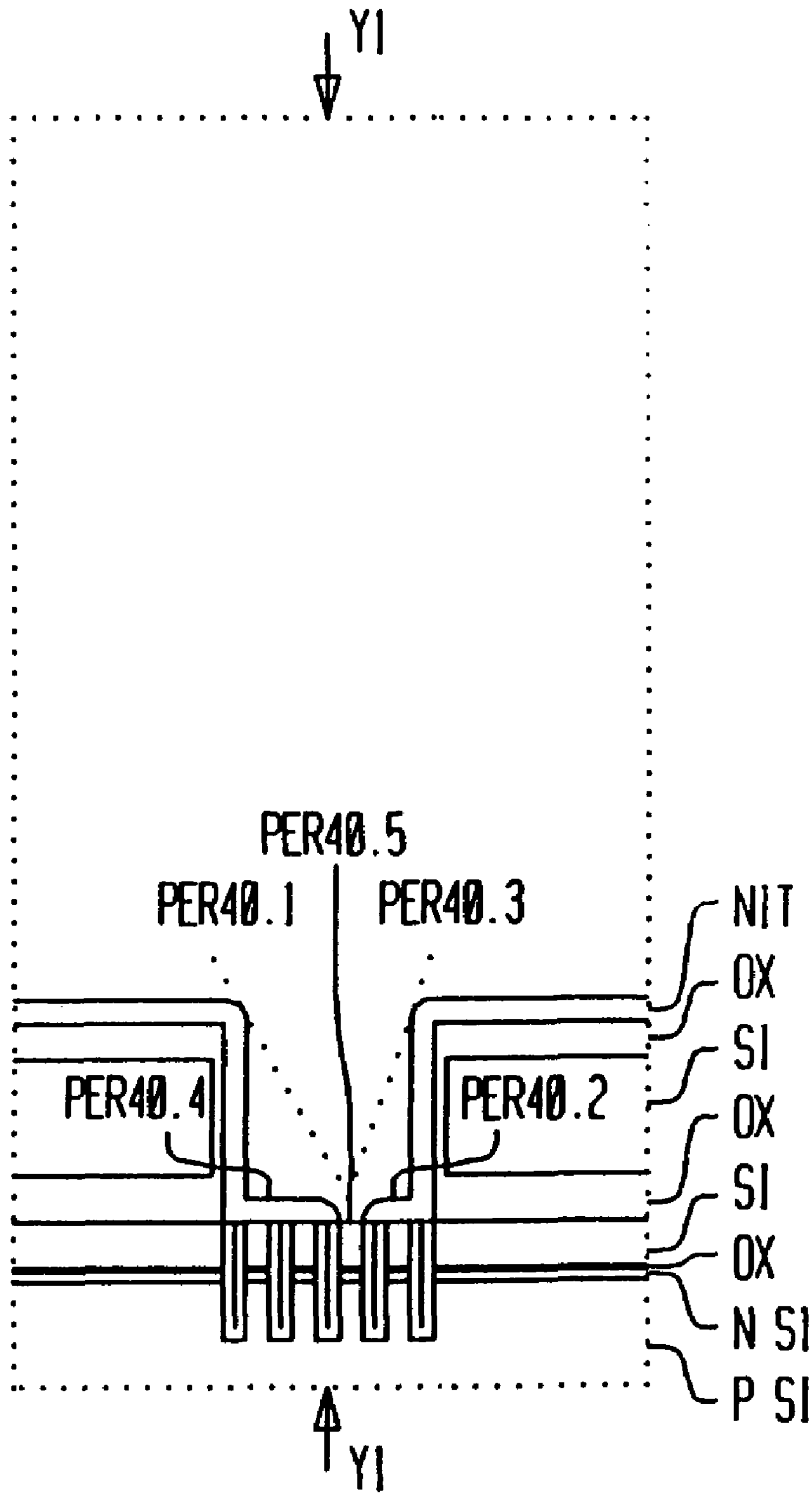
Figure 539:
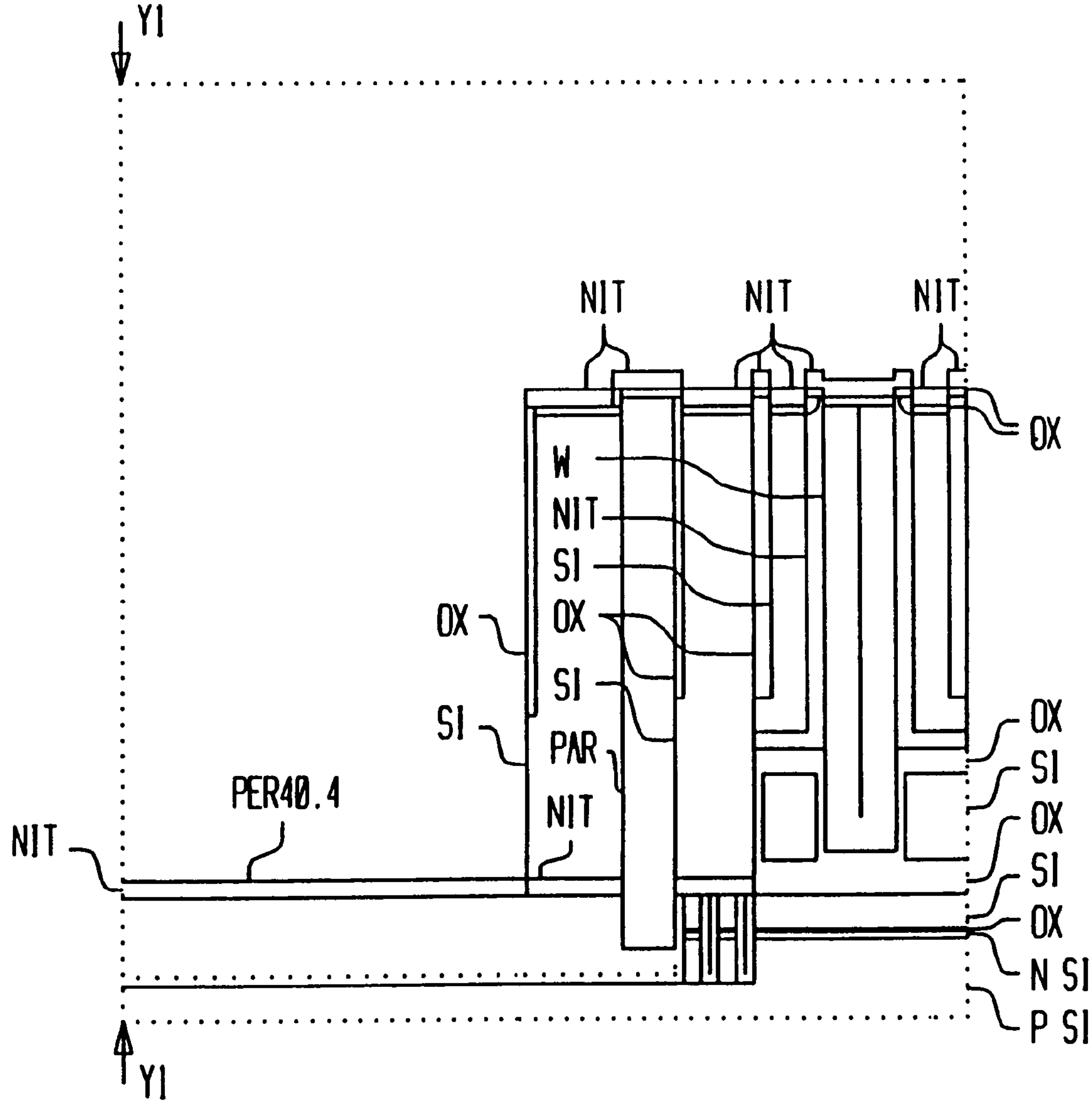

FIG. 538 and FIG. 539 illustrate a cross-section and length-section, respectively, with a layer of third insulating material deposited everywhere, except on the sides of the wall and above one of the exposed blades at the bottom of the forward trench.

Figure 540:
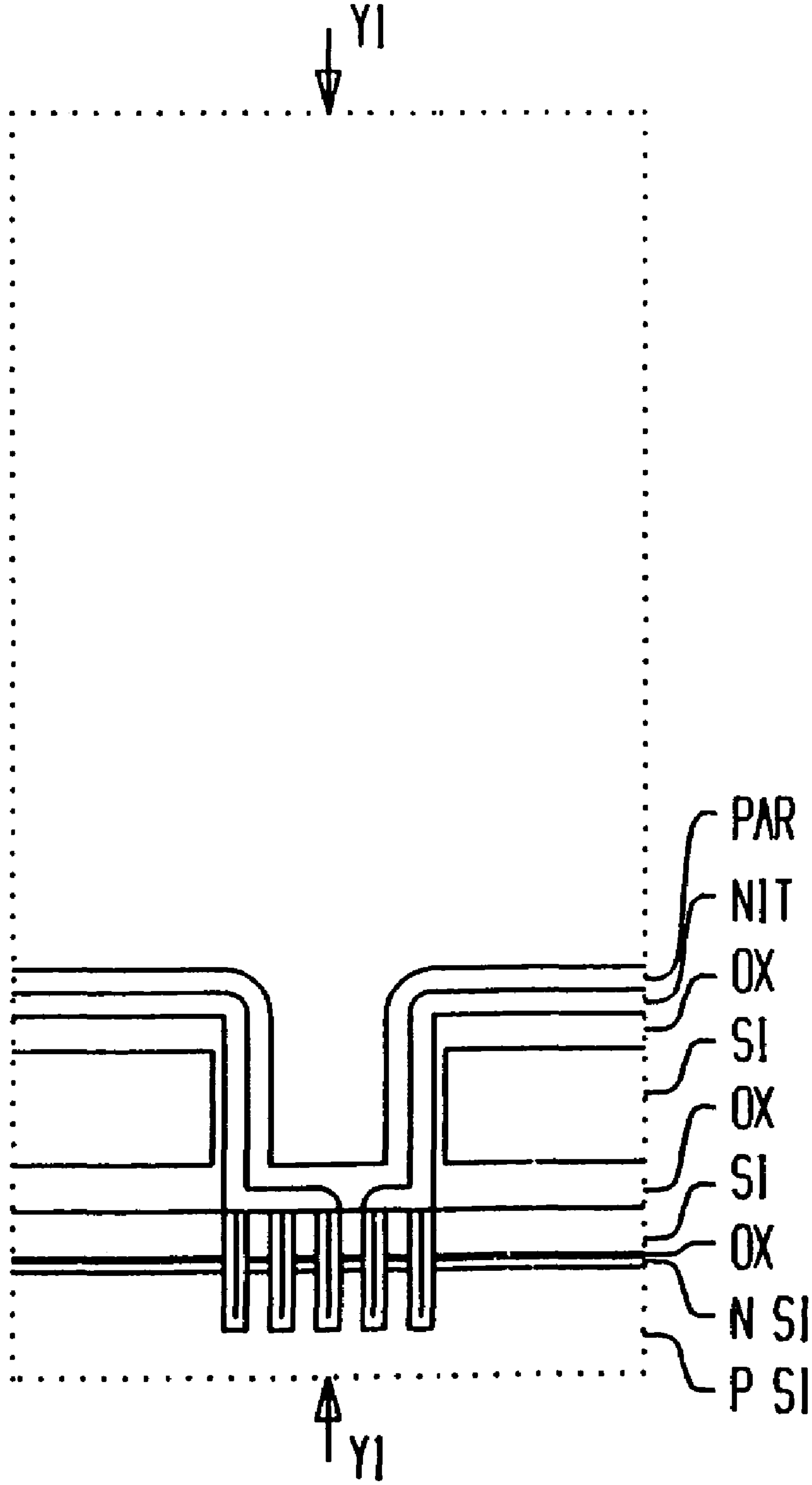
Figure 541:
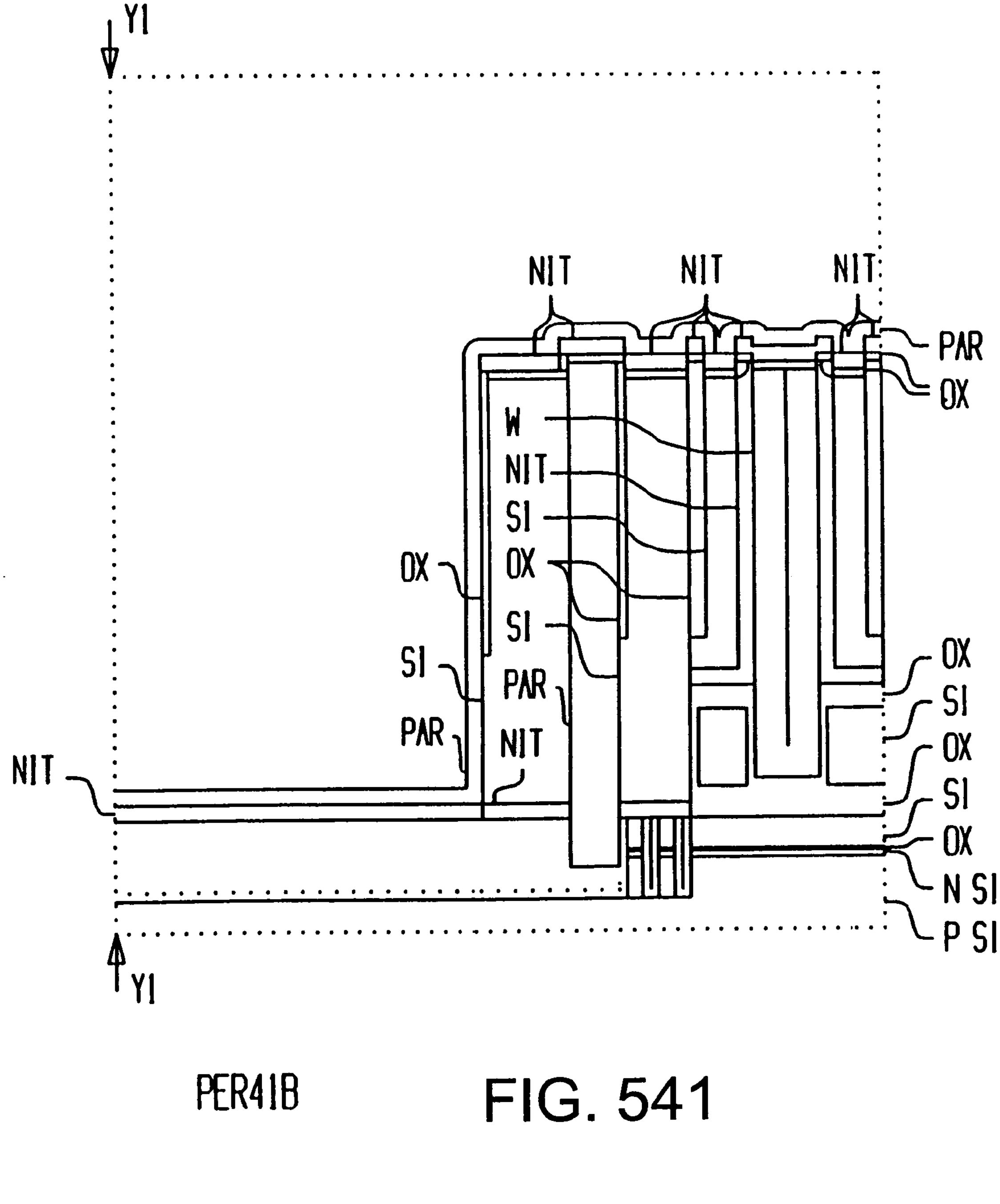

FIG. 540 and FIG. 541 illustrate a cross-section and length-section, respectively, with a layer of second insulating material deposited everywhere.

Figure 542:
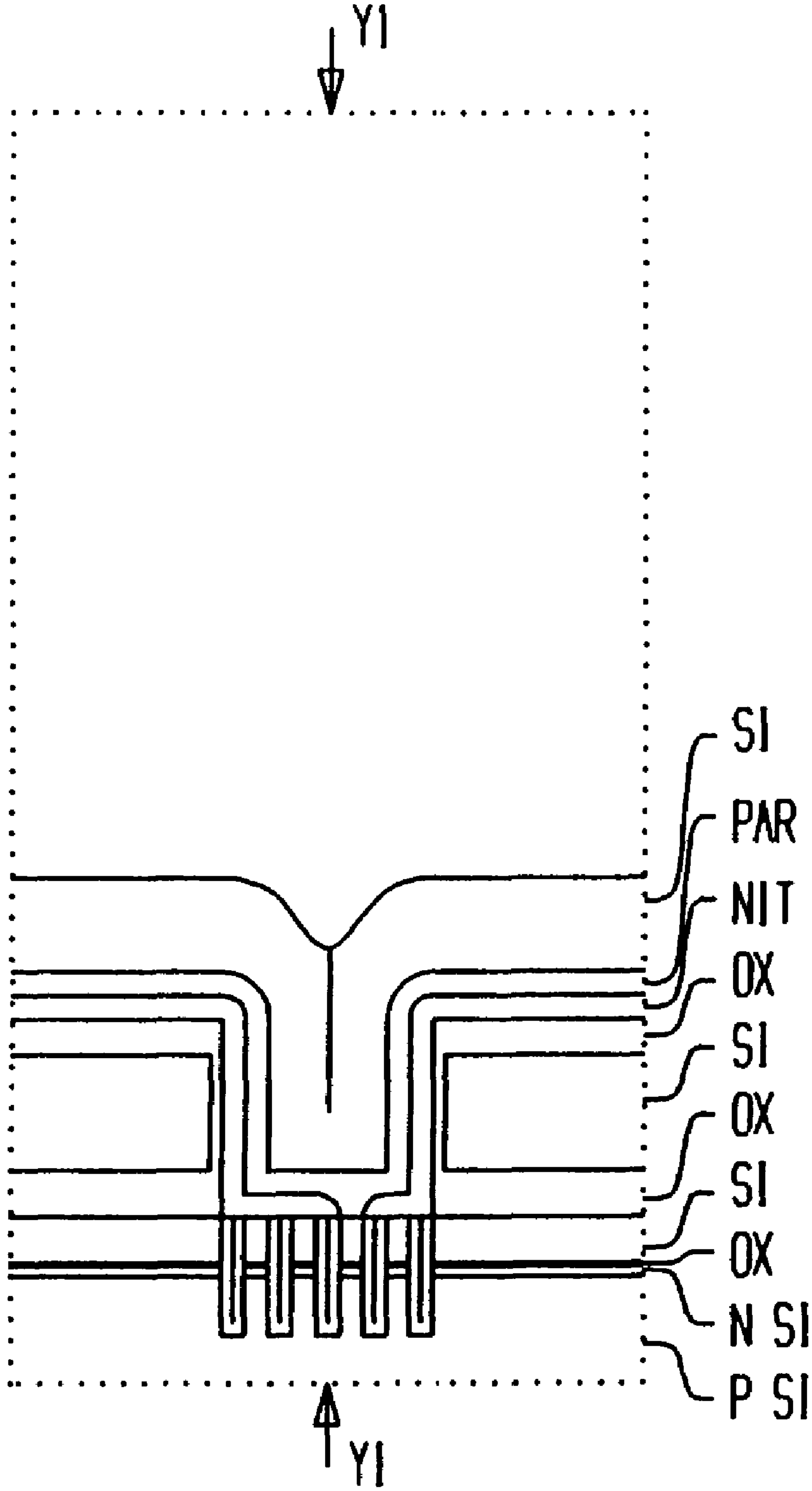
Figure 543:
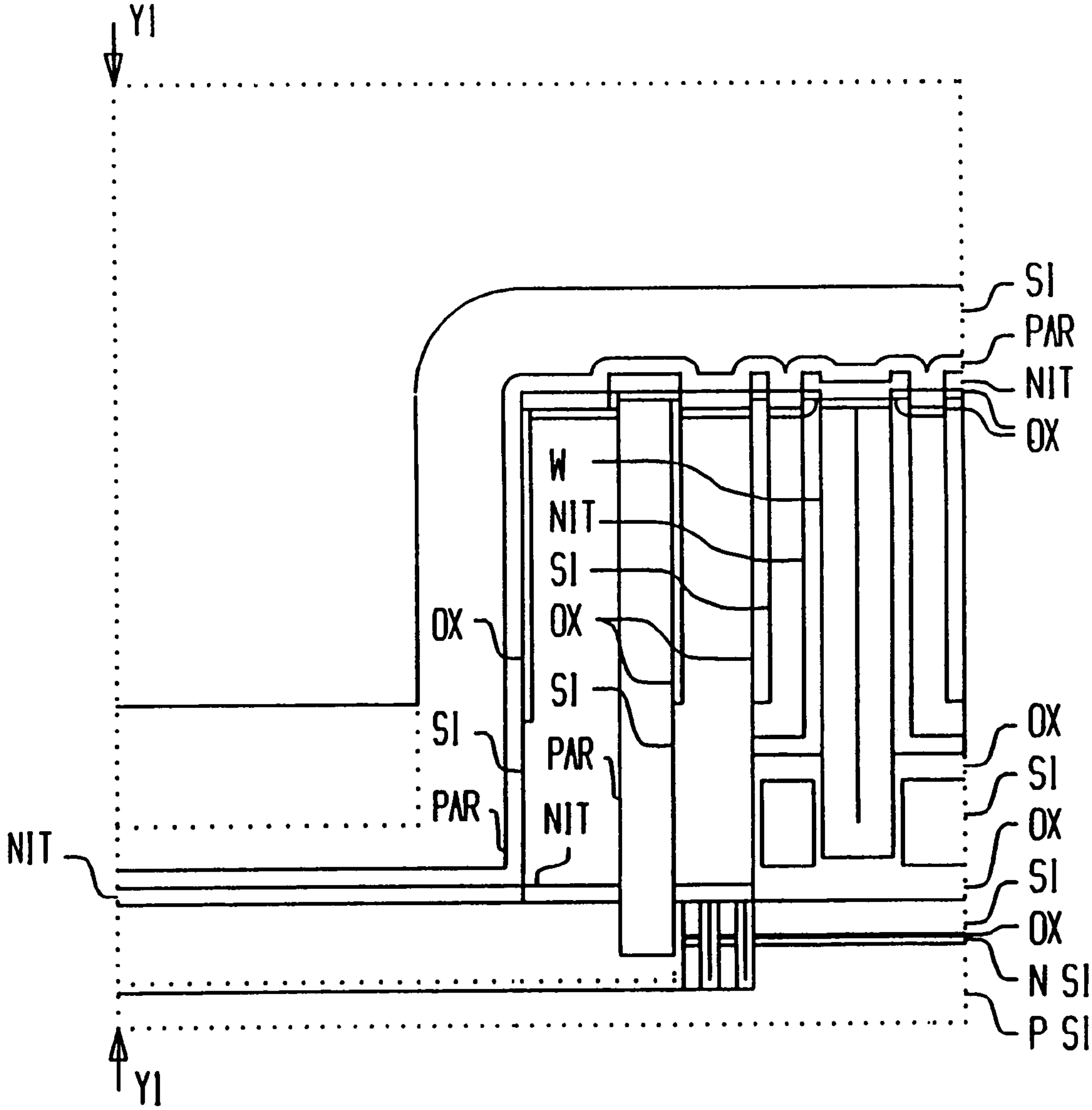

FIGS. 542 and 543 illustrate a cross-section and length-section, respectively, with a layer of controlled thickness of semiconductor material deposited.

Figure 544:
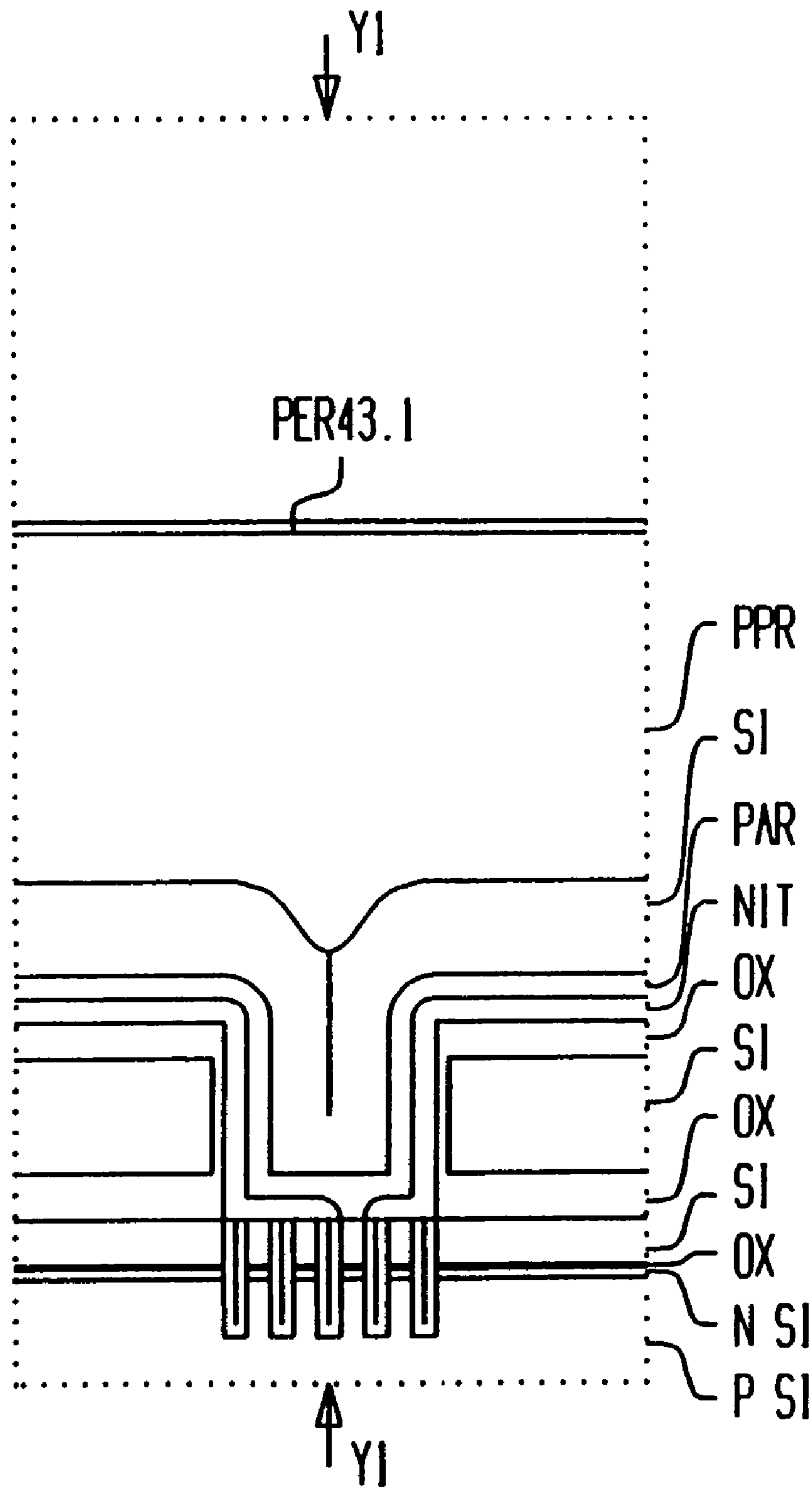
Figure 545:
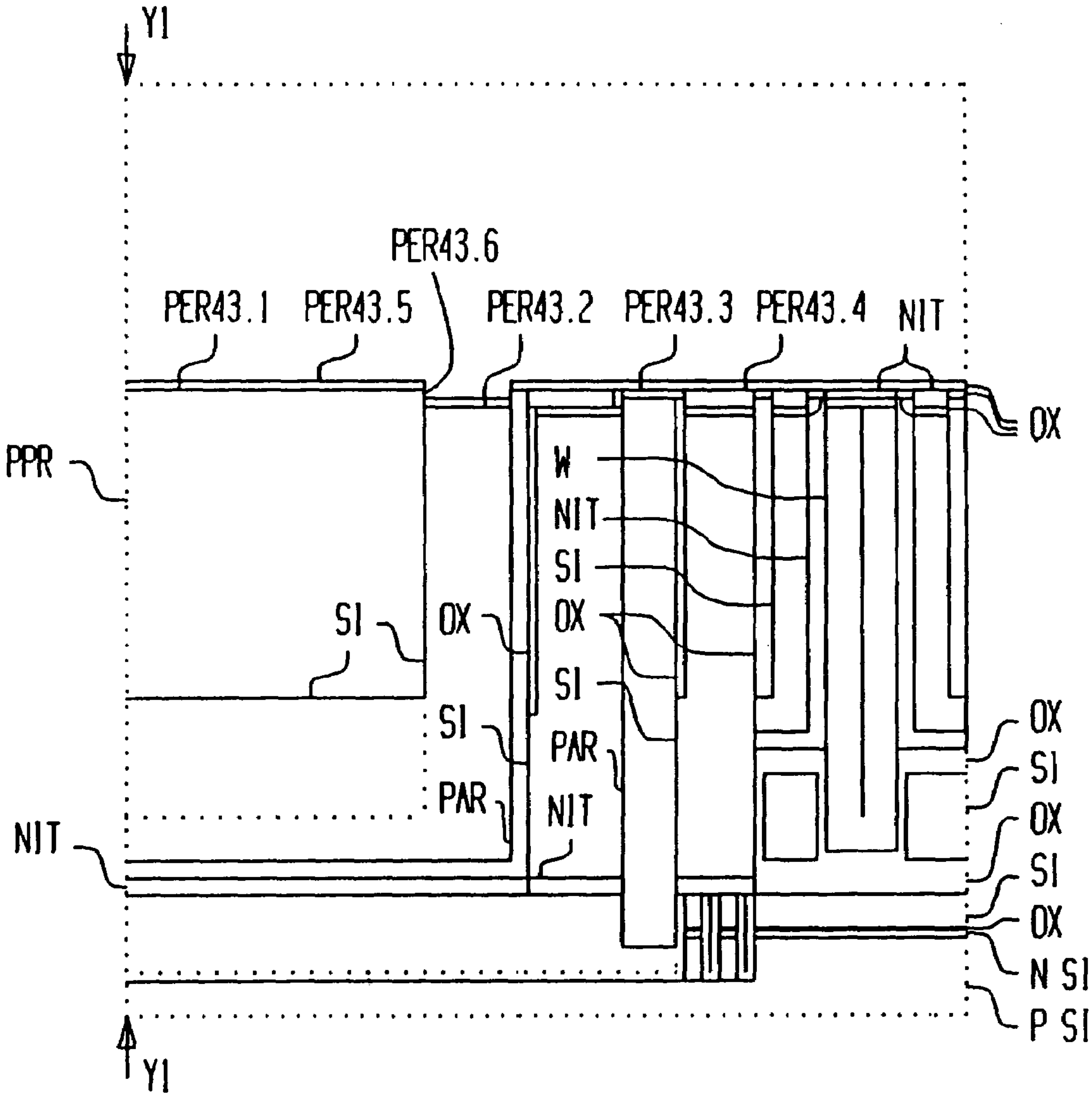

FIG. 544 and FIG. 545 illustrate a cross-section and length-section, respectively, with the region surrounding the wall filled with a filler material, the top surface planarized, the exposed semiconductor material and metal surfaces etched back and all top surfaces vertically covered with first insulating material.

Figure 546:
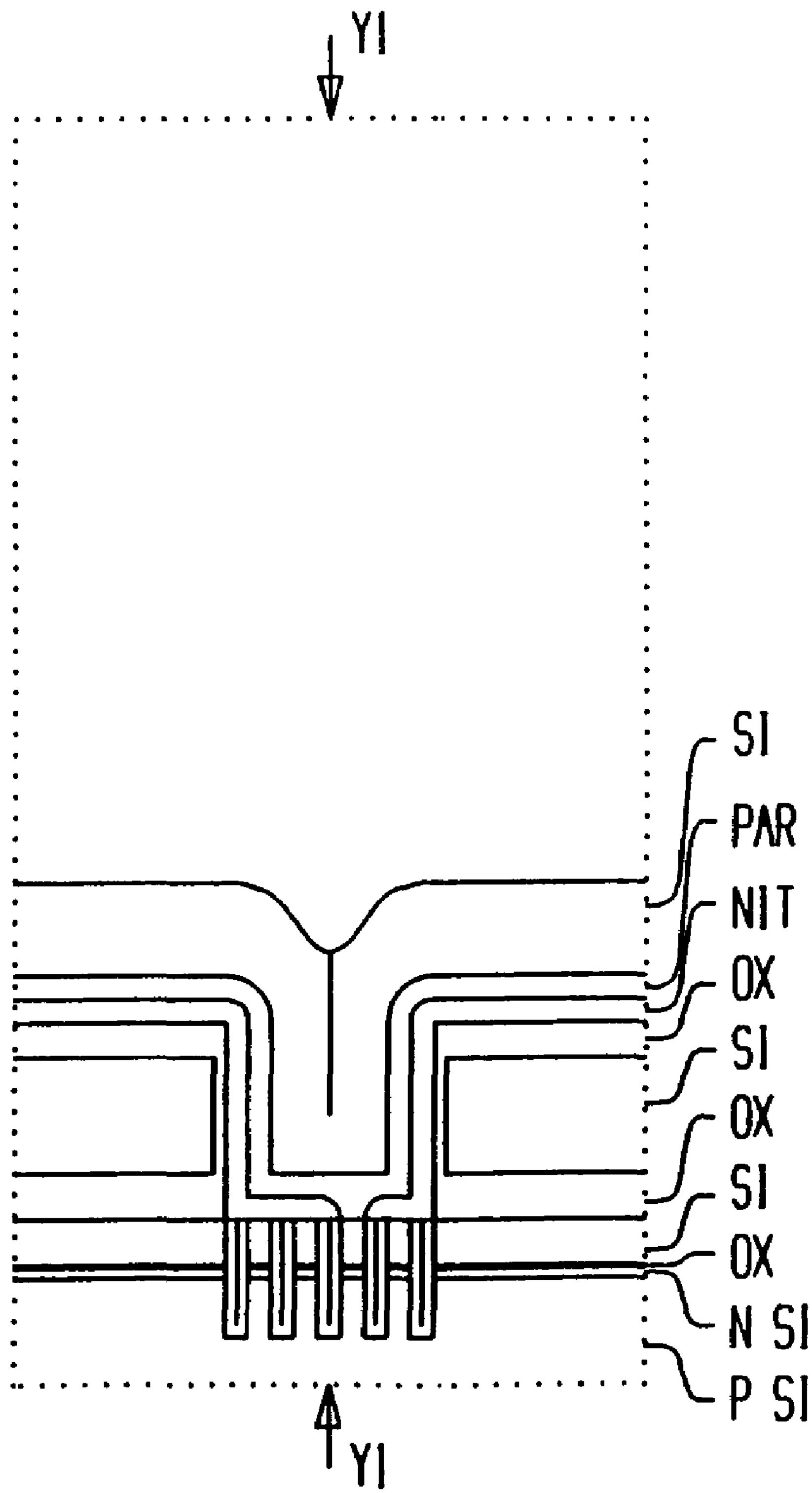
Figure 547:
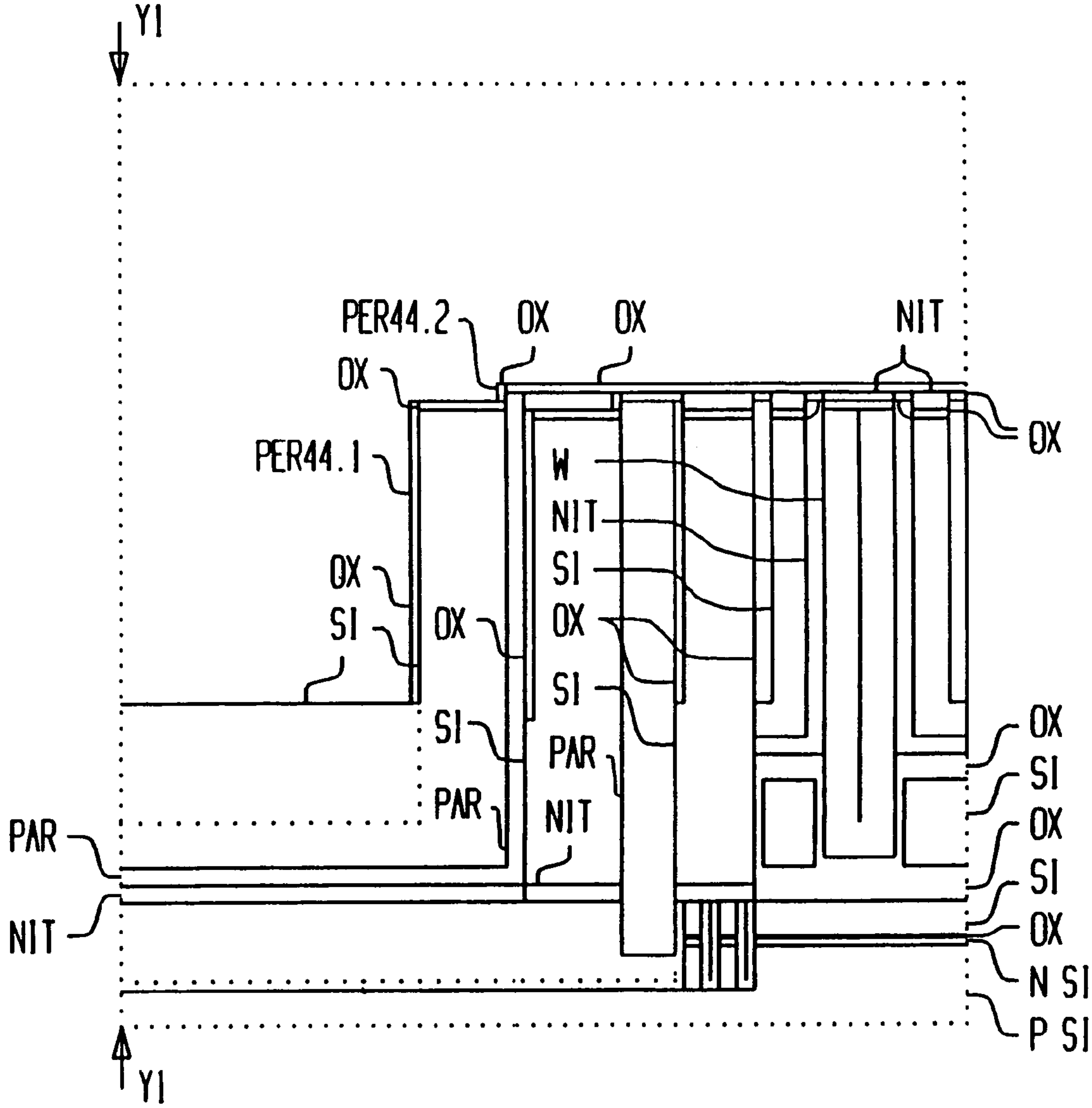

FIG. 546 and FIG. 547 illustrate a cross-section and length-section, respectively, with the filler material removed, and with the left side of the wall coated with first insulating material.

Figure 548:
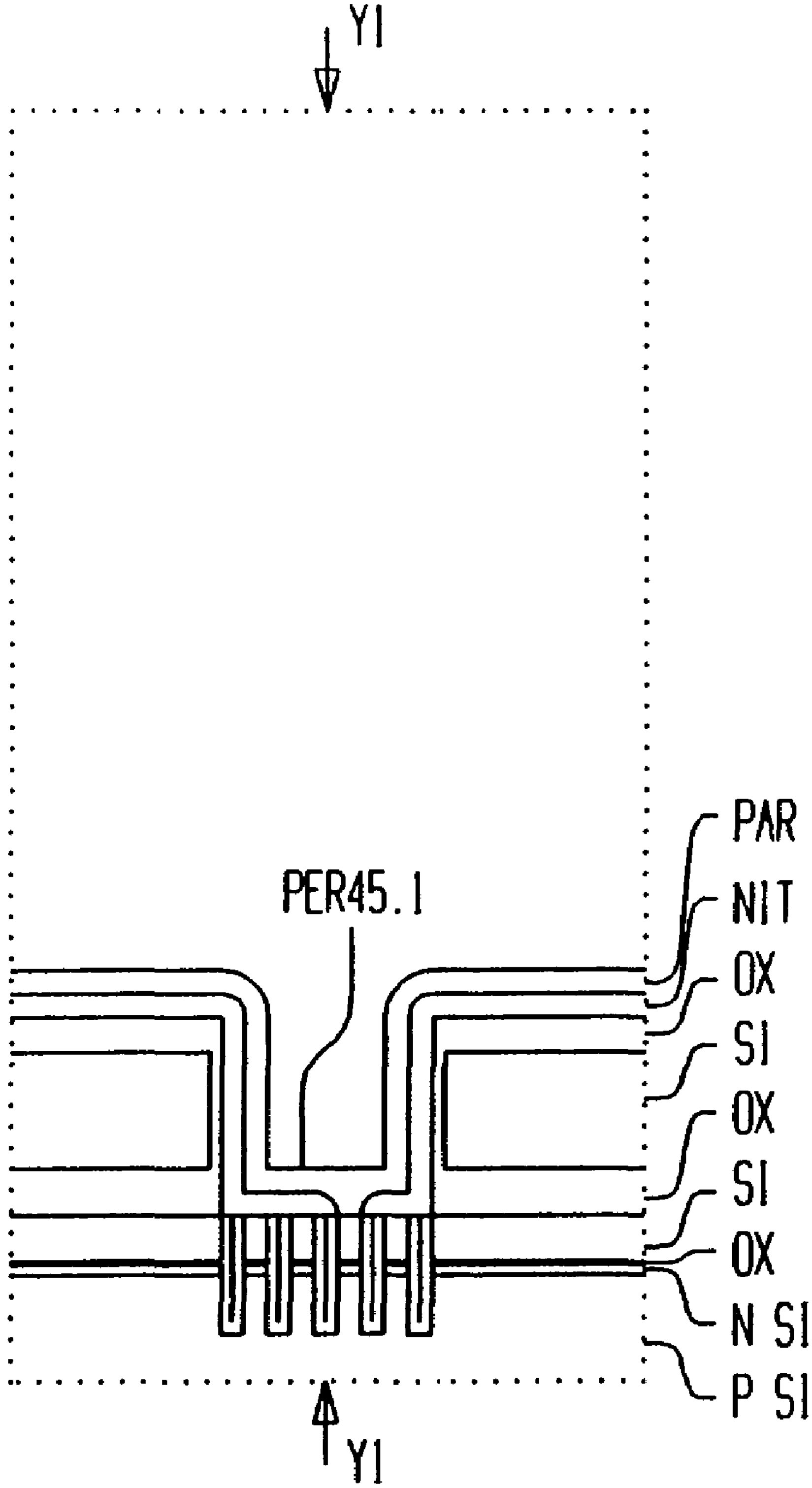
Figure 549:
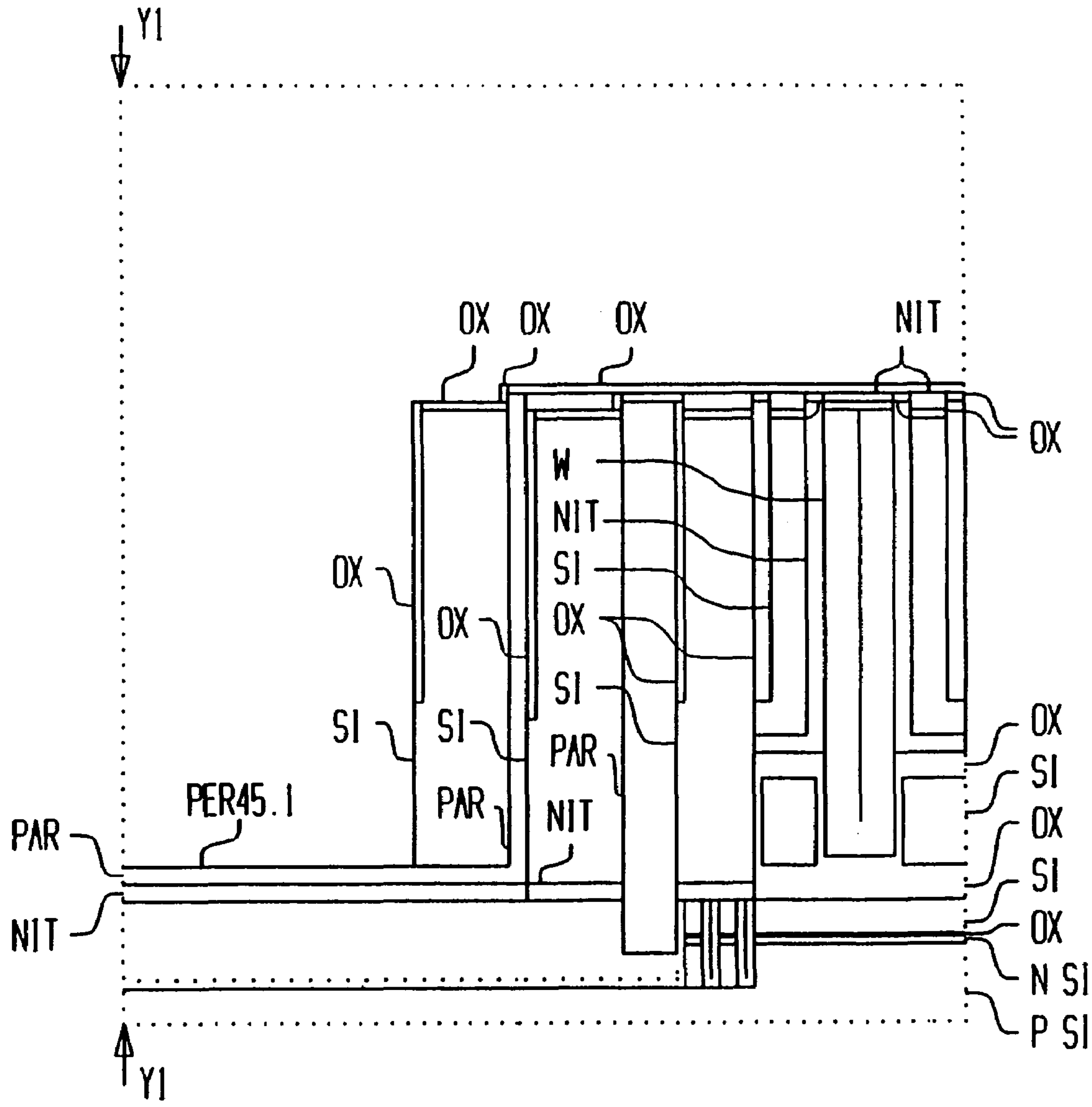

FIG. 548 and FIG. 549 illustrate a cross-section and length-section, respectively, with the layer of semiconductor material directionally removed from all non-vertical surfaces.

Figure 550:
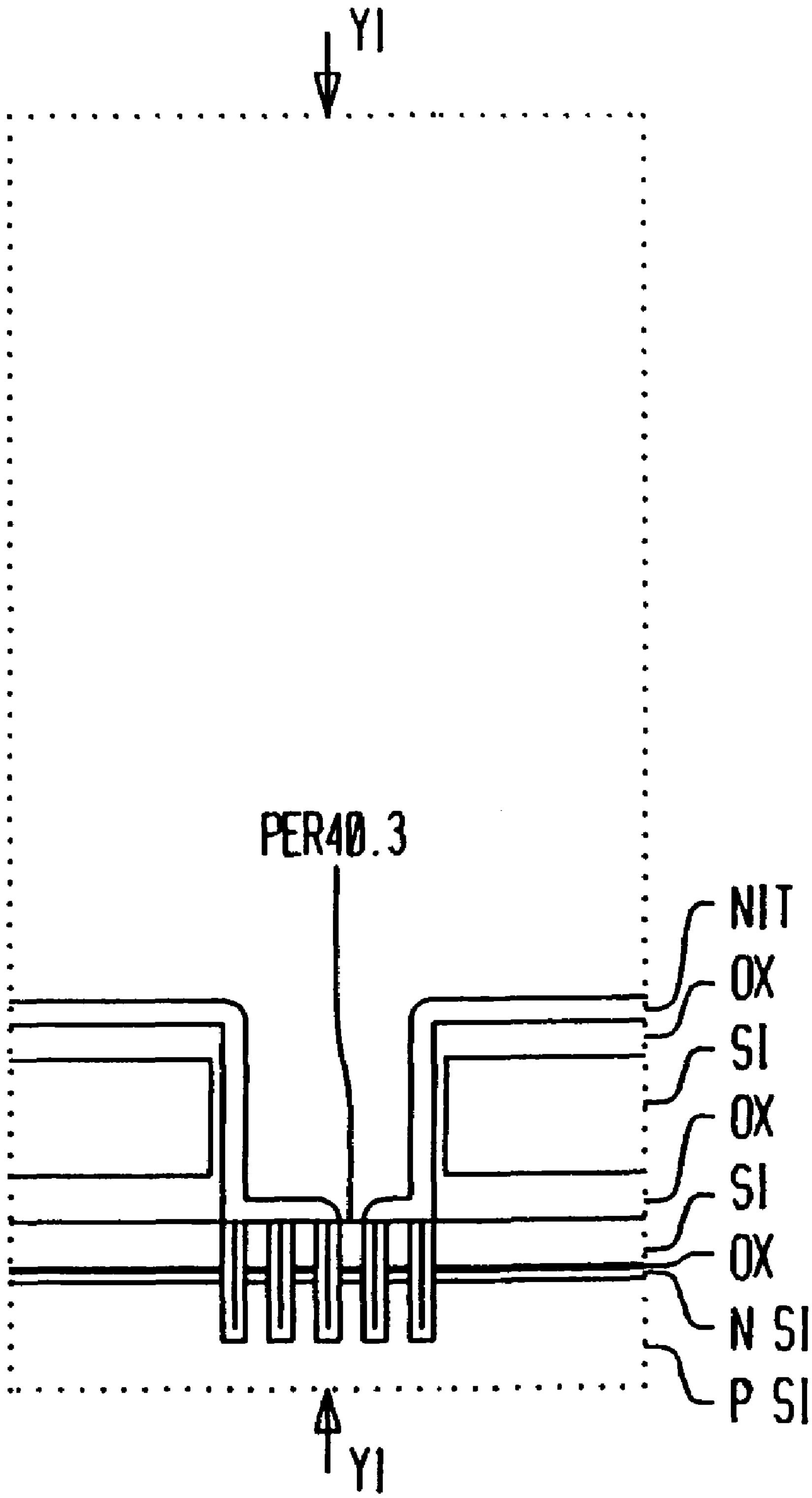
Figure 551:
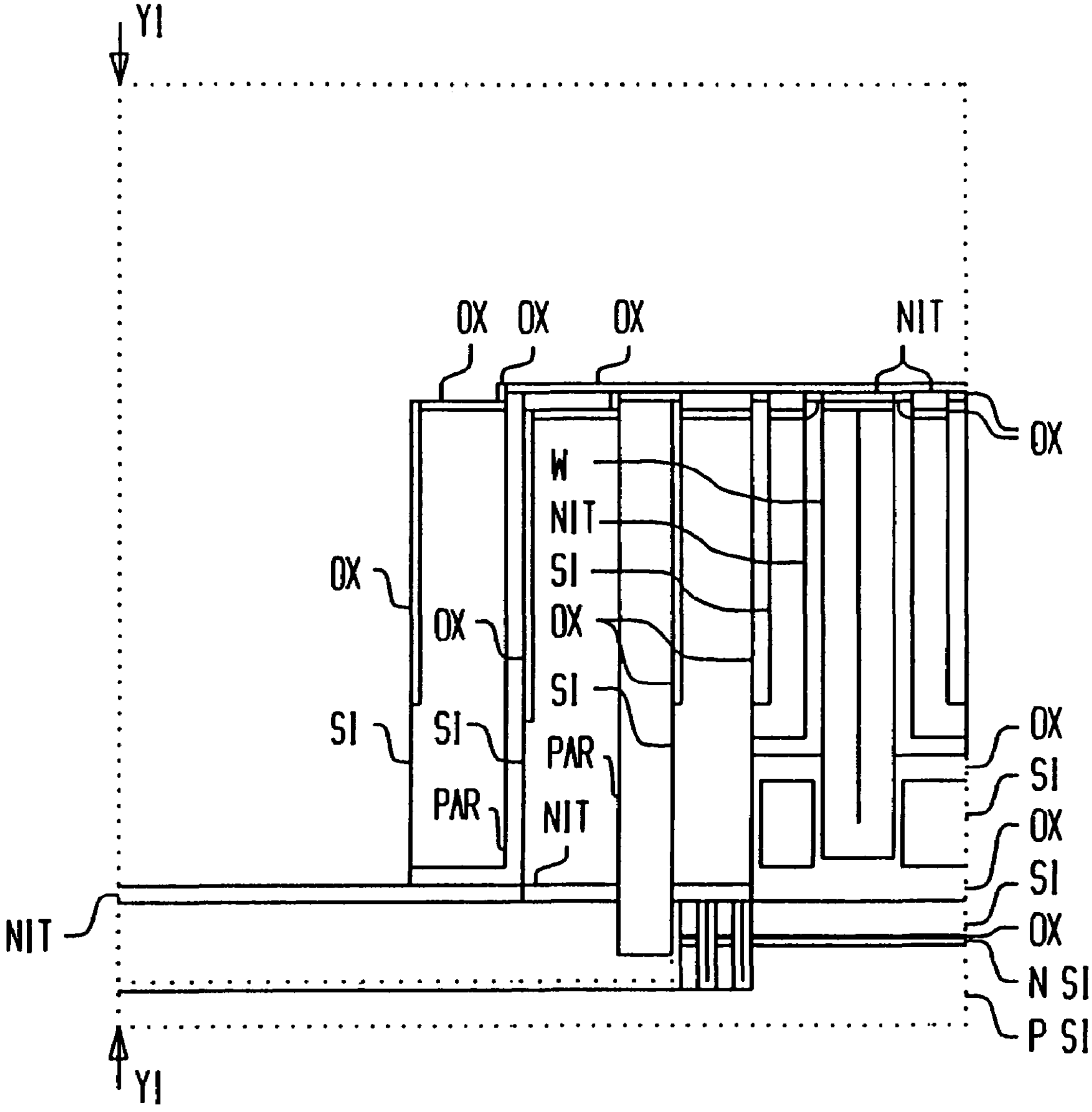

FIG. 550 and FIG. 551 illustrate a cross-section and length-section, respectively, with all exposed second insulating material removed.

Figure 552:
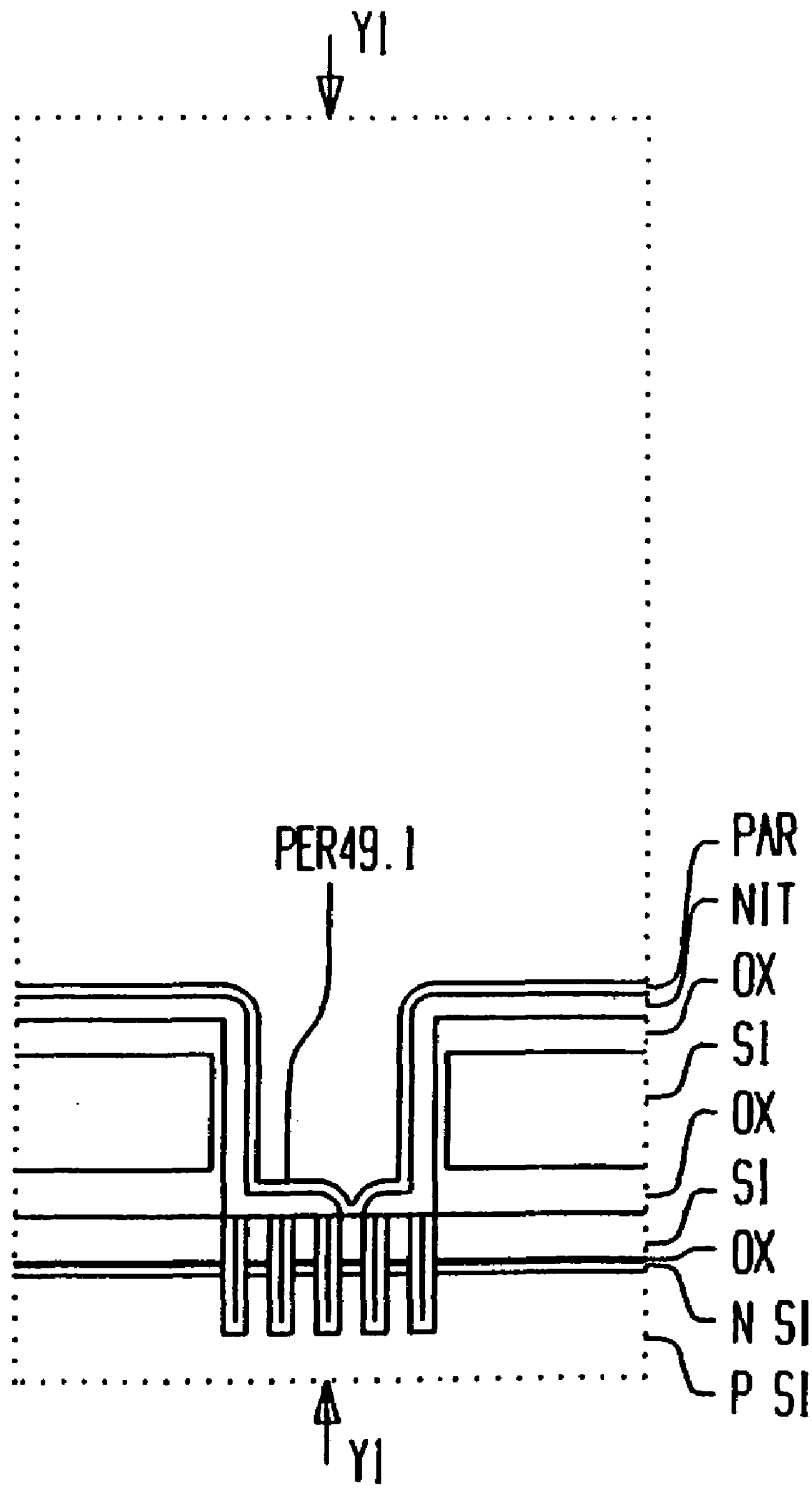
Figure 553:
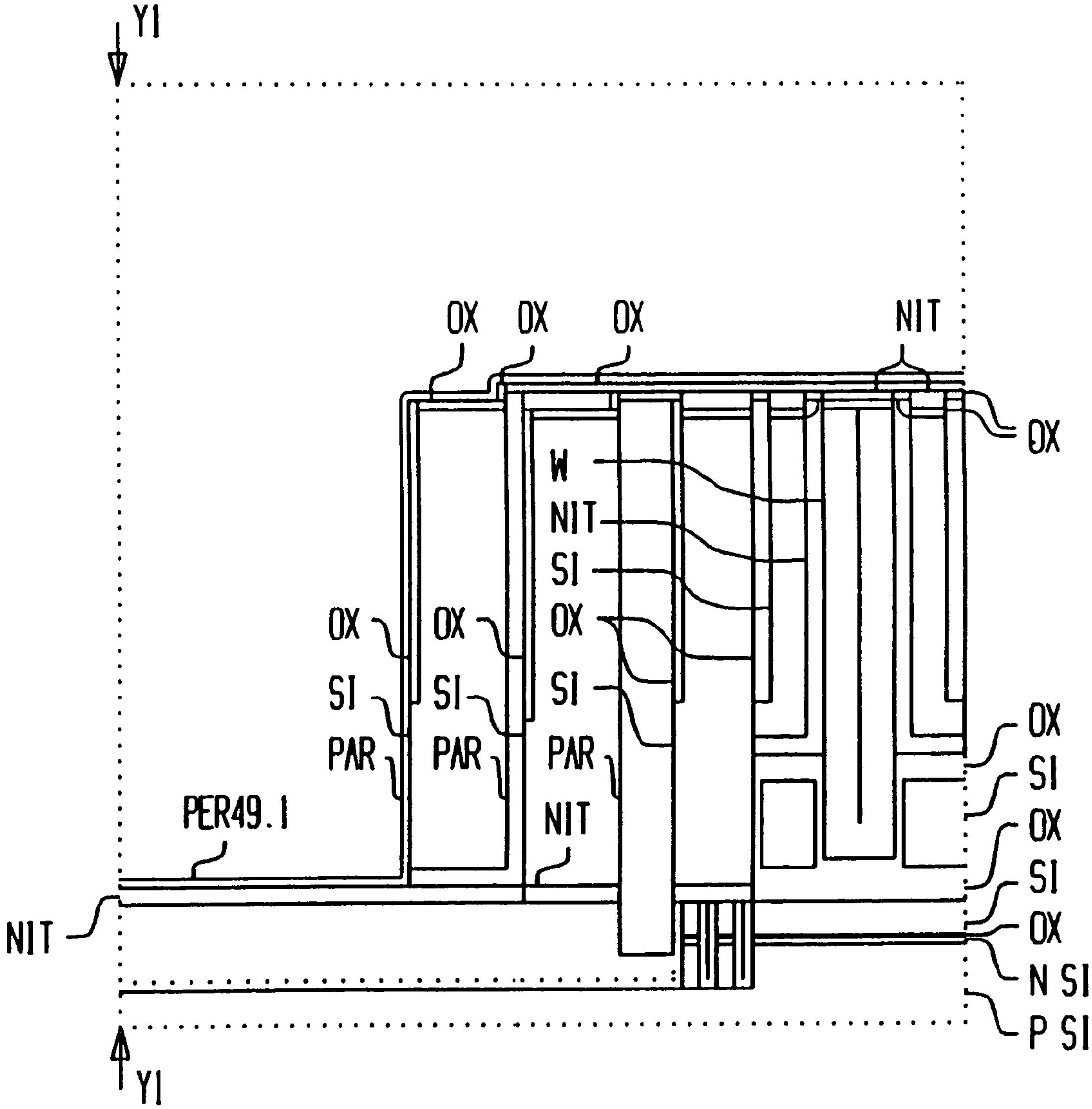

FIG. 552 and FIG. 553 illustrate a cross-section and length-section, respectively, with a new layer of second insulating material deposited everywhere.

Figure 554:
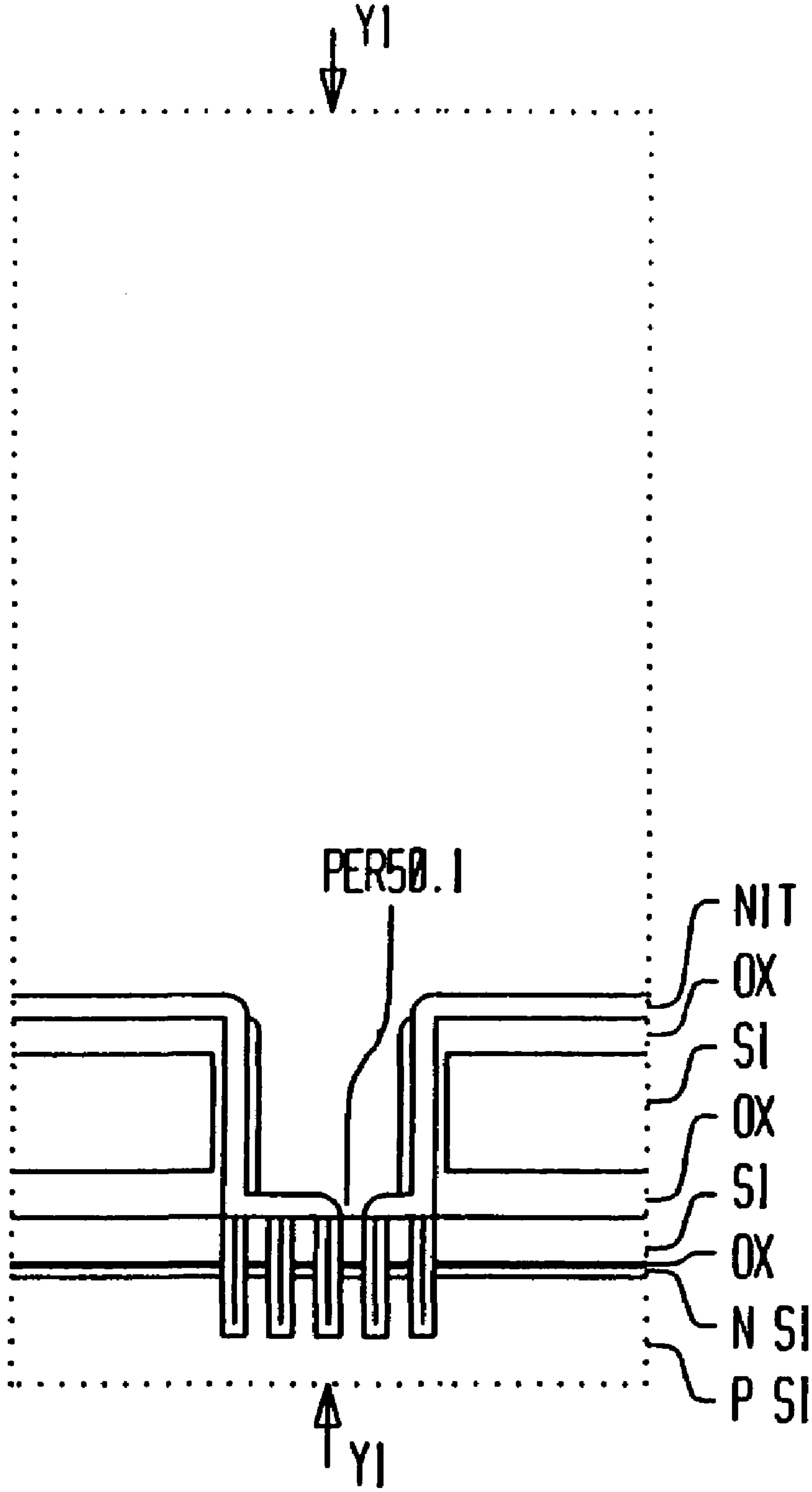
Figure 555:
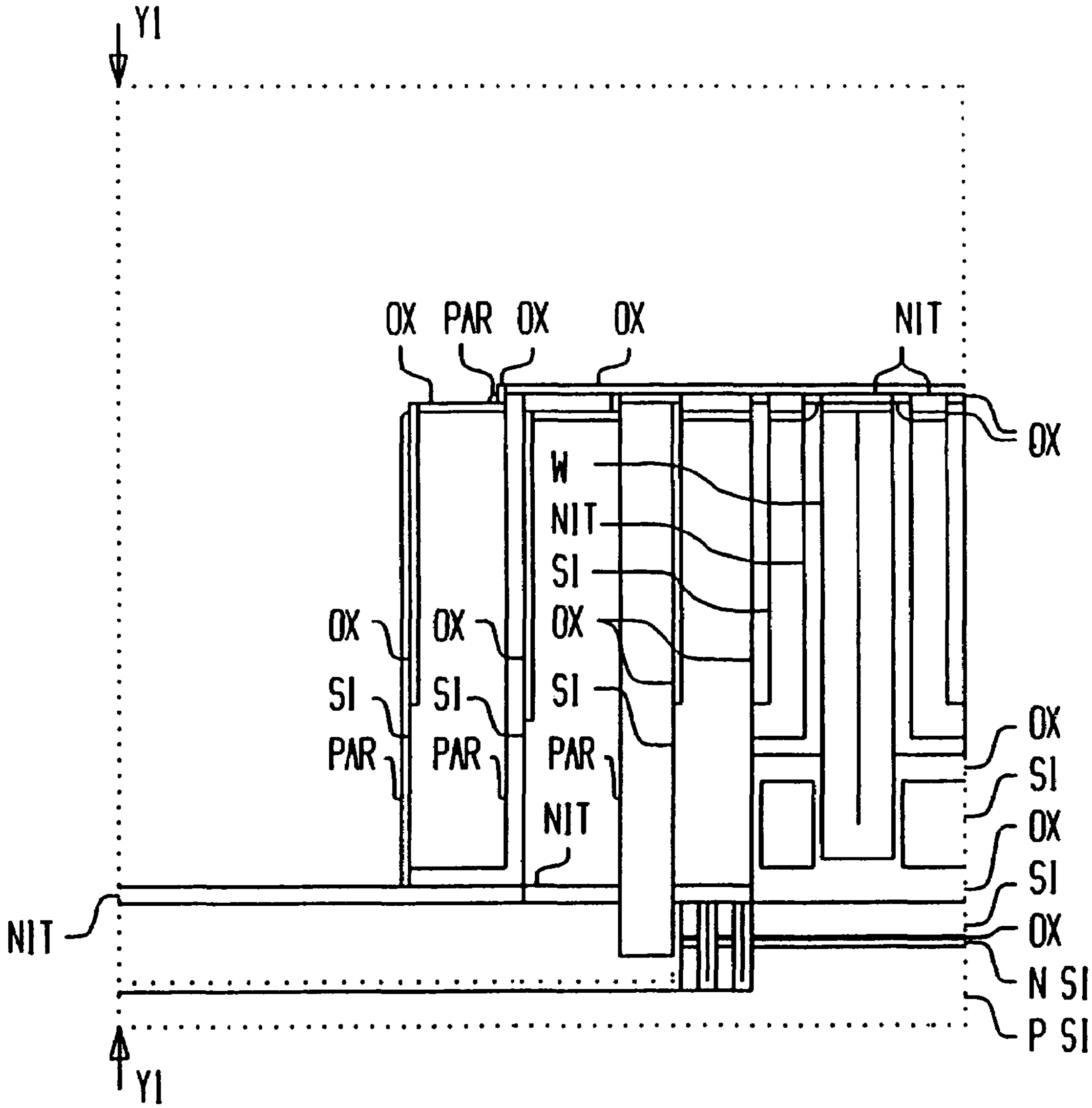

FIG. 554 and FIG. 555 illustrate a cross-section and length-section, respectively, with the new layer of second insulating material removed from all non-vertical surfaces.

Figure 556:
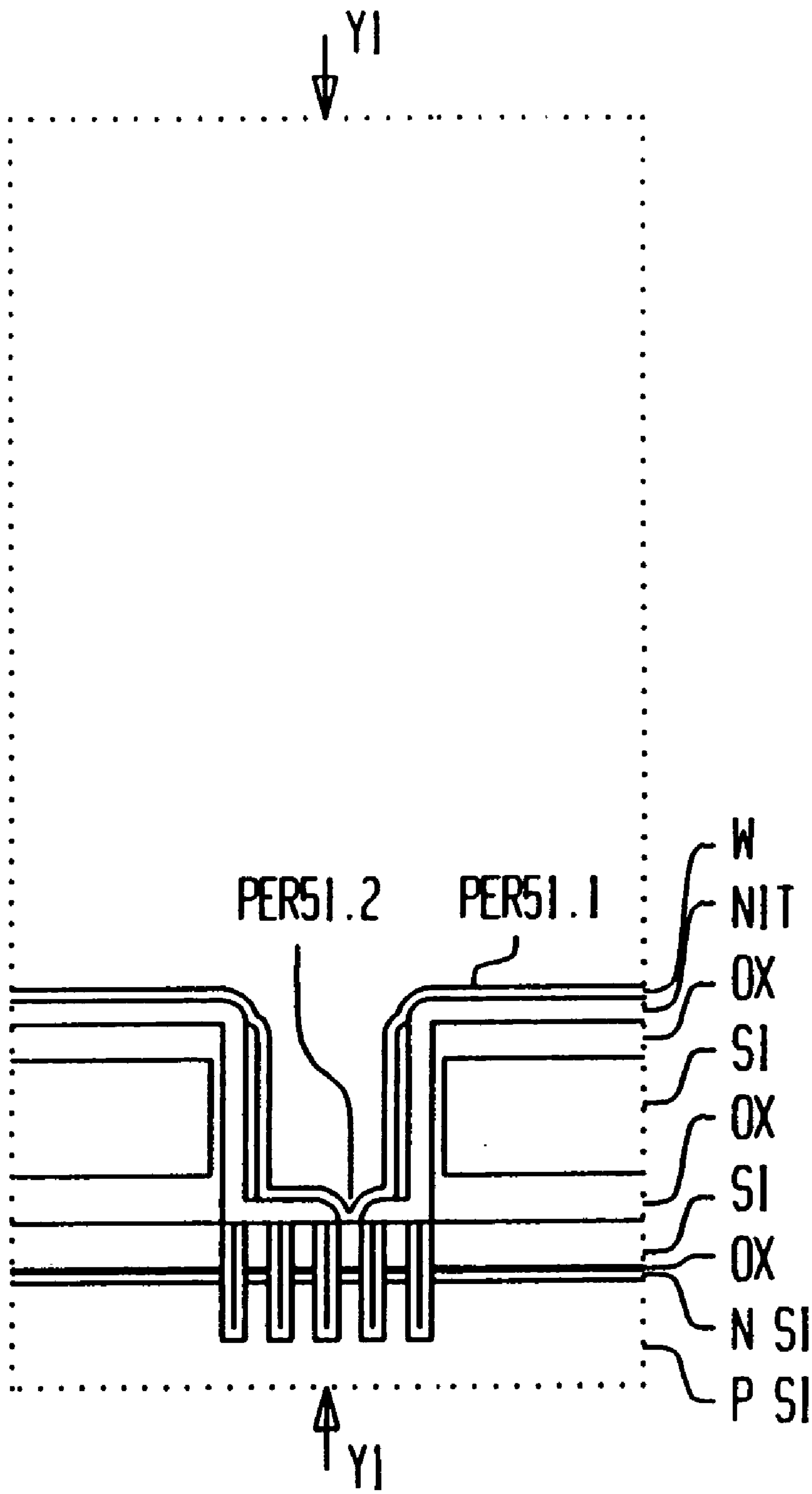
Figure 557:
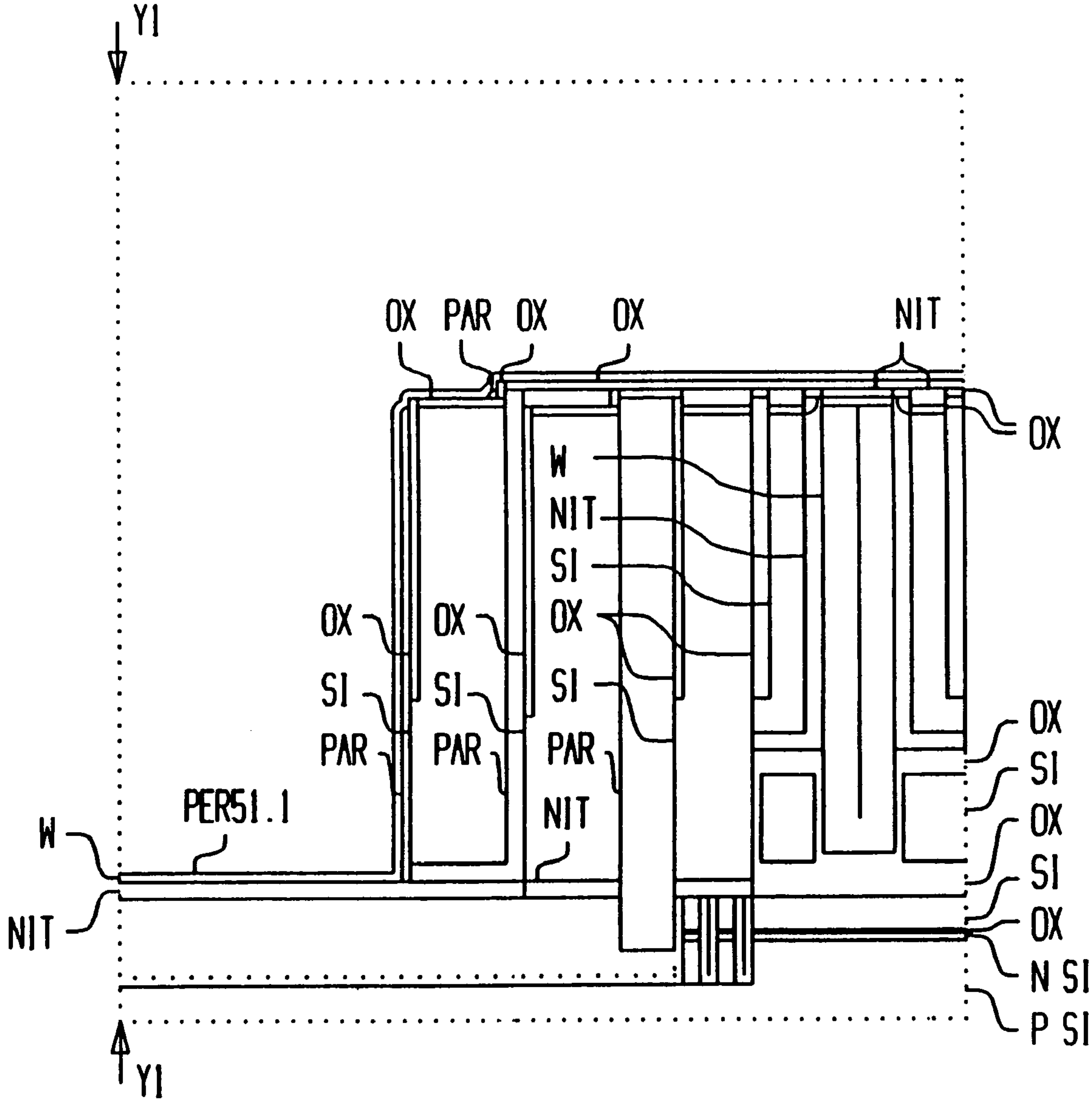

FIG. 556 and FIG. 557 illustrate a cross-section and length-section, respectively, with a layer of metal deposited everywhere.

Figure 558:
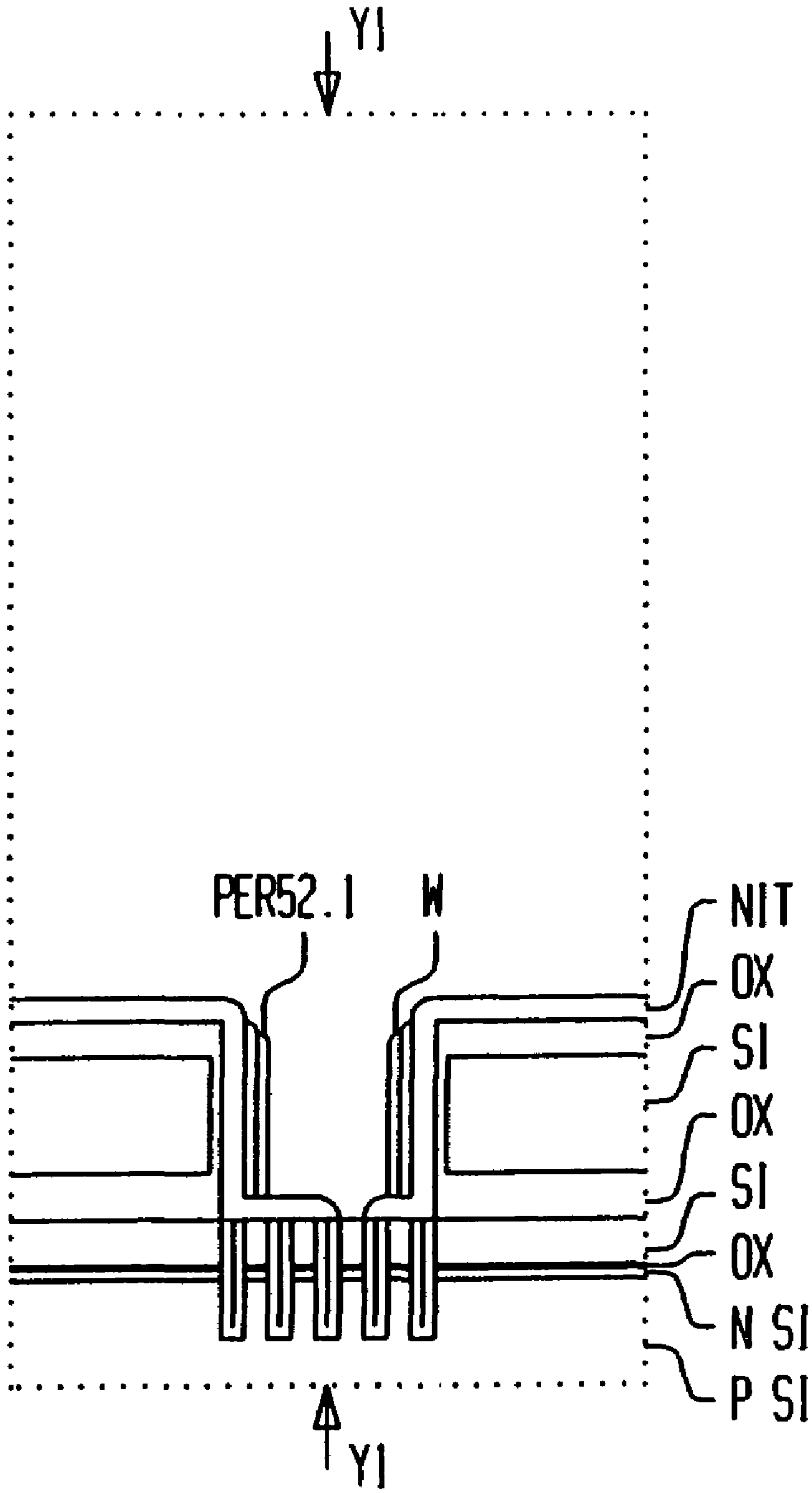
Figure 559:
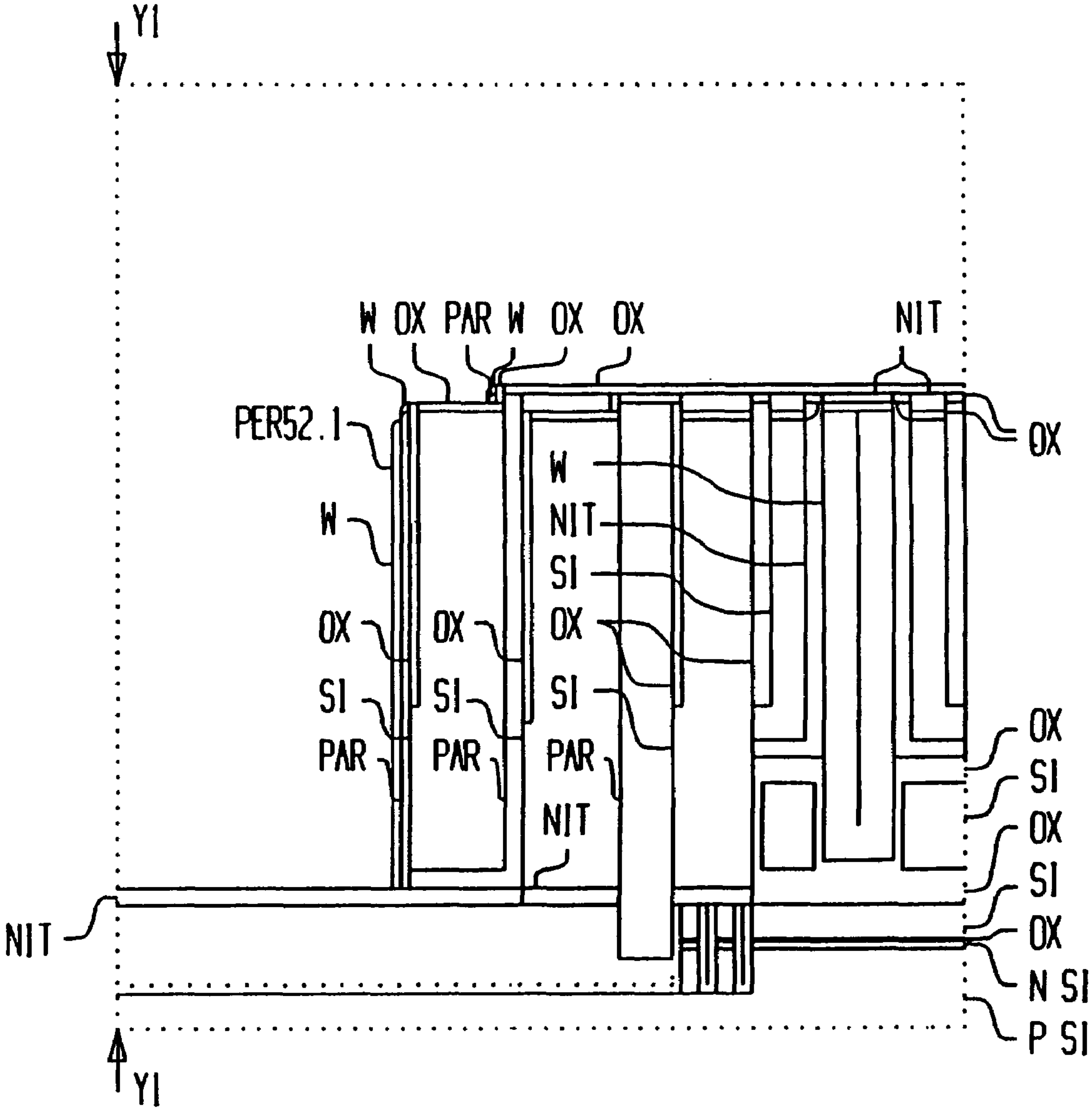

FIG. 558 and FIG. 559 illustrate a cross-section and length-section, respectively, with the metal layer removed from all non-vertical surfaces.

Figure 560:
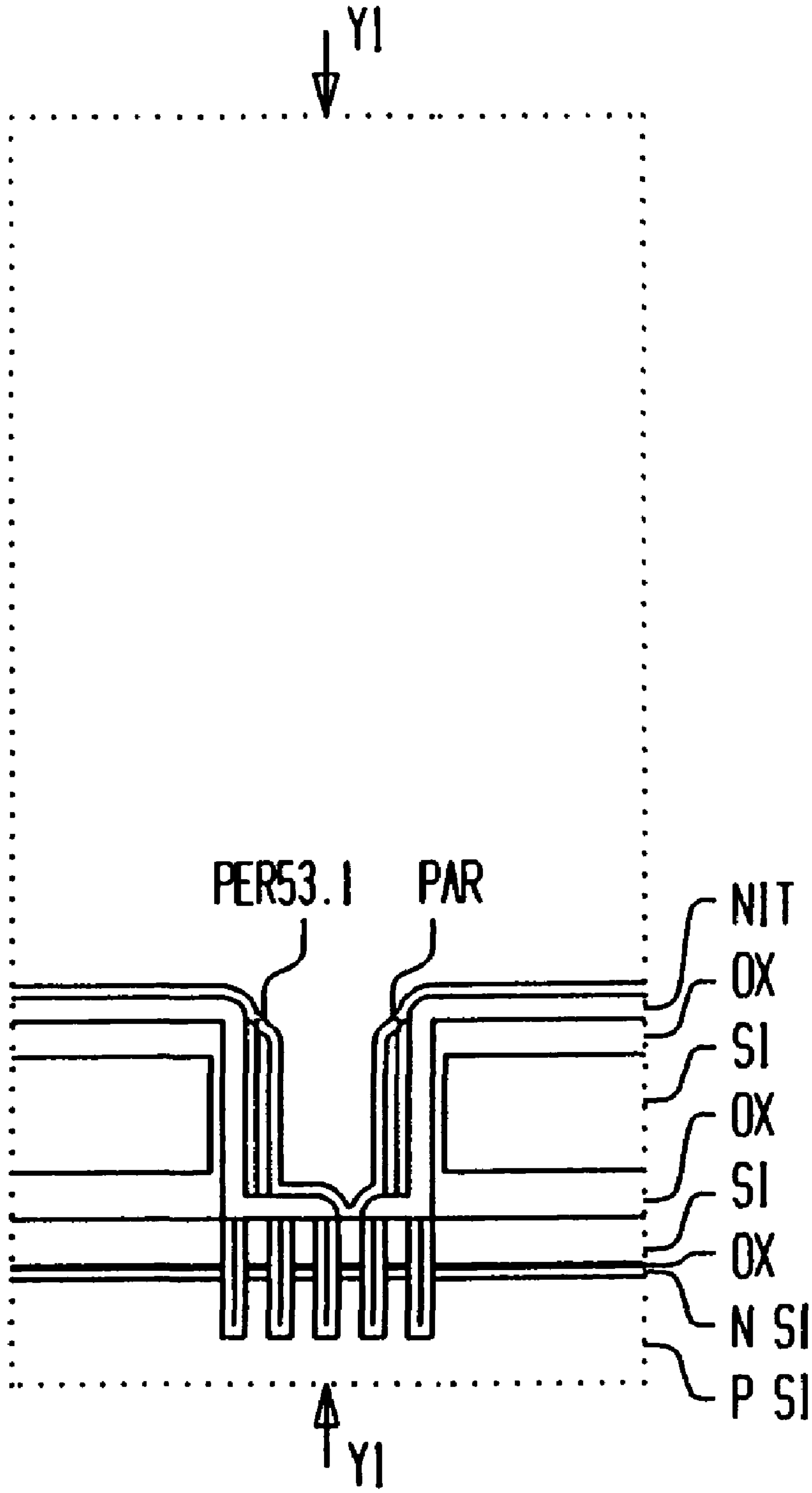
Figure 563:
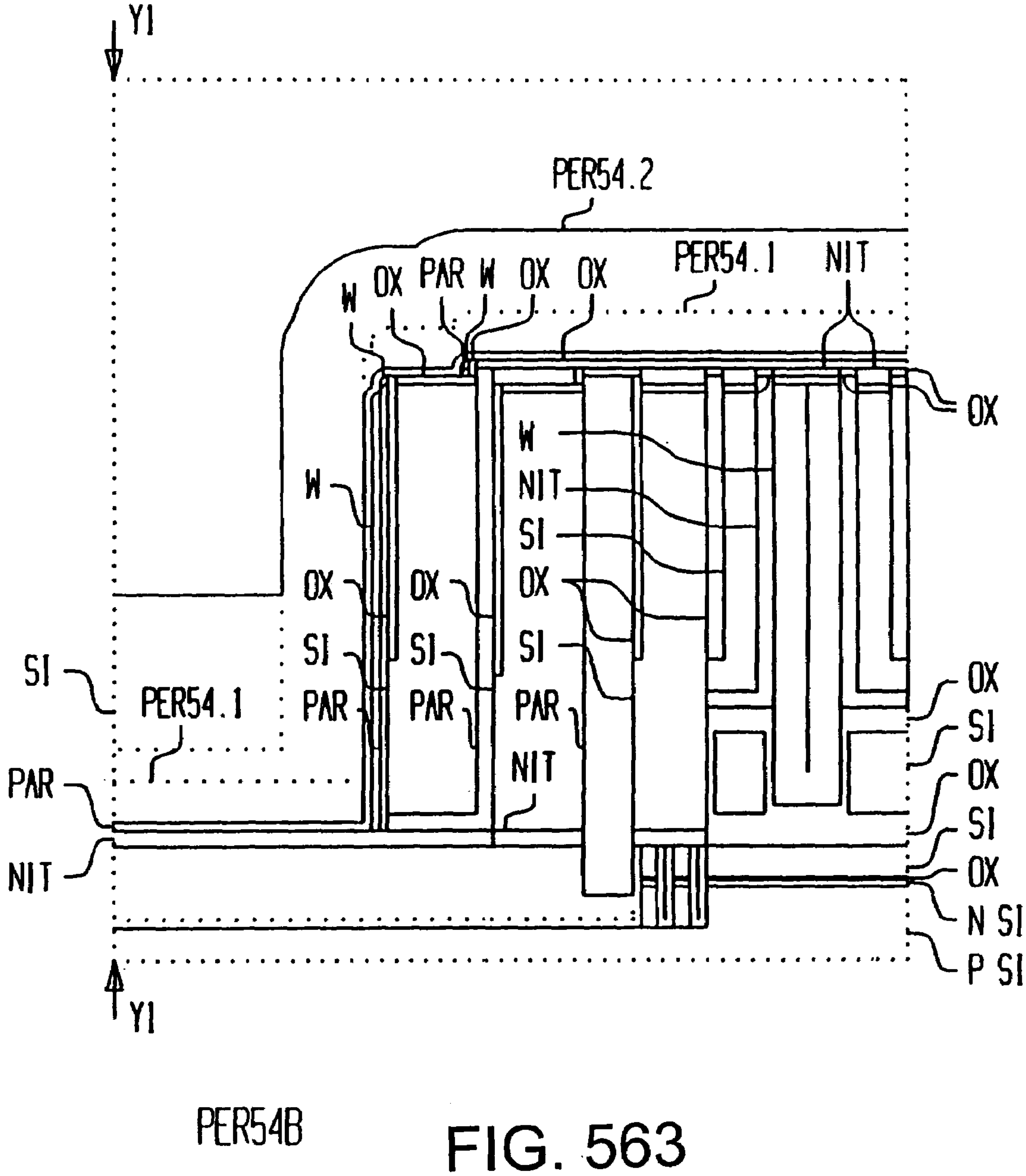

FIG. 560 and FIG. 563 illustrate a cross-section and length-section, respectively, with a layer of second insulating material deposited everywhere.

Figure 562:
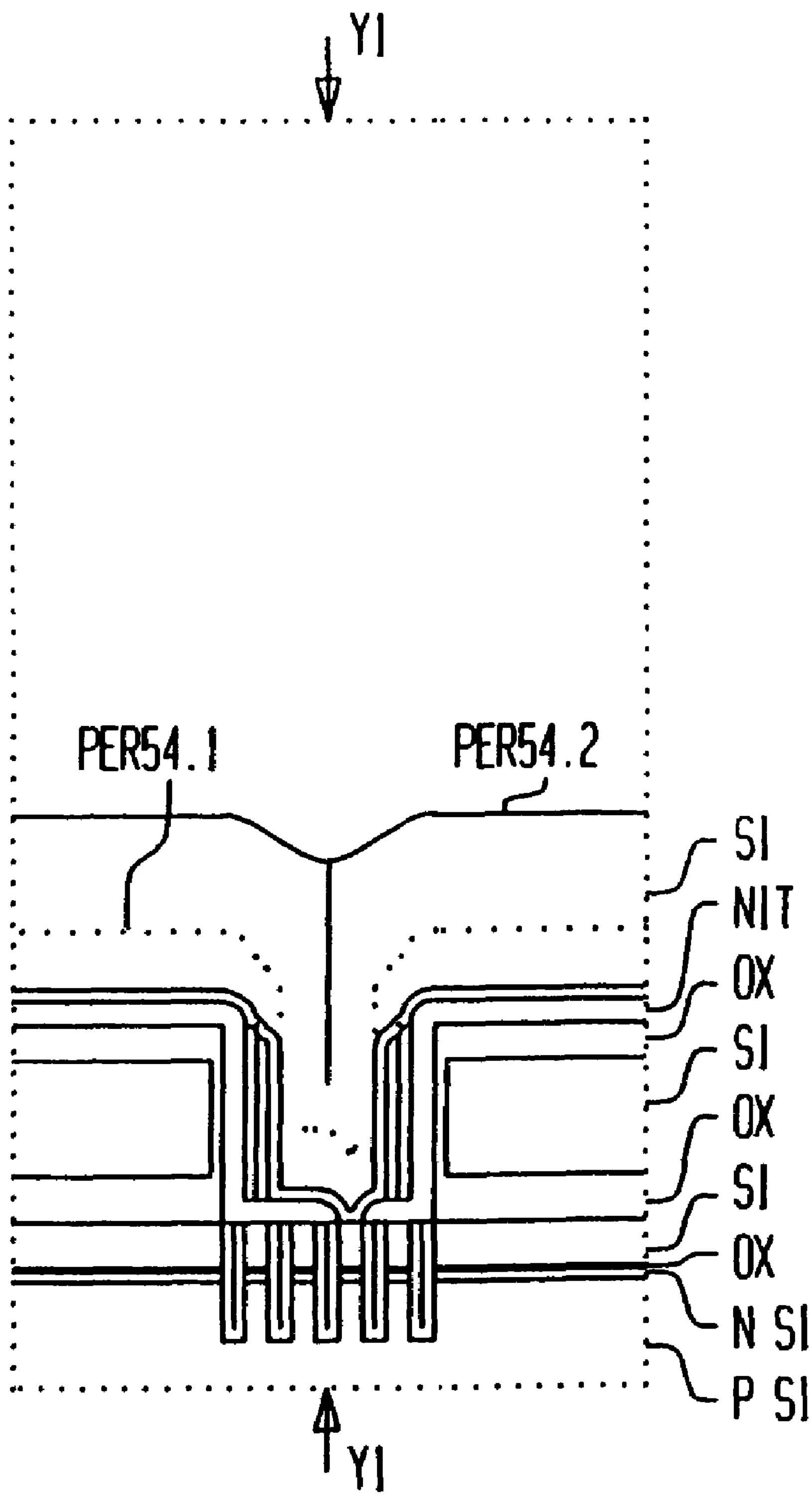

FIG. 562 and FIG. 563 illustrate a cross-section and length-section, respectively, with two subsequent layers of controlled thickness of semiconductor material deposited.

Figure 564:
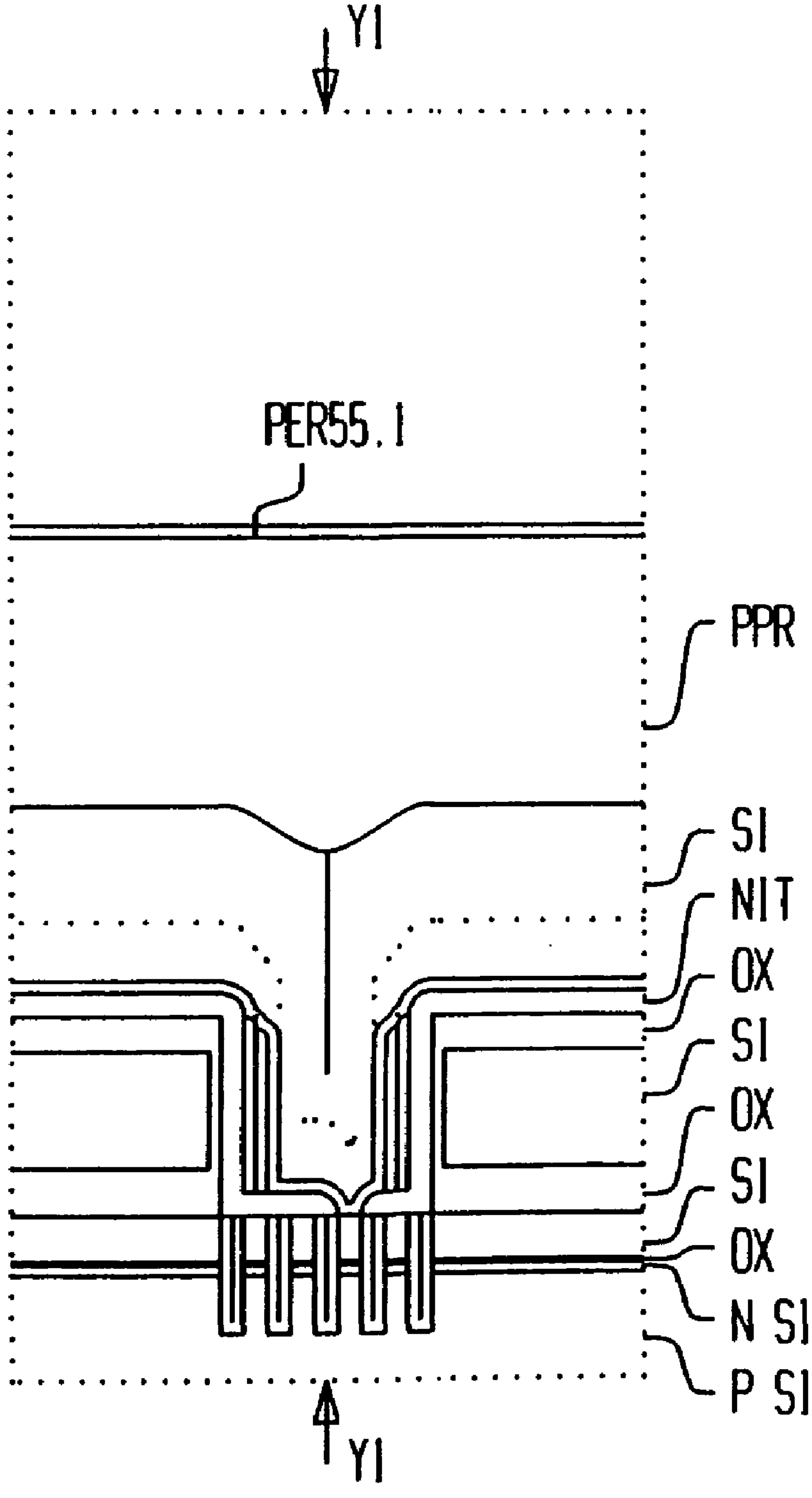
Figure 565:
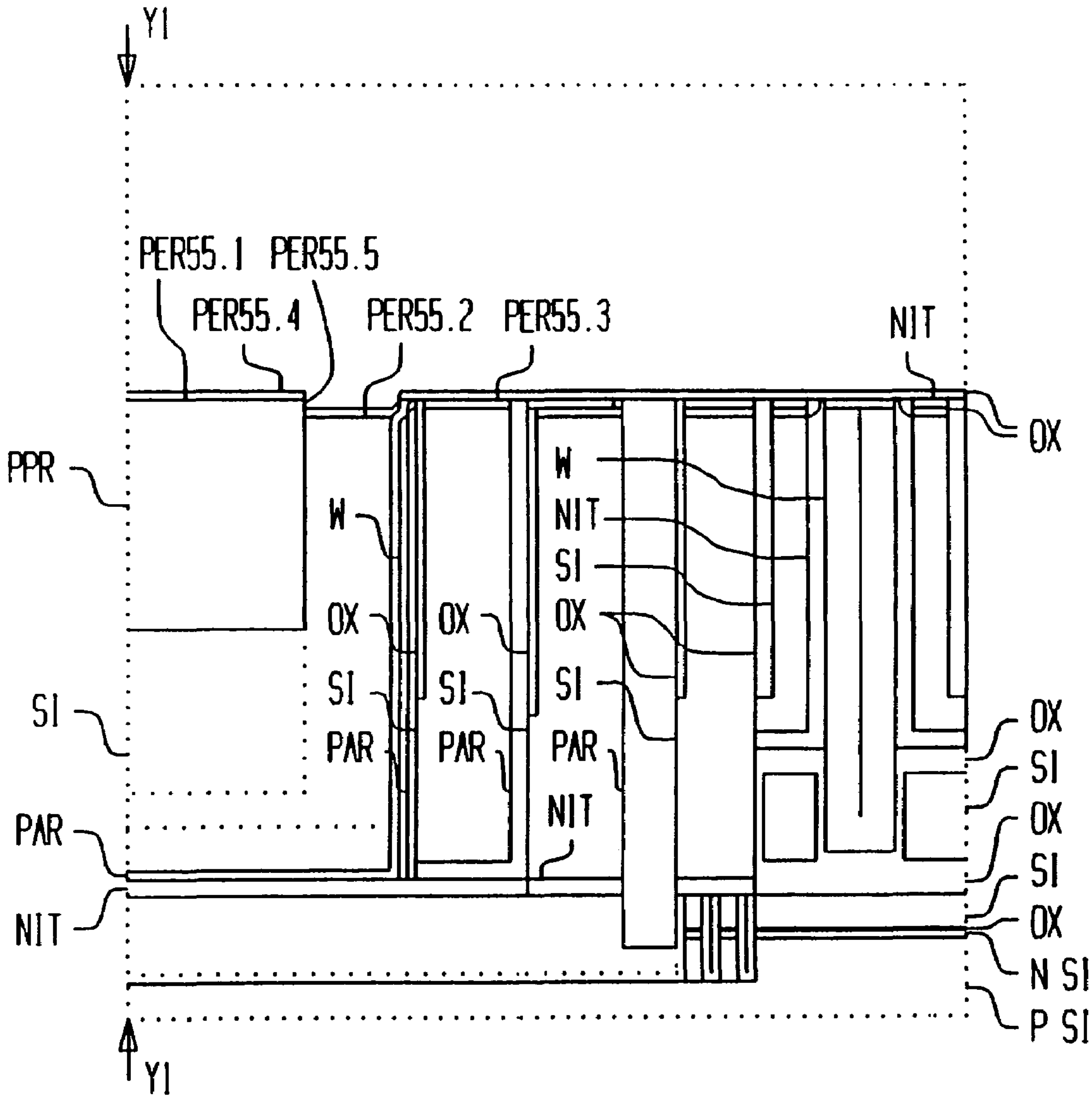

FIG. 564 and FIG. 565 illustrate a cross-section and length-section, respectively, with the region surrounding the wall filled with a filler material, the top surface planarized, the exposed semiconductor material surfaces etched back and all top surfaces vertically covered with first insulating material.

Figure 566:
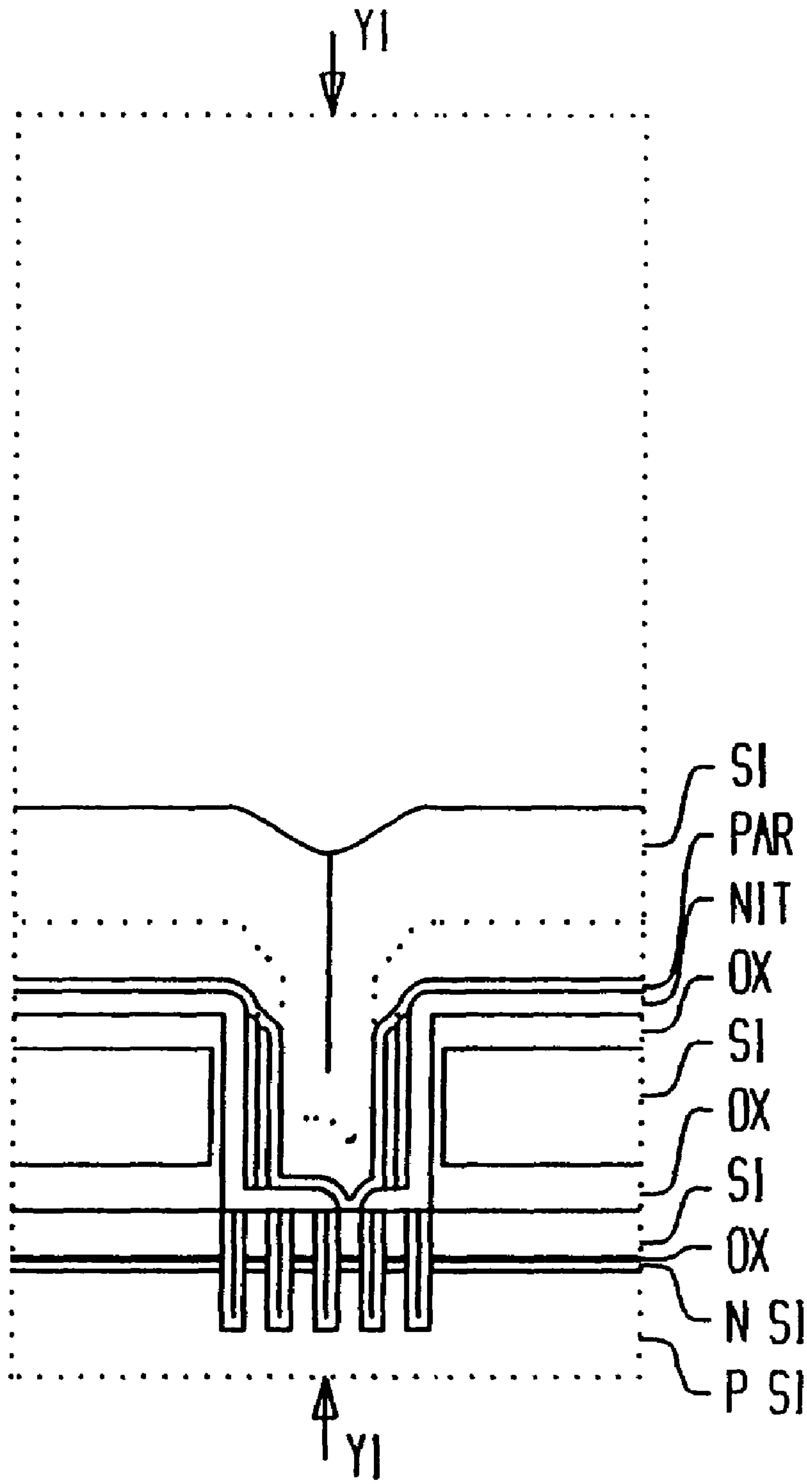
Figure 567:
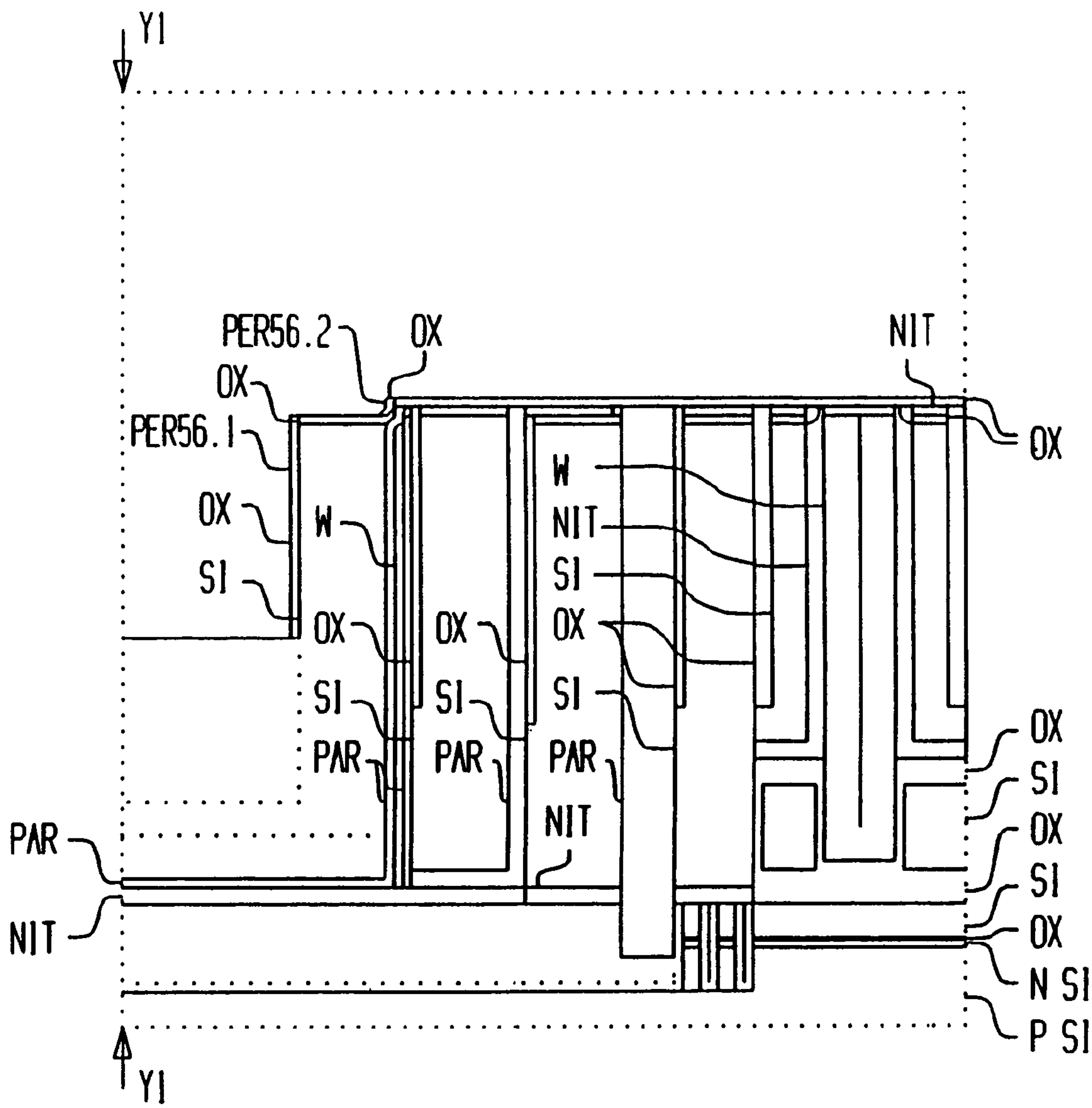

FIG. 566 and FIG. 567 illustrate a cross-section and length-section, respectively, with the filler material removed, and with the left side of the wall coated with first insulating material.

Figure 568:
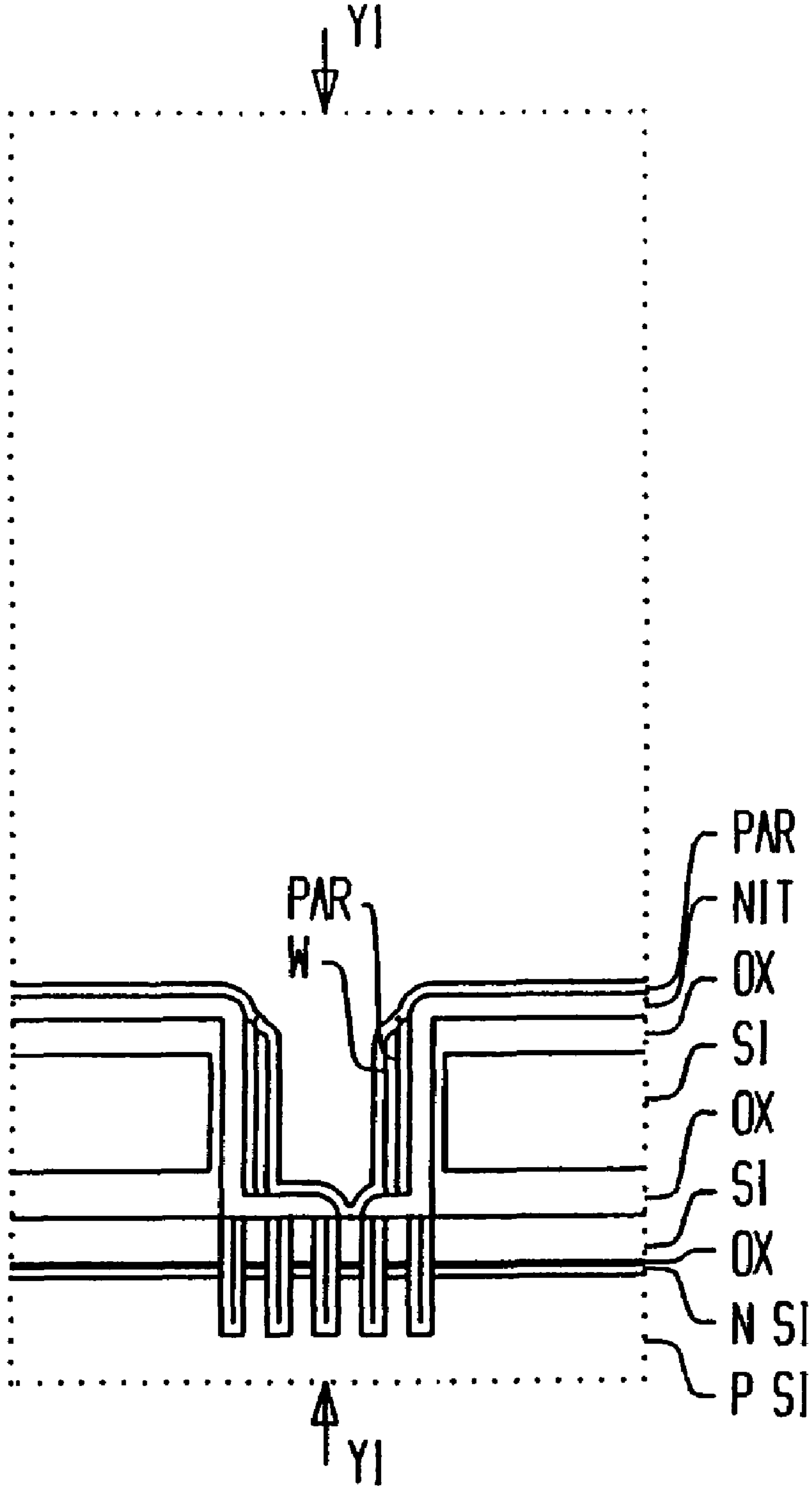
Figure 569:
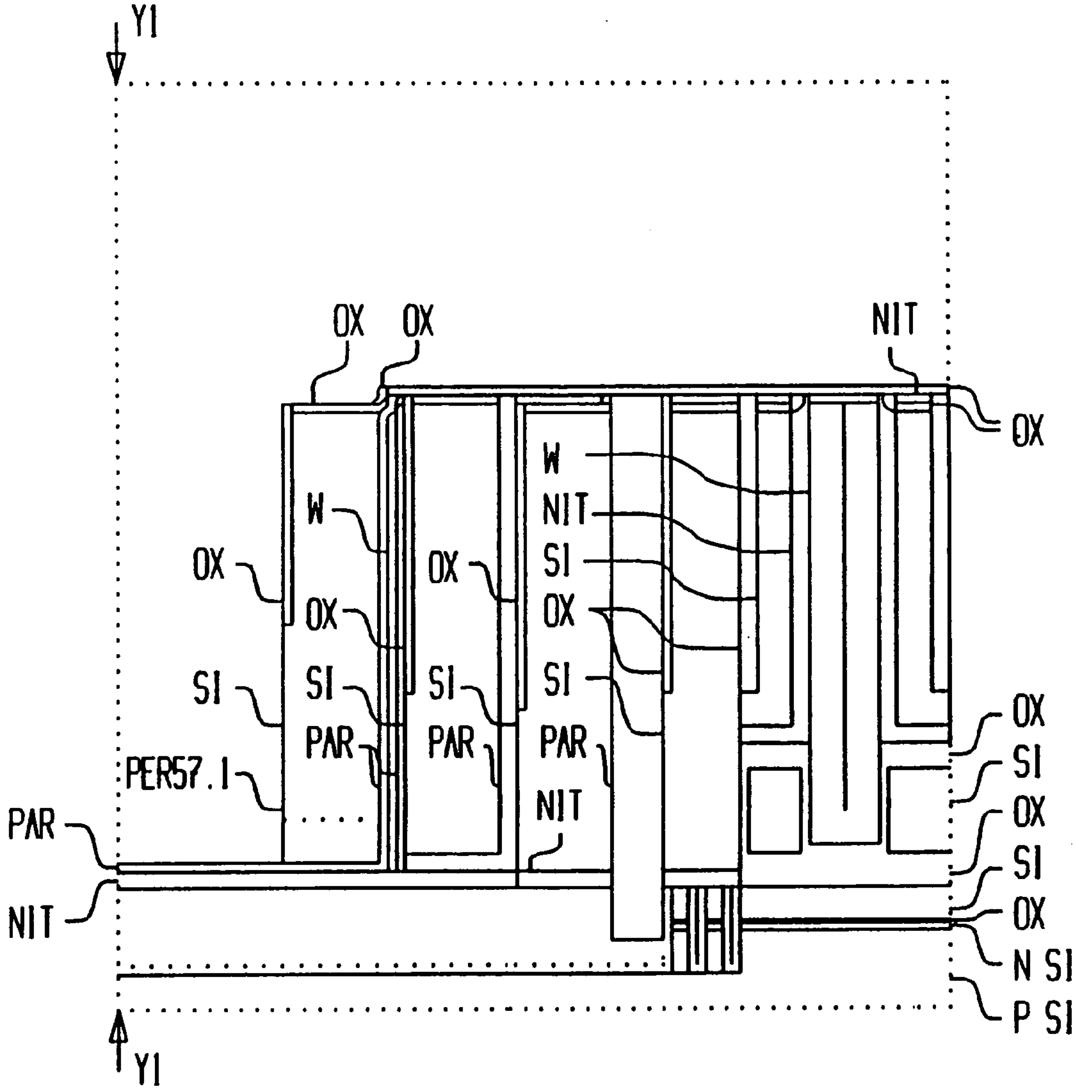

FIG. 568 and FIG. 569 illustrate a cross-section and length-section, respectively, with the layer of semiconductor material directionally removed from all non-vertical surfaces.

Figure 570:
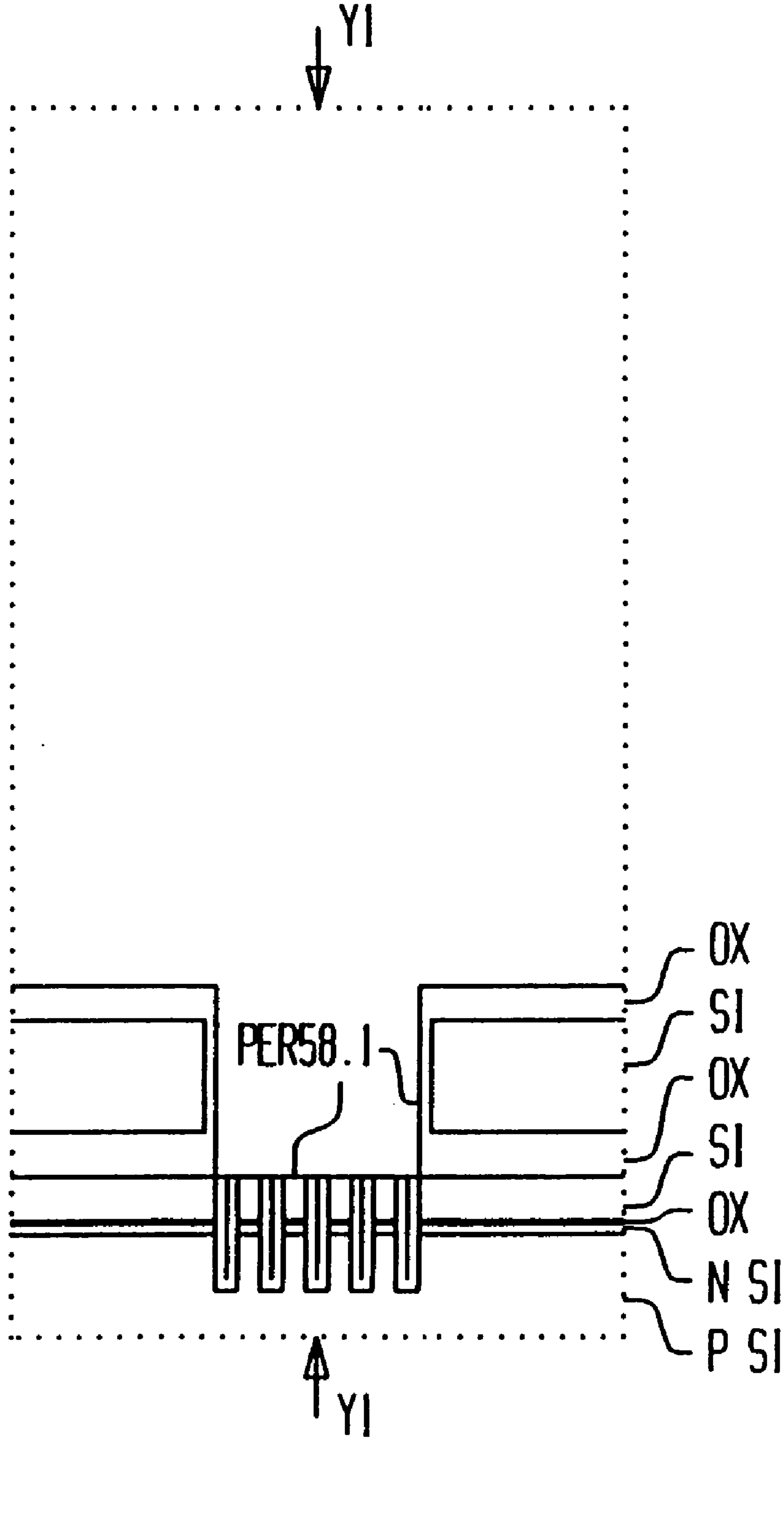
Figure 571:
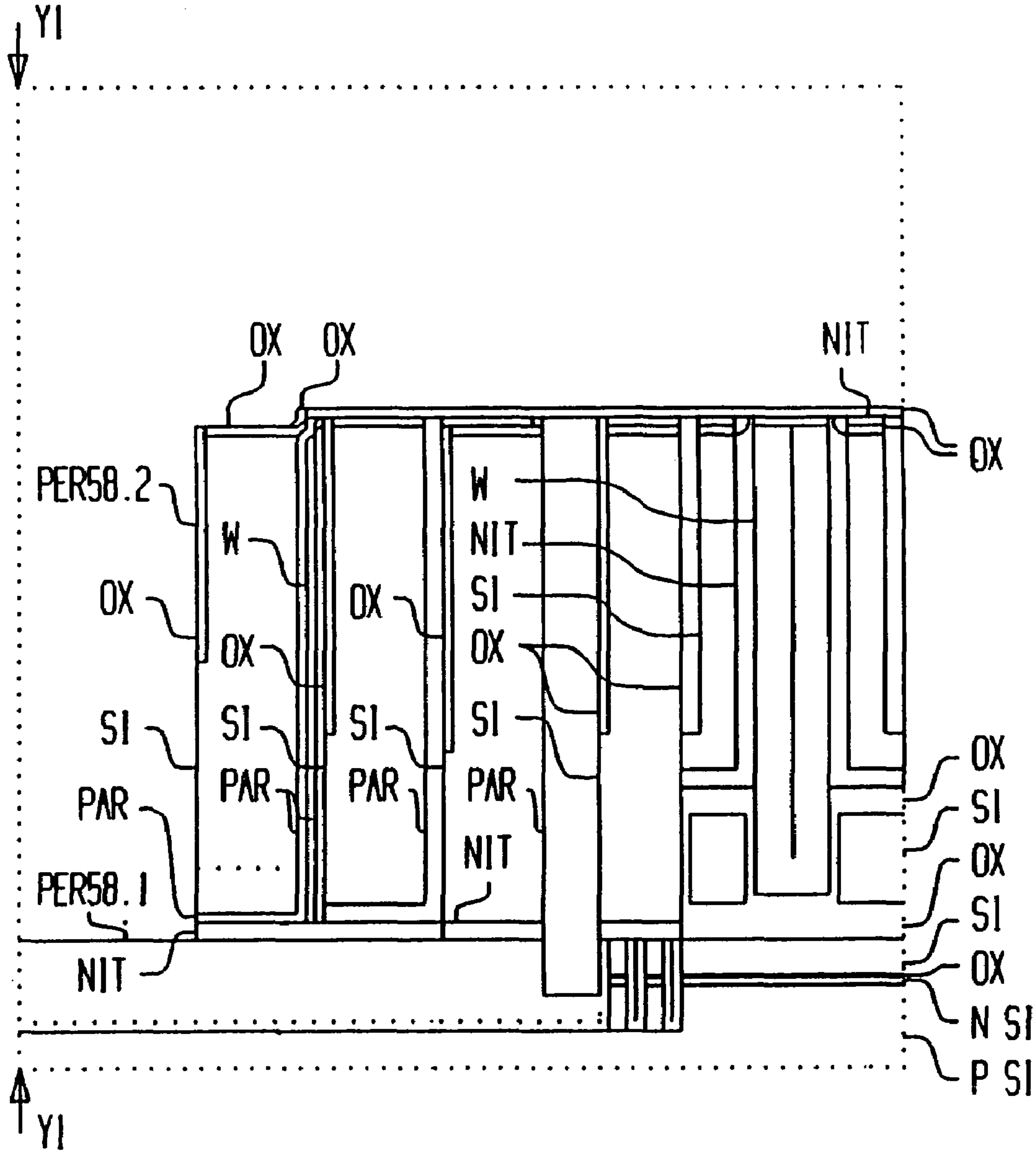

FIG. 570 and FIG. 571 illustrate a cross-section and length-section, respectively, with, in turn, all exposed second insulating material, metal, second and third insulating materials removed.

Figure 572:
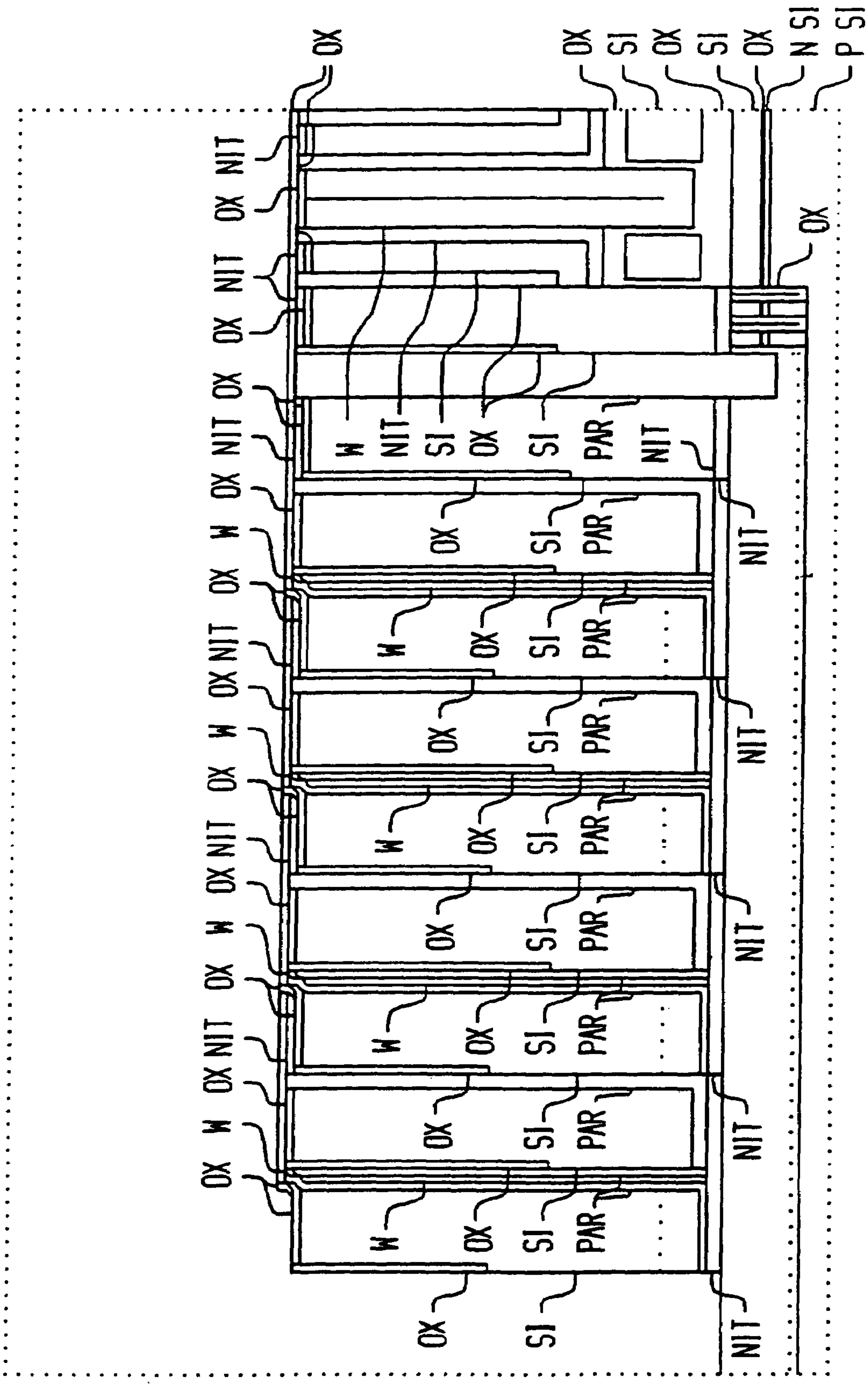

FIG. 572 illustrates a length-section where the steps illustrated from FIG. 540 and FIG. 541 to FIG. 570 and FIG. 571 have been repeated three more times, with certain variations.

Figure 573:
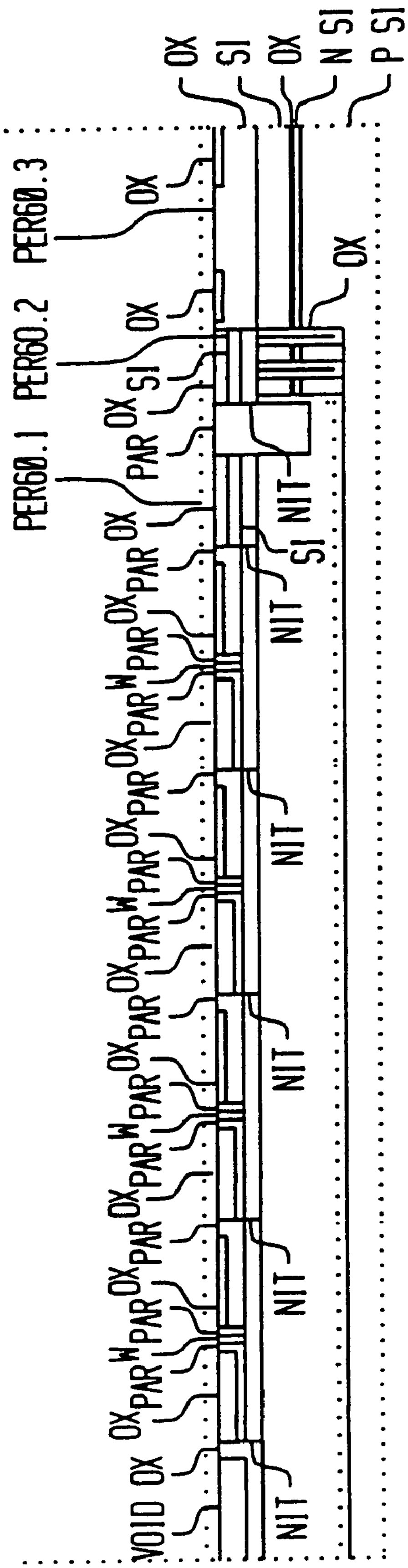

FIG. 573 illustrates a length-section, with the wall planarized away to expose the mosaic of regions of metal and first, second and third insulating materials.

Figure 574:
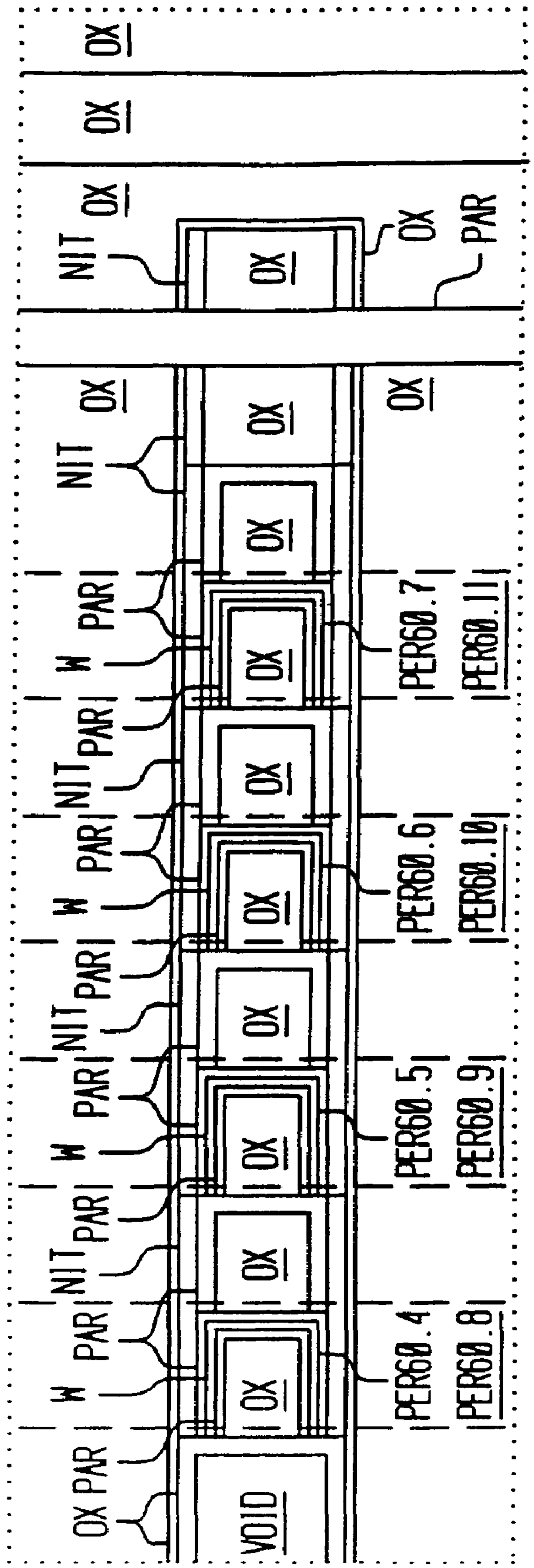

FIG. 574 illustrates the top view of FIG. 574 with the mosaic of exposed regions of metal and first, second and third insulating materials, as well as with suggested metal bus traces connecting to the metal regions shown.

Figure 575:
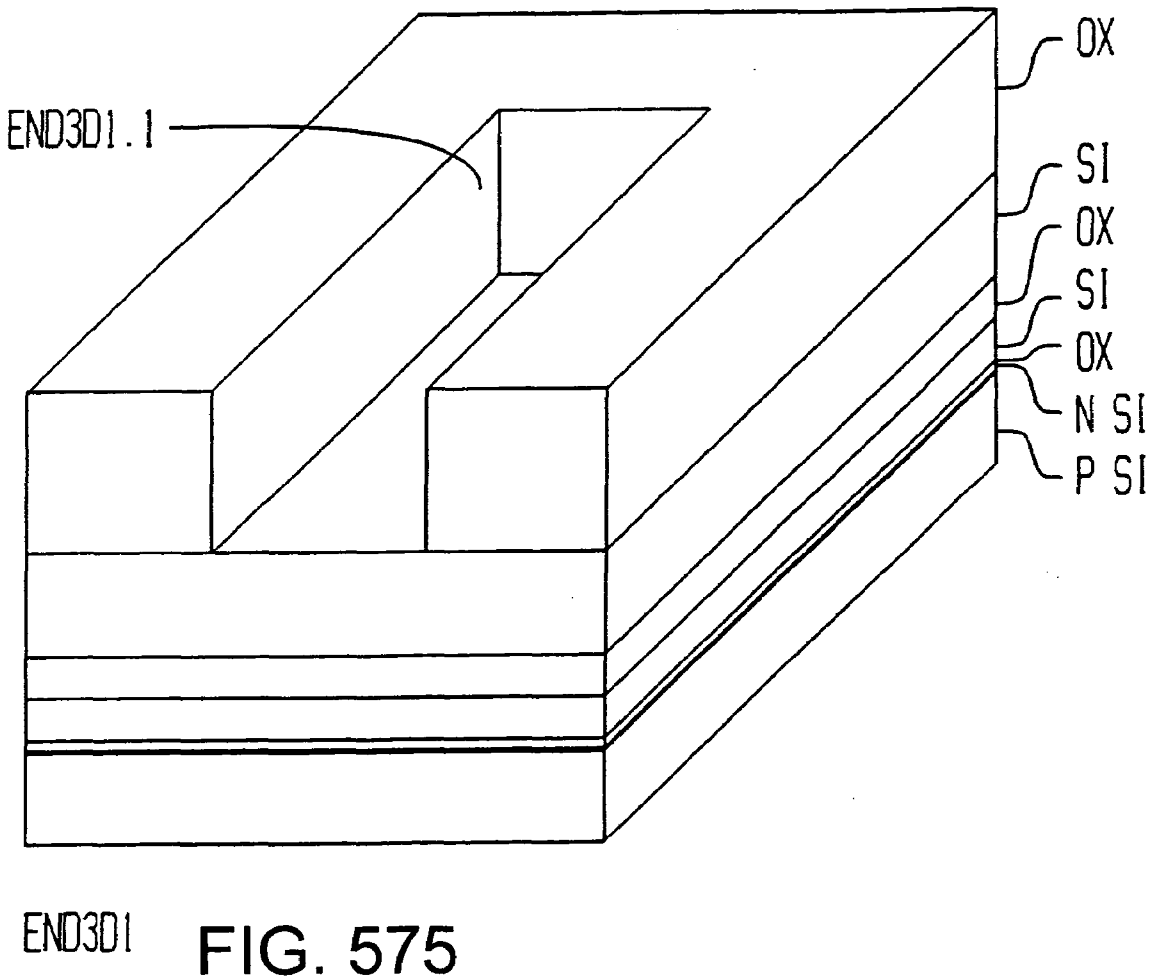

FIG. 575 is a three-dimensional depiction of a small cutaway section of an integrated circuit wafer with an opening in the top layer for forming the end of a trench.

Figure 576:
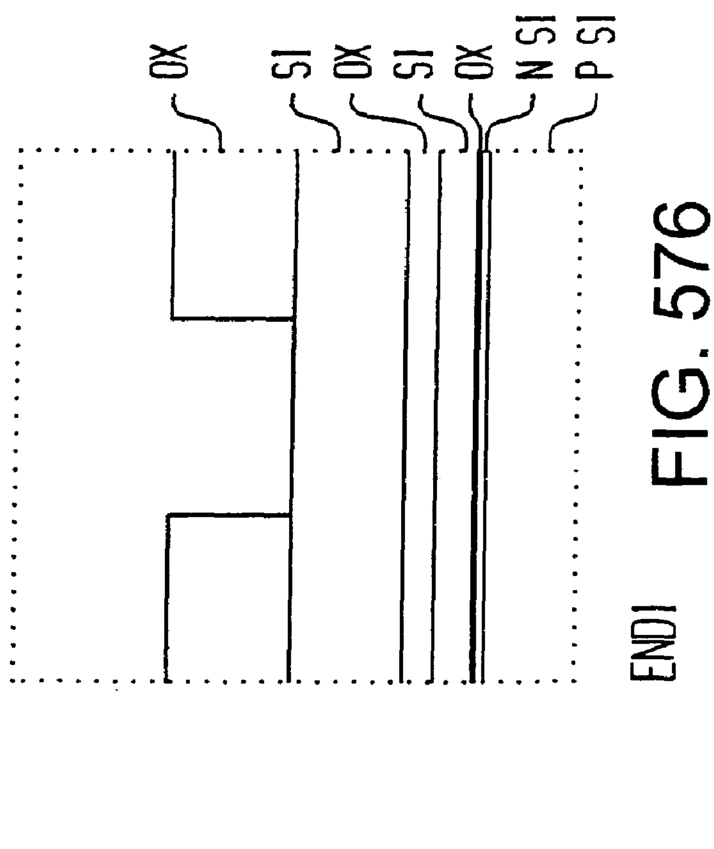

FIG. 576 is a two-dimensional depiction of the front end of FIGS. 573 and 574, i.e., the cross-section of the trench mask.

Figure 577:
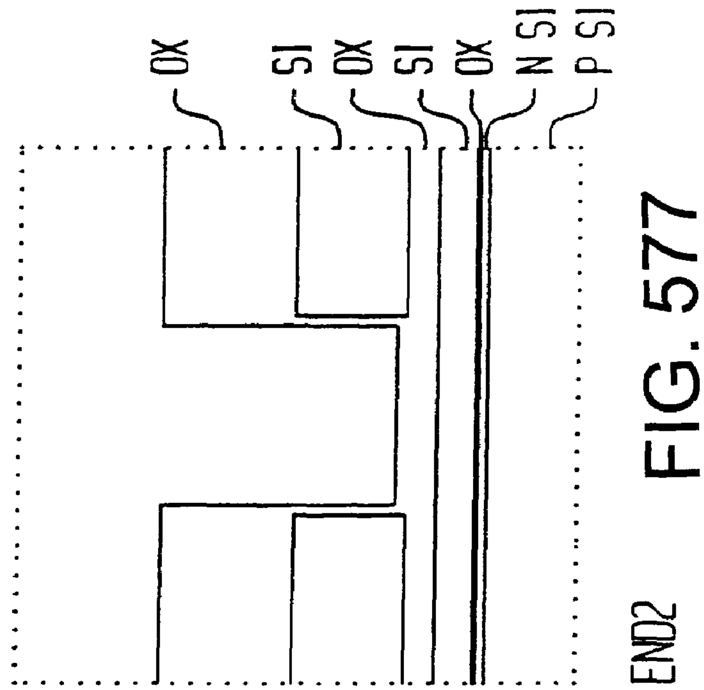

FIG. 577 illustrates the cross-section of the trench etched through the opening in the top layer and coated with a layer of first insulating material.

Figure 578:
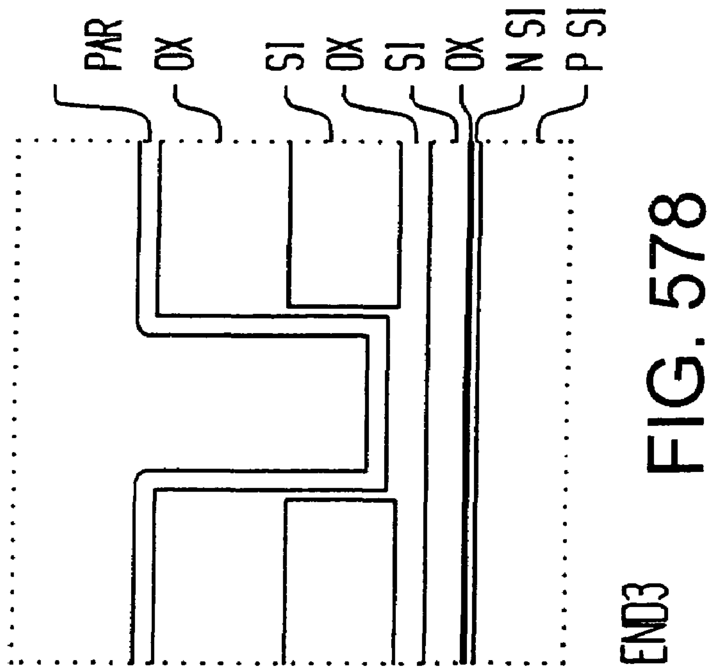

FIG. 578 illustrates the cross-section of the trench further coated with a layer of second insulating material.

Figure 579:
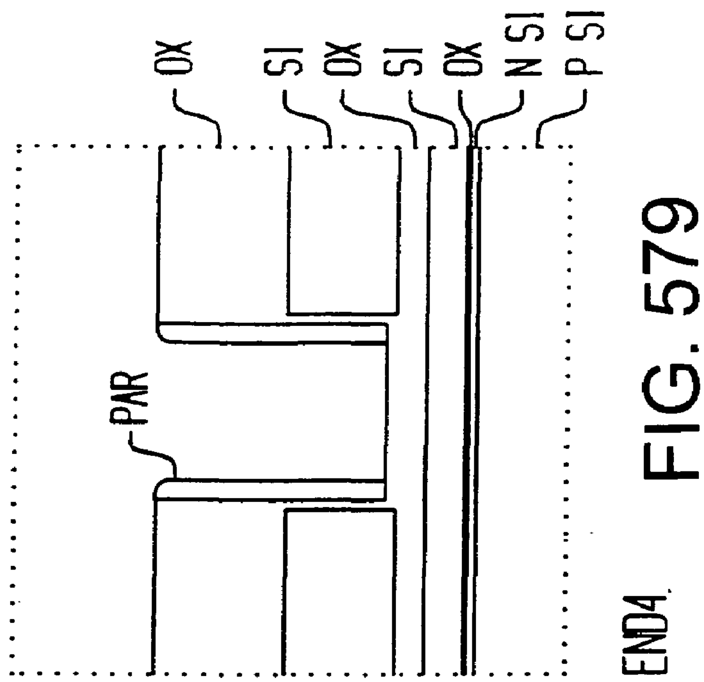

FIG. 579 illustrates the cross-section of the trench with the second insulating material removed from the horizontal surfaces.

Figure 580:
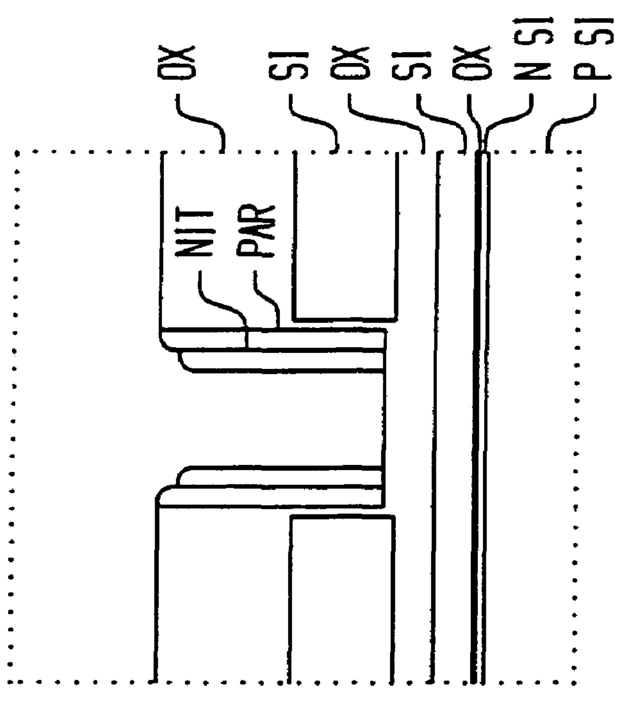

FIG. 580 illustrates the cross-section of the trench with its walls further coated with a layer of a third insulating material.

Figure 581:
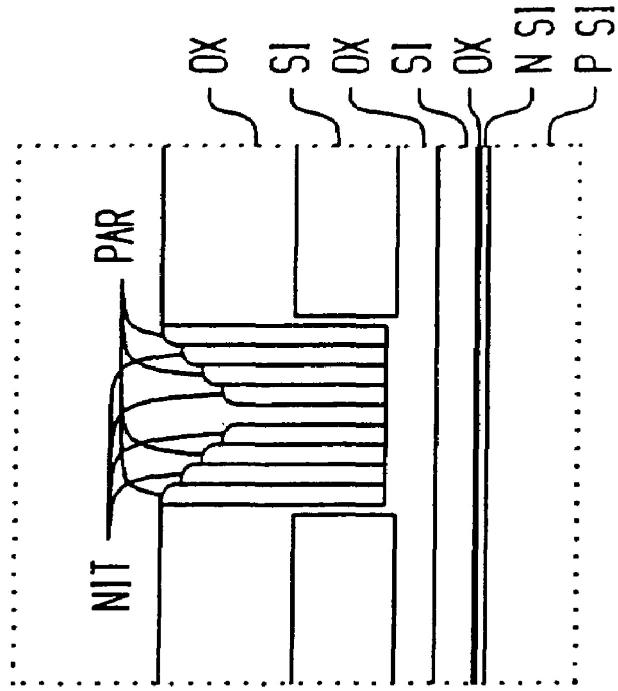

FIG. 581 illustrates the cross-section of the trench with its walls coated with alternating layers of the second and a third insulating material.

Figure 582:
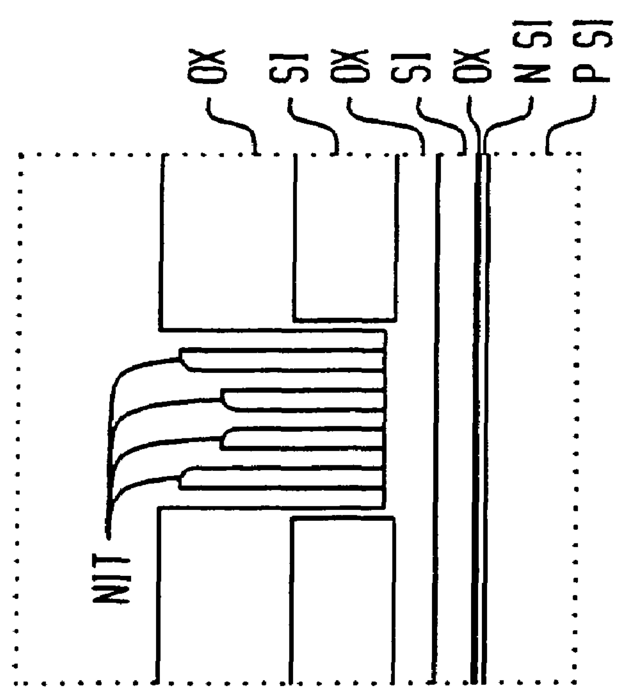

FIG. 582 illustrates the cross-section of the trench with all layers of the second insulating material removed.

Figure 583:
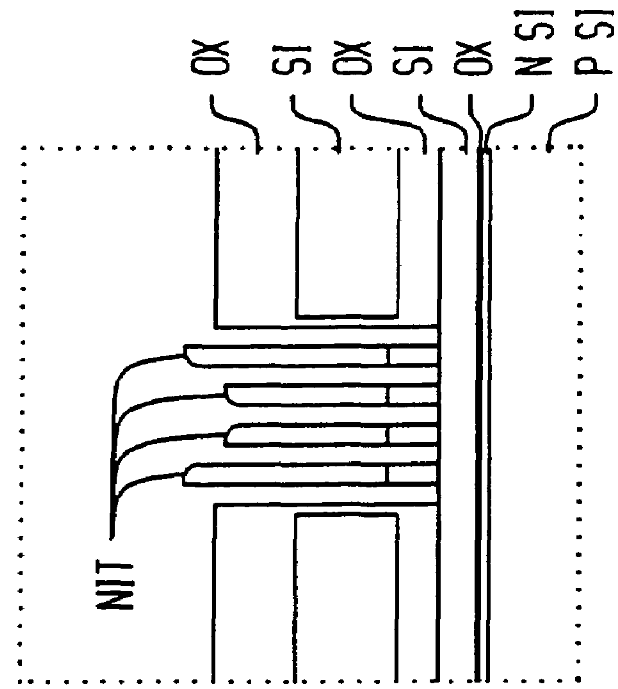

FIG. 583 illustrates the cross-section of the trench with the first bottom layer etched vertically where it was exposed between the blades of third insulating material.

Figure 584:
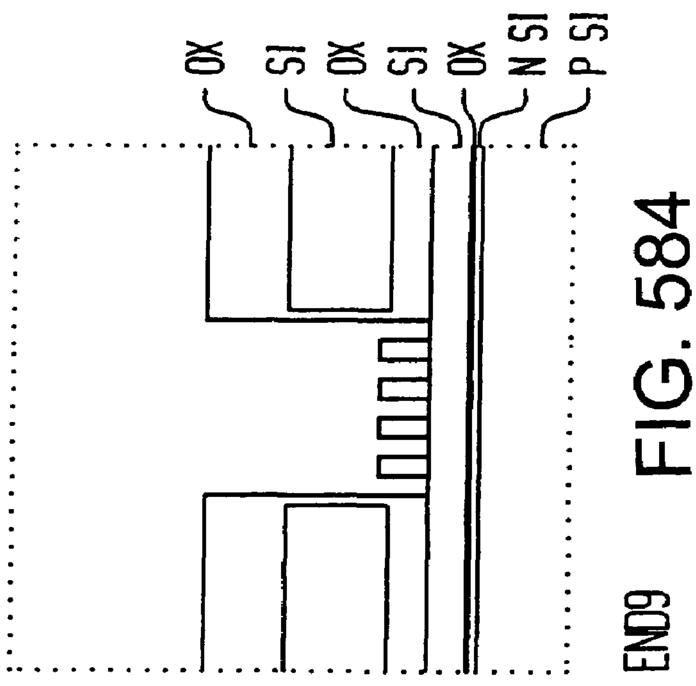

FIG. 584 illustrates the cross-section of the trench with the blades of third insulating material removed.

Figure 585:
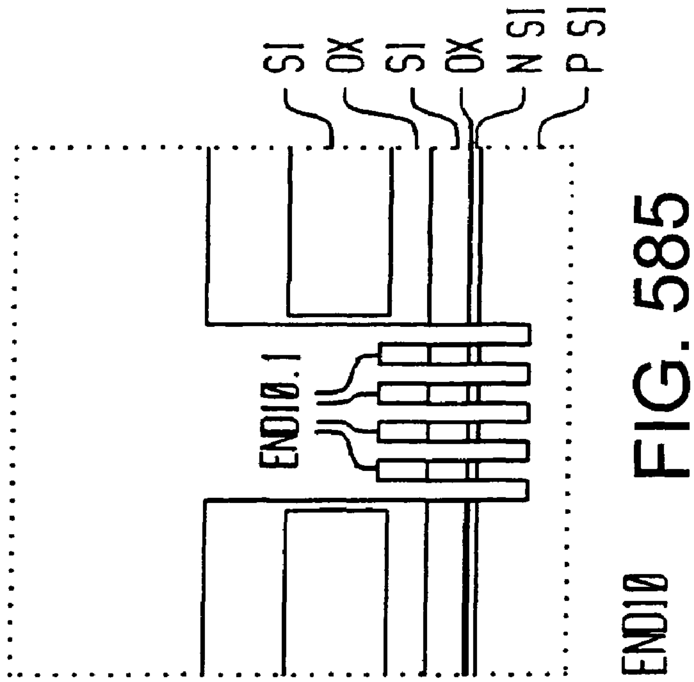

FIG. 585 illustrates the cross-section of the trench with the small trenches at its bottom deepened into the fifth layer down.

Figure 586:
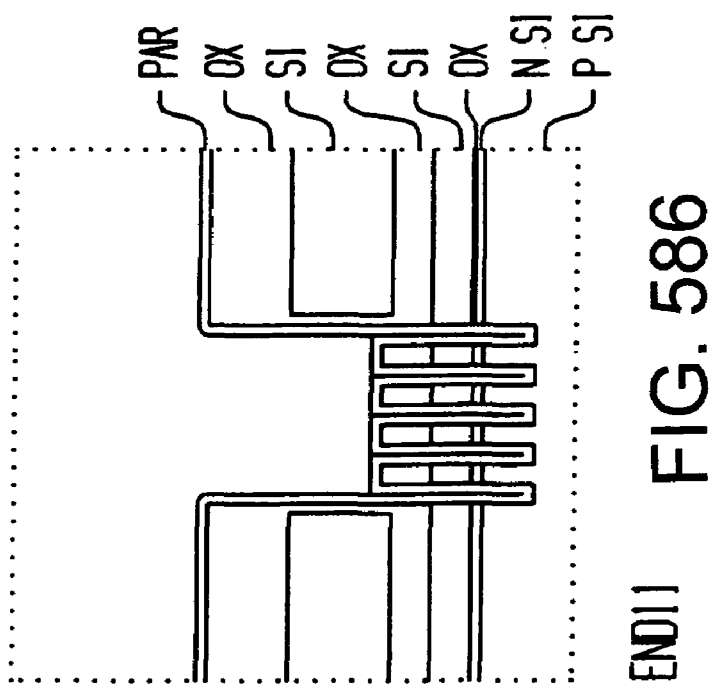

FIG. 586 illustrates the cross-section of the trench with the small trenches at its bottom filled, and with the other surfaces coated, with the second insulating material.

Figure 587:
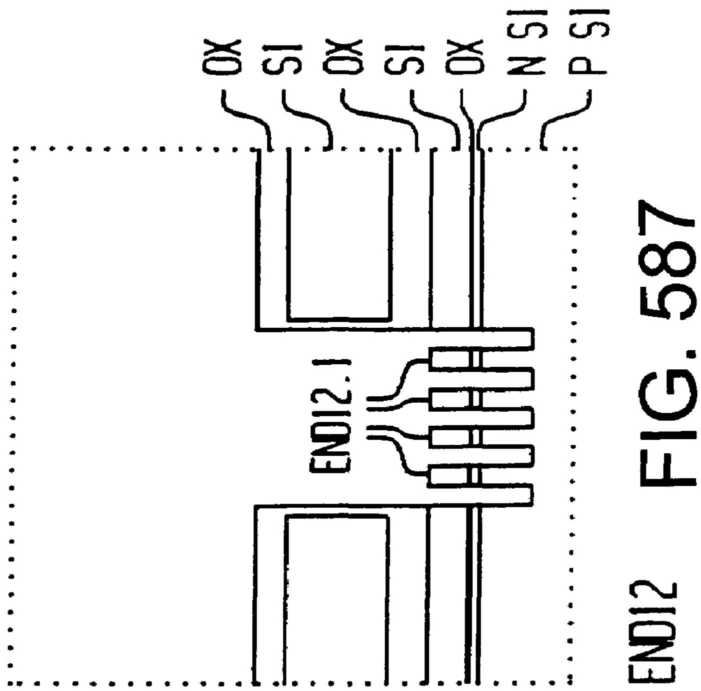

FIG. 587 illustrates the cross-section of the trench with all second insulating material as well as the top layer of the blades at the bottom of the trench removed.

Figure 588:
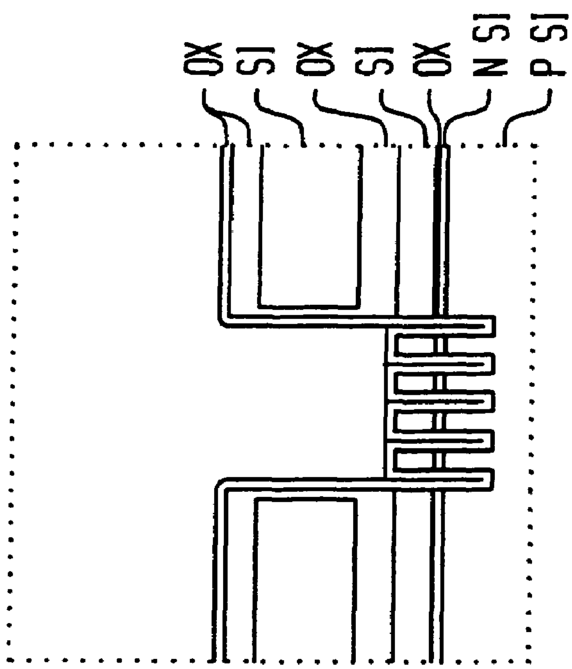

FIG. 588 illustrates the cross-section of the trench with the small trenches at its bottom filled, and the other surfaces coated, with the first insulating material.

Figure 589:
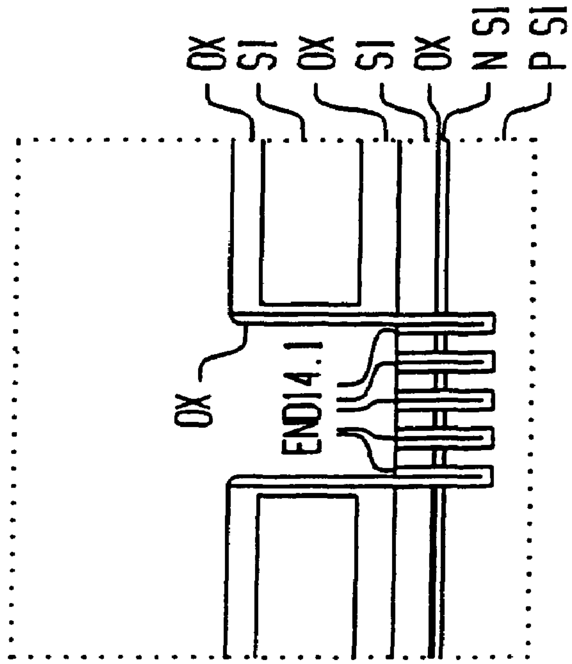

FIG. 589 illustrates the cross-section of the trench with the layer of first insulating material removed, except in the small trenches between the blades at the bottom of the trench.

Figure 590:
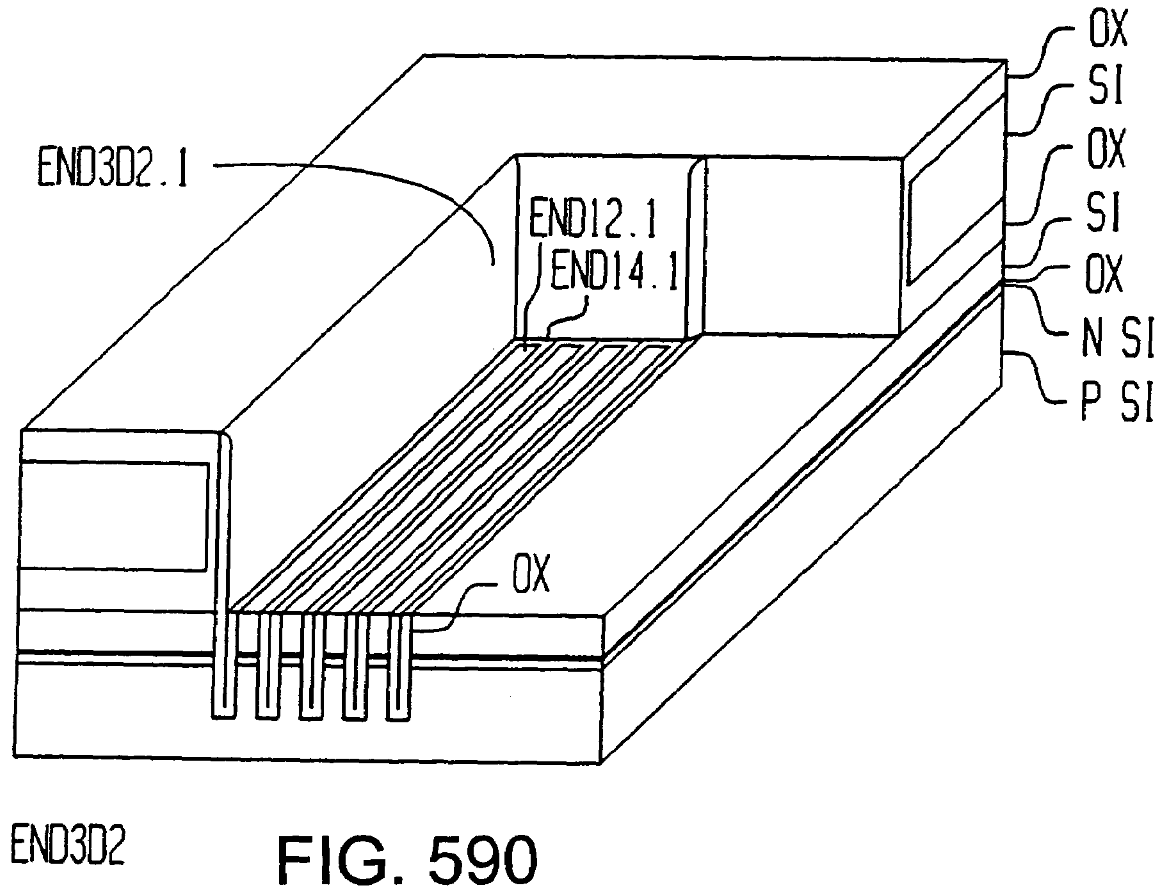

FIG. 590 is a three-dimensional depiction of the small cutaway section of the wafer with the front wall removed, illustrating the laterally insulated blades at the bottom of the trench.

Figure 592:
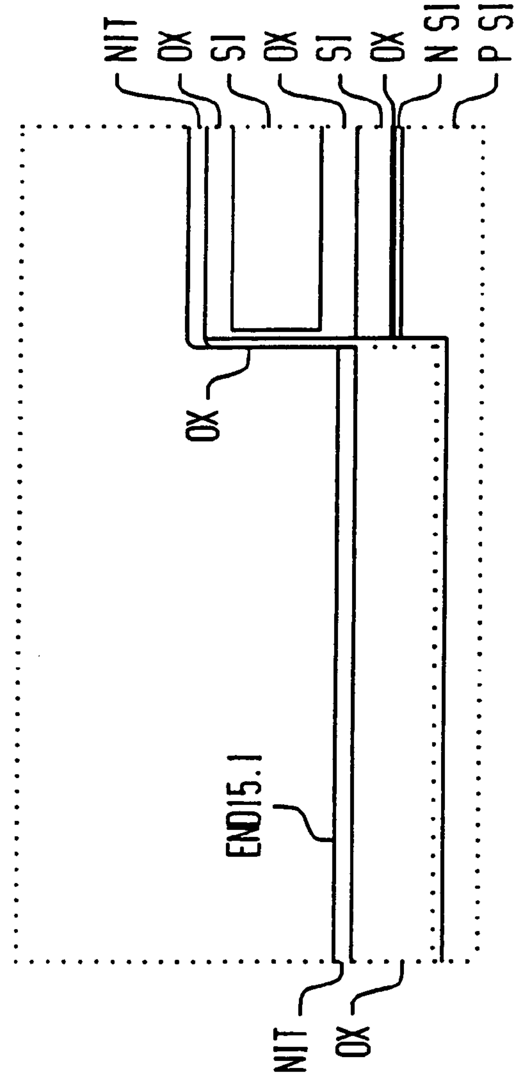
Figure 591:
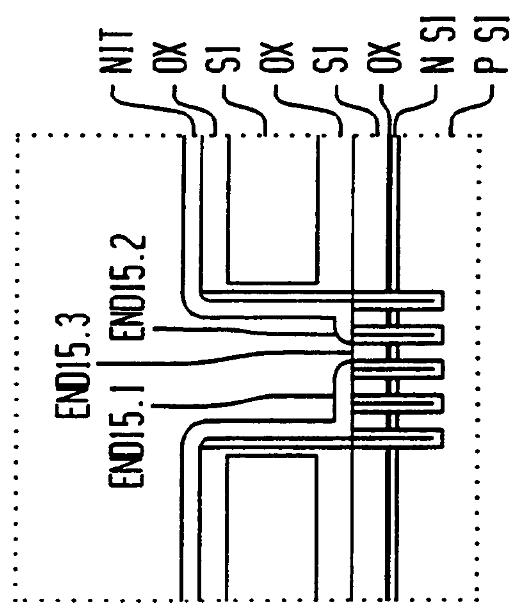

FIG. 591 and FIG. 592 illustrate a cross-section and length-section through the center of the trench, respectively, with a layer of third insulating material deposited everywhere, except on the end-wall of the trench and above one of the exposed blades at the bottom of the trench.

Figure 594:
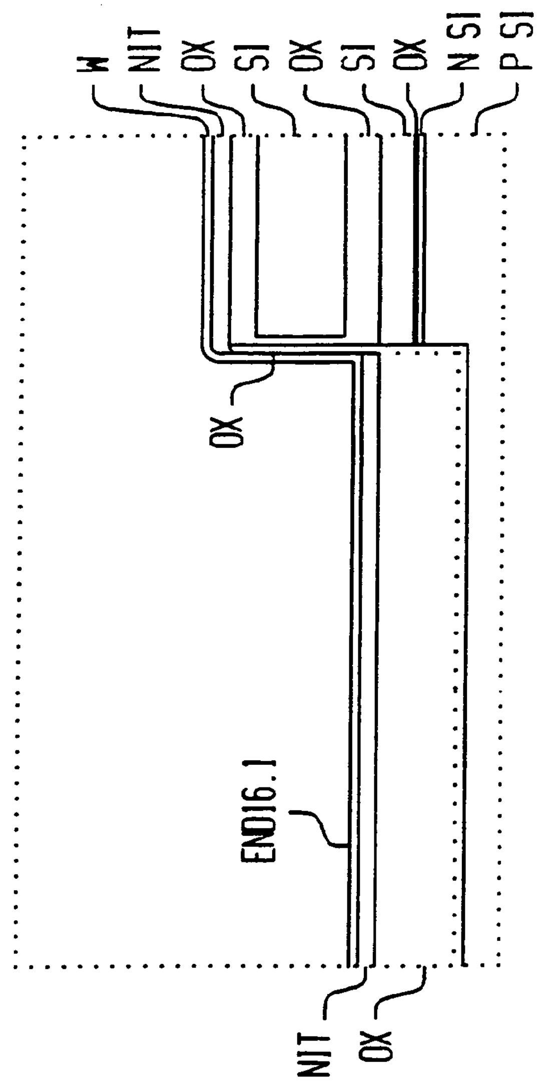
Figure 593:
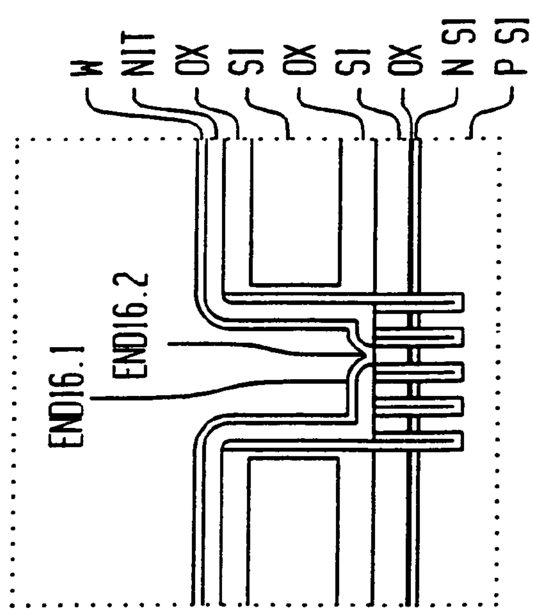

FIG. 593 and FIG. 594 illustrate a cross-section and length-section, respectively, with a layer of metal deposited everywhere.

Figure 596:
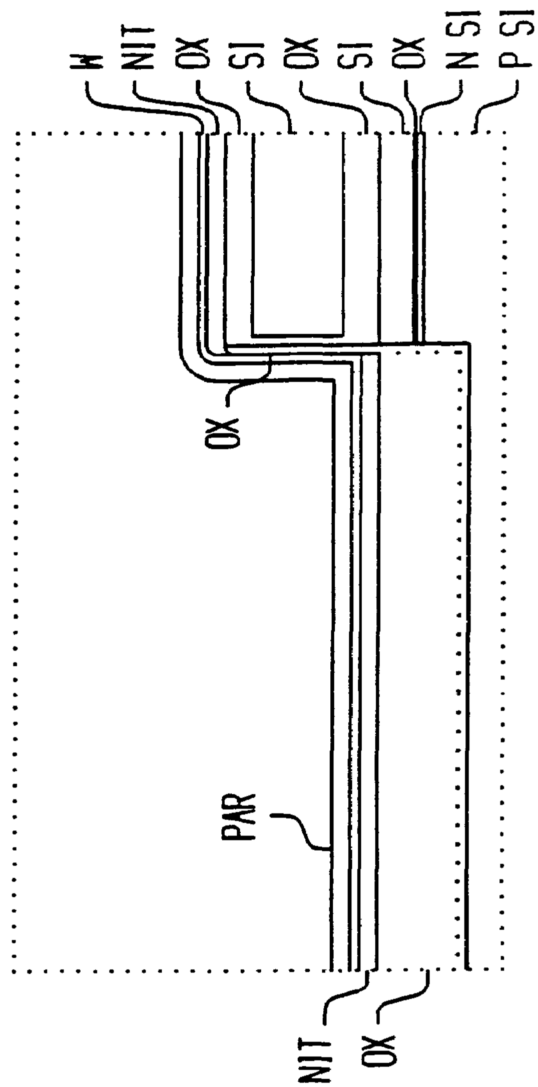
Figure 595:
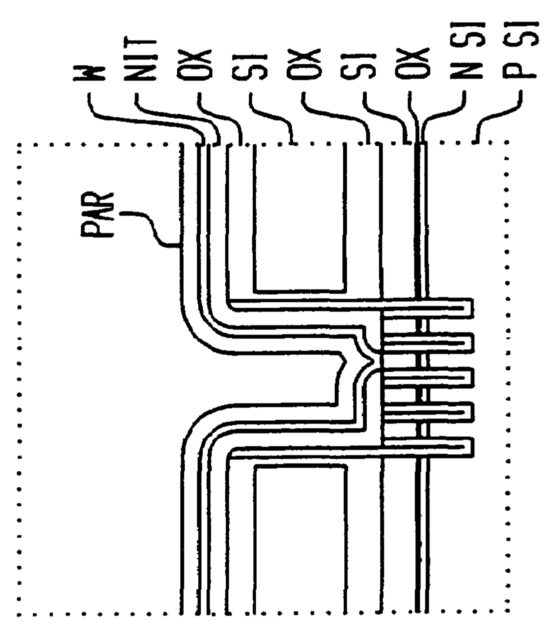

FIG. 595 and FIG. 596 illustrate a cross-section and length-section, respectively, with a layer of second insulating material deposited everywhere.

Figure 598:
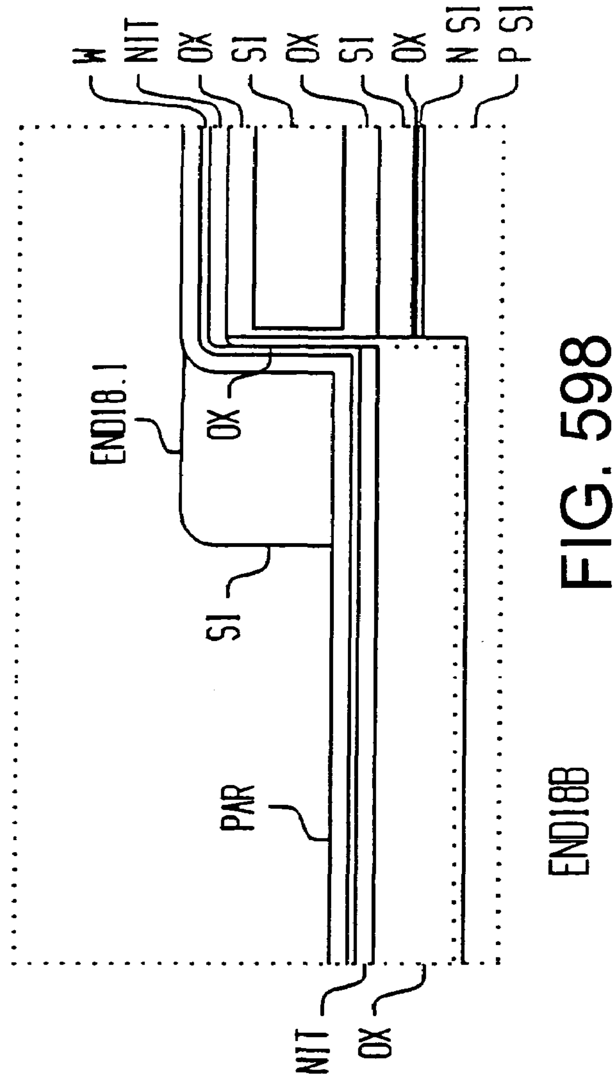
Figure 597:
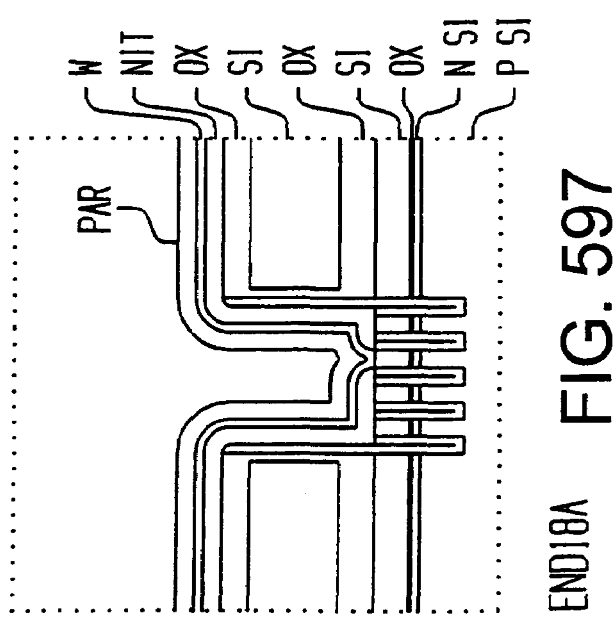

FIG. 597 and FIG. 598 illustrate a cross-section and length-section, respectively, with a plug of semiconductor material of controlled length deposited at the end of the trench.

Figure 600:
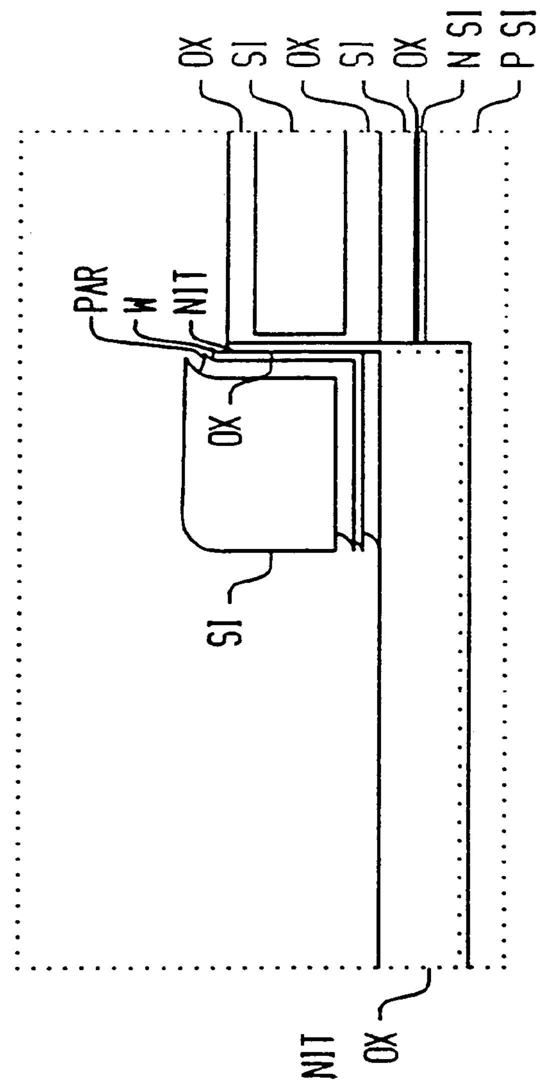
Figure 599:
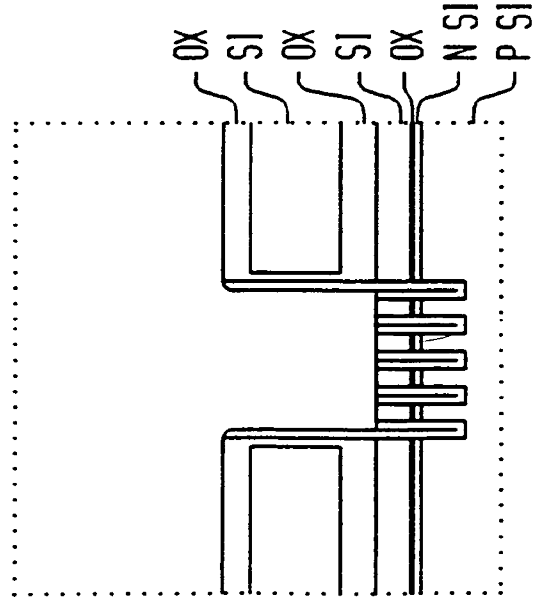

FIG. 599 and FIG. 600 illustrate a cross-section and length-section, respectively, with the layers of third insulating material, conductive material and second insulating material removed in turn, where they are not protected by the plug.

Figure 602:
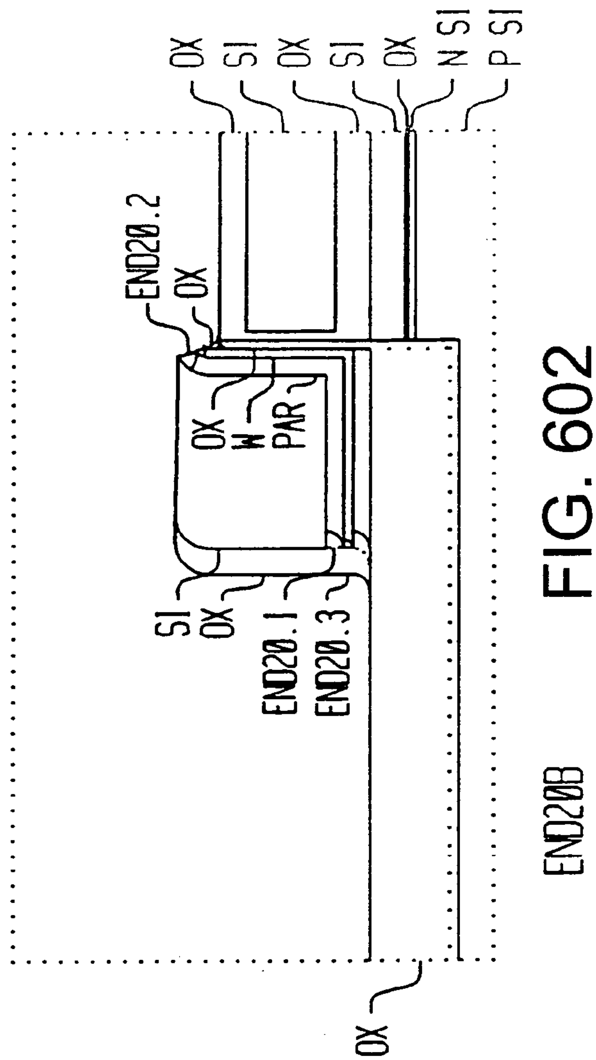
Figure 601:
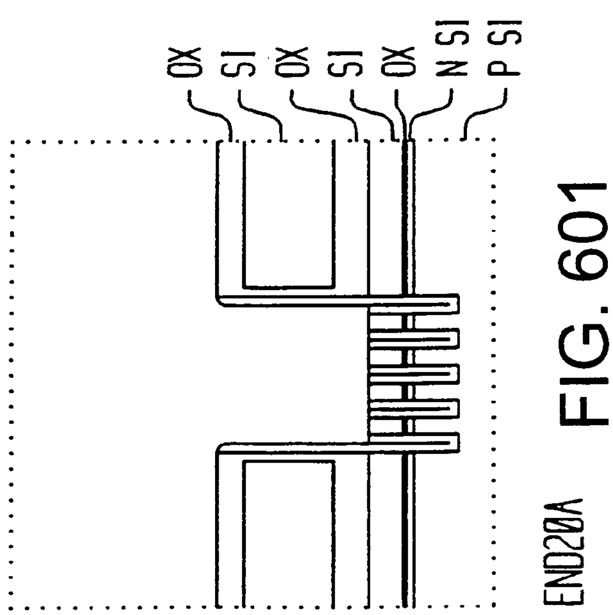

FIG. 601 and FIG. 602 illustrate a cross-section and length-section, respectively, with the undercut regions of the layers of insulating and conductive materials filled with a layer of first insulating material, and with a layer of first insulating material directionally deposited onto the exposed, left side of the plug.

Figure 603:
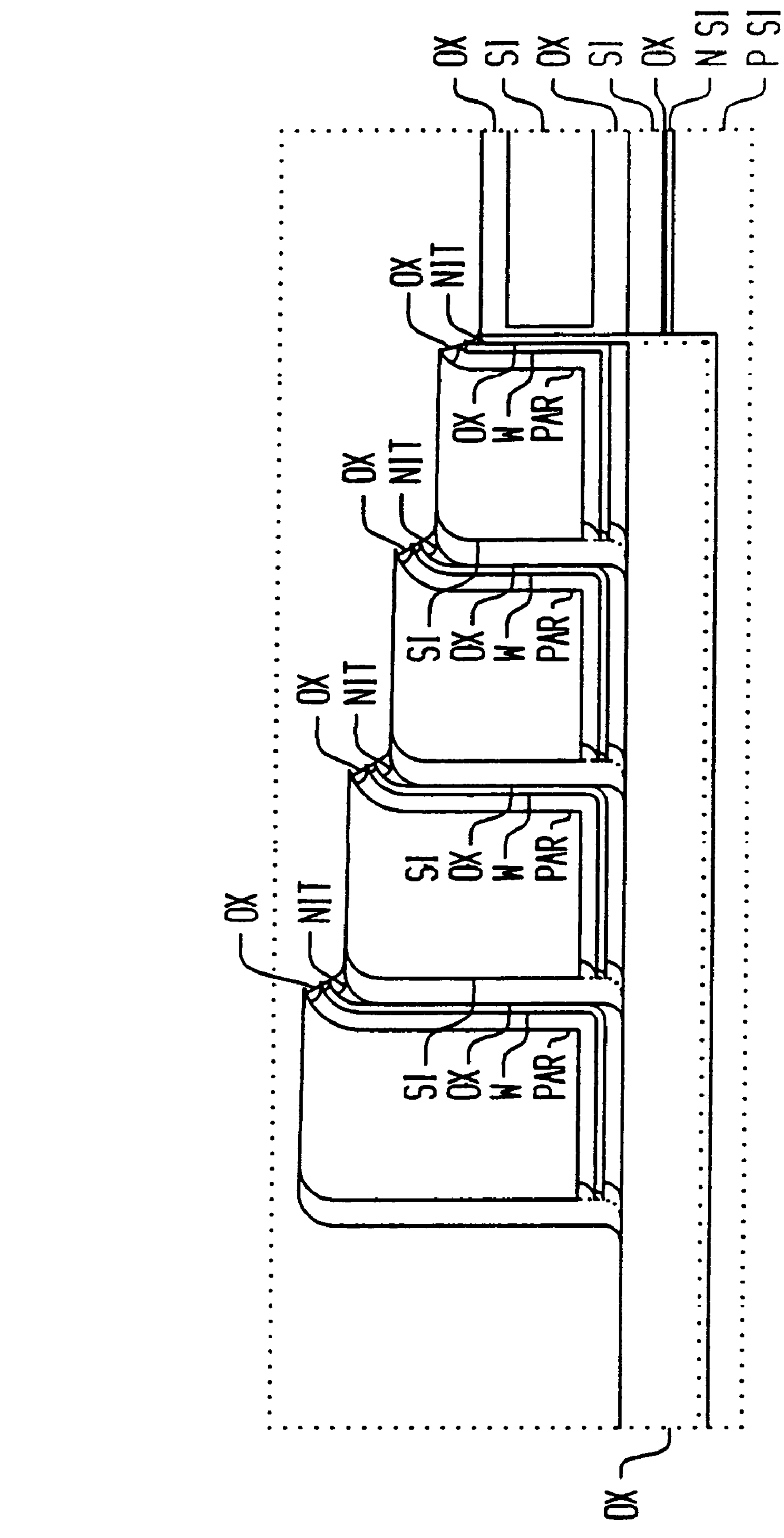

FIG. 603 illustrate a length-section, with the steps from FIG. 597 and FIG. 598 to FIG. 601 and FIG. 602 repeated three more times, with certain variations.

Figure 604:
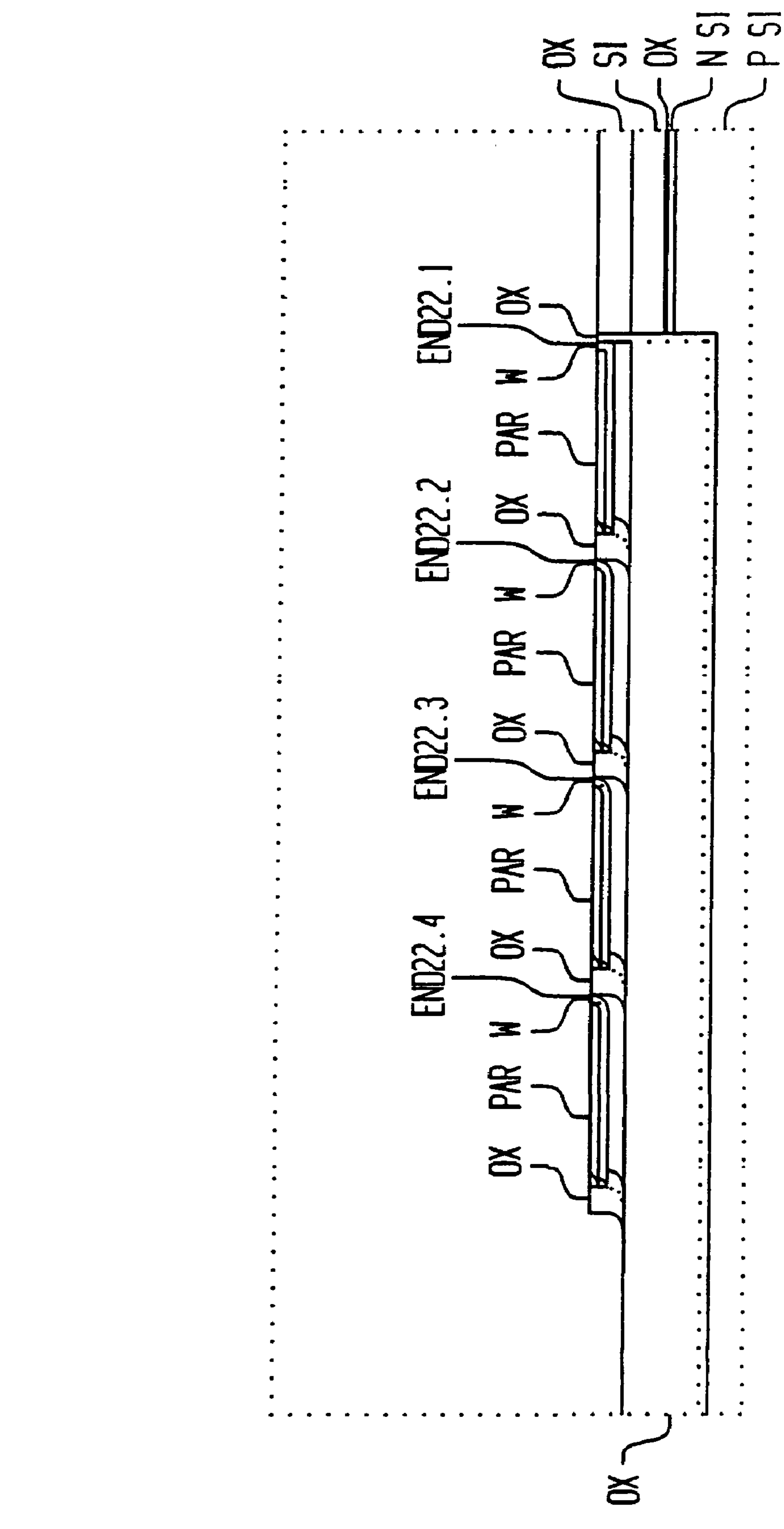

FIG. 604 illustrate a length-section, with the top surface of the structure shown in FIG. 603 planarized and lowered.

Figure 605:
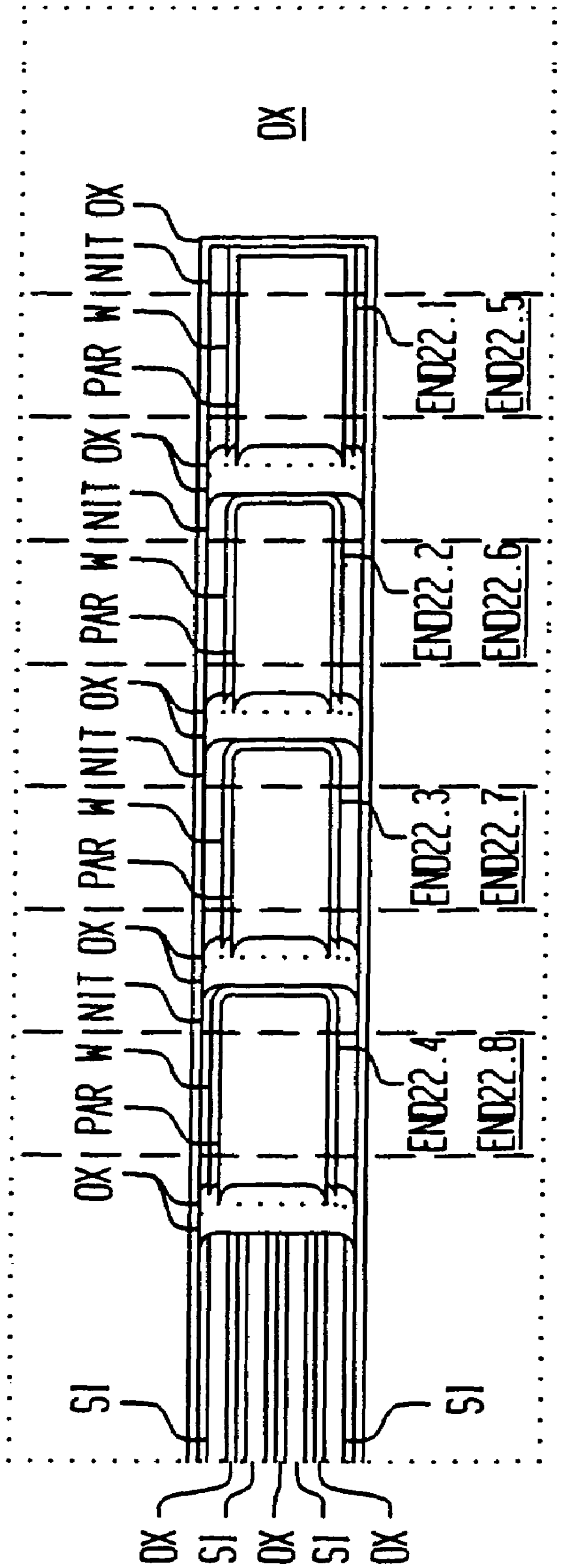

FIG. 605 is a top view of FIG. 604 and illustrates the mosaic of insulating and conductive layers imbedded in the structure, and a pattern of suggested conductive traces to contact the imbedded conductive layers.

Figure 606:
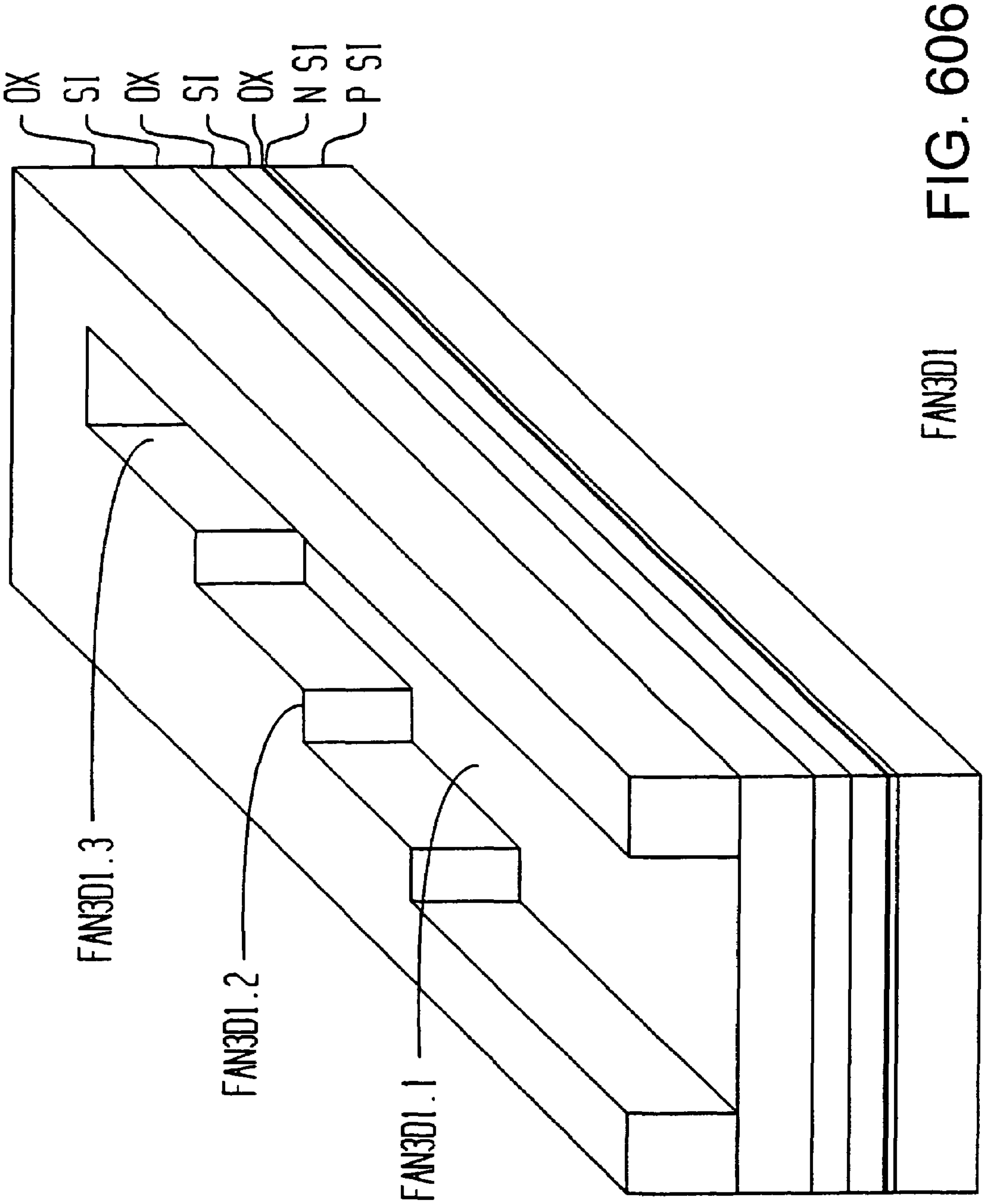

FIG. 606 is a three-dimensional depiction of a small cutaway section of an integrated circuit wafer with an opening in the top layer for forming a step-wise tapered end of a trench.

Figure 607:
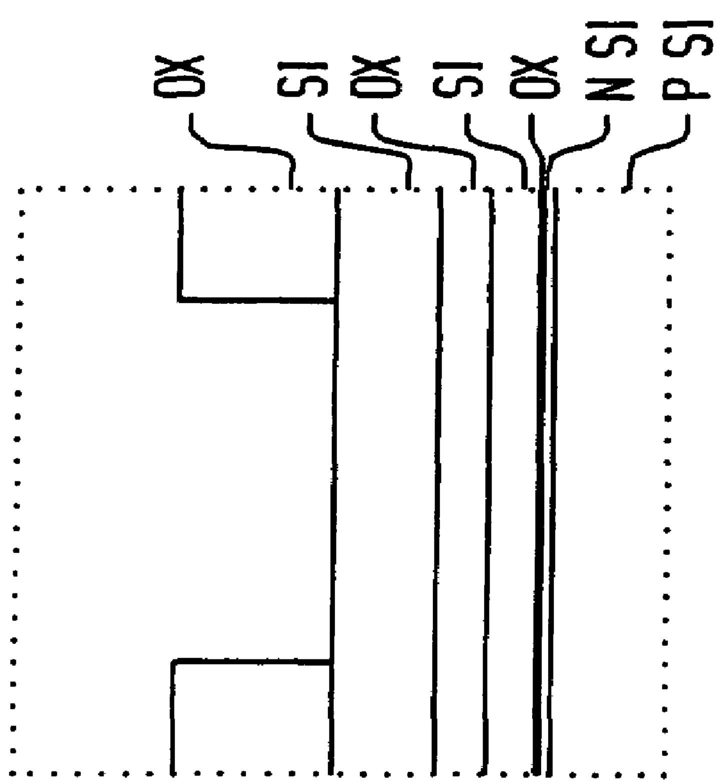

FIG. 607 is a two-dimensional depiction of the front end of FIG. 606, i.e., the cross-section of the trench mask.

Figure 608:
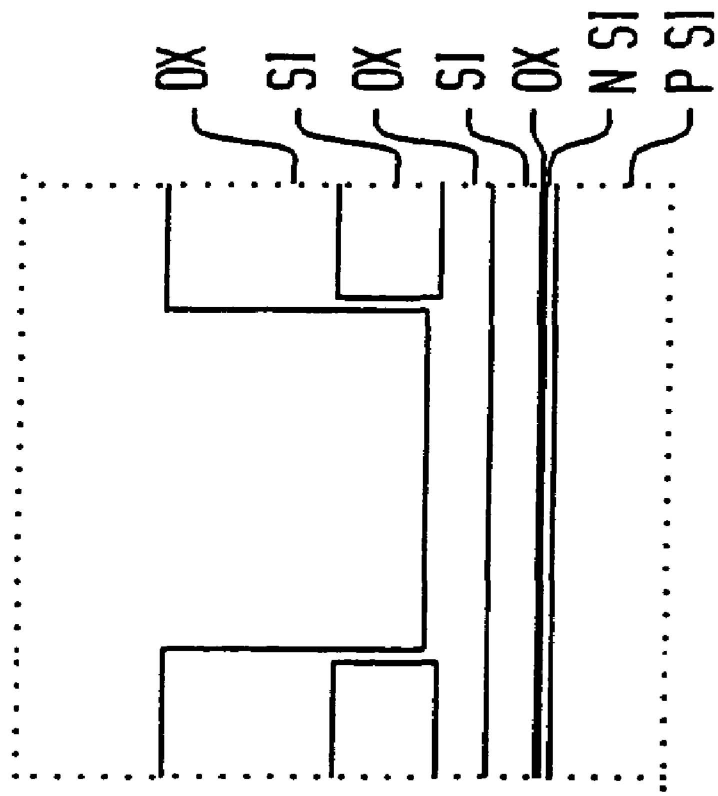

FIG. 608 illustrates the cross-section of a trench etched through the opening in the top layer and coated with a layer of first insulating material.

Figure 609:
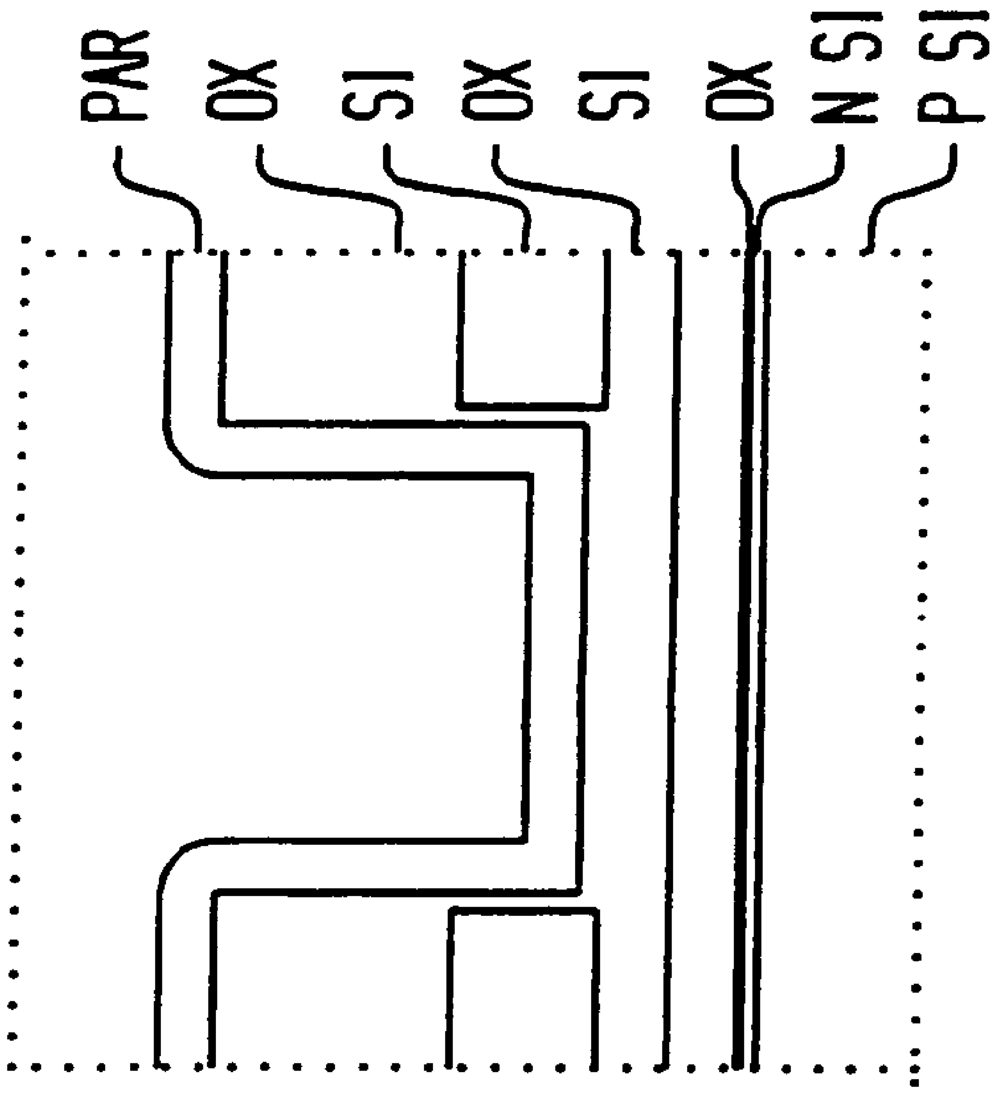

FIG. 609 illustrates the cross-section of the trench further coated with a layer of second insulating material.

Figure 610:
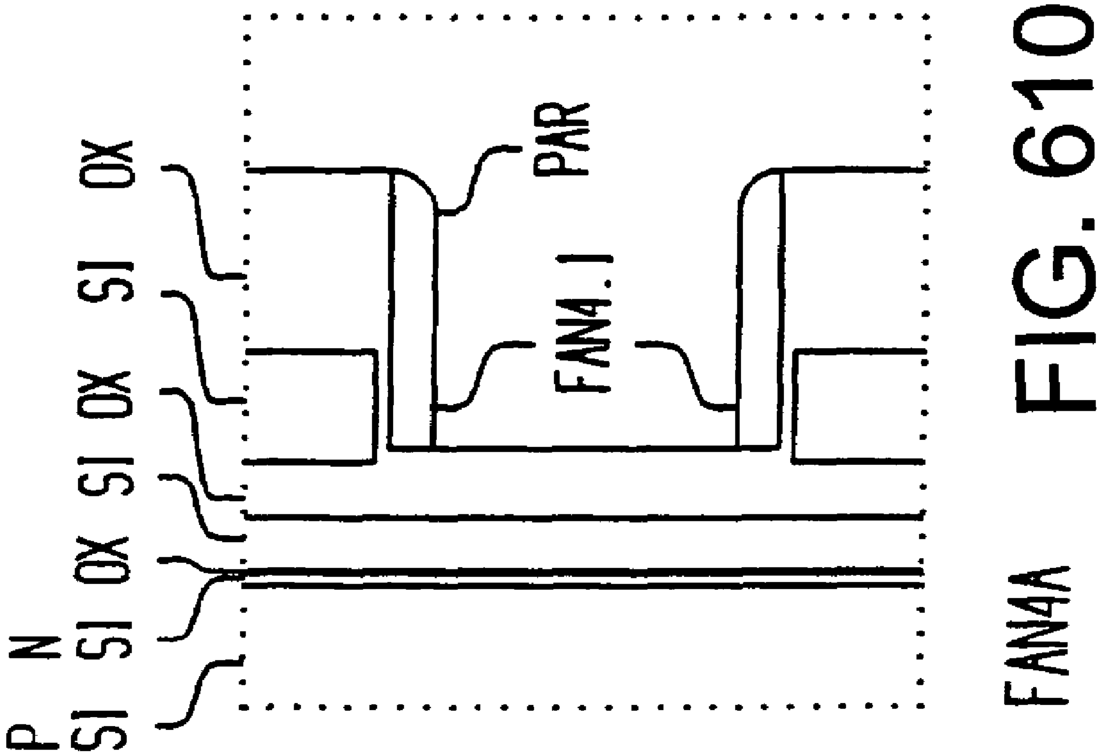
Figure 611:
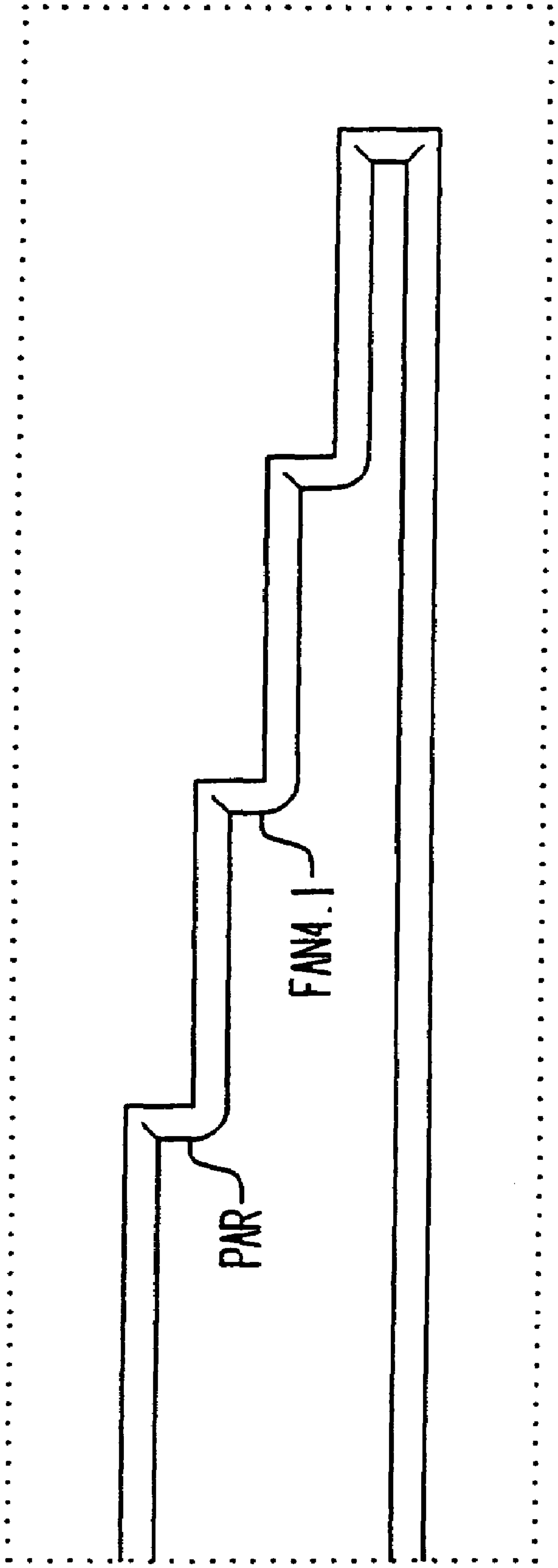

FIG. 610 and FIG. 611 illustrate a cross-section and a top view of the trench, respectively, with the second insulating material removed from the horizontal surfaces.

Figure 612:
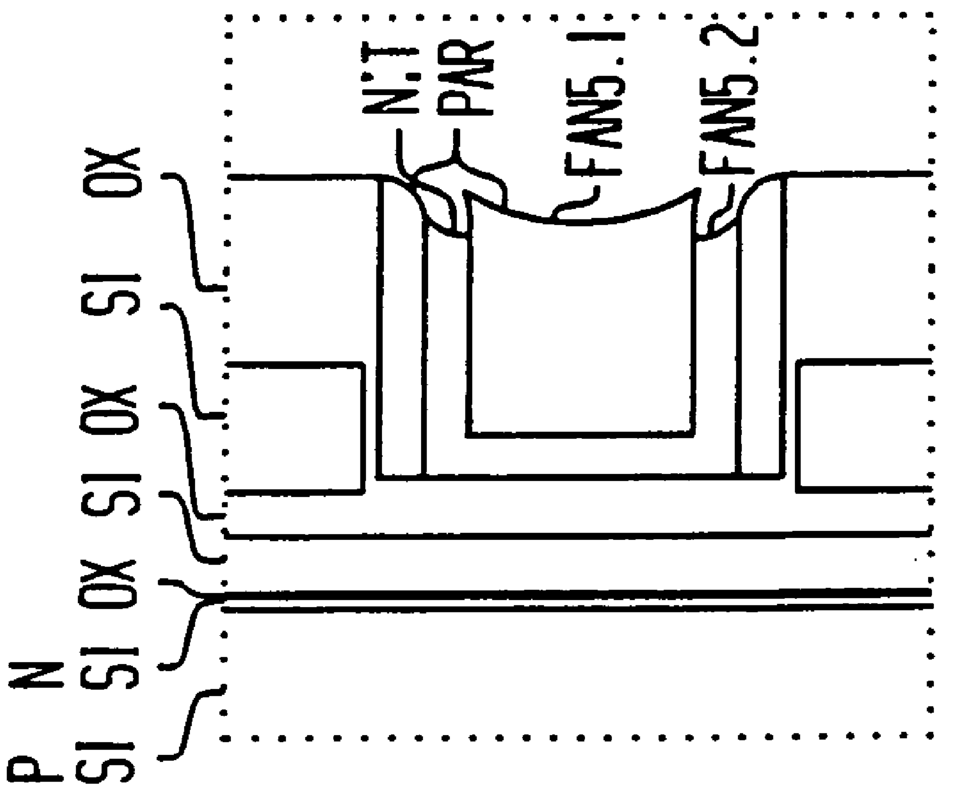
Figure 613:
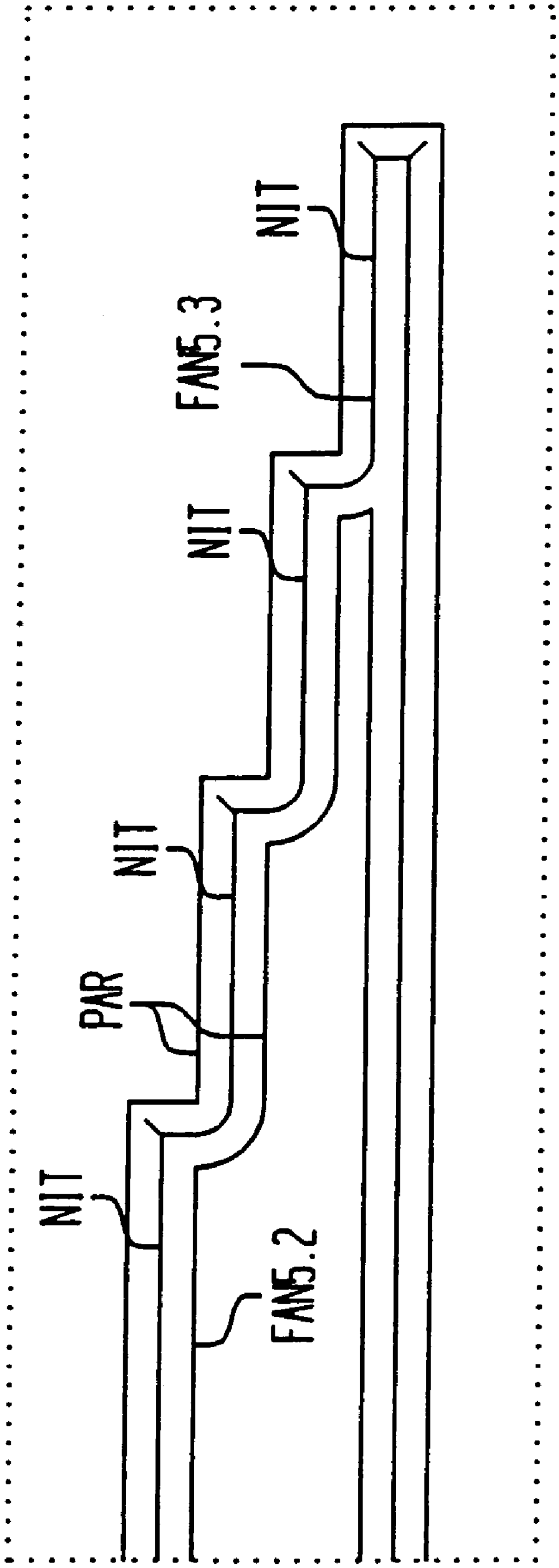

FIG. 612 and FIG. 613 illustrate a cross-section and a top view of the trench, respectively, with its walls coated with a layer of a third insulating material and filled with second insulating material.

Figure 614:
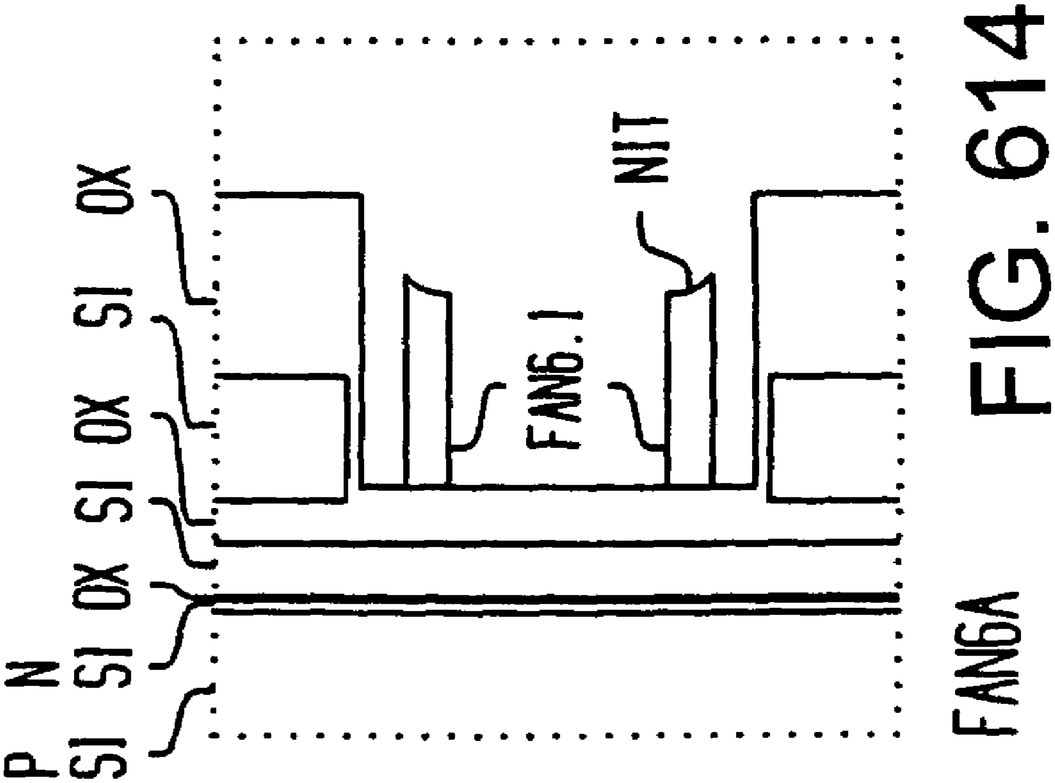
Figure 615:
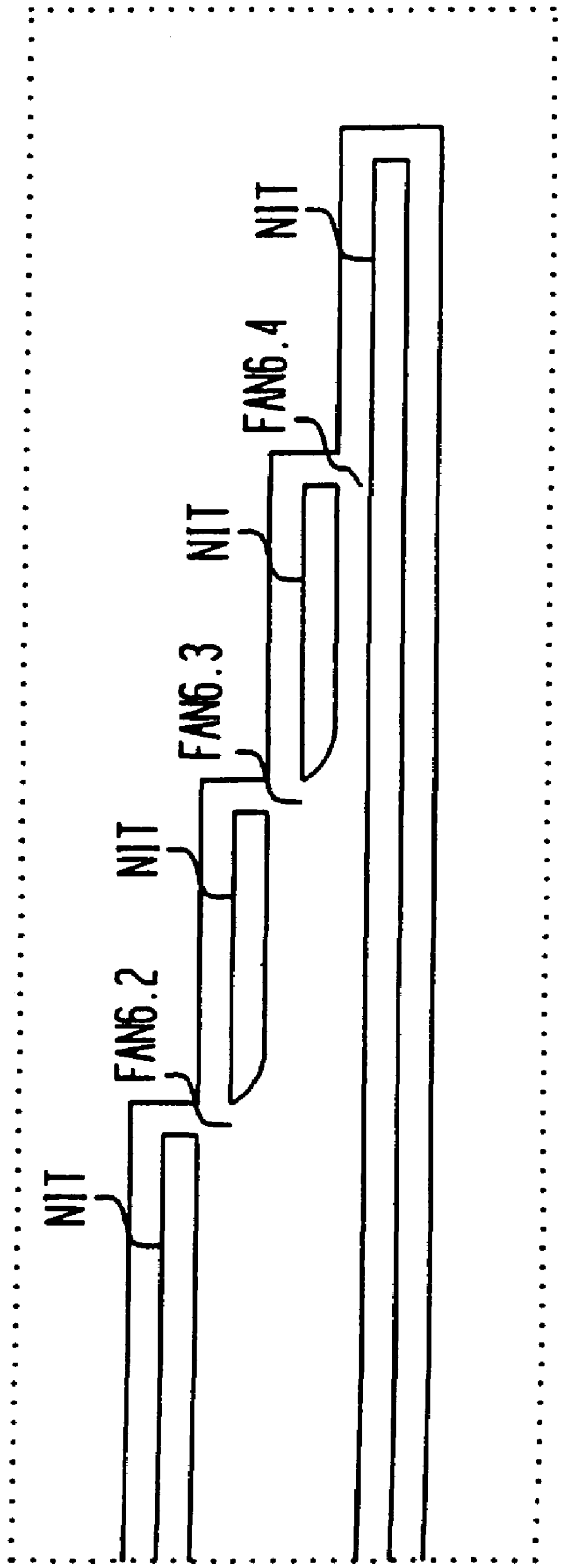

FIG. 614 and FIG. 615 illustrate a cross-section and a top view of the trench, respectively, with all second insulating material removed and the blades of third insulating material severed at the steps of the taper.

Figure 616:
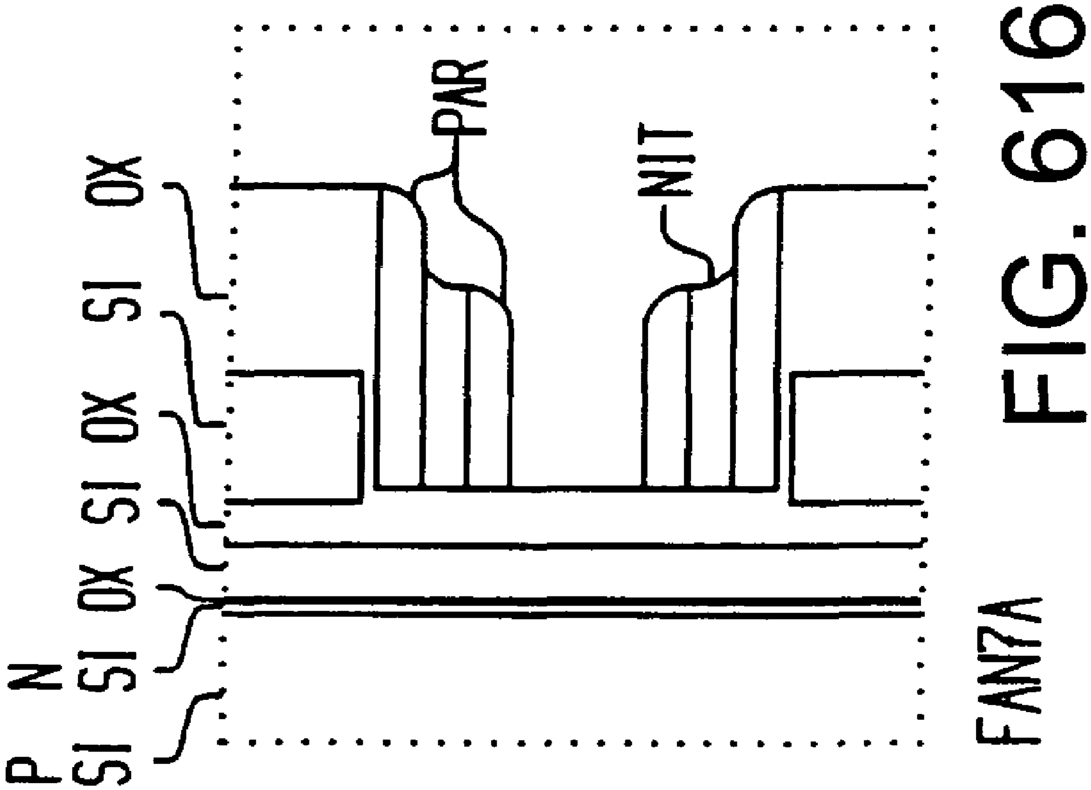
Figure 617:
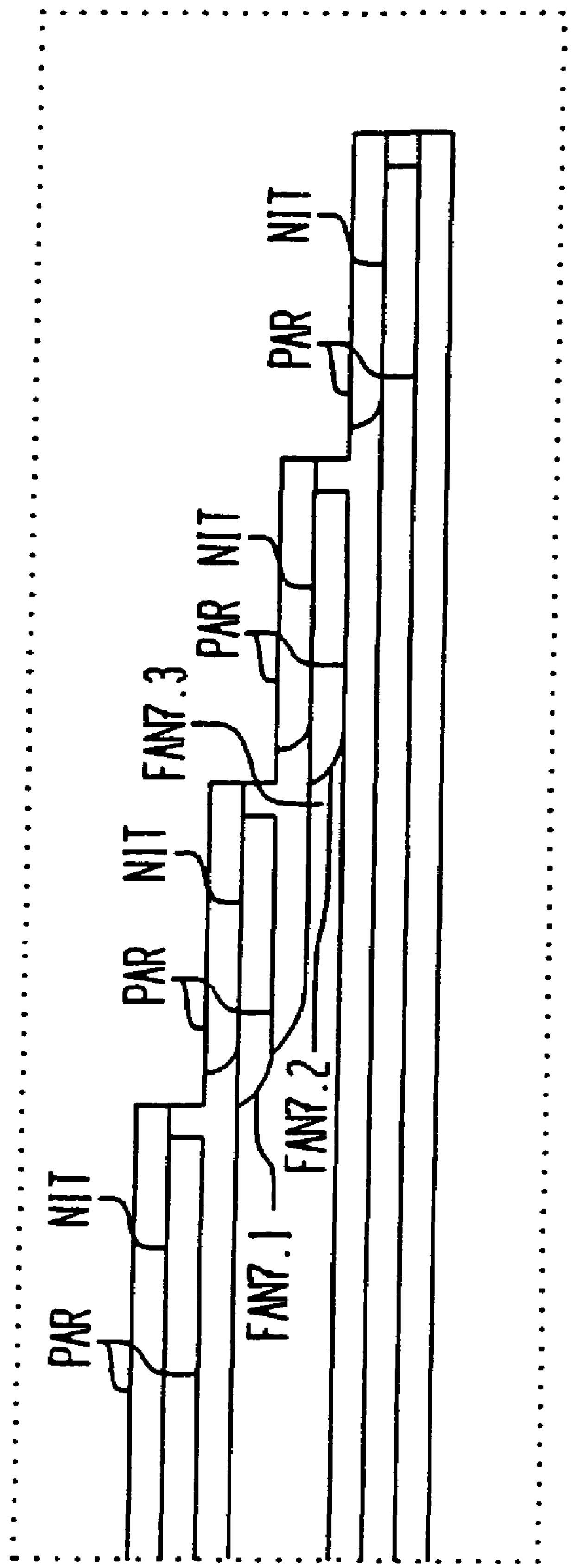

FIG. 616 and FIG. 617 illustrate a cross-section and a top view of the trench, respectively, with the walls coated with successive layers of second, third, and second insulating material.

Figure 618:
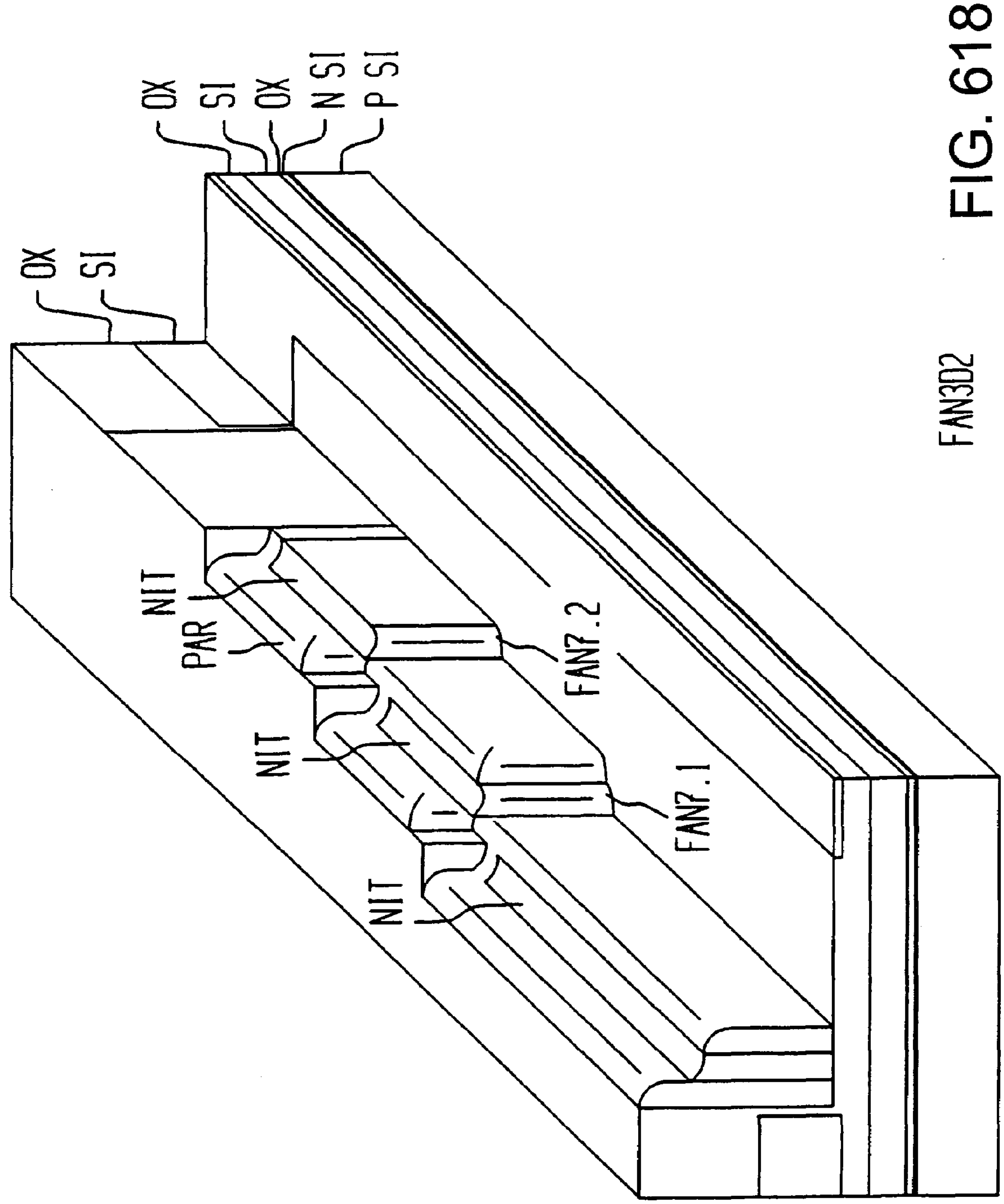

FIG. 618 is a three-dimensional depiction of the small cutaway section of the wafer with the right-hand wall and layers removed, illustrating the contours of the remaining layers.

Figure 619:
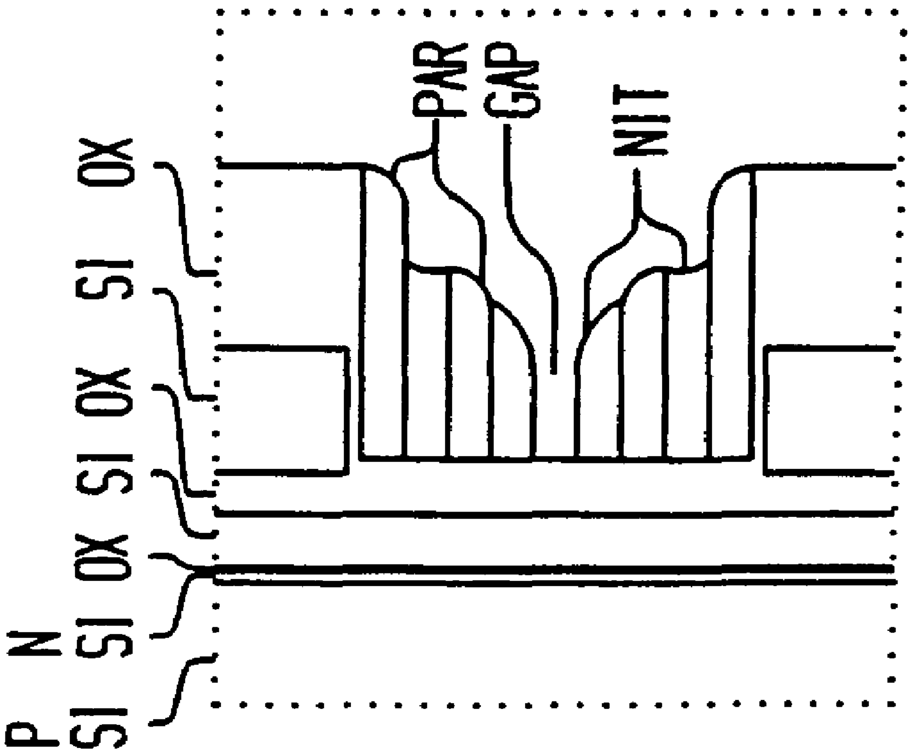
Figure 620:
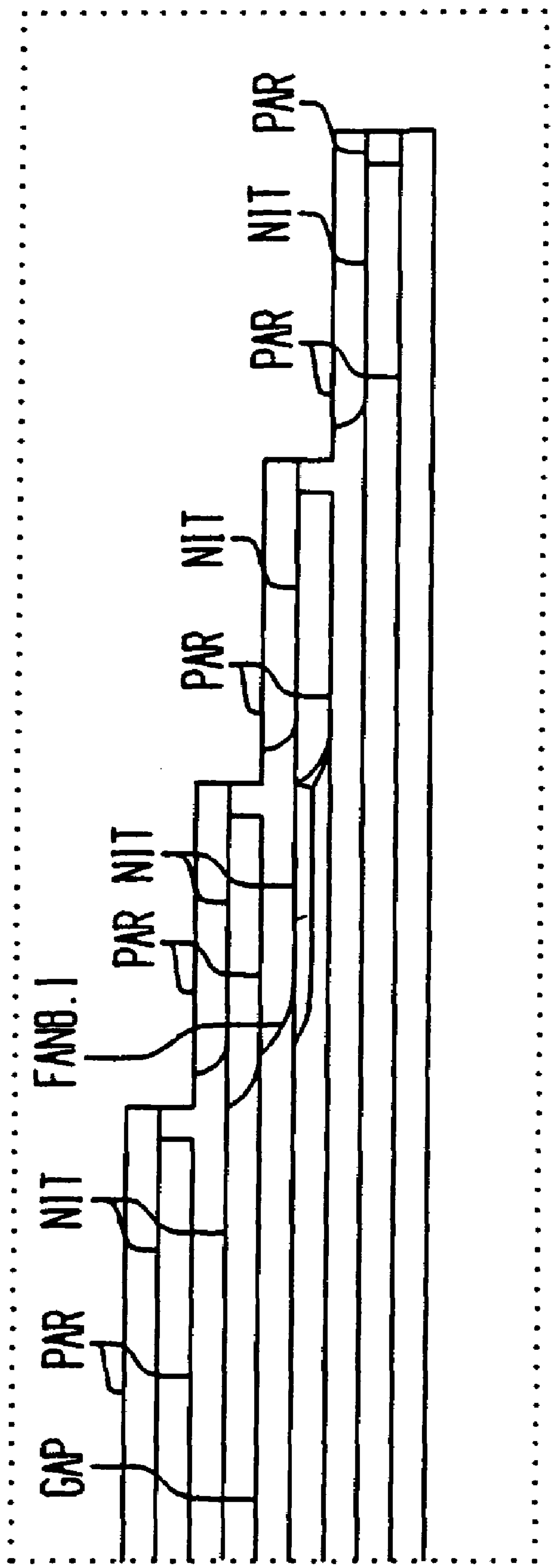

FIG. 619 and FIG. 620 illustrate a cross-section and a top view of the trench, respectively, with a further layer of third insulating material on the walls.

Figure 621:
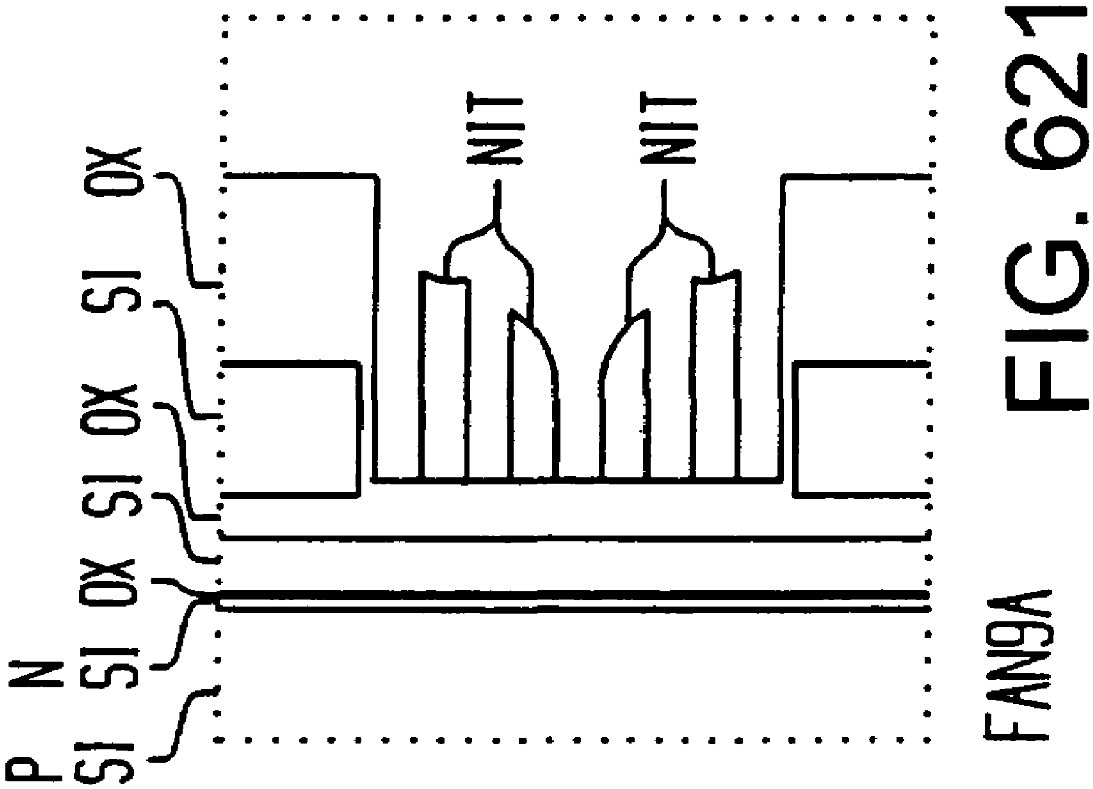
Figure 622:
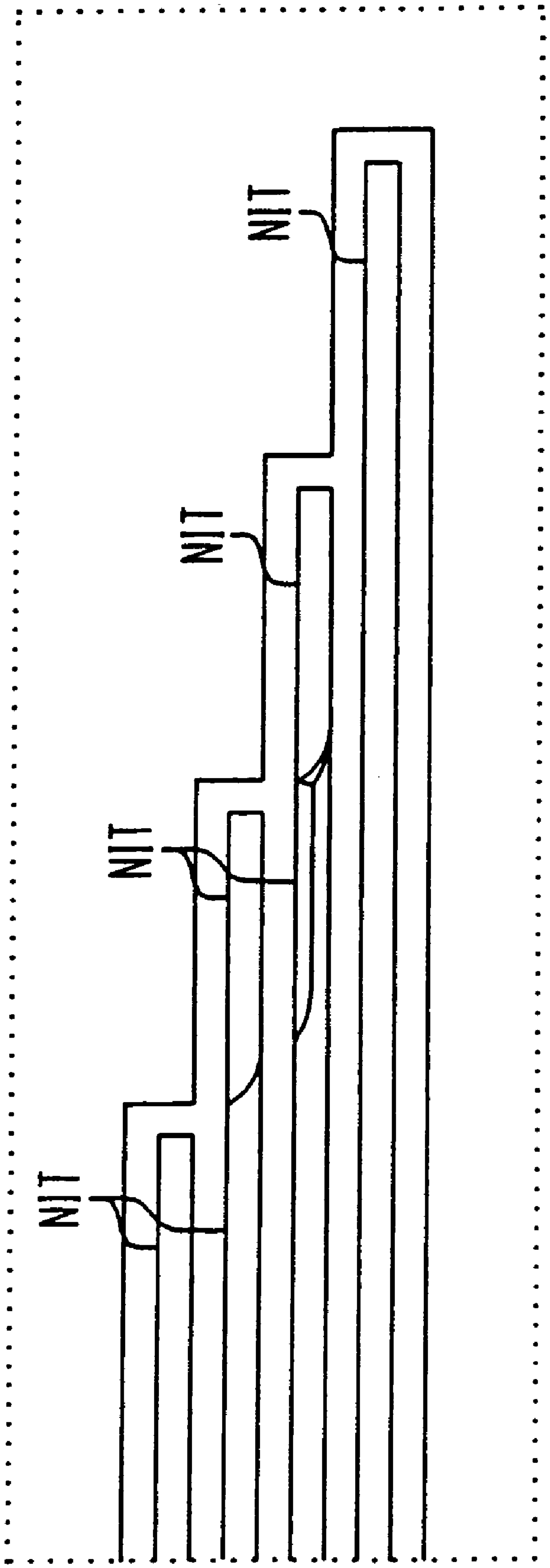

FIG. 621 and FIG. 622 illustrate a cross-section and a top view of the trench, respectively, with all second insulating material removed, to leave isolated blades of third insulating material.

Figure 623:
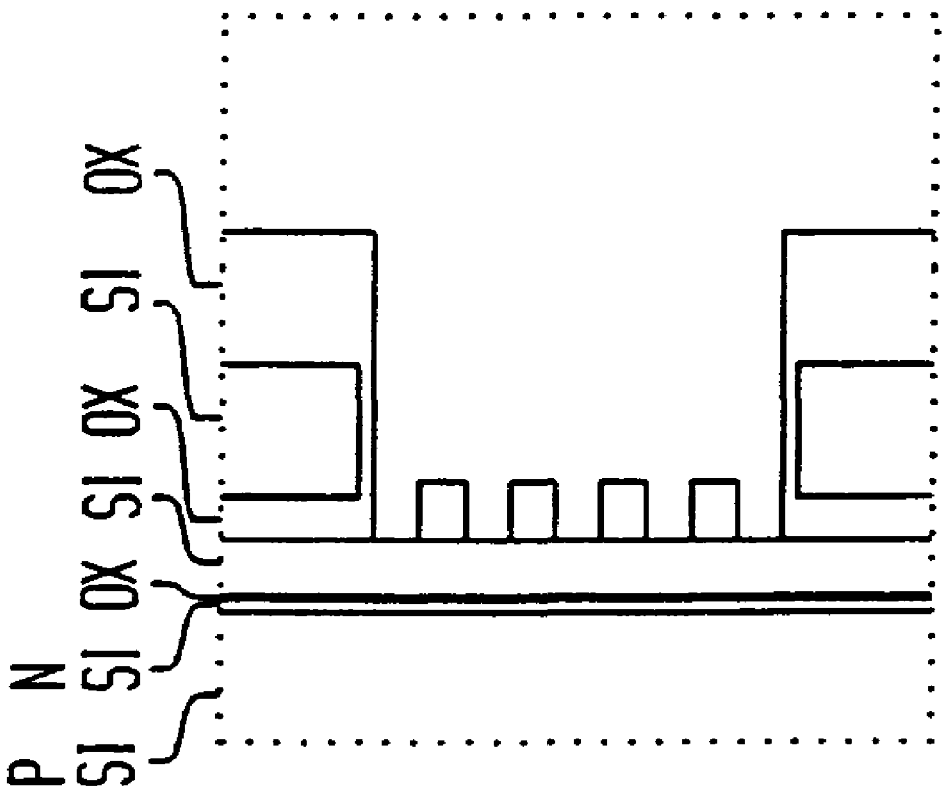
Figure 624:
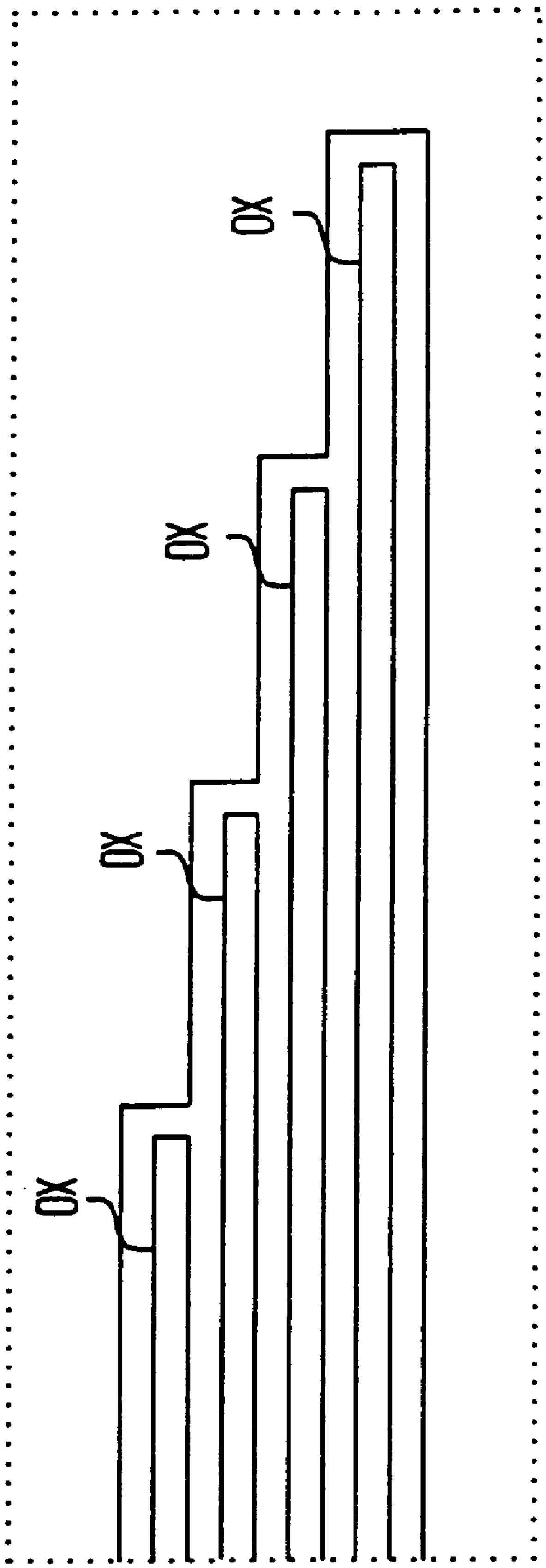

FIG. 623 and FIG. 624 illustrate a cross-section and a top view of the trench, respectively, with the first bottom layer etched vertically between the blades of third insulating material, before the blades are removed.

Figure 625:
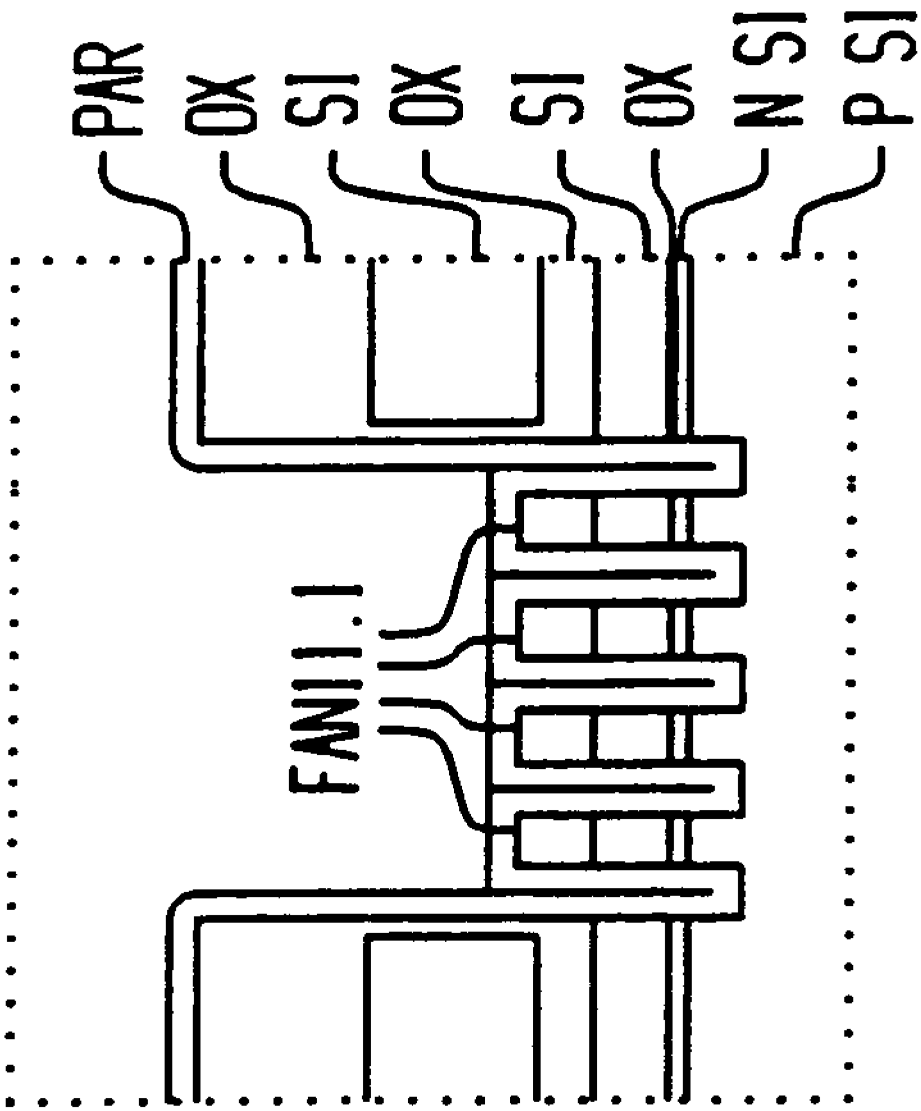

FIG. 625 illustrates the cross-section of the trench with the small trenches at its bottom deepened into the fifth layer down, and filled with second insulating material which also covers all surfaces.

Figure 626:
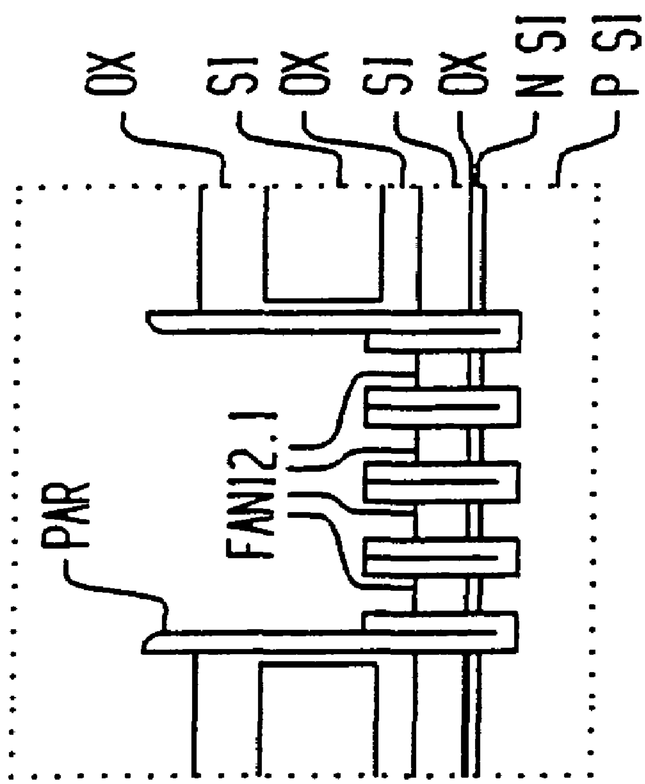

FIG. 626 illustrates the cross-section of the trench with the second insulating material removed from the horizontal surfaces and the top layer of the blades at the bottom of the trench removed.

Figure 627:
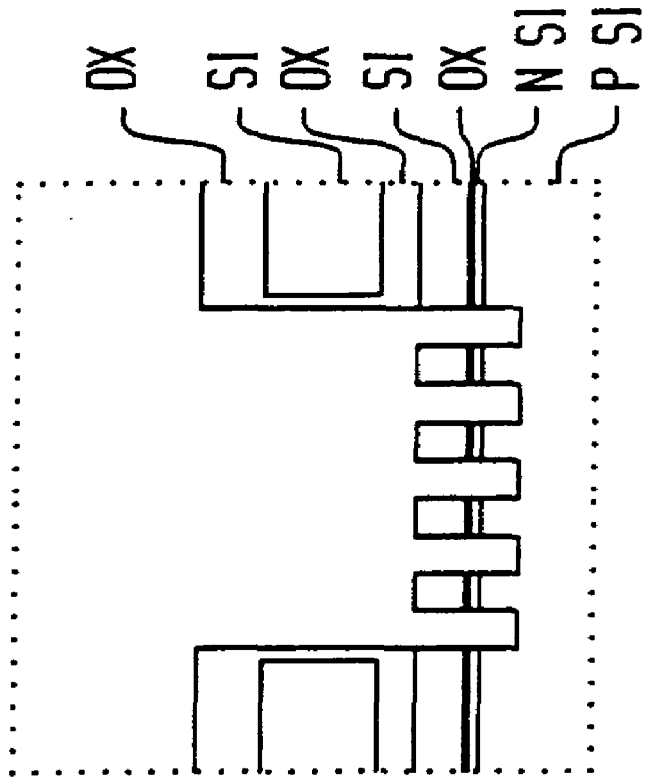

FIG. 627 illustrates the cross-section of the trench with all second insulating material removed.

Figure 628:
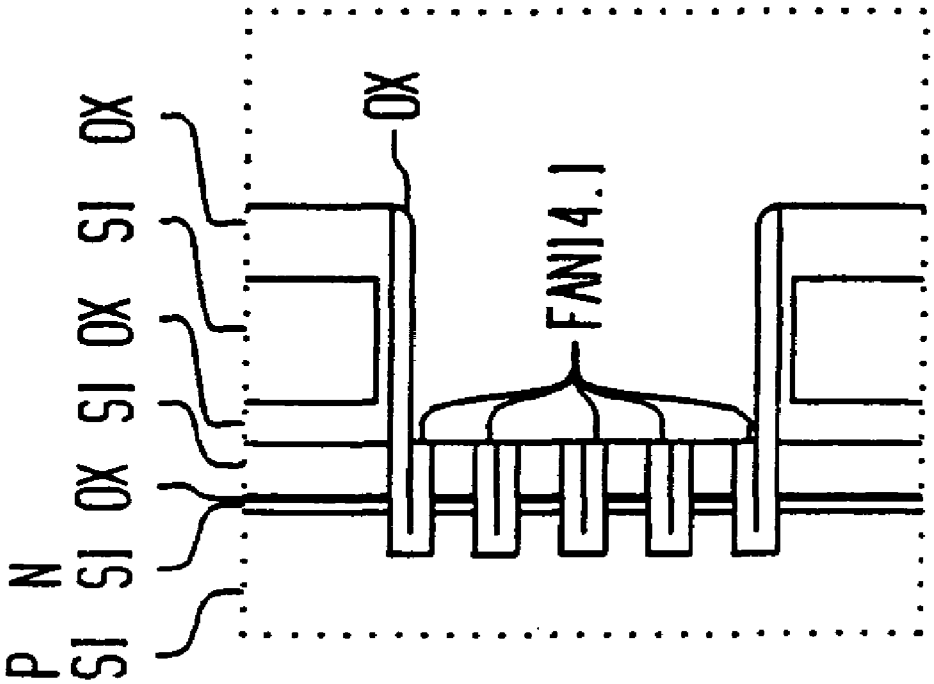
Figure 629:
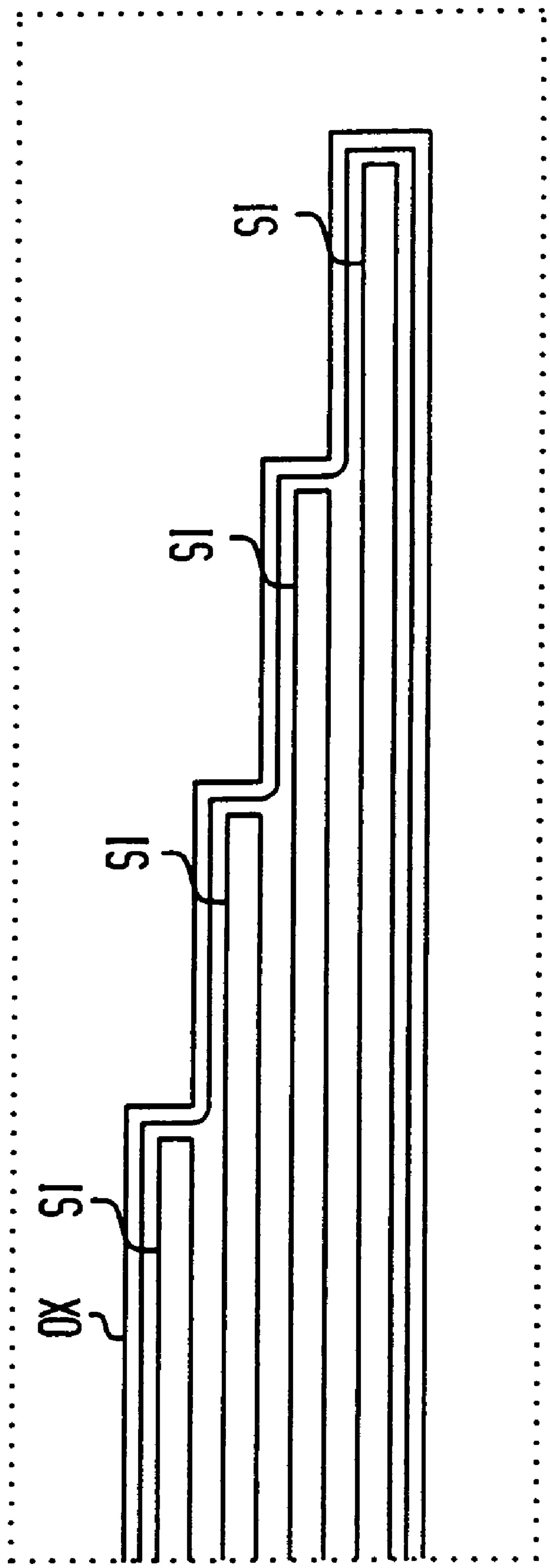

FIG. 628 and FIG. 629 illustrate a cross-section and a top view of the trench, respectively, with its walls coated and the small trenches at its bottom filled with first insulating material.

Figure 630:
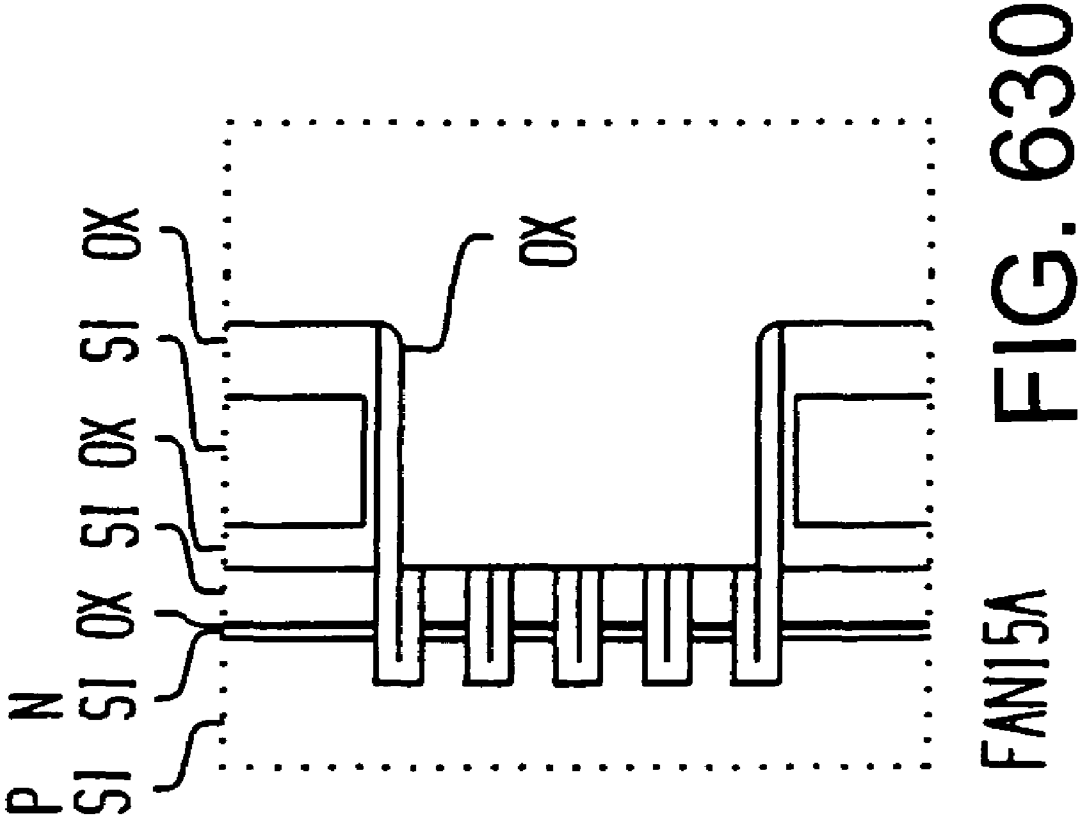
Figure 631:
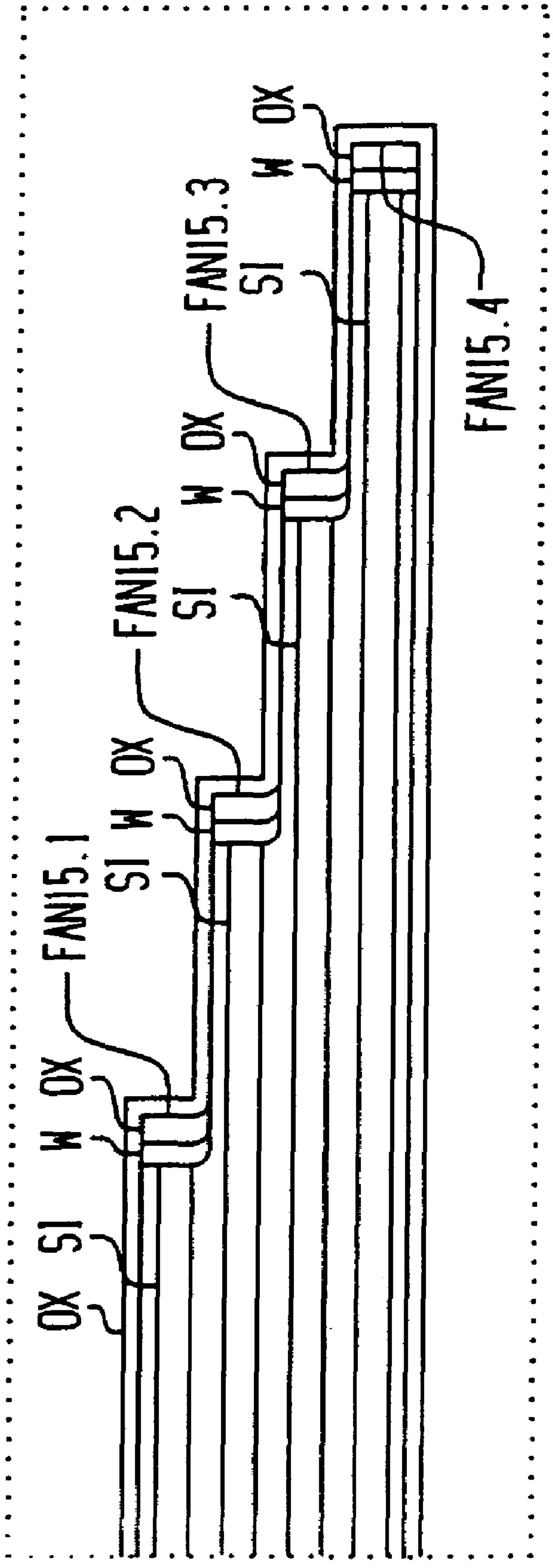

FIG. 630 and FIG. 631 illustrate a cross-section and a top view of the trench, respectively, with the walls perpendicular to the trench, at the steps and at the end, covered with layers of first insulating material and metal.

Figure 632:
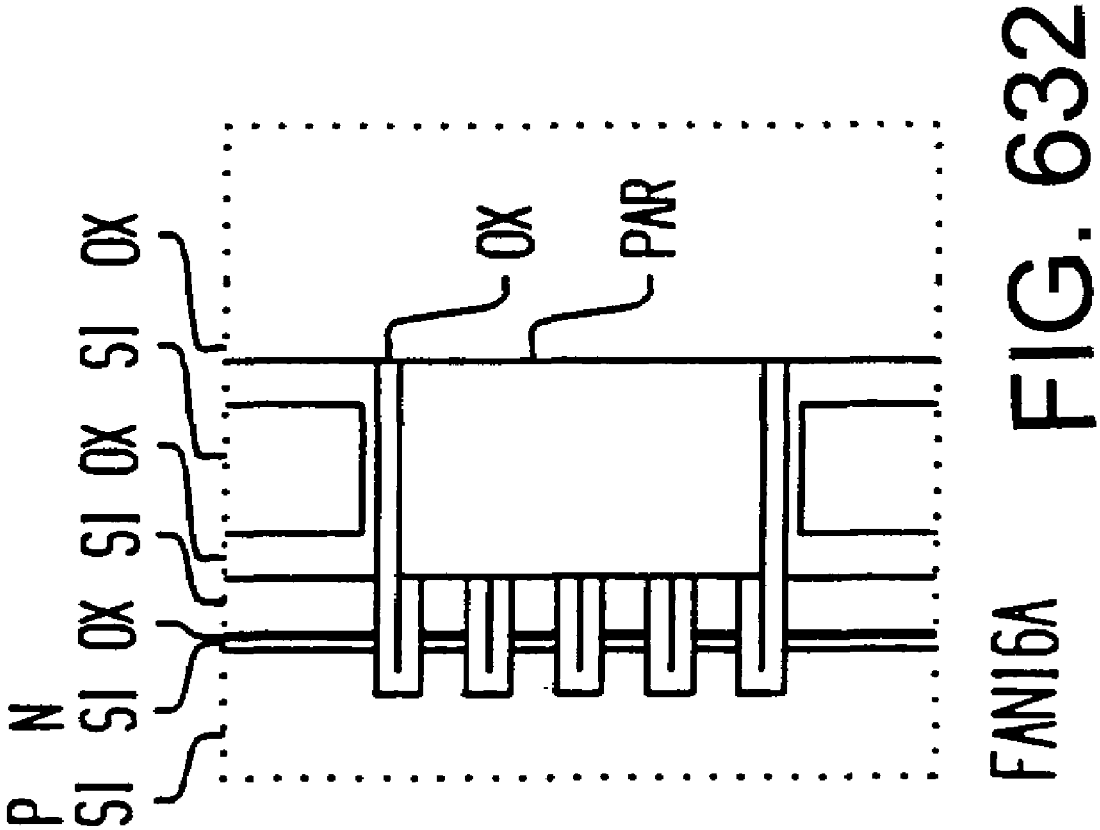
Figure 633:
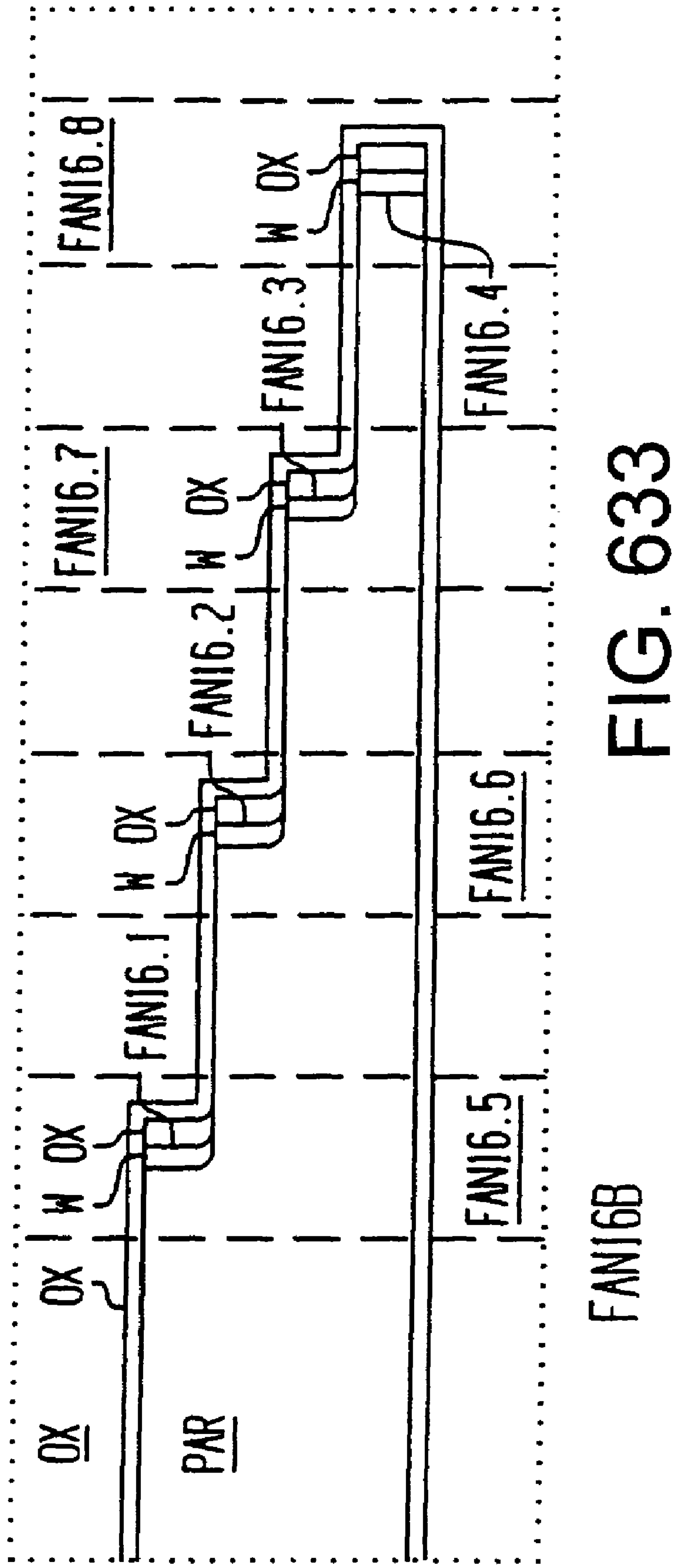

FIG. 632 and FIG. 633 illustrate a cross-section and a top view of the trench, respectively, with the trench filled with second insulating material and the top surface planarized, with the top view showing the mosaic of exposed regions of metal, and first and second insulating materials, as well as suggested metal bus traces connecting to the metal regions.

Figure 634:
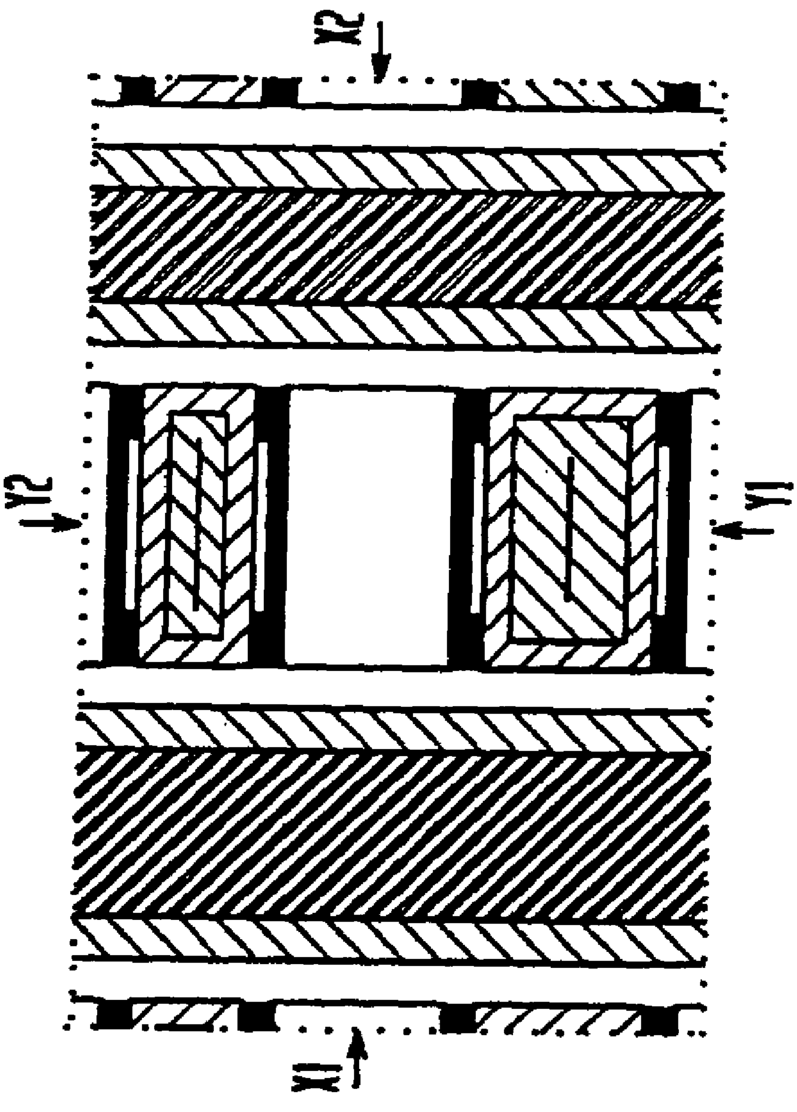
Figure 635:
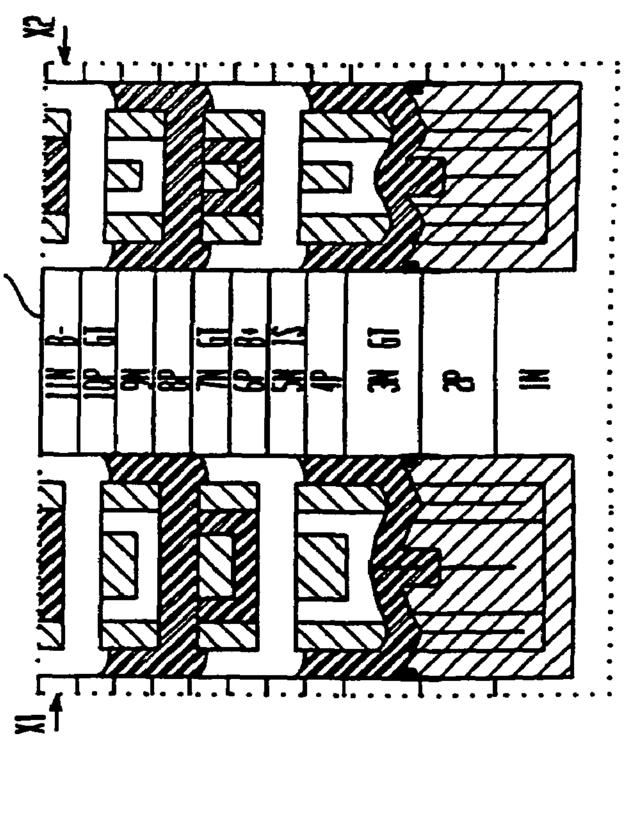
Figure 636:
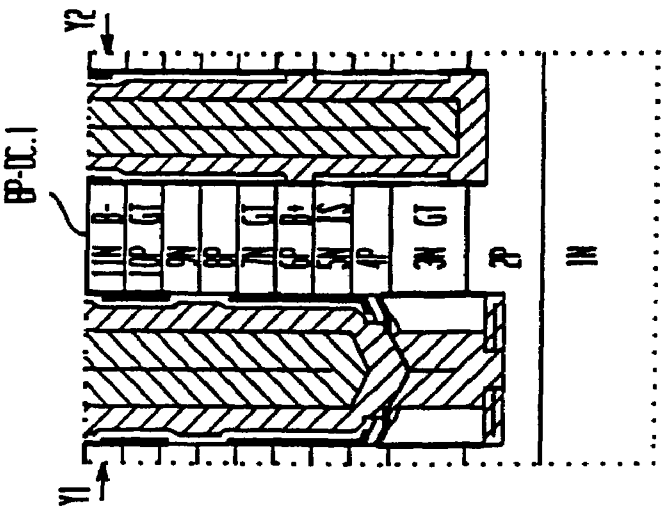

FIGS. 634, 635 and 636 depict three mutually orthogonal cross-sections of the lower half of the structure of FIGS. 455, 456 and 457.

Figure 637:
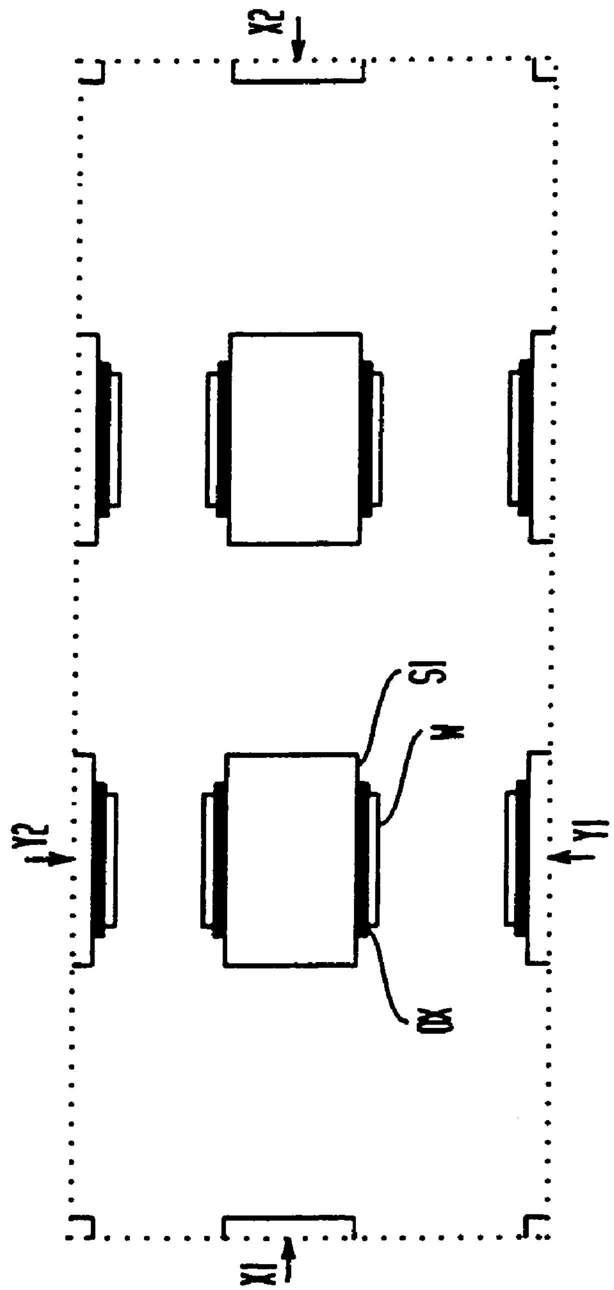

FIGS. 637, 638 and 639 depict three mutually orthogonal cross-sections of the top of the structure of FIGS. 634, 635 and 636, with the pillar tops elongated upward, with second insulating material forming the trench bottoms, and with alternating ones of the trenches running vertically in FIG. 637 widened, to become the widest trenches.

Figure 640:
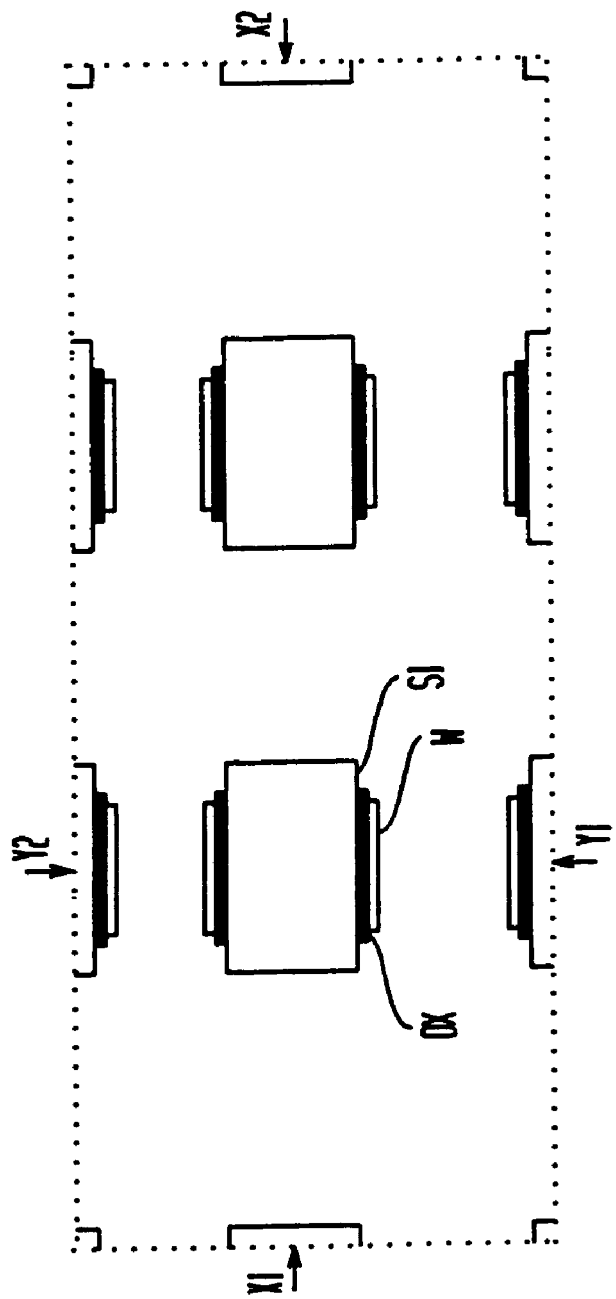
Figure 642:
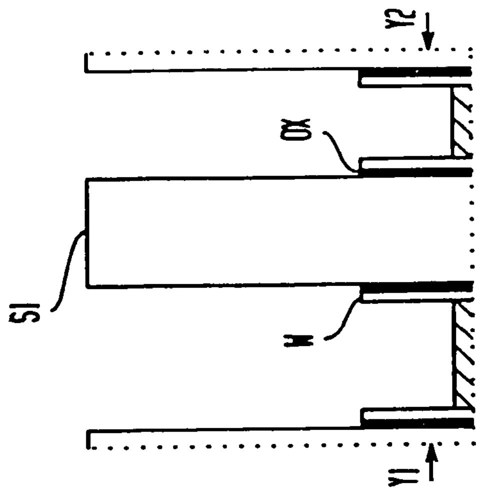
Figure 641:
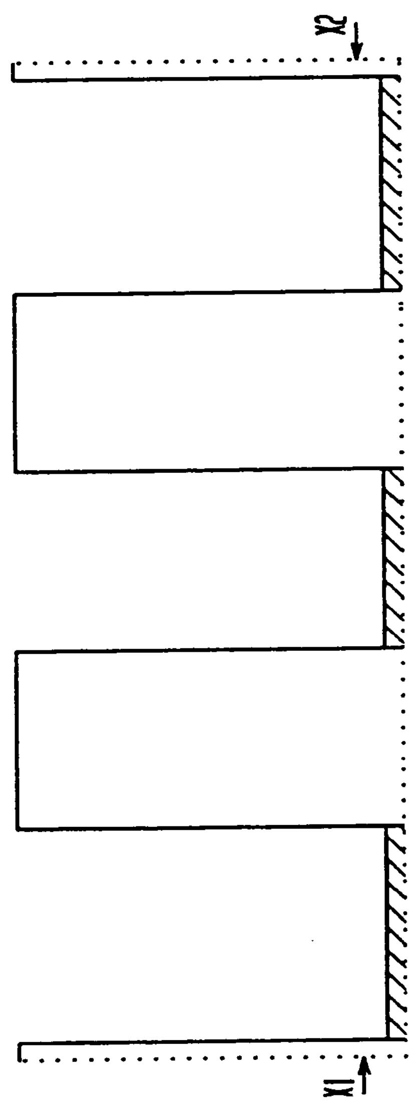

FIGS. 640, 641 and 642 depict the three mutually orthogonal cross-sections, with the tops of the traces of first metal on top of first insulating material on the pillar walls lowered.

Figure 643:
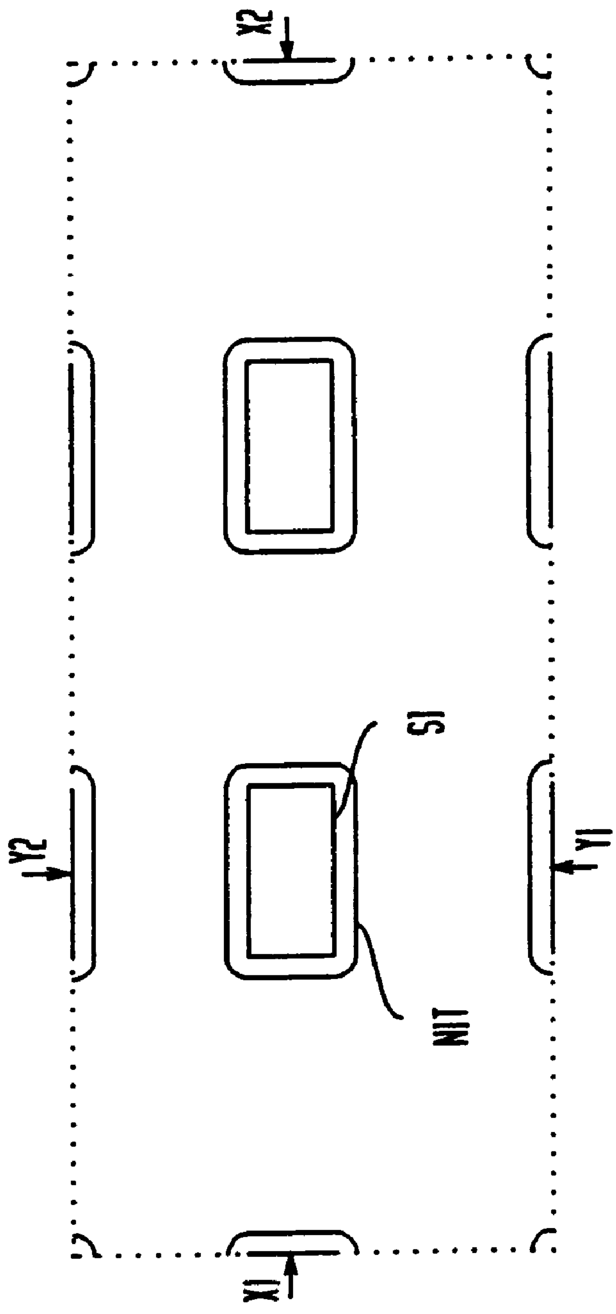
Figure 645:
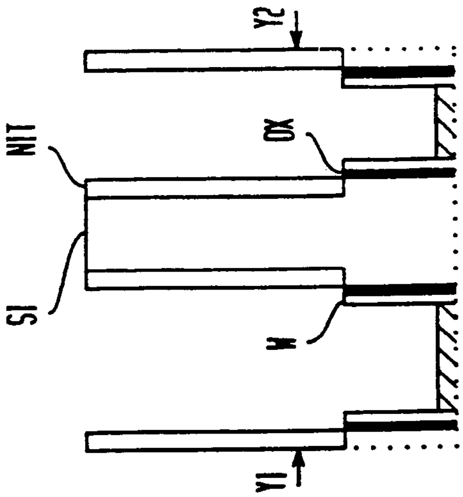
Figure 644:
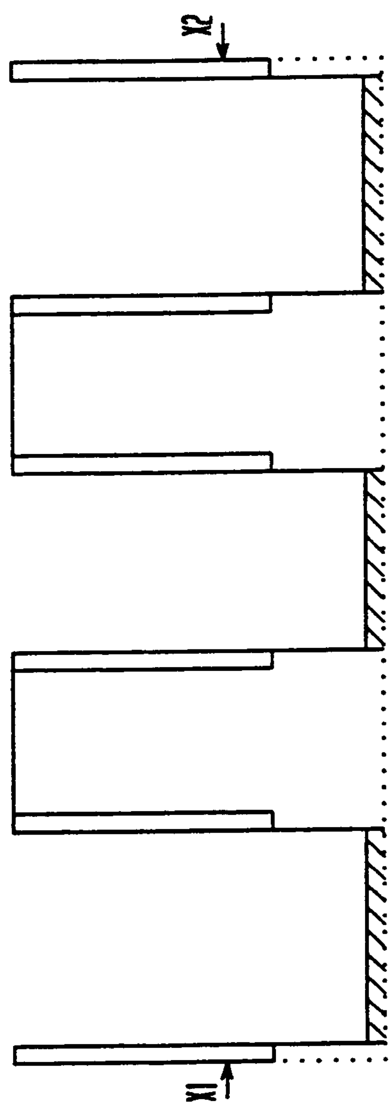

FIGS. 643, 644 and 645 depict the three mutually orthogonal cross-sections, with sleeves of third insulating material inlayed into the top portions of the pillars.

Figure 646:
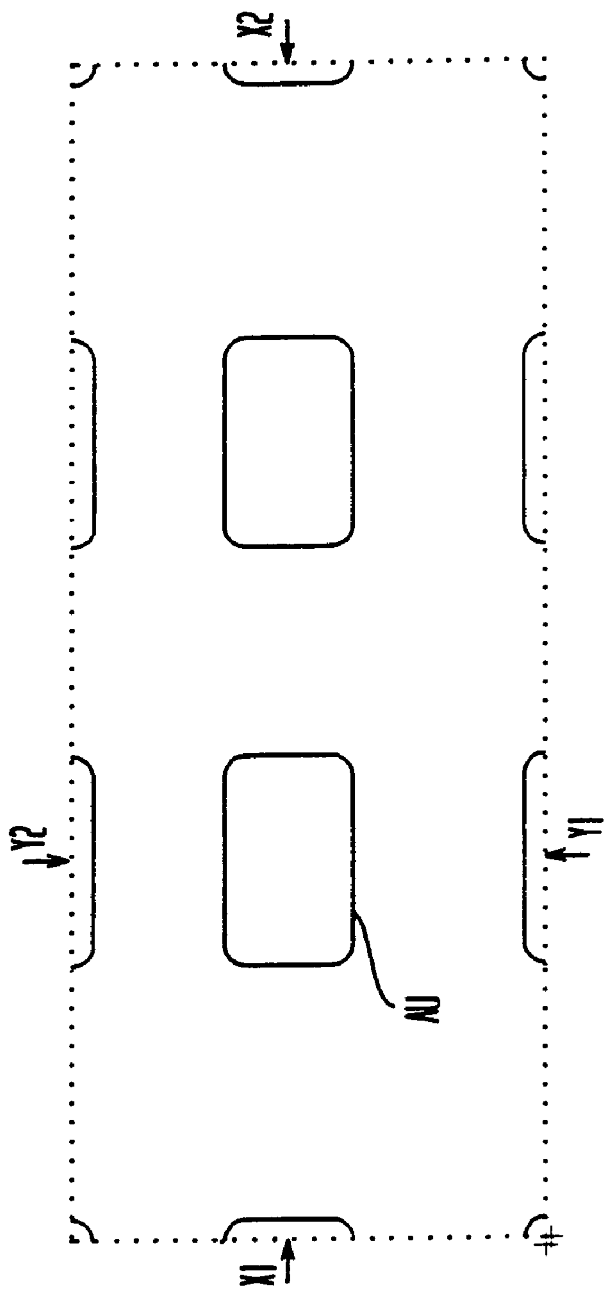
Figure 648:
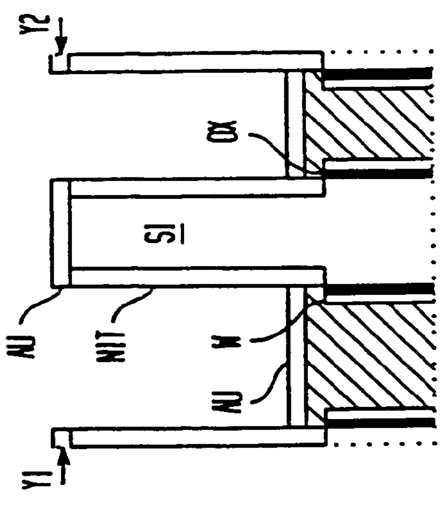
Figure 647:
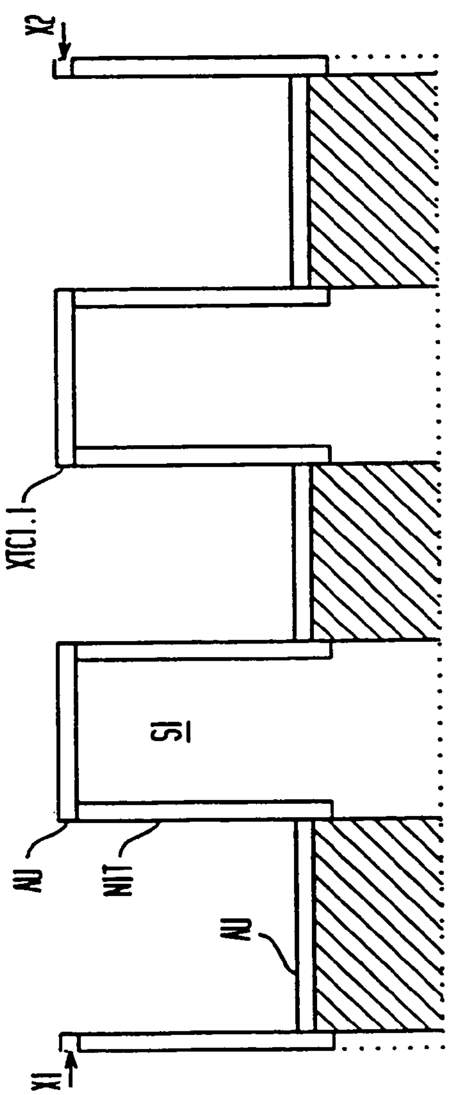

FIGS. 646, 647 and 648 depict the three mutually orthogonal cross-sections, with a protective layer covering the tops of the pillars and the bottoms of the trenches.

Figure 649:
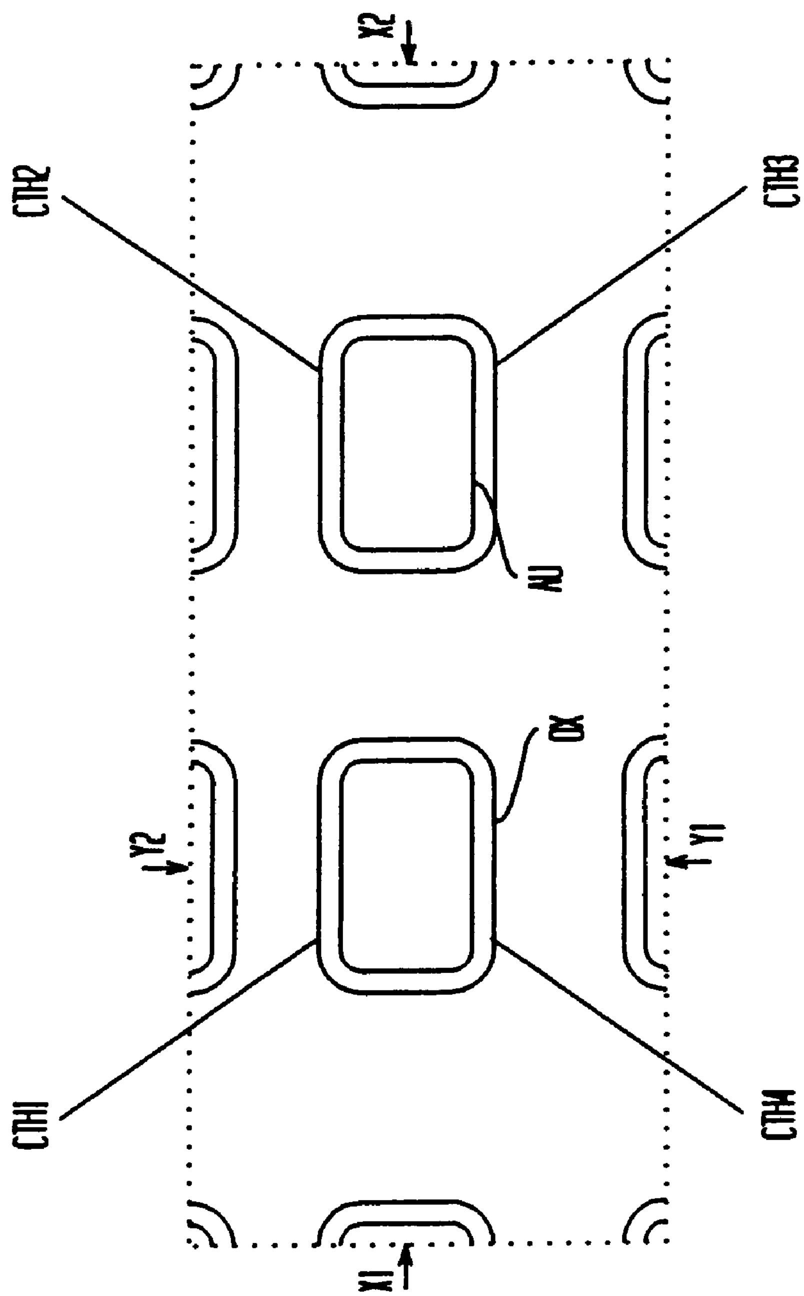
Figure 651:
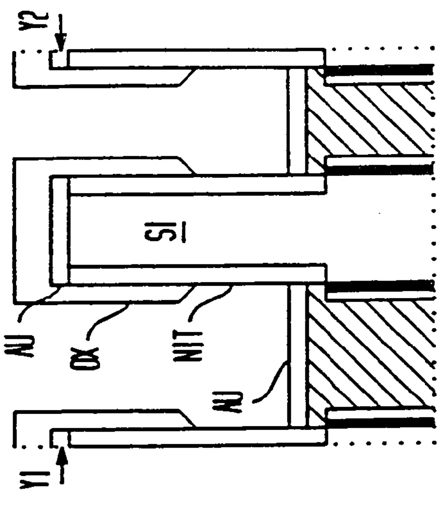
Figure 650:
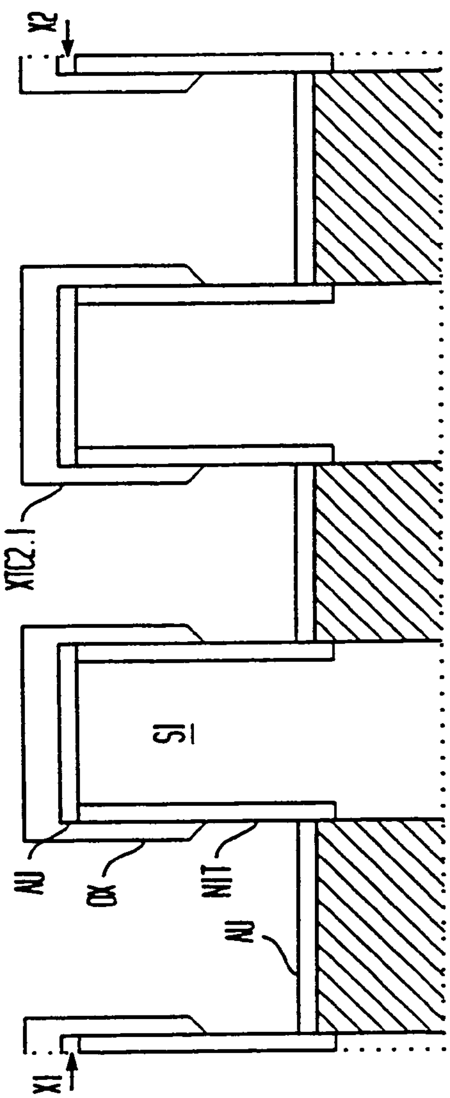

FIGS. 649, 650 and 651 depict the three mutually orthogonal cross-sections, with the top portions of the pillars covered by hats of first insulating material.

Figure 652:
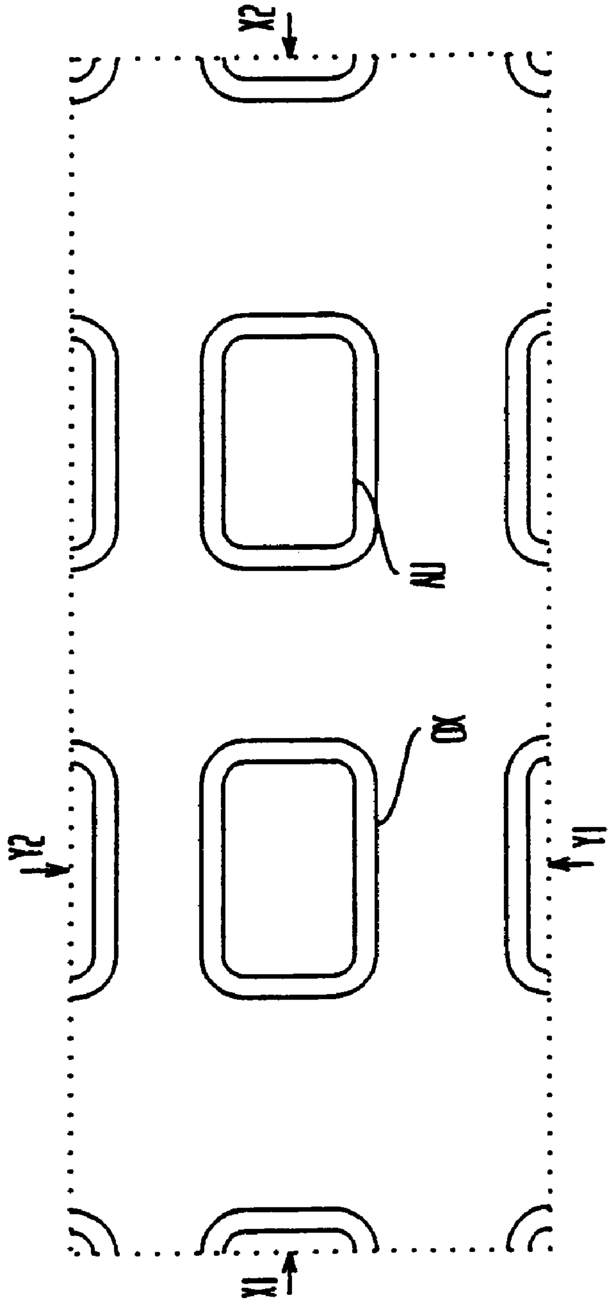
Figure 654:
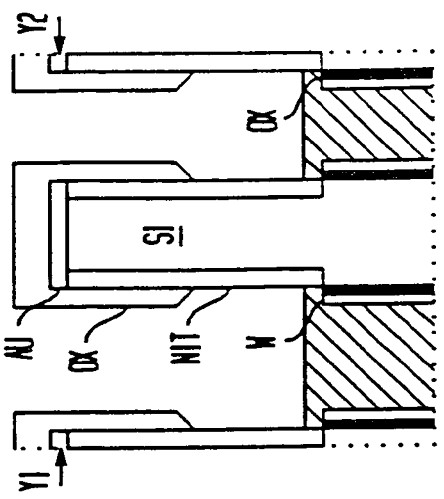
Figure 653:
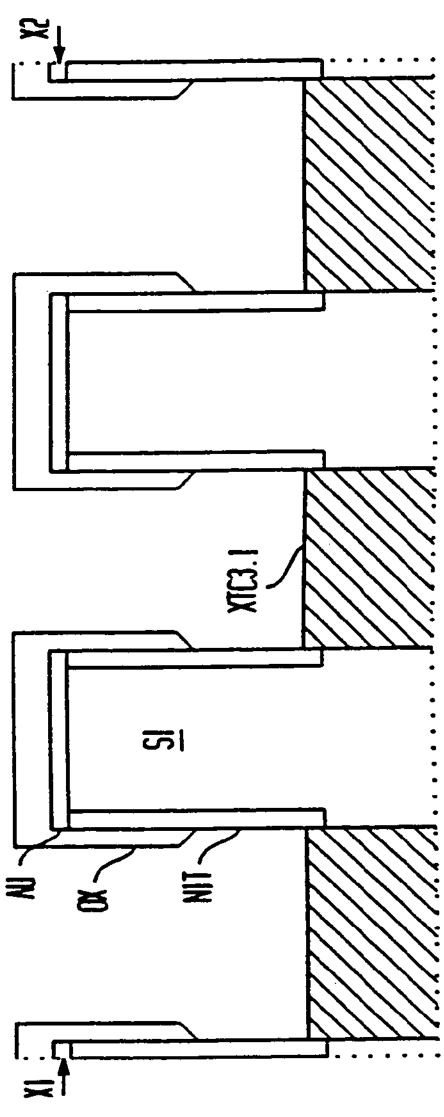

FIGS. 652, 653 and 654 depict the three mutually orthogonal cross-sections, with the protective layer removed from the bottoms of the trenches.

Figure 655:
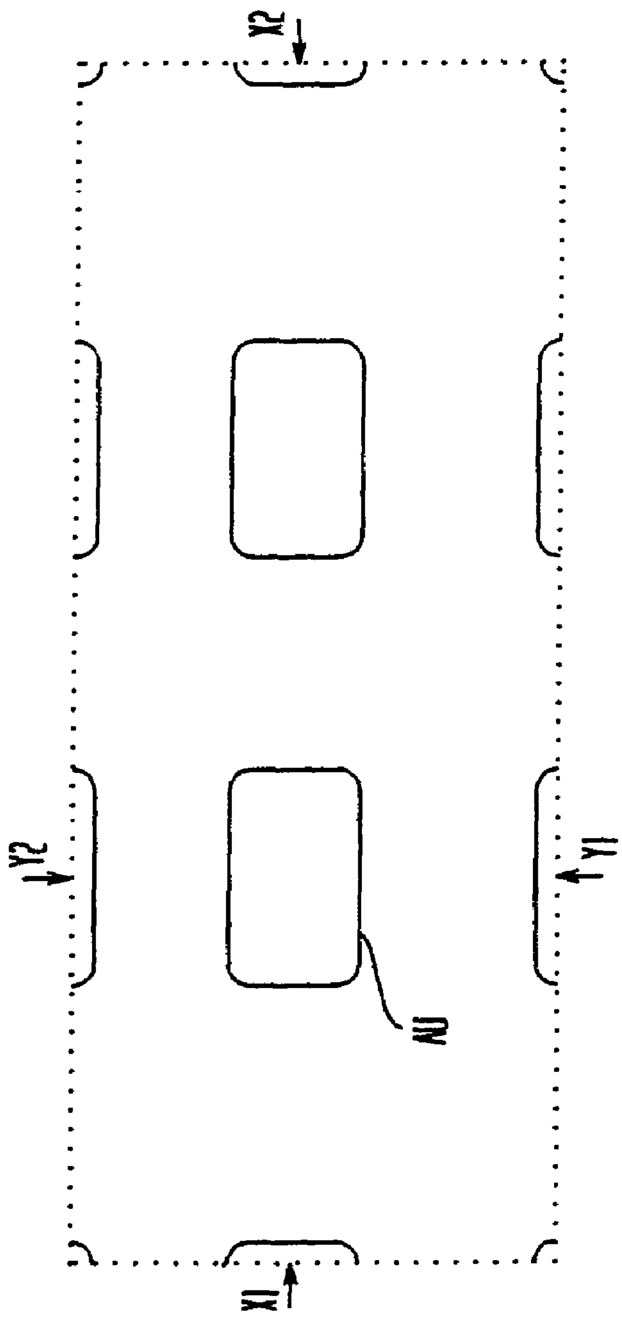
Figure 657:
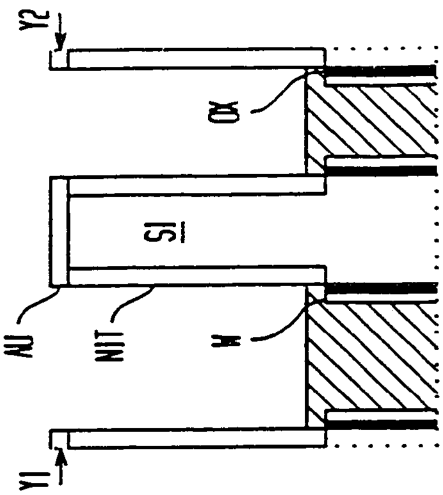
Figure 656:
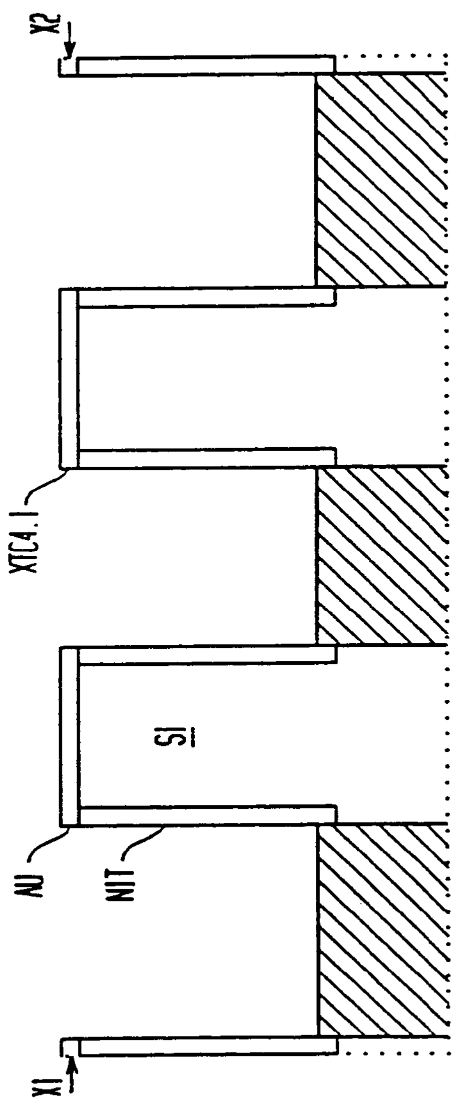

FIGS. 655, 656 and 657 depict the three mutually orthogonal cross-sections, with the hats removed from the pillar tops.

Figure 658:
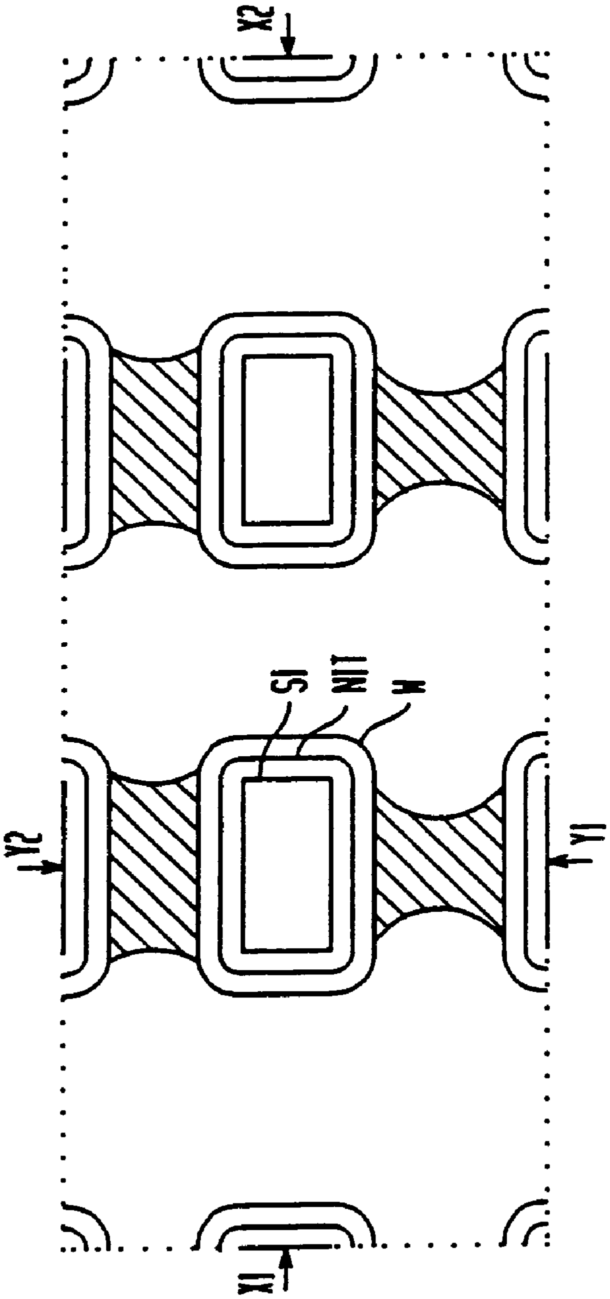
Figure 660:
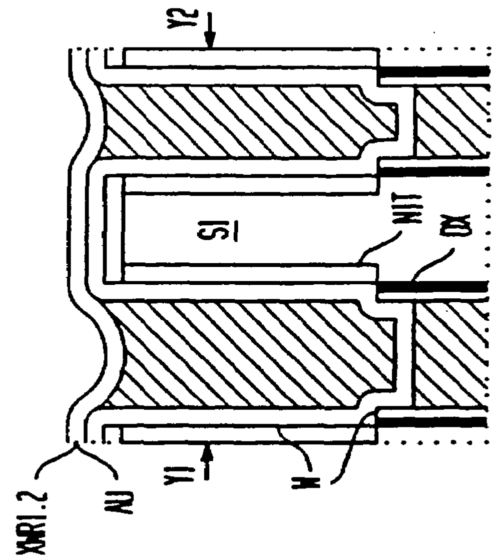
Figure 659:
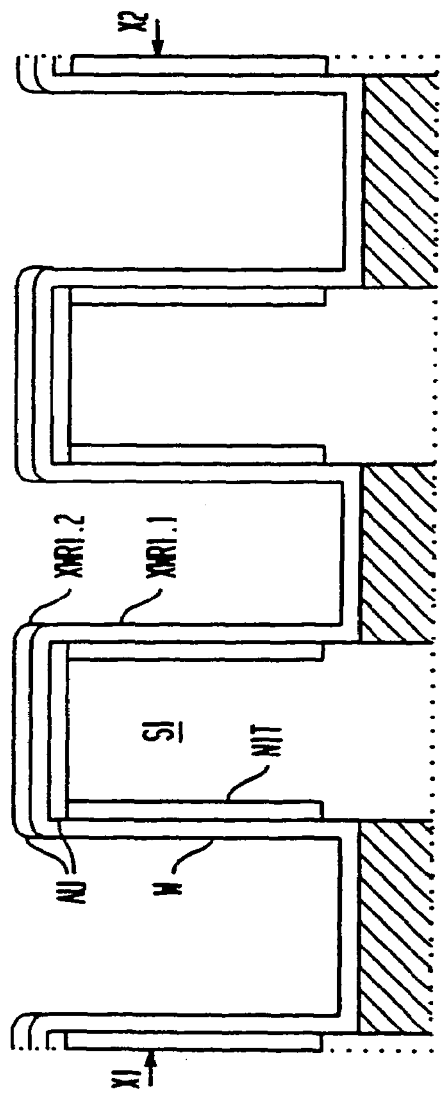

FIGS. 658, 659 and 660 depict the three mutually orthogonal cross-sections, with a layer of first metal covering all surfaces exposed in the previous figure, with walls of second insulating material in the narrowest and second-narrowest trenches, and with a second protective layer covering the tops of these walls and the pillars.

Figure 661:
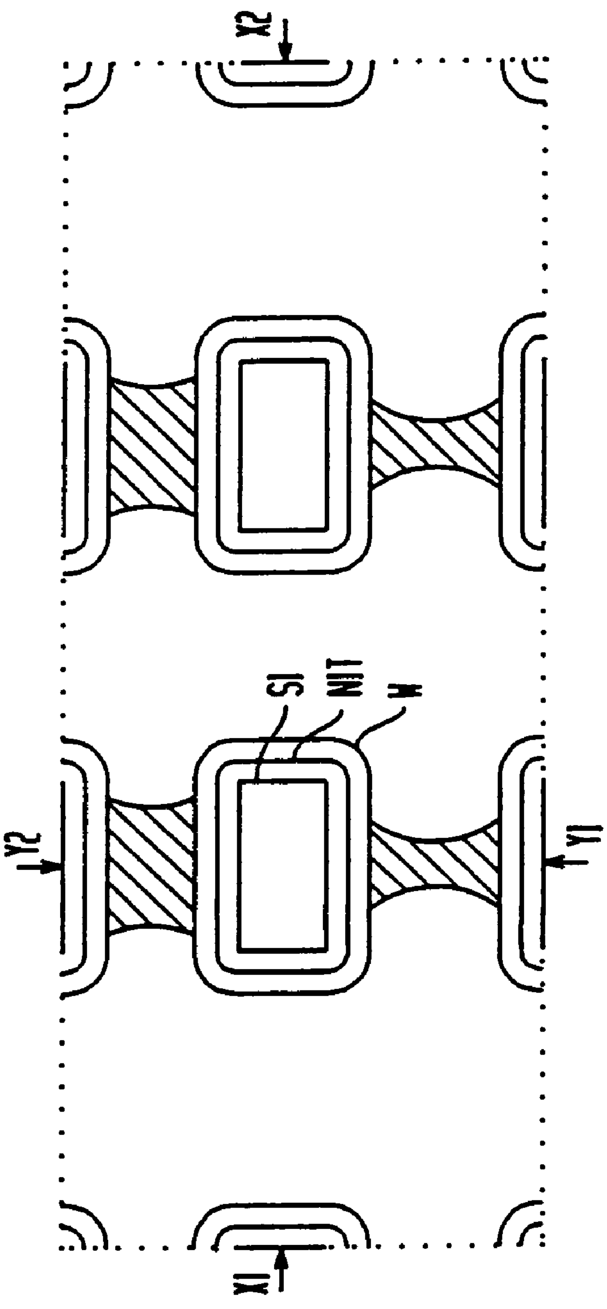
Figure 663:
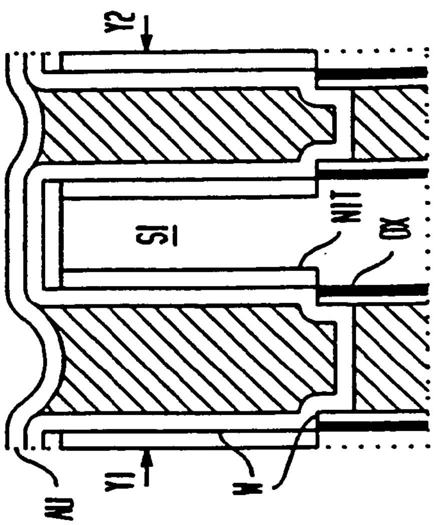
Figure 662:
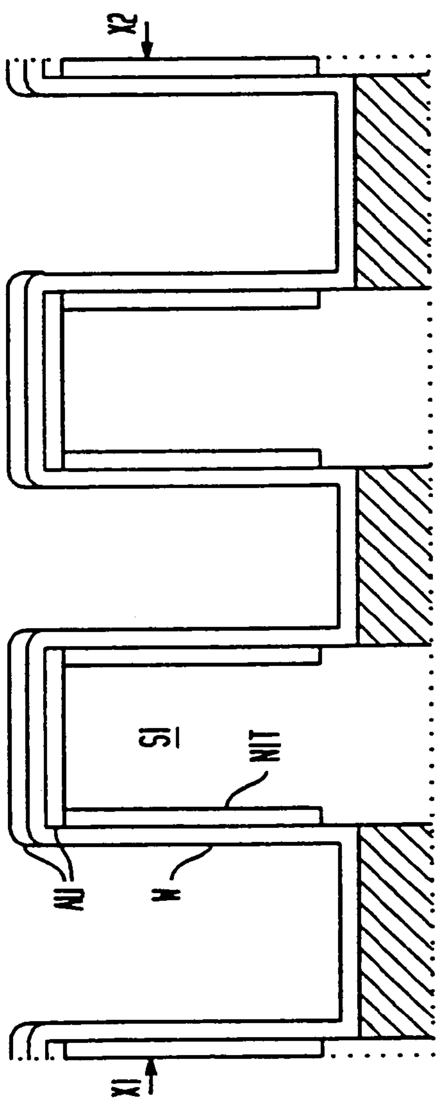

FIGS. 661, 662 and 663 depict the three mutually orthogonal cross-sections, with the walls of second insulating material thinned.

Figure 664:
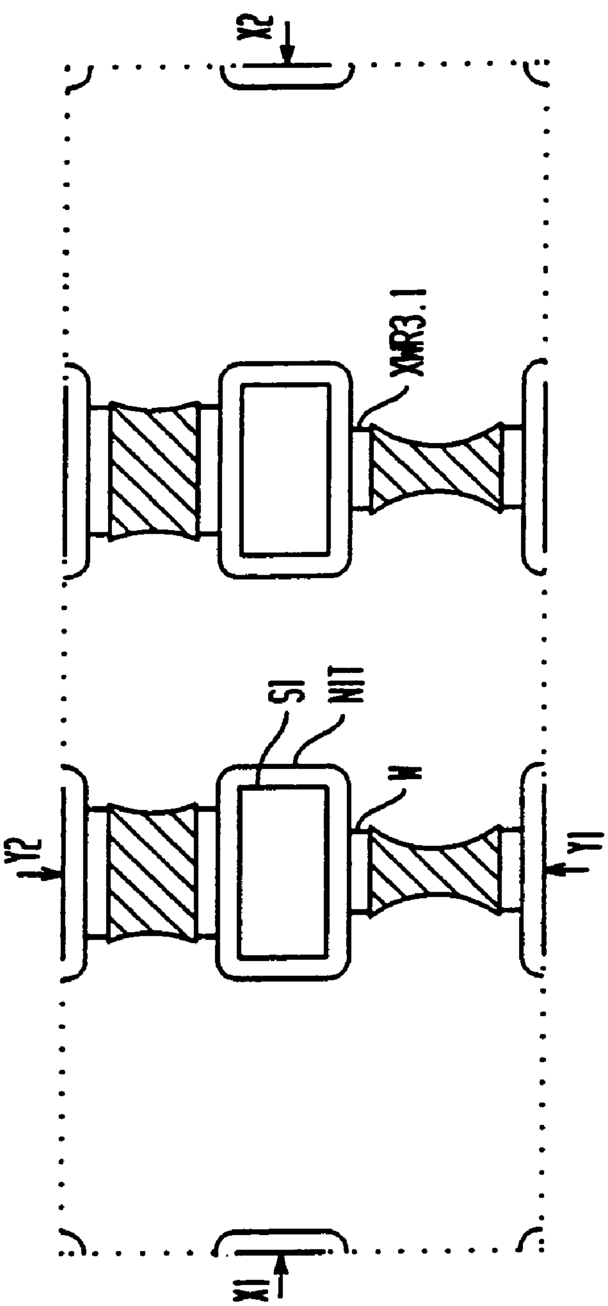
Figure 666:
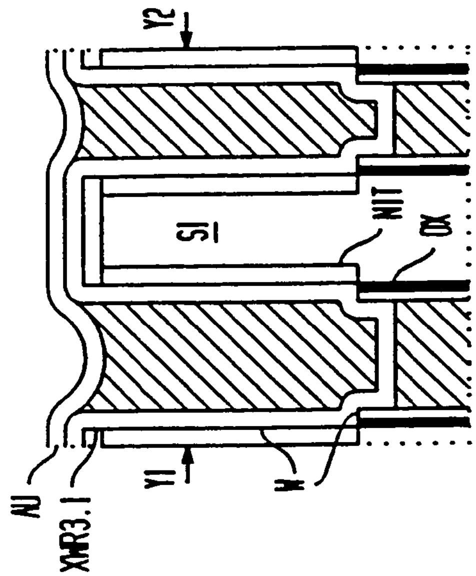
Figure 665:
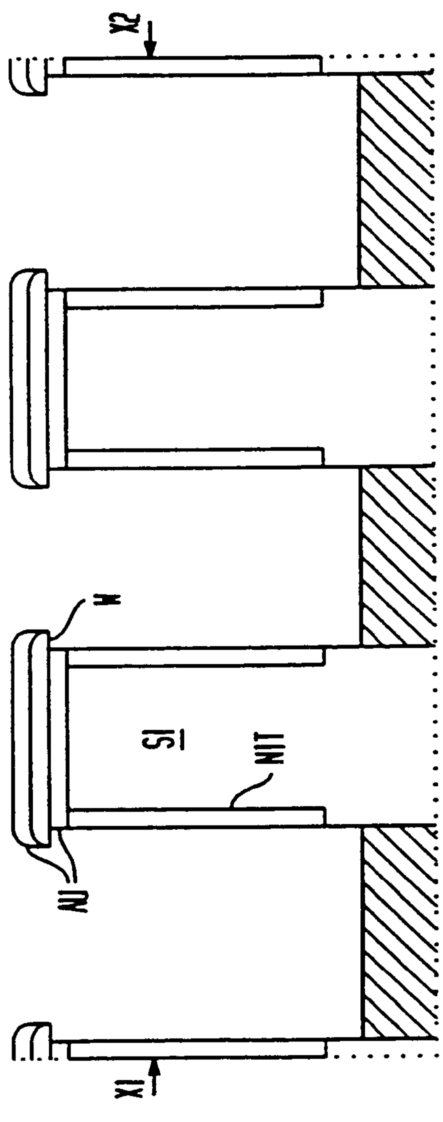

FIGS. 664, 665 and 666 depict the three mutually orthogonal cross-sections, with the layer of first metal remaining only between the walls of second insulating material and the pillars and on the pillar tops.

Figure 667:
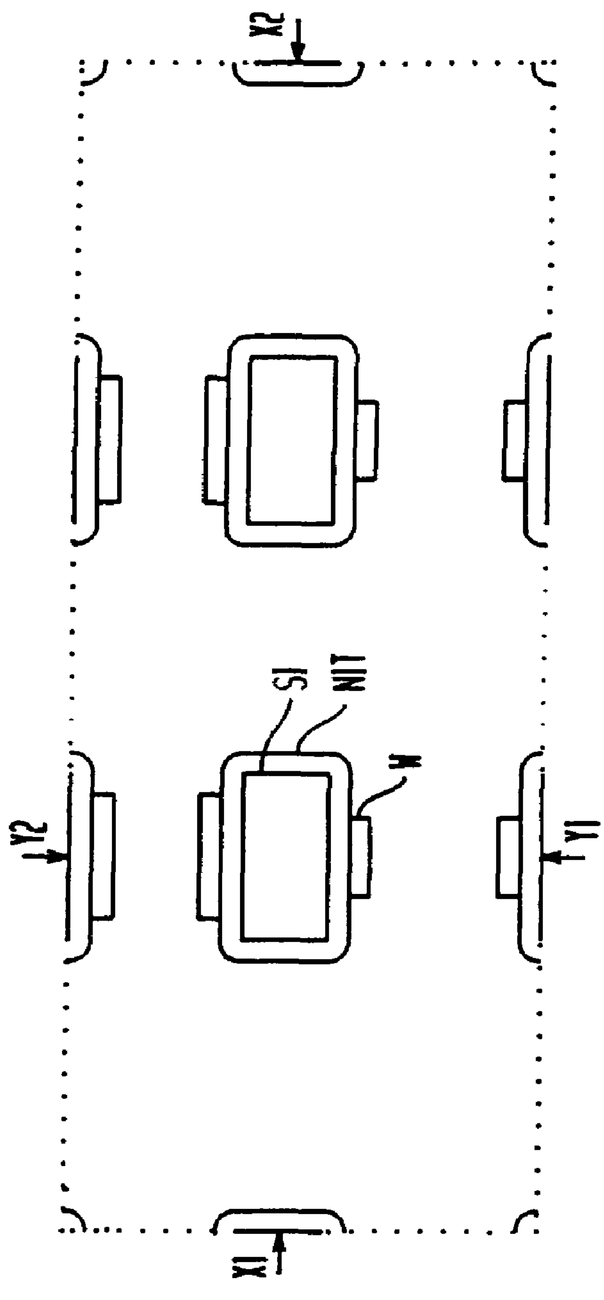
Figure 669:
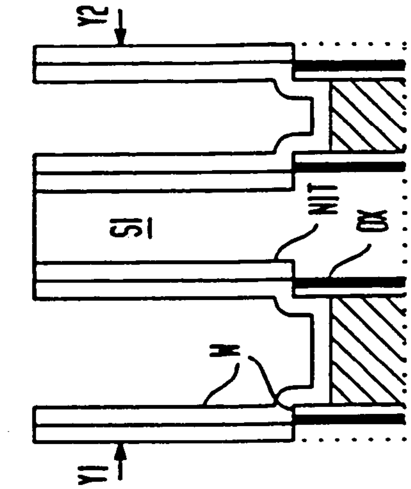
Figure 668:
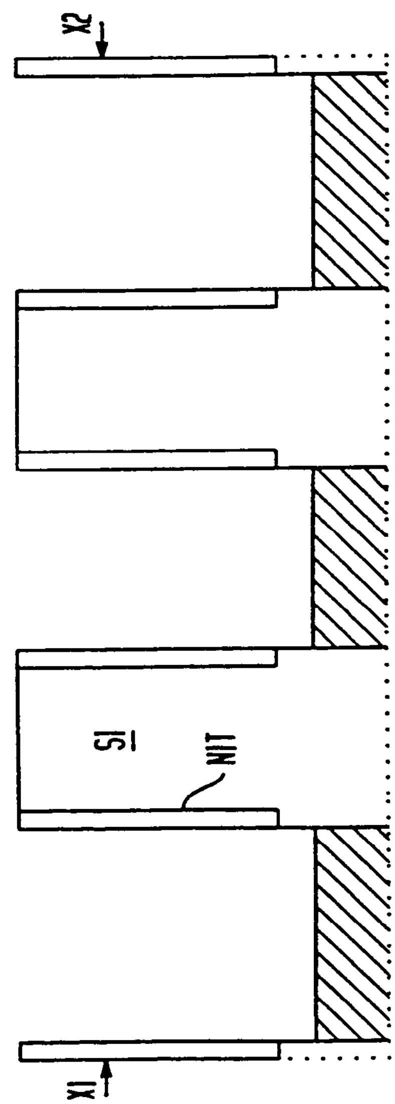

FIGS. 667, 668 and 669 depict the three mutually orthogonal cross-sections, with the pillar tops cleared of the two protective layers and the layer of first metal, and with the walls removed.

Figure 670:
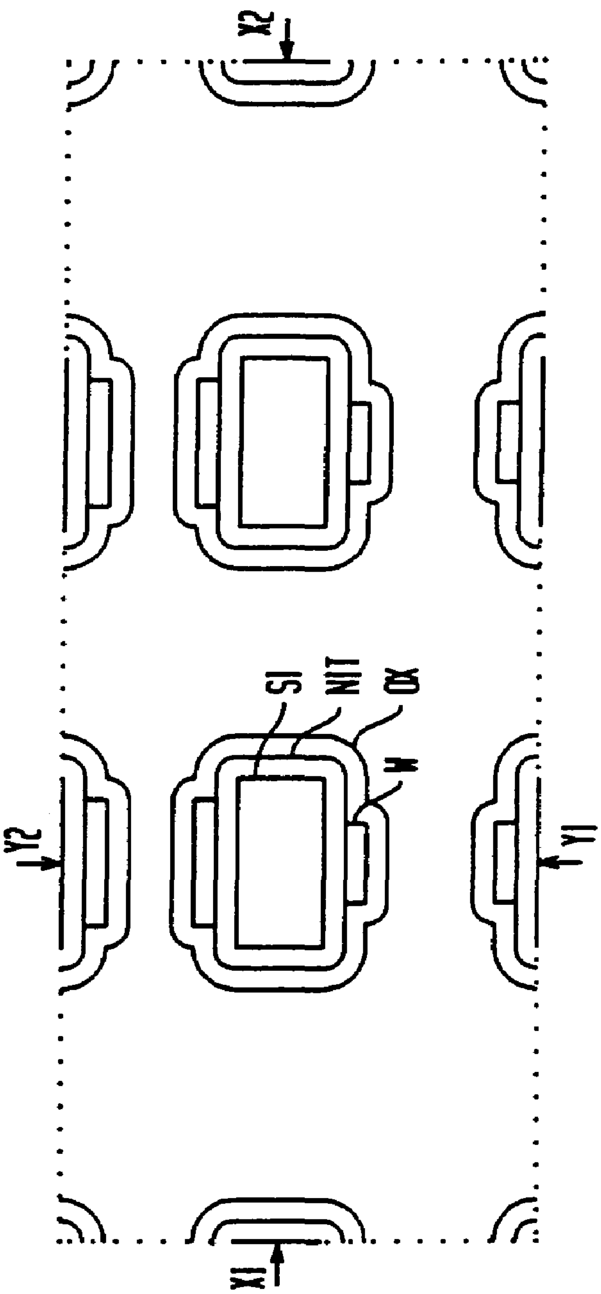
Figure 672:
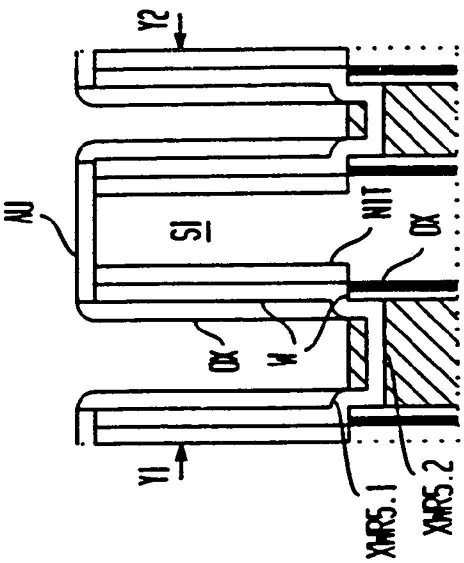
Figure 671:
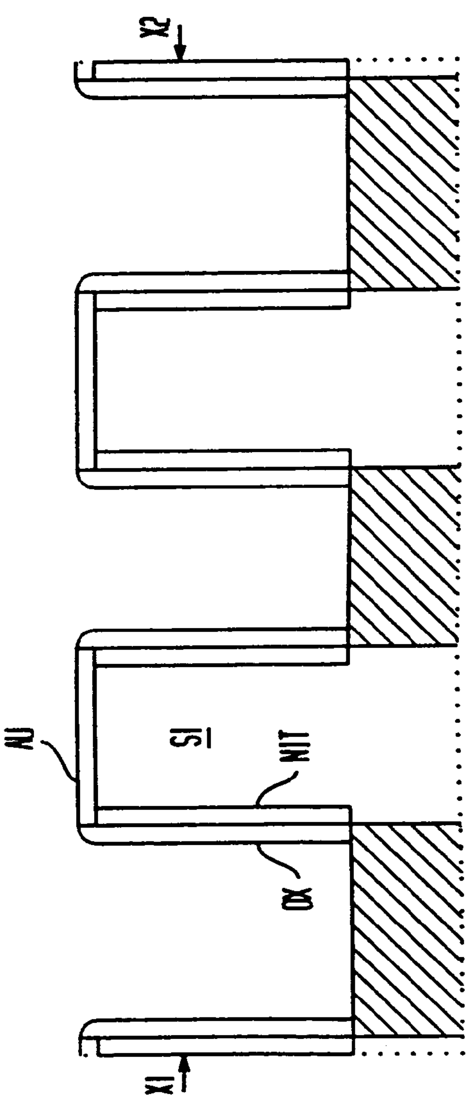

FIGS. 670, 671 and 672 depict the three mutually orthogonal cross-sections, with a protective layer covering the tops of the pillars, and a layer of first insulating material covering the walls of the pillars, and with a layer of second insulating material covering the bottoms of the U-shaped layers of first metal in the narrowest and second-narrowest trenches.

Figure 673:
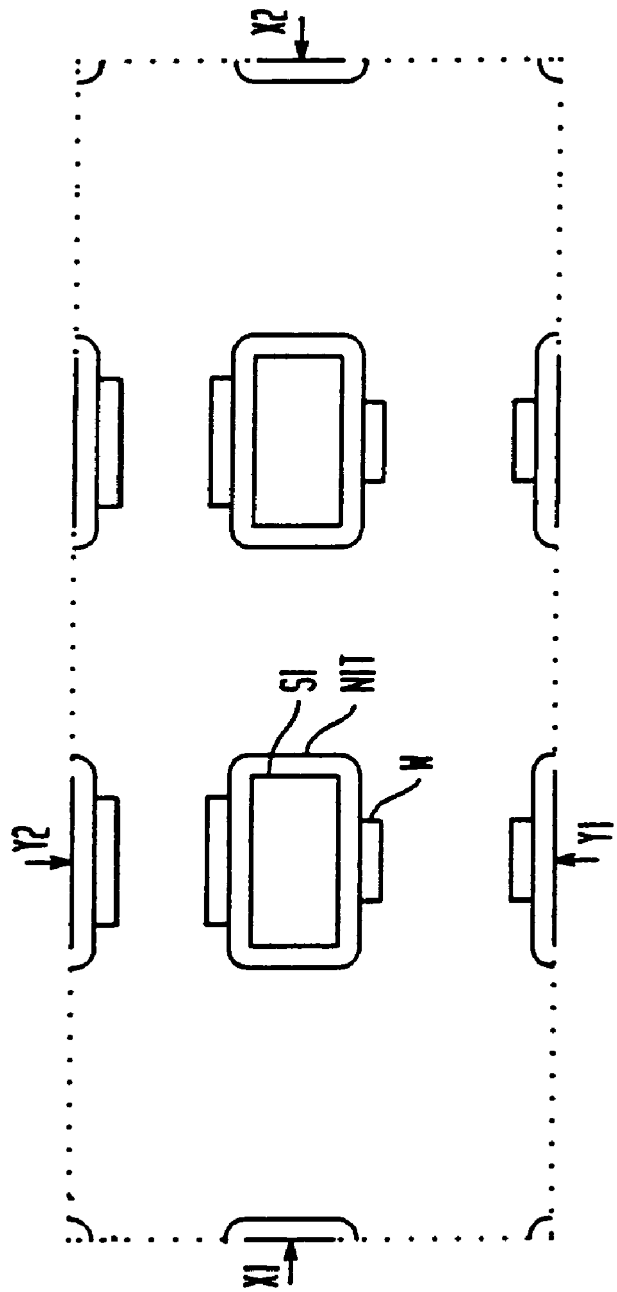
Figure 675:
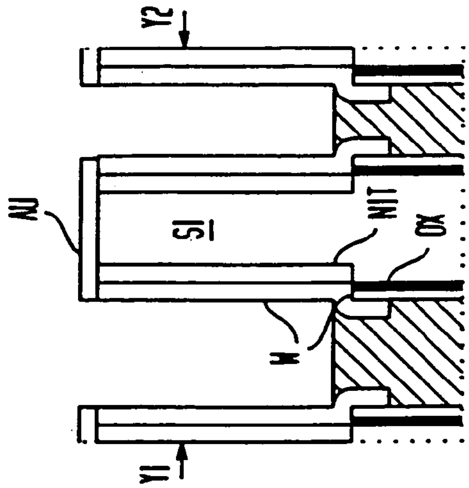
Figure 674:
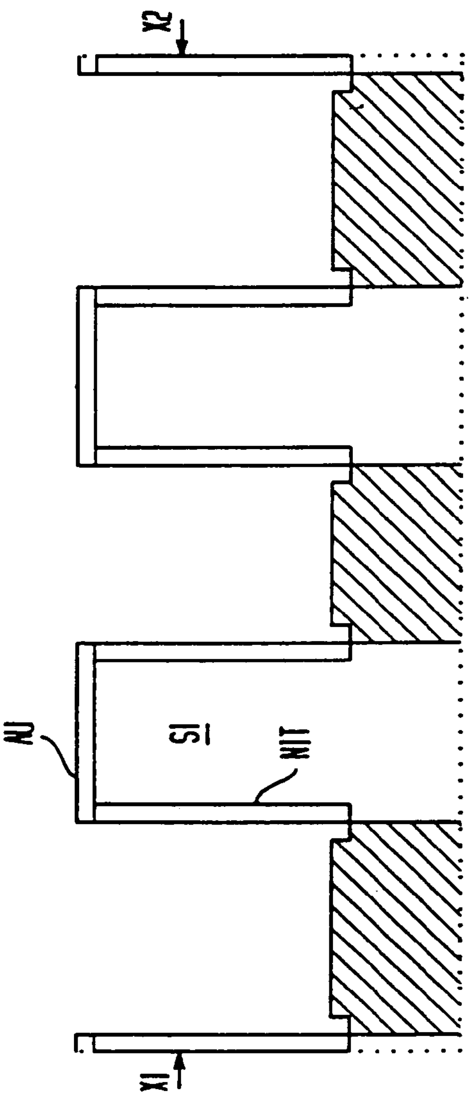

FIGS. 673, 674 and 675 depict the three mutually orthogonal cross-sections, with the bottoms of the U-shaped layers of first metal in the narrowest and second-narrowest trenches removed, and with the pillar walls cleared of the layer of first insulating material.

Figure 676:
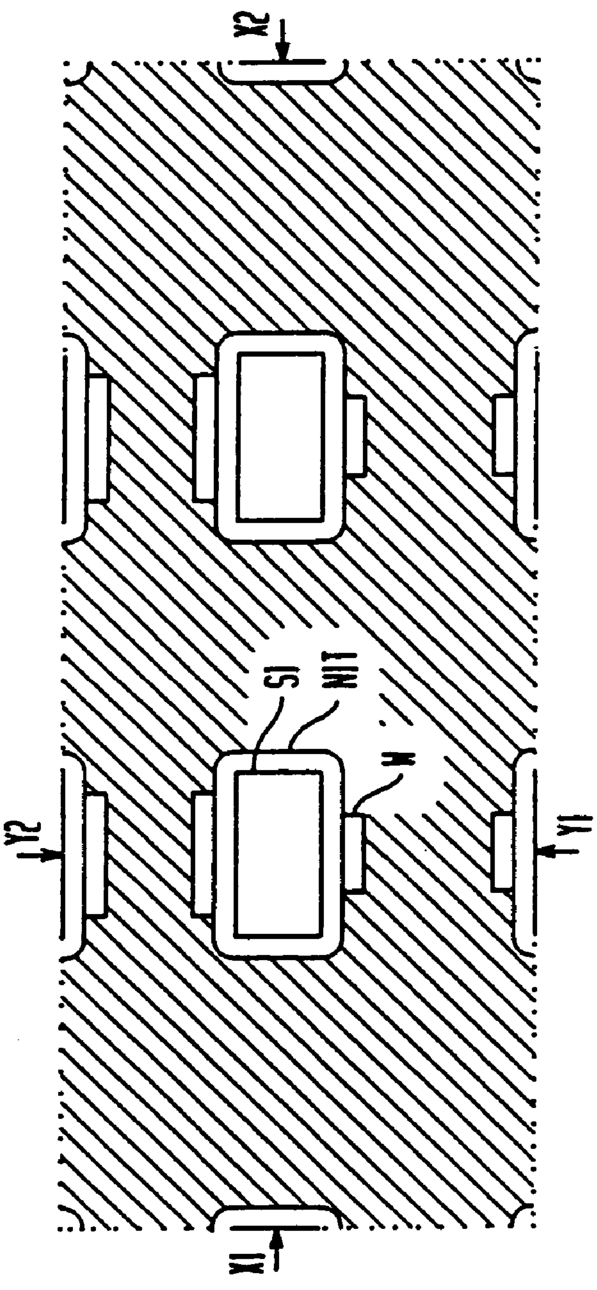
Figure 678:
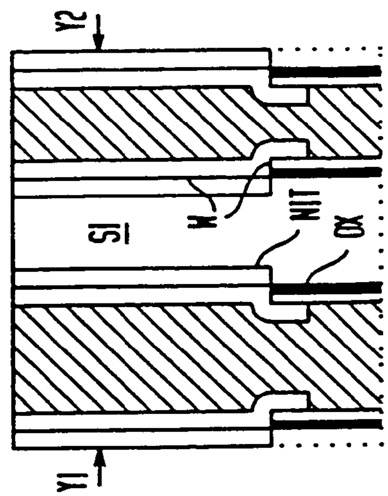
Figure 677:
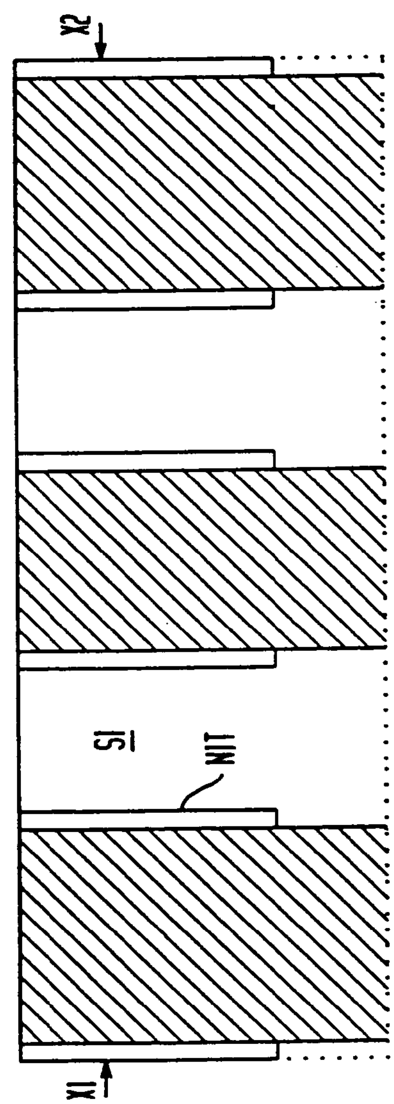

FIGS. 676, 677 and 678 depict the three mutually orthogonal cross-sections, with the pillar tops cleared of the protective layer, and with second insulating material filling all trenches.

Figure 679:
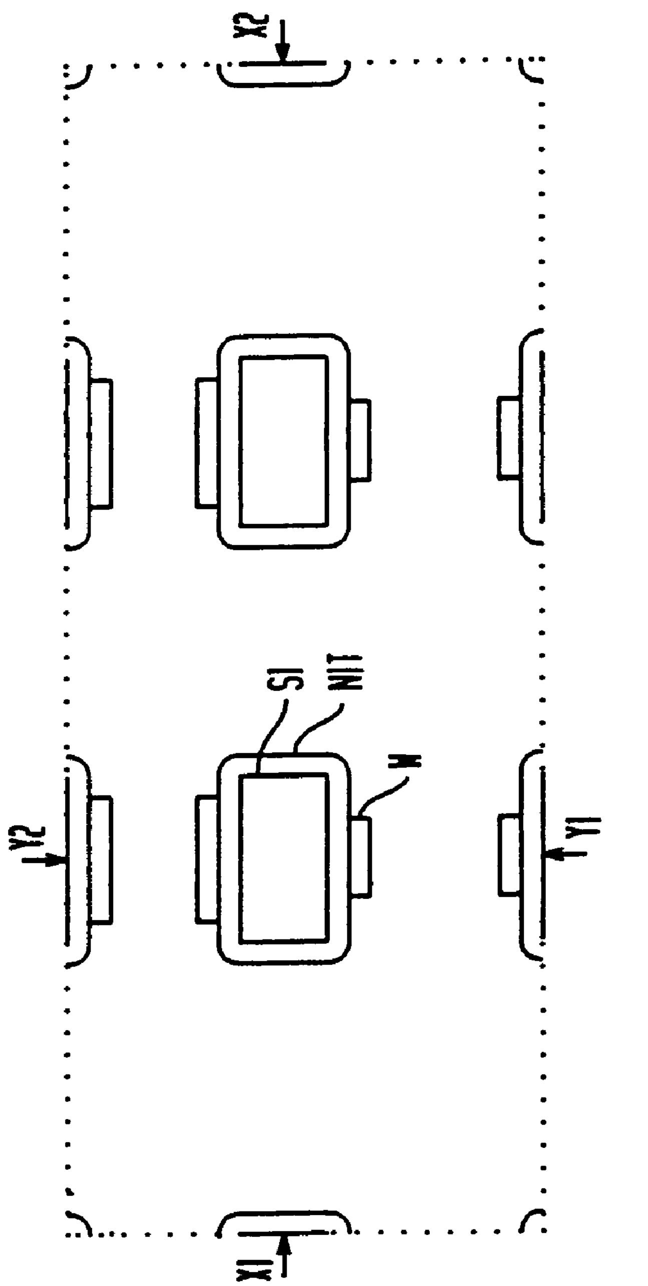
Figure 681:
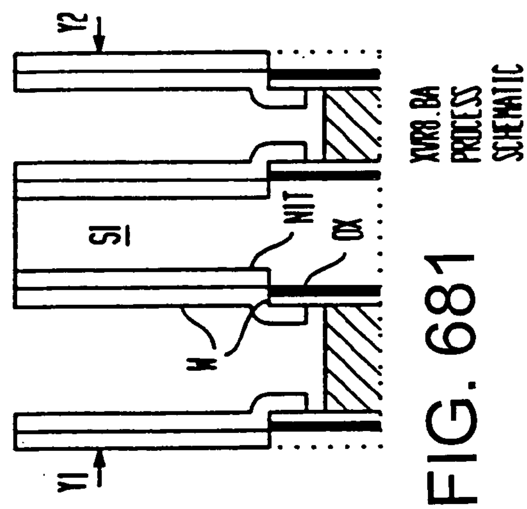
Figure 680:
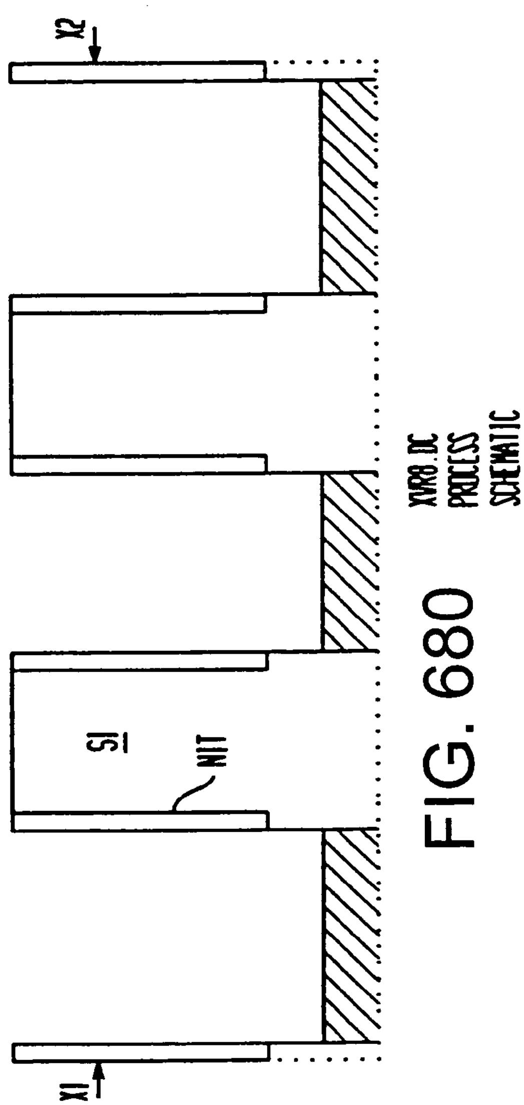

FIGS. 679, 680 and 681 depict the three mutually orthogonal cross-sections, with the trench bottoms of second insulating material below the traces of first metal on top of the sleeves of third insulating material on the pillar walls; with the traces connecting to second traces of first metal leading further down into the structure.

Figure 682:
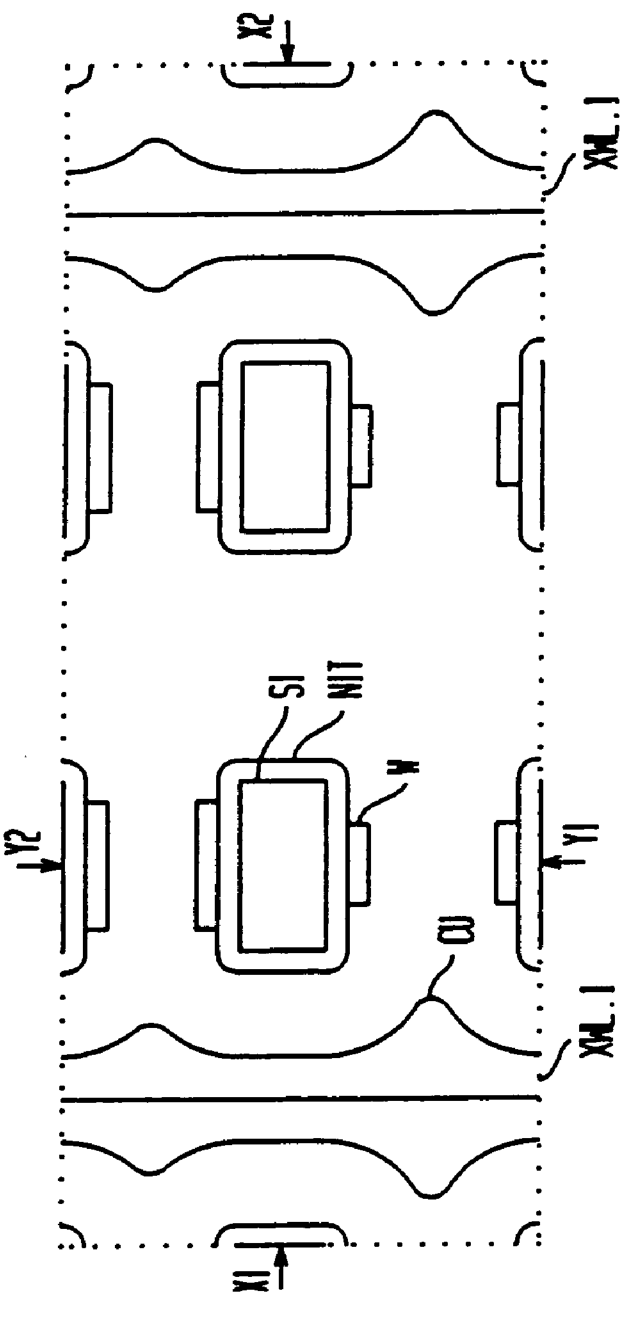
Figure 684:
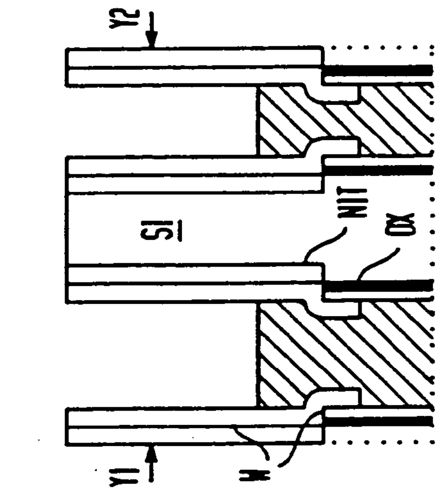
Figure 683:
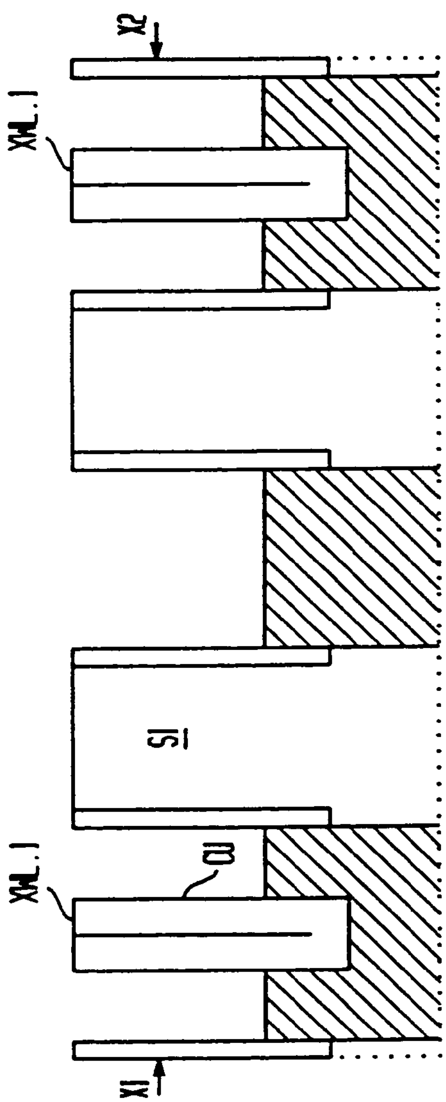

FIGS. 682, 683 and 684 depict the three mutually orthogonal cross-sections, with corrugated walls of a third metal, centered in the widest trenches, and with trench bottoms of second insulating material above the bottom edges of the sleeves of third insulating material.

Figure 685:
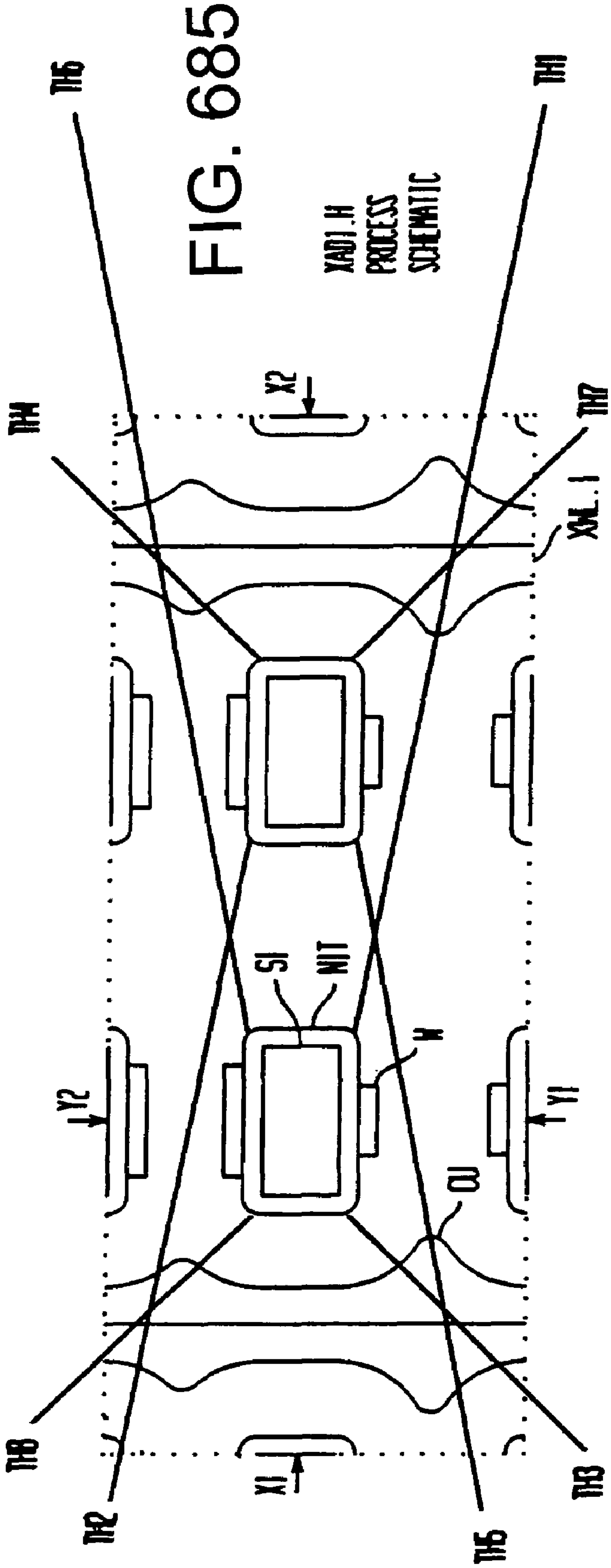
Figure 687:
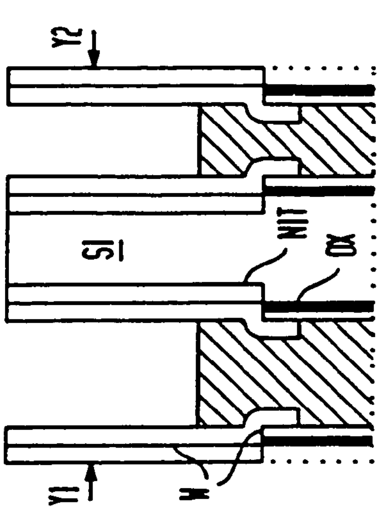
Figure 686:
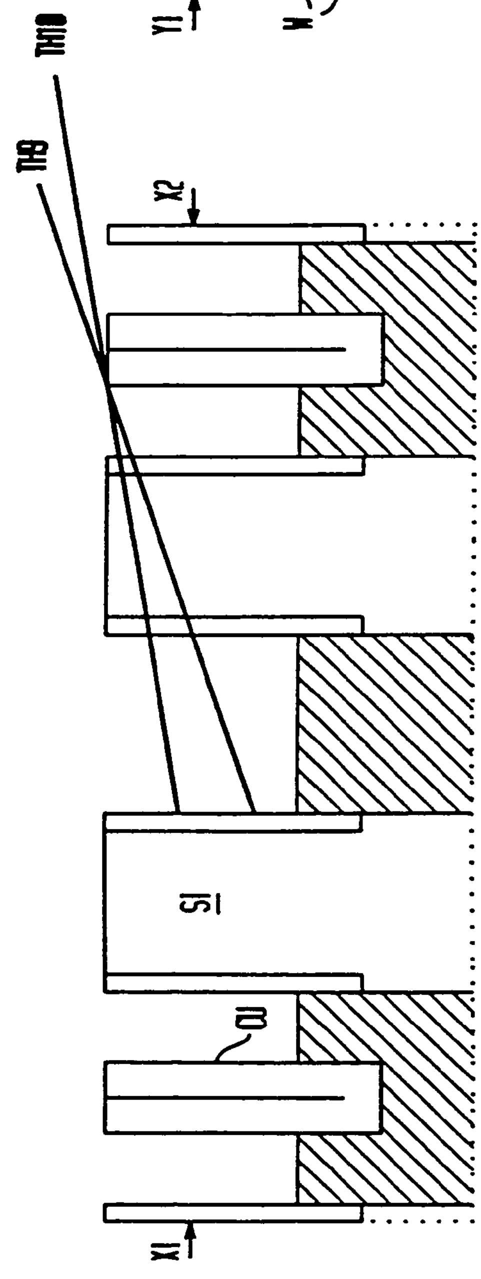

FIGS. 685, 686 and 687 depict a repetition of FIGS. 682, 683 and 684, with certain directions for subsequent directional material depositions indicated by heavy lines.

Figure 688:
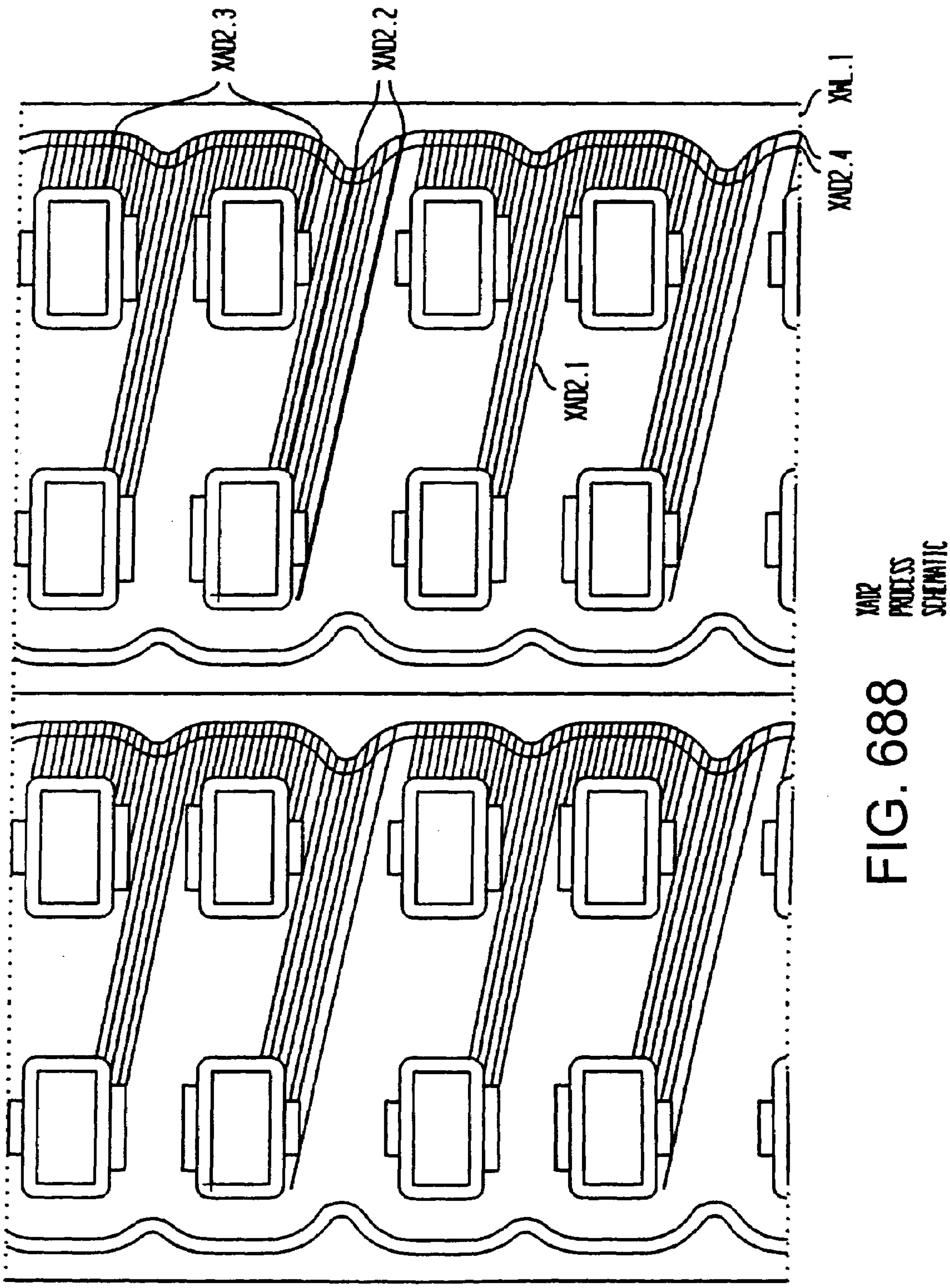

FIG. 688 depicts a top view of sixteen plus fractional pillars and walls, with parallel lines indicating the paths grazing the tops of the walls, of particles in subsequent directional material depositions.

Figure 689:
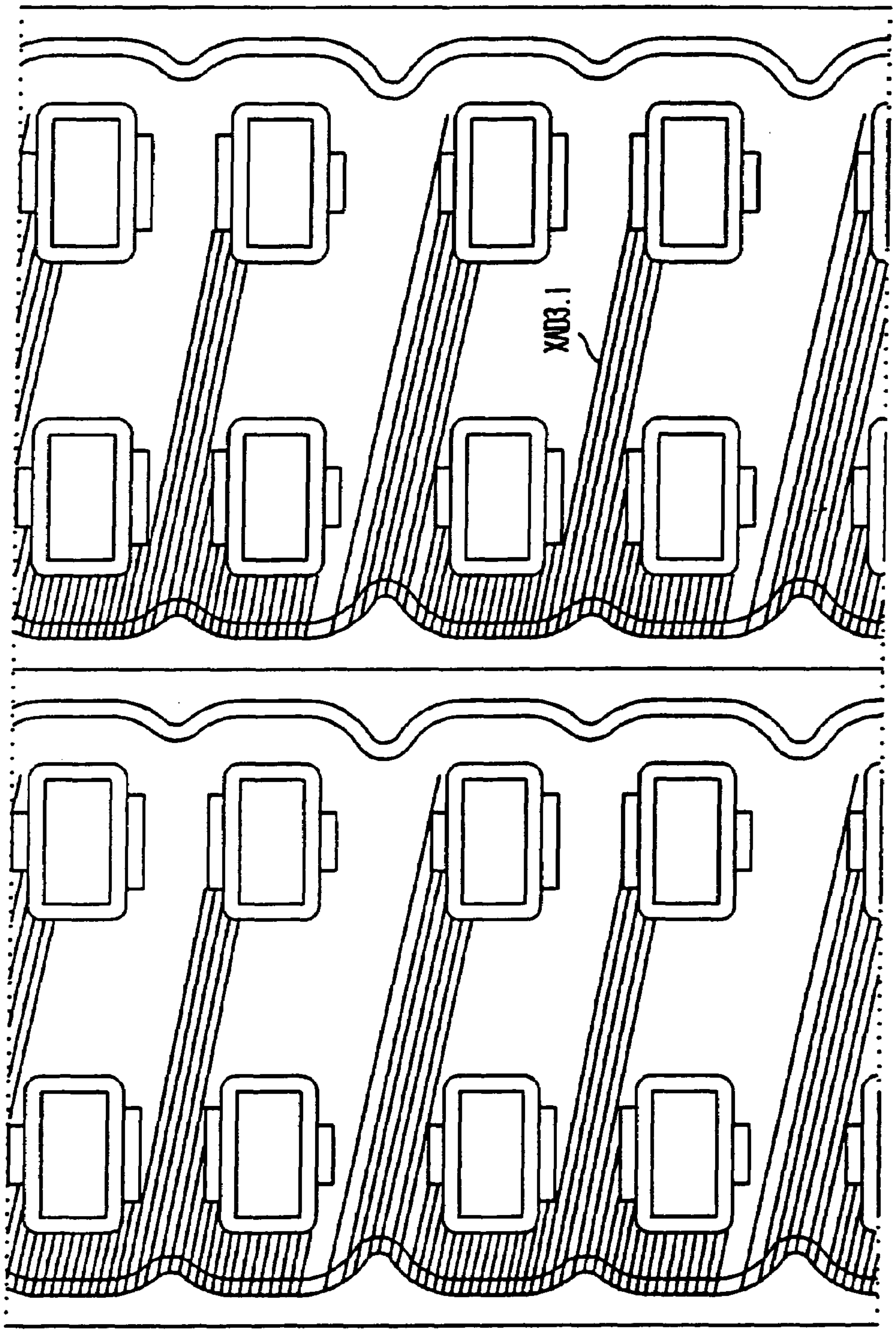

FIG. 689 depicts a repetition of FIG. 688, but with paths for material depositions from the opposite direction.

Figure 690:
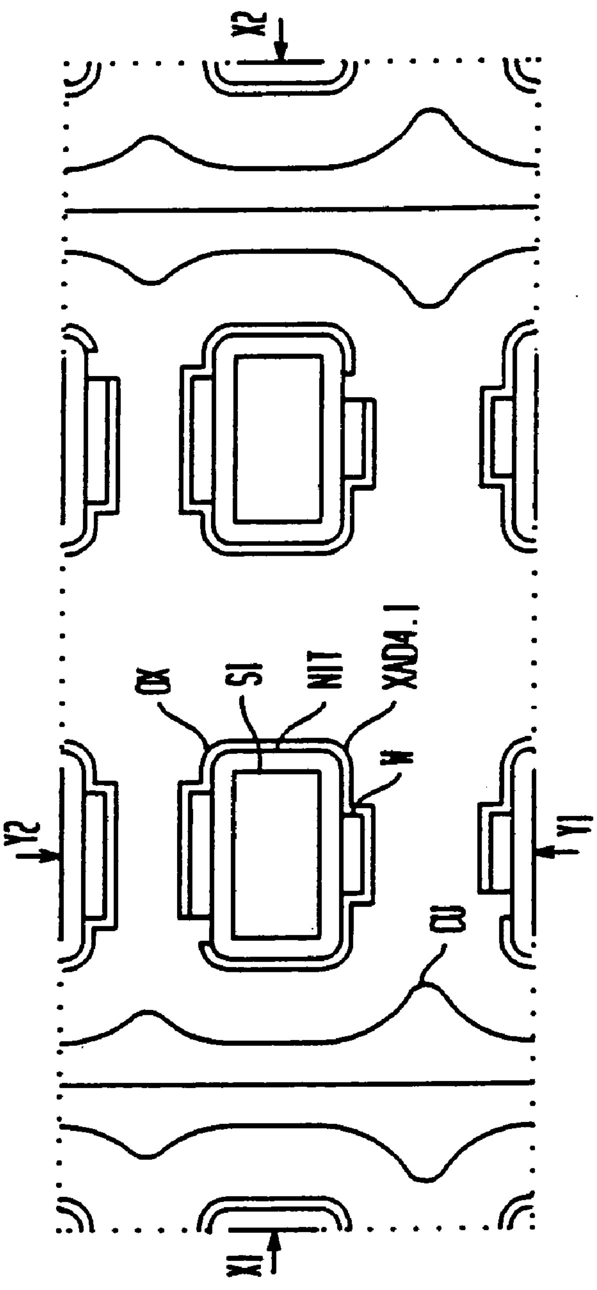
Figure 692:
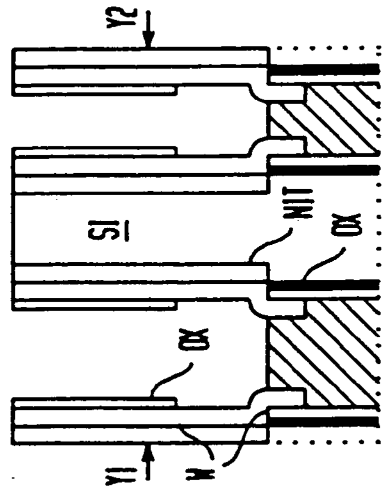
Figure 691:
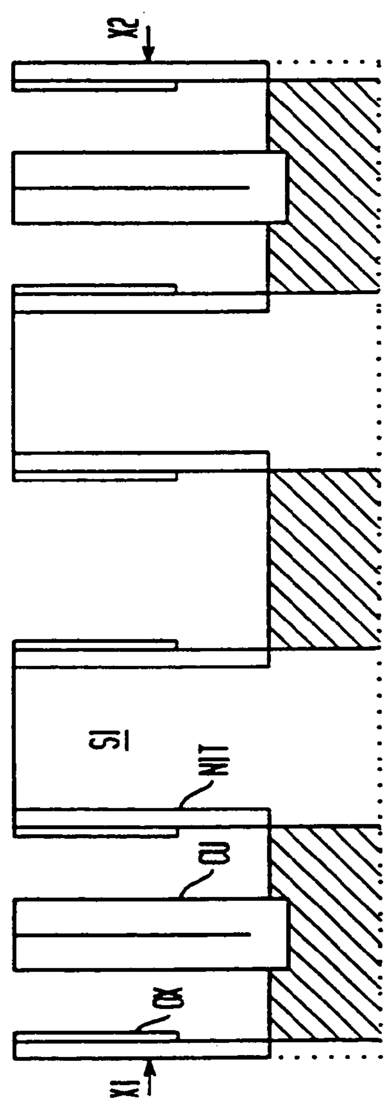

FIGS. 690, 691 and 692 depict the three mutually orthogonal cross-sections, with trench bottoms of second insulating material at the bottom edges of the sleeves of third insulating material, and with a thin layer of first insulating material covering the upper portion of the pillar walls, except (at the height indicated by arrows in FIGS. 691 and 692 (in a gap adjacent to one edge of one first metal trace on each pillar.

Figure 693:
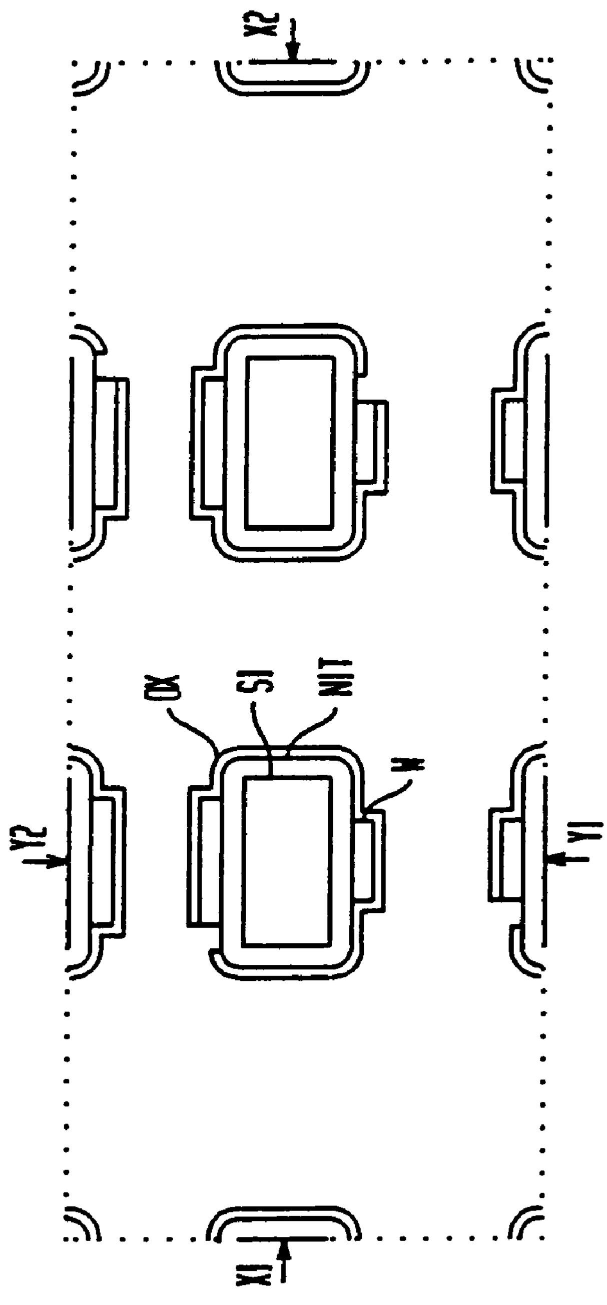
Figure 695:
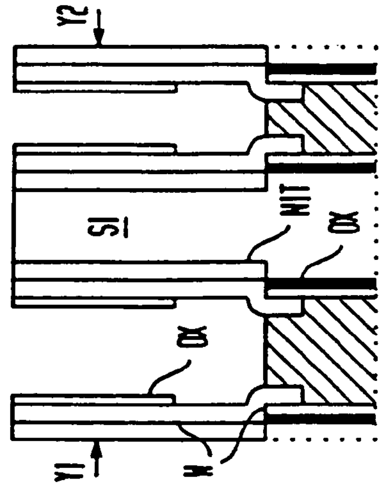
Figure 694:
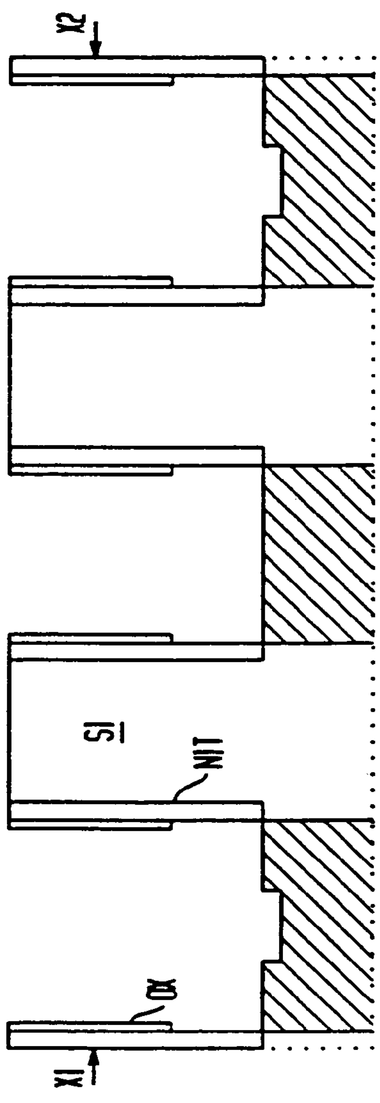

FIGS. 693, 694 and 695 depict a repetition of FIGS. 690, 691 and 692, with the gap in the first insulating material covering the upper portion of the pillar walls (at the height indicated by arrows in FIGS. 694 and 695 (adjacent to the other edge of the other first metal trace on each pillar.

Figure 696:
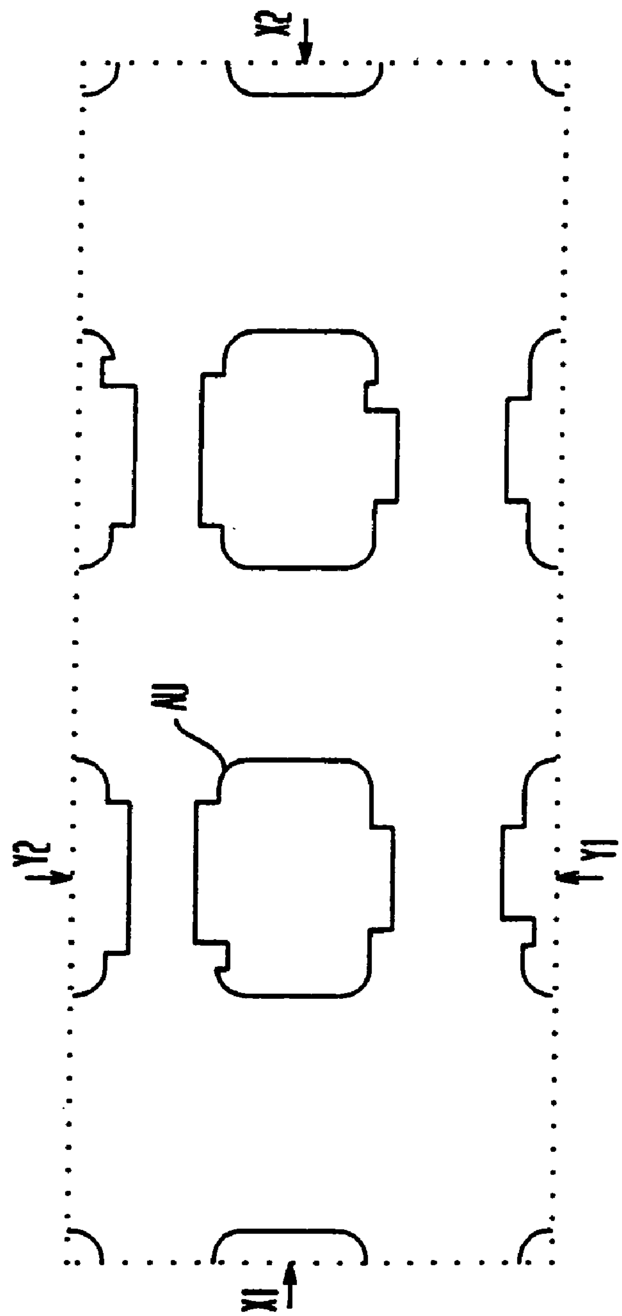
Figure 698:
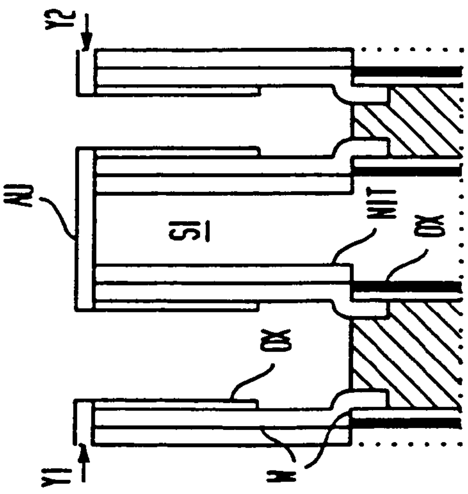
Figure 697:
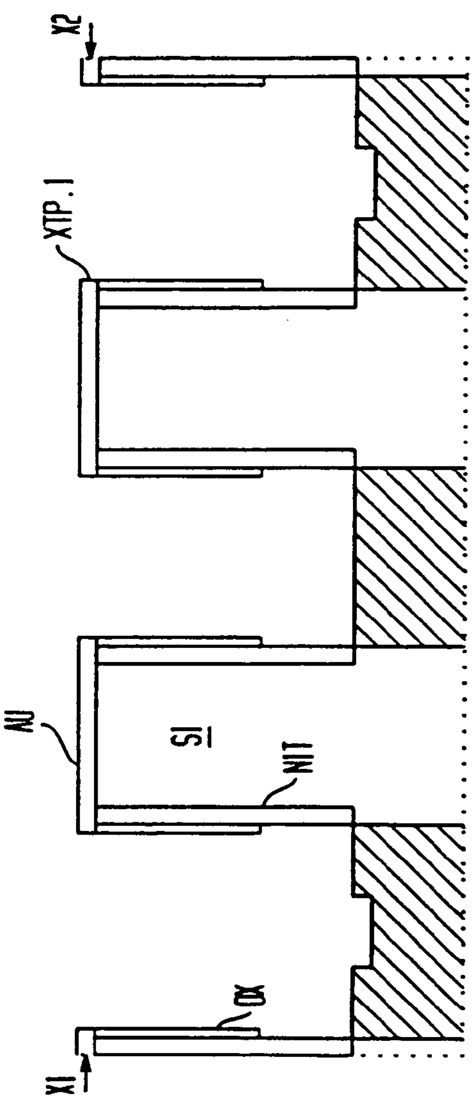

FIGS. 696, 697 and 698 depict the three mutually orthogonal cross-sections, with the corrugated walls removed and with a protective layer covering the tops of the pillars.

Figure 699:
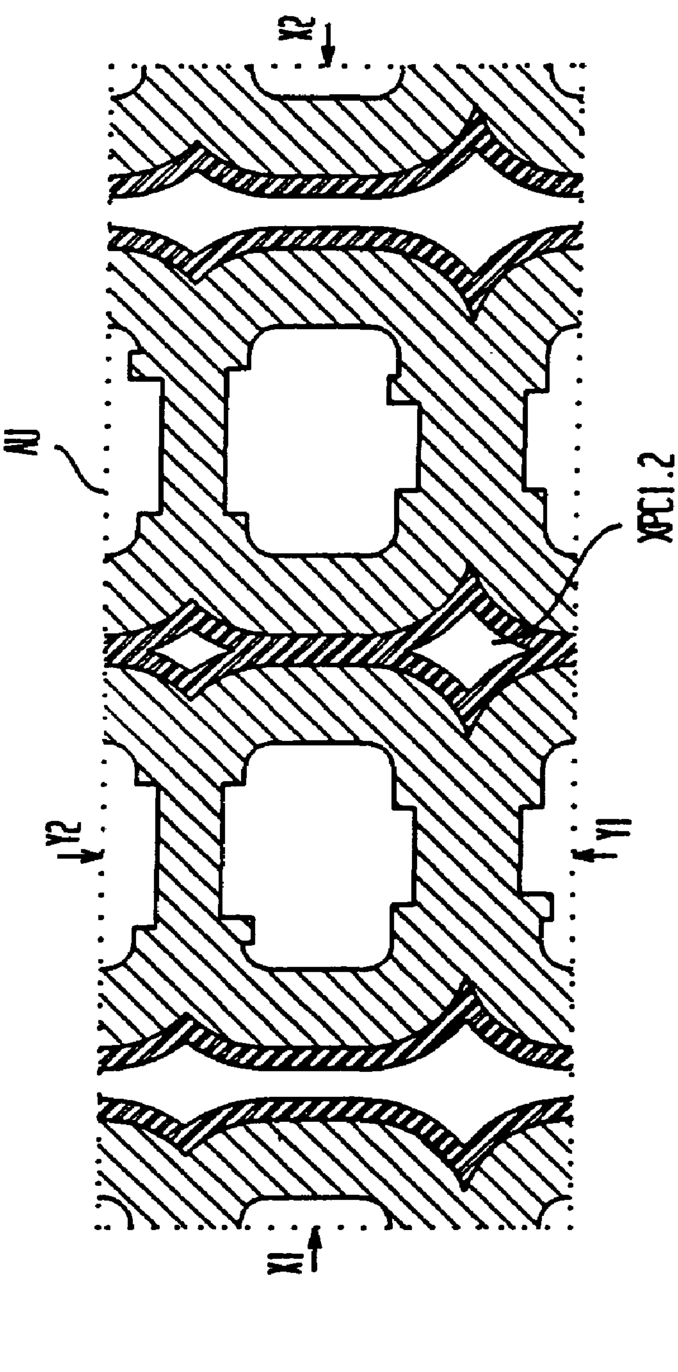
Figure 701:
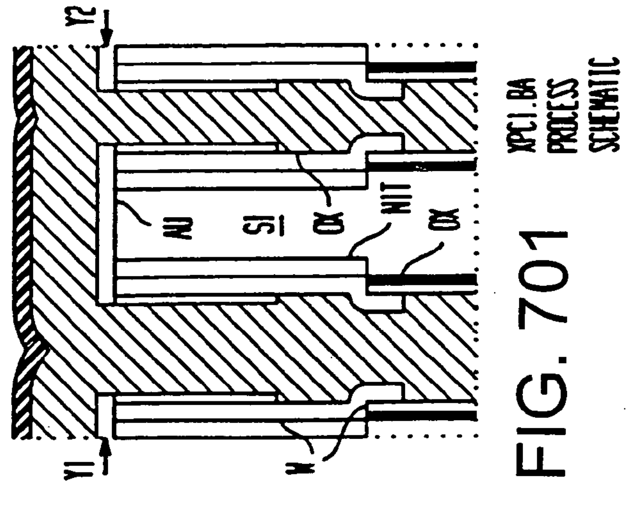
Figure 700:
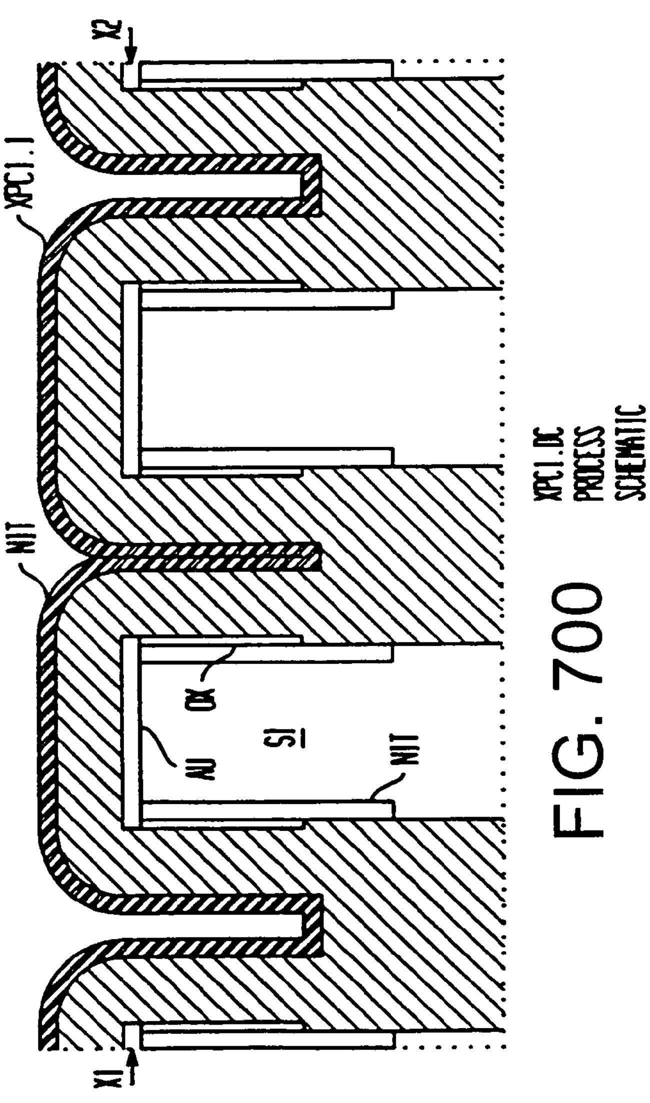

FIGS. 699, 700 and 701 depict the three mutually orthogonal cross-sections, with a layer of third insulating material on top of a thick layer of second insulating material covering all surfaces.

Figure 702:
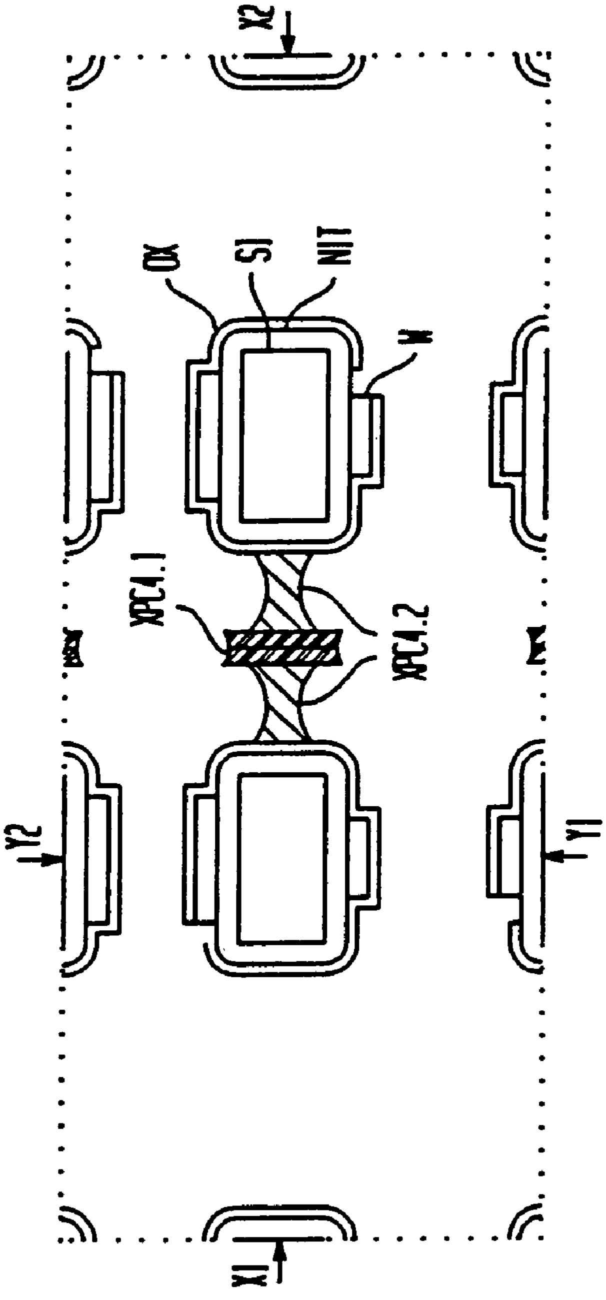
Figure 704:
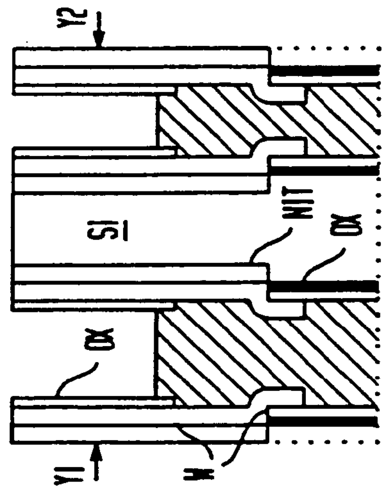
Figure 703:
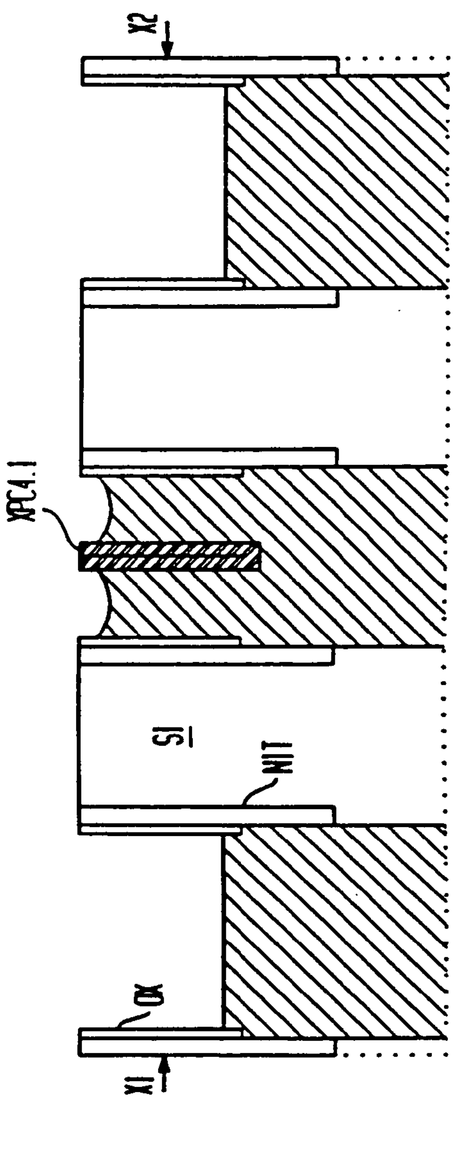

FIGS. 702, 703 and 704 depict the three mutually orthogonal cross-sections, with short first walls of third insulating material between the pillars, at the center of the second-widest trench, and with perpendicular second walls of second insulating materials between the first walls and the pillars, and with the trench bottoms slightly above the bottom edge of the sleeve of third insulating material.

Figure 705:
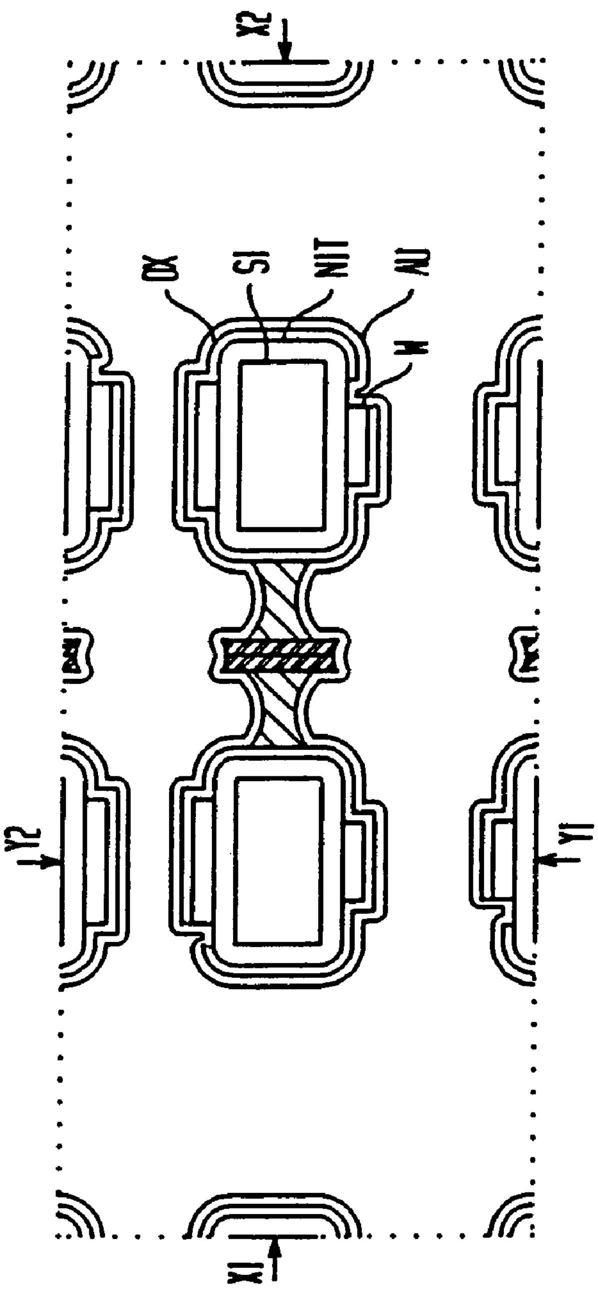
Figure 707:
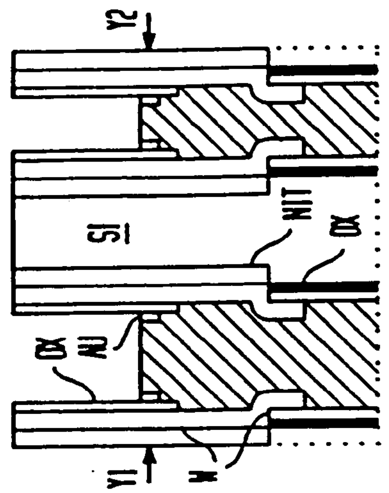
Figure 706:
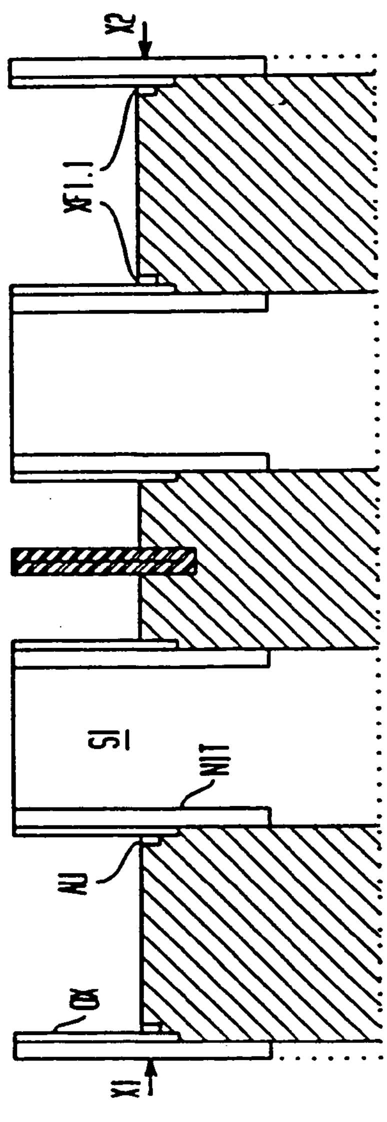

FIGS. 705, 706 and 707 depict the three mutually orthogonal cross-sections, with a narrow strip of a thin layer of second metal covering the walls at the height indicated by the arrows in FIGS. 705 and 706, and with the trench bottoms at the top edge of these metal loops.

Figure 708:
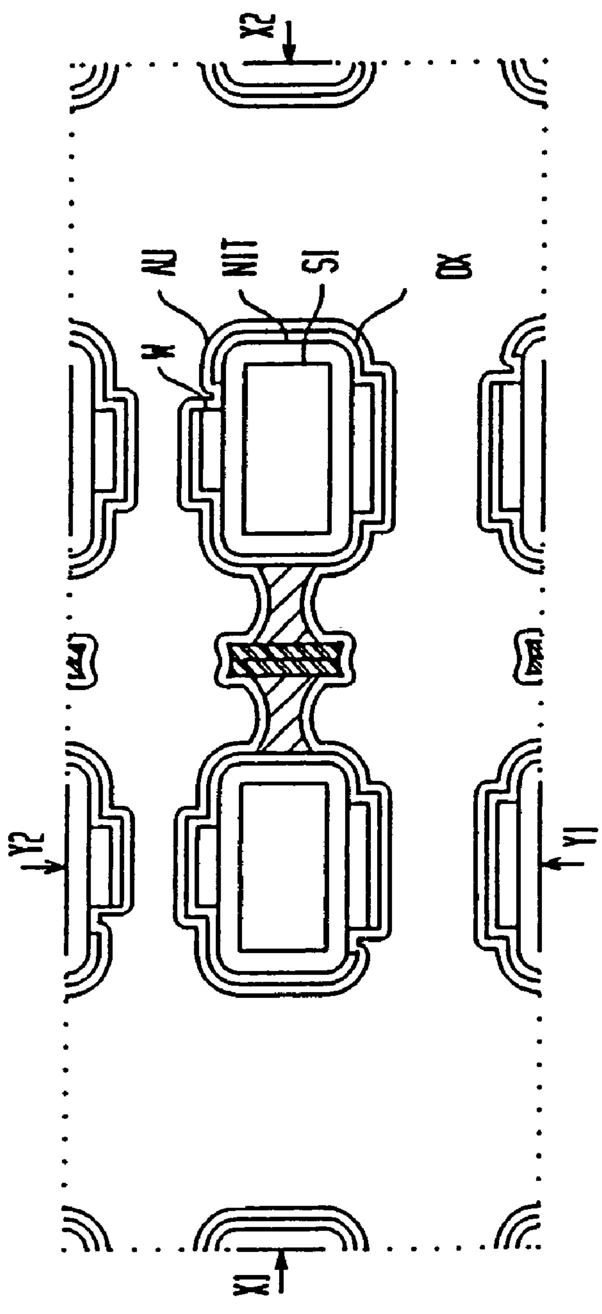
Figure 710:
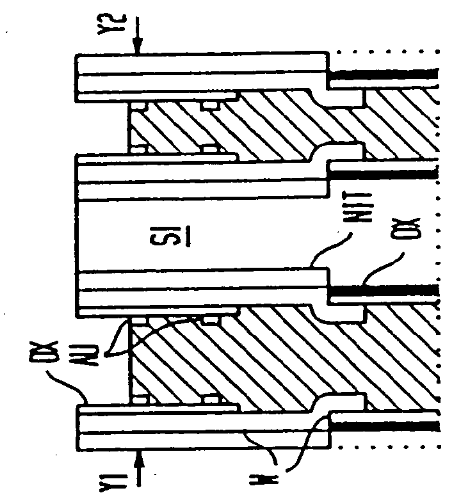
Figure 709:
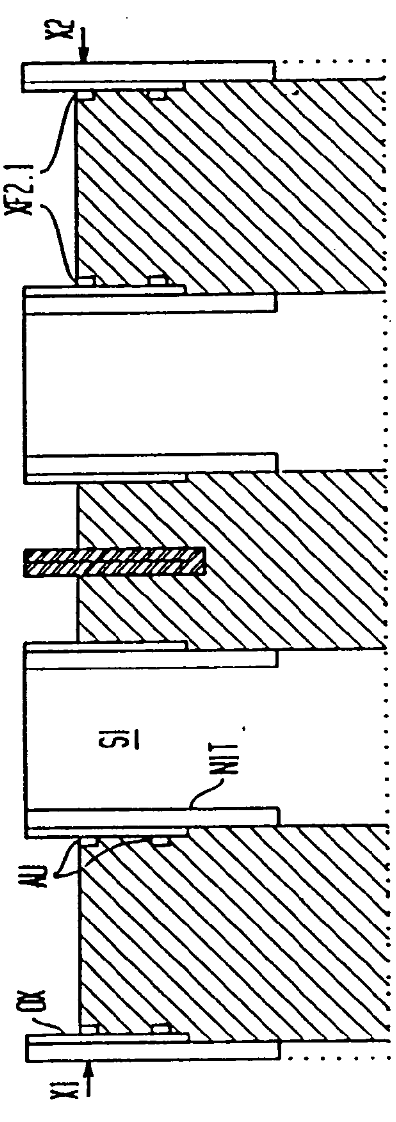

FIGS. 708, 709 and 710 depict the three mutually orthogonal cross-sections, with a second narrow strip of a thin layer of second metal covering the walls at the second height indicated by the arrows in FIGS. 708 and 709, and with the trench bottoms at the top edge of these second metal loops.

FIG. 711 depicts a schematic side view of a pair of interconnected pillars.

Figure 712:
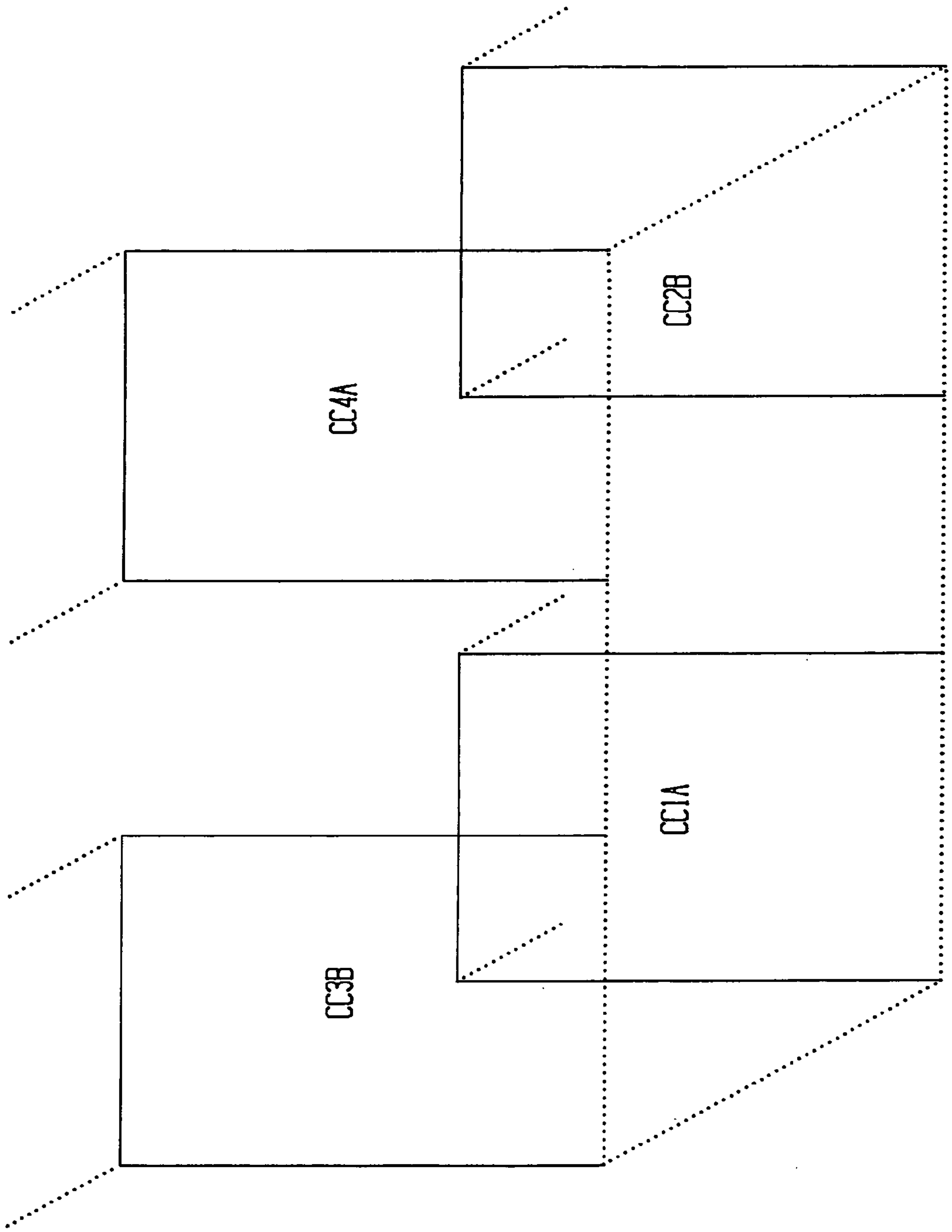

FIG. 712 depicts a pair of front-facing co-planar pillar sides, and a pair of back-facing co-planar pillar sides, which will be processed to become cross-connection sub-structures, where these sub-structures become features of the equivalent of an electrical “X” linkage.

Figure 713:
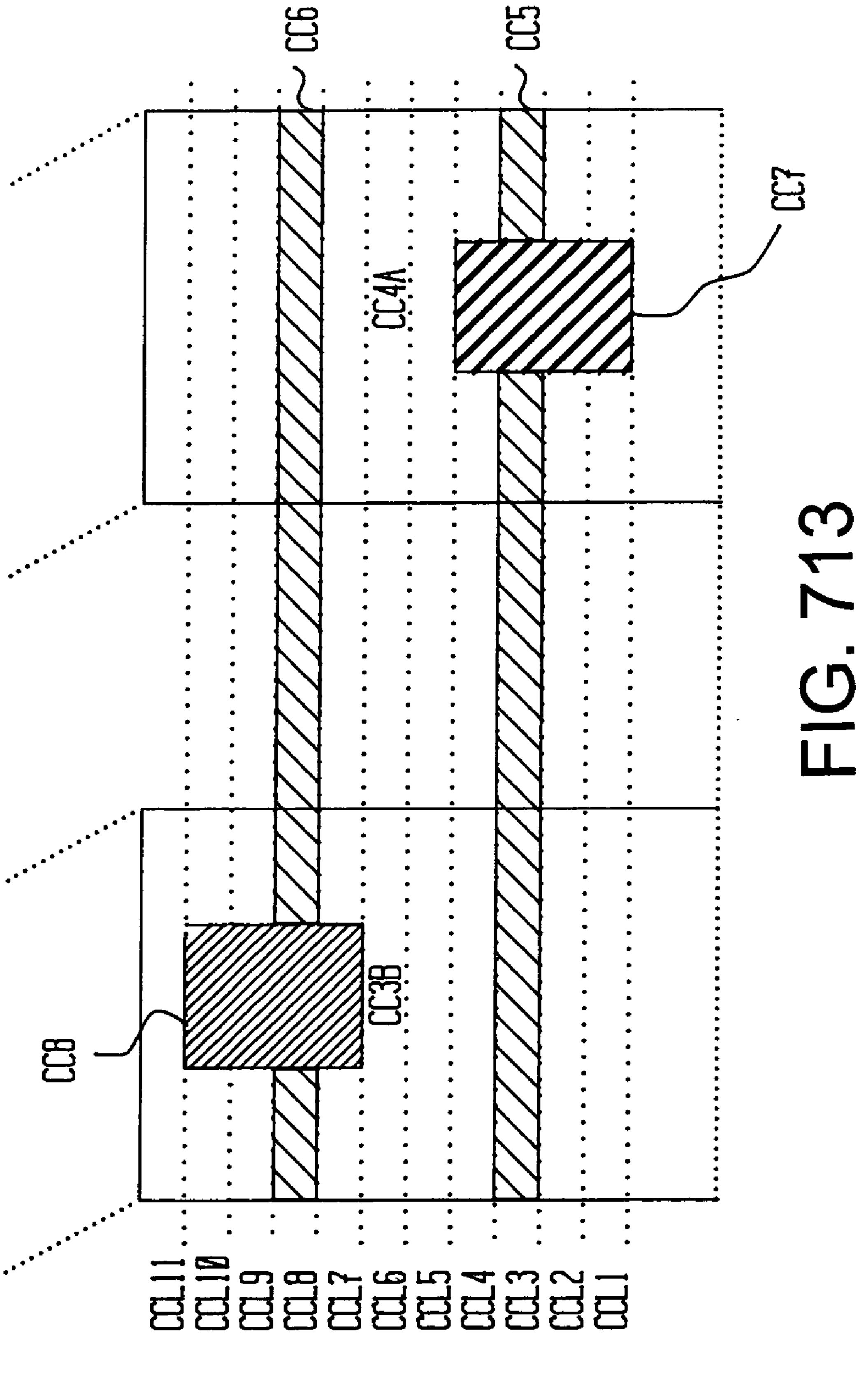

FIG. 713 depicts the front-facing pair of co-planar pillar sides shown in FIG. 712, with the spatial locations of conductive and insulator structural regions identified, and with the spatial locations of piston and/or sleeve processing levels identified, where the conductive and insulator regions become features of the equivalent of an electrical cross-connection or “X” linkage.

Figure 714:
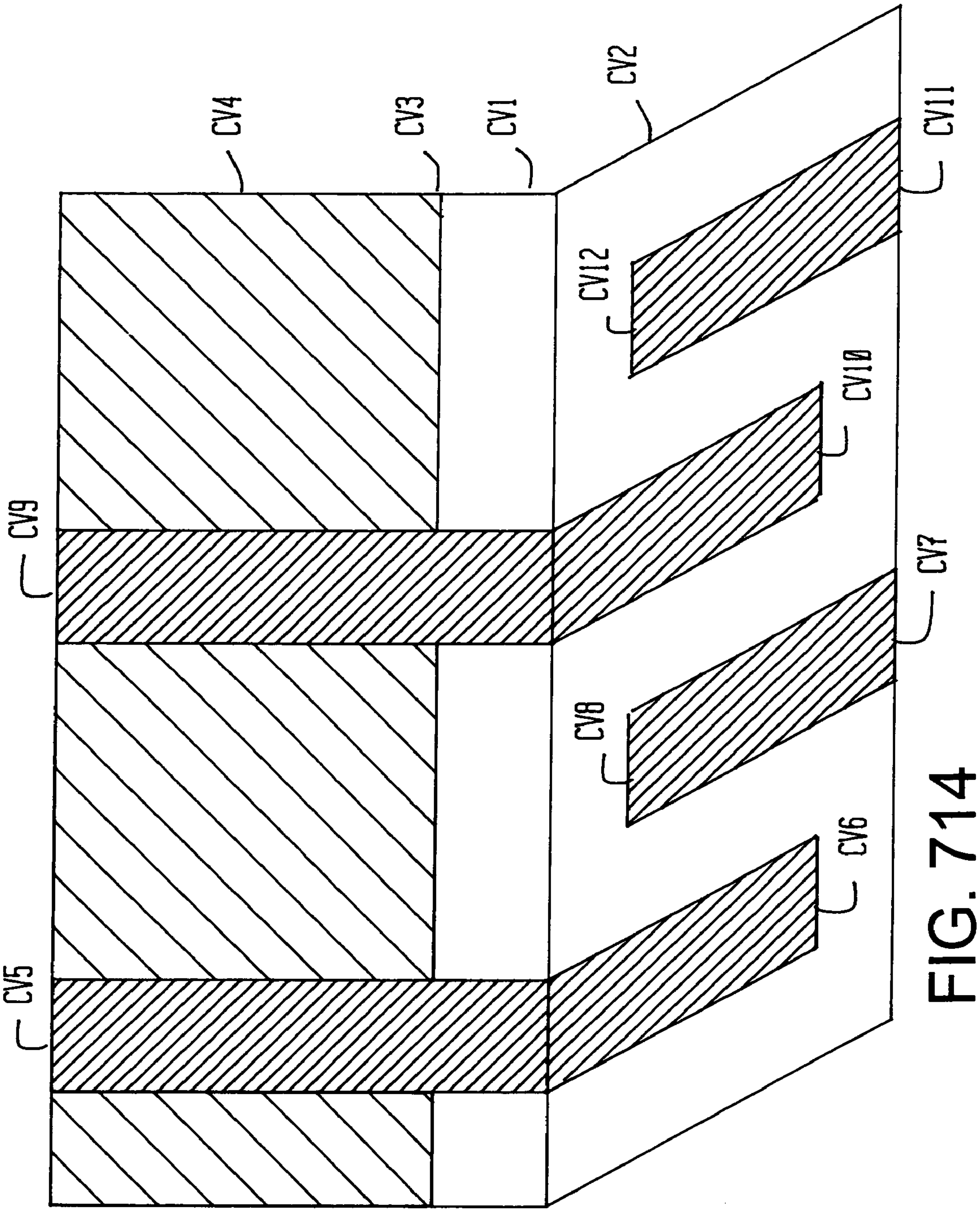

FIG. 714 depicts the back wall and bottom of a trench with conductive interconnect and insulator structural features, the left and right ends of the shown structure being cut off by vertical etching, where these conductive interconnect and insulator structural features become elements of the equivalent of an electrical cross-connection or "X" linkage alternative structure.

DESCRIPTION OF THE PREFERRED EMBODIMENT

The following Description of the Preferred Embodiment is organized into six parts: I. Considerations Regarding The Following Description, II. Fabrication Technology Used In The Following Step Sequence, III. SRAM Cell Fabrication Step Sequence, IV. Pillar Masking Techniques, V. Periphery, and VI. Supplemental Techniques & Clarifications. Part I introduces concepts, conditions and clarifications regarding the Part III step sequence. Part II explains fabrication methods used in the Part III step sequence. Part III is the fabrication step sequence itself. Thus, Parts I and II provide background information regarding the step sequence(s) in Part III, and may be used for reference while reading in detail the step sequence(s) of Part III. Part IV describes techniques for creating masks which can be used to create pillars. Part V describes techniques for creating peripheral circuitry. Part VI describes various supplemental techniques and clarifications for the previously described technology.

The step sequence of Part III demonstrates that features may be fabricated at various locations on a vertical pillar which form elements of components of a larger integrated circuit. These capabilities create a basis for a three-dimensional circuit integration technology.

Figure 1:
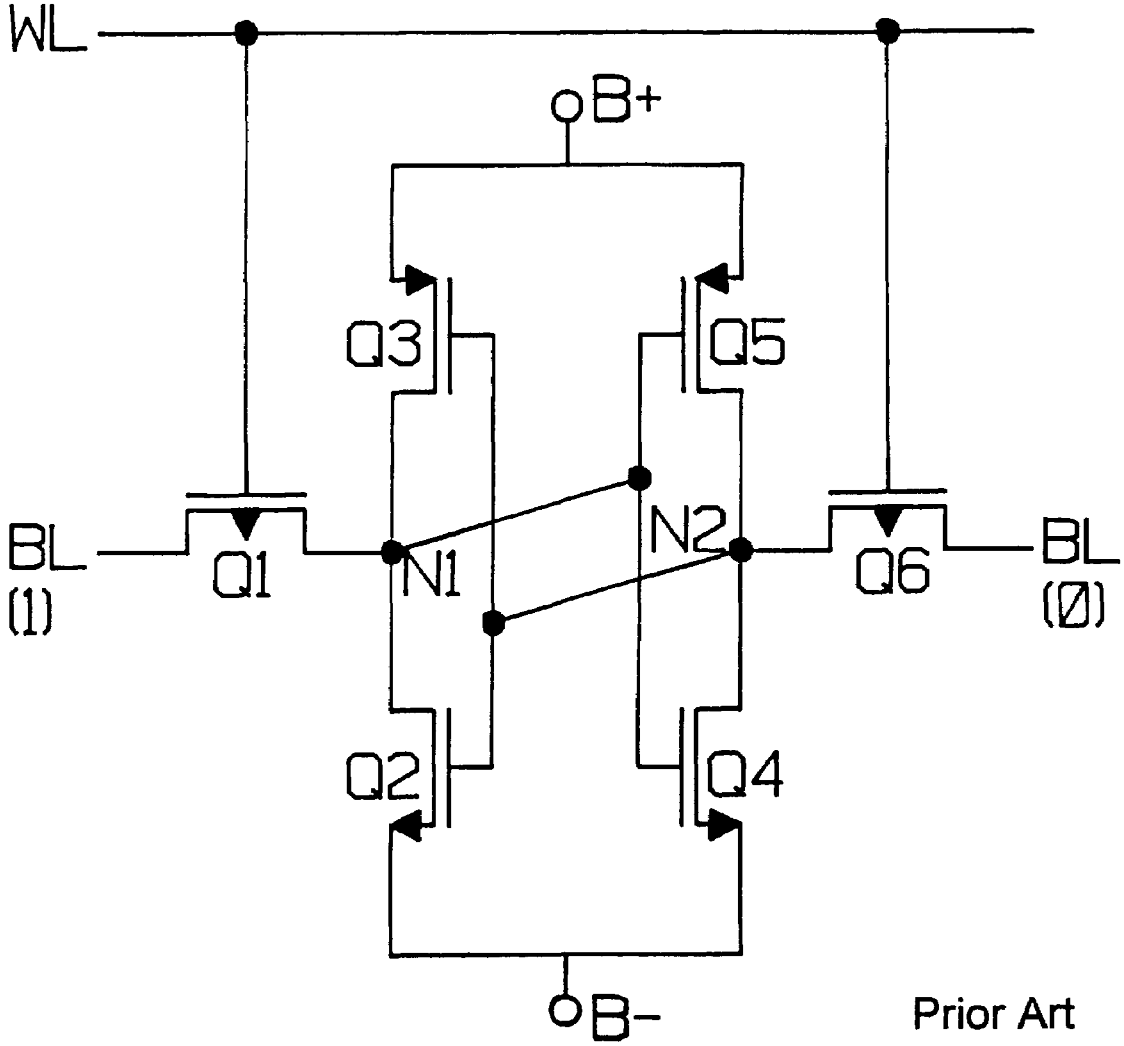
FIG. 1 is a conventional schematic of the subsequently described SRAM cell.

The step sequence of Part III describes 266 process steps (or step groups) to be performed on a silicon semiconductor wafer which result in the creation of one or more CMOS type static random access memory (SRAM) cells. This step sequence amounts to a process algorithm, where the step sequence of the algorithm determines the form of the semiconductor structures and wiring interconnects of a microelectronic integrated circuit. These process steps primarily involve the controlled deposition and etching of selected materials. Groups of these steps are used to fabricate specific structures which, taken together, comprise the complete SRAM cell. FIGS. 416, 417 and 418 depicts cross-sectional views of this complete SRAM cell. The conventional-style schematic of this cell is depicted in FIG. 1. FIG. 2 shows the schematic of FIG. 1 redrawn in the wiring and semiconductor spatial relationship of the structure of FIGS. 416, 417 and 418.

A summary of the part and sub-part headings used in the subsequent description is as follows:

I. CONSIDERATIONS REGARDING THE FOLLOWING DESCRIPTION.
APPLICATION.
CIRCUITRY.
STRUCTURES.
PROCESSES.
MATERIALS.
DRAWINGS
TERMINOLOGY.
II. FABRICATION TECHNOLOGY USED IN THE FOLLOWING STEP SEQUENCE.
VERTICAL MASKING.
LOWER TRENCH MASKING PLUG.
UPPER TRENCH WALL MASKING COATING.
SUBSEQUENT VERTICAL MASKING STEPS.
VERTICAL MASKING OPTIONS.
III. SRAM CELL FABRICATION STEP SEQUENCE.
INITIAL STEPS.
LOWER BIT LINES.
CENTER PARTITION.
LOWER WORD LINES.
CAPS.
B TRENCH.
CAPS.
A TRENCH.
CAPS.
C TRENCH SIDE ETCHING.
CAPS.
C TRENCH.
UPPER WORD LINES.
UPPER BIT LINES.
COMPLETED STRUCTURE.
IV. PILLAR MASKING TECHNIQUES.
V. PERIPHERY.
PER
END.
FAN.
VI. PILLAR-TO-PILLAR INTERCONNECTIONS
VII. SCALING DOWN.
SCALING DOWN OF WIRING PLANAR SURFACE AREA.
SCALING DOWN OF POWER DISTRIBUTION.
SCALING DOWN OF MULTIPLE TRANSISTOR CIRCUITS.
SCALING DOWN OF PERIPHERY TO CELL ARRAY INTERFACE.
SCALING DOWN OF CROSSOVER CIRCUIT INTERCONNECTIONS.
VIII. CUSP REDUCTION.
IX. SUB-LITHOGRAPHIC CAPABILITIES.
X. IMPROVED SUBSTRATE ISOLATION.
XI. CLARIFICATIONS AND SUPPLEMENTAL TECHNIQUES.

In Parts II, III and IV, three types of paragraphs are typically present as follows: Paragraphs preceded by a code enclosed in brackets (such as "[PS-2]") explain the capabilities and value of the step(s) which follow. (The codes were for checking the text and can be ignored.) Paragraphs beginning with "FIG." or "FIGS." are process steps (which may include more than one process). These process steps are coded with parenthetic codes such as "(I)," "(LB1)," etc. These parenthetic codes are the primary step descriptors, and the FIG. numbers are expected to correspond as described in the text. Paragraphs beginning with neither brackets or "FIG(S)." are otherwise descriptive or explanatory text. Parts V and VI use similar formats, codes and descriptors where applicable.

I. CONSIDERATIONS REGARDING THE FOLLOWING DESCRIPTION

Application

The following integrated circuit technology is intended for and described as a method of making static random access memory (SRAM) cell arrays, although it may be extended to a variety of other IC fabrication applications and structures. The following description is intended to be instructive regarding how to fabricate a wide variety of individual structural features using described steps or described short or long sequences of steps. It will be apparent to those skilled in the art that the techniques described independently and as steps, step sequences and combinations thereof are independently applicable to a wide variety of integrated circuit structures and applications. The SRAM cell example presented is intended to provide an illustrative application for the subsequently described inventions.

Circuitry

FIG. 1 is a conventional schematic of the subsequently described SRAM cell.

FIG. 2 depicts the schematic of FIG. 1 in the format of the subsequently described SRAM cell.

SRAM cell structure operation: Substrate layer IN is positively biased with respect to layer 2P in a conventional manner, so as to diode isolate the lower bit lines in the structure subsequently described in Part III.

Structures

The subsequently described structures are preferably constructed in cell arrays with a large number of cells, in the "open loop" (not continuously monitored with process control feedback) typical on conventional fabrication lines. However, simplified fabrication can be performed by limiting the number of cells to between 1 and 4, where each successive cell fabrication step (as described in the following steps) can be performed with frequent repetitive monitoring as the process step progresses by eye and hand control with available profile inspection equipment such as the MP2000 PLUS+offered by Chapman Instruments of Rochester, N.Y., and/or other conventional profile measuring equipment. Thereby, proper levels and thicknesses of coatings for a very small number of cells can be monitored until they are acceptably correct. In this manner, a cell or a few cells can in essence be "hand prototyped" (fabricated under manual control), with constant feedback regarding when the processes subsequently described are at the proper dimensions.

The construction of larger sized structures (pillars greater than 10 microns wide) can also simplify many fabrication processes. If these are preferred, use of thin coatings in the subsequently described cap-selected trench processes can simplify fabrication.

Shorter pillars and shallower trenches, as well as fewer alternate doping layers and less required vertical resolution, are conditions which make the subsequently described vertical wiring processes easier to fabricate (where "vertical" refers to perpendicular to the wafer surface). Since the subsequently described steps and step sequences can obviously be applied to other integrated circuit applications besides the SRAM cell described here, this should be considered when attempting to practice the subsequently described single steps, or short sequences of these steps in such applications.

Where stacks of layers are subsequently described, layer thickness can be increased significantly for each succeeding lower layer (counting from the top down), so as to facilitate etch-to-depth type operations where there is significant error for greater depth etches.

Trenches and pillars subsequently described in the text and portrayed in the figures are intended to be repetitive patterns, where the figures show just the significant region of and around a single cell. Wherever structures are mentioned as singular or plural, such a reference to a single cell depicted, or the plurality of cells in the intended extended array of cells, is in either case meant to imply the structure under discussion for however many cells are being constructed. The number of cells being constructed can be as many or as few as the fabricator prefers within the capabilities of his available equipment.

Center partitions, where shown, may be embedded in the underlying material for extra support in the manner shown subsequently at LW1A for FIGS. 79 and 80, using the techniques shown from LB10.1 through LB10.6. This extra support is more important for dissimilar materials as where LW1B shows a silicon-nitride partition above a silicon-dioxide underlying material. When fabricating center partitions, they are preferably supported at each end, rather than having them cut off at each end by trenches, so as to cause them to be free standing.

In figures labeled "PROCESS SCHEMATIC," coatings are depicted with exaggerated thickness for clarity of comprehension. These process schematics often show only a sufficient portion of the structure being fabricated to show the process steps being discussed. For example, a process schematic which shows just one side of a pillar for an in trench operation is meant to imply that a mirror image of the processing shown occurs on the other side of the trench, where that side and associated pillar wall is not included since it is redundant.

Various techniques can be used for interconnecting to the bottoms of pillar structures. These include such techniques as: conventional techniques used for interconnecting with various levels of mesa structures; VMOS-type V etches and patterned depositions in the Vs where the heights of the resulting circuit traces in the Vs correspond to adjacent pillar connected circuit traces; sloped ramps made with erodable masks (similar to VMOS) which support traces leading down to the lower heights of pillar connecting traces; trenches filled with conductors (by such means as the subsequently described close-out methods) can conduct down to contacts with pillar connecting traces at the heights of the lower portions of the pillars; subsequently described vertical wiring techniques can be used to link lower trace contacts to the upper surface of the wafer. Top levels of pillars can be conductively contacted by conventional means when the pillar interstices have been filled.

Processes

Processes indicated subsequently are intended to be by means which are currently known and in use for those processes, unless otherwise specified. "CVD" refers to chemical vapor deposition and its variants, such as low pressure CVD (LPCVD), or plasma enhanced CVD (PECVD). Plasma enhanced CVD (PECVD) processes are typically more appropriate for the step sequences of Part III. "Wet etch" refers to conventional liquid based etching processes used for integrated circuit fabrication. "Dry etch" refers to the subsequently described conventional dry etchant methods. In the subsequent description materials are described as, or shown to be, omni-directionally deposited. Omni-directional deposition is performed by such means as CVD over the interior surfaces of trenches. When this process is continued, coatings build up on opposing trench walls until the coatings become so thick that they touch each other, or in other words they close together in the middle of the trenches. This type of closing together in the middle of a trench of an omni-directional deposition will be subsequently referred to as a "close-out" of the deposited material.

CVD and other processes performed when Parylene depositions are present should be low temperature processes, so as to keep the Parylene from degrading. Conventional PECVD processes which operate sufficiently below the Parylene N nominal "melt" (softening) temperature of 420 degrees C. are appropriate here, assuming Parylene N is used.

Conventional wet etchants are usable in the following examples. Where silicon, silicon-dioxide, silicon-nitride, tungsten, gold and Parylene are individually selected against the other members of this group of materials, appropriate etchants are as follows: KOH for silicon, buffered HF for silicon-dioxide, H3PO4 for silicon-nitride, H2O with H2O2 (3:1) or alternately H2SO4 (concentrated) for tungsten, and KI+I2 for gold. (Parylene is dry etched with oxygen.) All indicated wet etches are at room temperature except the H2SO4 etch for tungsten which is above 130 to 150 degrees C. Wet etchants are most easily used when trench dimensions (and hence the other structures) are relatively large. When it is decided to fabricate trenches with small enough dimensions that the wet etchants will not easily reach the bottoms, then the wet etchants are preferably applied in vacuum and then pressurized so as to penetrate trenches. Removal of wet etchants in this case is by turbulent dilution from the top, followed by evaporation of the diluted liquid.

Conventional dry etching methods include plasma etch, reactive ion etching (RIE), sputter etching and ion milling. Of these, plasma etch is the most omni-directional, while commonly used dry etch methods typically offer more directionality, and ion milling can be configured to be highly directional. Directionality is typically vertical to the wafer surface, unless controlled by such means as ion-guns to become off vertical. With this in mind, plasma etch is preferred for omni-directional dry etches with the etcher configured so as to enhance omni-directionality. Ion milling, the highly directional minimally selective dry etch, is preferred for vertical etching of exposed horizontal surfaces as required for indicated subsequent process steps.

When conventional wet or omni-directional dry etch etchants are used, all such etchants are chosen so as to be selective for the materials indicated against the other materials exposed at the time, and all etching of named materials is by selective wet or dry omni-directional etch, unless otherwise specified or where trench etching is called out.

Materials to be selected by selective etchants are subsequently referred to as "selectable materials."

Various process steps called out in the subsequent fabrication sequence, particularly those which etch silicon (polysilicon) on the sides of trench walls, also removes silicon from the tops of the pillars. The topmost (20P) layers in the subsequently described structures must either be extended high enough to compensate for exposed silicon etching here and in subsequent etches, or a top cap may be used to protect the tops of the pillars whenever the silicon at the pillar tops is subsequently exposed during brief silicon (polysilicon) etches, or in a case where it is otherwise desirable to protect the material(s) exposed at the tops of structures. This top cap technique is described in detail at step LW5.4. Gold is a universally applicable material for such top capping with the materials used here. Other selectable materials may also be used. If top caps are not used, then etch control or profile monitoring techniques must be applied carefully so as to maintain workable reference heights for height specific Parylene etches which are subsequently described.

Various contemporary conventional techniques are known and available for integrating the etch so as to improve etch uniformity. These include use of: wafer clamping techniques for heat removal, electron cyclotron resonance sources, and magnetic or electric fields, for example. It is preferred that vertical etching processes subsequently described use more uniform etch control where available so as to improve etch depth uniformity, and thus allow more cells to be uniformly fabricated.

All masking must be planned to compensate for any undercutting and overetching around corners which would predictably occur in subsequent etching with said masking. Mask height settings noted are for intended results of the masking, not for actual mask edges. Directional anisotropic etches are required in various of the subsequently described process steps. Typical of this, materials are referred to as being "vertical etched." This is typically suggested to be done by ion milling due to its high directionality. However, reactive ion etching (RIE) often provides a useful conventional alternative vertical etching approach in these cases, depending on processes available to the fabricator and engineering preference.

The techniques subsequently indicated for reducing voids in lower trench masking plugs are typically applicable to Parylene close-outs where these need to be etched down in various subsequently described steps. Where Parylene is shown to be deposited so as to close out, and then subsequently etched down to a desired height in the manner subsequently described for lower trench masking plugs, the subsequently described reflow procedure is preferred prior to the etch down, unless a core of a selectable material has been used (see subsequent discussion of fabrication technology).

Where sputtered silicon-dioxide is subsequently specified (such as collimated sputtering applications), conventional high-powered DC sputtering processes for this purpose are preferred.

Where vertical etch down of the tops of all structures is specified in Part III, chemical-mechanical polishing potentially provides a more uniform surface than ion milling. Depending on fabricator preference and available equipment, chemical-mechanical polishing should be considered a desirable option for these types of operations when uniform surface is the objective.

It will be apparent to those skilled on the art that conventional atomic layer epitaxy (ALE) provides a useful alternative deposition technique for the subsequently described omni-directional depositions. When used for gate and other insulator such technology can reduce field problems at gate insulator edges.

It will be apparent to those skilled in the art that conventional SIMOX, silicon-on-sapphire or other known wafer insulating methods can be used to improve capacitance, and hence response times, in the lower bit line regions of the subsequently described structures.

Processes called out subsequently are intended to indicate to those skilled in the art what applicable operations need to be performed. Conventional supplemental operations which are normally associated with these processes, such as conventional preparatory and clean up steps, etc., typically are not expounded on unless they are not conventional. What is described is the primary fabrication steps, where those skilled in the art will be aware of conventional support and ancillary fabrication operations.

Materials

"Parylene" is deposited and etched in many of the subsequent steps. This material is available from Specialty Coating Systems, Inc. (a subsidiary of Union Carbide Chemicals and Plastics Co. Inc.) in Clear Lake, Wis. There is a large amount of published literature regarding Parylene and its uses, as well as many patents. In the following description, use of Parylene type N (poly-para-xylylene) is preferred. Parylene N has conventional means of omni-directional deposition. The conventional omni-directional etch down method is dry etch with oxygen as the etchant.

Drawings

Unless otherwise noted, drawings for process steps are cross-sectional views taken between points indicated on the associated views (X1–X2 for example). These cross-sectional views are to be construed as slices through the structure, and do not indicate any material or structures in front of or behind the plane of the slice.

Drawings with top and two side views depict such cross-sectional views of structures.

Drawings labeled "PROCESS SCHEMATIC" show structural layer and feature relationships, and approximate locations of features. Process schematics show layers which actually touch each other, but are depicted as if separated to show how the layers were built up.

Drawings labeled "PROCESS SCHEMATIC" for the B and A trench wiring processes show one side of a processed trench, and the coating thicknesses as shown are what would more typically be thought of as exaggerated in the horizontal direction (corresponding to parallel to the wafer surface) for clarity.

Terminology

In the following discussion process steps are described to create one or multiple structures, depending on the preference of the fabricator and the fabrication capabilities at hand. Portions of structures being fabricated are discussed both in the singular or plural, where the singular reference refers to an element of the structure or drawing under discussion, and where plural reference refers to multiple structures at large. Because these singular and plural references are both applicable depending on either the number of structures being fabricated, or the focal concept being discussed for a particular step, the use of singular or plural references typically connotes only a perspective regarding the issue being discussed, and not some specific inherent number of elements being fabricated.

Likewise, the terms "trench" and "trenches" are used to refer to elongated trenches as well as holes created either by trench etching, or created by a combination of trench etching and blocking of the sides by depositions in second trenches which cross the axis of the first trenches (as subsequently described).

The terms "partition" and "partitions" are used to describe structures which have a base at the bottom of a trench and which stand upright in the middle of trenches, so as to make a divider between the walls of a trench. Such structures which stand upright in the middle of a trench hole are also referred to as partitions, even though they are not elongated in an extended trench axis. Under some circumstances these structures are also referred to as "core(s)."

The term "vertical" is used herein to refer to "perpendicular to the wafer surface."The term "horizontal" is used herein to refer to "parallel to the wafer surface." The term "axis," particularly when used with "vertical" or "horizontal" connotes direction relative to the plane of the wafer or the plane of the drawing paper, depending on context.

II. FABRICATION TECHNOLOGY USED IN THE FOLLOWING STEP SEQUENCE

Vertical Masking

[PS-1] A lower trench masking plug and upper trench wall masking coating may be used to create vertical windows for etching the sides of pillars in desired vertical locations.

These masking coatings are subsequently referred to respectively as "sleeve" and "piston," or alternatively as just "masks." The upper trench wall masking coating may also be described as a "protective" coating for underlying materials which could be affected by the presence of a particular etchant. Hence, the term "protector" may be used in reference to an upper trench wall masking coating when it is on a trench side wall and used for this purpose. Protective coatings ("protectors") are subsequently also used to protect other locations such as tops of structures, as well.

Lower Trench Masking Plug

[PS-2] A lower trench masking plug is made by the deposition of a highly selectable material or materials in the bottom of a trench, where the deposition extends from the current bottom of the trench to a particular height.

[PS-3] Parylene is a preferred material for the fabrication of a lower trench masking plug.

[PS-4] Parylene may be omni-directionally deposited within a trench so as to coat the walls and bottom in a "U" shape which gradually grows to close out, or close together as the walls of the "U" grow toward each other to the point where they touch each other. As upper walls can touch slightly before the lower walls touch, voids can be created between the walls. These voids are preferably eliminated or their potential effect otherwise neutralized prior to etching a lower trench masking plug down to its reference height.

As a first method of accomplishing this, a center partition of a second selectable material such as silicon-dioxide may be used.

As a second method of accomplishing void elimination in Parylene used for lower trench masking plugs, the wafer may be heated to the Parylene melt temperature at which point it becomes viscous, and voids which were created in vacuum can be made to reflow together, thus eliminating the voids. This technique is described in IBM Technical Disclosure Bulletin Vol. 1, No. 1, June 1986, pages 249 and 250. (Note that the close-outs must occur in vacuum.) This reflow technique is preferred for simplicity and is used throughout the subsequent SRAM cell fabrication step sequence, unless otherwise noted. To envision this reflow technique in reference to the steps subsequently described for the piston-sleeve process schematics, the steps where the lower trench masking plug's center partition is deposited and etched back (PS.2 and PS.3) are eliminated, and the Parylene is closed out and reflowed instead. The subsequent height setting steps for the lower trench masking plug thus only require etch down of the Parylene without the center partition also being etched.

Figure 3:
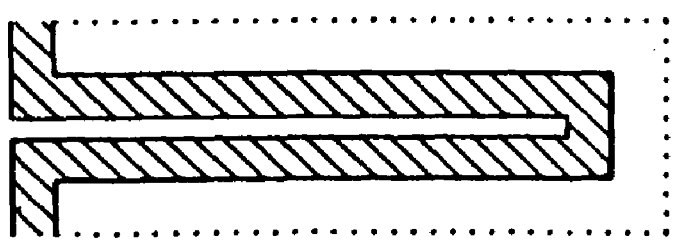
FIG. 3 depicts a vertical trench coated with a first material.

These materials and techniques may be used as follows:

FIG. 3 depicts a vertical trench which has been coated with an omni-directional deposition of Parylene (PS.1), using conventional means for deposition of Parylene.

Figure 4:
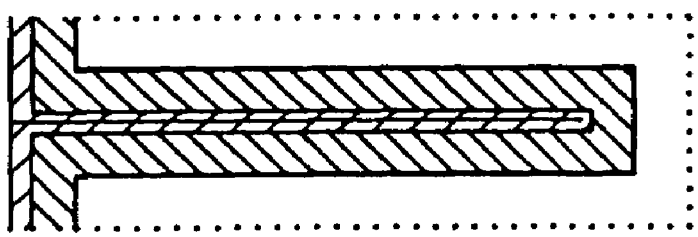
FIG. 4 depicts the trench closed out with a second material.

FIG. 4 depicts the results of a next subsequent omni-directional coating with silicon-dioxide (PS.2) by chemical vapor deposition (CVD), so as to cause the silicon-dioxide to close together in the middle of the trench. This type of closing together in the middle of a trench of an omni-directional deposition will be subsequently referred to as a "close-out" of the deposited material.

Figure 5:
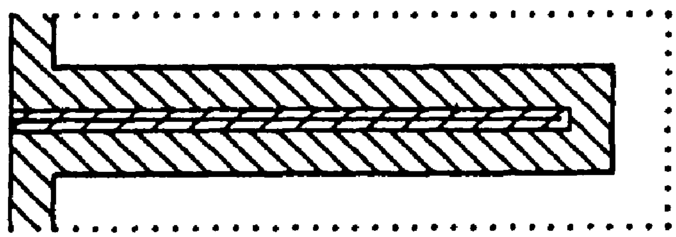
FIG. 5 depicts the trench with the second material removed from the top surface.

FIG. 5 depicts the results of a next subsequent step of selective etching away (PS.3) by wet etch or omni-directional dry etch of the top horizontal portion of this coating.

This partition or core is then etched down alternately as the Parylene to each side of it is etched down. This selectable material may itself contain voids. To compensate for and fill such voids, at predetermined intervals this selectable material may be repeatedly thinly deposited and etched off on top, where, should a void become exposed, such voids will also be coated and closed out as the general lower trench masking plug etch-down with repeated coating and etching of the center partition continues.

Figure 6:
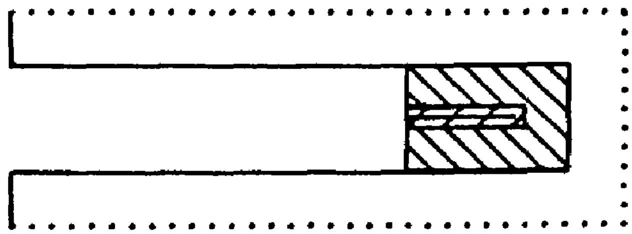
FIG. 6 depicts the trench with the first and second materials etched down to leave a plug at a first height.

FIG. 6 depicts the results of a next subsequent step of etch-down of the Parylene outer coating and silicon-dioxide center partition (PS.4) by repetitive omni-directional dry etch of Parylene, and then wet etch or omni-directional dry etch of silicon-dioxide, so as to etch the two coatings down a little at a time without crumbling too much of the silicon-dioxide partition with each subsequent Parylene etch. The aforementioned void filling may be used as required.

[PS-5] The aforementioned center partition can alternatively be left in place while the Parylene is etched down along its sides, and then etched out with a highly selective etchant if it crumbles due to lack of sufficient side support.

[PS-6] Alternatively, such a Parylene "U" may be filled with a liquid to fill voids, by depositing a liquid such as decane over the surface of the wafer in a vacuum before the "U" closes, followed by placing the liquid under pressure to force it into the trenches (the "U" centers) which remain in vacuum. In subsequent processing the liquid may be frozen prior to etching.

[PS-7] By-products of an added omni-directional dry etch reactant material can be deposited into voids so as to temporarily cap or fill them. Addition of CF4 gas to the O2 etchant gas would produce such reactant by-products as it interacts with walls of a silicon trench in situations where some additional etching of the trench walls can be tolerated.

[PS-8] A liquid such as decane may be used instead of Parylene to create a lower trench masking plug, where the liquid is deposited over the surface of the wafer in a vacuum, followed by placing the liquid under pressure to force it into the trenches which remain in vacuum, optionally followed by freezing the liquid, followed by etching the liquid (or optionally solid) height in the trenches down with a reactive etchant gas such as $O_2$ for a material such as decane. A jet of evaporated liquid nitrogen may be used to cool a conventional thermally conductive surface below but contacting the wafer if it is desired to freeze the decane by cooling the wafer, while maintaining any necessary vacuum at the wafer's upper surface. If the decane is to be processed while frozen, then subsequent processing is limited to processes which will not transfer too much thermal energy to too much of the decane, so as not to melt or evaporate too much of it (i.e. processes such as sputtering).

Upper Trench Wall Masking Coating

Figure 7:
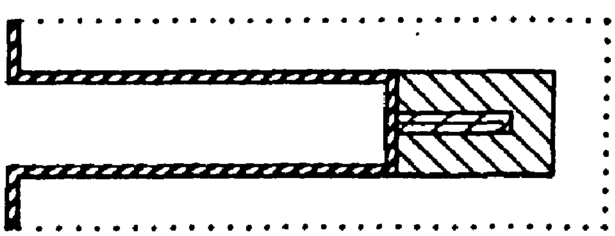
FIG. 7 depicts the trench coated with a third material.

FIG. 7 depicts the results of a next subsequent step of deposition of a selectable material such as silicon-nitride over the exposed surfaces of the trench (PS.5).

Figure 8:
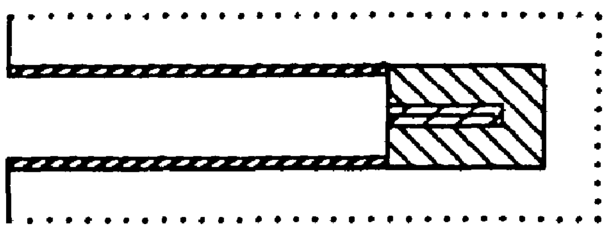
FIG. 8 depicts the trench with the third material removed from the non-vertical surfaces.

FIG. 8 depicts the results of a next subsequent step of vertical etching away of the horizontal surfaces exposed as a result of the prior step, leaving the prior coating of silicon-nitride only on the vertical surfaces, so as to create an upper trench wall masking coating (PS.6).

Subsequent Vertical Masking Steps

Figure 9:
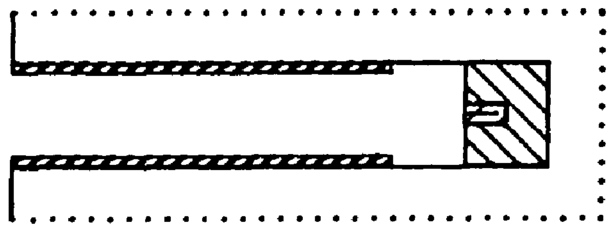
FIG. 9 depicts the trench with the first and second materials etched down to leave a plug at a lower height and expose the original trench walls in a window.

FIG. 9 depicts the results of a next subsequent step of further omni-directional etching by selective omni-directional dry etch and/or wet etch of the lower vertical masking plug materials down to a preferred lower mask height (PS.7).

Figure 10:
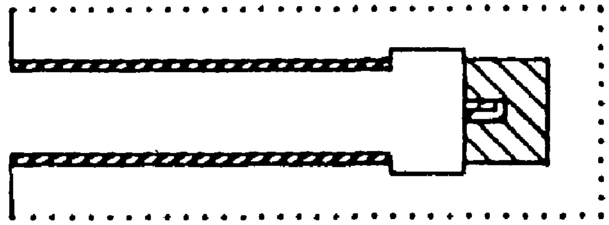
FIG. 10 depicts the trench with a recess created in the exposed original trench walls in the window.

FIG. 10 depicts the results of a next subsequent step of etching of the unmasked pillar side walls by selective wet etch or omni-directional dry etch, so as to create an intended feature, in this case a recess (PS.8).

Figure 11:
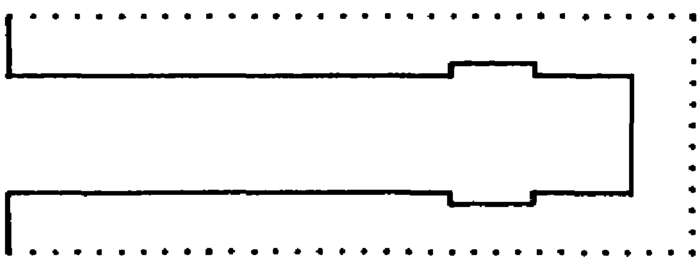
FIG. 11 depicts the trench with the recess in the walls with all first, second and third materials removed.

FIG. 11 depicts the results of a next subsequent step of selective etching away of the upper trench wall masking coating and lower vertical masking plug materials in the trench, so as to leave just the trench with the desired feature, in this case the recess as shown (PS.9).

Vertical Masking Options

[PS-10] An upper trench wall masking coating may be used without a supplemental lower trench masking plug when it is desired to side etch trench walls from the bottom of the upper trench wall masking coating down to the bottom of a trench. In this case, a lower trench masking plug at a preliminary height can be used to aid creation of the bottom of the upper trench wall masking coating, followed by removal of the lower trench masking plug material.

[PS-11] A lower trench masking plug may be used without a supplemental upper trench wall masking coating when it is desired to etch trench walls from the top of the lower trench masking plug to the top of the trench.

[PS-13] An upper trench wall masking coating may be created and its bottom height set by the etching down of a lower trench masking plug to a preliminary height, followed by coating the trench walls and temporary lower trench masking plug top with the upper trench wall masking coating material, followed by the vertical etching away of the bottom of the "U" formed by the upper trench wall masking coating.

[PS-14] The height of a lower trench masking plug may be set by the vertical etching away of the bottom of an upper trench wall masking coating "U" (which creates the upper trench wall masking coating), followed by the subsequent etching down of the lower trench masking plug material to the desired reference height.

In the foregoing discussion of vertical masks, the lower trench masking plug can be visualized as a "piston" which is moved up and down in a trench so as to set masking levels. Likewise, the upper trench wall masking coating can be visualized as a "sleeve" which masks off the upper portion of a trench. The gap between the piston and the sleeve is the region that will be etched.

In all cases, materials for lower trench masking plugs and upper trench wall masking coatings are chosen for selectivity against other materials which are or become exposed in the trench. This consideration applies both to selectively etching these other materials against the lower trench masking plugs and upper trench wall masking coatings, and vice versa when the lower trench masking plugs and upper trench wall masking coatings are removed.

When lower trench masking plugs and upper trench wall masking coatings are used, consideration must be given to overetching which occurs so as to undercut around the sides of these masks.

III. SRAM CELL FABRICATION STEP SEQUENCE

Initial Steps

[I-1] Multiple epitaxial layers may be deposited one above the other to create alternately doped regions which can be used to make multiple transistors.

[1-2] Multiple epitaxial layers are subject to additional dopant diffusion due to the heat associated with deposition. It is appropriate to compensate for this additional dopant diffusion by thermal budgeting through computer calculation of how much diffusion will occur with subsequent expected heat exposure, and process control which initially causes concentration of dopants near the centers of epitaxial layers, followed by a calculated amount of diffusion so that the final dopant concentration distribution will end up in the desired regions. Conventional diffusion calculations are available to calculate these diffusion rates, and conventional computer process control techniques may be used to place appropriate amounts of dopants at the appropriate locations as the epitaxial growth progresses. Use of conventional computer software such as SUPREM IV (the Stanford University Process Engineering Modeling program) would simplify process modeling.

Figure 12:
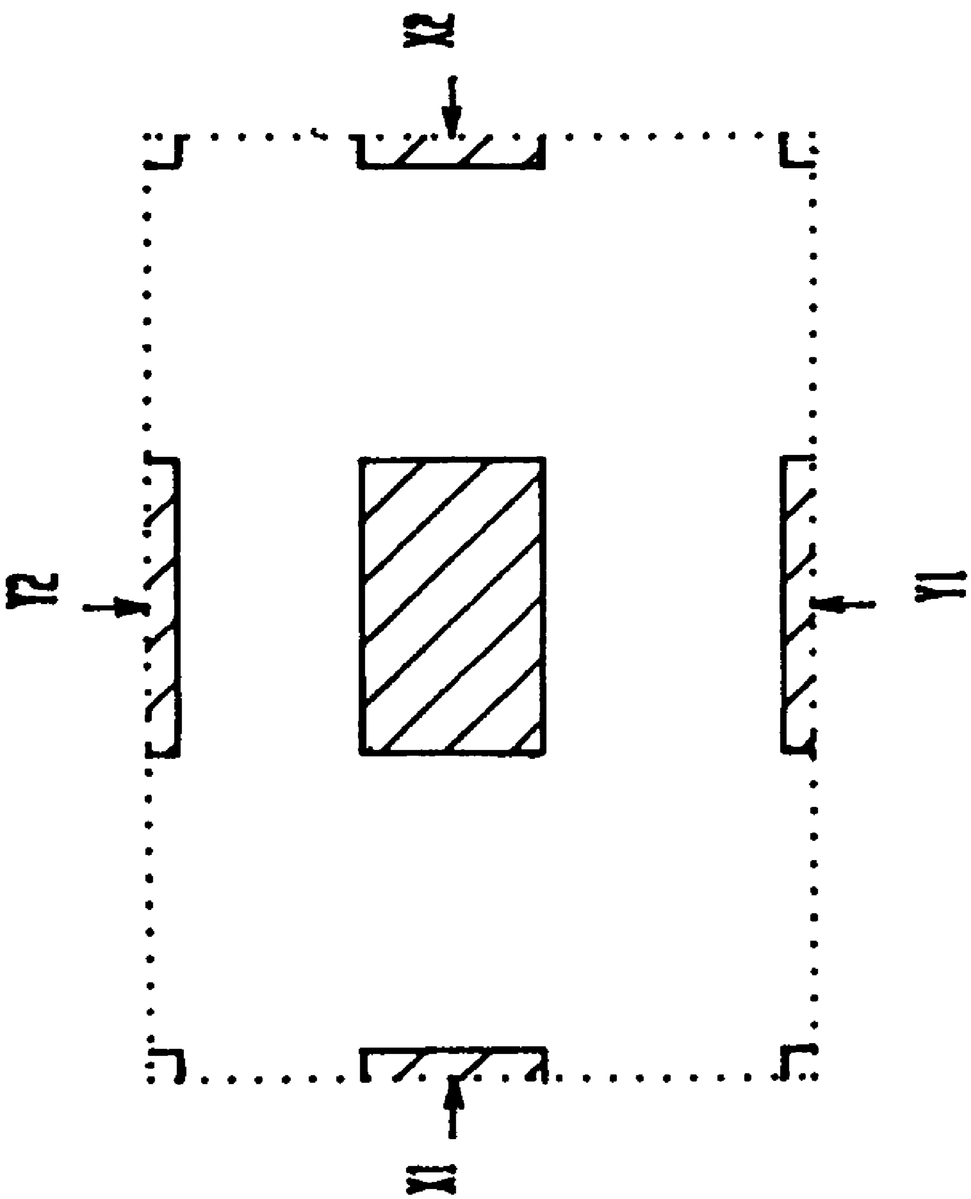
FIGS. 12, 13 and 14 depict a top view and two orthogonal cross-sections, respectively, of a small cutaway section of an integrated circuit wafer with twenty layers of semiconductor material of alternating polarities, topped with a patterned masking layer of a first insulating material.
Figure 14:
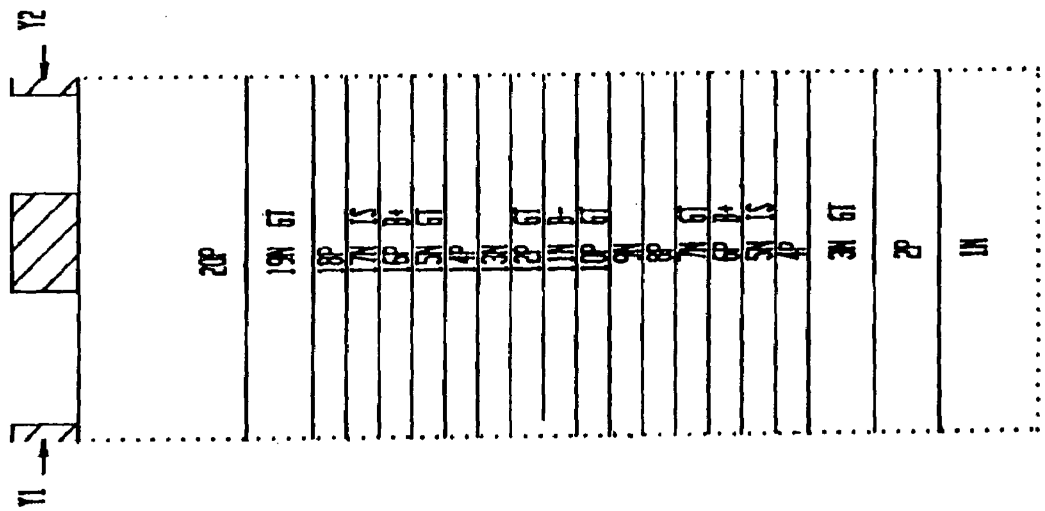
Figure 13:
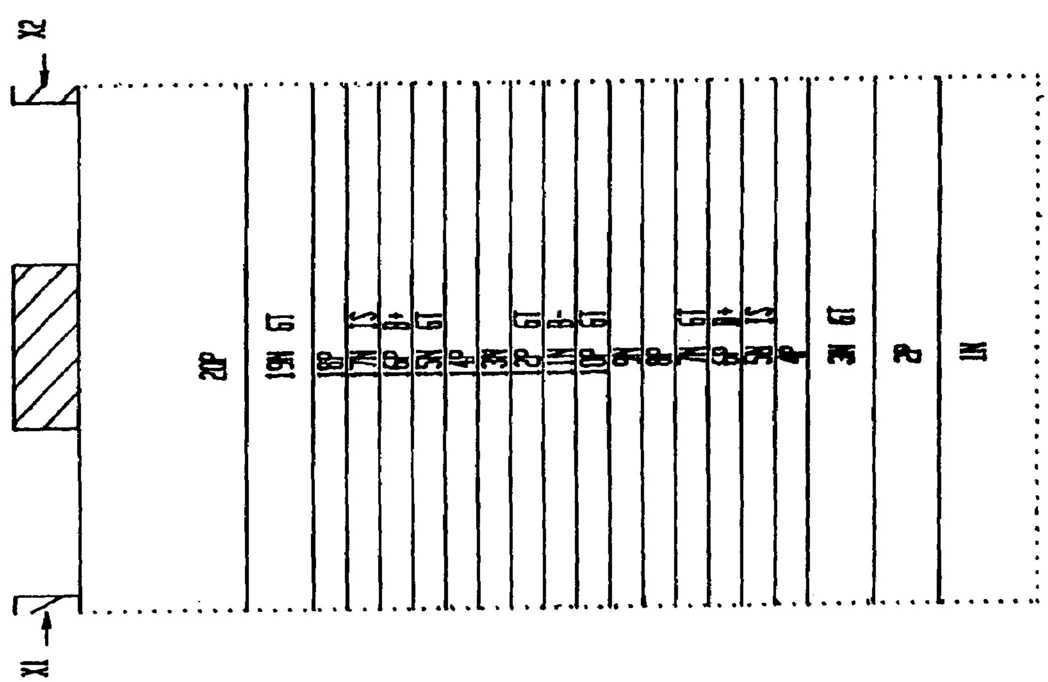

FIGS. 12, 13 and 14 (I) depict the results of the growing of 19 epitaxial layers of the indicated doping types 2P, 3N, 4P, 5N, 6P, 7N, 8P, 9N, 10P, 11N, 12P, 13N, 14P, 15N, 16P, 17N, 18P, 19N and 20P above the surface of N doped wafer 1N, followed by the creation by conventional methods of a mask above layer 20P (such as a layer of silicon-dioxide patterned from a patterned resist layer above it). Next to these designators are labels showing eventual purposes of various of these layers, where: 3N GT will be a channel (sub-gate) layer, 5N IS will be a diode isolation layer, 6P B+will be part of a B+ power distribution grid, 7N GT will be a channel (sub-gate) layer, 10P GT will be a channel (sub-gate) layer, 11N B− will be part of a B− power distribution grid, 12P GT will be a channel (sub-gate) layer, 15N GT will be a channel (sub-gate) layer, 16P B+will be part of a B+ power distribution grid, 17N IS will be a diode isolation layer, and 19N GT will be a channel (sub-gate) layer. Layers 16P, 6P and 11N should be process modeled to ensure that each is sufficiently able to carry the current required in the subsequently created structures.

Lower Bit Lines

[LB-1] A semiconductor wafer may be trench etched to create pillars which will contain the various doped continuous crystal regions and junctions which are used to form multiple stacked transistors.

Figure 15:
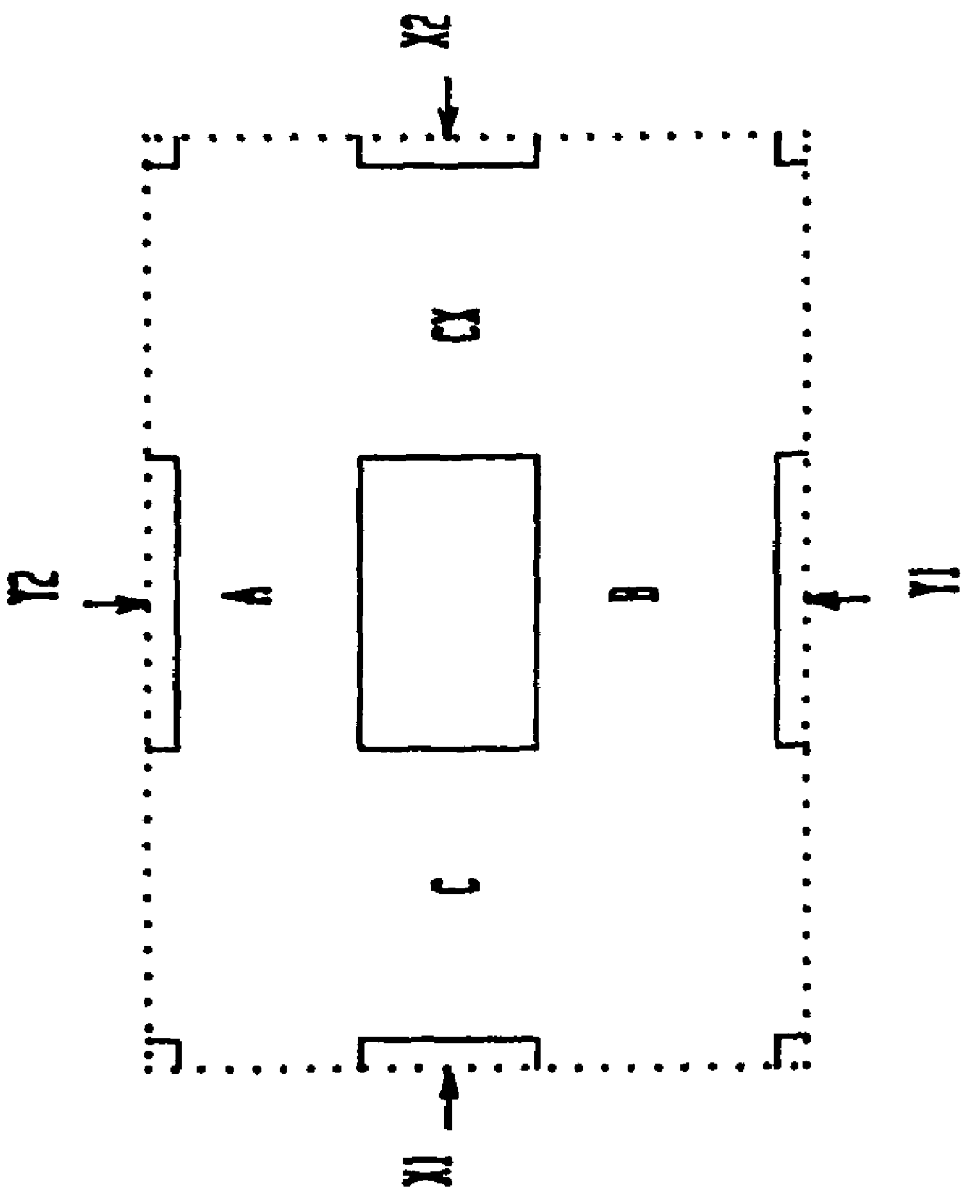
Figures 16, 17:
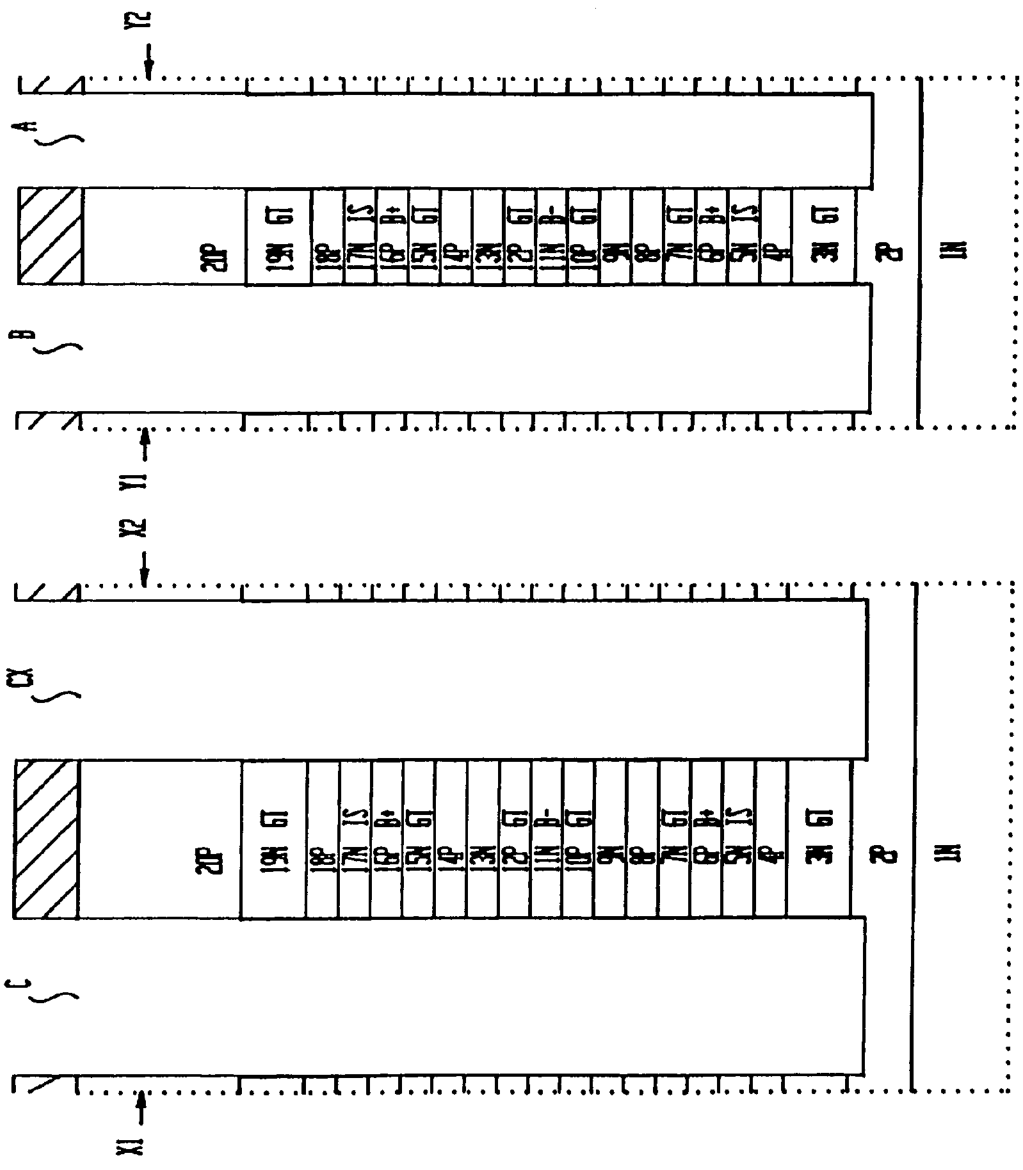

FIGS. 15, 16 and 17 (LB1) depict the results of a next subsequent step where the wafer is trench etched down to cut into the 2P layer, but not so as to sever it. The 2P layer may be thickened to make this easier with less accurate etching control. The trenches are labeled as A, B, C and CX, where the silicon-dioxide mask created by the photolithographic step has caused trench A to be 6 units wide, trench B to be 8 units wide, and trenches C and CX to be 10 units wide. These trenches will appear in subsequent FIGS. and will continue to be referred to by these labels, although since trenches C and CX are identical, they may also be subsequently referred to as trench C to refer to any C trench.

[LB-2] A second accurately etched material such as reflowed Parylene (other than the trench wall or bottom material) may be used to set a more precise vertical level than that of the trench bottoms, in an inaccurately or nonuniformly etched group of trenches. This can be done by setting the height of lower trench masking plugs at a preferred height which will be uniform compared to the original trench depth, where this plug is then left as structural feature. (This useful technique is not applied in this fabrication sequence.) Also, if layer 2P is sufficiently Boron doped, it has the potential to act as an etch stop.

[LB-6] A pillar side wall protector may be formed in a single trench axis, by deposition of an alternate selectable material which closes together in the first axis, followed by etching back a remaining gap in the second axis.

[LB-7] Parylene may be used as a pillar side wall protector by filling trenches with it in a single trench axis.

Figure 18:
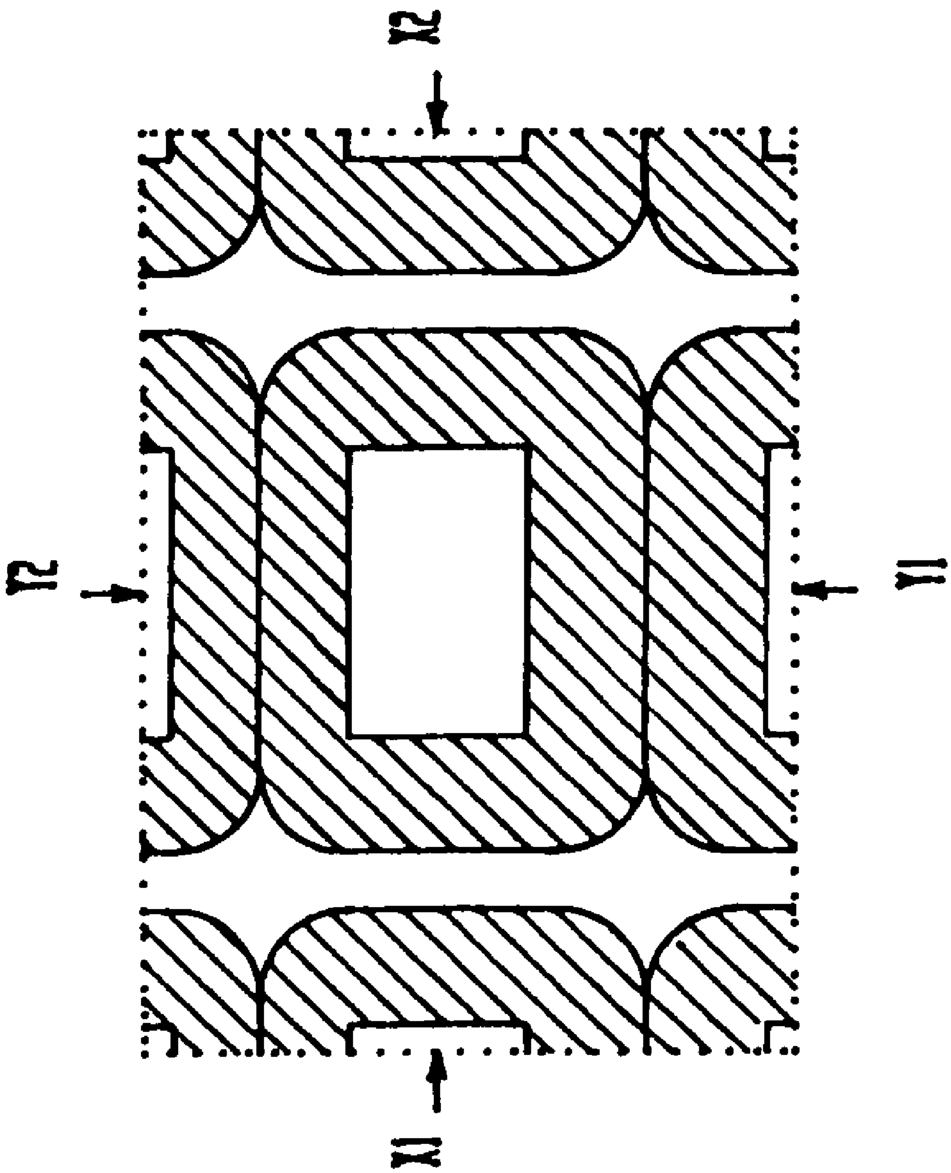
FIGS. 18, 19 and 20 depict three mutually orthogonal cross-sections, with the widest trenches partially closed and the narrower trenches completely closed by a second insulating material.
Figure 20:
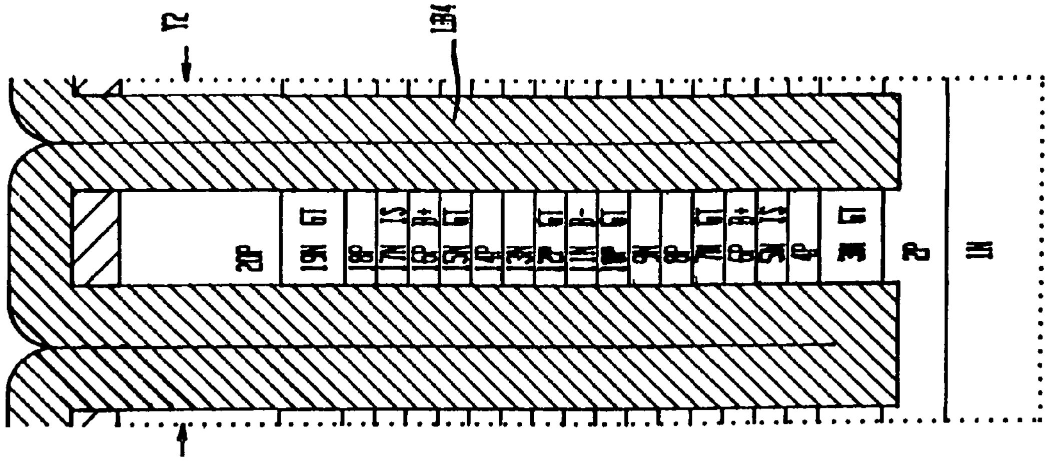
Figure 19:
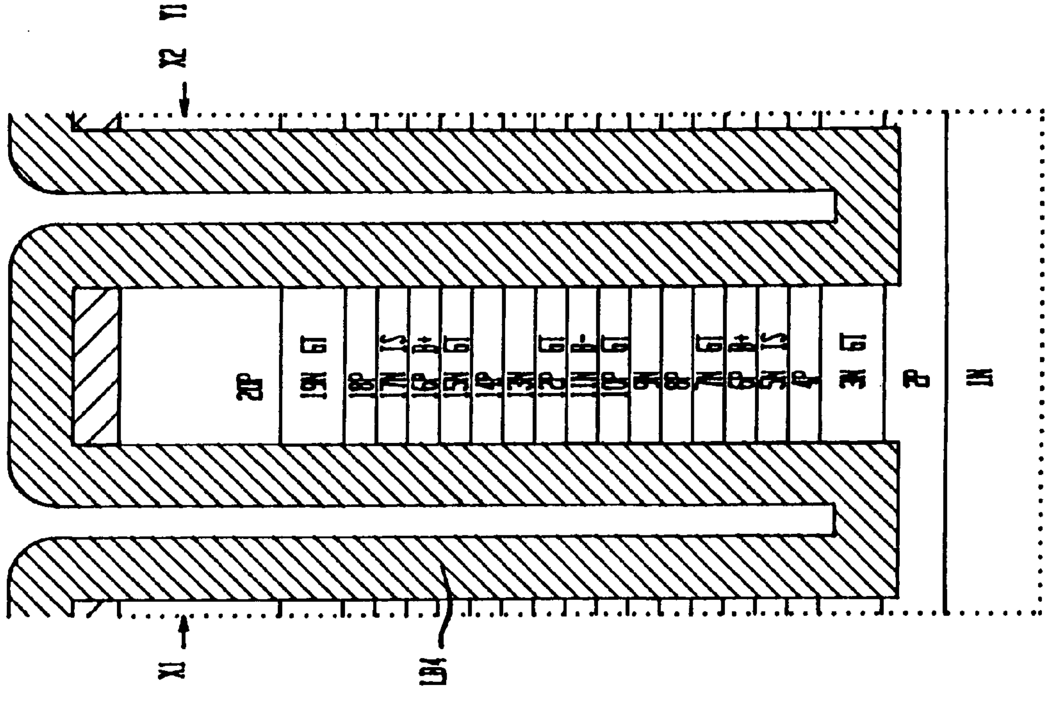

FIGS. 18, 19 and 20 depict the results of a next subsequent step where a coating of Parylene is deposited (LB4) so as to close out the A and B trenches, but so as to leave the C trenches gapped.

Figure 21:
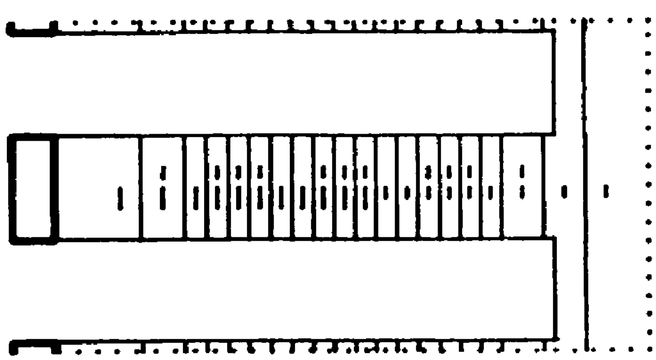
FIGS. 21 and 22 depict the two vertical cross-sections, with the second insulating material removed only from the widest trenches.
Figure 22:
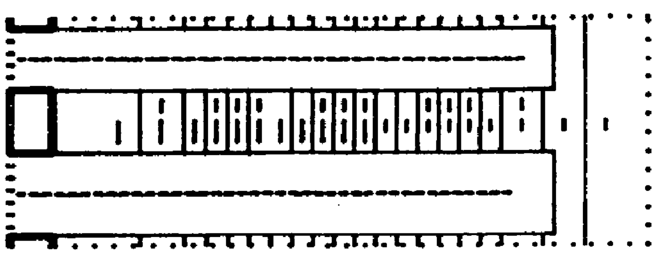

FIGS. 21 and 22 depict the results of a next subsequent step where the Parylene in the C trench is etched back so as to clear the C trench, but leaving Parylene filling the B and A trenches (LB4.1C & LB4.1BA). Void control is appropriate.

[LB-8] One trench axis may be etched deeper than another without use of photolithography.

Figure 23:
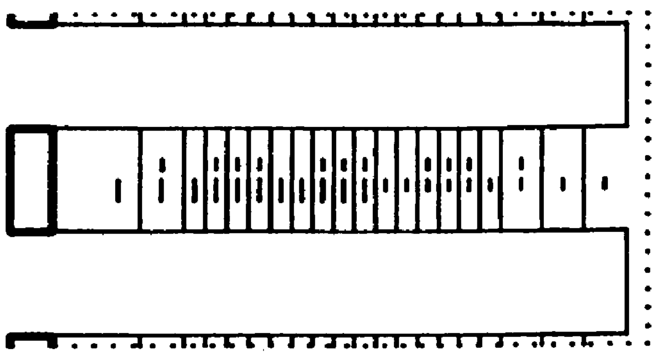
FIGS. 23 and 24 depict the two vertical cross-sections, with the bottoms of the widest trenches lowered into the lowest semiconductor layer.
Figure 24:
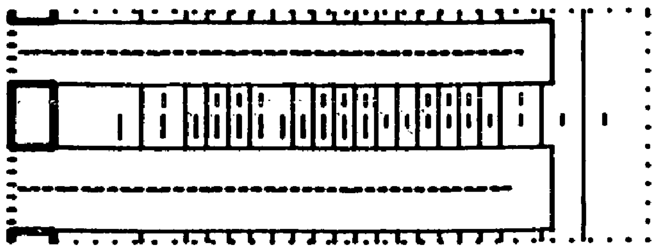

FIGS. 23 and 24 depict the results of a next subsequent step where exposure of the wafer to silicon-selective dry trench etch deepens the C trenches (to substantially below the top of layer 1N) while the B and A trenches remain protected (LB4.2C & LB4.2BA).

To accomplish this step, a thin coating of silicon-dioxide is preferably CVD coated over the exposed surfaces of the wafer so as to cover and protect the walls of the C trenches, followed by vertical etching away of the exposed tops and bottoms of the oxide coating, followed by exposure of the wafer to silicon-selective dry trench etch to deepen the C trenches while the B and A trenches remain protected, followed by omni-directional etching away of the silicon-dioxide coating which is covering and protecting the polysilicon on the walls.

Alternatively, this step can be accomplished by a single ion milling step which will also etch down the exposed upper surfaces as well as the shown bottom of the C trench.

Figure 25:
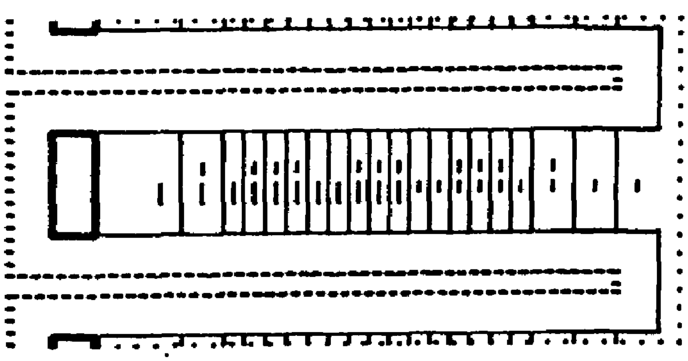
FIGS. 25 and 26 depict the two vertical cross-sections, with a new layer of second insulating material covering the top surface and partially filling the widest trenches.
Figure 26:
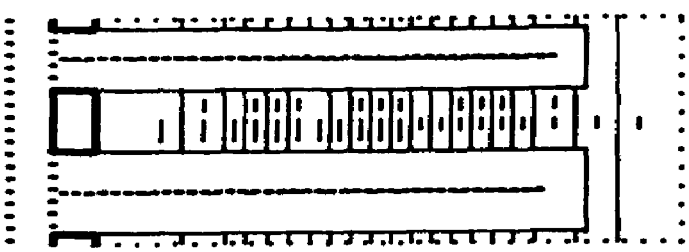

FIGS. 25 and 26 depict the results of a next subsequent step where Parylene is omni-directionally deposited over the exposed wafer surfaces, so as to coat the C trenches with a coating which is half the width of the B trenches, which leaves the C trenches gapped (LB4.3C & LB4.3BA).

Figure 27:
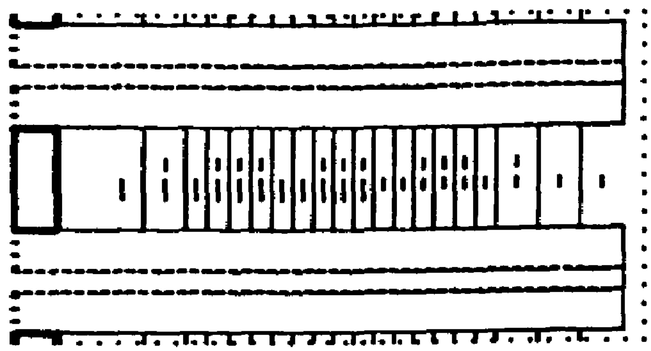
FIGS. 27 and 28 depict the two vertical cross-sections, with the new layer of second insulating material removed from all non-vertical surfaces.
Figure 28:
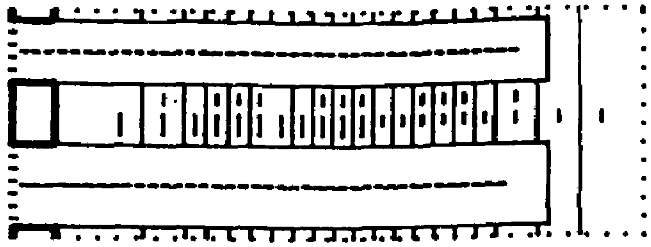

FIGS. 27 and 28 depict the results of a next subsequent step where the exposed tops and bottoms of the aforementioned Parylene are vertically etched down by such means as ion milling, so as to expose the silicon-dioxide mask caps above 20P (LB4.4C & LB4.4BA).

Figure 29:
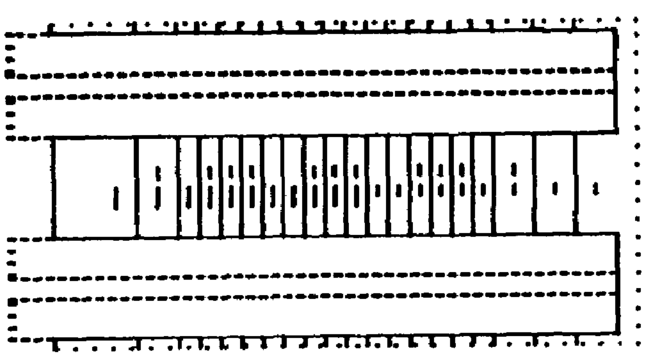
FIGS. 29 and 30 depict the two vertical cross-sections, with the layer of first insulating material removed from the pillar tops.
Figure 30:
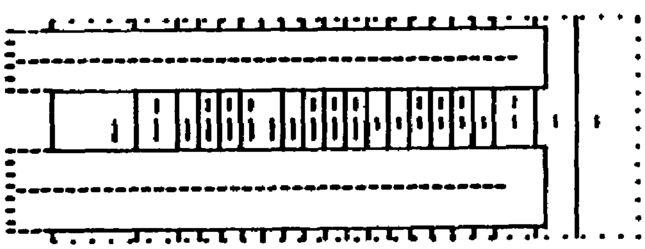

FIGS. 29 and 30 depict the results of a next subsequent step where the now exposed silicon-dioxide mask caps are selectively etched away (LB4.5C & LB4.5BA).

[LB-8A] One or more sides of a pillar may be thermally oxidized to serve as gate insulation layers which extend in a vertical plane.

[LB-8B] A protective coating may be deposited over a vertical gate insulation coating, so as to allow further processing of a pillar circuit without damage to the vertical gate insulation coating in subsequent steps.

[LB-8C] The tops and bottoms of an omni-directional deposition of a gate layer material can be etched away only in the vertical axis, so as to leave material for gate insulation of multiple pillar transistors extending only over the vertical surfaces of the pillars.

Figure 31:
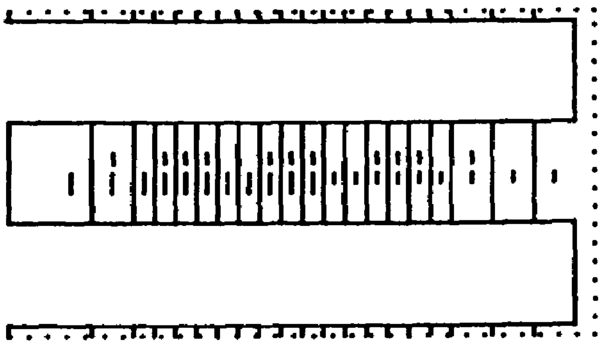
FIGS. 31 and 32 depict the two vertical cross-sections, with all second insulating material removed. Thin layers of first insulating material and semiconductor material covering all surfaces are not shown explicitly in this and subsequent figures.
Figure 32:
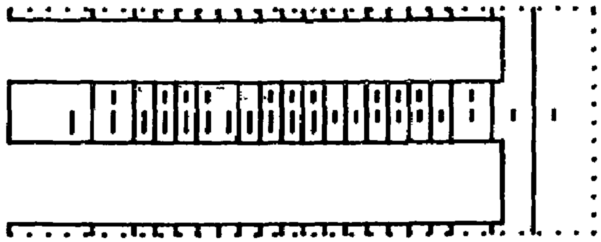

FIGS. 31 and 32 depict the results of a next subsequent step where all exposed Parylene is etched away, and the exposed surfaces are thermally oxidized to an appropriate gate oxide thickness, followed by chemical vapor deposition (CVD) coating this silicon-dioxide layer with a thin protective layer of polysilicon. The tops and bottoms of these polysilicon and silicon-dioxide layers are then vertically etched away by such means as ion milling. These layers are not shown in the schematic drawings due to their thinness (LB4.6C & LB4.6BA). In subsequent detail (three view) drawings they are indicated by a thick black line.

The polysilicon and thermally grown silicon-dioxide subsequently form the gates and gate insulators of field effect transistors. It will be obvious to those skilled in the art that alternative modern materials may be used as gate insulators, in accordance with engineering preference.

Figure 33:
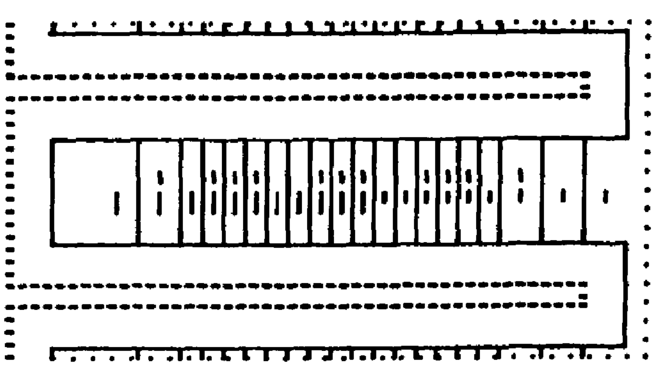
FIGS. 33 and 34 depict the two vertical cross-sections, with a new layer of second insulating material covering the top surface and partially filling the widest trenches.
Figure 34:
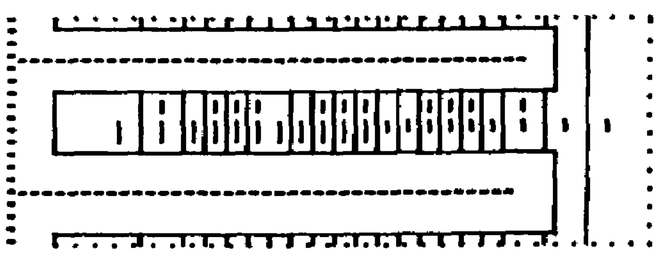

FIGS. 33 and 34 depict the results of a next subsequent step where Parylene is omni-directionally deposited over the exposed wafer surfaces, so as to close out the B and A trenches, and leave the C trenches gapped (LB4.7C & LB4.7BA).

Figure 35:
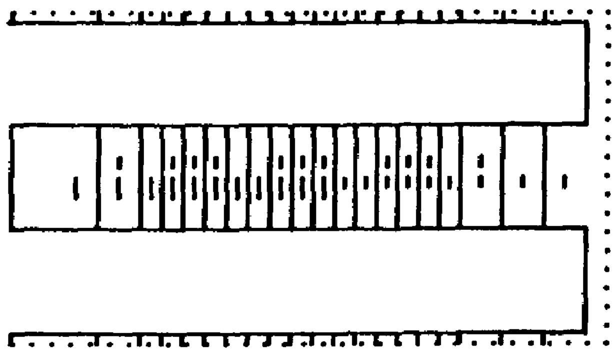
FIGS. 35 and 36 depict the two vertical cross-sections, with the new layer of second insulating material remaining only in the narrower trenches.
Figure 36:
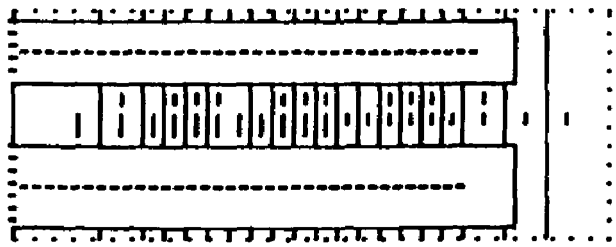
Figure 37:
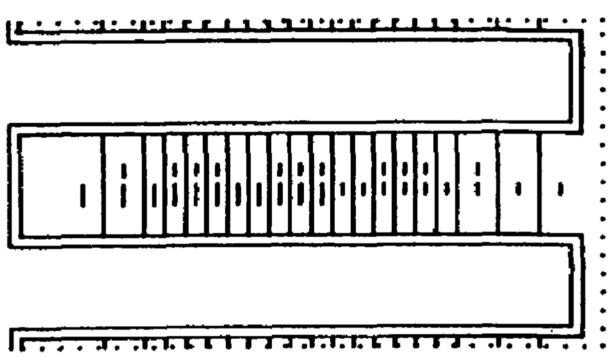
FIGS. 37 and 38 depict the two vertical cross-sections, with a layer of a first metal covering all surfaces.
Figure 38:
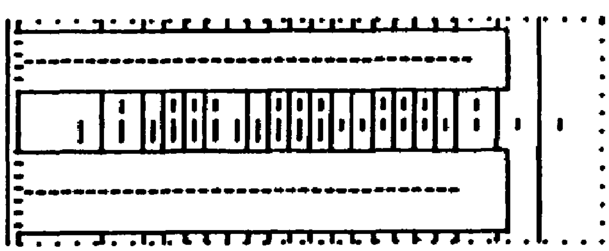

FIGS. 35 and 36 depict the results of a next subsequent step where the Parylene in the C trench is etched back so as to clear the C trench, but leaving Parylene filling the B and A trenches (LB4.8C & LB4.8BA). Void control is appropriate. At this point in the process sequence, to prevent shorting, any exposed conductive (protective) coating over or next to the insulative thermal oxide on the trench walls in the region to be subsequently filled with insulator can be side etched off using the previously described lower trench masking plugs and upper trench wall masking coatings (pistons and sleeves) as follows:

FIGS. 37 and 38 depict the results of a next subsequent step where a protective coating of tungsten is omni-directionally deposited over the exposed top, side and bottom surfaces of the C trench, and the tops of the pillars and intervening B and A trench Parylene (LB4.9C & LB4.9BA).

Figure 39:
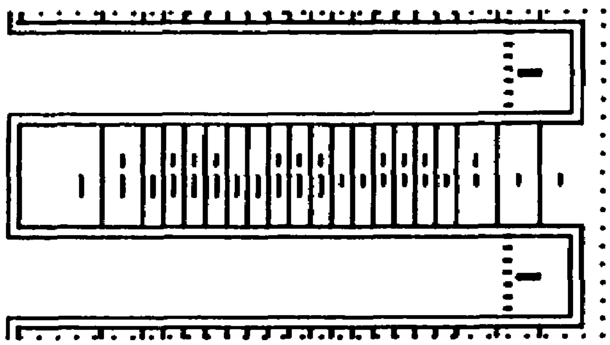
FIGS. 39 and 40 depict the two vertical cross-sections, with plugs of second insulating material with cores of first insulating material, at the bottom of the widest trenches.
Figure 40:
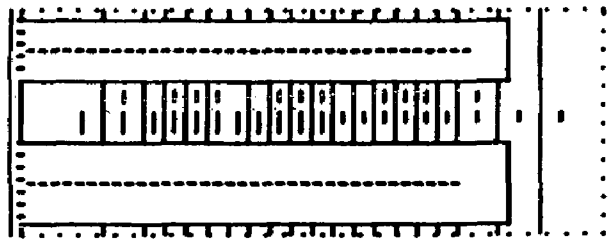

FIGS. 39 and 40 depict the results of a next subsequent step where a Parylene based lower trench masking plug (shown using a center partition of silicon-dioxide) is set to the height below which the subsequent side etch is to occur (LB4.10C. & LB4.10BA).

Figure 42:
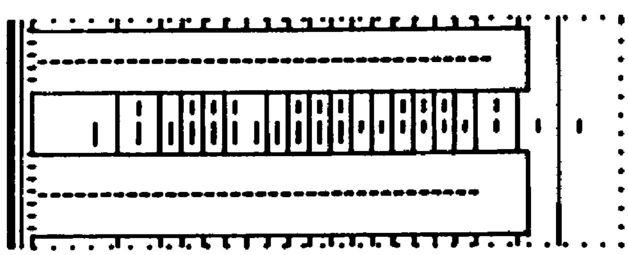
FIGS. 41 and 42 depict the two vertical cross-sections, with a layer of a third insulating material covering all surfaces.
Figure 41:
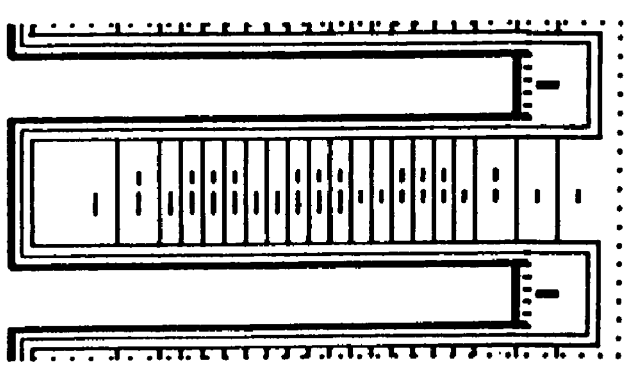

FIGS. 41 and 42 depict the results of a next subsequent step where an upper trench wall masking coating of silicon-nitride is deposited above this lower trench masking plug, where the lowest portion of this coating is lower than the top of layer 2P in accordance with the height of the lower trench masking plug (LB4.11C & LB4.11BA).

Figure 44:
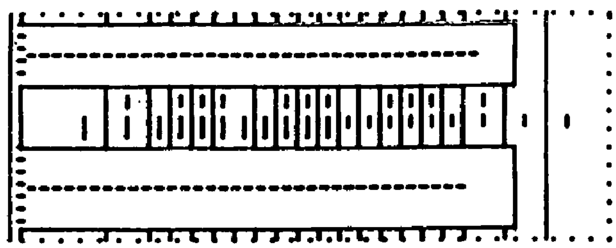
FIGS. 43 and 44 depict the two vertical cross-sections, with the third insulating material removed from all non-vertical surfaces.
Figure 43:
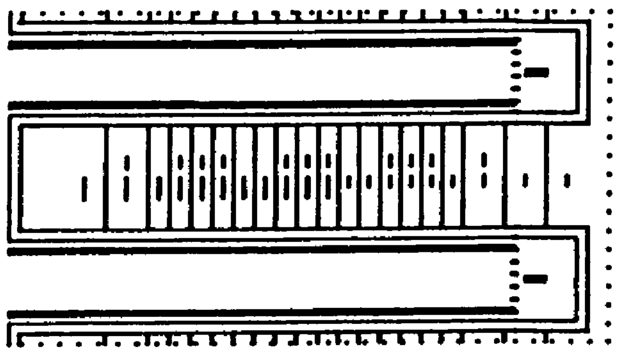

FIGS. 43 and 44 depict the results of a next subsequent step where the tops and bottoms of this silicon-nitride upper trench wall masking coating are vertically etched off by such means as ion milling, but so as to leave the tungsten coating still intact above the top surfaces as a protector for the Parylene in the B and A trenches (LB4.12C & LB4.12BA).

Figure 45:
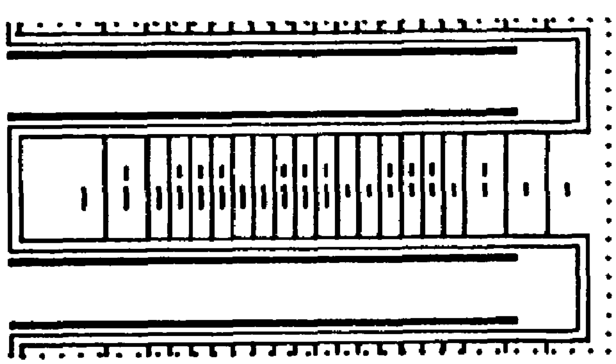
FIGS. 45 and 46 depict the two vertical cross-sections, with the plugs at the bottoms of the widest trenches removed.
Figure 46:
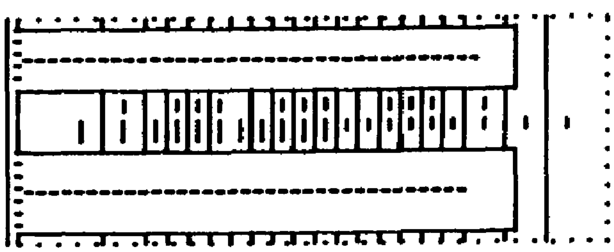

FIGS. 45 and 46 depict the results of a next subsequent step where the Parylene lower trench masking plug with silicon-dioxide core is selectively etched away (i.e. far enough down to expose the tungsten layer at the bottom of the trench) (LB4.13C & LB4.13BA).

Figure 47:
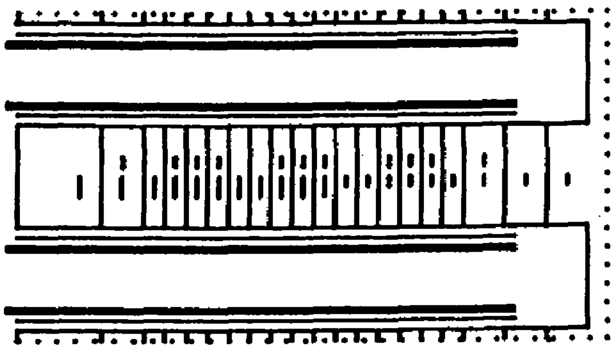
FIGS. 47 and 48 depict the two vertical cross-sections, with the metal layer removed, except underneath the layer of third insulating material on the walls of the widest trenches.
Figure 48:
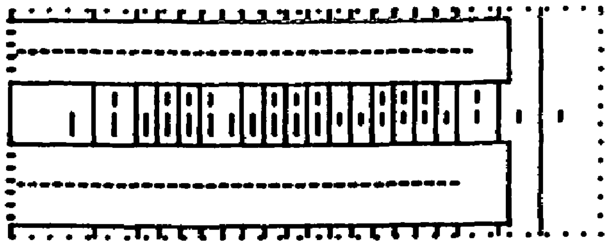

FIGS. 47 and 48 depict the results of a next subsequent step where the protective tungsten coating (in the regions at the bottom of the C trenches where the side wall etch is desired) is then selectively etched away, using the silicon-nitride upper trench wall masking coating as a mask (LB4.14C & LB4.14BA).

Figure 49:
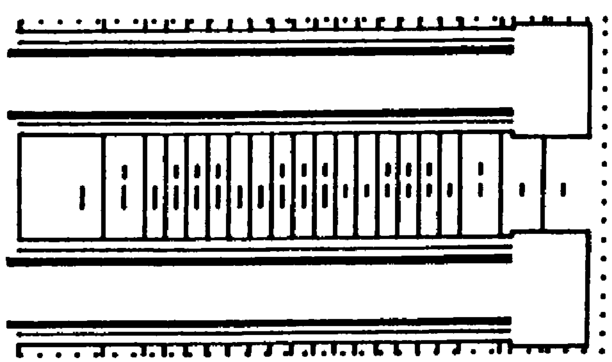
FIGS. 49 and 50 depict the two vertical cross-sections, with the thin layers of semiconductor and first insulating materials removed, except where they are protected by other layers.
Figure 50:
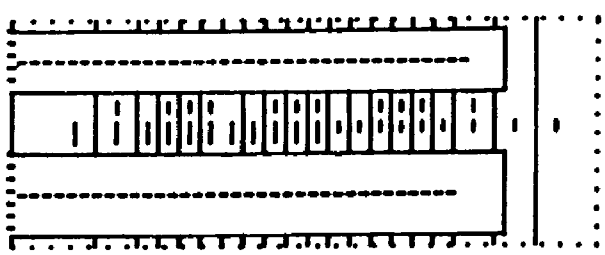

FIGS. 49 and 50 depict the results of a next subsequent step where the polysilicon and thermal silicon-dioxide side wall material below the silicon-nitride mask are then selectively etched away (LB4.15C & LB4.15BA). (A slight, thin etch down of other exposed silicon also occurs.)

Figure 51:
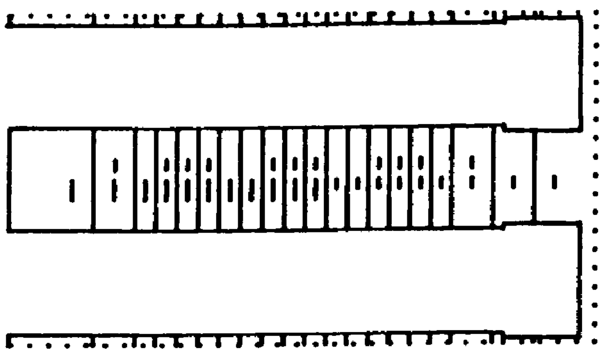
FIGS. 51 and 52 depict the two vertical cross-sections, with the layers of third insulating material and first metal removed from the walls of the widest trenches.
Figure 52:
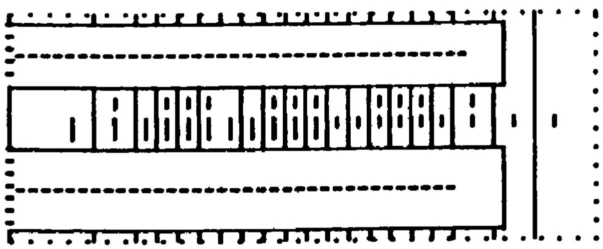
Figure 53:
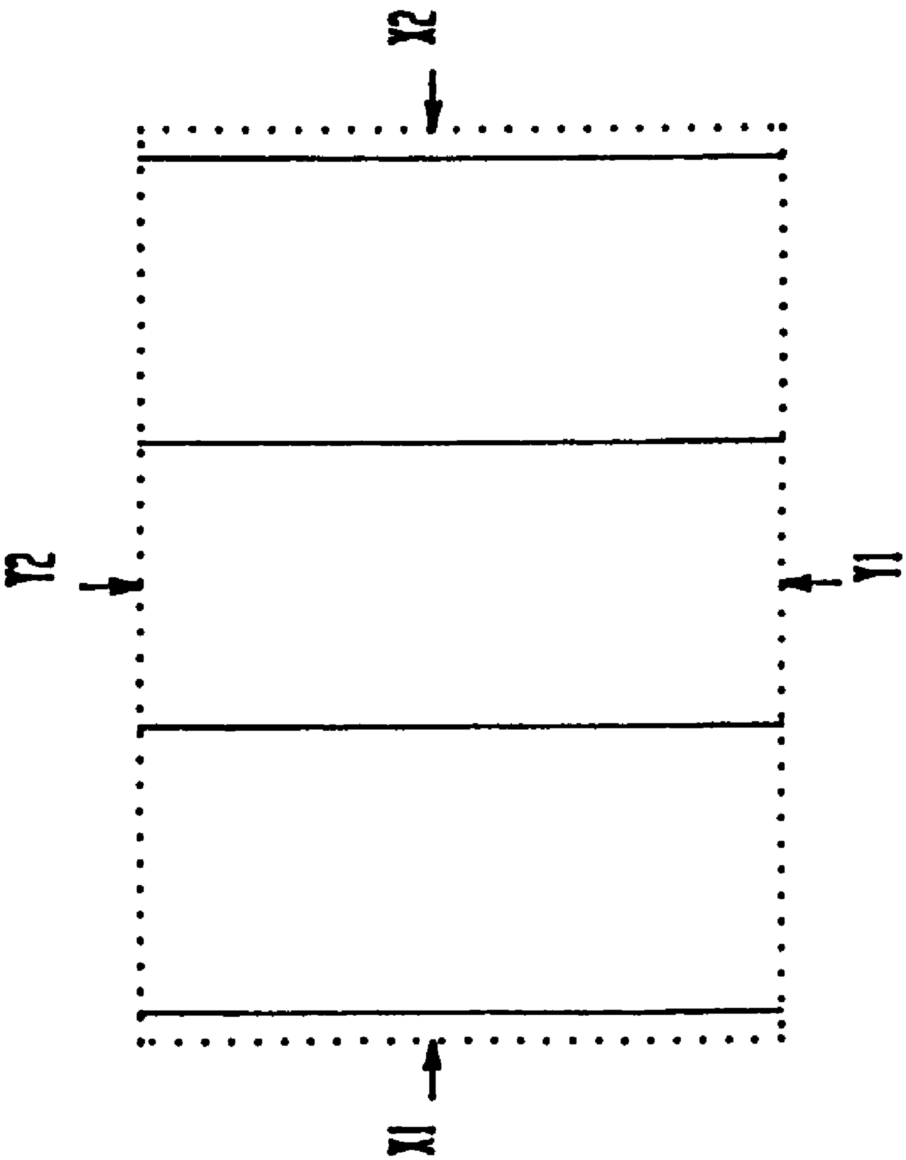
FIGS. 53, 54 and 55 depict three mutually orthogonal cross-sections of the structure of FIGS. 51 and 52 in more detail, with the thin layers of first insulating material and semiconductor material coating the pillars illustrated by heavier contour lines.
Figure 55:
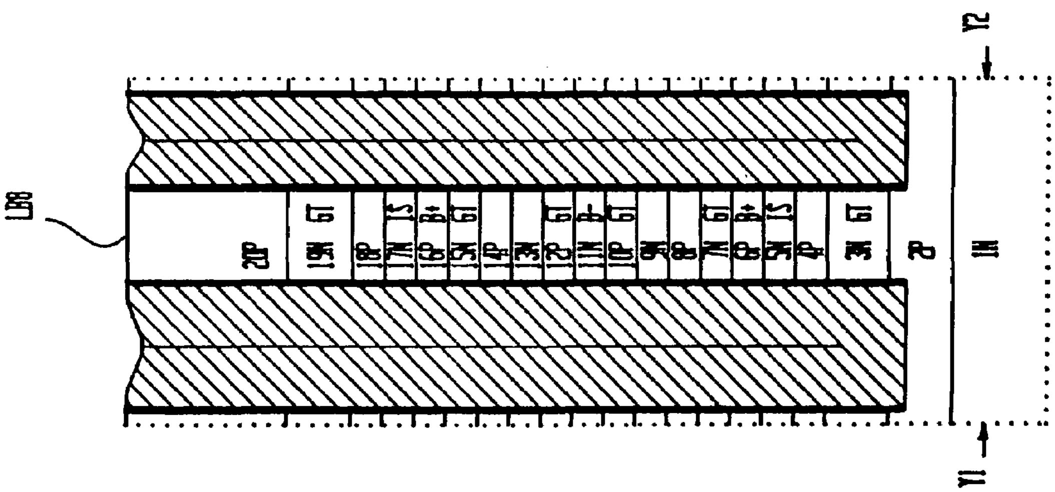
Figure 54:
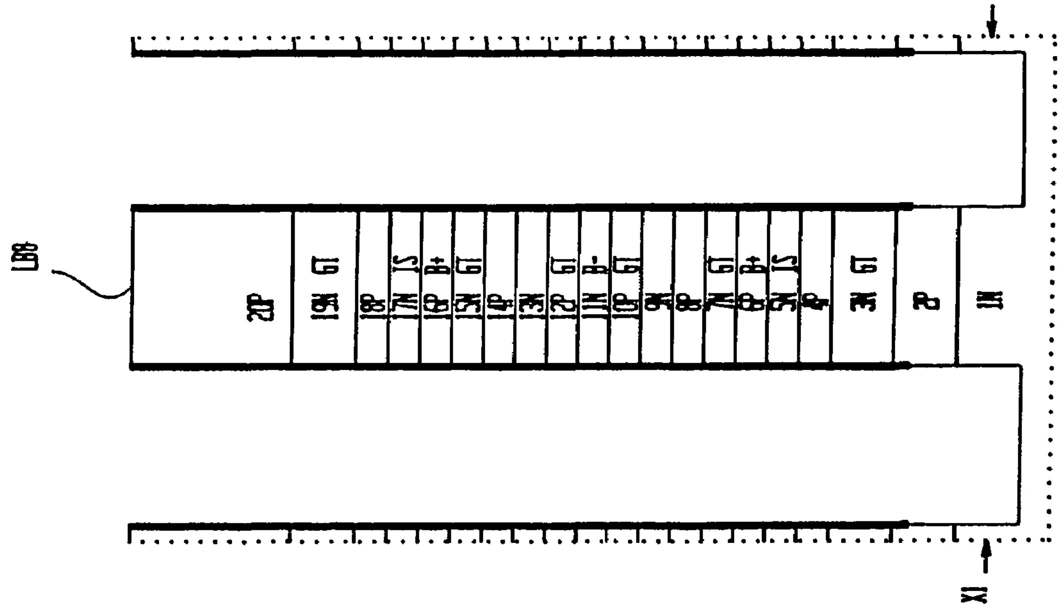

FIGS. 51 and 52 depict the results of a next subsequent step where the remaining material from the silicon-nitride upper trench wall masking coating and the tungsten protective coating are omni-directionally etched away by such means as selective wet etch or omni-directional dry etch (LB4.16C & LB4.16BA), as shown in greater detail in FIGS. 53, 54 and 55 which depict a pillar shown as LB8, to the sides of which the B and A trenches are closed out with Parylene, and where the C trench is shown as cleared after this wet etch or omni-directional dry etching. The back-etch of the lower conductive side wall material indicated in the process schematic is illustrated in FIGS. 53, 54 and 55 as a break between the side wall thermally oxidized silicon with its protective coating (shown as single thick vertical lines along the upper trench walls), and the bottoms of the C trenches.

The previously described process sequence shown as steps LB4.9 through LB4.16 should be repeated here (not shown) with the upper trench wall masking coating set slightly higher, followed by removal of the polysilicon protective coating layer only without removal of the underlying thermal silicon-dioxide, so that this thermal silicon-dioxide layer segment which will subsequently be covered by the silicon-dioxide insulative plug at step LB10 will not have a conductor over it which would short to the adjacent gate region. Thus, this allows the subsequent deposition of insulator forming the plug on the bottom of the trench to connect with the thermal oxide layer, but without leaving short circuiting traces of conductive material.

[LB-9] A trench may be partially filled with an insulator so as to make an insulative plug, so as to provide insulation between lower conductive regions of adjacent pillars.

[LB-10] An insulative plug may be fabricated by creation of vertically extending fingers made of the plug material, followed by joining these fingers together by deposition of a fill between them, followed by etching away of the thin layer of upper exposed plug material, resulting in a continuous plug which has the height of the vertically extending fingers.

Figure 56:
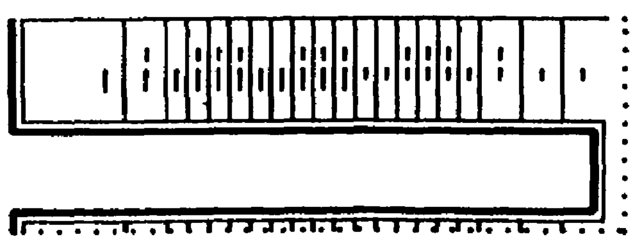
FIG. 56 depicts the vertical cross-section of the widest trench with all surfaces coated with a layer of first insulating material.

FIG. 56 depicts the results of a next subsequent step where the C trenches are coated by CVD with silicon-dioxide (LB8.1).

Figure 57:
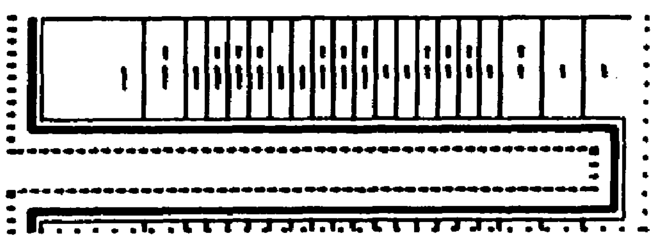
FIG. 57 depicts the vertical cross-section of the widest trench with all surfaces further coated with a layer of second insulating material.

FIG. 57 depicts the results of a next subsequent step where the trenches are then coated with Parylene (LB8.2).

Figure 58:
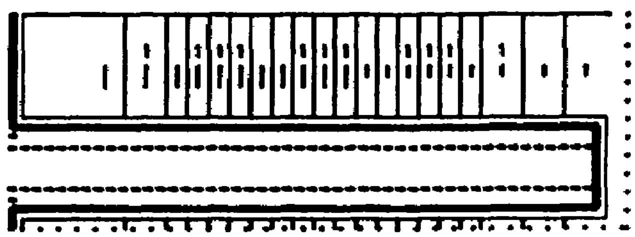
FIG. 58 depicts the vertical cross-section of the widest trench with the second insulating material removed from all non-vertical surfaces.

FIG. 58 depicts the results of a next subsequent step where the exposed tops and bottoms of the Parylene (LB8.3) are vertically etched away by ion milling.

Figure 59:
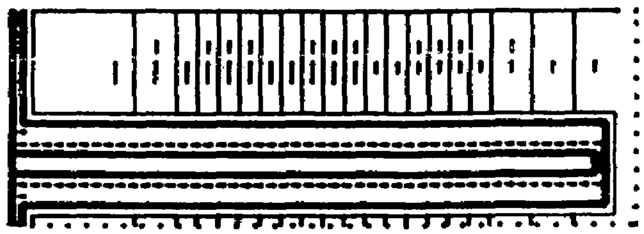
FIG. 59 depicts the vertical cross-section of the widest trench, with all surfaces covered and the trench closed out by first insulating material.

FIG. 59 depicts the results of a next subsequent step where the trenches are coated with silicon-dioxide by CVD, so as to close them out (LB8.4).

Figure 60:
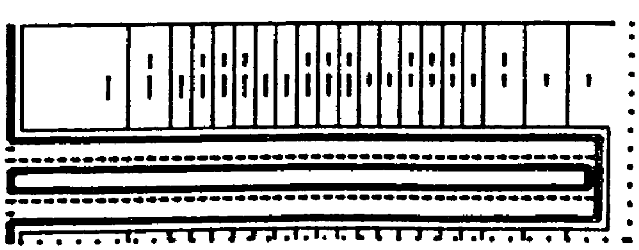
FIG. 60 depicts the vertical cross-section of the widest trench, with the top layer of first insulating material removed from the top surface.

FIG. 60 depicts the results of a next subsequent step where the upper portion of the silicon-dioxide coating is etched away (LB8.5) by such means as ion milling or wet etch or omni-directional dry etch, so as to expose the Parylene in the C trench, but leave the upper surfaces of the pillars and B and A trench Parylene still covered with silicon-dioxide.

Figure 61:
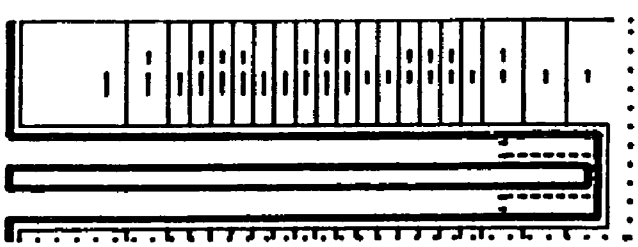
FIG. 61 depicts the vertical cross-section of the widest trench, with the layers of second insulating material removed to a preferred height in the trench.

FIG. 61 depicts the results of a next subsequent step where the C trench Parylene is etched down to a preferred height to support the subsequent steps (LB8.6).

Figure 62:
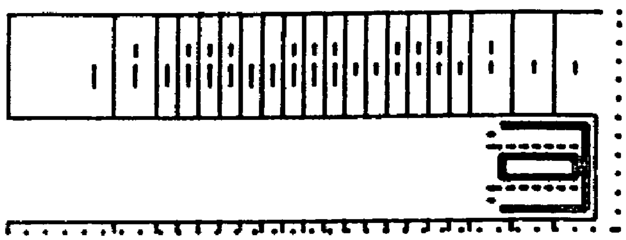
FIG. 62 depicts the vertical cross-section of the widest trench, with the layers of first insulating material remaining only below the preferred height in the trench.

FIG. 62 depicts the results of a next subsequent step where the silicon-dioxide walls and center partitions are etched back to just below the height of the C trench Parylene (LB8.7), and also cleared from the upper pillar and B and A trench Parylene surfaces.

Figure 63:
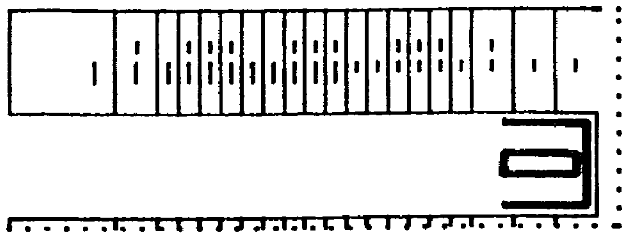
FIG. 63 depicts the vertical cross-section of the widest trench, with all second insulating material removed from the trench.
Figure 64:
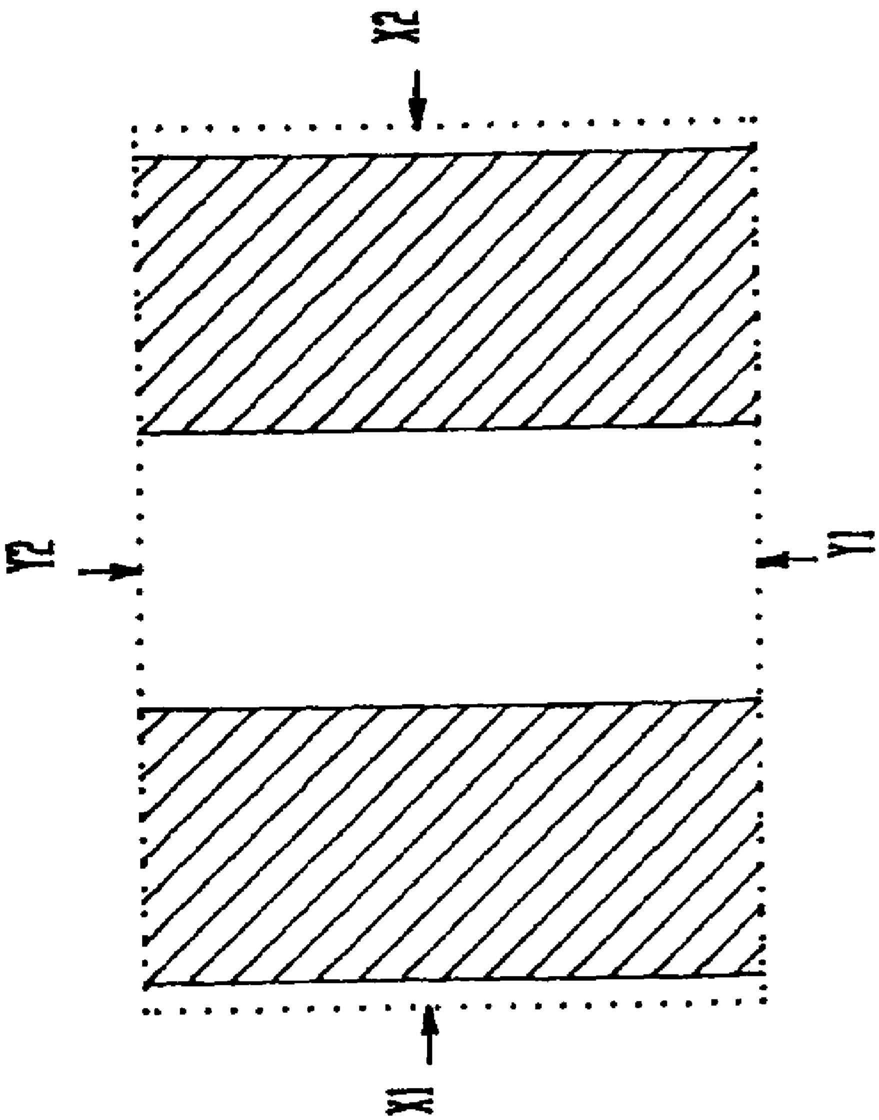
FIGS. 64, 65 and 66 depict three mutually orthogonal cross-sections of the structure of FIG. 63 with more detail and more completely.
Figure 66:
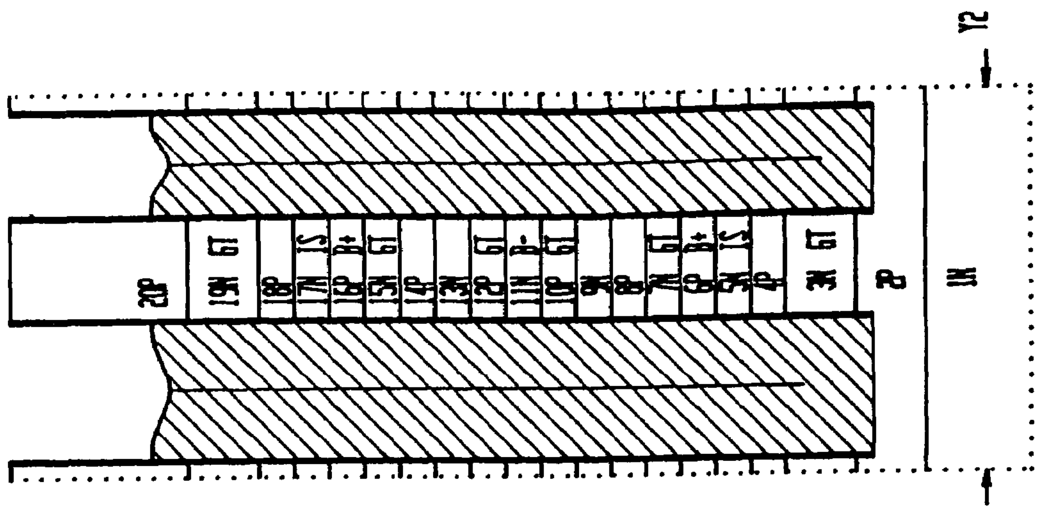
Figure 65:
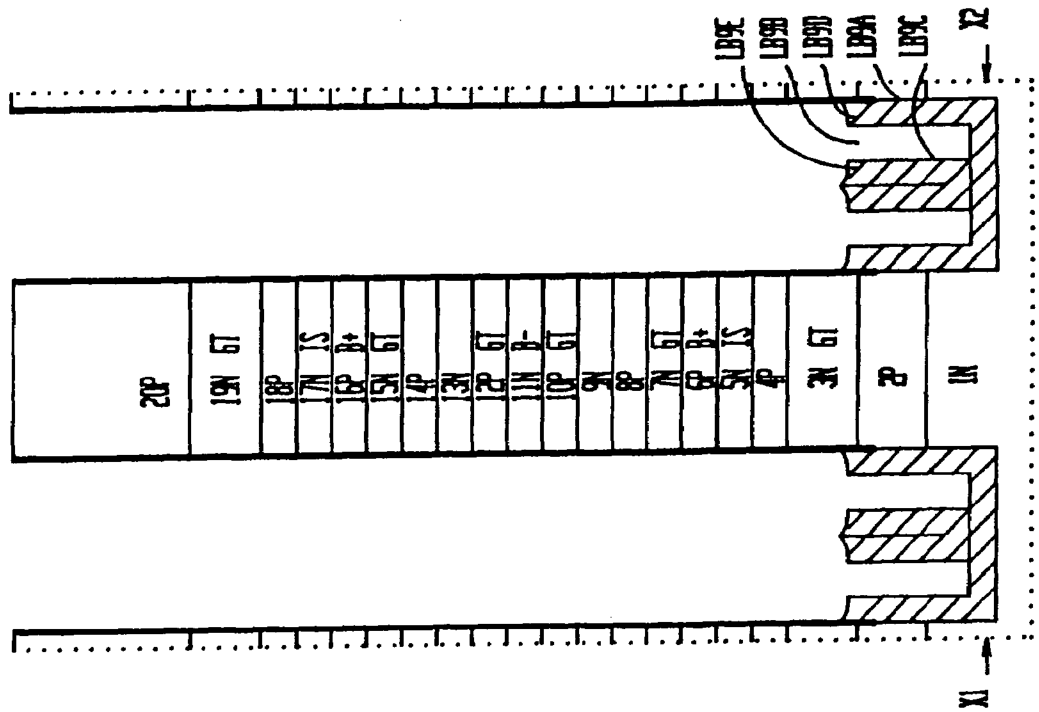

FIG. 63 (LB8.8) depicts the results of a next subsequent step where the C trench Parylene is etched out entirely, leaving fingers of silicon-dioxide extending upward as shown in FIGS. 64, 65 and 66 LB9D and LB9E to a height just above the bottom of layer 3N. (Note that the height of the Parylene in the B and A trenches is also reduced by this amount.)

[LB-11] Two narrower regions at the bottom of a trench can be closed out, followed by omni-directional wet etch or dry etch-back of the top, so as to create a low plug-like feature in the bottom of a trench.

Figure 67:
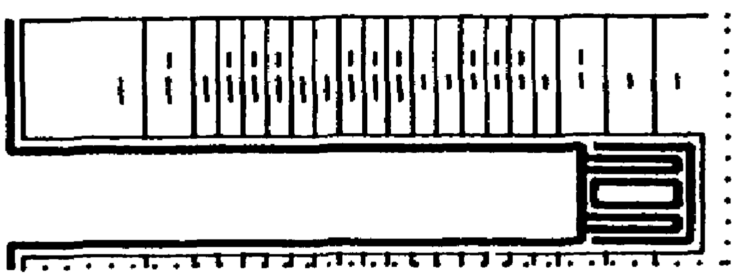
FIG. 67 depicts the vertical cross-section of the widest trench, with a layer of first insulating material covering all surfaces and filling the gaps at the bottom of the trench.

FIG. 67 depicts the results of a next subsequent step where CVD of silicon-dioxide closes out between the aforementioned upward extending fingers (LB9.1). (Note: The deposition of this step and the etch-back of the next step also coat and etch back in the tops of the B and A trenches.)

Figure 68:
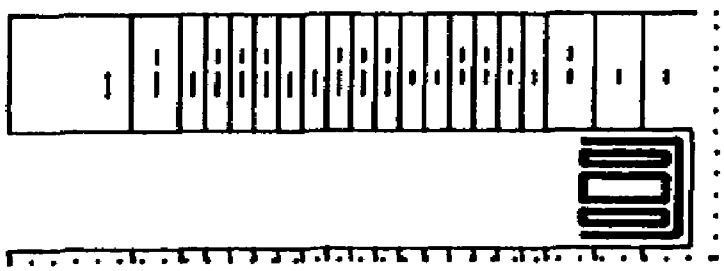
FIG. 68 depicts the vertical cross-section of the widest trench, with the plug of first insulating material at the bottom of the trench completed.

FIG. 68 (LB9.2) depicts the results of a next subsequent step where the silicon-dioxide coating the walls is etched back, so as to leave the desired insulative plugs at the bottom of each C trench. These insulative plugs protect a remnant of polysilicon protective coating which extends vertically just above and just below the interface between layers 2P and 3N, horizontally along the pillar portion in the C trench, and wrapping into the A and B trench sides of the pillars. This remnant has the potential to create a short circuit between the conductive material which exists in the A and B trenches when the structure is completed. This is prevented in later fabrication steps when this remnant is severed by etch-back in the bottom of the A trench, before vertical wiring is subsequently created in the etched-back region. Embedding this remnant in insulator in the C trench and elsewhere insulates it from other sort circuit contact. It is desirable to etch this polysilicon coating back from the sides and the top when adjacent coatings are etched away, before imbedding the region in its final insulative coating.

Figure 69:
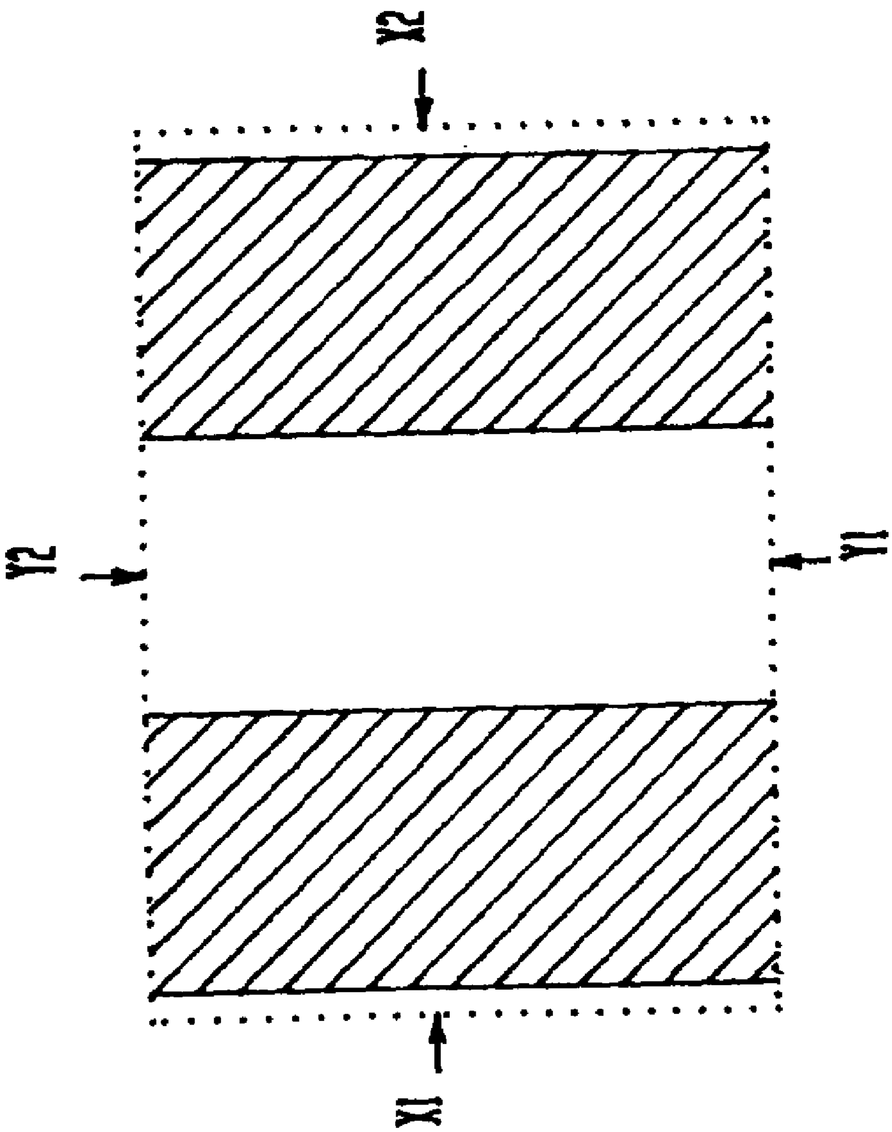
FIGS. 69, 70 and 71 depict three mutually orthogonal cross-sections of the structure of FIG. 68 more completely and detailed.
Figure 71:
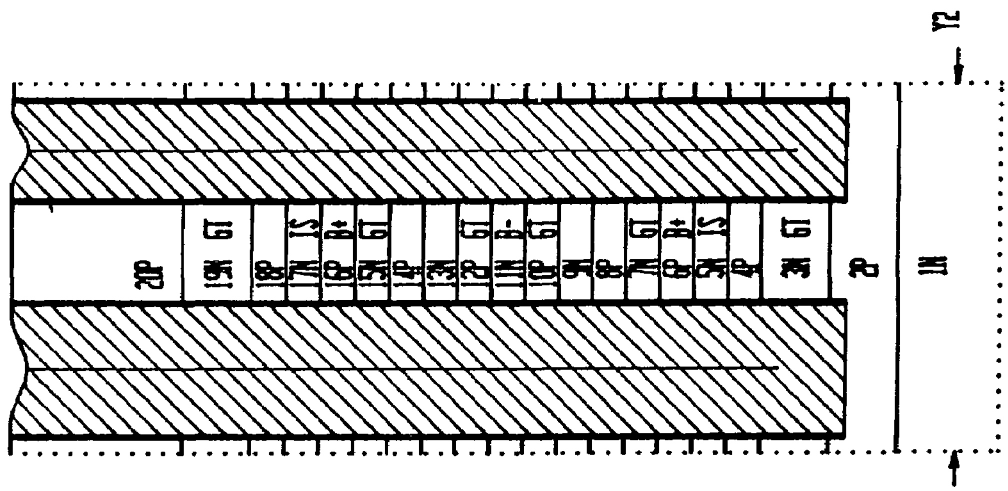
Figure 70:
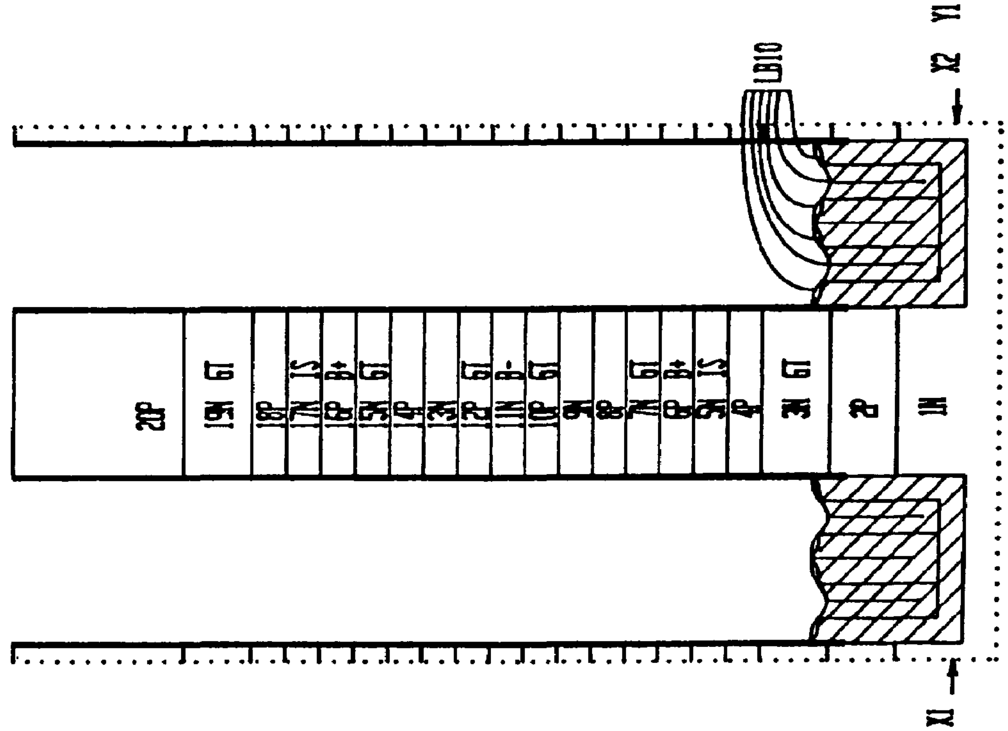

A coating of Parylene is deposited so as to close out the tops of the B and A trenches, but so as to leave the C trench gapped. This coating is then etched back so as to clear the C trench and leave the B and A trenches closed out as shown in FIGS. 69, 70 and 71, where LB10 shows the layers of one of the aforementioned insulative plugs. The lower regions of 2P continue along between insulative plugs at the bottoms of the C trenches, and beneath the pillars, so as to form bit lines for the circuitry to be subsequently created.

[LB-12] Thus, groups of conductive bit lines on horizontal planes can be constructed below the upper surface of a semiconductor wafer (significantly below the height of the pillar tops) to control a semiconductor memory (as will be subsequently described), without the use of photolithography.

Center Partition

[LB-13] A center partition can be created in the middle of a trench without use of photolithography.

[LB-14] A center partition can be created by coating the sides of a trench with a highly selectable material, filling the interstice with partition material, then removing the aforementioned highly selectable material on the sides of the partition.

[LB-15] Parylene is a preferred highly selectable material for the sides of such a partition.

Figure 72:
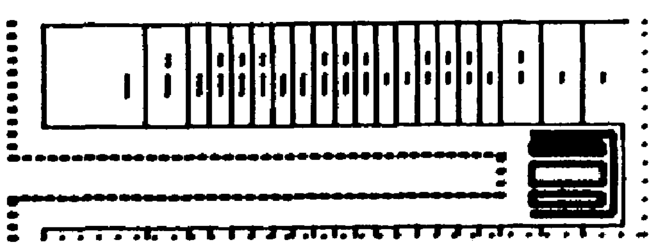
FIG. 72 depicts the vertical cross-section of the widest trench, with a layer of second insulating material covering all surfaces.

FIG. 72 depicts the results of a next subsequent step where Parylene (LB10.1) is deposited on the walls of the trenches above the aforementioned insulative plugs.

Figure 73:
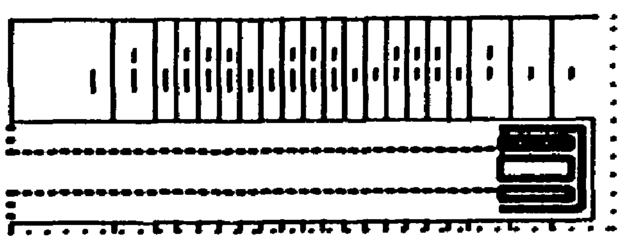
FIG. 73 depicts the vertical cross-section of the widest trench, with the layer of second insulating material removed from all non-vertical surfaces.

FIG. 73 depicts the results of a next subsequent step where the tops and bottoms of the Parylene coating are vertically etched away (LB10.2) by such means as ion milling.

[LB-15A] A mechanically supportive base can be created for a vertically extending structure made from subsequently deposited materials.

[LB-15B] A mechanically supportive base can be created for a center partition.

Figure 74:
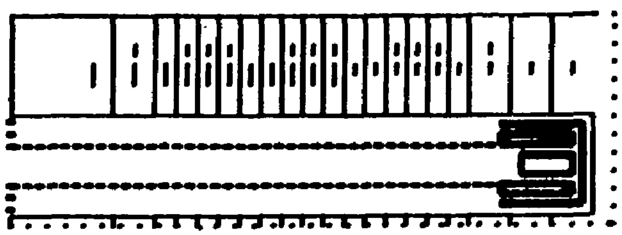
FIG. 74 depicts the vertical cross-section of the widest trench, with a notch at the center of the plug at the bottom of the trench.

FIG. 74 depicts the results of a next subsequent step where the centers of the insulative plugs are etched down slightly (LB10.3), so as to create recesses to add support to the center partitions which will be subsequently formed.

Figure 75:
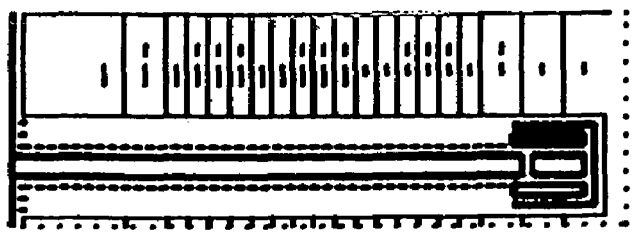
FIG. 75 depicts the vertical cross-section of the widest trench, with all surfaces covered and the trench closed out by third insulating material.

FIG. 75 depicts the results of a next subsequent step where an omni-directional CVD coating of silicon-nitride is deposited so as to close out the C trenches (LB10.4).

Figure 76:
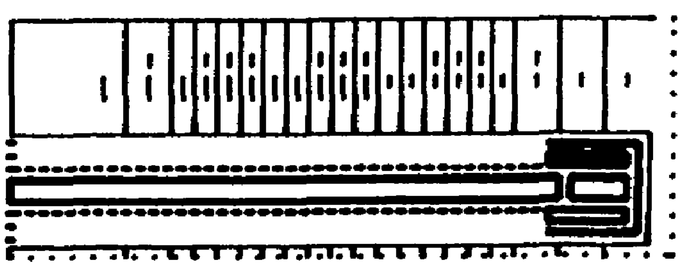
FIG. 76 depicts the vertical cross-section of the widest trench, with the layer of third insulating material removed from the top surface.

FIG. 76 depicts the results of a next subsequent step where the top of this silicon-nitride coating is etched off (LB10.5) by such means as wet etch or omni-directional dry etch.

Figure 77:
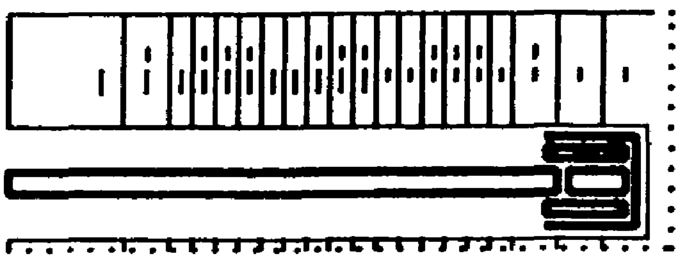
FIG. 77 depicts the vertical cross-section of the widest trench, with all second insulating material removed, leaving a center wall of third insulating material.
Figure 78:
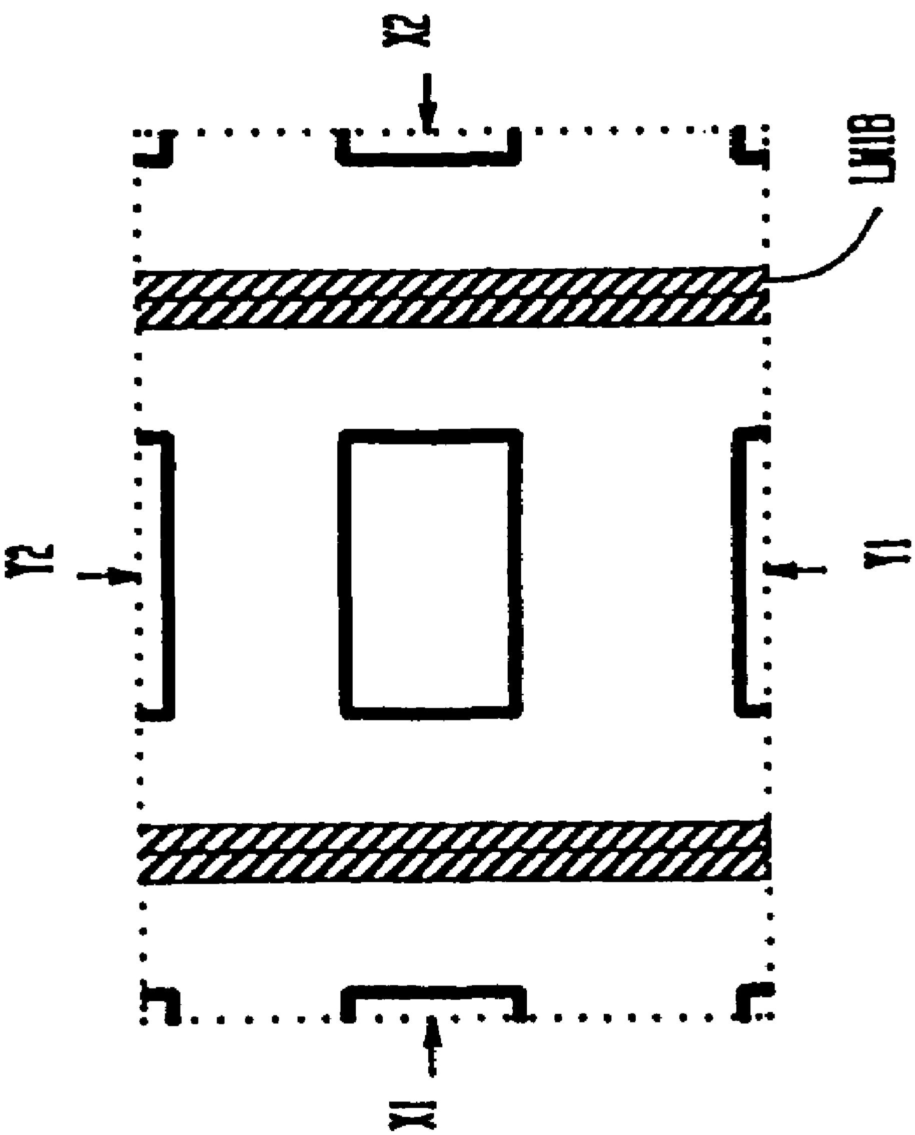
FIGS. 78, 79 and 80 depict three mutually orthogonal cross-sections of the structure of FIG. 77 more completely and detailed.
Figure 80:
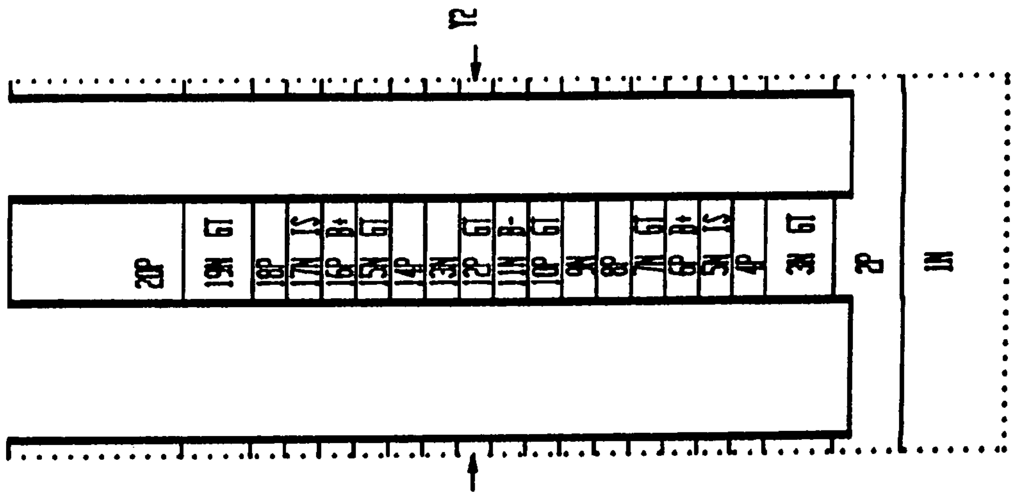
Figure 79:
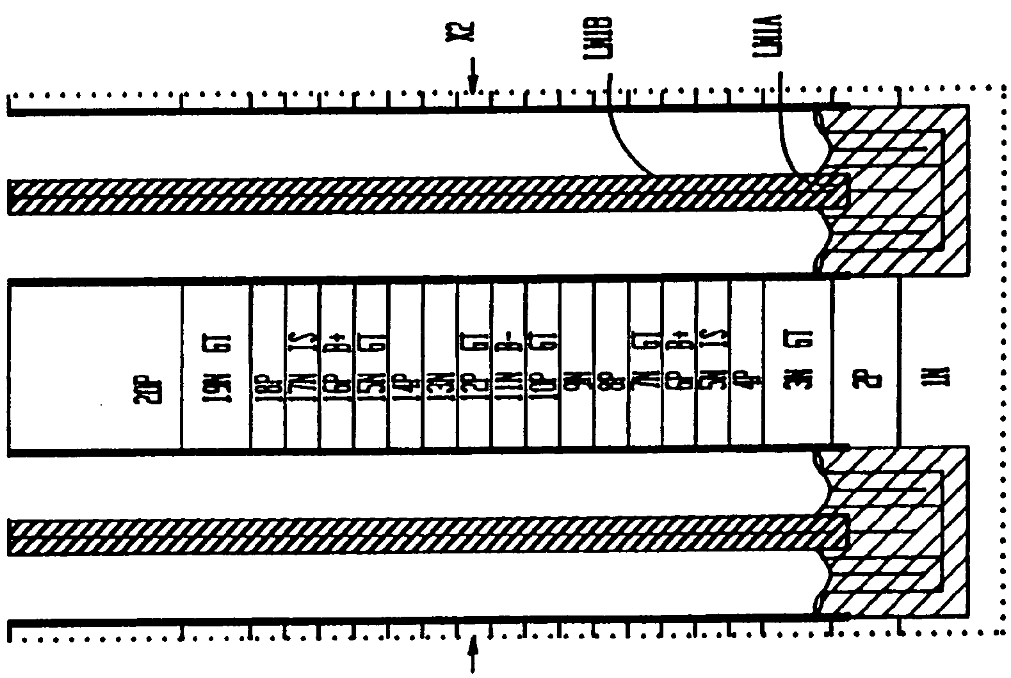

FIG. 77 depicts the results of a next subsequent step where the Parylene lining the walls is etched away, leaving the desired center partitions of silicon-nitride (LB10.6) in the middle of the C trenches, as shown in FIGS. 78, 79 and 80 as LW1B, where the aforementioned recesses are shown as LW1A.

Lower Word Lines

[LW-1] A center partition may be used to cause a wide trench to close out before narrower trenches.

[LW-2] Trenches which are narrower and wider may be caused to close out while leaving trenches of an intermediate size open.

Figure 81:
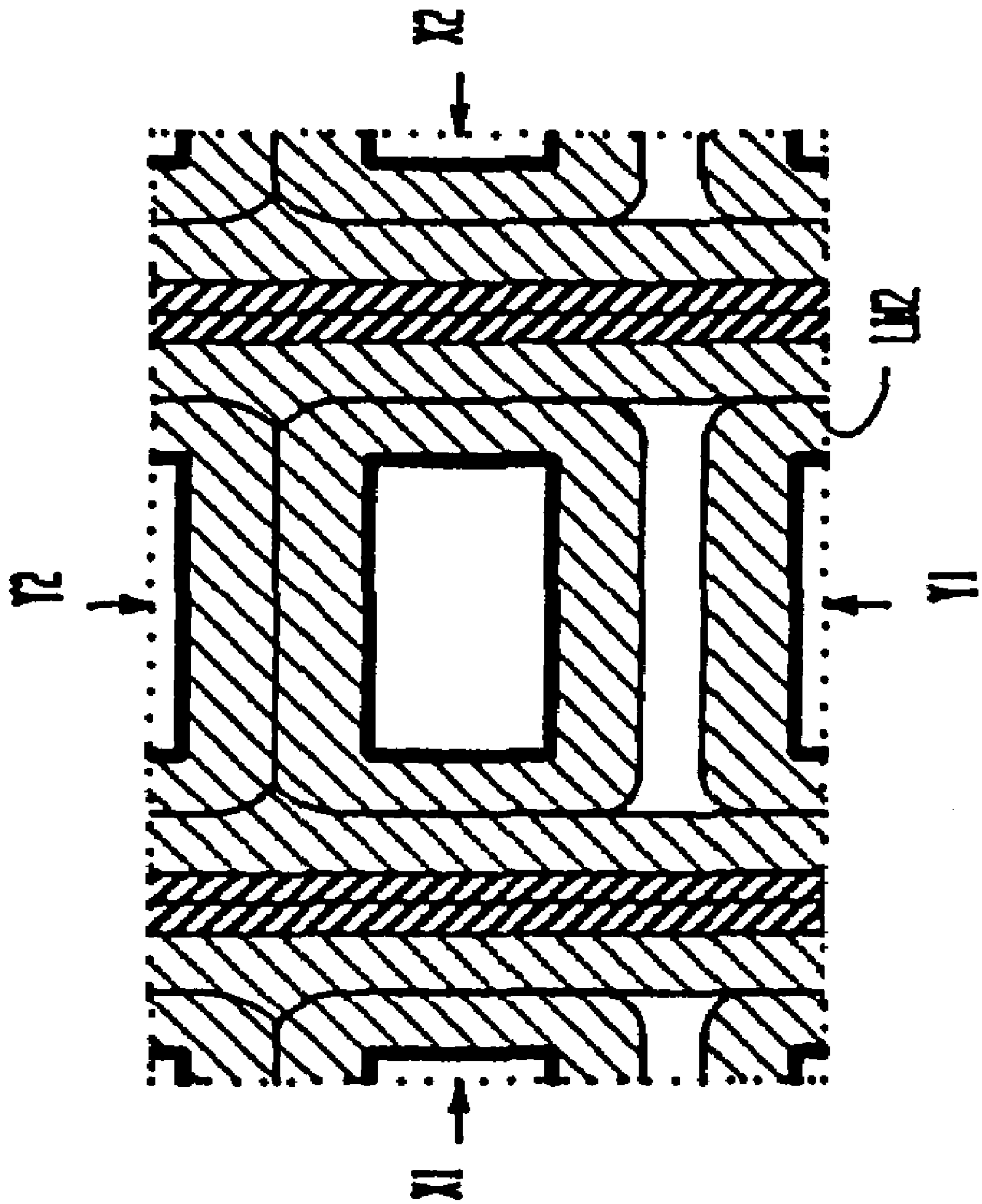
FIGS. 81, 82 and 83 depict three mutually orthogonal cross-sections with all surfaces covered and the widest and narrowest trenches completely closed by a layer of second insulating material.
Figure 83:
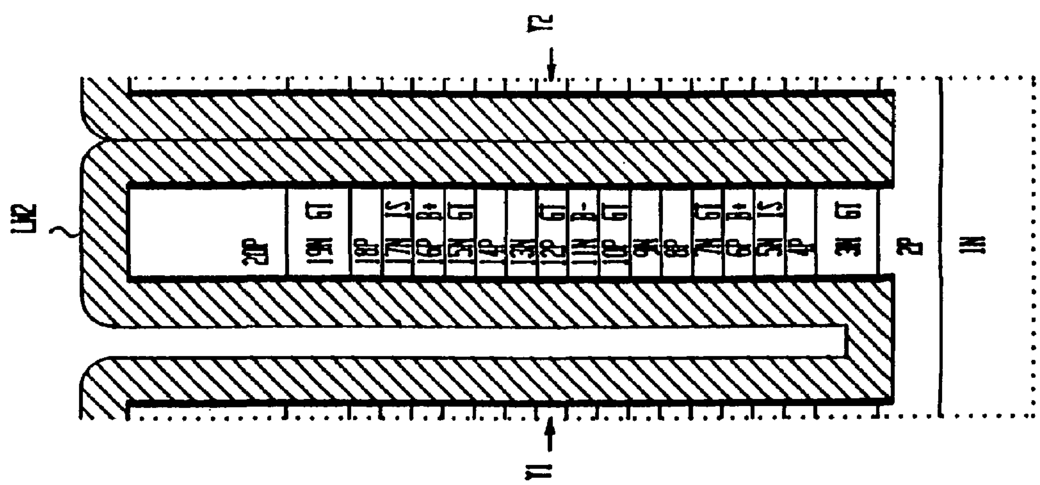
Figure 82:
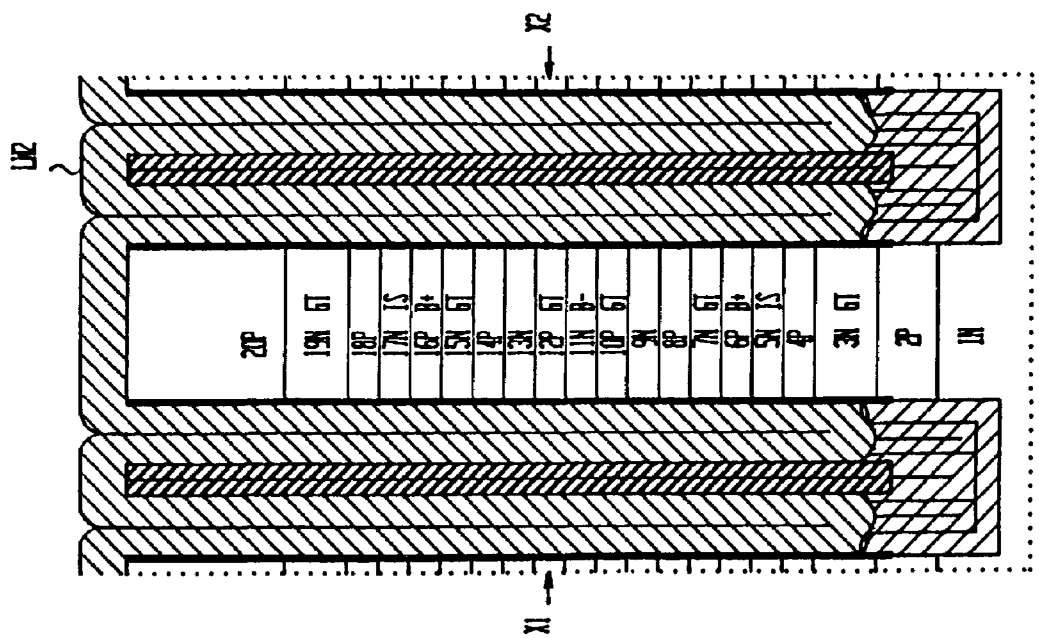

FIGS. 81, 82 and 83 depict the results of a next subsequent step where Parylene (LW2) is deposited so as to close out the A and C trenches, while leaving the B trenches gapped.

[LW-3] A material coating the sides of a center partition in a vertical trench may be etched back at intermittent locations in the horizontal axis without use of photolithography, so as to expose intermittent portions of the sides of the center partition.

Figure 84:
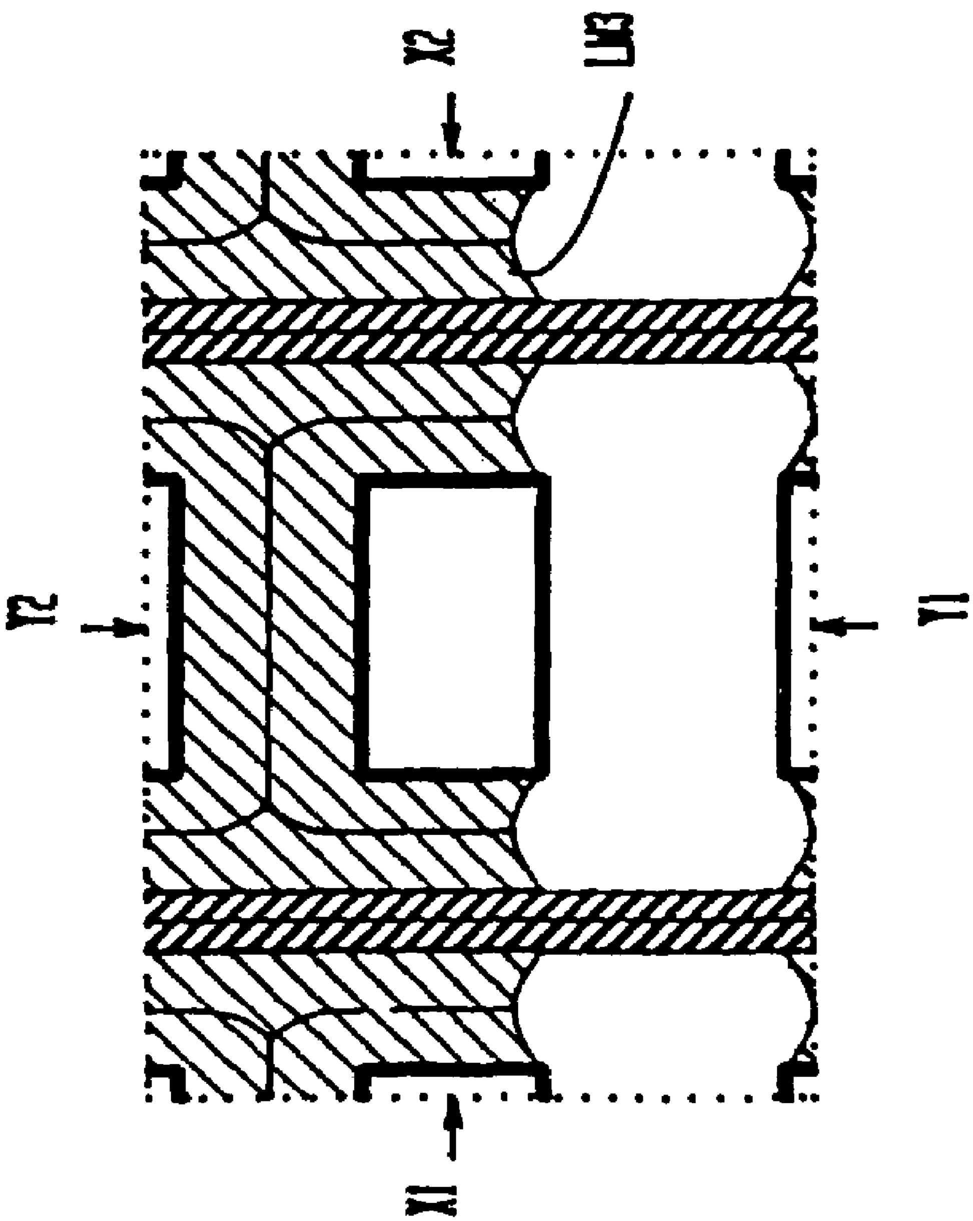
FIGS. 84, 85 and 86 depict three mutually orthogonal cross-sections, with the intermediate-width trench sections cleared of second insulating material.
Figure 86:
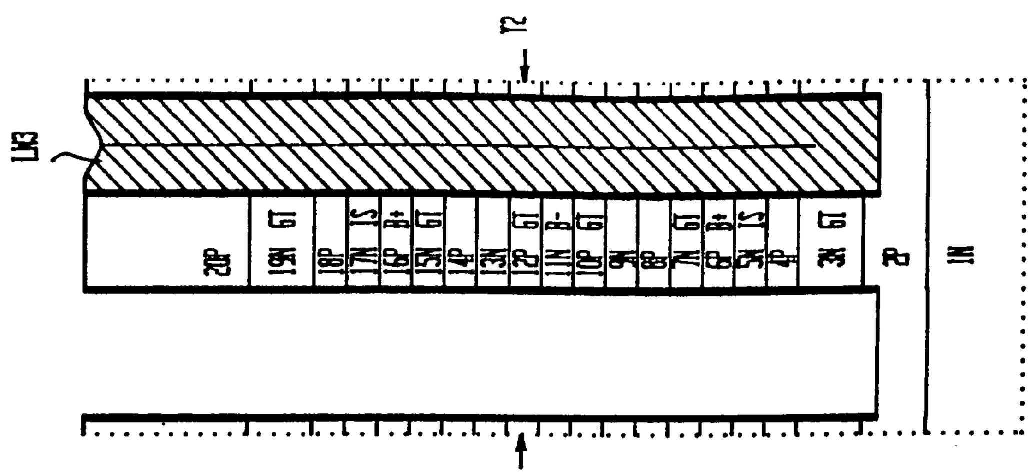
Figure 85:
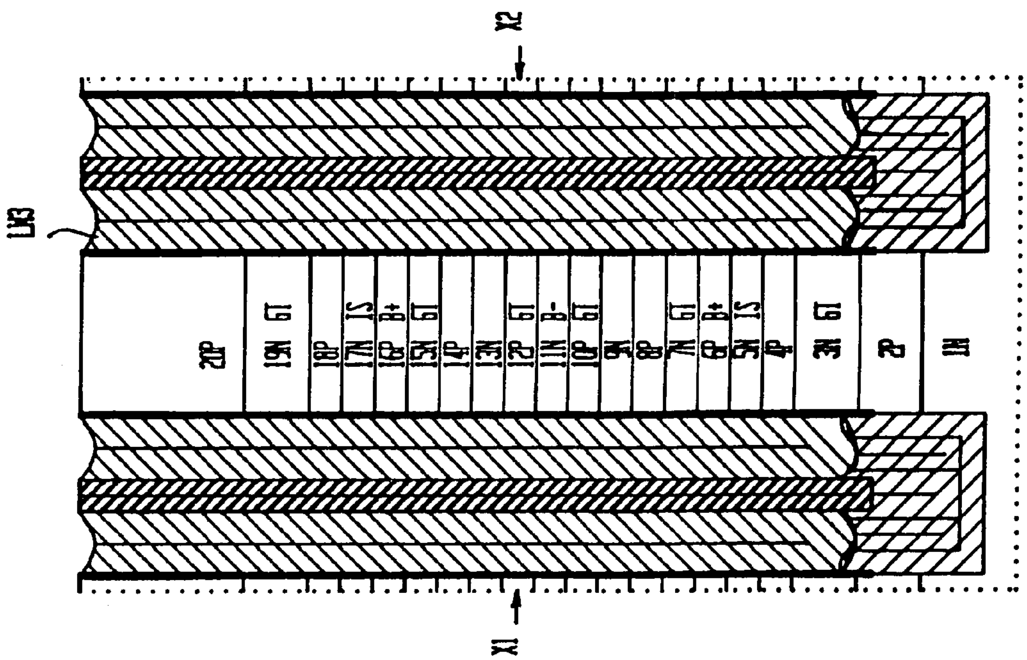

FIGS. 84, 85 and 86 depict the results of a next subsequent step where the Parylene is etched back on the top (LW3) and sides and bottom of the gapped B trenches, so as to expose portions of the sides of the center partitions and the walls of the B trenches.

[LW-4] Center partitions crossing an otherwise continuous trench may be etched away, so as to make the trench continuous.

Figure 87:
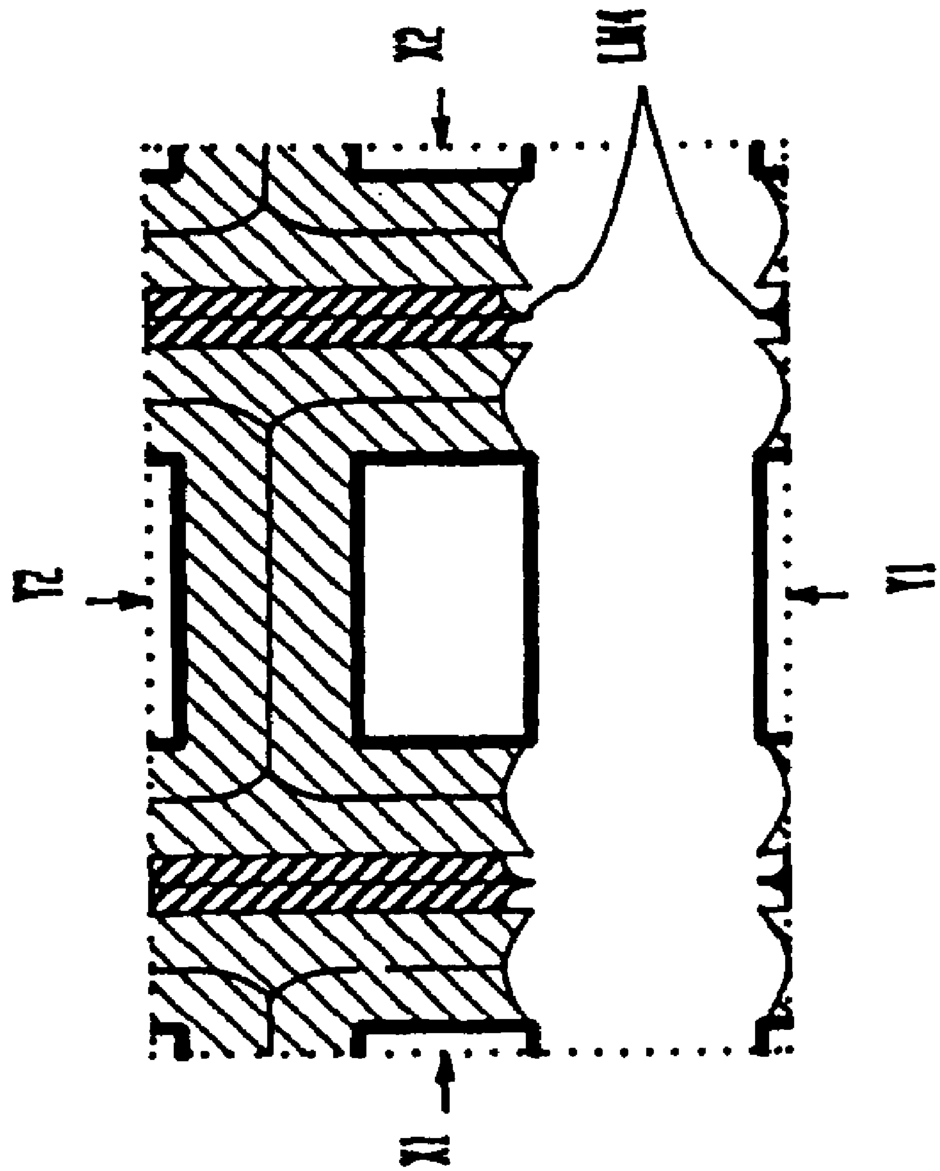
FIGS. 87, 88 and 89 depict three mutually orthogonal cross-sections, with the exposed segments of center walls in the widest trenches removed.
Figure 89:
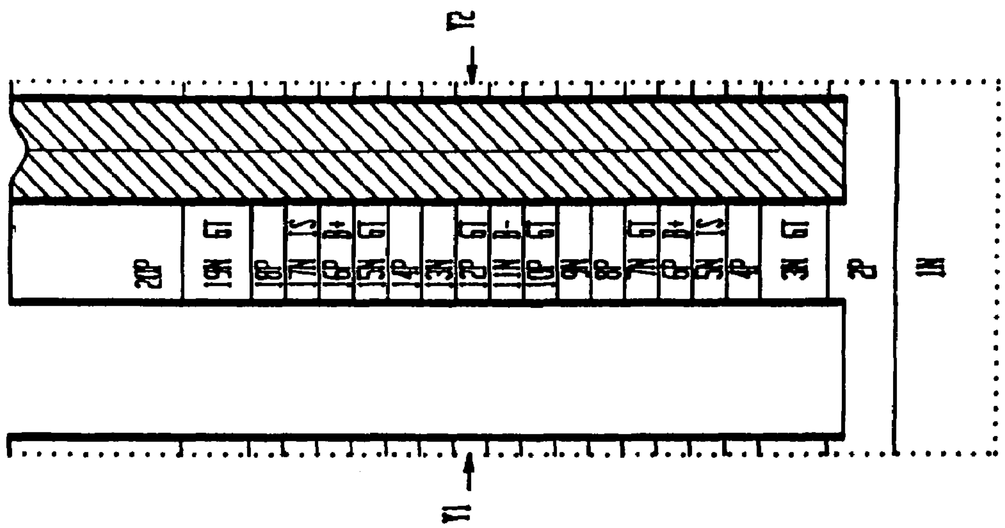
Figure 88:
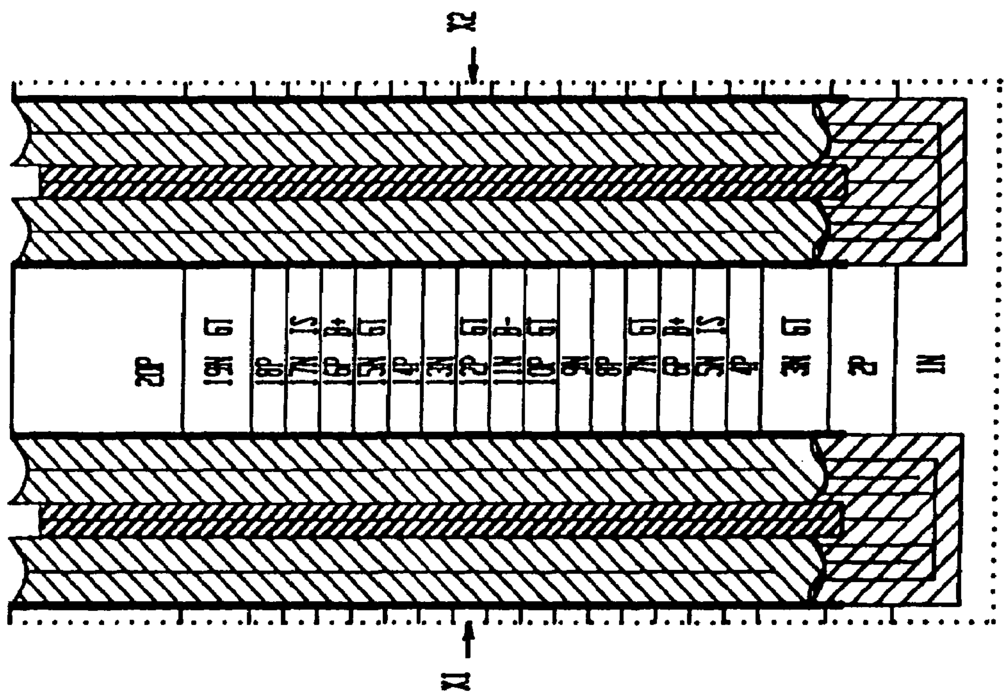

FIGS. 87, 88 and 89 depict the results of a next subsequent step where the silicon-nitride partition segments crossing the B trenches, where these silicon-nitride partition segments were exposed in the prior step, are now etched away from the sides by selective wet etch or omni-directional dry etch (LW4).

[LW-5] Alternating trenches may be etched so as to make them deeper than intervening alternating (adjacent) trenches without use of photolithography.

Figure 90:
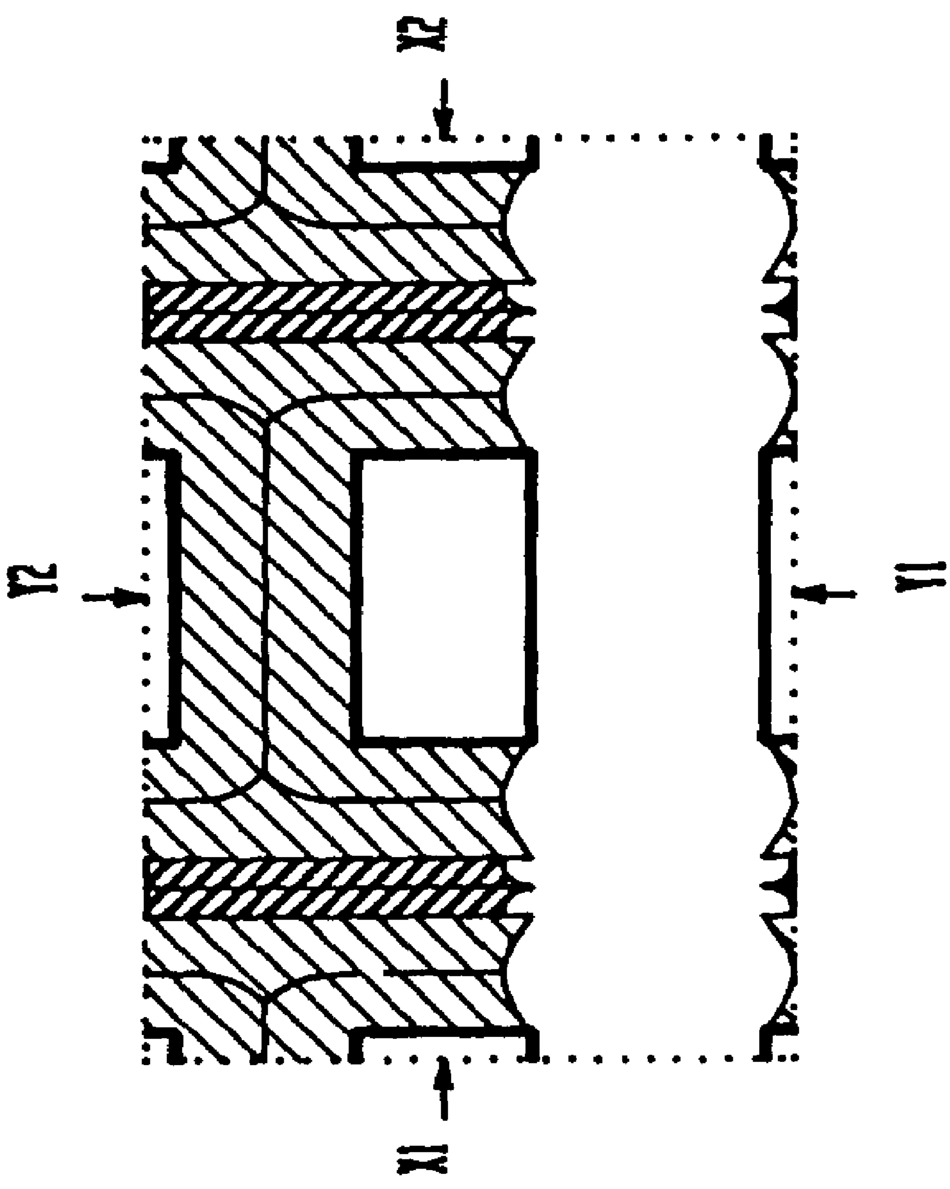
FIGS. 90, 91 and 92 depict three mutually orthogonal cross-sections, with the open intermediate-width trenches slightly deepened.
Figure 92:
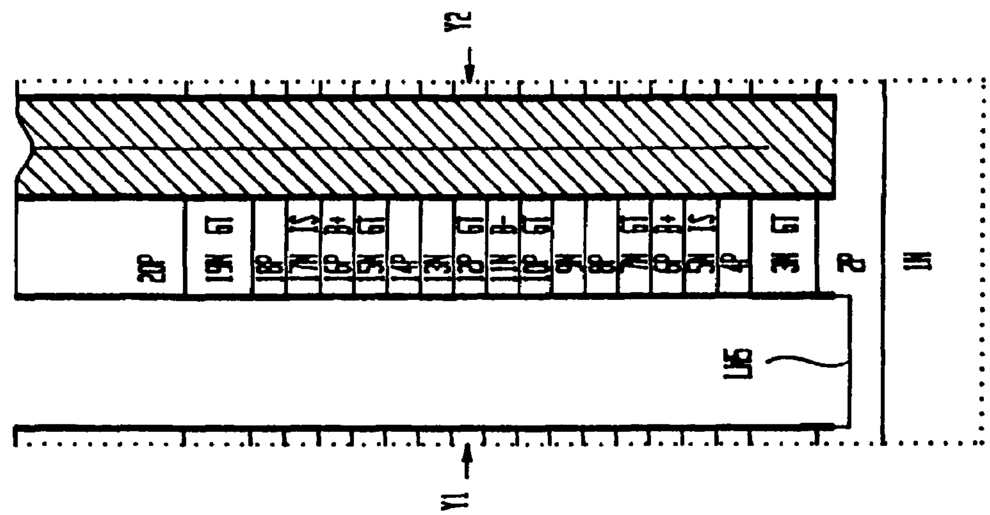
Figure 91:
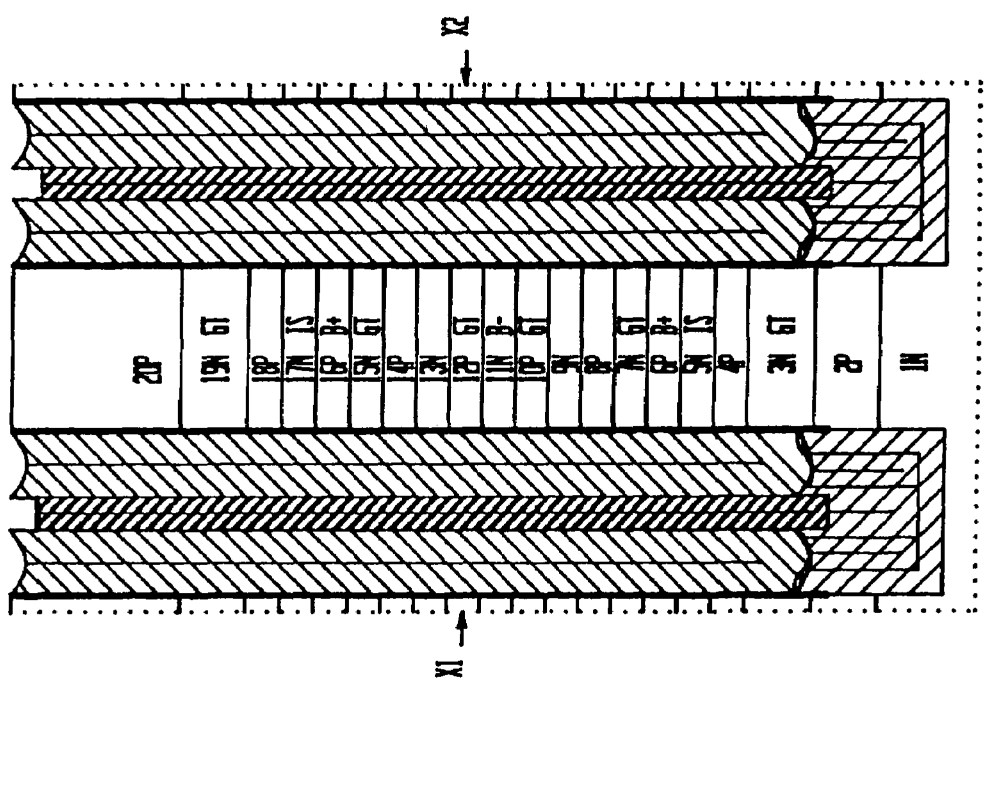

FIGS. 90, 91 and 92 depict the results of a next subsequent step where a thin coating of silicon-dioxide was CVD coated over the exposed surfaces of the wafer so as to cover and protect the polysilicon coating the thermal silicon-dioxide on the walls of the B trench, followed by vertical etching away of the exposed tops and bottoms of the oxide coating, followed by exposure of the wafer to silicon-selective dry trench etch to slightly deepen the B trenches while the A and C trenches remain protected, followed by omni-directional etching away of the silicon-dioxide coating which is covering and protecting the polysilicon on the walls (LW5).

This step also removes silicon from the tops of the pillars. The 20P layers must either be high enough to compensate for exposed silicon etching here and in subsequent etches, or a top cap may be used to protect the tops of the pillars here and whenever the silicon at the pillar tops is subsequently exposed during brief silicon (polysilicon) etches, or in a case where it is otherwise desirable to protect the material(s) exposed at the tops of structures. This top cap technique is described in detail for subsequent step LW5.4. Gold is a universally applicable material for such top capping with the materials used here. Other selectable materials may also be used. If top caps are not used, then the aforementioned cautions regarding careful etch control or profile monitoring are applicable here, and in subsequent similar situations.

Alternatively, this step (LW5) can be accomplished by a single ion milling step which will also slightly etch down the exposed upper surfaces as well as the shown bottom of the B trench. Some associated sacrifice of the polysilicon protective wall coating will occur, to the degree it gets unintentionally eroded. This can be compensated for by using a thicker polysilicon coating when it is originally deposited.

Any conductive deposited coating or conductive trench wall material exposed by this step is etched away and then covered with insulator at a subsequent step. At this indicated subsequent step, insulator is deposited on the bottom of the trench (see the paragraph after discussion of the Parylene etch-back at step LW5.5 which precedes the insulator deposition).

Figure 93:
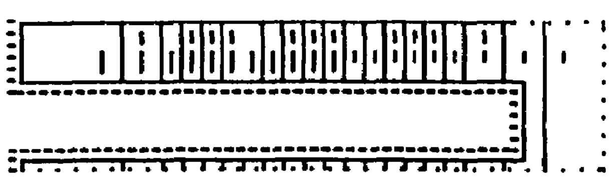
FIG. 93 depicts the vertical cross-section of the intermediate-width trench, with all surfaces covered by a layer of second insulating material.

FIG. 93 depicts the results of a next subsequent step where a coating of Parylene (LW5.1) is deposited over the wafer with the B trenches open.

Figure 94:
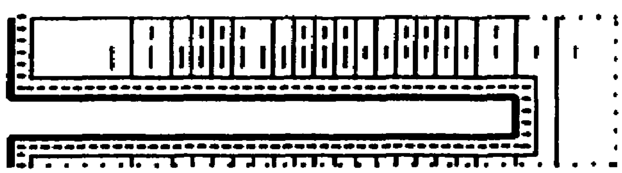
FIG. 94 depicts the vertical cross-section of the intermediate-width trench, with all surfaces further covered by a layer of third insulating material.

FIG. 94 depicts the results of a next subsequent step where a coating of silicon-nitride (LW5.2) is omni-directionally deposited by CVD.

Figure 95:
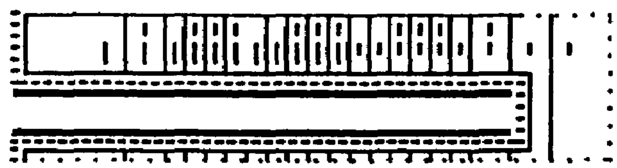
FIG. 95 depicts the vertical cross-section of the intermediate-width trench, with all third insulating material removed from the non-vertical surfaces.

FIG. 95 depicts the results of a next subsequent step where the exposed tops and bottoms of the silicon-nitride coating are vertically etched away (LW5.3) by ion milling.

[LW-6] Oblique angle directional deposition can be used to coat regions at tops of trenches, while not coating down into trenches.

[LW-6A] Such oblique angle directional deposition can be achieved by collimated sputtering from a sputtering source with collimator.

[LW-6B] Such oblique angle directional deposition can be from an evaporative source.

[LW-7] A protective coating may coat the top of a trench but not the bottom of a trench, so as to mask the top portion but not the bottom portion.

Figure 96:
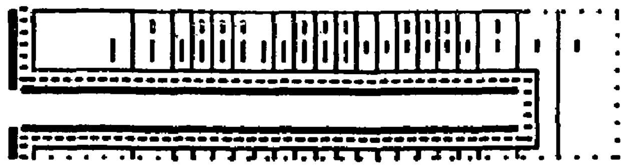
FIG. 96 depicts the vertical cross-section of the intermediate-width trench, with the top surfaces covered by a layer of a second metal.

FIG. 96 depicts the results of a next subsequent step where a coating of tungsten (which is selectable against the other exposed materials) is directionally deposited at one or more oblique angles (i.e. the direction of deposition is near the plane of the wafer) by collimated sputtering, so as to coat the tops of pillars (LW5.4) and perhaps upper trench walls, but not the bottoms of trenches. In this process, the deposition source is located slightly above the wafer, and the deposition direction forms a small angle with the plane of the wafer, so that the deposition path is close to the plane of the wafer, but slightly down toward it sufficiently to project onto the upper surface of the wafer (i.e. the pillar tops). Gold is an alternate selectable material which can be used for this type of top coating and selected against the other materials used in this structure, both here and in subsequent top coating examples. Alternatively, materials used to create such a top coating can be evaporated from a point source (such as a flash evaporator), where the line of sight from the evaporation source to the wafer forms a similar small angle to the plane of the wafer. In this case, during the evaporation process the wafers are left in the same location, rather than moving them in the conventional planetary holder. This evaporative approach is preferably applied to lower boiling temperature materials, such as aluminum. Preferably in either deposition case, the wafer is rotated around its center while its top surface stays in the same plane so as to coat the tops of pillars and filled trenches equally from all sides, so as to minimize extra material on the sides of the tops of the pillars, etc. A subsequent etch-back step can be used to remove these coatings on the sides of the tops of structures while leaving a remaining thinner layer on the tops (where etch selectivities against other exposed materials permit). The process schematic shows what could be interpreted as a separation between this directionally deposited coating (on the tops) and the silicon-nitride coating on the sides of the trench walls which was just vertically etched in the prior step. This shown gap is merely intended to communicate that these are two different coatings which touch each other.

When directional deposition is performed by either of the aforementioned means, some material will overhang at the tops of the exposed trenches. To minimize this effect, coatings should be kept at a minimum thickness which will provide the desired selective protection. These overhangs can be reduced by ion milling the upper surface of the wafer at a considerably more oblique angle than the original deposition angle. The deposition and ion milling steps can also be repeated in a loop applied repetitively when greater coating thicknesses are being deposited. When the upper portions of the trenches are not being processed during the steps where the angle deposition coating is acting as a protector, then the trench can tolerate a much less oblique angle of deposition (i.e. from closer to the zenith) when the coating is being deposited.

[LW-8] A selected material may be removed from the bottom of a trench while not removing it from the top of the trench.

[LW-9] Material coating the sides of a trench may be removed only at the bottom of the trench, so as to make a narrow undercut which has a width which is approximately equal to the thickness of the coating.

Figure 97:
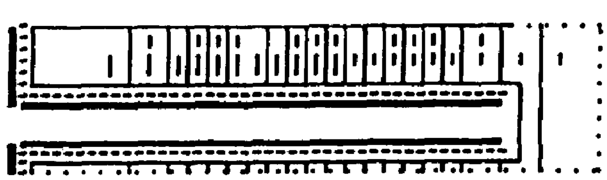
FIG. 97 depicts the vertical cross-section of the intermediate-width trench, with the trench bottom and lateral undercuts at the trench bottom cleared of second insulating material.

FIG. 97 depicts the results of a next subsequent step where the Parylene at the bottoms of the B trenches is etched down and back (LW5.5), while the other surfaces remain protected.

At this point in the process sequence, any exposed conductive and/or protective coating over or next to the insulative thermal oxide on the trench walls (which is now exposed by the Parylene etch-back) can be etched off with a brief selective wet etch or omni-directional dry etch, so as to allow the subsequent deposition of insulator on the bottom of the trench to connect with the thermal oxide layer without leaving short circuiting traces of conductive material.

[LW-10] An undercut may be filled with an omni-directional deposition so as to close it out.

[LW-11] A feature may be created at the bottom of a trench by close-out of a deposition below an overhanging material, followed by etch-back of the exposed portion of the deposition, followed by removal of the overhanging material.

[LW-12] An insulated region may be created at the bottom of a trench by close-out of a deposition below an overhanging material, followed by etch-back of the exposed portion of the deposition, followed by removal of the overhanging material.

[LW-13] An insulation region dividing two vertically extending conductive regions (to be subsequently described) in a trench may be created by the aforementioned method.

Figure 98:
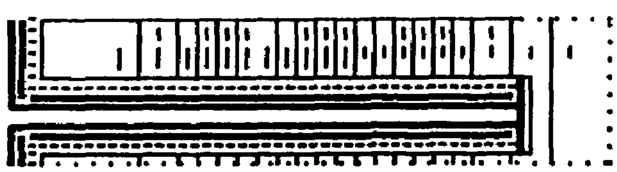
FIG. 98 depicts the vertical cross-section of the intermediate-width trench, with a layer of first insulating material covering all surfaces and filling the lateral undercuts at the trench bottom.

FIG. 98 depicts the results of a next subsequent step where a layer of silicon-dioxide is omni-directionally deposited by such means as CVD, so as to close out so as to form thin tabs only at the bottoms of the trenches below the overhanging material coating the upper walls of the trenches, but so as to merely coat the other exposed regions (LW5.6).

Figure 99:
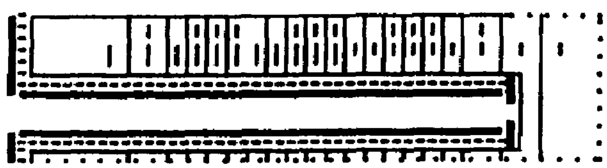
FIG. 99 depicts the vertical cross-section of the intermediate-width trench, with all surfaces cleared of first insulating material, but the undercuts still filled.

FIG. 99 depicts the results of a next subsequent step where this silicon-dioxide coating is partially selectively etched back by wet etch or omni-directional dry etch, so as to leave the intended insulative thin tab features at the bottom of the trenches, but so as to leave the other surfaces clean (LW5.7).

Figure 100:
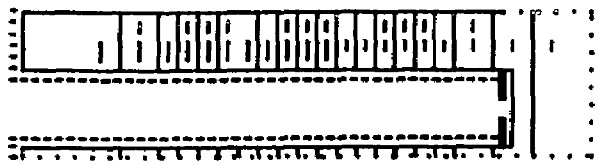
FIG. 100 depicts the vertical cross-section of the intermediate-width trench, with all surfaces cleared of first and second metal.

FIG. 100 depicts the results of a next subsequent step where the upper directionally deposited tungsten (or alternately gold) coating and the silicon-nitride coating on the B trench walls are etched off by one or more selective wet etch or omni-directional dry etch steps (LW5.8).

Figure 101:
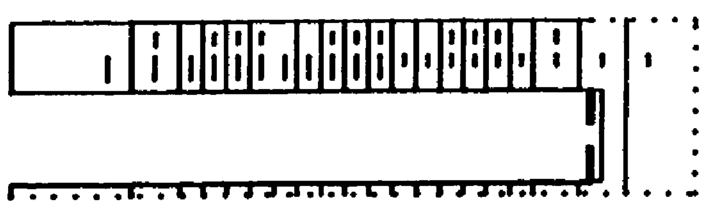
FIG. 101 depicts the vertical cross-section of the intermediate-width trench, with all surfaces cleared of second insulating material, but the tabs of first insulating material from the filled undercuts still present.
Figure 102:
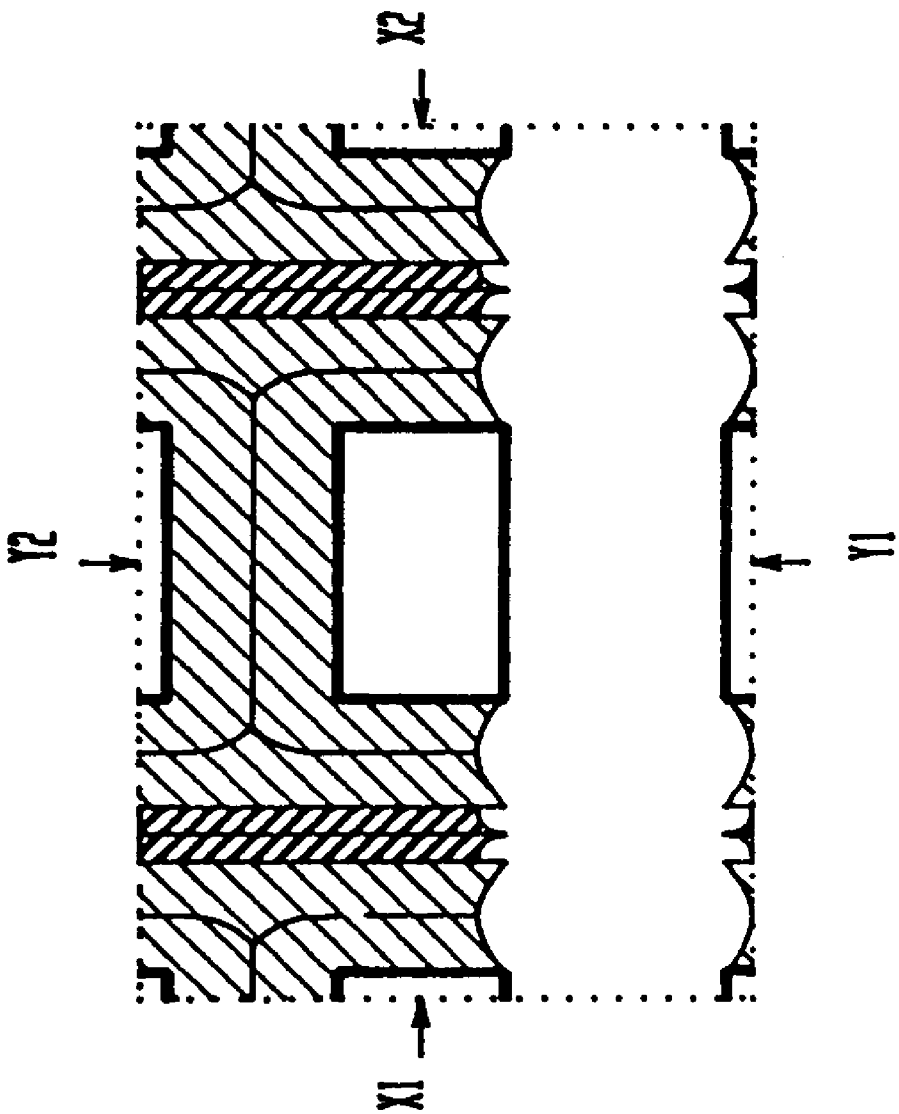
FIGS. 102, 103 and 104 depict three mutually orthogonal cross-sections of the structure of FIG. 101 more completely and detailed.
Figure 103:
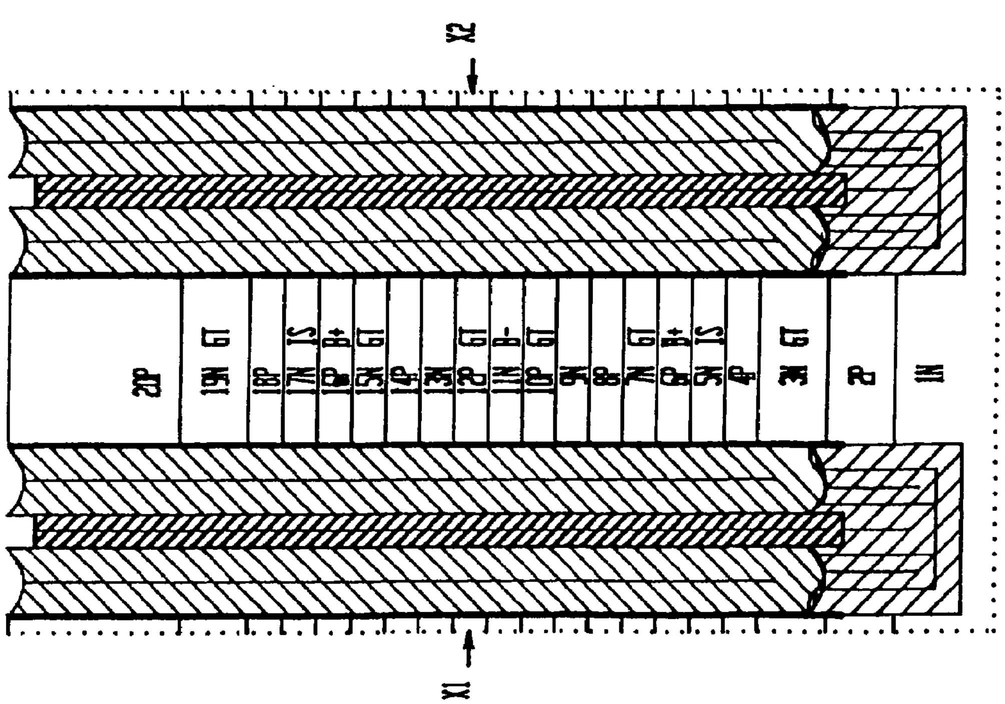
Figure 104:
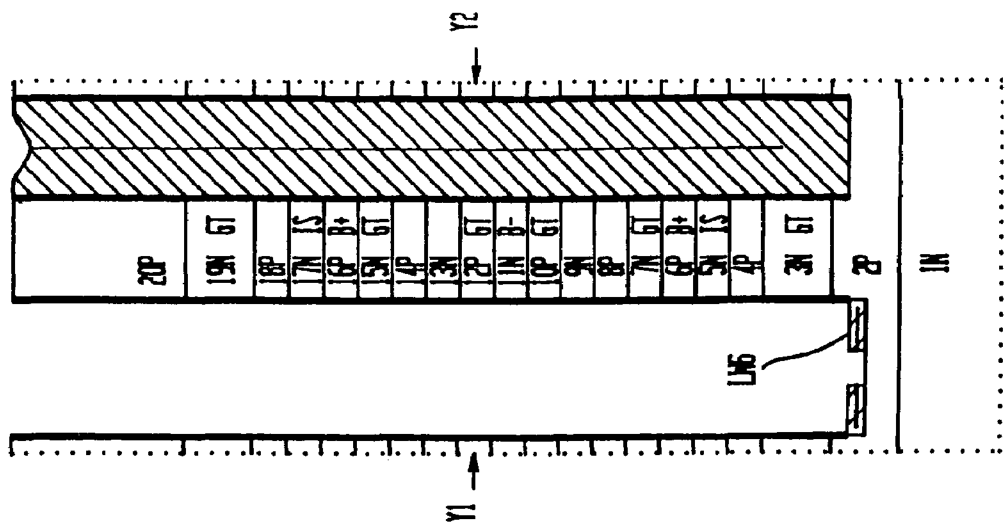

FIG. 101 depicts the results of a next subsequent step where the Parylene coating the B trench walls, etc. is etched away, but leaving the intended insulative features at the bottom of the B trenches (LW5.9), as shown in greater detail in FIGS. 102, 103 and 104 as LW6.

[LW-14] SIMOX implantation of the bottoms of a pillar-trench array can provide an insulative layer at the bottoms of the trenches of this array.

As an alternative means of creating a thin insulative region at the bottom of the B trench, SIMOX implantation of oxygen can be performed by conventional means, so as to accelerate oxygen ions toward the wafer and implant them into the exposed surfaces of the wafer. This causes the exposed silicon at the bottom of the B trench to be converted to a thin layer of silicon-dioxide during an annealing cycle, while the other upper exposed surfaces also receive impregnation with oxygen in a thin layer which can be removed by available means later, if desired. The Parylene is removed before the SIMOX is annealed, then redeposited and etched back to the way it was before.

[LW-15] A conductor may be deposited along vertical trench walls above horizontal insulative extensions in a trench, the deposited conductor being horizontally narrower than the insulative horizontal extensions below it, this deposition of conductor being followed by etching away of the tops and bottoms of the conductor, thereby allowing the deposited conductor to be insulated from lower regions in the trench by the insulative horizontal extensions below the deposited conductor.

Figure 105:
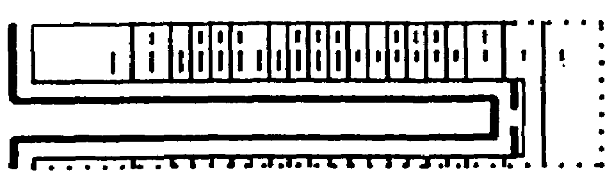
FIG. 105 depicts the vertical cross-section of the intermediate-width trench, with all surfaces covered by a layer of first metal.

FIG. 105 depicts the results of a next subsequent step where a conductor such as tungsten is omni-directionally deposited over the exposed wafer surfaces by such means as CVD (LW6.1).

Figure 106:
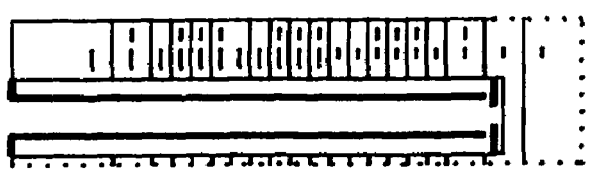
FIG. 106 depicts the vertical cross-section of the intermediate-width trench, with all non-vertical surfaces cleared of first metal.

FIG. 106 depicts the results of a next subsequent step where the exposed tops and bottoms of the aforementioned conductor are vertically etched away by such means as ion milling (LW6.2).

Figure 107:
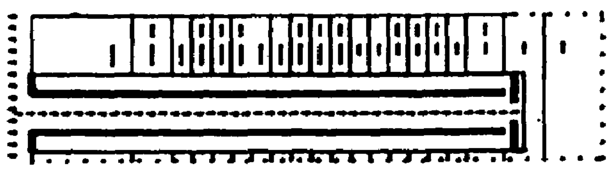
FIG. 107 depicts the vertical cross-section of the intermediate-width trench, with all surfaces covered and the trench closed out by a layer of second insulating material.

FIG. 107 depicts the results of a next subsequent step where Parylene is omni-directionally deposited over the exposed wafer surfaces by such means as CVD, so as to close out in the B trench (LW6.3).

Figure 108:
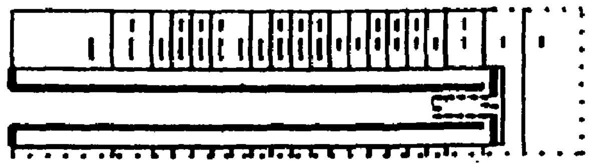
FIG. 108 depicts the vertical cross-section of the intermediate-width trench, with the second insulating material cleared from all surfaces and down to a preferred height in the trench.

FIG. 108 depicts the results of a next subsequent step where the exposed Parylene is selectively etched down to a preferred height for subsequent vertical masking (LW6.4) to create the feature height shown subsequently for the lower word lines in FIGS. 111, 112 and 113 at LW7.

[LW-17] Continuous horizontal conductive lines (circuit traces) in a trench may be created by etch-back of the upper portion of the aforementioned conductor by omni-directional wet etch or dry etch of the sides of the conductor above a lower trench masking plug.

[LW-18] Control lines for FET gates may be created by the above method.

[LW-19] Word lines for a memory may be created in a trench by the above method.

Figure 109:
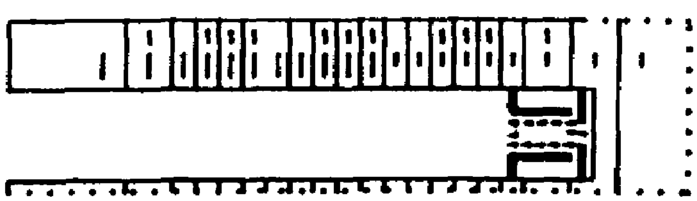
FIG. 109 depicts the vertical cross-section of the intermediate-width trench, with its walls down to the preferred height cleared of first metal.

FIG. 109 depicts the results of a next subsequent step where the exposed conductor on the trench walls above the Parylene in the B trench is selectively omni-directionally etched away, leaving word lines (LW6.5), and other exposed surfaces are not selected in the etch.

Figure 110:
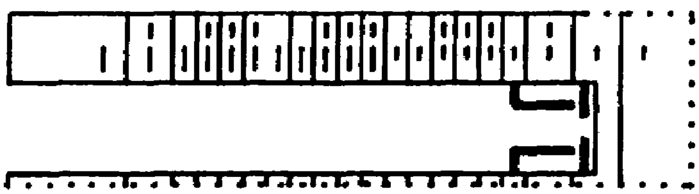
FIG. 110 depicts the vertical cross-section of the intermediate-width trench, with all second insulating material cleared out.
Figure 111:
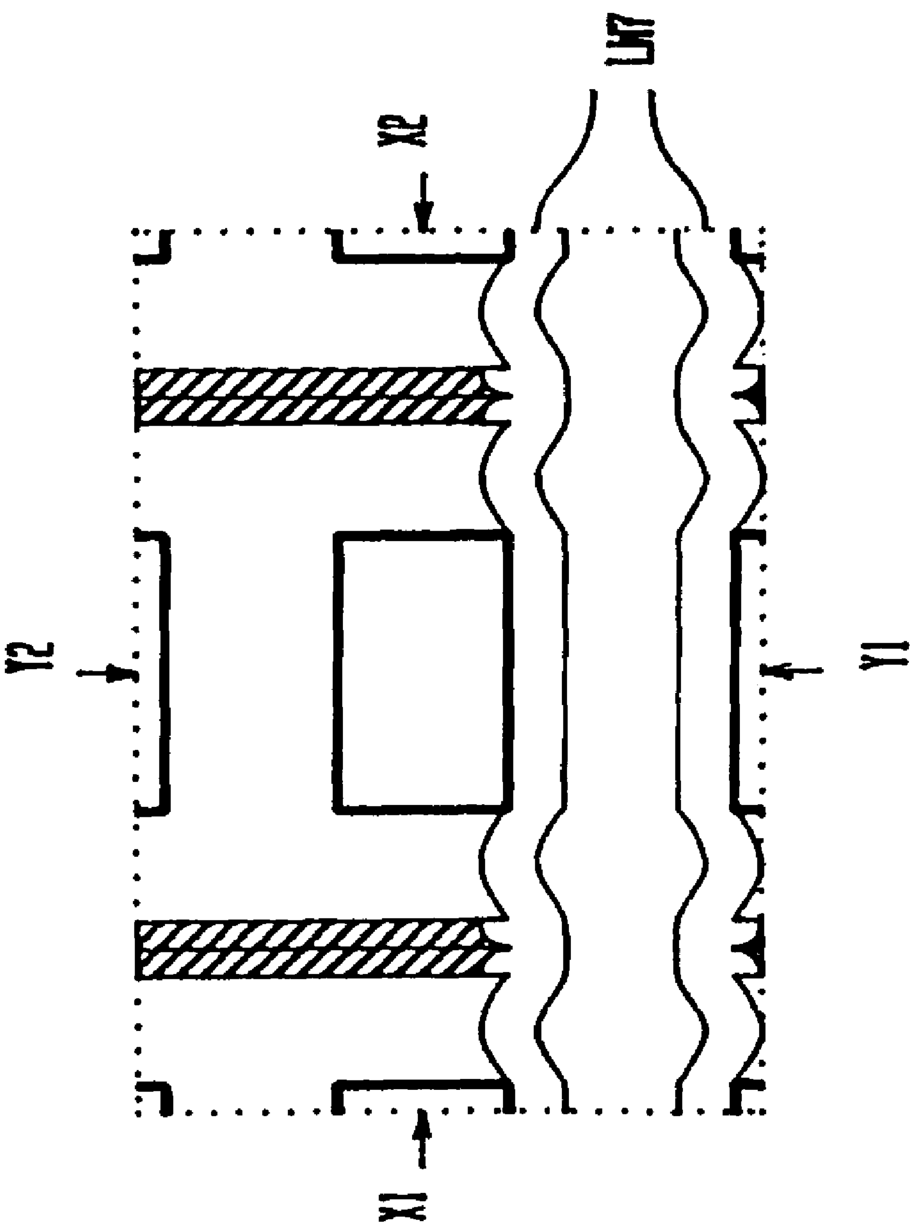
FIGS. 111, 112 and 113 depict three mutually orthogonal cross-sections of the structure of FIG. 110 more completely and detailed.
Figure 113:
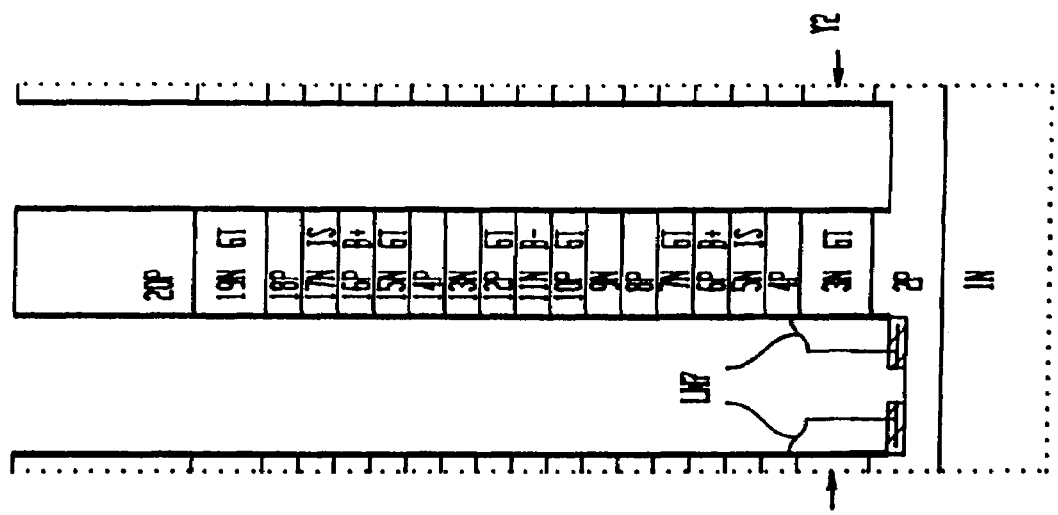
Figure 112:
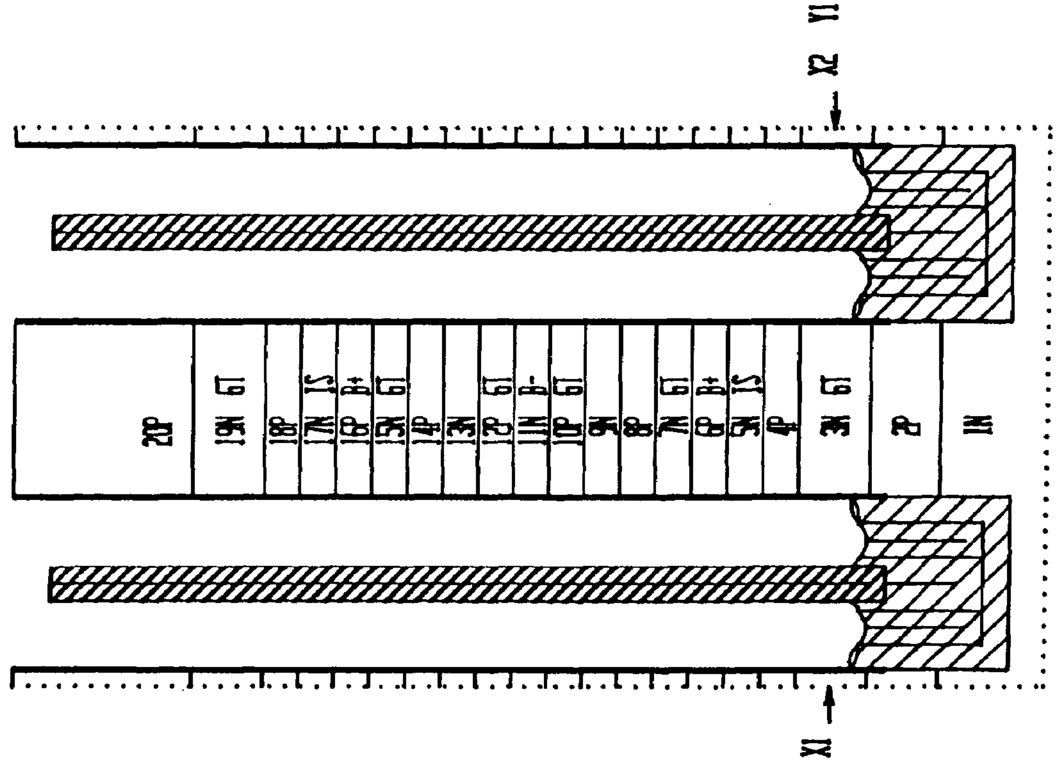

FIG. 110 depicts the results of a next subsequent step where all exposed Parylene is etched away (LW6.6), as shown in FIGS. 111, 112 and 113 where LW7 depicts the word lines, which extend along the bottom of the B trench between just below the top of layer 2P and just above the bottom of layer 4P.

[LW-20] As a result of the foregoing steps, groups of conductive word lines on horizontal planes can be constructed below the upper surface of a semiconductor wafer to control a semiconductor memory, without the use of photolithography.

[B-23] A coating may be omni-directionally deposited in a trench above and below a step which narrows the trench, so that the lower area will close out before the upper area, thereby allowing more rapid more precisely controlled etch-back of the upper area.

[LW-21] An insulator may be created between two adjacent horizontal conductors in a trench by close-out of an insulative deposition between the conductors, followed by omni-directional wet etch or dry etch-back of insulative material coating higher portions of the trench.

Figure 114:
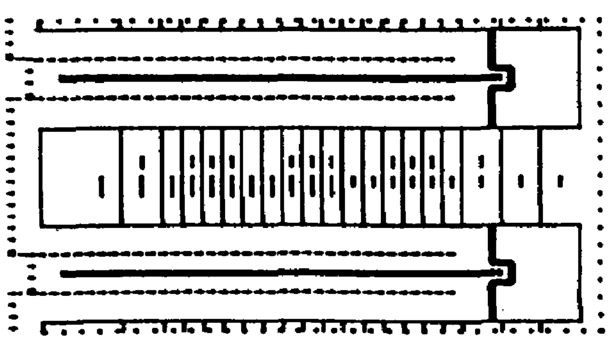
FIGS. 114 and 115 depict the two vertical cross-sections, with a layer of second insulating material covering the top surface, filling the widest and narrowest trenches, and partially filling the intermediate-width trench.
Figure 115:
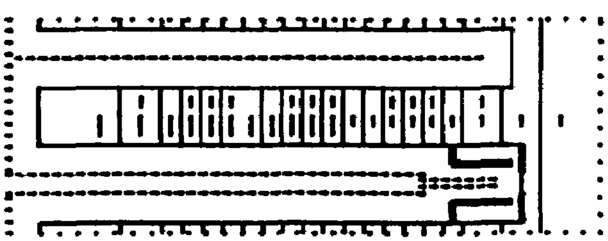

FIGS. 114 and 115 depict the results of a next subsequent step where a coating of Parylene has been deposited so as to close out the C and A trenches, while leaving the B trench gapped, including the region between the word lines (LW7.1C & LW7.1BA). Note that the word lines must not be too thick so as to prevent a close-out between them.

Figure 116:
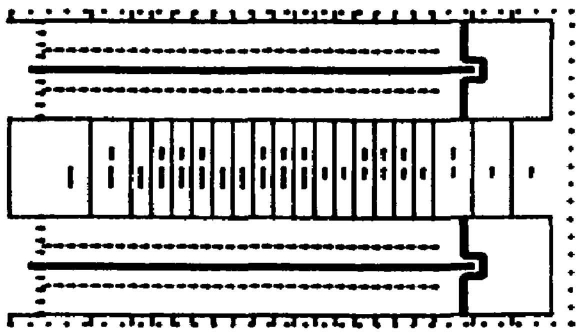
FIGS. 116 and 117 depict the two vertical cross-sections, with the widest and narrowest trenches filled with second insulating material and the intermediate-width trench clear.
Figure 117:
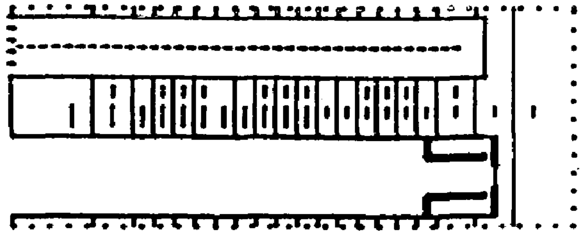

FIGS. 116 and 117 depict the results of a next subsequent step where the Parylene has been etched back so as to clear the B trench and the region between the word lines (LW7.2C & LW7.2BA).

Figure 118:
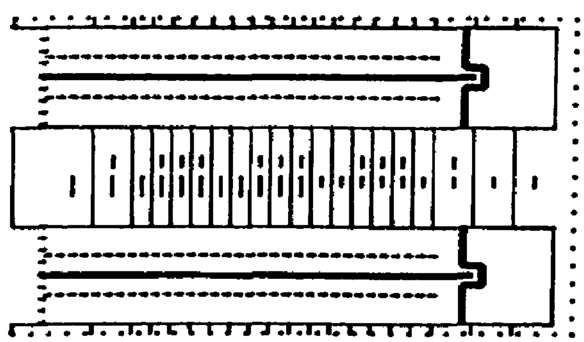
FIGS. 118 and 119 depict the two vertical cross-sections, with the wall of third insulating material in the widest trench lowered.
Figure 119:
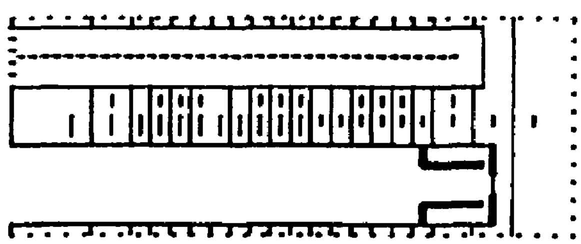

FIGS. 118 and 119 depict the results of a next subsequent step where the tops of the silicon-nitride partitions exposed in the C trench have been selectively etched away (LW7.3C & LW7.3BA).

Figure 120:
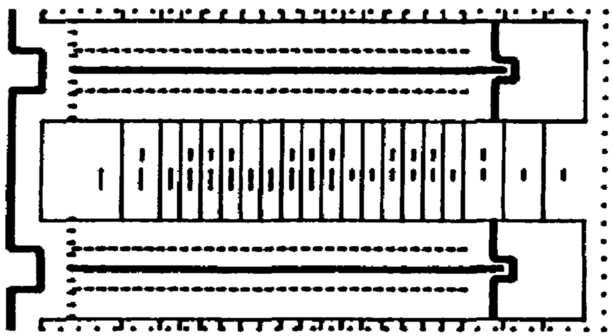
FIGS. 120 and 121 depict the two vertical cross-sections, with a layer of first insulating material covering all surfaces and closing the bottom region of the intermediate-width trench.
Figure 121:
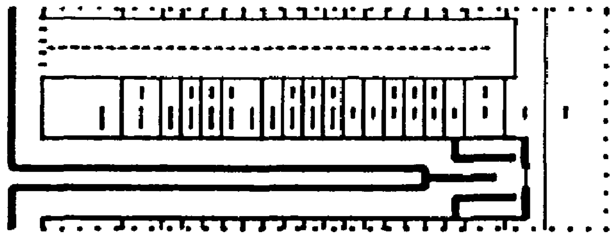

FIGS. 120 and 121 depict the results of a next subsequent step where a deposition of silicon-dioxide by CVD coats the space between the word lines, so as to close out (LW7.4C & LW7.4BA).

Figure 122:
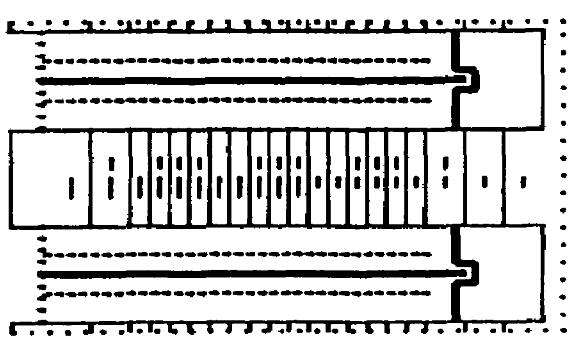
FIGS. 122 and 123 depict the two vertical cross-sections, with a plug of first insulating material left only at the bottom of the intermediate-width trench.
Figure 123:
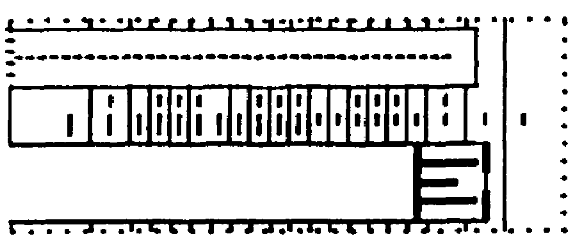

FIGS. 122 and 123 depict the results of a next subsequent step where this silicon-dioxide deposition is selectively etched back, so as to leave an insulative plug between the word lines (LW7.5C & LW7.5BA).

[LW-16] A center partition in a trench may be removed by selective omni-directional etch.

Figure 124:
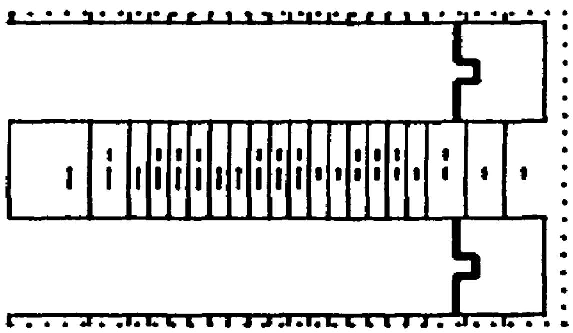
FIGS. 124 and 125 depict the two vertical cross-sections, with all trenches cleared except for plugs of first insulating material at the bottoms of the widest and the intermediate-width trenches.
Figure 125:
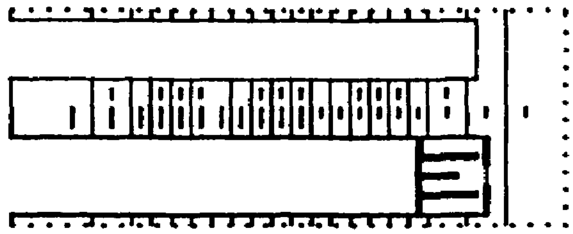
Figure 126:
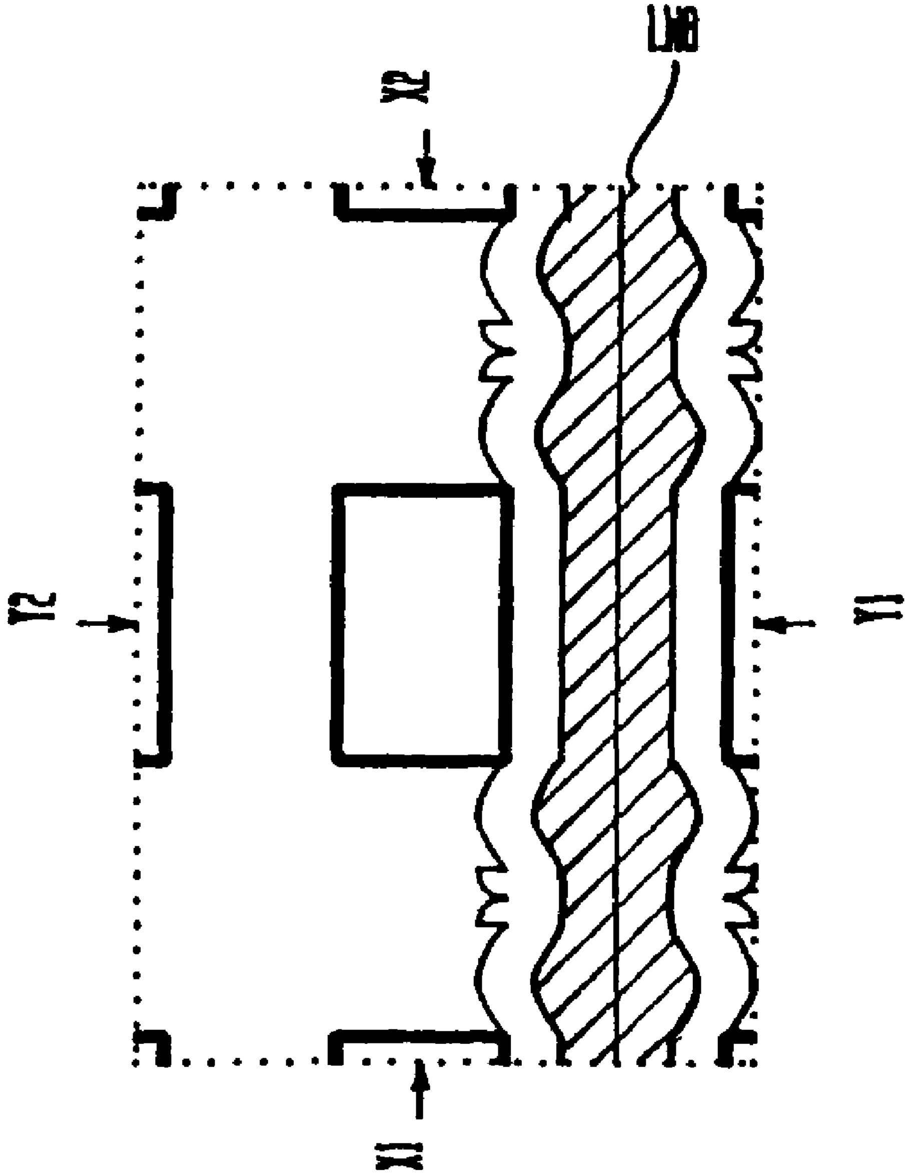
FIGS. 126, 127 and 128 depict three mutually orthogonal cross-sections of the structure of FIGS. 124 and 125 more completely and detailed.
Figure 128:
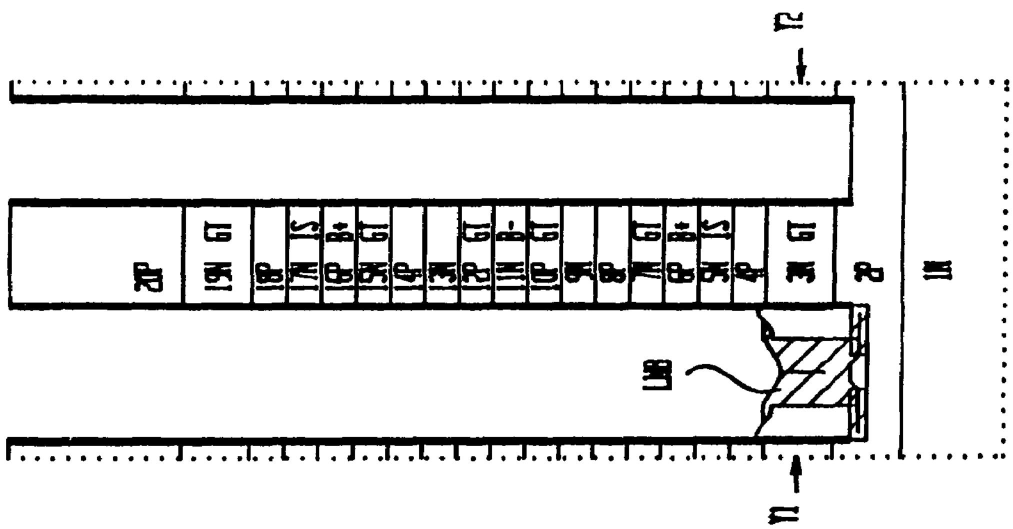
Figure 127:
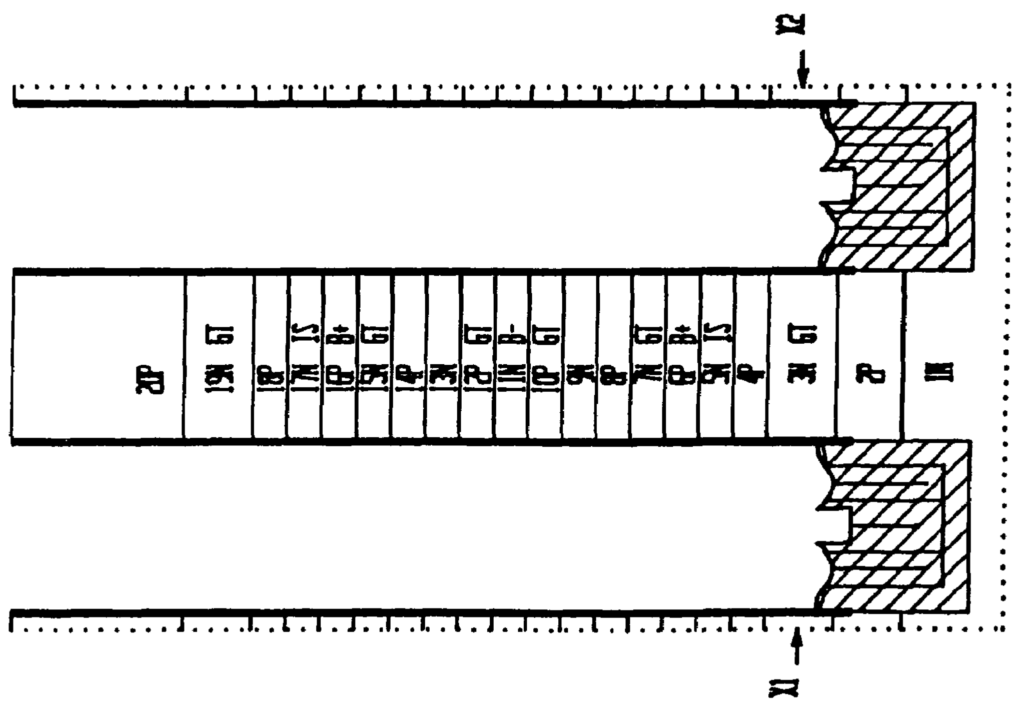

FIGS. 124 and 125 depict the results of a next subsequent step where the remaining Parylene in the C and A trenches along with the silicon-nitride partitions in the C trenches are selectively etched away (LW7.6C & LW7.6BA), leaving the silicon-dioxide insulation between the word lines, as shown at LW8 of FIGS. 126, 127 and 128. (The feature in this and subsequent figures that looks like a bubble below the silicon-dioxide insulation between the word lines is to be interpreted as being filled with silicon-dioxide from the prior deposition.)

Caps

In the following step sequence, trenches are "capped" with a selectable material. In this process, some trenches are capped, and other trenches are not. These caps act as protective covers for the trenches where they exist. Thus, they allow processing of uncapped trenches, while capped trenches are protected from processing, and therefore remain unprocessed.

[LW-22] Trenches of two narrower sizes may be closed out with a deposited material so as to leave trenches of a third wider size open.

[LW-23] Parylene is preferred for the aforementioned deposited close-out material.

Figure 129:
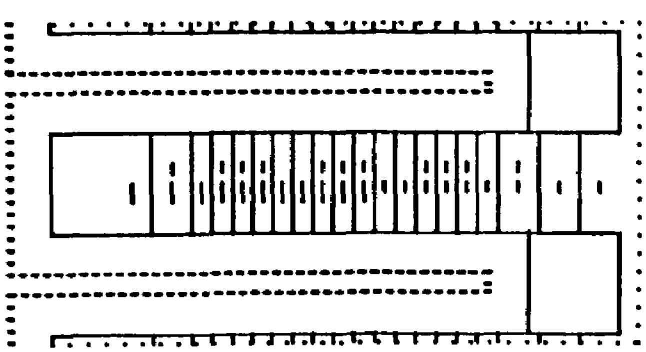
FIGS. 129 and 130 depict the two vertical cross-sections, with a layer of second insulating material covering the top surface, partially filling the widest trench, and filling the narrowest and intermediate-width trenches.
Figure 130:
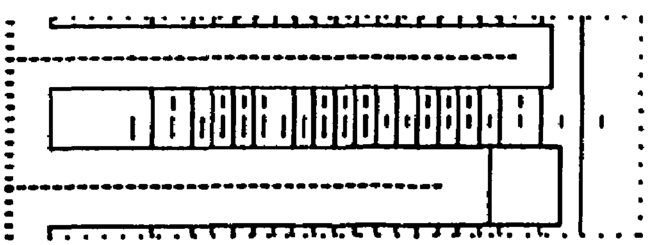

FIGS. 129 and 130 depict the results of a next subsequent step where a coating of Parylene is deposited so as to close out the A and B trenches, while leaving the C trench gapped (LW8.1C & LW8.1AB).

Figure 131:
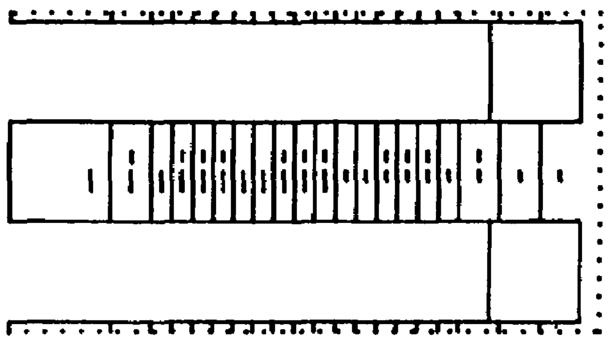
FIGS. 131 and 132 depict the two vertical cross-sections, with the widest trench clear, and the intermediate-width and narrowest trenches filled with second insulating material.
Figure 132:
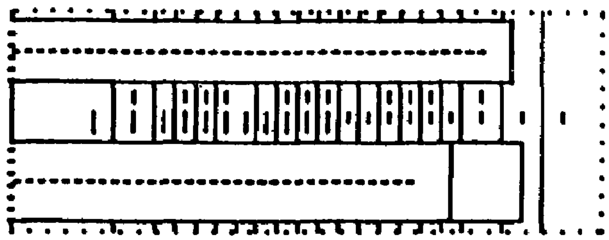
Figure 133:
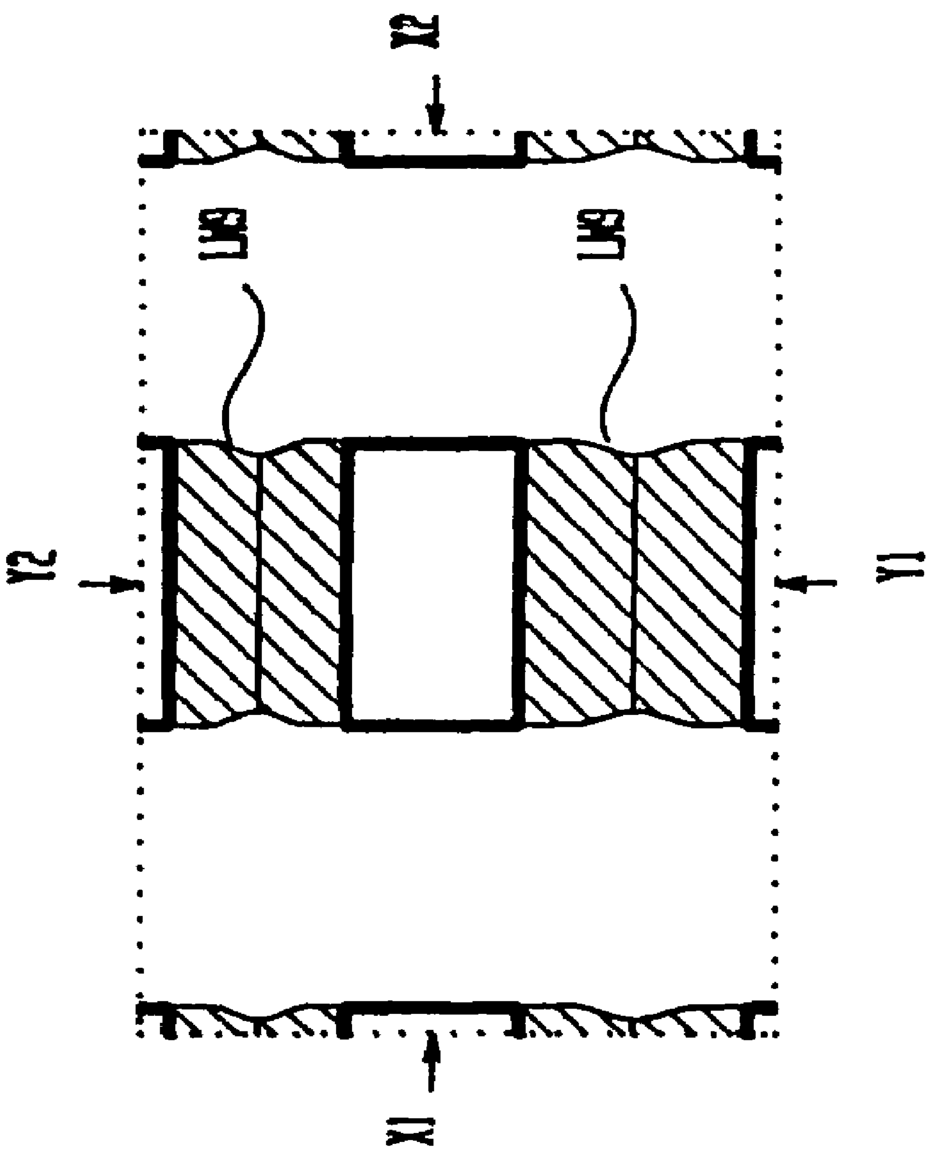
FIGS. 133, 134 and 135 depict three mutually orthogonal cross-sections of the structure of FIGS. 131 and 132 more completely and detailed.
Figure 135:
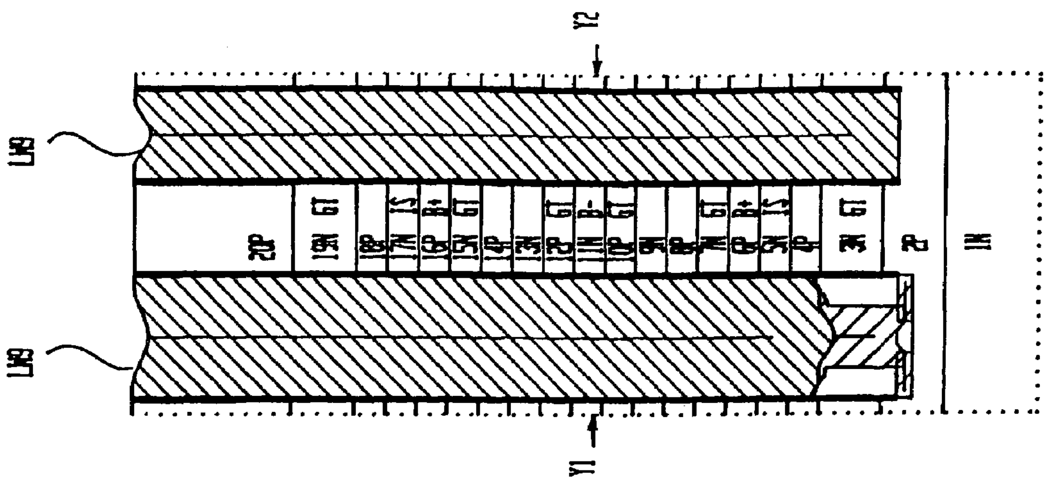
Figure 134:
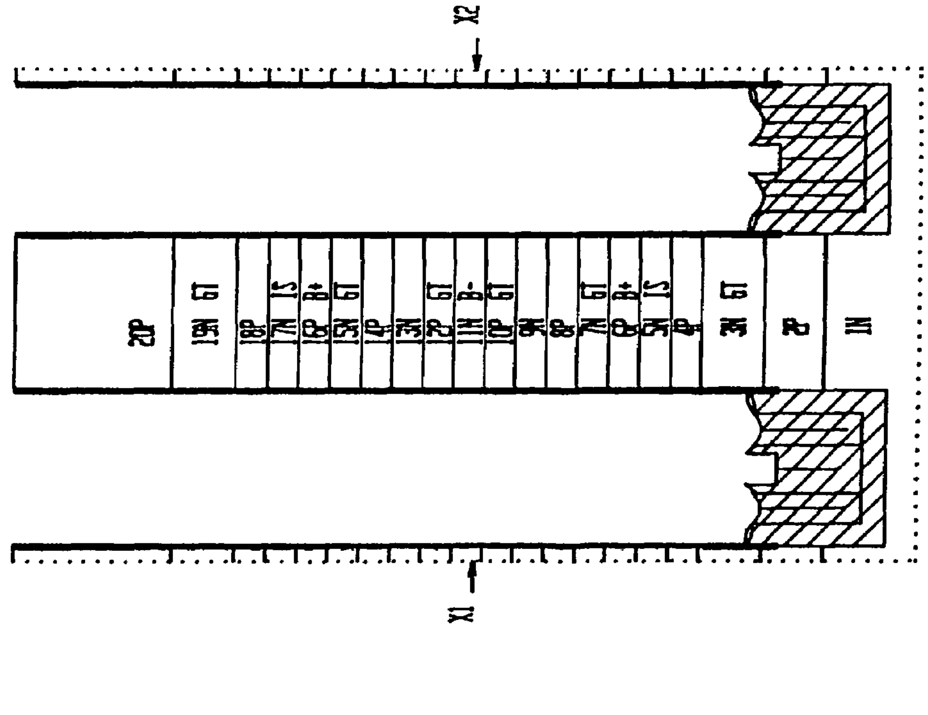

FIGS. 131 and 132 depict the results of a next subsequent step where this coating of Parylene is etched back so as to expose the C trench, while leaving the A and B trenches closed out (LW8.2C & LW8.2AB, as also shown in FIGS. 133, 134 and 135 per LW9.

[LW-24] When a first selectable material coating the walls of a trench is itself coated with a second material, the tops and bottoms of the first and second trench coating materials may be etched away, followed by coating the second coating material with a third coating material which will select with the first coating material (and which may be the same material as the first coating material), so that the tops of the first and third coating materials can be etched down from the top during the same etching step.

[LW-25] The aforementioned method may be used as a means to fabricate walls and a center partition of materials of the same selectivity in a trench.

[LW-26] Walls coated on trenches extending in a first axis may be used so as to enclose regions between pillars in an axis orthogonal to the first axis.

Figure 136:
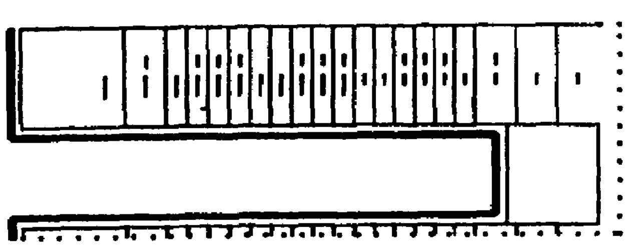
FIG. 136 depicts the vertical cross-section of the widest trench with all surfaces coated with a layer of third insulating material.

FIG. 136 depicts the results of a next subsequent step where silicon-nitride is omni-directionally deposited over the exposed wafer surfaces by such means as CVD (LW9.1).

Figure 137:
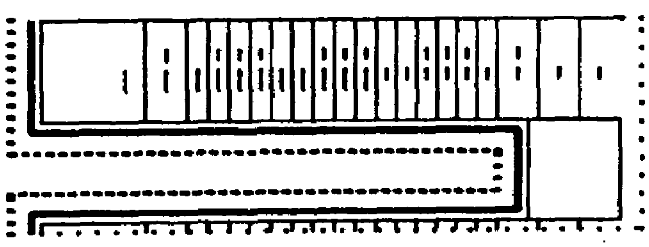
FIG. 137 depicts the vertical cross-section of the widest trench with all surfaces further coated with a layer of second insulating material.

FIG. 137 depicts the results of a next subsequent step where Parylene is omni-directionally deposited over the exposed wafer surfaces (LW9.2).

Figure 138:
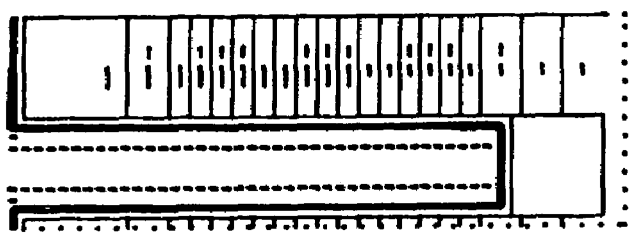
FIG. 138 depicts the vertical cross-section of the widest trench with the second insulating material removed from all non-vertical surfaces.

FIG. 138 depicts the results of a next subsequent step where the exposed tops and bottoms of the aforementioned Parylene coating are vertically etched away by such means as ion milling (LW9.3).

Figure 139:
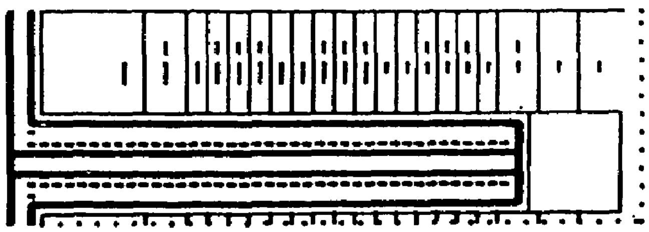
FIG. 139 depicts the vertical cross-section of the widest trench, with all surfaces covered and the trench closed out by third insulating material.

FIG. 139 depicts the results of a next subsequent step where silicon-nitride is onmi-directionally deposited over the exposed wafer surfaces by such CVD means as plasma CVD, so as to close out between the Parylene wall coatings (LW9.4).

Figure 140:
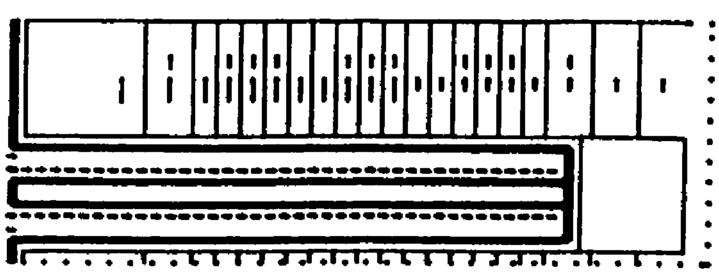
FIG. 140 depicts the vertical cross-section of the widest trench, with the top layer of third insulating material removed from the top surface.

FIG. 140 depicts the results of a next subsequent step where the upper surface double silicon-nitride layers are selectively etched to half their thickness by such means as wet etch or onmi-directional dry etch (LW9.5).

Figure 141:
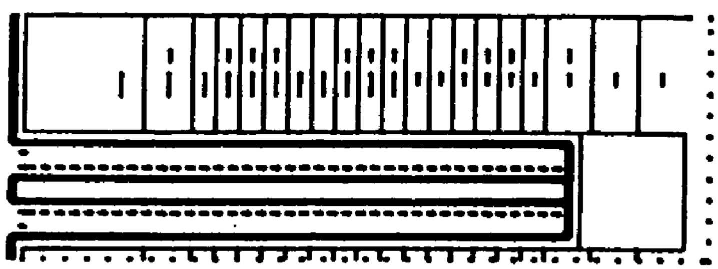
FIG. 141 depicts the vertical cross-section of the widest trench, with the second insulating material lowered to the height of the semiconductor top surface.

FIG. 141 depicts the results of a next subsequent step where the exposed Parylene is selectively etched down to even with the tops of the pillars below the silicon-nitride coating (LW9.6).

Figure 142:
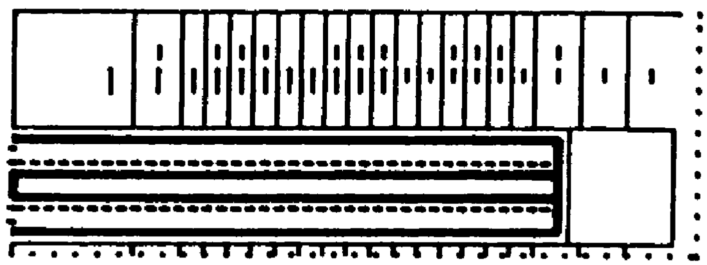
FIG. 142 depicts the vertical cross-section of the widest trench, with the third insulating material lowered to the height of the semiconductor top surface.
Figure 143:
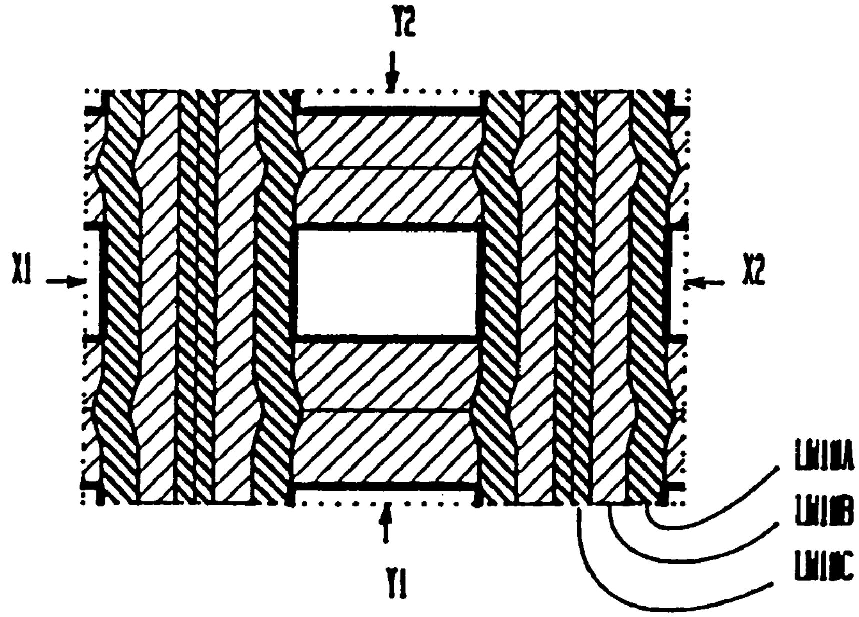
FIGS. 143, 144 and 145 depict three mutually orthogonal cross-sections of the structure of FIG. 142 with more detail and more completely.
Figure 144:
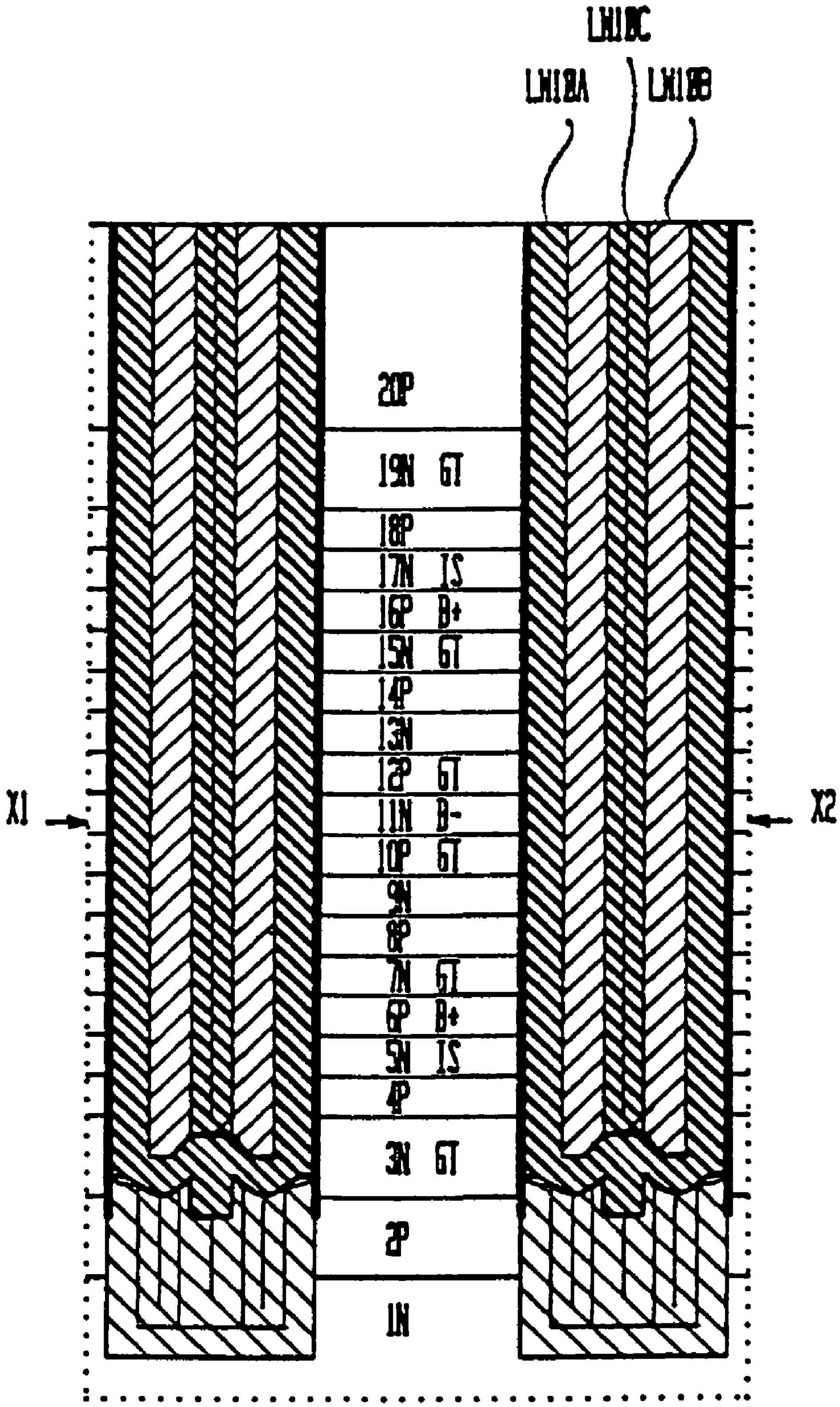
Figure 145:
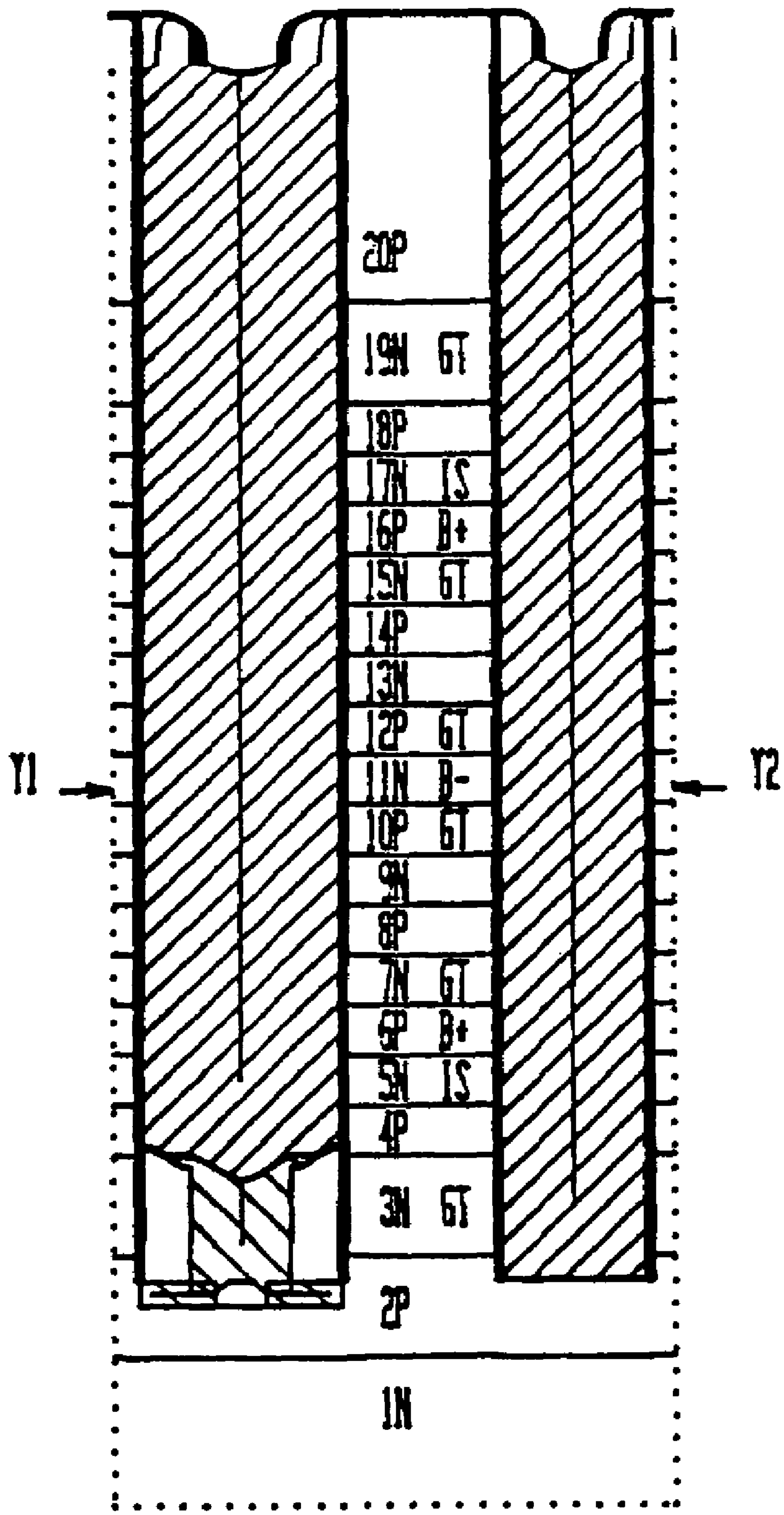

FIG. 142 depicts the results of a next subsequent step where the upper surface silicon-nitride is selectively vertically etched down by such means as wet etch or omni-directional dry etch (LW9.7), as shown in FIGS. 143, 144 and 145, where LW10A is the silicon-nitride wall coating, LW10B is the intervening Parylene, and LW10C is the silicon-nitride partition.

[LW-27] Trenches may be capped in a first axis, while leaving trenches (or trench holes) uncapped in an orthogonal axis.

[LW-28] Trenches may be capped in a first axis, while uncapping alternating trenches (or trench holes) in an orthogonal axis.

[LW-29] Narrower and wider trenches can be caused to remain capped when an intermediate width trench is uncapped.

Figure 146:
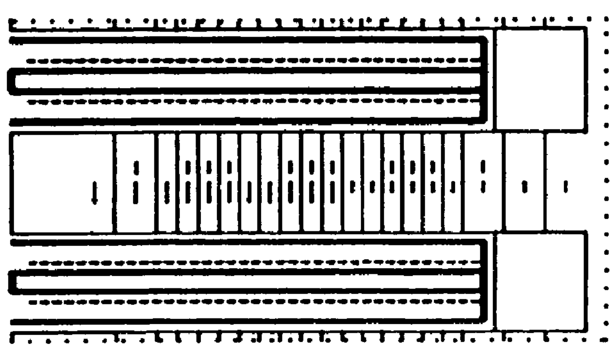
FIGS. 146 and 147 depict the two vertical cross-sections, with the second insulating material tops slightly below the height of the semiconductor top surface.
Figure 147:
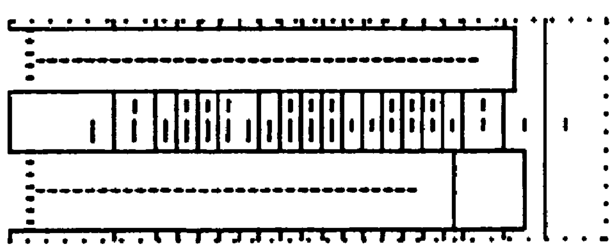

FIGS. 146 and 147 depict the results of a next subsequent step where the exposed Parylene is selectively etched down to a level just below the tops of the pillars where the depth is approximately as deep as the width of the indentation above the Parylene (LW10.1C & LW10.1BA).

Figure 148:
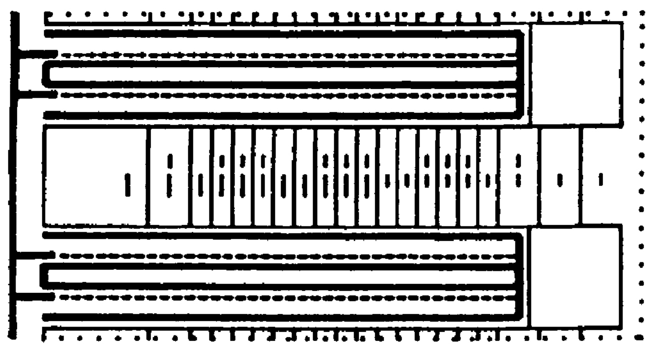
FIGS. 148 and 149 depict the two vertical cross-sections, with a layer of a third insulating material covering all surfaces.
Figure 149:
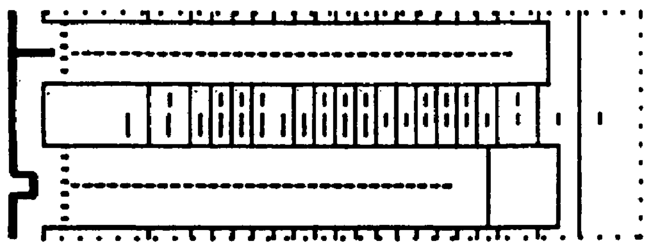

FIGS. 148 and 149 depict the results of a next subsequent step where silicon-nitride is omni-directionally deposited over the exposed wafer surfaces by such means as CVD (LW10.2C & LW10.2BA). All steps requiring silicon-nitride over Parylene should use plasma CVD silicon-nitride deposition.

Figure 150:
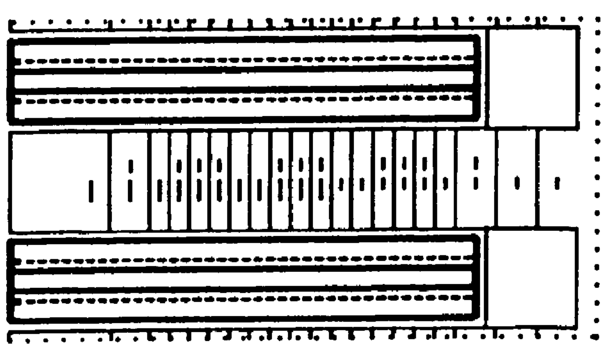
FIGS. 150 and 151 depict the two vertical cross-sections, with third insulating material covering only the tops of the widest and narrowest trenches.
Figure 151:
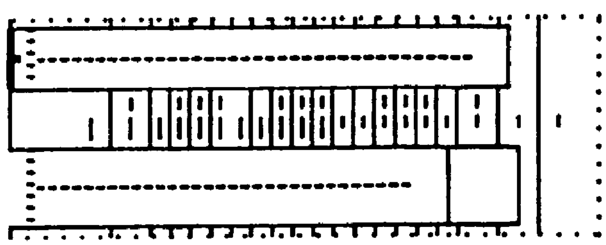

FIGS. 150 and 151 depict the results of a next subsequent step where the upper surface of silicon-nitride is selectively etched by such means as wet etch or omni-directional dry etch, so as to expose the Parylene in the B trench, but leave the closed-out regions which are deeper now than the thickness of the coating (LW10.3C & LW10.3BA). In this manner, the narrowest A trench and widest C trench are protectively capped, while the intermediate sized B trench Parylene filler material is exposed for processing.

[T1-1] Filler material can be etched away in an uncapped trench to expose the trench for processing.

[T1-2] Filler material can be etched away in uncapped trench holes to expose the trench holes for processing.

Figure 152:
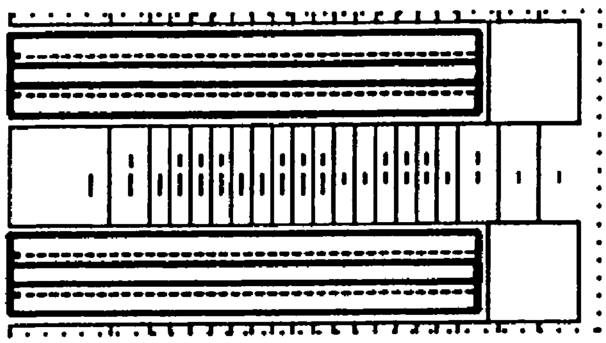
FIGS. 152 and 153 depict the two vertical cross-sections, with the intermediate-width trench cleared.
Figure 153:
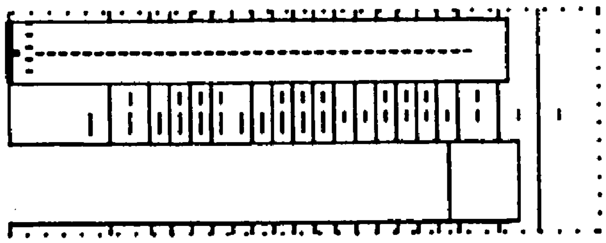
Figure 154:
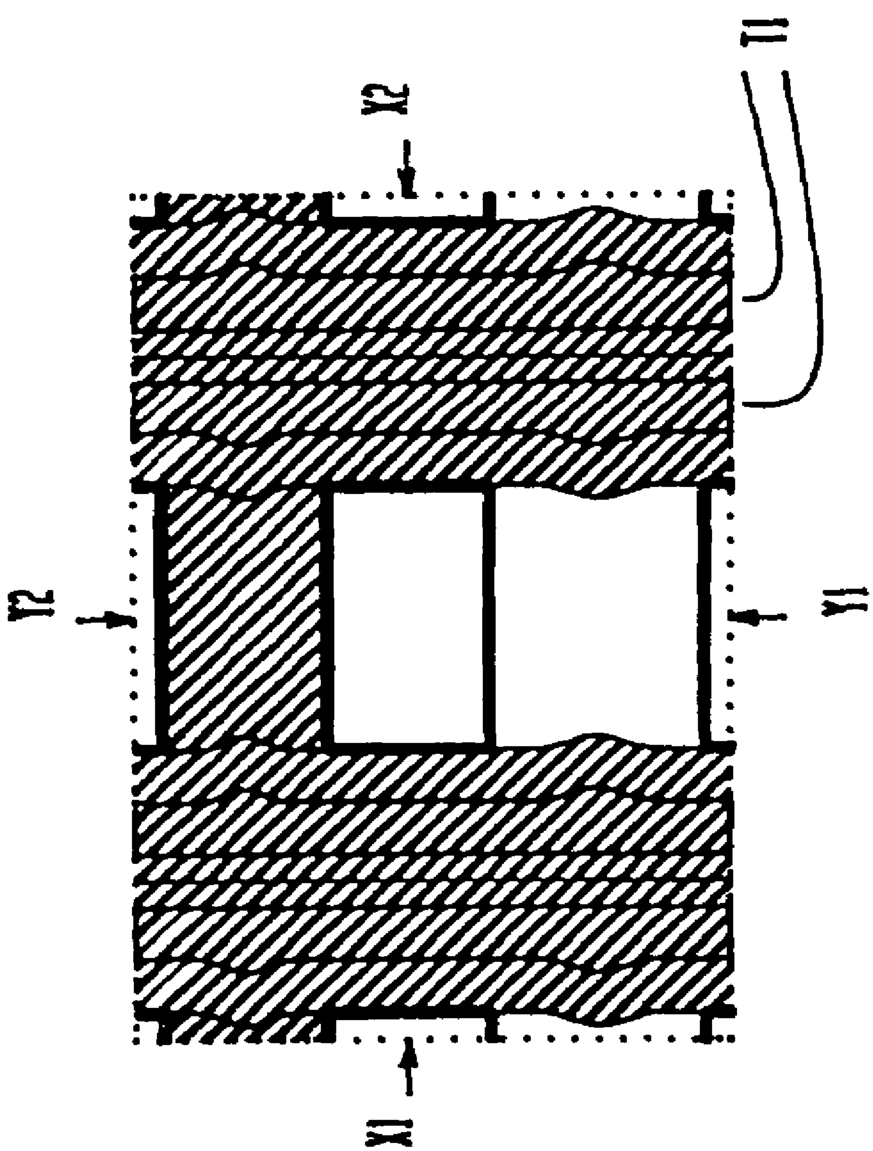
FIGS. 154, 155 and 156 depict three mutually orthogonal cross-sections of the structure of FIGS. 152 and 153 more completely and detailed.
Figure 156:
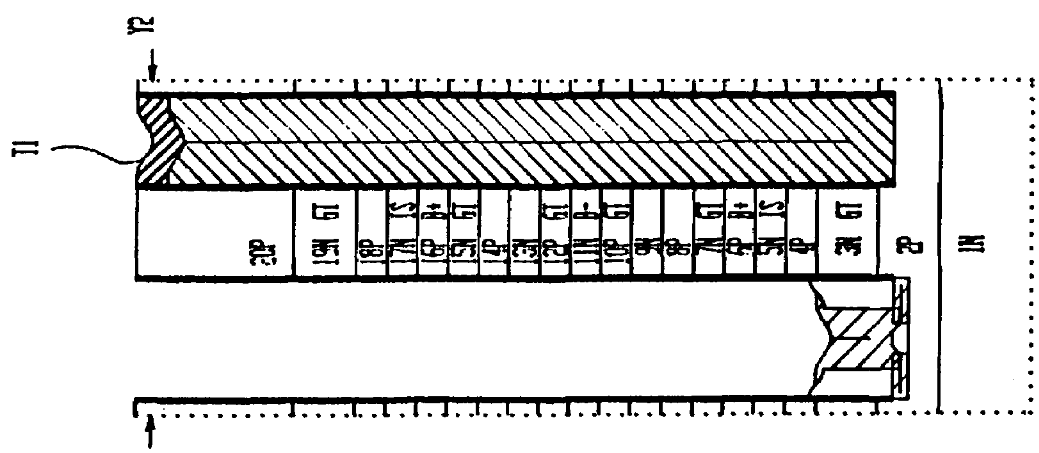
Figure 155:
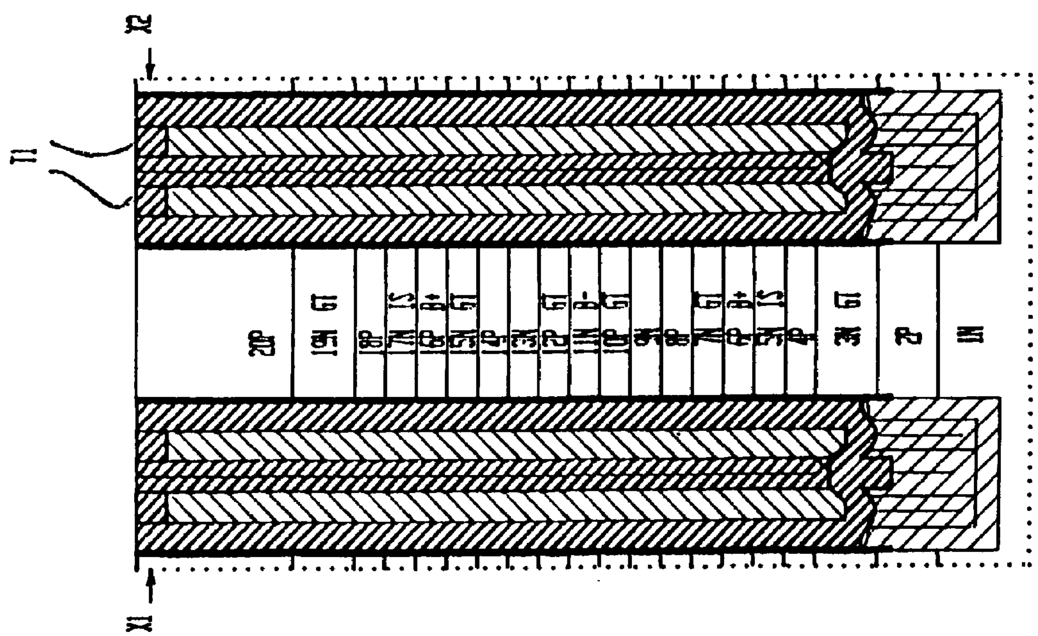

FIGS. 152 and 153 depict the results of a next subsequent step where all exposed Parylene is etched away, leaving the B trench open, but leaving the A and C trenches capped (LW10.4C & LW10.4BA), as shown in FIGS. 154, 155 and 156 where the caps are shown as T1.

B Trench

[B-1] A protector may be used for gate oxide in a vertical trench to protect the gate from further trench processing while wiring circuits in the trench.

Figure 157:
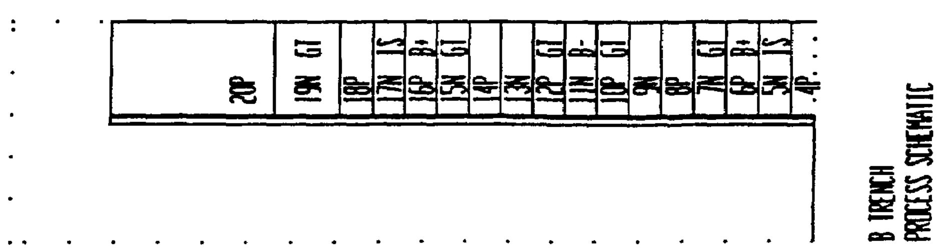
FIG. 157 depicts the vertical cross-section of the right-hand wall of the intermediate-width trench, in subsequent paragraphs simply called "the right wall," with the thin layer of semiconductor material now shown explicitly on top of the thin layer of first insulating material which is now shown as a heavier black line.

FIG. 157 depicts a process schematic of the right wall (these process schematics for the B, and subsequently A trenches, are assumed to be mirror imaged on the opposite wall) of the now exposed B trench, where the coating of polysilicon earlier applied over the thermally oxidized pillar walls is now shown schematically in greater detail as a separate coating over the thermal oxide (silicon dioxide) (B11).

[B-2] An upper trench wall masking coating can be used to mask a first material for etching, where this first material in turn masks a second material for etching.

[B-2A] A lower trench masking plug and upper trench wall masking coating can also be used to mask a first material for etching, where this first material in turn masks a second material for etching (not shown, but as follows except with the lower trench masking plug not etched down so far as to be eliminated).

Figure 158:
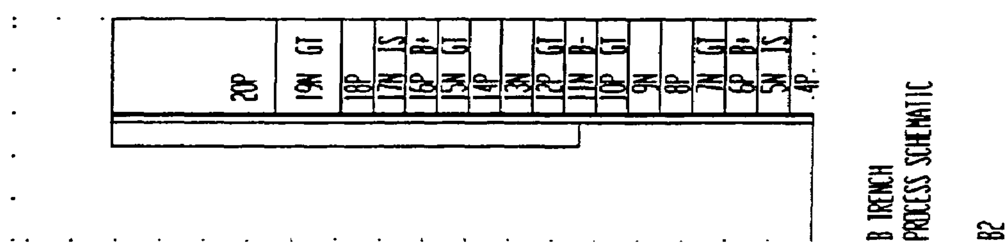
FIG. 158 depicts the right wall, with a masking layer of first metal covering it above a preferred height.

FIG. 158 depicts the results of a next subsequent step where a lower trench masking plug has been set at a height in the middle of layer 11N, a deposition of tungsten has been coated over the trench, the tops and bottoms of this deposition have been etched away by ion milling, leaving a vertical coating (upper trench wall masking coating) extending up and down the walls of the B trench above the height of the lower trench masking plug, followed by the etching down of the lower trench masking plug to a height just above the lower word lines, thereby exposing a lower section of the polysilicon protective wall coating (B2).

The protective Parylene plug over the word lines is either etched down to almost the tops of the word lines in the region of layer 4P to allow clearing of the polysilicon layer above this region in the following step, or the plug is removed for the next step where polysilicon is briefly etched away, and then replaced after this etch before the subsequent tungsten etch, to protect the tungsten in the lower word lines.

Figure 159:
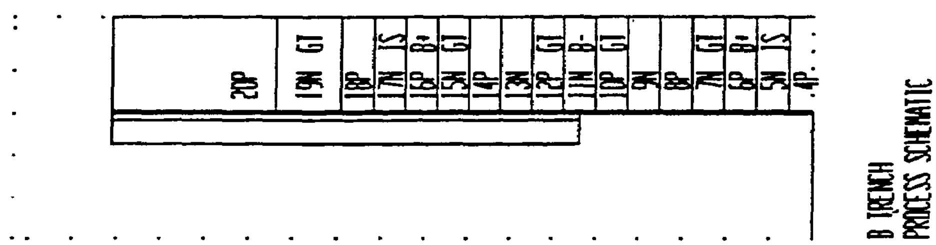
FIG. 159 depicts the right wall, with the layer of semiconductor material removed below the preferred height.

FIG. 159 depicts the results of a next subsequent step where the aforementioned lower section of the polysilicon protective wall coating is selectively etched away (B3).

Figure 160:
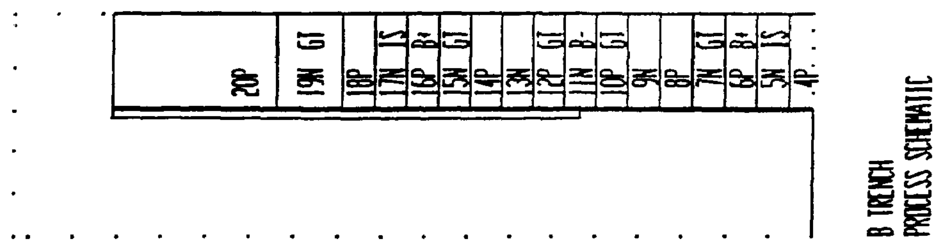
FIG. 160 depicts the right wall, with the masking layer of first metal re-removed.

FIG. 160 depicts the results of a next subsequent step where a lower trench masking plug has been set at a height below the tungsten vertical coating, then the tungsten vertical coating has been etched away, leaving the polysilicon as a mask above the exposed lower silicon-dioxide wall coating, then the lower trench masking plug has been removed. (B4).

Figure 161:
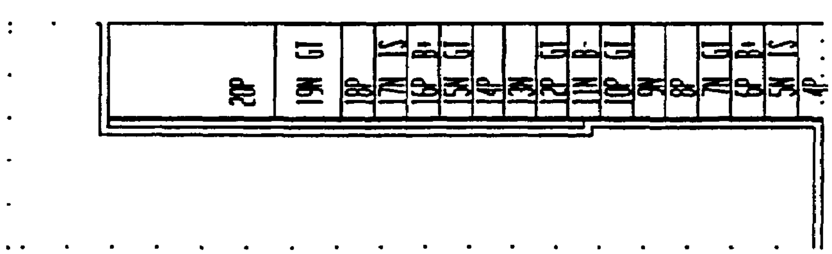
FIG. 161 depicts the right wall, with a thin layer of second insulating material covering all surfaces.

FIG. 161 depicts the results of a next subsequent step where a thin coating of Parylene is omni-directionally deposited over the exposed wafer surfaces (B5).

[B-3] When a first material extends vertically up and down the walls of a trench, where this first material is coated with a second material where the thickness of this second material overhangs lower portions of the trench, and where the first material also extends out horizontally beneath the bottom of the second material so as to form an "L," when this first material is exposed at the top of the trench, this exposed upper portion of this first material may be coated over by a directional deposition of a third material which is selectable against the first material (which third material may be the same as the second material), so as to make the lower portion of the first material which is exposed below the overhang material accessible to back- or undercut-etching, while the top portion of the first material remains protected from the etchant.

[B-4] Parylene is preferred as such a first material.

Figure 162:
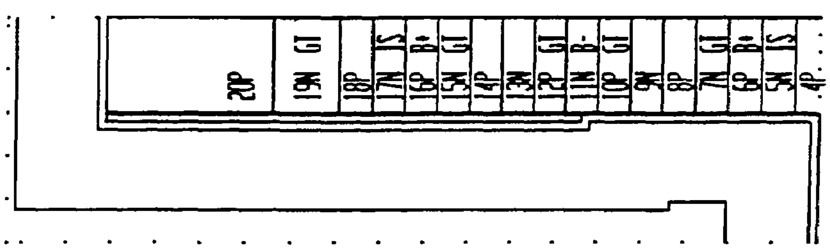
FIG. 162 depicts the right wall, with a further, thick layer of first metal covering all surfaces.

FIG. 162 depicts the results of a next subsequent step where a thick coating of tungsten is omni-directionally deposited over the exposed wafer surfaces (B6).

FIG. 162 depicts the results of a next subsequent step where a thin coating of Parylene is omni-directionally deposited over the exposed wafer surfaces, followed by an omni-directional deposition of a thick coating of tungsten (B6).

Figure 163:
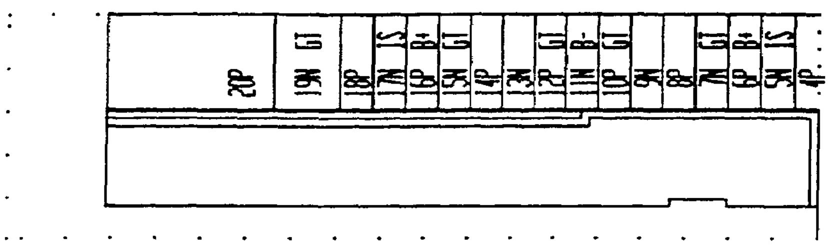
FIG. 163 depicts the right wall, with the thick layer of first metal removed from the horizontal surfaces, and the exposed second insulating material removed.

FIG. 163 depicts the results of a next subsequent step where the exposed tops and bottoms of the aforementioned Parylene and tungsten are vertically etched away by such means as ion milling (B7).

Figure 164:
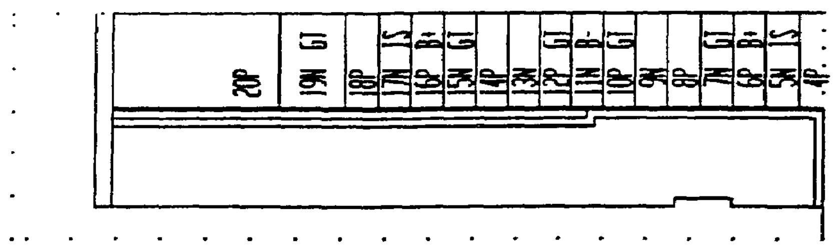
FIG. 164 depicts the right wall, with the top surface covered with a protective layer.

FIG. 164 depicts the results of a next subsequent step where silicon-dioxide (or alternatively gold) is directionally deposited at one or more oblique angles in the manner previously described at LW5.4, so as to coat the top exposed surfaces, thereby creating a protective coating above the previously exposed Parylene seams at the pillar tops (B8).

Figure 165:
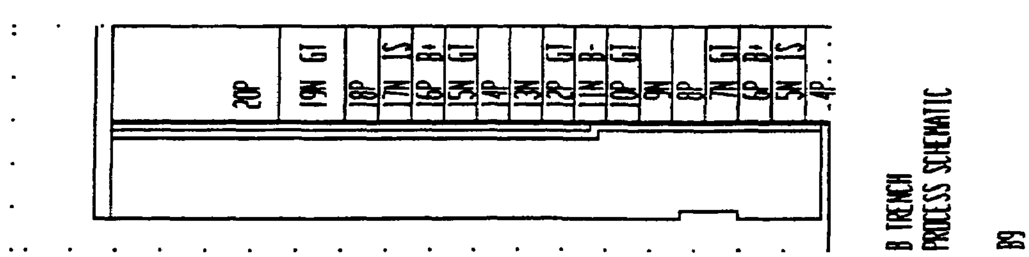
FIG. 165 depicts the right wall, with an undercut from clearing the second insulating material layer between the bottom surface and the layer of first metal.

FIG. 165 depicts the results of a next subsequent step where the exposed Parylene is etched back beneath the tungsten which overhangs it, so as to clear a thin void region back to the pillar wall (B9).

[B-S] A short horizontal insulative tab may be created which contacts a pillar side wall at the bottom of a trench by deposition of insulative material which closes out between an overhanging material above it and the bottom of the trench, where this deposition is followed by removal of the extraneous insulative material and overhanging material.

Figure 166:
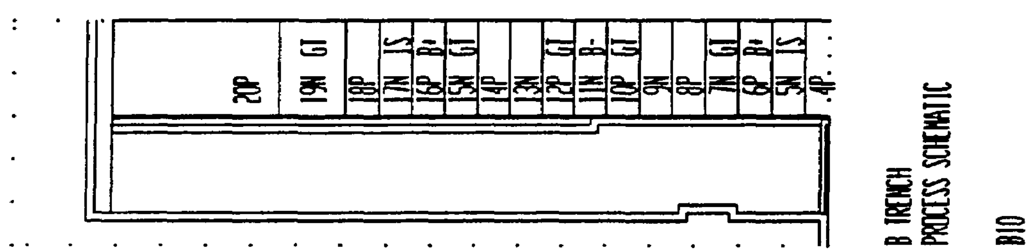
FIG. 166 depicts the right wall, with a layer of third insulating material covering all surfaces and filling the undercut.

FIG. 166 depicts the results of a next subsequent step where an insulator such as silicon-nitride is omni-directionally deposited over the exposed wafer surfaces by such means as CVD, so as to close out beneath the overhang (B10).

Figure 167:
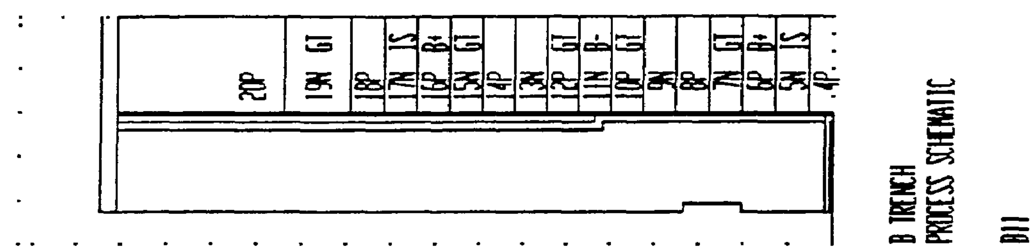
FIG. 167 depicts the right wall, with the third insulating material cleared from all surfaces except from the undercut.

FIG. 167 depicts the results of a next subsequent step where exposed insulator is selectively etched away up to the point where the etch has cleared the thin conformal coating, but not so as to significantly etch back the outer closed-out region beneath the overhang (B11). Alternatively, a tab may be left so as not to completely close out, and then Parylene may be deposited so as to close out the interstice in the tab, followed by etching back the Parylene from the trench walls in the manner described previously for the closed-out silicon-nitride tab at step B10. This alternative approach can be used here and in subsequent tab examples where an insulative fill or lower trench masking plug covers the tab in subsequent processing steps which could alter the function of the tab.

Figure 168:
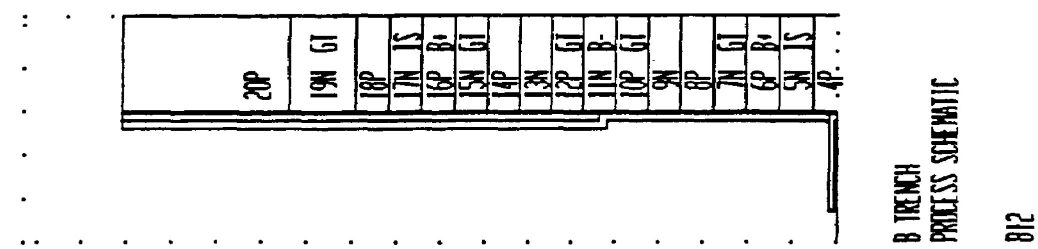
FIG. 168 depicts the right wall, with the top surface cleared from the protective layer and the wall cleared from all first metal.

FIG. 168 depicts the results of a next subsequent step where the exposed silicon-dioxide (or alternatively gold) on the pillar tops and tungsten on the trench walls is selectively etched away leaving the aforementioned tab (B12).

Figure 169:
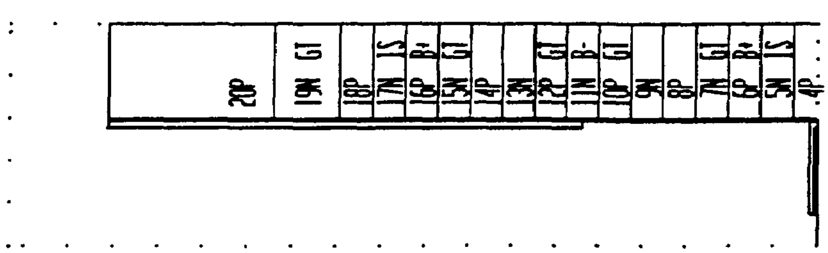
FIG. 169 depicts the right wall, cleared from all second insulating material.

FIG. 169 depicts the results of a next subsequent step where all exposed Parylene is selectively etched away (B13).

[B-5A] A short horizontal conductive tab may be created which contacts a pillar side wall at the bottom of a trench by deposition of conductive material which closes out between an overhanging material above it and the bottom of the trench, where this deposition is followed by removal of the extraneous conductive material and overhanging material.

Figure 170:
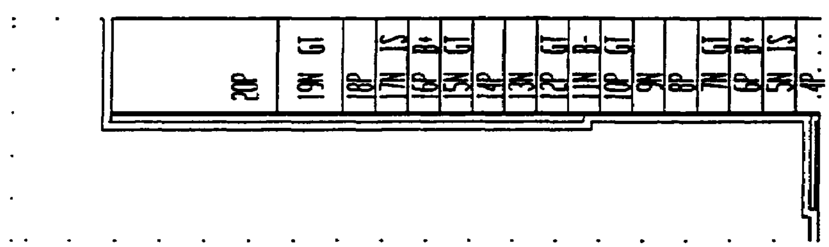
FIG. 170 depicts the right wall, with a layer of second insulating material covering all surfaces.

FIG. 170 depicts the results of a next subsequent step where Parylene is omni-directionally deposited over the exposed wafer surfaces (B14).

Figure 171:
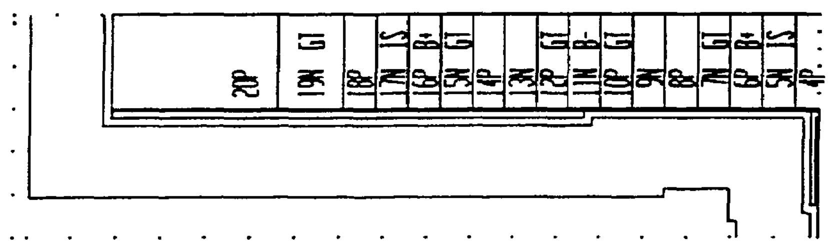
FIG. 171 depicts the right wall, with a further, thick layer of first insulating material covering all surfaces.

FIG. 171 depicts the results of a next subsequent step where a thick coating of silicon-dioxide is omni-directionally deposited over the exposed wafer surfaces (B15).

Figure 172:
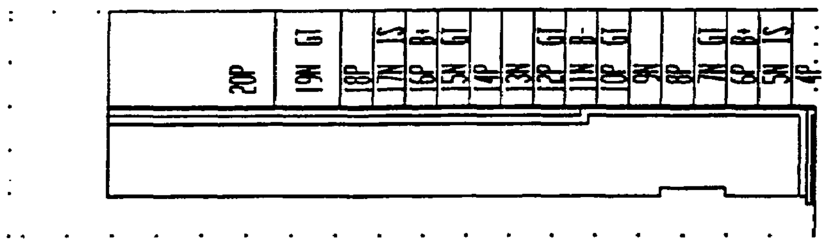
FIG. 172 depicts the right wall, with the thick layer of first insulating material removed from the horizontal surfaces, and the exposed second insulating material removed.

FIG. 172 depicts the results of a next subsequent step where the exposed tops and bottoms of the aforementioned thick silicon-dioxide and Parylene coatings are vertically etched away by such means as ion milling (B16).

Figure 173:
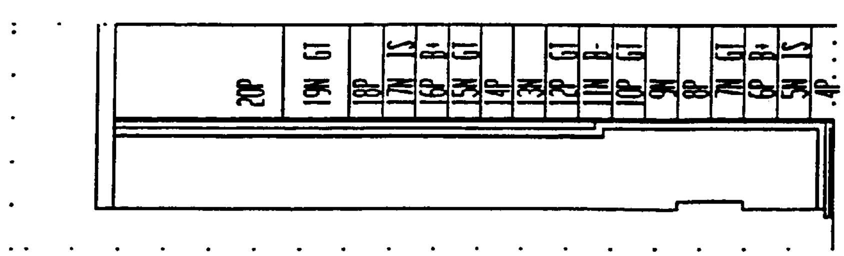
FIG. 173 depicts the right wall, with the top surface covered with a protective layer.

FIG. 173 depicts the results of a next subsequent step where silicon-dioxide (or alternatively gold) is directionally deposited at one or more oblique angles in the manner previously described at LW5.4, so as to coat the top exposed surfaces, thereby creating a protective coating above the previously exposed Parylene seams at the pillar tops (B17).

Figure 174:
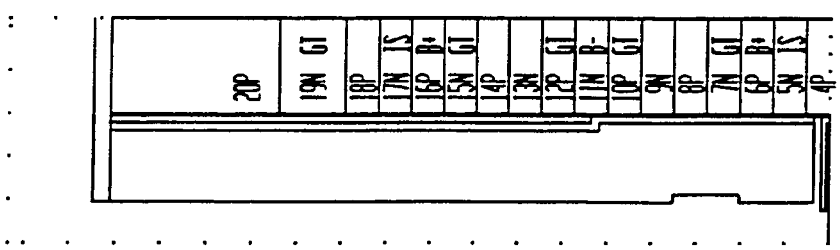
FIG. 174 depicts the right wall, with an undercut from clearing the second insulating material layer between the bottom surface and the layer of first insulating material.

FIG. 174 depicts the results of a next subsequent step where the exposed Parylene is etched back beneath the silicon-dioxide which overhangs it, so as to clear a thin void region back to the pillar wall (B18).

Figure 175:
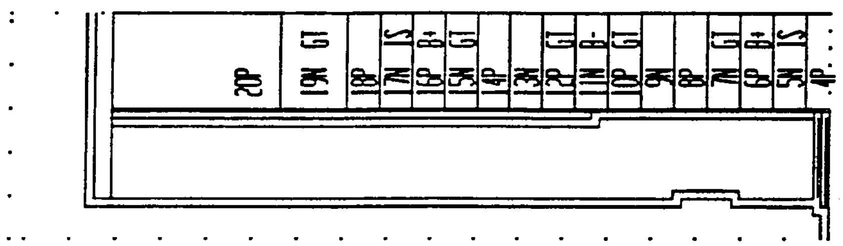
FIG. 175 depicts the right wall, with a layer of first metal covering all surfaces and filling the undercut.

FIG. 175 depicts the results of a next subsequent step where a selectable conductor such as tungsten is omni-directionally deposited over the exposed wafer surfaces by such means as CVD, so as to close out beneath the overhang (B19).

Figure 176:
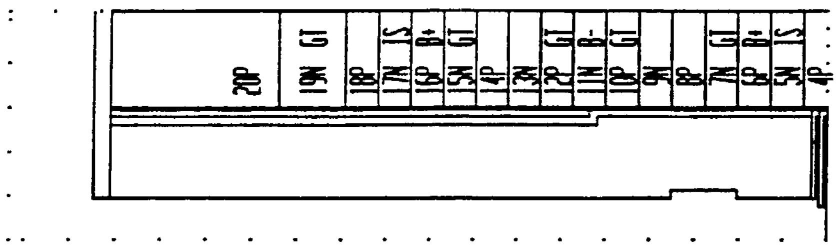
FIG. 176 depicts the right wall, with the first metal cleared from all surfaces except from the undercut.

FIG. 176 depicts the results of a next subsequent step where this exposed conductor is selectively etched away to the point where the etch has cleared the thin conformal coating, but not so as to significantly etch back the closed-out region beneath the overhang (B20). The alternative technique using a Parylene close-out (as described at step B11) may be applied here, as well.

Figure 177:
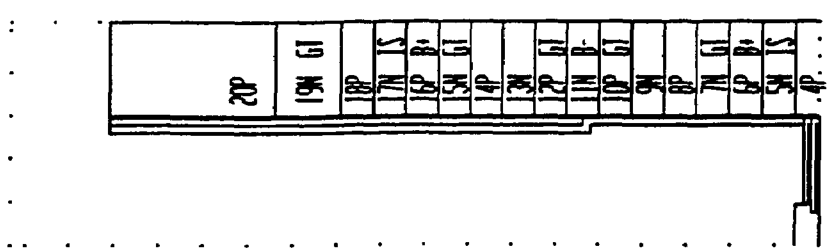
FIG. 177 depicts the right wall, with a plug of second insulating material at the bottom, and with the top surface cleared from the protective layer and the wall cleared from all first insulating material.

FIG. 177 depicts the results of a next subsequent step where a protective plug of Parylene is set at approximately the top of layer 4P to protect the lower silicon-dioxide. This is accomplished by omni-directionally depositing Parylene so as to close out the B trench (with reflow), and then etching the Parylene down to this height. Then, the exposed silicon-dioxide (or alternatively gold) on the pillar tops and silicon-dioxide on the trench walls is selectively etched away (B21).

Figure 178:
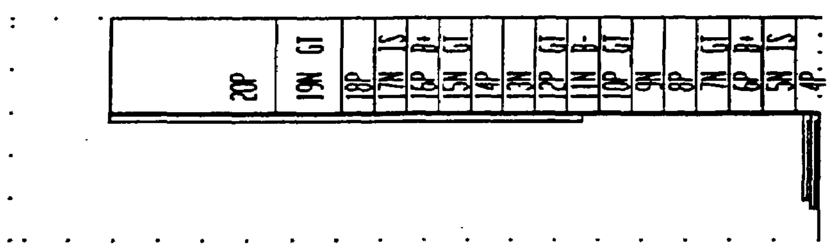
FIG. 178 depicts the right wall, cleared from all second insulating material.

FIG. 178 depicts the results of a next subsequent step where all exposed Parylene is etched away (B22). (The protective plug of Parylene previously set at the middle of layer 4P is now also etched away.)

Figure 179:
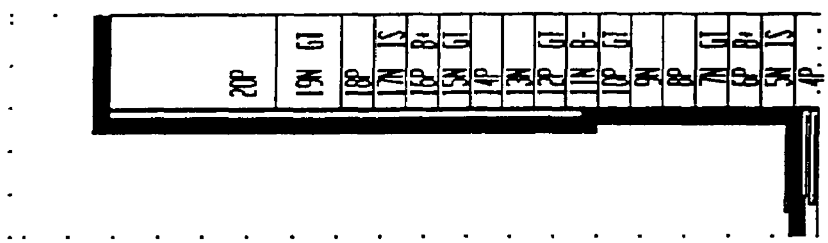
FIG. 179 depicts the right wall, with a plug of second insulating material at the bottom and with a thick layer of first insulating material covering all surfaces.

FIG. 179 depicts the results of a next subsequent step where a protective plug of Parylene is set approximately at the middle of layer 4P to protect the lower silicon-dioxide. This is accomplished by omni-directionally depositing Parylene so as to close out the B trench (with reflow), and then etching the Parylene down to this height. Then a thick coating of silicon-dioxide is omni-directionally deposited over the exposed wafer surfaces by such means as CVD (B23).

Wherever shown here and in subsequent process schematic FIGS., this coating of silicon-dioxide will preferably be at least around three times the thickness of the thermal silicon-dioxide side wall coating, so that the thermal silicon-dioxide side wall coating can serve as an insulator for the FET gates being created, and the thick coating of silicon-dioxide can serve as an insulator of sufficient thickness so as to prevent conductive channels from forming in underlying silicon regions in response to potentials applied to conductors on top of the thick coating.

Figure 180:
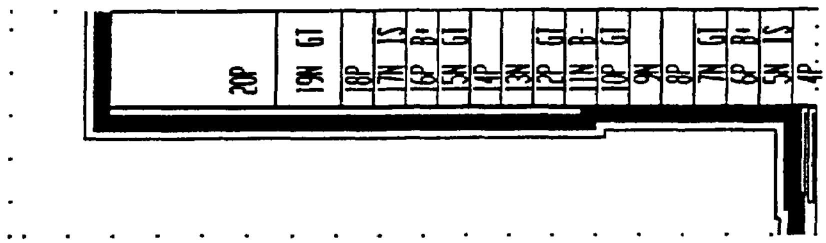
FIG. 180 depicts the right wall, with a layer of first metal covering all surfaces.

FIG. 180 depicts the results of a next subsequent step where tungsten is omni-directionally deposited over the exposed wafer surfaces by such means as CVD (B24).

Figure 181:
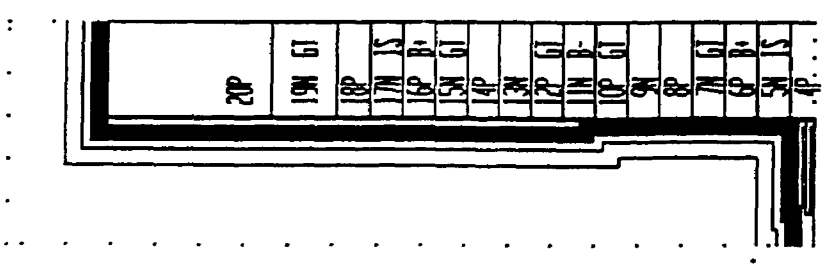
FIG. 181 depicts the right wall, with a thick layer of second insulating material covering all surfaces.

FIG. 181 depicts the results of a next subsequent step where a thick coating of Parylene is omni-directionally deposited over the exposed wafer surfaces (B25).

[B-7] A first material coating the walls of a trench can have the upper and lower horizontal surfaces removed so that the remaining first material extends vertically up and down the walls of the trench and overhangs the lower portion of the trench, thus exposing a conductor which wrapped down the sides of the trench and around beneath the first material.

Figure 182:
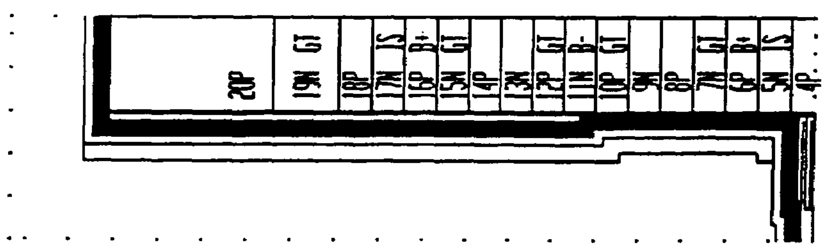

FIG. 182 depicts the results of a next subsequent step where the exposed tops and bottoms of the aforementioned thick coating of Parylene are vertically etched away by such means as ion milling (B26).

[B-8] Such a conductor can be etched back to the thickness of the overhang so that the thickness of the overhang serves to pattern a feature.

Figure 183:
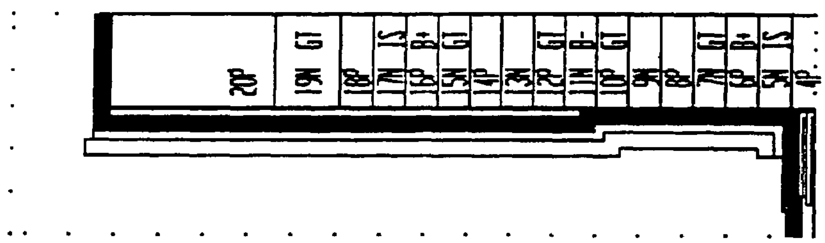

FIG. 183 depicts the results of a next subsequent step where the exposed tungsten on the bottom of the trench and above the Parylene is selectively etched away (B27).

Figure 184:
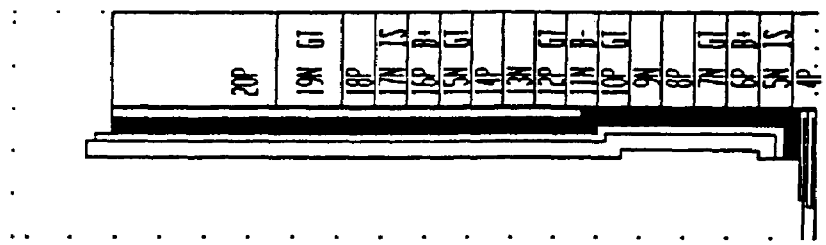

FIG. 184 depicts the results of a next subsequent step where the exposed silicon-dioxide not protected by the Parylene and tungsten is selectively etched away (B28).

Figure 185:
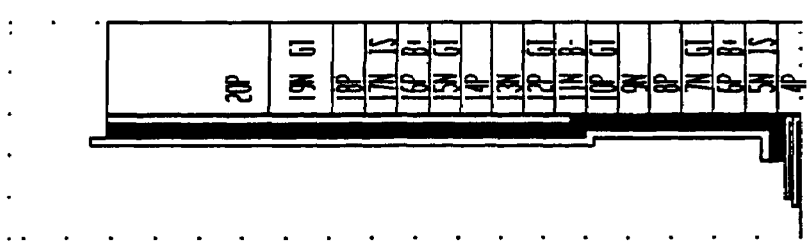

FIG. 185 depicts the results of a next subsequent step where all exposed Parylene is etched away (B29).

[B-9] An upper portion of a conductor can be selectively separated from a lower outward extending conductor to allow circuit contact variations before later conductive relinkage between the two.

[B-10] A selectable lower trench masking plug may be set at a preferred height so as to protect unlinked lower exposed conductive regions to permit etching above these regions without damage to them.

Figure 186:
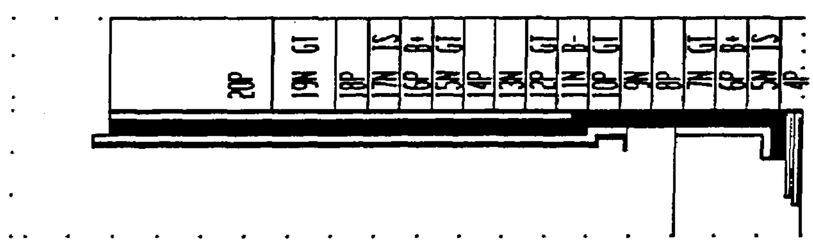

FIG. 186 depicts the results of a next subsequent step where an upper trench wall masking coating of silicon-dioxide is created with its lower limit just below the top of layer 9N, followed by a lower trench masking plug being etched down to a height just above the bottom of layer 8P, followed by selective etching away of the exposed tungsten adjacent to the upper portion of layer 8P and the lower portion of layer 9N (B30).

[B-11] Wiring material may be used as a vertically extending mask to allow selective etching of insulator on a wired pillar.

Figure 187:
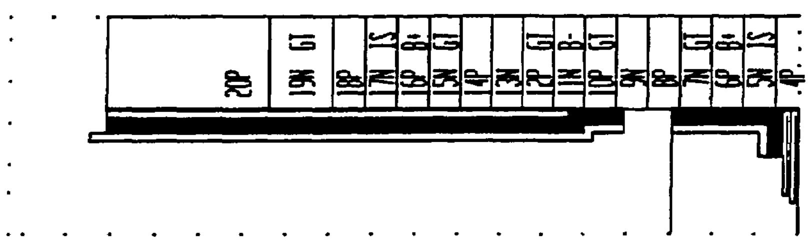

FIG. 187 depicts the results of a next subsequent step where the exposed silicon-dioxide sleeve on the trench walls and the thick silicon-dioxide layer above the lower trench masking plug and below the upper tungsten are selectively etched away (B31).

Figure 188:
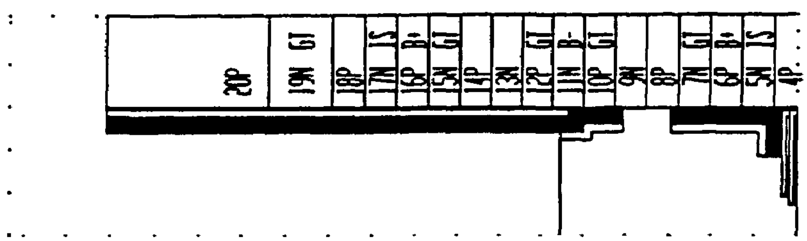

FIG. 188 depicts the results of a next subsequent step where a new lower trench masking plug is set at a height just below the top of layer 11N (B32), either by adding onto or by removal and replacement of the prior lower trench masking plug, and the exposed tungsten on the wall has been etched away.

[B-12] Insulator can be caused to vary in thickness along the sides of a wired pillar, so that the conductive wiring will act as a gate for certain FETs, but not activate gates for other FETs adjacent to said conductive wiring.

Figure 189:
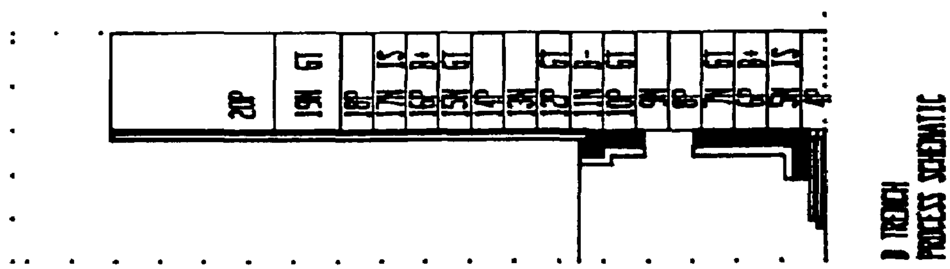

FIG. 189 depicts the results of a next subsequent step where the exposed silicon-dioxide on the trench walls above the lower trench masking plug is selectively etched away (B33).

[B-13] A conductive layer can be separated from a wired pillar of alternating doped regions by a constant thickness of insulator where this conductive layer acts as an FET gate for certain doped regions, but not on other similarly doped regions, so as to not require extra fabrication complexity when passing over these other similarly doped regions.

Figure 190:
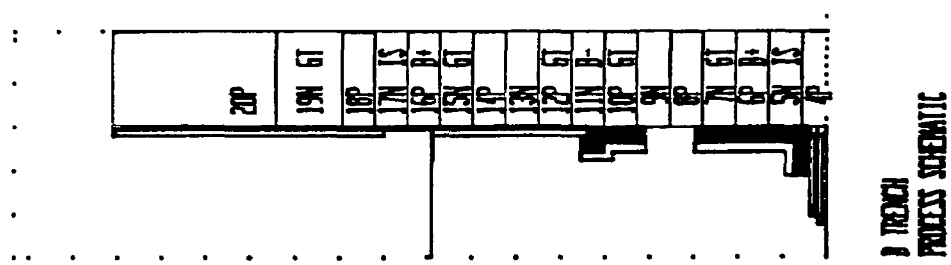

FIG. 190 depicts the results of a next subsequent step where an upper trench wall masking coating of tungsten was set with its lower limit near the top of layer 17N, followed by a lower trench masking plug being set to a height near the bottom of layer 16P, followed by selective etching away the polysilicon coating adjacent to 16P and 17N between these two masks, and then selectively etching away the tungsten upper trench wall masking coating (B34).

Figure 191:
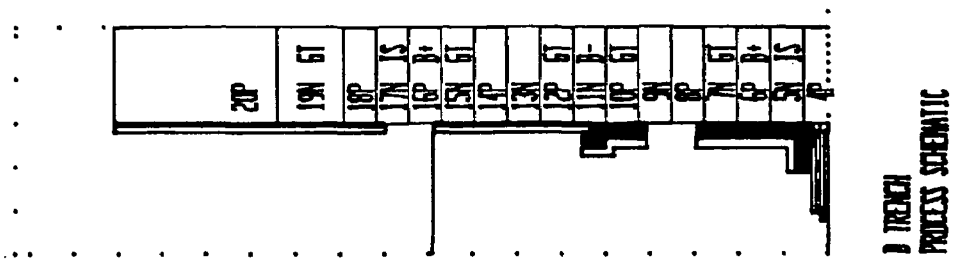

FIG. 191 depicts the results of a next subsequent step where the lower trench masking plug and the polysilicon above the upper portion of 17N act so as to mask the silicon-dioxide layer, and this region of the silicon-dioxide coating is selectively etched away (B35).

Figure 192:
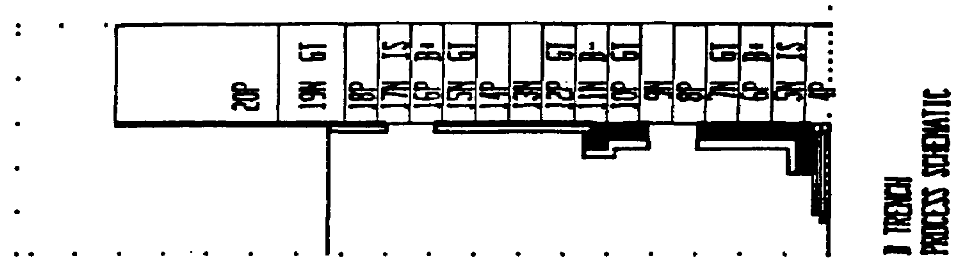

FIG. 192 depicts the results of a next subsequent step where the lower trench masking plug is set to a height near the bottom of layer 19N, and the polysilicon above it is selectively etched away (B36).

Figure 193:
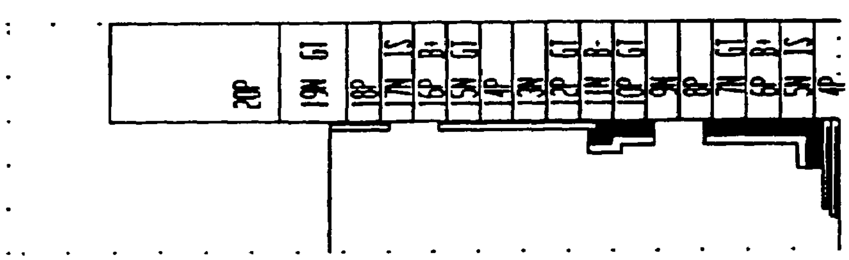

FIG. 193 depicts the results of a next subsequent step where the exposed silicon-dioxide on the trench walls above the lower trench masking plug is selectively etched away (B37).

[B-14] A conductive coating can be deposited so that conductive traces are stood off from a pillar by various insulator thicknesses, where various separate conductive traces then become linked together into a more complete electronic circuit trace.

[B-6] Chemical vapor deposition of tungsten is preferred as a conductive coating for the various subsequent as well as aforementioned processes due to its selectivity, refractory characteristics, and lack of circuit degradation features.

FIG. 194 depicts the results of a next subsequent step where the lower trench masking plug has been etched down to the height of the middle of layer 4P and a layer of tungsten is omni-directionally deposited over the exposed wafer surfaces by such means as CVD, so as to electrically connect the various side wall features up and down the trench (B38).

[B-15] Conductive wiring between adjacent pillars may be divided by coating the vertical sides of the pillars with a material which overhangs the lower portion of the adjacent trench, followed by vertically etching away the linking conductor between the two pillars so as to separate the wiring.

FIG. 195 depicts the results of a next subsequent step where a lower trench masking plug is set to a height near the top of layer 6P, and a thick coating of silicon-dioxide is then omni-directionally deposited over the exposed wafer surfaces by such means as CVD, where this coating is sufficiently thick so as to serve in subsequent steps as an overhanging mask with which to ion mill the lower tungsten coating at a preferred location when the tungsten is exposed (B39).

FIG. 196 depicts the results of a next subsequent step where the exposed tops and bottoms of the aforementioned silicon-dioxide coating are vertically etched away by such means as ion milling (B40).

FIG. 197 depicts the results of a next subsequent step where the lower trench masking plug is selectively etched away (B41).

FIG. 198 depicts the results of a next subsequent step where the now exposed tungsten coating is vertically ion milled, so as to remove the exposed portions of the coating not shielded by the silicon-dioxide overhanging mask (B42).

A protective plug of Parylene is set at the middle of layer 4P to protect the lower silicon-dioxide. This is accomplished by omni-directionally depositing Parylene so as to close out the B trench (with reflow), and then etching the Parylene down to this height.

FIG. 199 depicts the results of a next subsequent step where the exposed silicon-dioxide on the trench walls (which served as the overhanging mask) is selectively etched away (B43).

[B-16] A conductive linkage may be separated by selective etching with a lower trench masking plug and upper trench wall masking coating, so as to make more than one conductive trace running up and down the pillar.

FIG. 200 depicts the results of a next subsequent step where an upper trench wall masking coating of silicon-dioxide has been set to a height just above the bottom of layer 17N, a lower trench masking plug has been set to a height approximately at the interface of layers 16P and 15N, then the so exposed section of tungsten coating has been selectively etched away, leaving a break in the tungsten coating at that location, then the upper trench wall masking coating and the lower trench masking plug have been removed in succession by selective etching (B44).

[B-17] A selectable lower trench masking plug can be used so as to permit etching away of any extension of a conductive trace leading to the top of a pillar, so as that everything below the height of the lower trench masking plug will remain usable conductive wiring.

FIG. 201 depicts the results of a next subsequent step where a lower trench masking plug has been set to a height just below the top of layer 19N, and the tungsten coating above this mask has been selectively etched away, followed by the removal of the lower trench masking plug, thus completing the vertical wiring of the currently uncapped trench walls (i.e. the pillars which serve as these walls) (B45), as shown in FIGS. 202, 203 and 204 at BT1.

[B-18A] Thus, electronic circuitry can be wired so as to connect electronic circuitry which includes a plurality of transistors, without the use of photolithography.

[B-18B] Thus, a side of a pillar of alternating doped regions of semiconductor material can be wired so as to connect electronic circuitry which includes a plurality of transistors, without the use of photolithography.

[B-19] Likewise, electronic circuitry which includes a plurality of transistors can be vertically wired beneath the surface of a semiconductor wafer, without the use of photolithography.

[B-20] Conductive traces on one or more sides of a column can be coated with an insulator which is etched back above the height of a lower trench masking plug formed from it, so as to protect the circuitry.

FIG. 205 depicts the results of a next subsequent step where a coating of silicon-dioxide is omni-directionally deposited over the exposed wafer surfaces by such means as CVD (BT1.1).

[B-21] Such an insulated section can be filled with a material which can tolerate voids within its closed-out regions, so as to reliably contain voids without degradation from trapped reactant gasses.

[B-22] Parylene is a preferred material for such closed-out regions.

FIG. 206 depicts the results of a next subsequent step where Parylene is omni-directionally deposited over the exposed wafer surfaces, so as to close out in the middle of the trench, and then reflowed (BT1.2).

FIG. 207 depicts the results of a next subsequent step where the exposed Parylene is selectively etched down to a preferred height for subsequent vertical masking (BT1.3). If significant voids are present during this etch down process, a thin coating of Parylene may be intermittently deposited so as to reclose the trench as required, or other aforementioned void compensating techniques may be used (BT1.3).

FIG. 208 depicts the results of a next subsequent step where the exposed silicon-dioxide on the trench walls above the Parylene is selectively etched away, leaving a protective insulative fill in the region of the previously exposed vertical wiring (BT1.4), as shown in FIGS. 209, 210 and 211 at BT2.

Caps

[B-24] A cap above a preset level can be created in an open trench while other trenches remain capped.

[B-25] A cap of an open trench can be created by deposition and side closure (close-out), followed by etch-back of the deposition to the height of other caps.

[B-26] The height of the lower portion of a first cap can be set lower than the height of the lower portion of other caps, so that these other caps will be etched away first during top-etching of all caps.

FIGS. 212 and 213 depict the results of a next subsequent step where silicon-nitride is omni-directionally deposited over the exposed wafer surfaces by such means as CVD, so as to close out between the top of the aforementioned protective insulative fill and the top of the exposed B trench (BT2.1C & BT2.1BA).

FIGS. 214 and 215 depict the results of a next subsequent step where the silicon-nitride coating the top of the wafer is etched down by such means as selective wet etch or omni-directional dry etch, so as to leave the various trenches capped with caps of preferred depth and uniform height at the tops of the pillars (BT2.2C & BT2.2BA), as shown in FIGS. 216, 217 and 218 at T2, etc.

[B-27] The height of the bottom of a first cap can optionally be set higher than the height of the bottoms of other caps, so that the first cap will be etched away first during top-etching all caps (not shown).

[B-28] The height of the bottom of a first cap can optionally be set between the heights of the bottoms of other caps, so that the first cap will be etched away after top-etching etches away other caps with higher bottoms, but where the first cap is etched away before other caps with lower bottoms are etched away (not shown).

[B-29] The top of a cap can be etched down by ion milling.

[B-30] The tops of caps may be etched away by ion milling, so as to reduce all their heights, thereby reducing the subsequent heights of some caps, while eliminating other caps.

[B-31] The top of a cap can be etched down by wet etch or omni-directional dry etch (workable for the subsequent FIGS., but not shown).

[B-32] The tops of caps may be etched away with wet etch or omni-directional dry etch, so as to reduce all their heights, thereby reducing the subsequent heights of some caps while eliminating other caps (workable for the subsequent FIGS., but not shown).

FIGS. 219 and 220 depict the results of a next subsequent step where the exposed tops of the aforementioned silicon-nitride caps and intervening structures (pillar tops) are vertically etched away by such means as ion milling, so as to expose the Parylene in the C and A trenches (T2.1C & T2.1BA).

[B-33] Uncapped trenches (in this case trench subdivisions on opposing sides of a partition) which are narrower than the other trenches may be recapped by deposition and etch-back of a capping material, so as to leave any uncapped wider trenches still exposed.

FIGS. 221 and 222 depict the results of a next subsequent step where the exposed Parylene is selectively etched down to a preferred height for the subsequent C trench caps (T2.2C & T2.2BA).

FIGS. 223 and 224 depict the results of a next subsequent step where silicon-nitride is omni-directionally deposited over the exposed wafer surfaces by such means as CVD, so as to close out the regions between the C trench partitions for capping, while leaving the silicon-nitride coating the top of the A trench gapped (T2.3C & T2.3BA).

[B-34] A narrower trench can be closed and an intermediate sized trench can be opened by the aforementioned method when the widest trenches are already capped. In this case as subsequently demonstrated, "narrower" includes sub-trench widths on either side of a partition as in the C trench, rather than the original C trench width before partitioning, and "widest" refers to the B trench.

FIGS. 225 and 226 depict the results of a next subsequent step where the exposed silicon-nitride on the A trench walls above the rest of the wafer is selectively etched away, leaving the B and C trenches still capped, but the A trench uncapped (T2.4C & T2.4BA).

FIGS. 227 and 228 depict the results of a next subsequent step where all exposed Parylene is etched away, thereby opening the A trench for subsequent processing (T2.5C & T2.5BA), as shown in FIGS. 229, 230 and 231 in accordance with T2X.

A Trench

FIG. 232 depicts a process schematic of the left wall of the now exposed A trench, where the coating of polysilicon earlier applied over the thermally oxidized pillar walls is now shown schematically in greater detail as a separate coating over the thermal oxide (A1).

FIG. 233 depicts the results of a next subsequent step where an upper trench wall masking coating of tungsten has been set on the walls above a point near the top of layer 3N, and a lower trench masking plug has then been set just below the middle of layer 3N, then the polysilicon has been etched away in the region exposed by the masks, then the masks have been removed (A2).

FIG. 234 depicts the results of a next subsequent step where the prior process sequence has been used to etch away the polysilicon in the middle of layer 5N (A3).

FIG. 235 depicts the results of a next subsequent step where the silicon-dioxide layer behind the polysilicon layer is etched away, using the polysilicon as a mask (A4).

FIG. 236 depicts the results of a next subsequent step where tungsten is omni-directionally deposited over the exposed wafer surfaces by such means as CVD (A8).

FIG. 237 depicts the results of a next subsequent step where a lower trench masking plug has been set at a height just below the gap made in the middle of layer 3N, then a coating of silicon-nitride has been omni-directionally deposited over the exposed wafer surfaces by such means as CVD, then the exposed tops and bottoms of the aforementioned silicon-nitride coating have been vertically etched away by such means as ion milling, then the lower trench masking plug has been removed (A9).

[A-1] The bottom and sides of a conformal conductor coating may be etched away, so as to break connection between conductive traces on the sides of adjacent pillars where this connection crosses the bottom of an intervening trench.

FIG. 238 depicts the results of a next subsequent step where, after an omni-directional etch has removed the exposed tungsten, a top cap of silicon-dioxide (or alternatively gold) has been added (in the manner previously described at LW5.4) and then the polysilicon coating which covered the lower silicon-dioxide has been etched away in the region below the silicon-nitride which was previously covered by the lower trench masking plug (A10). The oblique angle of the directional deposition which creates the top cap should be done from multiple oblique angles as suggested at LW5.4 so as to avoid shadowing of any small steps which exist in the area to be coated, as shown.

FIG. 239 depicts the results of a next subsequent step where all exposed silicon-nitride is etched away (A11).

FIG. 240 depicts the results of a next subsequent step where an upper trench wall masking coating of silicon-nitride has been set with its lower end just below the top of layer 6P, and a lower trench masking plug has been set at a height at the level where layers 5N and 6P meet, then the exposed trench wall surface tungsten and polysilicon have been selectively etched away by such means as wet etch or omni-directional dry etch, then the upper trench wall masking coating has been removed (A12).

FIG. 241 depicts the results of a next subsequent step where the tungsten coating the trench walls above the lower trench masking plug has been selectively etched away, then an upper trench wall masking coating of silicon-nitride has been set on the walls above a point near the middle of layer 18P, and a lower trench masking plug has then been set just below the middle of layer 11N, then the polysilicon has been etched away in the region exposed between these masks, then the masks have been removed (A13).

[A-2] A lower trench masking plug may be used to electrically isolate and chemically selectively protect a completed lower conductive link, while a new upper conductive link is subsequently fabricated.

FIG. 242 depicts the results of a next subsequent step where the top cap of silicon-dioxide (or alternatively gold—as applied at A10) has been selectively etched away, and then a lower trench masking plug has been set at a height just below the middle of layer 11N, then a thick coating of silicon-dioxide has been omni-directionally deposited over the exposed wafer surfaces by such means as CVD (A14). If the top cap were of silicon-dioxide, then to conform with the drawing sequence shown, a lower trench masking plug of Parylene should be raised to even with the tops of the pillars (but with the top cap tops exposed) so as to not etch the silicon-dioxide which would otherwise be exposed further down the pillars. Then, after the top cap is removed, the Parylene lower trench masking plug should also be removed, before then setting the aforementioned lower trench masking plug to the middle of layer 11N, and then depositing the aforementioned thick coating of silicon-dioxide shown. Alternatively, a silicon-dioxide top cap can simply be left in place to mix with the thick coating of silicon-dioxide which is omni-directionally deposited in this step.

FIG. 243 depicts the results of a next subsequent step where a thin layer of tungsten is omni-directionally deposited over the exposed wafer surfaces by such means as CVD (A15).

[A-4] A first selectable material may be used as a mask to create multiple features in a second intervening (sandwiched) layer of a second selectable material along the walls of a vertical trench, without use of photolithography.

FIG. 244 depicts the results of a next subsequent step where an upper trench wall masking coating of silicon-nitride has been set on the walls above a point to result in subsequent masking near the middle of layer 14P, and a lower trench masking plug has then been set to result in subsequent masking near the middle of layer 13N, then the tungsten coating has been etched away in the region exposed by the masks, then the masks have been removed (A16).

FIG. 245 depicts the results of a next subsequent step where an upper trench wall masking coating of silicon-nitride has been set on the walls above a point near the middle of layer 18P, and a lower trench masking plug has then been set just above the bottom of layer 18P, then the tungsten coating has been etched away in the region exposed by the masks, then the masks have been removed (A17).

FIG. 246 depicts the results of a next subsequent step where the thick silicon-dioxide coating exposed by the gaps in the tungsten vertical mask has been etched away (A18).

FIG. 247 depicts the results of a next subsequent step where the exposed tops and bottoms of the tungsten and thick silicon-dioxide coatings are vertically etched away by such means as ion milling (A19).

FIG. 248 depicts the results of a next subsequent step where the exposed tungsten on the trench walls above the lower trench masking plug is selectively etched away (A20).

As an optional operation, FIG. 249 depicts the results of a next subsequent step where the right end of the thick silicon-dioxide tab shown (which extends out horizontally just above the top of the lower trench masking plug) has been etched off by exposure to vertical ion milling using the upper side wall coating of thick silicon-dioxide as a mask (A21). This would also lower the tops of the pillars and the center of the lower trench masking plug slightly (not illustrated in the schematic drawing).

FIG. 250 depicts the results of a next subsequent step where the lower trench masking plug has now been set to a height just below the middle of layer 7N (A22).

[A-5] A second conductive layer can be used to electrically connect direct contacts to a pillar surface with preexisting lower conductive layers along the sides of the vertical pillars, as an expeditious means of making wiring along the sides of the vertical pillars.

FIG. 251 depicts the results of a next subsequent step where a coating of tungsten is omni-directionally deposited over the exposed wafer surfaces by such means as CVD (A23).

FIG. 252 depicts the results of a next subsequent step where a coating of Parylene is omni-directionally deposited over the exposed wafer surfaces (A24).

FIG. 253 depicts the results of a next subsequent step where the exposed tops and bottoms of the aforementioned Parylene and tungsten coatings are vertically etched away by such means as ion milling (A25).

FIG. 254 depicts the results of a next subsequent step where the tungsten is etched back slightly beneath the overhang of the Parylene coating (A26).

FIG. 255 depicts the results of a next subsequent step where a lower trench masking plug is set at a new height at the middle of layer 18P (A28), and the tungsten coating the walls above the lower trench masking plug is selectively etched away. (The upper Parylene coating is etched down with the Parylene center plug. The lower Parylene coating becomes integrated into the lower trench masking plug.)

FIG. 256 depicts the results of a next subsequent step where the exposed thick silicon-dioxide coating on the trench walls above the Parylene lower trench masking plug is selectively etched away (A29).

[A-6] Along a wall of a vertical trench where a layer coated with an overhanging material wraps around below the overhanging material to make an "L," the space between the overhang and the material in the trench vertically below it may serve as a mask for a layer of material closer to the trench wall, if the horizontal extension of the "L" is etched back to expose this material closer to the trench wall.

FIG. 257 depicts the results of a next subsequent step where a thin coating of Parylene is omni-directionally deposited over the exposed wafer surfaces by such means as CVD, followed by a thick layer of tungsten being omni-directionally deposited over the exposed wafer surfaces by such means as CVD (A30).

FIG. 258 depicts the results of a next subsequent step where the exposed tops and bottoms of the aforementioned tungsten and Parylene are vertically etched away by such means as ion milling (A31).

FIG. 259 depicts the results of a next subsequent step where the exposed thin Parylene layer has been etched back so as to just expose a thin region of the polysilicon coating which covers the silicon-dioxide on the pillars (A32), and where the lower trench masking plug has been lowered slightly as a result of this same etching.

[A-7] This method may be used to isolate lower circuitry on a wired pillar from upper circuitry on the wired pillar.

FIG. 260 depicts the results of a next subsequent step where the exposed protective polysilicon layer has been etched back so as to just expose a thin region of the silicon-dioxide coating which covers the pillars (A33).

FIG. 261 depicts the results of a next subsequent step where silicon-dioxide is omni-directionally deposited over the exposed wafer surfaces by such means as CVD, so as to close out below the tungsten overhang (A34).

FIG. 262 depicts the results of a next subsequent step where the exposed tops and bottoms of the aforementioned silicon-dioxide are vertically etched away by such means as ion milling (A35).

FIG. 263 depicts the results of a next subsequent step where a non-reflowed lower trench masking plug of Parylene with a core of tungsten (as described in the aforementioned piston and sleeve discussion) is added above the prior reflowed lower trench masking plug, where its height is at the level where layers 18P and 19N meet. Then, a protective top cap of tungsten (or alternatively gold) is added in the manner of step LW5.4 (A36).

FIG. 264 depicts the results of a next subsequent step where the exposed silicon-dioxide on the trench walls above the lower trench masking plug is selectively etched away (A37).

FIG. 265 depicts the results of a next subsequent step where the Parylene height in the lower trench masking plug is etched down to expose the sides of the lower trench masking plug core, then the exposed tungsten on the trench walls above the lower trench masking plug, lower trench masking plug core, and (if used) in the top cap are selectively etched away. If gold was used for the top cap, it is also selectively etched away (A38).

FIG. 266 depicts the results of a next subsequent step where the exposed Parylene on the trench walls above the lower trench masking plug is selectively etched away, with a slight associated lowering of the Parylene in the lower trench masking plug (A39).

FIG. 267 depicts the results of a next subsequent step where the lower trench masking plug height is reset at a level just above the bottom of layer 20P (A40). The steps illustrated by FIGS. 267, 268 and 269 are optional; the thermal silicon-dioxide with the protective coat of polysilicon above the middle of layer 18P and the silicon-dioxide tab at the top of layer 20P can be left in place if it suits engineering preference.

FIG. 268 depicts the results of a next subsequent step where the exposed silicon and silicon-dioxide on the trench walls above the lower trench masking plug are selectively etched away (A41).

FIG. 269 depicts the results of a next subsequent step where the lower trench masking plug is selectively etched away (A42), as shown in FIGS. 270, 271 and 272 in accordance with AT1.

FIGS. 273, 274 and 275 depicts the results of a next subsequent step where a coating of silicon-dioxide is omni-directionally deposited over the exposed wafer surfaces by such means as CVD, then Parylene is omni-directionally deposited over the exposed wafer surfaces, so as to close out in the middle of the trench, then the exposed Parylene is selectively etched down to a preferred height for subsequent vertical masking at the level of the lower portion of layer 20P (if significant voids are present during this etch down process, a thin coating of Parylene may be intermittently deposited so as to reclose the trench as required, or other aforementioned void compensating techniques may be used), then the exposed silicon-dioxide on the trench walls above the Parylene is selectively etched away, leaving a protective insulative fill in the region of the previously exposed vertical wiring, as shown in FIGS. 273, 274 and 275 at AT2.

Caps

FIGS. 276 and 277 depict the results of a next subsequent step where silicon-nitride is omni-directionally deposited over the exposed wafer surfaces by such means as CVD (AT2.1C & AT2.1BA).

FIGS. 278 and 279 depict the results of a next subsequent step where the silicon-nitride coating the top of the wafer is etched down by such means as selective wet etch or omni-directional dry etch, so as to leave the various trenches capped with caps of preferred depth and uniform height at the tops of the pillars (AT2.2C & AT2.2BA), as shown in FIGS. 280, 281 and 282 at T3.

[T3-1] A walled trench may be opened for processing by removal of the primary fill material, followed by wet etch or omni-directional dry etch of the walls.

[T3-2] A walled trench with a center partition may be opened for processing by removal of the primary fill material, followed by wet etch or omni-directional dry etch of the walls and center partition.

FIGS. 283 and 284 depict the results of a next subsequent step where the exposed tops of the silicon-nitride caps are etched down by such means as wet etch or omni-directional dry etch, so as to remove the caps in the C trench, but leave the lower portions of the caps remaining in the B and A trenches (T3.1C & T3.1BA).

FIGS. 285 and 286 depict the results of a next subsequent step where all exposed Parylene is etched away (T3.2C & T3.2BA).

FIGS. 287 and 288 depict the results of a next subsequent step where the exposed silicon-nitride in the C trench is selectively etched away by wet etch or omni-directional dry etch, clearing the C trench, and some (but not all) of the silicon-nitride capping the B and A trenches is selectively etched away (T3.3C & T3.3BA), as shown in FIGS. 289, 290 and 291 in accordance with T3X. It should be noted here that in FIGS. 289 through 306, in contrast to previous and subsequent figures, the thermal silicon-dioxide layer and the polysilicon coating protecting it are represented separately by a thick black line and a white layer, respectively, and a tungsten layer is also represented separately by a white layer.

In the stylized cross-sections of FIGS. 294 to 306, this representation is applied to the structures at, and adjacent to, layer 19N only.

C Trench Side Etching

In the subsequent side etch-back steps, it is assumed that the aforementioned suggested ("such as") materials were used.

FIGS. 292, 293 and 294 depict the aforementioned step where the cross-section is lower in the trench as indicated by CS1A and B.

[CS-1] Where a pillar interstitial structure takes the form of a tube of approximately rectangular cross-section, and comprises a plurality of concentric layers of selectable filled-in materials, the outer layer of the tube which contacts the pillars may be partially etched away with an omni-directional etch, so as to leave narrowed sections of this outer layer material running vertically along the sides of each opposing pillar.

FIGS. 295, 296 and 297 depict the results of a next subsequent step where the outer layers of silicon-dioxide and tungsten in the C trench between the pillars are selectively etched away from the walls as shown at CS2A so as to undercut noticeably between the polysilicon protector and the silicon-dioxide of the interstices, as shown at CS2B. The silicon-dioxide depositions covering the tungsten are first etched. These silicon-dioxide bands are located at 4P, from 4P to 8P, and from 9N to 11N on the B-C exposed wall, and from 11N to 13N, from 14P to 18P, and at 18P on the A-C exposed wall. This omni-directional selective silicon-dioxide etch cuts into the silicon-dioxide fill of the B trench at the height from 16P to 17N and above 1 gN, and of the A trench at 5N to 6P and at 20P. However, this cutting is not sufficient to cause a problem. The selective tungsten etch is omni-directional and separates the wiring of opposing pillar walls. This etch has to be sufficiently long to completely clean out the tungsten structures running along the sides of the interstices marked CS1B in the prior FIG. 292 at the height of 4P of the B interstice. The width of the joint between the vertical tungsten wiring and the tungsten tab, controlled by the step at FIG. 198, determines how long and critical this tungsten etch will be. Nevertheless, it is beneficial if this tungsten etch leads to undercutting of the tungsten between the silicon-dioxide or polysilicon into the sides of the pillars by at least the thickness of the thickest tungsten layer.

In the aforementioned etching sequence, tungsten traces are left running up and down the middles of the pillar faces on either side of the A and B trenches to form vertical wiring.

[CS-2] Where a thin conductor is sandwiched between two adjacent vertical pillar-like structures (in this case where the aforementioned tube serves as one such pillar-like structure), this thin conductor can be horizontally etched back, so as to leave a narrowed vertically extending conductive trace between the middles of said vertical pillar-like structures.

FIGS. 298, 299 and 300 depict the results of a next subsequent step where the exposed polysilicon protector on the pillar walls and in the interstices between the pillars is selectively etched away, as shown at CS3A and CS3B, and then where tungsten in the interstices between the pillars is selectively etched back slightly so as to remove overhangs over the polysilicon protector, as shown at CS3B.

[CS-3] A gap between closely spaced adjacent vertical pillar-like structures can be filled with insulator, so as to insulate and chemically protect a narrower vertically extending conductive trace between the middles of the adjacent vertical pillar-like structures.

FIGS. 301, 302 and 303 depicts the results of a next subsequent step where a layer of silicon-dioxide is omni-directionally deposited over the exposed wafer surfaces by such means as CVD to a sufficient thickness to close out in the gaps previously created by the etch-back of the tungsten, as shown at CS4.

[CS-4] A material coating closely spaced adjacent pillars from the sides of these adjacent pillars can be etched off, so as to leave material only in the thin space between these adjacent pillars.

FIGS. 304, 305 and 306 depict the results of a next subsequent step where the unwanted exposed silicon-dioxide is selectively etched away sufficiently to clear the trench walls, etc., but not so much as to significantly side etch into the aforementioned closed-out regions shown at CS5.

[CS-5] The aforementioned method can be used to insulate and protect vertically extending circuit traces along the sides of pillars where the coated material is an insulator.

Caps

[CS-6] Caps of a first material can be replaced with caps of a second material, so as to provide caps of a different selectivity.

[CS-7] Caps of a plurality of materials can be created, so as to allow different selectivities when etching against the cap materials.

FIGS. 307 and 308 depict the results of a next subsequent step where the exposed silicon-nitride cap is selectively etched away (CS5.1C & CS5.1BA).

FIGS. 309 and 310 depict the results of a next subsequent step where Parylene is omni-directionally deposited over the exposed wafer surfaces, so as to close out all trenches (CS5.2C & CS5.2BA).

FIGS. 311 and 312 depict the results of a next subsequent step where the exposed upper surface of the Parylene is selectively vertically etched down to a height just above the insulative plugs in the B and A trenches, where either reflow or the aforementioned technique of redepositing additional Parylene intermittently during the etch down may be used for void control (CS5.3C & CS5.3BA).

FIGS. 313 and 314 depict the results of a next subsequent step where silicon-dioxide is omni-directionally deposited over the exposed wafer surfaces by such means as CVD, so as to close out the tops of the B and A trenches, but so as to leave the C trench gapped (CS5.4C & CS5.4BA).

FIGS. 315 and 316 depict the results of a next subsequent step where the upper surface silicon-dioxide is selectively omni-directionally etched back by such means as wet etch or omni-directional dry etch, so as to leave the B and A trenches capped, but so as to remove the silicon-dioxide from the tops of the C trenches (CS5.5C & CS5.5BA).

FIGS. 317 and 318 depict the results of a next subsequent step where the exposed upper surface of the Parylene (in the C trench) is selectively vertically etched down to a height just above the bottom of layer 20P, where either reflow or the aforementioned technique of redepositing additional Parylene intermittently during the etch down may be used for void control (CS5.6C & CS5.6BA).

FIGS. 319 and 320 depict the results of a next subsequent step where a thin coating of silicon-nitride is ommi-directionally deposited over the exposed wafer surfaces by such means as CVD (CS5.7C & CS5.7BA).

FIGS. 321 and 322 depict the results of a next subsequent step where the exposed tops and bottoms of the aforementioned silicon-nitride coating are vertically etched away by such means as ion milling, so as to leave a protective coating on the sides of the upper C trench walls which will protect the previously deposited thin Parylene sub-cap layer from side etching during subsequent selective Parylene etching (CS5.8C & CS5.8BA).

FIGS. 323 and 324 depict the results of a next subsequent step where the exposed Parylene (filling the C trench) is selectively etched away (CS5.9C & CS5.9BA).

FIGS. 325 and 326 depict the results of a next subsequent step where the silicon-nitride is selectively etched by such means as wet etch or omni-directional dry etch, so as to remove the silicon-nitride side wall protection layers at the tops of the C trenches (CS5.10C. & CS5.10BA), as shown in FIGS. 327, 328 and 329 at C1.

C Trench

[C-1] A vertical stack of a plurality of stacked materials can be created in a trench.

[C-2] Such a stack can be constructed by creation of a sequence of vertically stacked regions of finger-like structures.

[C-3] If such stacked structures are created in a trench hole, the stack can be fabricated with the same process sequence, but the fingers of the finger-like structures form concentric rather than elongated patterns.

[C-4] Isolated conductive links can be created by this method.

[C-5] Adjacent regions on a vertical pillar can be conductively connected by this method.

[C-6] Vertically connected regions on a vertical pillar can be insulated by this method.

[C-7] Vertically extending regions of the same height on adjacent columns can be electrically isolated by this method.

[C-8] Power distribution lines (busses) can be created by this method.

[C-9] Gridded power distribution lines can be created through use of the combination of the above conductive traces with conductive regions in intervening pillars.

[C-10] Power plane decoupling for spike reduction can be implemented by providing closely spaced power grids within an integrated circuit, so as to form a capacitor between the grids.

The following sequence schematically depicts the steps to create the aforementioned features, followed by a more detailed FIG. 353 below C2 which shows spatial relationships more clearly for reference:

FIG. 330 depicts the results of a next subsequent step where a layer of silicon-nitride is omni-directionally deposited over the exposed wafer surfaces (and on the exposed walls of the C trench) by such means as CVD (C1.1).

FIG. 331 depicts the results of a next subsequent step where a layer of Parylene is omni-directionally deposited over the exposed wafer surfaces (C 1.2).

FIG. 332 depicts the results of a next subsequent step where the exposed tops and bottoms of the aforementioned Parylene are vertically etched away by such means as ion milling (C1.3).

FIG. 333 depicts the results of a next subsequent step where tungsten is omni-directionally deposited over the exposed wafer surfaces by such means as CVD (C 1.4).

FIG. 334 depicts the results of a next subsequent step where Parylene is omni-directionally deposited over the exposed wafer surfaces, so as to close out in the middle of the C trench (C1.5).

FIG. 335 depicts the results of a next subsequent step where the exposed upper surface of the Parylene (in the C trench) is selectively vertically etched down to a height sufficiently above the bottom of layer 5N to accomplish the next steps, where the aforementioned techniques of reflow or redepositing additional Parylene intermittently during the etch down may be used for void control (C1.6). The height of the Parylene is chosen such that the subsequent structure (shown in FIG. 339-C1.10) has the appropriate height (shown in detail in FIG. 353-C2) to allow the silicon-nitride layer of the completed insulative plug shown in detail near the bottom of the C2 stack of FIG. 353 to end just above the bottom of layer 5N.

FIG. 336 (C1.7) depicts the results of a next subsequent step where the exposed tungsten on the trench walls above the Parylene is selectively etched away to the desired height.

FIG. 337 depicts the results of a next subsequent step where the exposed Parylene on the trench walls above the remaining tungsten feature is selectively etched away (with an associated indent in the Parylene in the center of the trench) (C1.8).

FIG. 338 depicts the results of a next subsequent step where the exposed silicon-nitride on the trench walls above the Parylene is selectively etched away to a height just above the bottom of layer 5N(C1.9).

FIG. 339 depicts the results of a next subsequent step where the exposed tungsten toward the center of the trench above the Parylene is selectively etched away sufficiently to recess it slightly in between the Parylene walls, as shown (C 1.10).

FIG. 340 depicts the results of a next subsequent step where the exposed Parylene between the trench walls above the silicon-nitride and tungsten is selectively etched away down to the height of the adjacent silicon-nitride and tungsten; then a recoating with Parylene is performed which closes out any overetch into the exposed Parylene below the A and B trench caps; followed by etch-back of the Parylene on the walls, tops and bottoms; thus completing an insulative plug which spans the C trench between the top of the silicon-dioxide plug on the bottom, and up to just above the bottom of layer 5N on the top (C1.11).

FIG. 341 depicts the results of a next subsequent step where a layer of tungsten is omni-directionally deposited over the exposed wafer surfaces (and on the exposed walls of the C trench) by such means as CVD (C1.12).

FIG. 342 depicts the results of a next subsequent step where a layer of Parylene is omni-directionally deposited over the exposed wafer surfaces (C1.13).

FIG. 343 depicts the results of a next subsequent step where the exposed tops and bottoms of the aforementioned Parylene are vertically etched away by such means as ion milling (C1.14).

FIG. 344 depicts the results of a next subsequent step where silicon-nitride is omni-directionally deposited over the exposed wafer surfaces by such means as CVD (C1.15).

FIG. 345 depicts the results of a next subsequent step where Parylene is omni-directionally deposited over the exposed wafer surfaces, so as to close out in the middle of the C trench (C1.16).

FIG. 234 346 depicts the results of a next subsequent step where the exposed upper surface of the Parylene (in the C trench) is selectively vertically etched down to a height sufficiently above the middle of layer 7N to accomplish the next steps, where the aforementioned techniques of reflow or redepositing additional Parylene intermittently during the etch down may be used for void control (C 1.17). The height of the Parylene is chosen such that the subsequent structure (shown in FIG. 350—C1.21) has the appropriate height (shown in detail in FIG. 353—C2) to allow the tungsten layer of the completed conductive plug shown in detail near the bottom of the C2 stack of FIG. 353 to end just above the middle of layer 7N.

FIG. 347 depicts the results of a next subsequent step where the exposed silicon-nitride on the trench walls above the Parylene is selectively etched away to the desired height.

FIG. 348 depicts the results of a next subsequent step where the exposed Parylene on the trench walls above the remaining silicon-nitride feature is selectively etched away (with an associated indent in the Parylene in the center of the trench) (C1.19).

FIG. 349 depicts the results of a next subsequent step where the exposed tungsten on the trench walls above the Parylene is selectively etched away to a height just above the middle of layer 7N(C1.20).

FIG. 350 depicts the results of a next subsequent step where the exposed silicon-nitride toward the center of the trench above the Parylene is selectively etched away sufficiently to recess it slightly in between the Parylene walls, as shown (C1.21).

FIG. 351 depicts the results of a next subsequent step where the exposed Parylene between the trench walls above the tungsten and silicon-nitride is selectively etched away down to the height of the adjacent tungsten and silicon-nitride; then a recoating with Parylene is performed which closes out any overetch into the exposed Parylene below the A and B trench caps; followed by etch-back of the Parylene on the walls, tops and bottoms; thus completing a conductive plug which spans the C trench between the top of the insulative plug on the bottom, and up to just above the middle of layer 7N on the top (C1.22).

The foregoing steps for creating insulative and conductive plugs are subsequently repeated twice more:

The next higher insulative plug is fabricated to run from just above the middle of layer 7N up to just above the bottom of layer 10P. The next higher conductive plug is fabricated to run from just above the bottom of layer 10P up to just above the middle of layer 12P.

The next higher insulative plug is fabricated to run from just above the middle of layer 12P up to just above the bottom of layer 15N. The next higher conductive plug is fabricated to run from just above the bottom of layer 15N up to just above the middle of layer 17N.

The foregoing steps for creating the insulative plug are subsequently repeated once more:

The next higher insulative plug (the highest) is fabricated to run from just above the middle of layer 17N up to past the bottom of layer 19N, with the first silicon-nitride coating being potentially somewhat thicker, as desired, followed by the middle Parylene and tungsten layers being fully etched away.

This entire repetitive step sequence for creating the aforementioned four insulative and three conductive elongated trench plugs which run the length of the C trench results in the stack of plugs shown in greater detail in cross-section as C2 of FIGS. 352, 353 and 354.

The uppermost silicon-nitride plug shown in C2 can alternatively be fabricated using the same step sequence used for the silicon-dioxide lower bit line insulation plugs (the first structures created at the bottom of the C trench), which would result in the rise shown in the middle of this plug at C2, rather than a flat surface in the middle of this plug.

[C-11] A multi-material cap can be removed to gain access to the structures below.

FIGS. 355 and 356 depict the results of a next subsequent step where a thin coating of Parylene is omni-directionally deposited over the exposed wafer surfaces (C2.1C & C2.1BA).

FIGS. 357 and 358 depict the results of a next subsequent step where the exposed tops and bottoms of the aforementioned Parylene coating are vertically etched away by such means as ion milling, leaving protective side wall coating at the top of the C trench for the subsequent processing step (C2.2C & C2.2BA).

FIGS. 359 and 360 depict the results of a next subsequent step where the upper surface silicon-dioxide is selectively vertically etched down by such means as wet etch or omni-directional dry etch, so as to remove the silicon-dioxide caps above the Parylene in the B and A trenches (C2.3C & C2.3BA).

FIGS. 361 and 362 depict the results of a next subsequent step where the exposed Parylene coating the upper surfaces is etched away, thus removing the silicon-dioxide over Parylene caps in the B and A trenches (C2.4C & C2.4BA), as shown in FIGS. 363, 364 and 365 at C3.

[C-12] A trench or trench hole of intermediate width can be protectively capped with a selective material while leaving trenches of greater and lesser width open.

[C-13] Such a cap can be fabricated by creation of a center partition in a trench or trench hole which is of intermediate width compared to other wider and narrower trenches on a wafer, as a means of causing this intermediate trench's (or trench hole's) early closure with a subsequent deposition which closes out.

FIGS. 366 and 367 depict the results of a next subsequent step where a thick Parylene coating is omni-directionally deposited over the exposed wafer surfaces so that only the A trench closes out (C3.1C & C3.1BA).

FIGS. 368 and 369 depict the results of a next subsequent step where the aforementioned thick Parylene coating is selectively etched back so as to leave a plug in the top of the A trench with the B and C trenches cleared (C3.2C & C3.2BA).

FIGS. 370 and 371 depict the results of a next subsequent step where silicon-dioxide is omni-directionally deposited over the exposed wafer surfaces by such means as CVD, so as to close out at the top of the B trench, but so as to leave the C trench gapped (C3.3C & C3.3BA).

FIGS. 372 and 373 depict the results of a next subsequent step where the layer of silicon-dioxide coating the exposed surfaces is etched back one layer thickness, so as to clear the silicon-dioxide from all surfaces except where a plug of silicon-dioxide is closed out at the top of the B trench (C3.4C & C3.4BA).

FIGS. 374 and 375 depict the results of a next subsequent step where the upper exposed Parylene is etched away, leaving the aforementioned silicon-dioxide plug at the top of the B trench (C3.5C & C3.5BA), as shown in FIGS. 376, 377 and 378 at T4.

Upper Word Lines

[UW-1A] Where a first vertically extending selectable material is vertically sandwiched between walls of a second vertically extending selectable material, the first selectable material can be etched down so as to expose the walls of the second selectable material, followed by the multi-directional etching of the second selectable material to a preferred height, as indexed by the height of the first selectable material.

FIGS. 379 and 380 depict the results of a next subsequent step where a tungsten is omni-directionally deposited by such means as CVD so as to leave a thin protective coating over the A and C trench exposed surfaces (T4. IC and T4.1BA).

FIGS. 381 and 382 depict the results of a next subsequent step where the tops and bottoms of aforementioned tungsten coating are vertically etched away by such means as ion milling (T4.2C and T4.2BA).

FIGS. 383 and 384 depict the results of a next subsequent step where the now exposed Parylene in the A trench is selectively etched down to a height just above the bottom of layer 19N, as shown in greater detail in subsequent FIG. 391 (UW2), so as to allow the subsequent silicon-dioxide side etch in the A trench to end up at the appropriate height (T4.3C and T4.3BA).

FIGS. 385 and 386 depict the results of a next subsequent step where the aforementioned silicon-dioxide side etch is now performed by omni-directional etch techniques, so that the thick silicon-dioxide coating the walls of the A trench now reaches up to just above the bottom of layer 19N (T4.4C and T4.4BA). This is shown in greater detail in subsequent FIG. 391 (UW2).

FIGS. 387 and 388 depict the results of a next subsequent step where the tungsten protective coating on the upper trench walls is selectively etched away (T4.5C and T4.5BA). The results of this step are shown in greater detail in FIG. 389, FIG. 390 and FIG. 391 (UW2).

The following steps create upper word lines in a manner similar to the aforementioned creation of the lower word lines, using similar steps and materials.

In the following steps, a pillar side wall protector is formed in the A trench, by deposition of an alternate selectable material which closes together in the first axis, followed by etching back a remaining gap in the second axis. Parylene is used as a pillar side wall protector by filling trenches with it in a single trench axis.

In the manner shown previously in FIGS. 18, 19 and 20 (LB4), in a next subsequent step a coating of Parylene is deposited sufficiently to close out the A trench, but so as to leave the C trenches gapped. (The B trenches in this case are capped.)

In the manner shown previously in FIG. 21 at (LB4.1C), in a next subsequent step the Parylene coating the C trenches is etched back, in this case exposing the walls of the C trenches, while leaving the A trenches filled with Parylene between the pillars in a shape where the A trench pillar walls are coated with the Parylene. (The pillars are bridged together with Parylene across the A trench.) (The B trenches remain capped.)

[UW-1B] It is possible to recess the conductive gate layer of a vertical gate on a vertical transistor so as to recess it from the edges of the underlying gate insulator.

[UW-1C] It is possible to form an access window to a conductor within an insulative coating on the sides of a vertical surface in an integrated circuit, where edges of this access window extend vertically and are displaced horizontally on the vertical surface.

A layer of a selectable material such as gold is directionally deposited by such means as directional evaporation from a point source or collimated sputtering vertically down so as to primarily coat the silicon-nitride at the bottom of the C trenches. The unwanted minor extra coating on the trench walls is selectively etched back, leaving a protective coating of gold over the silicon-nitride C trench plugs. The Parylene etch-back of the prior step should be sufficient to allow this gold coating to protect the silicon-nitride plug in subsequent partition fabrication and removal steps, so that the silicon-nitride will not be etched away along the pillar walls where short circuits could be created by subsequently deposited conductive material.

Parylene is then deposited to close out the C trenches, reflowed as required, then etched back down to expose the tops of the pillars and B trench caps. This upper gold on the tops of the pillars and B trench caps (i.e. any gold that is not acting as the protective coating to be left in the C trenches above the junction of layers 18P and 19N) is then selectively etched away. The remaining lower gold becomes a selectable protective coating of the plugs in the C trenches. The Parylene is then etched down so as to expose these gold protectors in each C trench.

FIGS. 392, 393 and 394 depict the results of a next subsequent step where a coating of Parylene is deposited sufficiently to close out the A trench, but so as to leave the C trenches gapped (UW2.1H, C and BA). (The B trenches in this case are capped.)

FIGS. 395, 396 and 397 depict the results of a next subsequent step where the Parylene coating the C trenches is etched back so that the remaining Parylene in the A trench covers central regions of the sides of the pillars in the A trench at the height of layer 19N (UW2.2H, C and BA), so as to allow performance of the following steps. This Parylene structure extends above the top of the polysilicon coated silicon-dioxide gate material which extends above the top of layer 19N. (The B trenches remain capped.)

FIGS. 398, 399 and 400 depict the results of a next subsequent step where the thin polysilicon layer protectively coating the silicon-dioxide gate material on the walls of the A trench in the region of layer 19N is selectively etched away (UW2.3H, C and BA).

FIGS. 401, 402 and 403 depict the results of a next subsequent step where the Parylene covering the gate material in the A trenches is selectively omni-directionally etched back a little further (UW2.4H, C and BA) to permit accomplishing the subsequent steps.

FIGS. 404, 405 and 406 depict the results of a next subsequent step where a layer of silicon-dioxide has been omni-directionally deposited over the exposed surfaces in a manner where this silicon-dioxide overlaps the polysilicon layer over the thermal silicon-dioxide in the middle of the A trench, where this layer will subsequently define the gate for the field effect transistor of layers 18P-19N-20P (UW2.5H, C and BA).

FIGS. 407, 408 and 409 depict the results of a next subsequent step where the tops and bottoms of the just applied silicon-dioxide layer are vertically etched away by such means as ion milling (UW2.6H, C and BA).

FIGS. 410, 411 and 412 depict the results of a next subsequent step where a layer of tungsten has been omni-directionally deposited over the exposed surfaces (UW2.7H, C and BA).

FIGS. 413, 414 and 415 depict the results of a next subsequent step where the tops and bottoms of the just applied tungsten layer are vertically etched away by such means as ion milling (UW2.8H, C and BA).

FIGS. 416, 417 and 418 depict the results of a next subsequent step where the Parylene covering the gate material in the middle of the A trench is selectively etched away (UW2.9H, C and BA). This leaves a gap between the silicon-dioxide walls in the middle of the A trench. This gap is not clearly shown in the schematic depiction of the figure, but it should exist to allow accomplishment of the next step.

FIGS. 419, 420 and 421 depict the results of a next subsequent step where the silicon-dioxide walls in the middle of the A trench are selectively etched back, so as to leave a layer of silicon-dioxide overlapping the edges of what are to become the gate regions on the walls of the A trench over layer 19N (UW2.10H, C and BA).

FIGS. 422, 423 and 424 depict the results of a next subsequent step where the tungsten coating the exposed upper trench walls is selectively etched away, leaving the silicon-dioxide coating over the upper trench walls and the edges of the regions in the centers of the A trench which are to become gates, but not over the polysilicon protective coating in the middle of these regions which are to become gates (UW2.11H, C and BA).

FIGS. 425 and 426 depict the results of a next subsequent step where a coating of Parylene is deposited sufficiently thick to close out all trenches and reflowed as required (UW2.12C and BA).

FIGS. 427 and 428 depict the results of a next subsequent step where the Parylene is selectively etched down to a height above the polysilicon protective coating of the structures on the walls of the A trench which are to become gates, above the tops of layer 19N, and then the silicon-dioxide coating the trench walls above the Parylene tops is selectively etched away (UW2.13C and BA). The cusps in the Parylene surface of FIGS. 425 and 426 define the centers from which the substantially circular Parylene etch fronts propagate, and locations of these cusps are indicated by small crosses in subsequent figures which show Parylene surfaces centered on them. If the steps illustrated by FIGS. 267, 268 and 269 have been omitted, then the steps illustrated in this figure are also omitted.

FIGS. 429 and 430 depict the results of a next subsequent step where the Parylene is selectively etched down to a height in the A trench just above the top of layer 19N, and then the exposed polysilicon protector coating the A trench walls above the Parylene top is selectively etched away (UW2.14C and BA). If the steps illustrated by FIGS. 267, 268 and 269 have been omitted, then the exposed walls of the A and C trenches remain coated to the top by silicon-dioxide.

FIGS. 431 and 432 depict the results of a next subsequent step where the Parylene in the trenches is selectively etched down so as to clear the C trench, at about the height of the interface between layers 18P and 19N (UW2.15C and BA).

In the manner shown previously in FIGS. 18, 19 and 20 (LB4), in a next subsequent step a coating of Parylene is deposited sufficiently to close out the A trench, but so as to leave the C trenches gapped. (The B trenches in this case are capped.)

In the manner shown previously in FIG. 21 at (LB4.1C), in a next subsequent step the Parylene coating the C trenches is etched back, in this case exposing the walls of the C trenches, while leaving the A trenches filled with Parylene. (The B trenches remain capped.)

In the following steps, center partitions are created in the middle of the C trenches without use of photolithography. These center partitions are created by coating the sides of a trench with a highly selectable material, filling the interstice with partition material, then removing the aforementioned highly selectable material on the sides of the partitions. Parylene is a preferred highly selectable material for the sides of such partitions.

In the manner shown previously in FIG. 72 (LB10.1), in a next subsequent step Parylene is deposited on the walls of the trenches above the aforementioned insulative plugs.

In the manner shown previously in FIG. 73 (LB10.2), in a next subsequent step the tops and bottoms of the Parylene coating are vertically etched away by such means as ion milling.

In the manner shown previously in FIG. 74 (LB10.3), in a next subsequent step the centers of the protectively coated insulative plugs are etched down slightly, so as to create recesses to add support to the center partitions which will be subsequently formed. This can be done here and in the previous example by vertical etching by such means as ion milling or selective reactive ion etching. If the gold protective coating is thick enough, then the recess need not penetrate through to the silicon-nitride below, leaving the silicon-nitride plug unchanged as shown in subsequent figures. Alternatively, the recess can extend down into the silicon-nitride for better support.

In the manner shown previously in FIG. 75 (LB10.4), in a next subsequent step an omni-directional CVD coating of silicon-nitride is deposited so as to close out the C trenches.

In the manner shown previously in FIG. 76 (LB10.5), in a next subsequent step the top of this silicon-nitride coating is etched off by such means as wet etch or omni-directional dry etch.

In the manner shown previously in FIG. 77 (LB10.6), in a next subsequent step the Parylene lining the walls is etched away, leaving the desired center partitions of silicon-nitride in the middle of the C trenches, in the manner further shown in FIGS. 78, 79 and 80 as LW1B, where the aforementioned recesses are shown as LW1A. However, in this case, the partitions are made shorter and based much higher.

In the following steps, a center partition is used to cause a wide trench to close out before narrower trenches. Trenches which are narrower and wider are thus caused to close out while leaving trenches of an intermediate size open.

In the manner shown previously in FIGS. 81, 82 and 83 (LW2), in a next subsequent step Parylene is deposited sufficiently to close out the C trench, while leaving the A trenches gapped. (The B trenches remain capped.)

In the following steps, a material coating the sides of a center partition in a vertical trench is etched back at intermittent locations in the horizontal axis without use of photolithography, so as to expose intermittent portions of the sides of the center partition.

In the manner shown previously for the B trench in FIGS. 84, 85 and 86 (LW3), in a next subsequent step the Parylene is etched back on the top and sides and bottom of the gapped A trenches, so as to expose portions of the sides of the center partitions crossing the A trenches and the walls of the A trenches.

In the following steps, the center partitions crossing otherwise continuous trenches may be etched away, so as to make the A trenches continuous.

In the manner shown previously in FIGS. 87, 88 and 89 (LW4), in a next subsequent step the silicon-nitride partition segments crossing the A trenches, where these silicon-nitride partition segments were exposed in the prior step, are now etched away from the sides by selective wet etch or omni-directional dry etch.

In the following steps, a conductor is deposited along vertical trench walls above insulative material in a trench, this deposition of conductor being followed by etching away of the tops and bottoms of the conductor, thereby allowing the deposited conductor to form pairs of conductive traces.

In the manner shown previously in FIG. 105 (LW6.1), in a next subsequent step a conductor such as tungsten is omni-directionally deposited over the exposed wafer surfaces by such means as CVD.

In the manner shown previously in FIG. 106 (LW6.2), in a next subsequent step the exposed tops and bottoms of the aforementioned conductor are vertically etched away by such means as ion milling.

In the manner shown previously in FIG. 107 (LW6.3), in a next subsequent step Parylene is onmi-directionally deposited over the exposed wafer surfaces by such means as CVD so as to close out.

In the manner shown previously in FIG. 108 (LW6.4), in a next subsequent step the exposed Parylene is selectively etched down to a preferred height for subsequent vertical masking to create the word line feature height shown in FIGS. 433, 434 and 435 at UW3. (Void control techniques are applicable). Note that the height of the word lines to be subsequently formed, which is determined by this preferred height, needs to be below the upper limit of the polysilicon gate coating which extends just above the bottom of layer 20P.

In the following steps, continuous horizontal conductive lines (circuit traces) in the A trench are created by etch-back of the upper portion of the aforementioned conductor by onmi-directional wet etch or dry etch of the sides of the conductor above a lower trench masking plug. Control lines for FET gates and word lines for a memory are thus created in the A trench by this method.

In the manner shown previously in FIG. 109 (LW6.5), in a next subsequent step the exposed conductor on the trench walls above the Parylene is selectively etched away, leaving word lines.

The vertical trench masking plug of Parylene may be left as an insulator between the two word lines. In this case however, this plug and the C trench silicon-nitride partition are removed as follows:

In the manner similar to that shown previously in FIG. 110 (LW6.6), in a next subsequent step the exposed Parylene and exposed silicon-nitride are incrementally sequentially selectively etched down (alternately selectively etched a little at a time) to the height of the bottom of the word lines, as shown in FIGS. 433, 434 and 435 where UW3 depicts the polysilicon and tungsten word lines, which extend along the bottom of the A trenches between just below the top of layer 18P and just above the bottom of layer 20P. (The tungsten continuation is slightly less tall than the polysilicon.)

The directionally deposited protective coating applied earlier (gold was recommended) which was protecting the silicon-nitride in the C trench is now selectively etched away.

As a result of the foregoing steps, groups of conductive upper word lines are constructed in the A trenches, these word lines extending in a horizontal plane.

[UW-2] Conductive traces on the opposing sides of a trench can be insulated by omni-directional deposition of an insulator which fills the region between them so as to fold together (close out) first between these conductive traces, and then above them, followed by etching this insulator back to a preferred height so that a remaining upper portion of this insulator serves as an insulative cap.

[UW-3] Trenches of multiple widths can be filled by deposition of a selectable material which folds together in or above the trenches, followed by etching said selectable material back to a preferred height.

FIGS. 436 and 437 depict the results of a next subsequent step where Parylene is omni-directionally deposited over the exposed wafer surfaces, so as to close out in the C and A trenches (UW3.1C & UW3.1BA).

FIGS. 438 and 439 depict the results of a next subsequent step where the exposed tops of the aforementioned Parylene are vertically etched away by such means as ion milling, down to the height of the top of the silicon-dioxide cap in the B trench, so as to expose this silicon-dioxide cap (UW3.2C & UW3.2BA).

FIGS. 440 and 441 depict the results of a next subsequent step where the exposed silicon-dioxide cap is selectively etched away (UW3.3C & UW3.3BA).

FIGS. 442 and 443 depict the results of a next subsequent step where the exposed Parylene is selectively etched away, down to the approximate height of the Parylene portion of the insulative fill set at UW1 (i.e. just above the bottom of layer 19N) for the Parylene remaining in the A and B trenches (UW3.4C & UW3.4BA).

FIGS. 444 and 445 depict the results of a next subsequent step where Parylene is omni-directionally deposited over the exposed wafer surfaces, so as to close out all trenches (UW3.5C & UW3.5BA).

FIGS. 446 and 447 depict the results of a next subsequent step where the exposed upper surface of the Parylene (in the A trench) is selectively vertically etched down to a height around the middle of layer 20P which is sufficiently high so as to allow the B trench, as well as the other trenches, to remain capped with Parylene (void control is appropriate) (UW3.6C & UW3.6BA), as shown in FIGS. 448, 449 and 450 in accordance with UW4. If the steps illustrated by FIGS. 267, 268 and 269 have been omitted, then the Parylene etch is followed by an omni-directional, selective silicon-dioxide etch to clear the walls of the A and C trenches.

[UW-4] Thus, groups of conductive word lines on horizontal planes can be constructed for a memory at multiple vertical levels without the use of photolithography.

Upper Bit Lines

[UB-1] Groups of conductive bit lines on horizontal planes can be constructed for a memory at multiple vertical levels without the use of photolithography.

FIGS. 451 and 452 depict the results of a next subsequent step where a moderately thick coating of tungsten is omni-directionally deposited over the exposed wafer surfaces, so as to close out the B and A trenches, but so as to leave the C trench gapped (UW4.1C & UW4.1BA).

FIGS. 453 and 454 depict the results of a next subsequent step where the exposed tops and bottoms of the aforementioned tungsten coating are vertically etched away by such means as ion milling, so as to separate bit lines along opposing sides of the C trenches, but so as to leave the B and A trench interstices between pillars closed (UW4.2C & UW4.2BA).

FIGS. 455, 456 and 457 depict the results of the preceding step where UBI indicates the aforementioned bit lines, and the overall FIGS. 455, 456 and 457 depict a cell and surrounding region of the completed SRAM circuit.

Completed Structures

As shown in the foregoing process step sequence:

[UB-2] Multiple layers of horizontal circuit traces in an integrated circuit can be created without the use of photolithography.

[UB-3] These multiple layers of horizontal circuit traces can be fabricated so as to extend in multiple horizontal directions.

[UB-4] An integrated circuit can be wired in both horizontal and vertical directions without use of photolithographic masks which have the pattern of this wiring.

[UB-5] An integrated circuit which includes a plurality of transistors can be constructed on a pillar which is of continuous single-crystalline structure.

[UB-6] An integrated circuit comprising multiple transistors which is constructed of components stacked vertically on continuous crystalline pillars can be wired with both multiple vertical and multiple horizontal conductive traces. This can be done without photolithography.

[UB-7] A portion of an integrated circuit comprising multiple transistors can be stacked on single-crystalline pillars, with multiple vertical interconnections between said transistors and multiple horizontal interconnections between transistors of adjacent pillars, so as to make a complex three-dimensional integrated multi-transistor circuit.

[UB-8] A complex three-dimensional integrated circuit can be constructed of groups of components which include multiple transistors whose alternately doped regions are made from continuous crystal, these multiple transistors being arranged in a first axis, this first axis extending into a first dimension, where these components are interconnected by conductive circuitry extending in a plurality of axes, said plurality of axes extending into second and third dimensions.

It will be apparent upon inspection of FIG. 2 that the lower structure (from layers 10P through 2P) extending below layer 11N, and the upper structure (from layers 12P through 20P) extending above layer 11N, are in fact the same structure wiring pattern, where the upward extending wiring pattern is the reverse image of the downward extending wiring pattern, these extensions being symmetrical in pattern.

[SCHM-1] As shown in FIGS. 2 and 455, 456 and 457 and the aforementioned fabrication step sequence, it is possible to construct a microelectronic integrated circuit where a wired vertical structure comprising at least a plurality of semiconductor devices embodies a portion (one-half in this case) of the complete circuit (such as the circuit of a memory cell), and where a plurality (two in this case) of such structures placed in close proximity (adjacent in this case) to one another are interconnected so as to create the complete circuit (as shown connected end-to-end in this example).

IV. PILLAR MASKING TECHNIQUES

Masks for making pillars below the lithographic limit can be created by making groups of lines in two orthogonal axes as follows:

[GRILL-1] An integrated circuit fabrication mask made up of groups of three equally spaced adjacent lines can be created without use of a photolithographic mask of these lines.

[GRILL-2] These groups of equally spaced adjacent lines can be fabricated with each group occurring in one of a plurality of parallel trenches.

[GRILL-3] Groups of three equally spaced adjacent lines can be created between prior existing groups of three equally spaced adjacent lines, all created without a photolithographic mask of any of these equally spaced adjacent lines.

[GRILL-4] Regular repetitions of etched trench and raised portions can be converted to higher spatial frequency repetitions of six trenches and raised portions for each prior trench and raised portion, without use of an intermediate photolithographic step.

[GRILL-5] Iterations of this process can allow repetitive line spacing division of parallel lines by six, in less than 18 deposition or etch steps per divide by six iteration.

[GRILL-6] These lines may be used as an integrated circuit fabrication mask.

[GRILL-7] Alternatively, by not varying or varying the sidewall deposition thicknesses in the sequence preferred, these mask lines may be fabricated with equal widths, or with unequal widths so as to make resulting lines of variable (such as alternating) widths, for example.

[GRILL-8] Substrates may be etched from such mask technology so as to form pillars in the substrate at dimensions smaller than the minimum photolithographic feature size used.

[GRILL-9] Parylene may be used as a subsequently easily removable (selectable) material when fabricating the open regions of such a mask.

FIG. 458 depicts a side cross-sectional view of a trench which has been anisotropically etched in Parylene by ion milling, using a subsequently selectively removed silicon-dioxide mask above the Parylene, where this silicon-dioxide mask in turn was etched from a photoresist pattern which was created by conventional photolithographic techniques. This Parylene coating may be deposited over a silicon substrate which is subsequently to be masked and patterned.

FIG. 459 depicts a next subsequent step where the trench has been omni-directionally coated by CVD with a layer of silicon-dioxide.

FIG. 460 depicts a next subsequent step where the silicon-dioxide layer has been omni-directionally coated with a layer of Parylene.

FIG. 461 depicts a next subsequent step where the exposed tops and bottoms of the aforementioned Parylene coating have been vertically etched away by such means as ion milling.

FIG. 462 depicts a next subsequent step where a layer of silicon-dioxide has been omni-directionally deposited by CVD so as to close out between the adjacent silicon layers.

FIG. 463 depicts a next subsequent step where the exposed upper interconnecting portion of the silicon-dioxide coating has been etched away by selective etching means such as wet etch or omni-directional dry etch (or optionally by ion milling).

FIG. 464 depicts a next subsequent step where the now exposed Parylene has been etched down by oxygen omni-directional dry etch, followed by a brief additional ion milling (which also lowers the silicon-dioxide) to drop the Parylene level below the bottom of the silicon-dioxide by the thickness of the lower (horizontal) silicon-dioxide layer.

FIG. 465 depicts a next subsequent step where a layer of Parylene has been omni-directionally deposited over the exposed surfaces, so as to close out between the upward extending silicon-dioxide fingers.

(The next step can be preceded or followed by a brief reflow of the Parylene to reduce or remove voids, provided that this step is not long enough to substantially distort the silicon-dioxide structures.)

FIG. 466 depicts a next subsequent step where a layer of silicon-dioxide has been omni-directionally deposited by CVD over the exposed surfaces.

FIG. 467 depicts a next subsequent step where a layer of Parylene has been omni-directionally deposited over the exposed surfaces.

FIG. 468 depicts a next subsequent step where the exposed tops and bottoms of the aforementioned Parylene layer have been vertically etched away by ion milling.

FIG. 469 depicts a next subsequent step where a coating of silicon-dioxide has been omni-directionally deposited by CVD over the exposed surfaces, so as to close out in the remaining gaps.

FIG. 470 depicts a next subsequent step where the exposed upper interconnecting portion of the silicon-dioxide coating has been etched away by selective etching means such as wet etch or omni-directional dry etch. (Ion milling could be used for a similar result.)

FIG. 471 depicts a next subsequent step where the now exposed Parylene has been etched down by oxygen omni-directional dry etch. This step can be preceded by a brief reflow of the Parylene to reduce or remove voids, provided that this step is not long enough to substantially distort the silicon-dioxide structures.

FIG. 472 depicts a next subsequent step where the exposed lower interconnecting portions of the silicon-dioxide have been vertically etched away by such means as ion milling.

FIG. 473 depicts a next subsequent step where the region below the silicon-dioxide mask has been vertically etched by such means as ion milling.

(At this point, the silicon-dioxide mask may be used to etch the lower silicon substrate to a preferred depth by such means as ion milling.)

FIG. 474 depicts a next subsequent step where the silicon-dioxide and Parylene have been selectively etched away so as to leave a pattern in the lower material (such as silicon) which is similar to the starting pattern, but at a much higher spatial frequency. This pattern in the lower material can be etched deeply enough to form one axis of a pattern of pillars.

In the aforementioned sequence, other materials such as silicon can be substituted for the Parylene, as long as they can be selectively etched against the alternate material. Other materials can also be substituted for the silicon-dioxide as long as they can be selected against the alternate material. Void control techniques mentioned earlier are appropriate.

Anomalies in photolithographically formed trench widths are reflected in the formed shapes of the closed-out grill partitions at the middle of the photolithographically formed trench locations, in the manner of the center partition structures described subsequently in the middles of the ribbon groups.

Substrates may be etched from such mask technology so as to form pillars in the substrate at dimensions smaller than the minimum photolithographic feature size used, as follows: Substrates (silicon, for example) are etched from selectable masks (of silicon-dioxide, for example) made up of a first such group of mask lines which extend in a first planar axis, so as to create trenches. These mask lines are then removed by selective etching against the substrate. The resulting trenches in the substrate are then closed out by omni-directional deposition of a material (tungsten, for example) which may be subsequently selected against the substrate. The tops of this subsequently selectable material are then etched down so as to expose the tops of the upward extending wall-like partitions of the substrate which exist between the closed-out material portions (the features between the trenches). A new deposition of the original type material in which the original photolithographically formed trenches were etched (Parylene, for example, with silicon-dioxide and photoresist on top) is then deposited over the existing surface. Masks made up of a second such group of lines running in a second planar axis orthogonal to the first such line group axis are then formed in the same manner as the first such group of lines. The substrate material (silicon, in this example) is again etched so as to now create orthogonal intersecting trenches which enclose pillars (between trenches on four sides of each such pillar), these pillars being able to be fabricated at a smaller size than the minimum feature size used in the photolithographic steps.

[RIBBON-GROUPS-1] Multiple groups of horizontal lines of like trench and raised portion spacing (partition ribbon groups) running adjacent and approximately parallel to opposing vertical walls of a trench can be fabricated without use of a photolithographic mask, these line groups being separated from each other by a filler region between them of potentially different dimensions, so that the minimum to maximum width variation of this filler region fills the nonuniformity spacing difference between the walls of the trench.

[RIBBON-GROUPS-2] These lines may be used as an integrated circuit fabrication mask.

[RIBBON-GROUPS-3] Alternatively, by not varying or varying the sidewall deposition thicknesses in the sequence preferred, these mask lines may be fabricated with equal widths, or with unequal widths so as to make alternating width resulting lines, for example.

[RIBBON-GROUPS-4] Substrates may be etched from such mask technology so as to form pillars in the substrate at dimensions smaller than the minimum photolithographic feature size used.

[RIBBON-GROUPS-5] Parylene may be used as a subsequently easily removable (selectable) material when fabricating the open regions of such a mask.

FIG. 475 represents a top view and FIG. 476 represents a cross-sectional side view taken between the points X1101–X1102 of a completed example of a ribbon group integrated circuit mask. This mask comprises a group of silicon-dioxide ribbon-like partitions of like width, such as 1104, with a center silicon-dioxide partition of varying width 1103, all located above an etchable substrate of silicon or other suitable material. This mask structure may be fabricated as follows:

A layer of Parylene is deposited over a substrate to a depth equal to the height of the silicon-dioxide partitions shown.

An anisotropic trench is etched in the Parylene layer to the depth of the silicon by such means as ion milling from a conventional ion milling mask. The width of this trench is equal to the distance between the outlying walls of the most outlying silicon-dioxide partitions shown in the figures. When this type of trench is fabricated with small dimensions which approach the resolution limit of the photolithographic process being used, the edge straightness will not be completely controllable because of the limits of photolithographic resolution. For reasons such as this, the trench may not be of perfectly uniform width. Such a varying trench width is represented in FIGS. 475 and 476 by the exaggerated waviness of the lines (such as 1104) shown (exaggerated for clarity). To the degree that the original trench walls are wavy or otherwise anomalous, then the subsequently formed center region 1103 will also be wavy or otherwise anomalous.

A layer of silicon-dioxide is then omni-directionally deposited by such means as CVD at a thickness equal to that of the outlying partitions shown.

The exposed tops and bottoms of this silicon-dioxide layer are then vertically etched away by such means as ion milling.

A layer of Parylene is then omni-directionally deposited over the exposed surfaces to a desired unmasked region thickness.

The exposed tops and bottoms of this Parylene layer are then vertically etched away by such means as ion milling.

Subsequent alternating silicon-dioxide and Parylene layers are then deposited and ion milled in a repetition of the foregoing four steps until the middle gap region is reached.

The middle gap is then filled with an omni-directional CVD deposition of silicon-dioxide so as to close out.

The exposed upper surface of this silicon-dioxide deposition is then etched down by such means as ion milling, omni-directional dry etch or wet etch so as to expose the tops of all the interstitial upward extending Parylene fingers.

These Parylene fingers are then etched down and away so as to expose the underlying silicon, thus leaving the remaining silicon-dioxide partitions as a mask, completing the sequence.

In the aforementioned sequence, other materials such as silicon can be substituted for the Parylene, as long as they can be selectively etched against the alternate material. Other materials can also be substituted for the silicon-dioxide as long as they can be selected against the alternate material.

Substrates may be etched from such mask technology so as to form pillars in the substrate at dimensions smaller than the minimum photolithographic feature size used in accordance with the orthogonal masking technique described in the aforementioned discussion of divide-by-six grill masks.

V. PERIPHERY

When pillar structures have been fabricated on a pitch which is at or above the available lithographic limit, then conventional lithographic interconnection means can be used to link to the various structures as desired. When connecting to higher and lower structures of the cell array, conventional V etch techniques which expose continuous features at various heights with horizontal displacement proportional to the angle of the "V" are probably the most convenient historical technique to align continuous feature ends with planar interconnection points.

In the following step sequence, many new capabilities are provided for interconnecting and accessing circuitry formed below the photolithographic limit to conventional circuitry formed at or above the photolithographic limit.

Per

As subsequently described, it is possible to provide two patterns in a masking layer of an integrated circuit wafer by photolithographic image transfer, where the first pattern provides a first set of reference locations for elongated structures with spacings and widths below the photolithographic limit, and a second pattern which serves as a primary second reference location for the core of a wall, which in turn serves as a reference location for the end of the elongated structures and for via structures.

As subsequently described, it is possible to provide a set of parallel, elongated structures submerged below the surface of the wafer, with widths and spacings below the photolithographic limit and aligned with the first set of reference locations, where the submerged structures consist of at least an insulated conductive trace each, the ends of which are determined in relation to the second reference location.

As subsequently described, it is possible to provide a set of second reference locations derived from the primary second reference location by increasing the thickness of a wall, built upon the core located at the primary second reference location, in steps of well controlled thicknesses, where the locations of the edge of the wall at these thicknesses serve as the set of second reference locations.

As subsequently described, it is possible to fabricate a set of insulated, conducting vias aligned by virtue of the first set of reference locations with the submerged structures, where each via conductor contacts one of the conductive traces.

As subsequently described, it is possible to space the insulated, conducting vias along the conductive traces at distances larger than the photolithographic limit, where these distances are referenced to the set of second reference location and are achieved by non-photolithographic techniques of self-aligning to the core of the wall.

As subsequently described, it is possible to provide a set of vias spaced above the photolithographic limit and contacting one by one a set of conductive traces spaced below the photolithographic limit such as to provide a fan-out structure from sublithographic dimensions to larger than minimum photolithographic dimensions.

In the drawings for the subsequent periphery steps and elsewhere, common mnemonic labels are used to aid the reader in keeping track of various materials present. These labels are selected to draw attention to etch selectivity considerations between different materials present at the same time. Labels such as OX for silicon-dioxide, PAR for Parylene, W for tungsten, NIT for silicon-nitride are used to indicate these materials, for example. In the case of silicon, SI is used to indicate the element silicon in one of its various crystalline or non-crystalline forms, where P SI or N SI indicates P or N doped silicon, respectively. VOID and GAP labels are used respectively for voids and gaps. The text typically indicates deposition methods and requirements which may result in a particular crystalline form. For example, amorphous silicon may be required where a low temperature deposition is needed to avoid Parylene temperature limits.

Directional RIE can typically be used as an alternative to ion milling anywhere in this disclosure where vertical or other directional anisotropic etching is required, particularly if additional selectivity is desired.

Where vertical directional depositions are required, they may be by means of collimated sputtering with an elongated collimator or with etch-back of unwanted coatings from deposition off the intended axis, or by evaporation from a point source by evaporation means such as E-beam or other heating method, with similar etch-back of any unwanted coating.

FIG. 477 (P3D1) is a three-dimensional depiction of a small cutaway section of an integrated circuit wafer where the following steps have been performed to create the indicated layers at appropriate thicknesses.

Generation of array and periphery from the same mask is desirable. This can be done by continuing the forward trench P3D1.1 across the array and enough beyond to allow space for severing the far end.

It should be pointed out that the structure shown below the traces, as well as some of the structure above them, is only one example of many possible arrangements. Preferably, the structure of P3D1 is determined by the structure of the pillars or other cell structures in the cell array, when it is desired to interconnect a sublithographic cell array to a sublithographic periphery.

On a silicon wafer of P-type conductive crystalline silicon, a thin layer of N-type conductive crystalline silicon is epitaxially grown over the wafer's surface. These two layers are doped (and biased in later operation) so as to form a diode block which isolates the N-type layer from the lower P-type layer.

The upper portion of this N-type silicon layer is then thermally oxidized, such that the resulting thermal oxide can serve as a gate insulator for field effect transistors.

Above this thermal oxide, a thicker layer of polysilicon which is sufficiently doped N or P so as to be adequately conductive, according to engineering preference or interface requirements for the structure being fabricated, is next deposited by such means as CVD. This upper layer is fabricated so as to serve as a field effect transistor gate above the thermal oxide, so as to be able to cause an inversion layer to form at the silicon surface beneath the thermal oxide when voltage is applied to the conductive polysilicon layer.

A similarly thick layer of silicon-dioxide is next deposited above the aforementioned polysilicon layer.

A thicker layer of undoped polysilicon is next deposited above the aforementioned deposited silicon-dioxide layer.

A thinner layer of silicon-dioxide is next deposited above the aforementioned thicker polysilicon layer.

A much thicker layer of polysilicon is next deposited above the aforementioned thinner silicon-dioxide layer.

A somewhat thinner top layer of silicon-dioxide is next deposited above the aforementioned thick polysilicon layer. This top layer is then patterned by conventional photolithographic means to serve as an etch mask of the form depicted in the subsequently described figure. A mask feature from which a forward trench will be formed (P3D1.1) and a feature from which a rear wall will eventually be formed (P3D1.2) are shown as open regions in the mask, as shown in FIG. 477 (P3D1).

FIG. 478 (PER1) is a two-dimensional depiction of the front end of FIG. 477 (P3D1).

FIG. 479 (PER2) depicts the results of a sequence of next subsequent steps where the upper two polysilicon portions of the structure are selectively trench-etched as shown, and the intervening silicon-dioxide portions are ion-milled using the upper trench portion as a mask, and where a thin layer of silicon-dioxide is deposited by CVD. As indicated in the figure, this reduces the height of the top silicon-dioxide layer which is serving as a mask. Contiguous silicon-dioxide is shown as a connected region, without showing interfaces between regions deposited at different times.

FIG. 480 (PER3) depicts the results of a next subsequent step where a layer of tungsten is omni-directionally deposited over the exposed wafer surfaces by such means as CVD, so as to close out in the rear trench (which was etched down from P3D1.2 of FIG. 477 (P3D1) in the prior step) and thus create the basis of a physical feature which will eventually serve as the wall (P3D2.2) shown at the rear of three-dimensional FIG. 501 (P3D3), as also shown at an intermediate point in its fabrication as P3D2.2 in three-dimensional FIG. 496 (P3D2). However, the deposition of this step is sufficiently thin so as not to close out in the forward trench, thereby leaving a gap to allow back-etching as required in subsequent steps.

FIG. 481 (PER4) depicts the results of a next subsequent step where the tungsten coating the exposed wafer surfaces which has not been closed out is selectively etched away, so as to leave remnants of this deposition only in the closed-out region which will subsequently become the rear wall.

FIG. 482 (PER5) depicts the results of a next subsequent step where a coating of Parylene whose thickness is approximately ⅙ the width of the forward trench is omni-directionally deposited over the exposed wafer surfaces.

FIG. 483 (PER6) depicts the results of a next subsequent step where the tops and bottoms of the Parylene of the prior step have been vertically etched away by such means as ion milling.

A small step (not shown) milled into the underlying oxide can serve as an anchor for the nitride blade to be fabricated next. This step forms a slightly recessed rectangle in the oxide surface. In the subsequent steps, additional inscribed steps and recessed rectangles can thus be created for anchoring the nitride blades to be formed in subsequent steps.

FIG. 484 (PER7) depicts the results of a sequence of next subsequent steps where layers of silicon-nitride, followed by Parylene, have been successively deposited and then the tops and bottoms etched away in the manner of the prior two steps, so as to create the successive vertical layers shown.

FIG. 485 (PER8) depicts the results of a next subsequent step where all exposed Parylene is selectively etched away, leaving the vertical standing silicon-nitride partitions.

In some cases, the high silicon-nitride blades of FIG. 485 (PER8) may be less desirable for the Parylene and silicon-dioxide etch steps leading to the structures shown respectively in FIG. 485 and FIG. 486 (PER8 and PER9). Blades of less height can be produced by replacing the step sequence of FIG. 483 to FIG. 485 (PER6 to PER8) by the step sequence of the following FIG. 486 to FIG. 489 (PER106 to PER109).

FIG. 486 (PER106) depicts the results of a sequence of next subsequent steps where first the tops and bottoms of the Parylene of the prior step are vertically etched away by such means as ion milling, then a coating of silicon-nitride whose thickness is approximately ⅙ the width of the forward trench is omni-directionally deposited over the exposed wafer surfaces and the tops and bottoms of this layer are vertically etched away by such means as ion milling, and then a thick layer of Parylene is omni-directionally deposited over the exposed wafer surfaces so as to close out between the walls of the forward trench, and reflowed.

FIG. 487 (PER107) depicts the results of a sequence of next subsequent steps where the Parylene coating the exposed wafer surfaces which has not been closed out is selectively etched away, so as to leave remnants of Parylene only in the closed-out region of the forward trench up to the height at PER107.1, and up to a height at PER107.2 in the narrower gaps between the silicon-nitride blades and the forward trench walls, then all exposed silicon-nitride is selectively etched away.

FIG. 488 (PER108) depicts the results of a sequence of next subsequent steps where all exposed Parylene is selectively etched away, leaving the two vertical standing silicon-nitride partitions, then a coating of Parylene whose thickness is approximately ⅙ the width of the forward trench is omni-directionally deposited over the exposed wafer surfaces (closing out between the silicon-nitride partitions and the trench walls) and the tops and bottoms of this Parylene layer are vertically etched away by such means as ion milling, then a coating of silicon-nitride whose thickness is approximately ⅙ the width of the forward trench is omni-directionally deposited over the exposed wafer surfaces and the tops and bottoms of this silicon-nitride layer are vertically etched away by such means as ion milling, and finally a second coating of Parylene whose thickness is approximately ⅙ the width of the forward trench is omni-directionally deposited over the exposed wafer surfaces such as to close out only in the narrow gap at PER108.1.

FIG. 489 (PER109) depicts the results of a sequence of next subsequent steps where the exposed Parylene coating the wafer surfaces which has not been closed out is selectively etched away, so as to leave remnants of Parylene only in the closed-out region of the forward trench up to the height at PER109.1, then all exposed silicon-nitride is selectively etched away, and finally all remaining exposed Parylene is selectively etched away, leaving the four vertical standing silicon-nitride blades at PER109.2, which are functionally equivalent to the blades of FIG. 485 (PER8).

FIG. 490 (PER9) depicts the results of a next subsequent step where the exposed silicon-dioxide is vertically etched by such means as ion milling or RIE using the silicon-nitride as a mask.

The ion-mill step has to ensure penetration through the oxide. However its depth is not very critical, because the polysilicon underneath is trench-etched next, using the silicon-dioxide as a mask.

It should be noted that shorter blades are preferred, and ion milling has benefits over RIE for etching the oxide. The thin oxide layer on the trench wall may get etched away in either process, but this is of no consequence.

FIG. 491 (PER10) depicts the results of a next subsequent step where the vertical silicon-nitride partitions have been selectively etched away, leaving the silicon-dioxide partitions.

FIG. 492 (PER11) depicts the results of a sequence of next subsequent steps where the exposed silicon is selectively trench-etched by such means as RIE using the silicon-dioxide partitions as a mask, where such vertical etching means as ion milling is used to etch through the thin thermal oxide layer, to obtain the vertical blades PER11.1.

FIG. 493 (PER12) depicts the results of a next subsequent step where a layer of Parylene of such thickness as to close out the trenches between and adjacent to the vertical blades is omni-directionally deposited.

FIG. 494 (PER13) depicts the results of a sequence of next subsequent steps where the Parylene layer and the underlying silicon-dioxide layers are vertically etched down by such means as ion milling to a depth such that the silicon-dioxide layers at the tops of the vertical blades are completely removed, and then all remaining Parylene is removed by onmi-directional selective etching.

As a preferred alternative to the step sequence leading to FIG. 494 (PER13), the Parylene layer may first be vertically etched down by such means as ion milling to a depth to expose the tops of the silicon-dioxide blades, then the silicon-dioxide blades are removed completely by omni-directional selective etching, and then all remaining Parylene is removed. Oxide etching is better controlled this way, because it stops at the silicon.

FIG. 495 (PER14) depicts the results of a next subsequent step where a layer of silicon-dioxide is omni-directionally deposited over the exposed wafer surfaces by such means as CVD, so as to close out between the short vertical blades remaining from the prior step. The interfaces of this layer with contiguous silicon-dioxide regions are shown.

FIG. 496 (P3D2) is a three-dimensional depiction of a small cutaway section of the integrated circuit wafer and depicts the results of a next subsequent step. In this step the silicon-dioxide layer from the previous step coating the exposed wafer surfaces, which has not been closed out, is etched away, so as to leave remnants of this deposition only in the closed-out regions. The forward trench etched down earlier from the mask forward trench P3D1.1 is shown as P3D2.1. The feature which is to become the rear wall is shown as P3D2.2

FIG. 497 (PER15) is a two-dimensional depiction of the front end of FIG. 496 (P3D2), where PER15.1 indicates the aforementioned remnants of closed-out silicon-dioxide deposition between the short vertical blades.

FIG. 498 (PER16) depicts the results of a sequence of next subsequent steps where Parylene is omni-directionally deposited over the exposed wafer surfaces so as to close out between the walls of the forward trench, reflowed, and then etched down to the same height as the top of the top silicon-dioxide mask.

FIG. 499 (PER17) depicts the results of a sequence of next subsequent steps where the exposed silicon-dioxide of the top mask has been selectively etched down and away, followed by selective etching down and away of the exposed silicon, followed by selectively etching away of the exposed thin silicon-dioxide layers on the vertical surfaces of the Parylene plug and the tungsten wall.

Bottom powered RIE with C2F6CHF3He which etches silicon-dioxide and silicon, but not Parylene and tungsten, may also be used for this step.

FIG. 500 (PER18) depicts the results of a next subsequent step where the Parylene plug which was protecting the interior region of the forward trench has been selectively etched away, or alternatively has been etched approximately to the top edge of the forward trench (not shown).

FIG. 501 (P3D3) is a three-dimensional depiction of a small cutaway section of the integrated circuit wafer showing the results of the step of FIG. 500 (PER18) in greater detail. The remaining portion of the forward trench etched down earlier from the mask forward trench P3D1.1, shown in FIG. 496 (P3D2) as P3D2.1, is shown here again. The closed-out feature P3D2.2 shown in FIG. 496 (P3D2) which was to become the rear wall is now shown serving as the rear wall.

FIGS. 502 and 503 (PER19A & PER19B) depict the results of a sequence of next subsequent steps where Parylene is omni-directionally deposited over the exposed wafer surfaces so as to close out between the walls of the forward trench, reflowed, and then the Parylene coating the exposed wafer surfaces which has not been closed out is selectively etched away, so as to leave remnants of this deposition only in the closed-out region of the forward trench. FIG. 503 (PER19B) and following figures with the same view are two-dimensional depictions of the vertical section through the center of the forward trench, with the fold surface of the closed-out layers indicated by dotted lines.

FIG. 504 (PER20) depicts the results of a sequence of next subsequent steps where a thinner layer of silicon-nitride is omni-directionally deposited over the exposed wafer surfaces by such means as CVD, then a thicker layer of amorphous silicon is omni-directionally deposited over the exposed wafer surfaces by such means as CVD, then a thinner layer of silicon-dioxide is omni-directionally deposited over the exposed wafer surfaces by such means as CVD.

FIG. 505 (PER21) depicts the results of a next subsequent step where the tops and bottoms of the last deposited layer of silicon-dioxide have been vertically etched away by such means as ion milling.

FIG. 506 (PER22) depicts the results of a next subsequent step where the exposed silicon shown to the left of the now expanded wall (over the forward trench) has been selectively trench-etched down using the expanded wall as a mask, so as to expose the silicon-nitride stop layer beneath.

FIG. 507 (PER23) depicts the results of a sequence of next subsequent steps where the silicon-nitride coating the exposed wafer surfaces which has not been enclosed is selectively etched away, so as to leave remnants of this deposition only in the closed-out or otherwise enclosed regions.

FIGS. 508 and 509 (PER24A & PER24B) depict the results of a next subsequent step where all exposed Parylene is selectively etched away.

FIGS. 510 and 511 (PER26A & PER26B) depict the results of a next subsequent step where silicon-nitride is directionally deposited by means mentioned earlier, such as collimated sputtering or evaporation from a point source, parallel to the horizontal extension of the wall first vertically so as to coat the horizontal surfaces, then at approximately 60 degree elevation angles to the wafer surface, so as to coat the forward trench. This coating action first occurs down vertically, then down from the upper right, and then down from the upper left of FIG. 510 (PER26A), for example, so as to directionally coat the exposed upper and lower horizontal surfaces and the side walls of the forward trench as the directional deposition points at them, as shown as PER26.1. Any deposition that is not sufficiently directional may coat the side of the wall to a significantly lesser degree. Any such coating may be subsequently removed by omni-directional selective etch-back.

FIGS. 512 and 513 (PER27A & PER27B) depict the results of a next subsequent step where a layer of amorphous silicon is omni-directionally deposited over the exposed wafer surfaces by such means as CVD so as to close out in the forward trench, as shown as PER27.1.

FIGS. 514 and 515 (PER28A & PER28B) depict the results of a sequence of next subsequent steps where the upper surfaces of the wafer are first coated with positive photoresist or a layer of polyimide covered with positive photoresist, to form a substantially flat upper surface, then the top surface is planarized to the height shown at PER28.1 by such means as chemical-mechanical polishing so as to cut the top of the wall substantially flat, then the photoresist is blanket exposed first to ultraviolet light and second to hexamethyldisilazane (HMDS) and then oxidized such as to form a thin silicon-dioxide layer at its surface at PER28.1. Then the exposed silicon surfaces are selectively vertically etched to a height shown at PER28.2 (which also etches the tungsten to a height shown at PER28.3) and a silicon-dioxide layer half the depth of the just etched trench is vertically deposited by such means as directional sputtering or line-of-sight deposition from an evaporation source (such as E-beam), as shown, for example, at PER28.4. After the vertical silicon-dioxide deposition, a narrow vertical gap of exposed positive photoresist at PER28.5 exists. Some etch-back may be required after collimated sputtering, to clear the gap at PER28.5 of spurious silicon-dioxide.

FIGS. 516 and 517 (PER29A & PER29B) depict the results of a sequence of next subsequent steps where the photoresist is dissolved through the narrow vertical gap at PER28.5 and the silicon-dioxide at PER28.4 is lifted off with the decomposing resist, then a layer of silicon-dioxide is directionally deposited by aforementioned means (as with FIGS. 510 and 511 (PER26A & PER26B)) perpendicular to the horizontal extension of the wall, from a low (small) angle off the plane of the wafer, so as to coat the front side of the wall as shown at (PER29.1), and the first silicon-dioxide ridge as shown at (PER29.2), but so as to leave the tops essentially uncoated. Any lesser unwanted coating in undesired places is subsequently removed by omni-directional selective etch-back in the manner indicated in the steps leading to FIGS. 510 and 511 (PER26A & PER26B).

FIGS. 518 and 519 (PER30A & PER30B) depict the results of a next subsequent step where the exposed silicon shown to the left of the current wall edge (over the forward trench in FIG. 517 (PER29B)) is selectively trench-etched down using the expanded wall as a mask, so as to expose the silicon-nitride stop layer beneath, at PER30.1.

FIGS. 520 and 521 (PER31A & PER31B) depict the results of a next subsequent step where a layer of Parylene of the thickness shown at PER31.1 is omni-directionally deposited over the exposed wafer surfaces.

FIGS. 522 and 523 (PER32A & PER32B) depict the results of a next subsequent step where the tops and bottoms of the Parylene have been vertically etched away by such means as ion milling.

FIGS. 524 and 525 (PER33A & PER33B) depict the results of a next subsequent step where a layer of amorphous silicon PER33.1 is omni-directionally deposited over the exposed wafer surfaces by such means as CVD, so as to close out between the walls of the forward trench.

FIGS. 526 and 527 (PER34A & PER34B) depict the results of a sequence of next subsequent steps where the upper surfaces of the wafer are first coated with positive photoresist or a layer of polyimide covered by positive photoresist, which forms a substantially flat upper surface, then the top surface is planarized to the height shown at PER34.1 by such means as chemical-mechanical polishing so as to cut the top of the wall substantially flat, then the photoresist is blanket exposed and its surface exposed to HMDS. Then the exposed Parylene partition in line with the wall shown at PER34.2 is selectively etched away, creating a trench, while the silicon deposited by the HMDS exposure of the photoresist surface at PER34.1 is simultaneously oxidized such as to form a silicon-dioxide layer which retards etching of the photoresist in subsequent steps.

FIGS. 528 and 529 (PER35A & PER35B) depict the results of a next subsequent step where the trench created at PER34.1 is deepened by vertical ion milling of the exposed upper surfaces of the wafer, as shown at PER35.1, so as to sever and subsequently insulate the lower forward regions of the forward trench (down to a depth below the surface of the P-substrate) from the portions below the wall behind this severance. (Forward is to the left and behind is to the right in FIG. 529 (PER35B)). Differences in the ion milling rates cause the upper surfaces of the different materials to be at different heights, rather than the uniform height shown at PER35.2.

FIGS. 530 and 531 (PER36A & PER36B) depict the results of a sequence of next subsequent steps where Parylene is omni-directionally deposited over the exposed wafer surfaces so as to close out between the sides of the trench deepened in the prior step. A partial, brief viscous reflow may be used here to reduce any voiding in the Parylene, if it occurs. Then the top surface is planarized to the height shown at PER36.1 by such means as chemical-mechanical polishing so as to cut the top of the wall substantially flat, then the photoresist is blanket exposed and its surface exposed to HMDS and oxidized so as to form a protective silicon-dioxide layer at PER36.2.

FIGS. 532 and 533 (PER37A & PER37B) depict the results of a sequence of next subsequent steps where the exposed silicon surfaces are selectively vertically etched to a height shown at PER37.1 (which also etches the tungsten to a height shown at PER37.2), and a silicon-dioxide layer half the depth of the just etched trench is vertically deposited by such means as directional sputtering or line-of-sight deposition from an evaporation source (such as E-beam), as shown, for example, at PER37.3, then (as with FIGS. 514 and 515 (PER28A & PER28B)) the photoresist is dissolved through the narrow vertical gap of exposed resist remaining (as at PER28.5) and the silicon-dioxide above the resist is lifted off with the decomposing resist. Then a layer of silicon-dioxide is directionally deposited by aforementioned means (as with FIG. 510 and FIG. 511 (PER26A & PER26B)) perpendicular to the horizontal extension of the wall, from a low (small) angle off the plane of the wafer, so as to coat the front side of the wall as shown at PER37.4, and the first silicon-dioxide ridge as shown at PER37.5, but so as to leave the tops essentially uncoated. Any lesser unwanted coating in undesired places is subsequently removed by omni-directional selective etch-back.

FIGS. 534 and 535 (PER38A & PER38B) depict the results of a sequence of next subsequent steps where the exposed silicon shown to the left of the expanded wall (over the forward trench) has been selectively trench-etched down using the expanded wall as a mask, and the Parylene in the forward trench selectively etched away, so as to expose the silicon-nitride stop layer beneath, as shown at PER38.1.

FIGS. 536 and 537 (PER39A & PER39B) depict the results of a next subsequent step where all exposed silicon-nitride outer exposed surface layers are selectively etched away. (This will also etch any silicon-nitride exposed along the top of the wall.) This step completes a side of the wall as shown in FIG. 537 (PER39B) at PER39.1 which will serve as a spatial reference for the subsequent layer sequence between FIGS. 538 and 539 (PER40A & PER40B) and FIGS. 570 and 571 (PER58A & PER58B), where the subsequently described FIG. 571 (PER58B) depicts an analogous side of the wall which is shown further to the left in the figure at PER58.2.

FIGS. 538 and 539 (PER40A & PER40B) depict the results of a sequence of next subsequent steps where silicon-nitride is first directionally deposited by means mentioned earlier, such as collimated sputtering or evaporation from a point source, at an angle indicated by the shadow edge shown in FIG. 538 (PER40A) at PER40.1, selected so as to coat the right side of the forward trench shown in FIG. 538 (PER40A) at PER40.2, while shadowing the left side of the trench, using the step formed by the left trench wall as a mask. The wall is shadowed in the manner of the earlier angle deposition steps, since the deposition path is parallel to the wall. Silicon-nitride is next directionally deposited at an angle indicated by the shadow edge shown in FIG. 538 (PER40A) at PER40.3, selected so as to coat the left side of the forward trench shown in FIG. 538 (PER40A) at PER40.4, while shadowing the right side of the trench, using the step formed by the right trench wall as a mask. The wall is again shadowed in the manner of the earlier angle deposition steps, since the deposition path is parallel to the wall. The deposition angles of these last two angle deposition steps are selected so that both depositions leave a gap region over one polysilicon blade at the bottom of the forward trench shadowed as shown at PER40.5. Some clean-up etch-back of the silicon-nitride deposition by a limited selective etch may be done to remove unwanted partial overshoot of the deposited material.

FIGS. 540 and 541 (PER41A & PER41B) depict the results of a next subsequent step where a layer of Parylene is omni-directionally deposited over the exposed wafer surfaces.

FIGS. 542 and 543 (PER42A & PER42B) depict the results of a next subsequent step where a layer of amorphous silicon is omni-directionally deposited over the exposed wafer surfaces by such means as CVD.

FIGS. 544 and 545 (PER43A & PER43B) depict the results of a sequence of next subsequent steps where the upper surfaces of the wafer are first coated with photoresist or a layer of polyimide covered with positive photoresist, to form a substantially flat upper surface, then the top surface is planarized to the height shown at PER43.1 by such means as chemical-mechanical polishing so as to cut the top of the wall substantially flat, then the photoresist is blanket exposed first to ultraviolet light and second to HMDS and then oxidized such as to form a thin silicon-dioxide layer at its surface at PER43.1. Then the exposed silicon surfaces are selectively vertically etched to a height shown at PER43.2 (which does not appreciably etch the exposed silicon-dioxide and silicon-nitride surfaces at PER43.3 and PER43.4 respectively, and a silicon-dioxide layer half the depth of the just etched trench is vertically deposited by such means as directional sputtering, as shown, for example, at PER43.5. After the vertical silicon-dioxide deposition, a narrow vertical gap of exposed positive photoresist at PER43.6 exists.

FIGS. 546 and 547 (PER44A & PER44B) depict the results of a sequence of next subsequent steps where the photoresist is dissolved through the narrow vertical gap at PER43.6 in FIG. 545 (PER43B) and the silicon-dioxide at PER43.5 in FIG. 545 (PER43B) is lifted off with the decomposing resist (and the polyimide layer is removed if present), then a layer of silicon-dioxide is directionally deposited by aforementioned means (as with FIGS. 510 and 511 (PER26A & PER26B)) perpendicular to the horizontal extension of the wall, from a low (small) angle off the plane of the wafer, so as to coat the front side of the wall as shown at PER44.1, and the side of the step as shown at PER44.2, but so as to leave the tops essentially uncoated. Any lesser unwanted coating in undesired places is subsequently removed by omni-directional selective etch-back.

FIGS. 548 and 549 (PER45A & PER45B) depict the results of a next subsequent step where the exposed silicon shown to the left of the expanded wall (over the forward trench) has been selectively trench-etched down to the Parylene stop layer, as shown at PER45.1, using the expanded wall as a mask.

FIGS. 550 and 551 (PER48A & PER48B) depict the results of a next subsequent step where all exposed Parylene layers are selectively etched away, so as to expose the gap in the silicon-nitride masking layer created as PER40.3 in the earlier step associated with FIGS. 538 and 539 (PER40A & PER40B).

FIGS. 552 and 553 (PER49A & PER49B) depict the results of a next subsequent step where a new, thinner layer of Parylene (thin enough to permit clearance of the gap in the forward trench silicon-nitride mask in the next step) is onmi-directionally deposited over the exposed wafer surfaces, as shown at PER49.1.

FIGS. 554 and 555 (PER50A & PER50B) depict the results of a next subsequent step where the tops and bottoms of this new Parylene layer have been vertically etched away by such means as ion milling, so as to expose the gap in the forward trench silicon-nitride mask, as shown at PER50.1.

FIGS. 556 and 557(PER51A & PER51B) depict the results of a next subsequent step where a layer of tungsten PER51.1 is omni-directionally deposited over the exposed wafer surfaces by such means as CVD, so as to make electrical contact with the lower trace exposed in the gap between the silicon-nitride mask coatings on the left and right sides of the aforementioned gap, as shown at PER51.2.

FIGS. 558 and 559 (PER52A & PER52B) depict the results of a next subsequent step where the tops and bottoms of the tungsten layer have been vertically etched away by such means as ion milling, as shown at PER52.1. Ion milling may be required through a continuous range of angles, all ballistic bombardment paths of the ions being parallel to the front face of the wall, or at such an angle that the front face of the wall is slightly shadowed, so as not to erode the front of the wall significantly. This technique is appropriate when the tungsten contact layer is thicker and the edges of left and right silicon-nitride masks drop off at sharper angles. If the angle of deposition used to deposit the silicon-nitride masks is dithered slightly so as to soften the edges, for example, the sharper edges shown will be more gradual, making this technique less required. A balance must be found between fuzziness of the edges of the left and right silicon-nitride masks and the ability of the masks to sufficiently select (expose and isolate) the trace between them. Note that the less than perfect collimation of the most common commercial collimated sputtering equipment helps to produce a taper at the nitride edge, if only the sputtering angle is chosen judiciously. Note that extended collimator grills will produce a higher degree of collimation.

Figure 561:
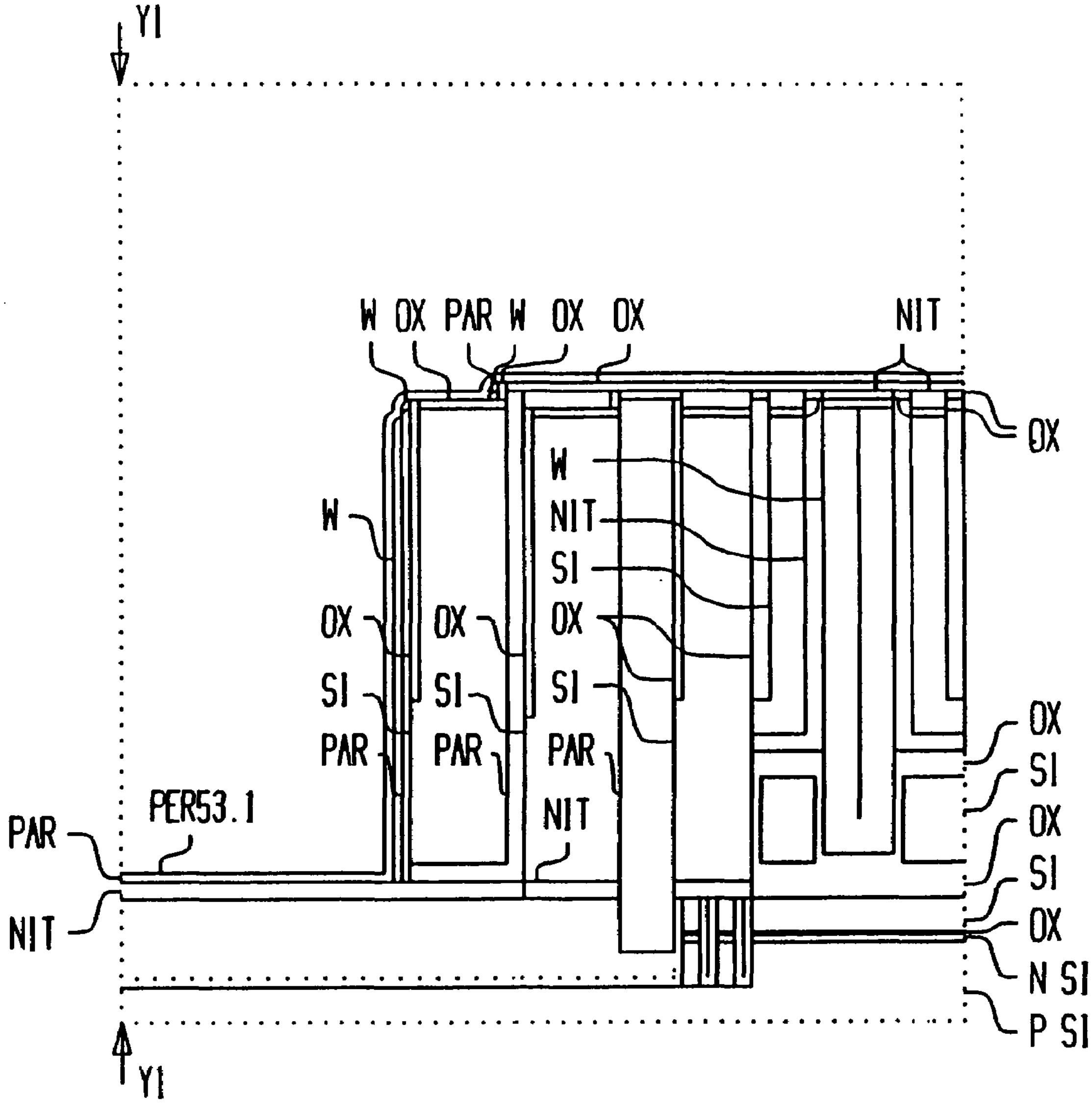

FIGS. 560 and 561 (PER53A & PER53B) depict the results of a next subsequent step where a thin layer of Parylene PER53.1 is omni-directionally deposited over the exposed wafer surfaces.

FIGS. 562 and 563 (PER54A & PER54B) depict the results of a sequence of next subsequent steps where first amorphous silicon is directionally deposited by aforementioned means (as with FIG. 510 and FIG. 511 (PER26A & PER26B)) in the direction orthogonal to the plane of the wafer, so as to coat the top of the wall and the other exposed horizontal surfaces to a height shown by a broken line as at PER54.1, but not the vertical surfaces such as the sides of the wall, so as to create a coating which builds directly upward from the wafer's horizontal surface features, but leaves the vertical surfaces substantially shadowed, and then a thick layer of amorphous silicon PER54.2 is omni-directionally deposited over the exposed wafer surfaces by such means as CVD, so as to close out in the forward trench.

FIGS. 564 and 565 (PER55A & PER55B) depict the results of a sequence of next subsequent steps where the upper surfaces of the wafer are first coated with positive photoresist or a layer of polyimide covered with positive photoresist, to form a substantially flat upper surface, then the top surface is planarized to the height shown at PER55.1 by such means as chemical-mechanical polishing so as to cut the top of the wall substantially flat, then the photoresist is blanket exposed first to ultraviolet light and second to HMDS and then oxidized such as to form a thin silicon-dioxide layer at its surface at PER55.1. Then the exposed silicon surfaces are selectively vertically etched to a height shown at PER55.2 (which does not appreciably etch the exposed silicon-nitride and silicon-dioxide surfaces at, for example, PER55.3), and a silicon-dioxide layer half the depth of the just etched trench is vertically deposited by such means as directional sputtering, as shown, for example, at PER55.4. After the vertical silicon-dioxide deposition, a narrow vertical gap of exposed positive photoresist at PER55.5 exists.

FIGS. 566 and 567 (PER56A & PER56B) depict the results of a sequence of next subsequent steps where the photoresist is dissolved through the narrow vertical gap at PER55.5 in FIG. 565 (PERSSB) and the silicon-dioxide at PER55.4 in FIG. 565 (PER55B) is lifted off with the decomposing resist (and the polyimide layer is removed if present), then a layer of silicon-dioxide is directionally deposited by aforementioned means (as with FIGS. 510 and 511 (PER26A & PER26B)) perpendicular to the horizontal extension of the wall, from a low (small) angle off the plane of the wafer, so as to coat the side of the wall as shown at PER56.1, and the side of the step as shown at PER56.2, but so as to leave the tops essentially uncoated. Any lesser unwanted coating in undesired places is subsequently removed by omni-directional selective etch-back.

FIGS. 568 and 569 (PER57A & PER57B) depict the results of a next subsequent step where the exposed silicon shown to the left of the expanded wall (over the forward trench) has been selectively trench-etched down to the Parylene stop layer, as shown at PER 57.1, using the expanded wall (which is coated on the top and sides with silicon-dioxide) as a mask.

FIGS. 570 and 571 (PER58A & PER58B) depict the results of a sequence of next subsequent steps where all exposed Parylene, tungsten, Parylene and then silicon-nitride are sequentially selectively etched away, leaving the trench walls and bottom cleared as shown at PER58.1.

This step completes a side of the wall as shown at PER58.2, which serves the same purpose as the analogous side of the wall in the step shown in FIG. 537 (PER39B) at PER39.1. The sequence of steps from FIGS. 538 and 539 (PER40A & PER40B) through FIGS. 570 and 571 (PER58A & PER58B) is a repeatable sequence. Each time this sequence is repeated, another tungsten layer which runs parallel to the side of the wall is added, as was shown in FIGS. 558 and 559 (PER52A & PER52B) at PER52.1. Each of these successive tungsten layers is stood off from adjacent tungsten layers by the intervening layers before and after it, and each is insulated by the aforementioned Parylene layers on either side of each tungsten layer. Each of these successive tungsten layers makes electrical contact with the region exposed in the gap between the adjacent nitride layers in the trench, as shown in the aforementioned example at PER40.3. The thickness of the standoff layers is preferably chosen so as to make the spacing between these insulated tungsten layers substantially wider than the spacing between the conductive blades (as shown at PER13.1 in FIG. 494 (PER13)), which are contacted by these tungsten layers, and which run orthogonally along the bottom of the forward trench. This allows the tungsten layers to be in turn contacted by electrically connecting traces above the upper edges of these layers, when such contacting traces are running parallel to the tungsten layer edges, at least where the contacting traces contact the tungsten layer edges. These tungsten layers are hence preferably spaced on centers which are considerably farther apart than the analogous spacing between centers of the orthogonal blades running along the bottom of the forward trench in the orthogonal axis.

The conductive blades (as shown at PER13.1 in FIG. 494 (PER13)) may be fabricated with a center-to-center spacing which is below the minimum feature size of available photolithography used in a particular fabrication process (the photolithographic limit). When such is the case, the wider center-to-center spacing between the orthogonal tungsten traces allows contact to these traces by lines on a center-to-center spacing which is greater than the minimum feature size of the available photolithography in that particular process (above the photolithographic limit). This type of structure provides means for electrically conductive traces which are fabricated in sizes which are above the photolithographic limit to contact electrically conductive traces which are sized below the photolithographic limit. This capability allows circuit structures which are fabricated below the photolithographic limit, when linked to traces such as the blades PER13.1 at the bottom of the forward trench, to interface with structures which are fabricated by conventional means above the photolithographic limit.

While in FIG. 538 (PER40A) the gap is shown at the second blade from the right for clarity, in a preferred embodiment the leftmost blade would be chosen first, then, in repetitions of the procedure from FIGS. 538 and 539 (PER40A & PER40B) to FIGS. 570 and 571 (PER58A & PER58B), the gap would be placed at the second, third and forth blades in turn.

The vertical tungsten layers could be called a combined via and fan-out structure between the sub-lithographic lines at the bottom of the trench and lithographic wiring at the top surface.

FIG. 572 (PER59B) depicts the results of a next process sequence where the sequence of steps from FIGS. 538 and 539 (PER40A & PER40B) through FIGS. 570 and 571 (PER58A & PER58B) has been repeated three more times as before, with the exception that the gap created between the silicon-nitride depositions at the bottom of the forward trench (as shown in FIG. 538 (PER40A) at PER40.3) is placed over a different one of the four polysilicon blades in each subsequent repetition of the sequence of steps FIGS. 538 and 539 (PER40A & PER40B) through FIGS. 570 and 571 (PER58A & PER58B). Hence, each of the four (total) aforementioned tungsten contacting traces contacts—and thus electrically connects to—one uniquely associated polysilicon blade in the forward trench, these polysilicon blades being electrically conductive traces in their own right. The polysilicon blade traces (thus contacted by the tungsten layers through the gaps) lead toward the forward end of the forward trench, and are available there for connection to other traces on like center-to-center spacing, or continue through an array of structures, such as a memory cell array, for example, within which they serve as bus lines for certain signals. As mentioned earlier, this center-to-center spacing may be significantly below the photolithographic limit, while the center-to-center spacing between the orthogonal contacting tungsten layers may be fabricated so as to be above the photolithographic limit, thus permitting interconnection with these tungsten traces by conventional photolithographic methods.

FIGS. 573 and 574 (PER60B & PER60C) depict cross-sectional and top views, respectively, showing the results of a sequence of next subsequent steps where the upper surfaces of the wafer are first coated with positive photoresist, which forms a substantially flat upper surface, then the top surface is planarized by such means as chemical-mechanical polishing so as to cut the top of the wall substantially flat to the height shown by the dotted line at PER60.1 in FIG. 573 (PER60B), all exposed silicon surfaces are selectively etched down to the height shown at PER60.2, then all remaining positive photoresist is dissolved. Then a layer of silicon-dioxide is omni-directionally deposited so as to fill the depressions left from the previous etching of the silicon, and the top surface is again planarized. by such means as chemical-mechanical polishing to the final height at PER60.3 in FIG. 573 (PER60B). This leaves a mosaic pattern of silicon-dioxide, silicon-nitride and Parylene areas, all electrical insulator materials, surrounding mutually insulated, U-shaped tungsten structures, at the surface, as shown in a top view in FIG. 574 (PER60C). Each of the four tungsten structures PER60.4, PER60.5, PER60.6 and PER60.7 is connected to a different polysilicon trace at the trench bottom. While the widths and spaces of the polysilicon traces at the trench bottom are of sub-photolithographic dimensions, the U-shaped tungsten structures are of a size and arrangement such as to allow interconnecting them with a set of bus lines whose widths and spacings are larger than the photolithographic limit, which are running orthogonally to the traces at the trench bottom, as delineated by dashed lines in FIG. 574 (PER60C) and labeled PER60.8 to PER60.11, each connecting to corresponding polysilicon traces in many trenches and to a peripheral circuit.

End

As subsequently described, it is possible to provide a pattern in a masking layer of an integrated circuit wafer by photolithographic image transfer, where the pattern simultaneously provides a first set of reference locations for elongated structures with spacings and widths below the photolithographic limit, and a second reference location for the end of said elongated structures and for via structures.

As subsequently described, it is possible to provide a set of parallel, elongated structures submerged below the surface of the wafer, with widths and spacings below the photolithographic limit and aligned with the first set of reference locations of the masking pattern, where the submerged structures consist of at least an insulated conductive trace each, the ends of which are determined by the second reference location.

As subsequently described, it is possible to fabricate a set of insulated, conducting vias aligned by virtue of the first set of reference locations with the submerged structures, where each via conductor contacts one of the conductive traces.

As subsequently described, it is possible to space the insulated, conducting vias along the conductive traces at distances larger than the photolithographic limit, where these distances are referenced to the second reference location provided by the masking pattern and are achieved by non-photolithographic techniques of self-aligning.

As subsequently described, it is possible to provide a set of vias spaced above the photolithographic limit and contacting one by one a set of conductive traces spaced below the photolithographic limit such as to provide a fan-out structure from sublithographic dimensions to larger than minimum photolithographic dimensions.

FIG. 575 (END3D1) is a three-dimensional depiction of a small cutaway section of an integrated circuit wafer where the following steps have been performed to create the indicated layers at appropriate thicknesses.

On a silicon wafer of P-type conductive crystalline silicon, a thin layer of N-type conductive crystalline silicon is epitaxially grown over the wafer's surface. These two layers are doped (and biased in later operation) so as to form a diode block which isolates the N-type layer from the lower P-type layer.

The upper portion of this N-type silicon layer is then thermally oxidized, such that the resulting thermal oxide can serve as a gate insulator for field effect transistors.

Above this thermal oxide, a thicker layer of polysilicon which is sufficiently doped N or P so as to be adequately conductive, according to engineering preference or interface requirements for the structure being fabricated, is next deposited by such means as CVD. This upper layer is fabricated so as to serve as a field effect transistor gate above the thermal oxide, so as to be able to cause an inversion layer to form at the silicon surface beneath the thermal oxide when voltage is applied to the conductive polysilicon layer.

A similarly thick layer of silicon-dioxide is next deposited above the aforementioned polysilicon layer.

A thick layer of polysilicon is next deposited above the aforementioned deposited silicon-dioxide layer.

A top layer of silicon-dioxide which is thicker than the last mentioned deposited layer of silicon-dioxide is next deposited above the aforementioned thick polysilicon layer. This top layer is then patterned by conventional photolithographic means to serve as an etch mask. One end of a mask feature from which a trench will be formed is shown as the open region in the mask at END3D1.1 in FIG. 575 (END3D1).

FIG. 576 (END1) is a two-dimensional depiction of the front end of FIG. 575 (END3D1).

FIG. 577 (END2) depicts the results of a sequence of next subsequent steps where the upper polysilicon portion of the structure is selectively trench-etched as shown, and where a thin layer of silicon-dioxide is deposited by CVD.

In this and the following figures, interfaces of the silicon-dioxide layer deposited in this step with contiguous silicon-dioxide regions are not shown.

FIG. 578 (END3) depicts the results of a next subsequent step where a coating of Parylene whose thickness is approximately ⅙ the width of the trench is omni-directionally deposited over the exposed wafer surfaces.

FIG. 579 (END4) depicts the results of a next subsequent step where the tops and bottoms of the Parylene deposited in the prior step are vertically etched away by such means as ion milling or directional RIE.

FIG. 580 (END5) depicts the results of a sequence of next subsequent steps where a layer of silicon-nitride whose thickness is approximately ⅙ of the width of the trench is omni-directionally deposited, then the tops and bottoms of the silicon-nitride layer are vertically etched away by such means as ion milling, and where the silicon-nitride coating the end walls of the trench is etched away by ion milling parallel to the trench and with small decline toward the wafer surface (aiming the ion beam first toward one end and then toward the other end of the trench). Other etch methods with similar directionality may be used instead of ion milling.

FIG. 581 (END6) depicts the results of a sequence of next subsequent steps where one more layer of Parylene and one more layer of silicon-nitride are successively deposited and etched back in the manner described for the preceding FIG. 580 (END5), so as to create the successive vertical layers shown.

FIG. 582 (END7) depicts the results of a next subsequent step where all exposed Parylene is selectively etched away, leaving the vertically standing silicon-nitride partitions. Note that the silicon-nitride partitions are free-standing and do not touch the end walls of the trench, because the Parylene deposition covered all four sidewalls when the silicon-nitride was deposited. The milling of the silicon-nitride from the end walls may also cut part of the Parylene there, but this is inconsequential, because another layer of Parylene is deposited before the second silicon-nitride, so that a space to the end wall is guaranteed. These spaces are important, because they eventually guarantee the insulation between the four traces in the trench, making the etching of the isolating gap PER35.1 of prior FIG. 529 (PER35B) unnecessary.

FIG. 583 (END8) depicts the results of a next subsequent step where the exposed silicon-dioxide is vertically etched by such means as ion milling or RIE, using the silicon-nitride partitions as a mask. This milling step also thins the top silicon-dioxide, which must initially be sufficiently thick to bear this step with adequate thickness remaining. Note that the ion-mill step has to ensure penetration through the oxide. However its depth is not very critical, because the polysilicon underneath is trench-etched next, using the silicon-dioxide as a mask.

FIG. 584 (END9) depicts the results of a next subsequent step where the vertical silicon-nitride partitions are selectively etched away, leaving the silicon-dioxide partitions.

FIG. 585 (END10) depicts the results of a sequence of next subsequent steps where the exposed silicon is selectively trench-etched by such means as RIE, using the silicon-dioxide partitions as a mask, where such vertical etching means as ion milling is used to etch through the thin thermal oxide layer, to obtain the vertical blades at END10.1.

FIG. 586 (END11) depicts the results of a next subsequent step, where a layer of Parylene of such thickness as to close out the small trenches between and adjacent to the vertical blades is deposited by CVD.

FIG. 587 (END12) depicts the results of a sequence of next subsequent steps where first tops and bottoms of the Parylene layer are ion milled to expose the silicon-dioxide tops, then the exposed silicon-dioxide is selectively etched to a depth such that the silicon-dioxide layers at the tops of the vertical blades above END 12.1 are completely removed, and then all remaining Parylene is removed by omni-directional selective etching. This procedure further thins the top silicon-dioxide, which needs to have been sufficiently thick for an adequately thick layer to remain.

FIG. 588 (END13) depicts the results of a next subsequent step where a layer of silicon-dioxide is omni-directionally deposited over the exposed wafer surfaces by such means as CVD, so as to close out between the short vertical blades remaining from the prior step.

In this and subsequent figures, the interfaces of the silicon-dioxide layer deposited in this step with contiguous silicon-dioxide regions are shown.

FIG. 589 (END14) shows the results of a next subsequent step, where the tops and bottoms of the silicon-dioxide layer deposited last have been etched away by such means as ion milling, to expose the polysilicon tops END 12.1 of the short vertical blades imbedded between the closed-out silicon-dioxide spacers shown at END 14.1 at the bottom of the trench, but where the wafer outside the trench bottom is still covered with silicon-dioxide.

FIG. 590 (END3D2) is a three-dimensional depiction of a small cutaway section of the integrated circuit wafer and depicts the end of the trench which was etched down earlier from the mask trench END3D1.1 and is shown as END3D2.1, but with the right-hand wall removed. The figure shows the polysilicon tops END 12.1 of the short vertical blades imbedded between the closed-out silicon-dioxide spacers END14.1 at the bottom of the trench, and the trench walls and the wafer surface covered with silicon-dioxide.

FIGS. 591 and 592 (END15A &END15B) depict the results of a sequence of next subsequent steps where silicon-nitride is first directionally deposited by means mentioned earlier, such as collimated sputtering or evaporation from a point source, in the azimuthal direction perpendicular to the trench and from an elevation angle selected so as to coat the left side of the trench shown in FIG. 591 (END15A) at END15.1, while shadowing the right side of the trench using the step formed by the right trench wall as a mask. Silicon-nitride is next directionally deposited in the opposite azimuthal direction perpendicular to the trench and from an elevation angle selected so as to coat the right side of the trench shown in FIG. 591 (END15A) at END15.2, while shadowing the left side of the trench using the step formed by the left trench wall as a mask. The deposition angles of these two angle deposition steps are selected so that both depositions leave a gap region over one polysilicon blade at the bottom of the trench shadowed, as shown at END15.3.

Some clean-up etch-back of the silicon-nitride deposition by a limited selective etch may be done to remove unwanted partial overshoot of the deposited material.

FIG. 591 (END1SA) is a two-dimensional depiction of the front end of FIG. 590 (END3D2) after the silicon-nitride deposition, while FIG. 592 (END15B) and following figures with the same view are two-dimensional depictions of the vertical section through the center of the trench, with the fold surface of the closed-out center silicon-dioxide partition indicated by dotted lines.

A preferred variation places the first of the gaps over the polysilicon blade at one side of the trench, and progresses in subsequent repetitions of the step sequence of FIGS. 591 and 592 (END15A & END15B) through FIGS. 601 and 602 (END20A & END20B) to each successive blade toward the other side of the trench, until the fourth blade on the other side of the trench is contacted in the last repetition of the step sequence.

FIGS. 593 and 594 (END16A & END16B) depict the results of a next subsequent step where a layer of tungsten END16.1 is omni-directionally deposited over the exposed wafer surfaces by such means as CVD, so as to make electrical contact with the trace exposed in the gap between the silicon-nitride mask coatings on the left and right sides of the aforementioned gap, as shown at END 16.2.

FIGS. 595 and 596 (END17A & END17B) depict the results of a next subsequent step where a layer of Parylene is omni-directionally deposited over the exposed wafer surfaces.

FIGS. 597 and 598 (END18A & END18B) depict the results of a sequence of next subsequent steps where a very thick layer (at least thicker than the width of the trench) of amorphous silicon is deposited over the exposed wafer surfaces by such means as collimated sputtering in the azimuthal direction parallel to the trench in the direction toward the end wall, and with a small decline toward the wafer surface, so as to deposit a silicon plug lodged against the end wall of the trench at END 18.1, and then a small fraction of the deposition thickness is selectively omni-directionally etched away to clear all exposed silicon, except the aforementioned silicon plug at the end of the trench.

FIGS. 599 and 600 (END19A & END 19B) depict the results of a sequence of next subsequent steps where all exposed Parylene, tungsten, and then silicon-nitride are sequentially selectively etched away, leaving the trench walls and bottom to the left of the aforementioned silicon plug, as well as the wafer surface, cleared.

FIGS. 601 and 602 (END20A & END20B) depict the results of a sequence of next subsequent steps where a first layer of silicon-dioxide is omni-directionally deposited over the exposed wafer surfaces so as to close out in the undercuts from etching the Parylene, tungsten and silicon-nitride layers, then this first silicon-dioxide layer is omni-directionally etched so as to leave the undercuts filled as shown at END20.1 and END20.2, then a second layer of silicon-dioxide is deposited over the exposed wafer surface by such means as collimated sputtering in the azimuthal direction parallel to the trench in the direction toward the end wall, and with a low decline so as to deposit mainly against the end wall of the trench at END20.3. The interface between the two silicon-dioxide regions at END20.1 is shown by a dotted line.

FIG. 603 (END21) depicts the subsequent development of the cross-sectional view of FIG. 602 (END20B). This view shows the results of a next process sequence, where the sequence of steps shown from FIGS. 591 and 592 (END15A & END15B) through FIGS. 601 and 602 (END20A & END20B) has been repeated three more times as before. An exception is that the gap created between the silicon-nitride depositions at the bottom of the trench (as shown in FIG. 591 (END15A) at END15.3) is placed over a different one of the four polysilicon blades in each subsequent repetition of the sequence of steps shown from FIGS. 591 and 592 (END15A & END15B) through FIGS. 601 and 602 (END20A & END20B). Hence, each of the four (total) aforementioned tungsten layers contacts (and thus electrically connects to (one uniquely associated polysilicon blade in the trench, these polysilicon blades being electrically conductive traces in their own right. The polysilicon blade traces (thus contacted by the tungsten layers through the gaps) lead toward the forward end of the trench, and are available there for connection to other traces on like center-to-center spacing, or continue through an array of structures, such as a memory cell array, for example, within which they serve as bus lines for certain signals. As mentioned earlier, this center-to-center spacing may be significantly below the photolithographic limit, while the center-to-center spacing between the orthogonal contacting tungsten layers may be fabricated so as to be above the photolithographic limit, thus permitting interconnection with these tungsten traces by conventional photolithographic methods.

FIGS. 604 and 605 (END22A & END22B) depict cross-sectional and top views, respectively, showing the results of a sequence of next subsequent steps where the upper surfaces of the wafer are first coated with positive photoresist, which forms a substantially flat upper surface, then the top surface is planarized by such means as chemical-mechanical polishing so as to cut the top of the wall substantially flat to the height of the lower silicon-dioxide surface originally deposited onto the wafer, as shown in FIG. 604 (END22A). Then the photoresist is dissolved. This leaves a mosaic pattern of silicon-dioxide, silicon-nitride and Parylene areas, all electrical insulator materials, surrounding mutually insulated, U-shaped tungsten structures, at the surface, as well as the polysilicon traces at the trench bottom, as shown in a top view in FIG. 605 (END22B). Each of the four tungsten structures END22.1, END22.2, END22.3 and END22.4 is connected to a different polysilicon trace at the trench bottom. While the widths and spaces of the polysilicon traces at the trench bottom are of sub-photolithographic dimensions, the U-shaped tungsten structures are of a size and arrangement such as to allow interconnecting them with a set of bus lines larger than the photolithographic limit and running orthogonally to the traces at the trench bottom, as delineated by dashed lines in FIG. 605 (END22B) and labeled END 22.5 to END 22.8, each connecting to corresponding polysilicon traces in many trenches and to a peripheral circuit.

Fan

As subsequently described, it is possible to provide a pattern in a masking layer of an integrated circuit wafer by photolithographic image transfer, where the pattern simultaneously provides a first set of reference locations for elongated structures with spacings and widths below the photolithographic limit, and a second set of reference locations for the ends of said elongated structures and for via structures, the reference locations of the second set being spaced above the photolithographic limit.

As subsequently described, it is possible to provide a set of parallel, elongated structures submerged below the surface of the wafer, with widths and spacings below the photolithographic limit and aligned with the first set of reference locations of the masking pattern, where the submerged structures consist of at least an insulated conductive trace each, the end of which is determined by one of the second set of reference locations.

As subsequently described, it is possible to fabricate a set of insulated conducting vias aligned by virtue of the second set of reference locations with the ends of the submerged structures one by one, where each via conductor contacts one of the conductive traces.

As subsequently described, it is possible to provide a set of vias spaced above the photolithographic limit and contacting one by one a set of conductive traces spaced below the photolithographic limit such as to provide a fan-out structure from sublithographic dimensions to larger than minimum photolithographic dimensions.

FIG. 606 (FAN3D1) is a three-dimensional depiction of a small cutaway section of an integrated circuit wafer where the following steps have been performed to create the indicated layers at appropriate thicknesses.

On a silicon wafer of P-type conductive crystalline silicon, a thin layer of N-type conductive crystalline silicon is epitaxially grown over the wafer's surface. These two layers are doped (and biased in later operation) so as to form a diode block which isolates the N-type layer from the lower P-type layer.

The upper portion of this N-type silicon layer is then thermally oxidized, such that the resulting thermal oxide can serve as a gate insulator for field effect transistors.

Above this thermal oxide, a thicker layer of polysilicon which is sufficiently doped N or P so as to be adequately conductive, according to engineering preference or interface requirements for the structure being fabricated, is next deposited by such means as CVD. This upper layer is fabricated so as to serve as a field effect transistor gate above the thermal oxide, so as to be able to cause an inversion layer to form at the silicon surface beneath the thermal oxide when voltage is applied to the conductive polysilicon layer.

A similarly thick layer of silicon-dioxide is next deposited above the aforementioned polysilicon layer.

A thick layer of polysilicon is next deposited above the aforementioned deposited silicon-dioxide layer.

A similarly thick top layer of silicon-dioxide is next deposited above the aforementioned thick polysilicon layer. This top layer is then patterned by conventional photolithographic means to serve as an etch mask. One end of a mask feature from which a trench will be formed is shown as the open region in the mask at FAN3D 1.1 in FIG. 606 (FAN3D1). The open region is tapered by a number of equally wide steps FAN3D1.2 down to a final width at FAN3D1.3 which is approximately 3/2 times the width of the steps.

The final width of the open region at FAN3D1.3 may be as small as the minimum feature size possible with the photolithographic process used, while the distance from the end of the opening to the first step and from step to step is chosen at least equal to two times the minimum feature size. Consequently, the step width, being equal to ⅔ of the final width at FAN3D1.3 of the open region may be as small as to ⅔ of the minimum feature size.

The minimum feature size possible with a photolithographic process depends on many factors, such as (1) the tolerance of the feature sizes in the master image residing on the photomask or the reticle, (2) the wave length of the monochromatic light used to transfer the image into the photoresist layer initially residing on top of the top silicon-dioxide layer, (3) the tolerance in the intensity of this light, (4) the resolution of the optical lens system used for the image transfer, (5) the tolerance of the sensitivity and contrast characteristics of the photoresist employed, (6) the tolerance in the image development process, and (7) the tolerance in the etch process of the top silicon-dioxide layer used to transfer the opening from the photoresist layer to the silicon-dioxide layer. The random length error increments added to or subtracted from the dimensions of the opening in the silicon-dioxide by these parameters typically are statistically independent, so that their variances add, and the distribution of each dimension is essentially normal, with the nominal dimension as its mean and the square root of the sum of the variances as its standard deviation. The minimum feature size of a process is a compromise between the economic advantage of a reduced feature size and the loss in manufacturing yield traceable to oversized or undersized features caused by the wafer-to-wafer process variations. A typical compromise is such that positive or negative deviations of less than three standard deviations from the nominal minimum feature dimension still produce acceptable product. This leads to minimum feature dimensions equal to about 15 to 30 standard deviations.

FIG. 607 (FAN1) is a two-dimensional depiction of the front end of FIG. 606 (FAN3D1), showing the cross-section of the full-width opening.

FIG. 608 (FAN2) depicts the results of a sequence of next subsequent steps where the upper polysilicon portion of the structure is selectively trench-etched as shown, and then a thin layer of silicon-dioxide is deposited by CVD.

In this and subsequent figures, interfaces of the silicon-dioxide layer deposited in this step with contiguous silicon-dioxide regions are not shown.

FIG. 609 (FAN3) depicts the results of a next subsequent step where a coating of Parylene whose thickness is approximately ⅙ the width of the trench is omni-directionally deposited over the exposed wafer surfaces.

FIGS. 610 and 611 (FAN4A and FAN4B) depict end (turned 90 degrees) and top views showing the results of a next subsequent step where the tops and bottoms of the Parylene deposited in the prior step are vertically etched away by such means as ion milling or reactive ion etching (RIE), leaving the walls of the stepwise tapered trench covered with a continuous layer of Parylene FAN4.1. FIG. 611 (FAN4B) and all subsequent figures with the "b" label show the top view of the small cutaway section of FIG. 606 (FAN3D1) processed to the respective point, while FIG. 610 (FAN4A) and subsequent figures with the A label show a two-dimensional depiction of the front end of the small cutaway section of FIG. 606 (FAN3D1) processed to the respective point, conventionally oriented with respect to the B-labeled figures.

FIGS. 612 and 613 (FAN5A and FAN5B) depict the results of a sequence of next subsequent steps where a layer of silicon-nitride whose thickness is approximately ⅙ of the width of the trench is omni-directionally deposited, then the tops and bottoms of the silicon-nitride layer are vertically etched away by such means as ion milling, then a thick layer of Parylene is omni-directionally deposited, reflowed and planarized as desired, so as to close out even in the widest part of the trench, then the Parylene is selectively etched so as to leave a protective plug FAN5.1 in the trench, and then the exposed silicon-nitride is selectively etched to leave a U-profile FAN5.2 in the trench, except in its narrowest part at FAN5.3, where the silicon-nitride has closed out to a single blade during its deposition.

FIGS. 614 and 615 (FAN6A and FAN6B) depict the result of a sequence of next subsequent steps where first all remaining Parylene is selectively etched away, then a thin layer of Parylene is omni-directionally deposited such as to close out only between the silicon-nitride structure and the trench walls, then the exposed Parylene is omni-directionally etched away, but with the closed-out regions remaining filled, then the tops and bottoms of the silicon-nitride layer are vertically etched by such means as ion milling, so as to leave a continuous blade structure as shown in cross-section at FAN6.1 and in its outline at FAN5.2 and FAN5.3, then the silicon-nitride structure is directionally etched by such means as ion milling or other etch method with sufficient directionality, with the beam directed parallel to the trench in the direction toward the tapered end and at a slight decline with respect to the wafer surface, so as to remove the silicon-nitride at the surfaces which are not parallel to the directional etch beam and leave gaps at FAN6.2, FAN6.3 and FAN 6.4 and finally all remaining Parylene is selectively etched away.

FIGS. 616 and 617 (FAN7A and FAN7B) depict the results of a sequence of next subsequent steps where a coating of Parylene whose thickness is approximately ⅑ the width of the trench is omni-directionally deposited over the exposed wafer surfaces (closing out between the walls and the silicon-nitride blades), then the tops and bottoms of the Parylene layer are vertically etched by such means as ion milling, then the Parylene is directionally etched by such means as ion milling or other etch method with sufficient directionality, with the beam directed parallel to the trench in the direction toward the tapered end and at a slight decline with respect to the wafer surface, so as to remove the Parylene at the surfaces which are not parallel to the directional etch beam and expose the fronts of the silicon-nitride blades at FAN7.1 and FAN 7.2.

FIG. 618 (FAN3D2) is a three-dimensional depiction of the processing state of FIGS. 616 and 617 (FAN7A &FAN7B), but with the right-hand part and the right-hand three layers in the trench removed, showing the vertical and horizontal steps in the Parylene and silicon-nitride layers, and the exposed fronts of the two silicon-nitride blades at FAN7.1 and FAN7.2.

FIGS. 619 and 620 (FAN8A and FAN8B) depict the results of a sequence of next subsequent steps where a coating of silicon-nitride whose thickness is approximately ⅑ the width of the trench is omni-directionally deposited over the exposed wafer surfaces (closing out in the narrow gap at FAN7.3), then the tops and bottoms of the silicon-nitride layer are vertically etched by such means as ion milling or other etch method with sufficient directionality down to the Parylene partitions and the silicon-dioxide floor, respectively, and then the silicon-nitride is directionally etched by such means as ion milling or other etch method with sufficient directionality, with the beam directed parallel to the trench in the direction toward the tapered end and at a slight decline with respect to the wafer surface, so as to remove the silicon-nitride at the surfaces which are not parallel to the ion beam and to sever the silicon-nitride bridge in front of the Parylene blade at FAN 8.1 and expose the front of this blade.

FIGS. 621 and 622 (FAN9A and FAN9B) depict the results of a next subsequent step where all remaining Parylene is selectively etched away.

FIGS. 623 and 624 (FAN10A and FAN10B) depict the results of a sequence of next subsequent steps where the exposed silicon-dioxide is vertically etched by such means as ion milling or other etch method with sufficient directionality, using the silicon-nitride partitions as a mask, and then the silicon-nitride blades are etched away by selective, omni-directional etching. The silicon-dioxide etching step also thins the top silicon-dioxide, which must initially be sufficiently thick to bear this step with adequate thickness for further processing remaining.

FIG. 625 (FAN11) depicts the results of a sequence of next subsequent steps where the exposed silicon is selectively trench-etched by such means as RIE, using the silicon-dioxide partitions as a mask, where such vertical etching means as ion milling is used to etch through the thin thermal oxide layer, to obtain the vertical blades at FAN 1.1, and then a layer of Parylene of such thickness as to close out the small trenches between and adjacent to the vertical blades is omni-directionally deposited.

FIG. 626 (FAN12) depicts the results of a sequence of next subsequent steps where first the tops and bottoms of the Parylene layer are ion milled to expose the silicon-dioxide tops, then the exposed silicon-dioxide is selectively etched to a depth such that the silicon-dioxide layers at the tops of the vertical blades above the polysilicon at FAN12.1 are completely removed. This procedure further thins the top silicon-dioxide, which needs to have been sufficiently thick for an adequately thick layer of silicon-dioxide to remain.

FIG. 627 (FAN13) depicts the results of a next subsequent step where all remaining Parylene is removed by omni-directional selective etching.

FIGS. 628 and 629 (FAN14A and FAN14B) depict the results of a sequence of next subsequent steps where a layer of silicon-dioxide is omni-directionally deposited over the exposed wafer surfaces by such means as CVD, so as to close out between the short vertical blades remaining from the prior step, and then the tops and bottoms of the silicon-dioxide layer deposited last have been vertically etched away by such means as ion milling other etch method with sufficient directionality, to expose the polysilicon tops FAN 12.1 of the short vertical blades imbedded between the closed-out silicon-dioxide spacers shown at FAN14.1 at the bottom of the trench, but where the wafer outside the trench bottom is still covered with silicon-dioxide.

In this and subsequent figures, the interfaces of the silicon-dioxide layer deposited in this step with contiguous silicon-dioxide regions are shown.

FIGS. 630 and 631 (FAN15A and FAN15B) depict the results of a sequence of next subsequent steps where silicon-dioxide is first directionally deposited by means mentioned earlier, such as collimated sputtering, with the beam directed parallel to the trench in the direction toward the tapered end and at a slight decline with respect to the wafer surface so as to deposit only on the surfaces normal to the beam at FAN15.1, FAN15.2, FAN15.3 and FAN15.4, then spurious silicon-dioxide depositions on other surfaces are removed by a short, selective, omni-directional silicon-dioxide etch, then tungsten is directionally deposited by the same means, in the same direction and covering the same surfaces on top of the silicon-dioxide, and then spurious tungsten depositions on other surfaces are removed by a short, selective, omni-directional tungsten etch.

FIGS. 632 and 633 (FAN16A & FAN16B) depict the results of a sequence of next subsequent steps where a thick layer of Parylene is omni-directionally deposited on the top surface of the wafer such as to close out even in the widest part of the trench, then the top surface is planarized by such means as chemical-mechanical polishing so as to cut the surface substantially flat to the height of the remains of the silicon-dioxide surface originally deposited onto the wafer, as shown in FIG. 632 (FAN16A). This leaves a mosaic pattern of silicon-dioxide and Parylene areas, all electrical insulator materials, surrounding mutually insulated tungsten areas at the surface, as shown in FIG. 633 (FAN16B). Each of the four tungsten areas FAN16.1, FAN16.2, FAN16.3 and FAN16.4 is connected to a different polysilicon trace at the trench bottom. While the widths and spaces of the polysilicon traces at the trench bottom are of sub-photolithographic dimensions, the tungsten areas are spaced such as to allow interconnecting them with a set of bus lines larger than the photolithographic limit, running on the top surface orthogonally to the traces at the trench bottom. These bus lines are delineated by dashed lines in FIG. 633 (FAN16B) and labeled FAN16.5 to FAN16.8. Each such line connects to corresponding polysilicon traces in many trenches and to a peripheral circuit.

On sub-lithographic dimensions: This interface allows lines and spaces fixed to ⅓ the minimum feature dimension of a lithographic process, because a line and two spaces fit into the narrowest end region of the trench, the width of which can be at the lithographic limit. In fact, the lines and spaces are only ⅓ of the width of the trench left after oxide deposition at step FAN2, which is less than ⅓ the lithographic limit. However, even assuming that the thickness control of deposited layers is much better than the dimension tolerance of photolithography, the entire photolithographic tolerance appears in the width of the center feature of each step of the taper. This center feature is an insulating spacer, except at the narrowest end where it is the conductor trace. While conductors and insulators can stand more tolerance than dimensions which determine transistor characteristics, the center spacer of the full-width trench may be a trench of the cell array, where accuracy of width is important and may require backing off from the minimum feature size possible. One of the favorable aspects is the ability of making the steps of the taper smaller than the photolithographic limit, because the different widths of the initial opening track very closely with one-another, and in a given taper the deviations of all widths of the opening from their nominal values are the same. These deviations are random from wafer to wafer, from chip to chip, and from trench to trench, with decreasing standard deviation.

On information transfer with photolithography: We are using photolithography in an unconventional way, because we transfer information regarding which of multiple vertical wiring patterns we wish to select. In our cell technology the information is contained in the width of the trenches, leading to A-, B-, C- and sometimes D-trenches. In the stepped taper, the widths convey the information on number of lines remaining, while the steps contain the information for the locations of the vertical vias. Thus, information is contained in both the horizontal and the vertical features of the taper pattern. This saves the complexities of defining via locations by thicknesses of deposited layers.

VI. PILLAR-TO-PILLAR INTERCONNECTIONS

As subsequently described, it is possible to create the equivalent of a schematic cross-over or "X" connection which in this case interconnects electrical contact points at the tops of two (2) adjacent pillars. No further lithography is used to do this beyond the intitial lithographic step which defined the pillars.

FIGS. 634, 635 and 636 (BP-DC.H, BP-DC.DC and BP-DC.BA) depict the lower region of the pillars of the aforementioned 20 layer high SRAM cell, where now only layers 1N through 11N are present in the pillars BP-DC.1, along with the associated structures to the sides of these layers. In these and the subsequent figures which continue the processing algorithm, wider D trenches are shown to the left of the pillars in the D and C trench figures (DC). These trenches should be wider than shown in theses schematic representations to allow for close-out of unwanted cusps formed when closing out C trenches in subsequent process steps. D trenches more than ⅘ the width of the C trenches are necessary to accomplish this. (Note that in the cross-sectional view of FIG. 634 the standoff insulator shown in the A trench is not depicted as thick as it would be in a more detailed drawing.)

Chemical-mechanical polishing offers a particularly useful means of planarization where planarization is called out below. Etches called out below are selective for the materials being etched, against the other materials present. Parylene depositions can be reflowed slightly after deposition to remove voids where desired.

The following step sequence represents a fabrication algorithm similar to the aforementioned step sequences. The drawings show the progression of the status of the structure after the respective steps of the sequence have been performed. In the figures, Parylene regions are represented by light, left-slanted hatching, thick silicon-nitride regions are represented by dark, right-slanted hatching, and other regions are labeled by AU for gold, Cu for copper, NIT for silicon-nitride, OX for silicon-dioxide, SI for silicon and W for tungsten.

FIGS. 637, 638 and 639 (X0.H, .DC & .BA) depict upward extensions X0.1 of region 11N on two adjacent pillars, with nearby pillars also partially shown. Below these extensions, regions 1N through 11N exist as before, up to the mid-point of region 11N. Above the mid-point of region 11N, the extensions have been created by adding additional height to the pillars when they were originally formed, and processing them in the manner of the mid-point of region 11N, so that they are merely continuous, upward extensions of the pillars and wiring shown at the mid-point of region 11N. As shown, every other C trench X0.2 has been widened. These new widened C trenches are now referred to as "D trenches" X0.3 in the subsequent text.

FIGS. 640, 641 and 642 (XU1.H, .DC & .BA) depict the results of a next subsequent step (group of operations) where the following operations are sequentially performed:

- Set a Parylene piston part way up the upper extended pillar section, so as to accomplish the next operation in this step, to facilitate creation of the structure shown in FIG. 642 (XU1.BA).
- Omni-directionally etch away tungsten and silicon-dioxide where exposed above the Parylene piston height.
- Lower the Parylene piston to the height shown at the bottom of FIGS. 641 and 642 (XU1.DC & .BA).

Alternatively to leaving this upward extension of the silicon pillar, the top of the pillar may be planarized to leave the exposed tungsten and thermal silicon-dioxide at the height just described, then the pillar may be "grown" upward to the desired height with silicon (such as amorphous silicon) using the directional deposition technique described subsequently as associated with the step of FIG. 646 (XTC1).

FIGS. 643, 644 and 645 (XU2.H, .DC & .BA) depict the results of a next subsequent step (group of operations) where the following operations are sequentially performed:

- Set a Parylene piston at the prior height part way up the extended pillar section, as shown in FIG. 640 (XU1.BA) in the prior step, or retain the original piston height from the start of the prior step without subsequently lowering it to facilitate having the piston at the same height.

Omni-directionally etch back the silicon.

Omni-directionally deposit silicon-nitride to expand the upper extension of the pillar back to the prior cross-section, as shown in FIG. 643 (XU2.H).

Vertically etch away the exposed horizontal surfaces of this silicon-nitride deposition.

Close out all trenches with Parylene and/or fill with a suitable photoresist and planarize the top surface, stopping just past the silicon at the tops of the pillars as the end point.

Lower the Parylene/photoresist level to the height shown at the bottom of FIG. 645 (XU2.BA).

As subsequently described and shown in FIGS. 646, 647 and 648 through 655, 656 and 657 (XTC1–XTC4), it is possible to create a coating (in this case a protective coating) on the tops of pillars, but not on the pillar or trench sides or in the bottoms of the trenches without use of lithography.

FIGS. 646, 647 and 648 (XTC1.H, .DC & .BA) depict the results of a next subsequent step (group of operations) where the following operations are sequentially performed:

Set a Parylene piston just above the bottom of the silicon-nitride coating applied in the prior step.

Vertically directionally deposit (straight down) gold XTC1.1 by such means as collimated sputtering with an extended collimator so as to vertically coat the exposed horizontal surfaces straight up from the bottom, so as to extend the tops of the pillars directly upward as shown in FIG. 647 (XTC1.DC) and FIG. 648 (XTC1.BA), with the same cross-section as the lower pillar as shown in FIG. 646 (XTC1.H). The gold coating needs to be thin enough relative to the current depth of the trench to allow the silicon-dioxide coating of the next step to completely cover the sides of the gold on the tops of the pillars, but so as not to require the overspray of such a silicon-dioxide coating to cover much of the horizontal surfaces at the current bottom of the trench. (See the issues regarding shadowing for the silicon-dioxide coating as discussed in the next step.)

A brief etch of gold is useful at this point to remove overspray and stringers.

FIGS. 649, 650 and 651 (XTC2.H, .DC & .BA) depict the results of a next subsequent step where the following operation is performed:

Directionally deposit silicon-dioxide XTC2.1 (by such means as collimator-sputtered quartz with an extended collimator and subsequent etch-back of any misdirected deposition) at a deposition angle starting from just above the plane of the wafer, down toward the wafer at a suitable downward angle to accomplish the following result, from the four separate planar view directions shown in FIG. 649 (XTC2.H) as CTH1, CTH2, CTH3 and CTH4. These four coating angles are directed so as to protectively coat the tops and sides of the gold on the tops of the pillars, but so as not to significantly coat the gold which was deposited at the current bottoms of the trenches.

When the deposition is directed from one of the deposition angles such as CTH1, the deposition is shadowed by the nearby intervening pillars. Shadowing from such pillars which are nearer a given pillar being coated cause the coating to only extend a little bit down such a pillar being coated. Shadowing from such pillars which are farther away from a given pillar being coated cause the coating to extend much farther down such a pillar being coated. Pillar, trench and gold coating dimensions must be selected so as to allow such shadowing to completely coat the tops and sides of the upper gold layers on the tops of the pillars, but so as not to cover much of the lower gold coating the horizontal surfaces at the current bottoms of the trenches. When this lower gold is partially coated, it must not be coated so much as to substantially cover the trench at any location from one side of the trench to the other side. In other words, as long as the gold coating the horizontal surfaces at the current bottom of the trenches is still exposed at least down the middle of the trench, then the subsequent step which etches this lower gold coating away can be implemented as long as the omni-directional selective etchant can reach the gold under and around any silicon-dioxide overspray which ends up over-coating some of the sides of this lower gold coating. The deposition angles should be picked so as to accomplish the desired result as described above. The deposition angles shown which project in the planar directions shown by CTH1, CTH2, CTH3 and CTH4 are at an approximate slope of 1 unit into the drawing and 0.708 units over to the side, as the line approaches the orthogonal axis line shown between X1 and X2. When deposited at these planar angles, any associated downward angle will result in incidence on pillar walls which varies approximately between a factor of 1 to a factor of around 5 down the wall from the top, due to shadowing from the sides of various other pillar tops which are in the line of deposition. It is therefore appropriate to pick the associated downward angle so that, relative to the gold thickness, the minimum downward coverage (the factor of 1 shown here) is sufficient to coat the sides of the upper gold layer, but to ensure that the maximum downward coverage does not cover too much of the lower gold in the trench. A discussion of deposition angles and shadowing which develops some of the considerations for this step is elaborated for the subsequent steps of FIGS. 685, 686, 687, 688 and 689 (XAD1, XAD2 and XAD3).

FIGS. 652, 653 and 654 (XTC3.H, .DC & .BA) depict the results of a next subsequent step where the following operation is performed:

Omni-directionally etch any still exposed gold at XTC3.1 to remove it from the bottoms of the trenches.

FIGS. 655, 656 and 657 (XTC4.H, .DC & .BA) depict the results of a next subsequent step where the following operation is performed:

Omni-directionally etch silicon-dioxide to remove the silicon-dioxide protective coating applied in the step leading to FIG. 649 (XTC2).

As subsequently described, it is possible to etch a closed-out region between two pillars in from the sides, while the top remains protected. It is possible to use this techninique to define vertical features such as wiring which runs up and down the sides of pillars.

FIGS. 658, 659 and 660 (XWR1.H, .DC & .BA) depict the results of a next subsequent step (group of operations) where the following operations are sequentially performed:

Lower the Parylene level to the height shown in FIG. 659 (XWR1.DC) and FIG. 660 (XWR1.BA).

Omni-directionally deposit tungsten XWR1.1 (coat is shown thicker than desired for clarity).

Omni-directionally deposit Parylene to close the A and B trenches and gap the C and D trenches.

Etch back the exposed Parylene to clear the C and D trenches while the A and B trenches remain closed.

Vertically directionally deposit a fairly thin coat of gold XWR1.2 straight down, as with the FIGS. 646, 647 and 648 (XTC1) gold deposition.

Coat the tops of the pillars with silicon-dioxide, as with FIGS. 649, 650 and 651 (XTC2).

Clear the lower gold not coated with silicon-dioxide, as with FIGS. 652, 653 and 654 (XTC3).

Clear the silicon-dioxide coating on the upper pillar portions, as with FIGS. 655, 656 and 657 (XTC4).

FIGS. 661, 662 and 663 (XWR2.H, .DC & .BA) depict the results of a next subsequent step where the following operation is performed:

Etch back the exposed Parylene (mostly from the sides in the A and B trenches) to cover the desired width of the tungsten trace to be subsequently formed as shown in FIG. 661 (XWR2.H).

FIGS. 664, 665 and 666 (XWR3.H, .DC & .BA) depict the results of a next subsequent step where the following operation is performed:

Omni-directionally etch back the tungsten to the desired width as shown behind the narrow Parylene vertical strips as shown in FIG. 664 (XWR3.H), so as to leave tungsten strips XWR3.1 running vertically up and down the upper portions of the pillars, where these lines electrically contact and extend the wiring of the lower layers upward. (Artifacts of these vertical tungsten strips are removed in later steps.)

FIGS. 667, 668 and 669 (XWR4.H, .DC & .BA) depict the results of a next subsequent step (group of operations) where the following operations are sequentially performed:

Etch away exposed gold.

Fill with a suitable filler such as photoresist and planarize the top surface, stopping at the silicon at the tops of the pillars as the end point.

Reset the Parylene or filler piston height down to just below the bottom of the horizontal crossover connections linking the new vertical tungsten wiring extensions.

FIGS. 670, 671 and 672 (XWR5.H, .DC & .BA) depict the results of a next subsequent step (group of operations) where the following operations are sequentially performed:

Recreate the gold top caps as with FIGS. 646, 647 and 648 (XTC1) through FIGS. 655, 656 and 657 (XTC4).

Set a Parylene piston to a height so as to allow vertical etching of the subsequent silicon-dioxide coating to terminate this silicon-dioxide coating at the knee XWR5.1 where the tungsten extends out as it covers the lower vertical wiring.

Omni-directionally deposit a thin coating of silicon-dioxide.

Vertically etch away the exposed tops and bottoms of this silicon-dioxide coating, leaving the aforementioned tungsten knees protected from above.

(See the next step for action on horizontal cross-connecting trace XWR5.2.)

FIGS. 673, 674 and 675 (XWR6.H, .DC & .BA) depict the results of a next subsequent step (group of operations) where the following operations are sequentially performed:

Lower the Parylene height to just below the bottom of the tungsten horizontal cross-connecting traces XWR5.2 of FIG. 672 (XWR5.BA), and vertically etch away these horizontal cross-connecting traces.

Set a Parylene piston at a height at the bottom of the aforementioned silicon-dioxide protective coating.

Omni-directionally etch away the aforementioned silicon-dioxide coating.

FIGS. 676, 677 and 678 (XWR7.H, .DC & .BA) depict the results of a next subsequent step (group of operations) where the following operations are sequentially performed:

Set a Parylene piston at the bottom of the gold caps.

Etch back the gold exposed above the Parylene.

Fill with a suitable filler such as photoresist and etch down the upper surface by planarization, stopping at the exposure of silicon at the tops of the pillars as the end point. (The prior steps for FIGS. 676, 677 and 678 (XWR7) can be accomplished by this step, and are hence optional.)

FIGS. 679, 680 and 681 (XWR8.H, .DC & .BA) depict the results of a next subsequent step where the following operation is performed:

Set a Parylene piston just below the bottoms of the tungsten vertical wiring extensions created in the steps illustrated in FIGS. 658, 659 and 660 (XWR1) through FIGS. 673, 674 and 675 (XWR6). This height will be below the bottom of the subsequently created copper wall by a distance equal to the gap between the copper wall and the adjacent pillars.

FIGS. 682, 683 and 684 (XWL.H, .DC & .BA) depict the results of a next subsequent step (group of operations) where the following operations are sequentially performed:

Omni-directionally deposit Parylene so as to close out the A, B and C trenches and leave the D trench gapped.

Omni-directionally etch back the Parylene exposed in the D trench to leave the gap in the D trench at the thickness of the subsequently created copper wall XWL.1.—

Omni-directionally deposit copper by such means as CVD so as to close out in the D trenches (the A, B and C trenches remain closed out).

Fill with a suitable filler such as photoresist and planarize the tops of the copper down, stopping on the exposed silicon at the tops of the pillars. Note that sufficient planarization of the tops of the pillars and walls provides a repeatable reference to hit desired heights in the subsequently described directional depositions at the steps associated with FIGS. 685, 686 and 687 (XAD1) through FIG. 689 (XAD3). The primary requirement of these directional depositions will be that they hit reasonably predictable relative levels, not that the levels have an absolute precision regarding height.

Set a Parylene piston at a height just below the desired bottom of lower conductive link XF1.1 of FIGS. 705, 706 and 707 (XF1) which is to be subsequently formed.

As subsequently described, it is possible to selectively coat the sides of vertical structures such as pillars using a wall structure as a masking aid.

As subsequently described, it is possible to selectively coat the sides of vertical structures such as pillars so as to leave coated or exposed regions in desired locations without lithography. These coated or exposed regions may be used insulate or permit electrical contact to underlying regions, thereby permitting selective electrical contact by subsequently applied wiring.

FIGS. 685, 686, 687 and 688 (XAD1 & XAD2) depict the deposition angle (see lines XAD2.1) and results of the following deposition operations:

Directionally deposit silicon-dioxide by such means as collimated sputtering with an elongated collimator at the planar angle shown as TH1 (top) in FIG. 685 (XAD1.H), with TH9 (side) in FIG. 686 (XAD1.DC), as shadowed by the walls and intervening pillars, so as to coat the pillar regions shown in accordance with the deposition path lines shown in FIG. 688 (XAD2). (The thickened deposition path lines represent the longest XAD2.2 and shortest XAD2.3 distances from the wall XWL.1 to the sides of the nearest path perpendicular to the wall, and adjacent to the wall. The depth from the tops of the pillars down to the lowest incidence point is directly proportional to the relative lengths of these lines. The wall edges in FIG. 688 (XAD2) are depicted as paired lines XAD2.4 so that it can be seen that the walls can have somewhat different thickness—choose one line or the other to represent the wall edge—and still shadow properly for the desired effect.)

FIGS. 685, 686, 687 and 689 (XAD1 & XAD3) depict the deposition angle XAD3.1 and results of the following deposition operations:

Directionally deposit silicon-dioxide by such means as collimator sputtering with an elongated grill at the planar angle shown as TH2 in FIG. 685 (XAD1.H) with the downward angle equivalent to TH9 in FIG. 711 (XAD1.DC), as shadowed by the walls and intervening pillars, so as to coat the pillar regions shown in accordance with the deposition path lines shown in FIG. 689 (XAD3).

Regarding FIGS. 685, 686 and 687 (XAD1):

Directionally deposit silicon-dioxide by such means as collimated sputtering with an elongated collimator at the planar angle shown as TH3 with a downward angle sufficiently steep so as to hit the sides of the pillar walls at the height of the Parylene when shadowed by the walls, so as to coat the exposed pillar sides.

Perform the preceding step from the opposing planar direction shown as TH4 with the same steep downward angle.

FIGS. 690, 691 and 692 (XAD4.H, .DC & .BA) depict the results of a next subsequent step (group of operations) where the following operations are sequentially performed:

The above operations of FIGS. 685,686 and 687 (XAD1), FIG. 688 (XAD2) and FIG. 689 (XAD3) result in a protective silicon-dioxide coating XAD4.1 which surrounds the pillars at a height just above the Parylene height as shown in FIG. 690 (XAD4.H), at the height of the cross-section shown in FIG. 691 (XAD4.DC) and FIG. 692 (XAD4.BA) as X1–X2 and Y1–Y2, respectively.

As a reminder, sufficient planarization of the tops of the pillars and walls provides a repeatable reference to hit desired heights in the subsequently described directional depositions at the steps associated with FIGS. 685,686 and 687 (XAD1) through FIG. 689 (XAD3). The primary requirement of these directional depositions will be that they hit reasonably predictable relative levels, not that the levels have an absolute precision regarding height. Additionally, the TH1 and TH2 depositions, because they are at the shallower deposition angle of TH9, are shadowed by the wall when they deposit on the pillars nearest the wall. They are substantially not shadowed when they deposit on the pillars in the second rows which are farther away from the wall. The combination of TH1 and TH2 at the shallower angle, with TH3 and TH4 at the steep angle, results in a coating all around the tops of the pillars, and around most of the bottoms of the pillars, but leaving gaps to the sides of the tungsten wiring near the bottoms of the pillars on the sides nearest the walls. Thus, gaps in the silicon-dioxide coating are created where the deposition path lines from the wall to the pillars shown in FIG. 688 (XAD2) and FIG. 689 (XAD3) were shortest, since the regions very low on the pillar section shown are not coated near the sides of the tungsten traces. In the regions of the pillars immediately above the tops of the Parylene pistons, the coating surrounding the pillars at the level of the section shown is approximated by the coating labeled "OX" depicted in FIG. 690 (XAD4.H). The gaps shown in the coating next to the sides of the tungsten vertical wiring represent the aforementioned directional deposition gaps, which are the object of the aforementioned silicon-dioxide coating process. The silicon-dioxide coating thus surrounds the pillars at the lower level above the Parylene piston everywhere except in these gaps, creating an insulation coating on the pillar walls everywhere except at the two shown sides of the tungsten vertical wiring on the opposing sides of the opposing pillars shown at the level indicated in the cross-section described by X1–X2 and Y1–Y2. This silicon-dioxide deposition process is adjusted so as to cause these unique gaps to be formed in the appropriate locations, thereby allowing a subsequently created conductive interconnecting trace to be formed in later steps, so as to wrap around the outside of each pair of side-by-side pillars, thereby interconnecting the sides of the tungsten traces exposed in the gaps. The bottoms of these conductive interconnecting traces are just above the top of the current Parylene piston level, and the tops of these traces are only slightly higher than the bottoms.

The portion of this silicon-dioxide "over-spray" coating covering the horizontal exposed surfaces is then selectively vertically etched away.

The Parylene pistons are then reset at a height a little above the level where tops of the aforementioned conductive traces will be formed.

The silicon-dioxide coating above the Parylene pistons is then selectively stripped away.

The silicon-dioxide deposition sequence performed in steps FIGS. 685,686 and 687 (XAD1) through FIGS. 690, 691 and 692 (XAD4) is then repeated for different angles of deposition, where the deposition angles TH1 and TH2 are replaced with deposition directions TH5 and TH6, with the associated downward angle TH9 being replaced with the downward angle shown as TH10 for the shallower angle depositions, and the deposition angles TH3 and TH4 being replaced by the deposition angles TH7 and TH8 at or near the same steeper downward deposition angle as before. This new silicon-dioxide directional deposition sequence forms a coating on the upper portions of the pillars with the insulative coating and gaps substantially equivalent to those in the prior lower directional silicon-dioxide deposition sequence. In this new sequence, however, the contact gaps for the tungsten vertical wiring are formed on opposite sides of the pillars from the contact gaps formed in the prior lower level deposition sequence. This allows a second set of horizontal conductive traces to be formed above the lower conductive traces, just above the top of the current Parylene piston setting, and with the tops of these higher conductive traces formed a little bit above the bottoms. Other than the contact points to the tungsten vertical wiring, the higher second set of conductive linking traces will follow substantially the same planar path (when viewed from the top) as the previously described lower linking conductive traces.

The portion of this silicon-dioxide coating covering the horizontal exposed surfaces is then selectively vertically etched away.

FIGS. 693, 694 and 695 (XAD5.H, DC & .BA) depict the results of a next subsequent step (group of operations) where the following operations are sequentially performed:

Parylene pistons are then set at a height at just above the bottoms of the copper walls.

The copper walls are then selectively etched away. Various appropriate wet etchants may be used for etching copper selectively against the other materials exposed at this step, such as $HNO_3$ or $HClO_4$.

In the foregoing sequence, while the copper walls are present, selective etchants previously recommended for use elsewhere are appropriate for these steps where tungsten is not being selectively etched.

FIGS. 696, 697 and 698 (XTP.H, .DC & .BA) depict the results of a next subsequent step (group of operations) where the following operations are sequentially performed:

Gold caps XTP.1 are again formed at the tops of the pillars by vertical angular deposition and associated deposition and etching steps described in the prior sequence FIGS. 646,647 and 648 (XTC1) through FIGS. 655, 656 and 657 (XTC4).

FIGS. 699, 700 and 701 (XPC1.H, .DC & .BA) depict the results of a next subsequent step (group of operations) where the following operations are sequentially performed:

The Parylene piston height may be reset at this point to form an appropriate bottom reference for the following steps.

A coating of Parylene is then omni-directionally deposited so as to close out the A and B trenches, while leaving the C and D trenches gapped.

An omni-directional deposition of silicon-nitride XPC1.1 is then deposited so as to close out between the walls of the C trenches with the slight gap holes shown between coating cusps in the C trench between pillars, but with the D trench remaining totally gapped.

(See the next step for action on vertical holes XPC1.2 at the cusps.)

FIGS. 702, 703 and 704 (XPC4.H, .DC & .BA) depict the results of a next subsequent step (group of operations) where the following operations are sequentially performed:

Omni-directionally etch silicon-nitride so as to remove the thickness of the silicon-nitride coatings exposed in the gapped D trenches and in and around the vertical holes XPC1.2 at the cusps between pillars in the C trenches, but leaving the closed-out coatings XPC4.1 between pillars in the C trenches.

Close out all gapped trenches with Parylene or fill with a suitable photoresist.

Planarize so as to etch down to the silicon pillar tops (thus removing the gold caps).

Etch the Parylene (or other filler) down to the desired height to allow the bottom of the subsequently created lower ring wiring to be at the appropriate height.

Omni-directionally deposit Parylene so as to close out between the remaining partitions of the closed-out coatings XPC4.1 and adjacent pillars in the C trenches.

Etch this Parylene back equal to the deposition thickness, leaving remnants XPC4.2 in the C trench as shown, and the tops of the Parylene pistons at a height equal to the bottom of the lower ring to be subsequently formed.

FIGS. 705, 706 and 707 (XF1 .H, .DC & .BA) depict the results of a next subsequent step (group of operations) where the following operations are sequentially performed:

Directionally deposit gold from various suitable angles so as to hit all sides of the pillars and leave the desired thickness of the gold rings being created. (Alternatively, a CVD deposition of copper or another metal may be substituted for the gold here and in subsequent gold depositions for this and the following step, provided suitable selective etchants for this copper or such other metal are substituted in the subsequent etching operations.)

Vertically etch away the exposed horizontal surfaces of this gold coating.

Close out all open trenches with Parylene (and/or fill with a suitable photoresist).

Set a Parylene (or resist) piston height at the top edge height desired for the lower ring being created.

Omni-directionally etch away the gold above this piston height, leaving the gold conductive interconnecting ring desired, where this ring contacts the sides of the tungsten vertical wiring exposed in the two gaps on the opposite sides of adjacent pillars, thereby electrically linking the two contact points exposed in these two gaps to form what schematically would amount to a cross-over electrical connection (see lower conductive link XF1.1).

FIGS. 708, 709 and 710 (XF2.H, .DC & .BA) depict the results of a next subsequent step (group of operations) where the following operations are sequentially performed:

Reset the Parylene piston level to the desired height to form the bottom of the upper ring.

Again perform the steps analogous to the last two steps for FIGS. 702, 703 and 704 and to all steps for FIGS. 705, 706 and 707 (XF1) so as to form a second, higher ring. This second ring, upper conductive link XF2.1, electrically links the two contact points exposed in the two gaps on the opposite sides of the pillars from those accessed in the FIGS. 705, 706 and 707 (XF1) steps, thereby forming what schematically amounts to a cross-over electrical connection in a second crossing direction above the lower cross-over connection. Schematically, the combination of these two connections amounts to an “X” linkage which interconnects the exposed wiring on opposing sides of adjacent paired pillars.

FIG. 711 (XFX) depicts a completed cell structure showing the pillar structures XFX.1 where dotted lines denote the alternately doped crystal layer divisions 1N through 11N, where XFX.2 depicts a lower word line, where XF1.1 depicts the lower conductive link, where XF2.1 depicts the upper conductive link, and XFX.3 depicts the region of vertical wiring.

VII. SCALING DOWN

In the aforementioned drawings as subsequently discussed, dimensional relationships shown in the drawings represent relative scaling of the structures shown in one anticipated embodiment. These dimensions may be varied according to engineering preference.

Scaling Down of Wiring Planar Surface Area

As described earlier in the A and B trench process descriptions for the 20-layer pillar memory cell (as in FIG. 201 (B45), FIG. 269 (A42) and FIG. 272 (AT1) and other aforementioned examples), and also for the previously discussed folded-over 11-layer variation on this cell, vertical conductive wiring is created up and down the sides of each pillar. This wiring electrically connects various transistors (FETs in this case) to one another. In a more detailed sense, this wiring electrically connects various different doped regions, or differently doped regions and gates, of 2, 3, 4, or as many as transistors together, depending on whether one considers a short section of the wiring, or all the wiring. This wiring runs up and down a straight vertical side of each pillar. This wiring stands off from the side of each pillar by a distance which varies depending on whether it contacts the pillar surface, contacts a gate layer, or is stood off by insulator sufficiently to prevent conductive channels from forming in underlying silicon regions of the pillar in response to potentials applied to this conductive wiring. Although the standoff coatings should preferably be three or more times the thickness of the gate layers, the wiring and other underlying coatings can be made very thin. Modern conventional deposition techniques such as atomic layer epitaxy (ALE) can create layers that are less than a nanometer thick. Other, conventional deposition techniques can be controlled down to nanometer dimensions. When viewed from the top, such thin vertical wiring occupies a very minimal planar surface area, nevertheless it is at the same time wiring for interconnecting from 2 to 5 transistors. Even when the wiring has not been etched in from the sides of the deposition (as previously discussed in FIGS. 292 through 304 (CS1 through CS5)), the planar surface area occupied can be made very small due to the extreme thinness of the layers constituting the wiring and gate structures. When the wiring has been etched in further from the sides as described in the foregoing description, the planar surface area occupied can be made even smaller. Here and in the following discussion, the phrase "planar surface area" is used to refer to the area of the vertical projection of the wiring structure under discussion onto the planar surface of the wafer (or the die if the wafer has been cut).

With conventional optical lithographic fabrication techniques with the capability of a minimum lithographic groundrule limit of 0.25 microns, planar surface areas occupied which can form and wire 2 transistors can be as small as 1.6 square microns, 1.5 times that (2.4 square microns) for 3 transistors, 2 times that (3.2 square microns) for 4 transistors, or 2.5 times that (4.0 square microns) for 5 transistors. Hence, planar surface areas occupied by the wiring for 2 conventional transistors can be as small as 1.6 square microns, 1.5 times that for 3 transistors, 2 times that for 4 transistors, or 2.5 times that for 5 transistors. Non-optical lithographic fabrication techniques can permit smaller minimum lithographic groundrule limits, with the dimensions of various sized features being proportionally reduced, or "scaled down", and with planar surface areas occupied by the aforementioned examples of transistors and wiring scaling down with the square of the reduction in the minimum lithographic groundrule limit. Here and in the following discussion, "lithographic" is used to refer to the complete range of various techniques available to transfer patterns to the surfaces of integrated circuits being fabricated, so as to allow fabrication of a complete integrated circuit. Likewise, the minimum lithographic feature sizes discussed here and in the following discussion refer to the minimum dimensions at which complete circuitry can be fabricated (components, wiring and power connections), not to the minimum dimension for a feature on a single surface such as might be produced by a single mask or the writing of a beam.

With the aforementioned pillar circuits shown as memory cells, a 0.25 micron lithographic groundrule limit allows a minimum dimension for the smallest structure feature shown which is lithographically patterned, in this case the A trenches or pillar widths in the narrower axis, to be 0.25 microns. As in the figures, the pillar width in the wider dimension would then be 5/3 of that, or 0.42 microns (i.e. a pillar 0.25(0.42 square microns in cross-section). The greatest thickness of the vertical wiring coatings on the sides of the pillars in the A or B trenches would be the greatest sum of the thicknesses of the coatings shown, proceeding out from the side of a given pillar. In this case this would be the sum of the thickness of the thermal silicon dioxide coating, plus the thickness of the standoff silicon dioxide, plus the thickness of the two overlapping tungsten wiring layers as shown for example horizontally adjacent to the junction of layers 17N and 18P in FIG. 269 (A42). When these coatings are 10 nm for the thermal silicon-dioxide coating, plus 30 nm for the thickness of the standoff silicon-dioxide, plus 25 nm each for the thickness of the two overlapping tungsten wiring layers, then the total thickness at that point would be 90 nm. From top to bottom of a straight-sided pillar, 100 nm would be a round number for the horizontal excursion of the tungsten wiring as shown in FIG. 272 in ATI (note that ATI denotes more than one such wiring structure) and in FIG. 295 at CS2B, allowing for variations in coating thickness and some wall anomaly. Hence, for a pillar 0.42 microns wide with such a 100 nm (0.1 microns) thick wiring structure, the total planar surface area taken up by this wiring structure would be 0.042 square microns (0.42(0.1) even before side etch-back (as FIGS. 292 through 304 (CS1 through CS5)) had been performed as previously described to further narrow the structure. It will be noted that the structure shown wires (interconnects) 2, 3, 4, and even 5 transistors within this 0.042 square micron total planar surface area. It will be further noted that this is an improvement over the aforementioned 1.6 square microns for 2 transistors to 4.0 square microns for 5 transistors wired by conventional methods.

Availability of optical and other lithographic methods which allow smaller groundrules allow placement of from 2 to 5 transistors in less planar surface area. For smaller lithographic groundrule limits, minimum planar surface areas to form and wire 2, 3, 4 or 5 conventional transistor structures can be scaled down from the aforementioned 1.6 to 4.0 square microns, and likewise pillar widths in each of the two planar axes can also be scaled down with the lithographic groundrule limit. For example, using rounded numbers and scaling down by the ratio of the square of the minimum lithographic groundrule dimension, for the following groundrules, 2, 3, 4 and transistors could be conventionally wired in as little as the following planar surface areas:

Table: Minimum Planar Surface Areas for 2 to 5 Transistors Vs. Minimum Groundrule Dimensions (MIN GRD)

| MIN GRD | 2 TRANS | 3 TRANS | 4 TRANS | 5 TRANS |
|---|---|---|---|---|
| 0.25 μm | 1.6 $\mu m^2$ | 2.4 $\mu m^2$ | 3.2 $\mu m^2$ | 4.0 $\mu m^2$ |
| 0.18 μm | 0.83 $\mu m^2$ | 1.24 $\mu m^2$ | 1.66 $\mu m^2$ | 2.07 $\mu m^2$ |
| 0.10 μm | 0.26 $\mu m^2$ | 0.38 $\mu m^2$ | 0.51 $\mu m^2$ | 0.64 $\mu m^2$ |
| 0.075 μm | 0.14 $\mu m^2$ | 0.22 $\mu m^2$ | 0.29 $\mu m^2$ | 0.36 $\mu m^2$ |
| 0.05 μm | 0.064 $\mu m^2$ | 0.10 $\mu m^2$ | 0.13 $\mu m^2$ | 0.16 $\mu m^2$ |

Groundrules—Pillar Circuit Wider Widths

For 0.25, 0.18, 0.10, 0.075 or 0.05 micron groundrules and the pillar circuit as in the figures, the aforementioned wider pillar width dimension would be reduced proportionally to, respectively, 0.42, 0.30, 0.17, 0.13 or 0.08 microns (groundrule (5/3, using the relative widths of the pillars in the figures).

Groundrules—Pillar Wiring Max. Planar Surface Areas

For 0.25, 0.18, 0.10, 0.075 or 0.05 micron groundrules and the aforementioned 0.1 micron total thickness of the wiring and associated coatings, these successively smaller pillar width dimensions would result in maximum planar surface areas taken up by the wiring of, respectively, 0.042, 0.030, 0.017, 0.013 or 0.008 square microns (wider pillar width in microns (0.1 microns).

Coatings can be made thinner than this example. For downscaled gate insulators (thermal oxide shown in the aforementioned examples) and other layers of the vertical wiring structure, in combination with the aforementioned successively smaller pillar widths, successively smaller maximum planar surface areas of the wiring structure would result, as listed in the following table. The pillar widths in the narrower dimension are included first, followed by "(" and the pillar width in the wider dimension which actually determines the width of the wiring.

Table: Max. Wiring Planar Surface Area vs. Pillar Width (pw) and Wiring Structure Thickness (WST)

| PW\WST | 100 nm | 80 nm | 60 nm |
|---|---|---|---|
| 0.25 × 0.42 $\mu m^2$ | 0.042 $\mu m^2$ | 0.034 $\mu m^2$ | 0.025 $\mu m^2$ |
| 0.18 × 0.30 $\mu m^2$ | 0.030 $\mu m^2$ | 0.024 $\mu m^2$ | 0.018 $\mu m^2$ |
| 0.10 × 0.17 $\mu m^2$ | 0.017 $\mu m^2$ | 0.014 $\mu m^2$ | 0.010 $\mu m^2$ |
| 0.075 × 0.13 $\mu m^2$ | 0.013 $\mu m^2$ | 0.010 $\mu m^2$ | 0.008 $\mu m^2$ |
| 0.05 × 0.08 $\mu m^2$ | 0.0080 $\mu m^2$ | 0.0064 $\mu m^2$ | 0.0048 $\mu m^2$ |
| PW\WST | 40 nm | 20 nm | 10 nm |
| 0.25 × 0.42 $\mu m^2$ | 0.017 $\mu m^2$ | 0.008 $\mu m^2$ | 0.004 $\mu m^2$ |
| 0.18 × 0.30 $\mu m^2$ | 0.012 $\mu m^2$ | 0.006 $\mu m^2$ | 0.003 $\mu m^2$ |
| 0.10 × 0.17 $\mu m^2$ | 0.007 $\mu m^2$ | 0.003 $\mu m^2$ | 0.002 $\mu m^2$ |
| 0.075 × 0.13 $\mu m^2$ | 0.0052 $\mu m^2$ | 0.0026 $\mu m^2$ | 0.0013 $\mu m^2$ |
| 0.05 × 0.08 $\mu m^2$ | 0.0032 $\mu m^2$ | 0.0016 $\mu m^2$ | 0.0008 $\mu m^2$ |

For dimensions and lithographic limits in between those listed, the results would be calculable intermediately between these results by like calculations, as they would be for dimensions and lithographic limits greater or less than the ranges listed. If pillars are narrower than shown, then this will result in further reductions in planar surface area. Improvements in planar surface area for the aforementioned dimensions and lithographic limits will be apparent with these examples. Additional transistors wired by the previously discussed pillar circuit method will have additional improvement in planar surface area per transistor.

Hence, it is possible with the aforementioned methods and structures to create wiring such as signal and/or power linkage interconnections for 2, 3, 4, 5 or more transistors within and within less than the aforementioned planar surface areas using the aforementioned fabrication techniques. In this manner, regions not included in this planar surface area can be made available for other uses such as formation of semiconductor sub-elements (distinctively doped regions such as sources, gates and drains), additional wiring, etc.

Scaling Down of Power Distribution

As described earlier in the process descriptions for the 20-layer pillar memory cell (as in FIG. 341 (C1.12) through FIG. 351 (C1.22), FIG. 353 in the regions of layers 11N and 6P, and in the supporting text for these figures), and also for the previously discussed folded-over 11-layer variation on this cell, gridded electrical power distribution conductors are created at various levels in the described integrated circuit structure. These conductors electrically connect and supply electrical power to various transistors (FETs in this case) in the integrated circuit. These conductors supply electrical power to 1, 2, 3, 4, 5 or as many as 6 transistors together on a given pillar, depending on whether one considers a short section of the pillar, or all of the pillar. Hence, a given section of this wiring surrounding a given pillar supplies power to the aforementioned 1, 2, 3, 4, 5 or as many as 6 transistors together on the given pillar within the planar surface area occupied by the pillar, plus a small section of the wiring and power conductors to each side of the pillar. As before, here and in the following discussion the phrase "planar surface area" is used to refer to the area of the vertical projection of the power conductors under discussion onto the planar surface of the wafer (or the die if the wafer has been cut).

With conventional optical lithographic fabrication techniques with the capability of a minimum lithographic groundrule limit of 0.25 microns, planar surface areas occupied by features which can form, wire and supply power to 1 transistor can be as small as 0.8 square microns, 2 times that (1.6 square microns) for 2 transistors, 3 times that (2.4 square microns) for 3 transistors, 4 times that (3.2 square microns) for 4 transistors, 5 times that (4.0 square microns) for 5 transistors, or 6 times that (4.8 square microns) for 6 transistors. Hence, planar surface areas occupied by the power distribution conductive structures for 1 conventional transistor can be as small as 0.8 square microns, 2 times that for 2 transistors, 3 times that for 3 transistors, 4 times that for 4 transistors, 5 times that for 5 transistors, or 6 times that for 6 transistors. Non-optical lithographic fabrication techniques can permit smaller minimum lithographic groundrule limits, with the dimensions of various sized features being proportionally reduced, or "scaled down," and planar surface areas occupied by the aforementioned examples of transistors, wiring and power distribution scaling down with the square of the reduction of the minimum lithographic groundrule limit. As before, here and in the following discussion "lithographic" is used to refer to the complete range of various techniques available to transfer patterns to the surfaces of integrated circuits being fabricated, so as to allow fabrication of a complete integrated circuit. Likewise, the minimum lithographic feature sizes discussed here and in the following discussion refer to the minimum dimensions at which complete circuitry can be fabricated (components, wiring and power connections), not to the minimum dimension for a feature on a single surface such as might be produced by a single mask or the writing of a beam.

With the aforementioned pillar circuits shown as memory cells, a 0.25 micron lithographic groundrule limit allows a minimum dimension for the smallest structure feature shown which is lithographically patterned, in this case the A trenches or pillar widths in the narrower axis, to be 0.25 microns. As in the figures such as FIG. 352, the pillar pitch in the narrower planar axis would be 13/6 times that, or 0.54 microns, and the pillar pitch in the wider planar axis would be 10/3 times that, or 0.83 microns. This results in a planar surface area of 0.54(0.83=0.45 square microns for the area taken up by the pillar pitch. It will be noted that the structure shown distributes power to 1, 2, 3, 4, 5, and even 6 transistors within this 0.45 square micron total planar surface area. It will be further noted that this is an improvement over the aforementioned 0.8 square microns for 1 transistor to 4.8 square microns for 6 transistors connected to power sources by conventional methods.

Availability of optical and other lithographic methods which allow smaller groundrules allow capabilities to place from 1 to 6 transistors in less planar surface area. For smaller lithographic groundrule limits, minimum planar surface areas which can form, wire and supply power to 1, 2, 3, 4, 5 or 6 conventional transistor structures can be scaled down from the aforementioned 0.8 to 4.8 square microns, and likewise pillar pitches in each of the two planar axes can also be scaled down with the lithographic groundrule limit. For example, particularly for iterated structures, using rounded numbers and scaling down by the ratio of the square of the minimum lithographic groundrule dimension, for the following groundrules, 1, 2, 3, 4, 5 and 6 formed and wired conventional transistors could be powered in as little as the following planar surface areas:

TABLE: Minimum Planar Surface Areas for 1 to 6 Conventional Transistors VS. Minimum Groundrule Dimensions (MIN GRD)

| MIN GRD | 1 TRANS | 2 TRANS | 3 TRANS |
|---|---|---|---|
| 0.25 μm | 0.8 $\mu m^2$ | 1.6 $\mu m^2$ | 2.4 $\mu m^2$ |
| 0.18 μm | 0.41 $\mu m^2$ | 0.83 $\mu m^2$ | 1.24 $\mu m^2$ |
| 0.10 μm | 0.13 $\mu m^2$ | 0.26 $\mu m^2$ | 0.38 $\mu m^2$ |
| 0.075 μm | 0.07 $\mu m^2$ | 0.14 $\mu m^2$ | 0.22 $\mu m^2$ |
| 0.05 μm | 0.032 $\mu m^2$ | 0.064 $\mu m^2$ | 0.10 $\mu m^2$ |
| MIN GRD | 4 TRANS | 5 TRANS | 6 TRANS |
| 0.25 μm | 3.2 $\mu m^2$ | 4.0 $\mu m^2$ | 4.8 $\mu m^2$ |
| 0.18 μm | 1.66 $\mu m^2$ | 2.07 $\mu m^2$ | 2.48 $\mu m^2$ |
| 0.10 μm | 0.51 $\mu m^2$ | 0.64 $\mu m^2$ | 0.76 $\mu m^2$ |
| 0.075 μm | 0.29 $\mu m^2$ | 0.36 $\mu m^2$ | 0.44 $\mu m^2$ |
| 0.05 μm | 0.13 $\mu m^2$ | 0.16 $\mu m^2$ | 0.20 $\mu m^2$ |

Groundrules—Pillar Pitches

For the pillar circuits as in the figures, 0.25, 0.18, 0.10, 0.075 or 0.05 micron groundrules allow these same A trench widths and pillar widths in the narrower dimension, and the aforementioned wider pillar pitches would be reduced proportionally. These widths allow 0.83, 0.60, 0.33, 0.25 or 0.17 micron pitches, respectively, in the wider pitch dimension (groundrule (10/3, using the relative widths of the pillars, etc. in the figures). These widths allow 0.54, 0.39, 0.22, 0.16 or 0.11 micron pitches, respectively, in the narrower pitch dimension (groundrule (13/6, per the figures). The products of these respective widths (wider times narrower width) result in the respective planar surface areas taken up by the power supply structures: 0.45, 0.23, 0.073, 0.040 or 0.019 square microns. Each of these planar surface areas has the ability to supply power to 1, 2, 3, 4, 5 or 6 transistors.

For dimensions and lithographic limits in between those listed, the results would be calculable intermediately between these results by like calculations, as they would be for dimensions and lithographic limits greater or less than the ranges listed. If pillars or trenches are narrower than shown, then this will result in further reductions in planar surface area. Improvements in planar surface area for the aforementioned dimensions and lithographic limits will be apparent with these examples. Additional transistors powered by the previously discussed pillar circuit method will have additional improvement in planar surface area per transistor.

Hence, it is possible with the aforementioned methods and structures to create power distribution (such as B+ or ground, or a plurality of power distributions such as the combination of B+ and ground both connected to the circuit, for example) for 1, 2, 3, 4, 5, 6 or more transistors within or within less than the dimensions described for the aforementioned planar surface areas using the aforementioned pillar circuit fabrication techniques. In this manner, regions not included in this planar surface area can be made available for other uses such as other circuitry or components, or for size reduction.

Scaling Down of Multiple Transistor Circuits

As described earlier in the process descriptions for the 20-layer pillar memory cell (as in FIG. 455, *b* and *c*, the preceding figures, and in the supporting text for these figures), and also for the previously discussed folded-over 11-layer variation on this cell, multiple transistors (FETs in this case) are created at various levels in the described integrated circuit structure. In this structure, 1, 2, 3, 4, 5 or as many as 6 transistors are formed together on a given pillar, depending on whether one considers a short section of the pillar, or all of the pillar. Hence, 1, 2, 3, 4, 5 or as many as 6 transistors together on the given pillar are formed, wired and powered within the planar surface area occupied by the pillar, plus a small section of the wiring and power conductors to each side of the pillar. As before, here and in the following discussion the phrase "planar surface area" is used to refer to the area of the vertical projection of the structure under discussion onto the planar surface of the wafer (or the die if the wafer has been cut).

As before, with conventional optical lithographic fabrication techniques with the capability of a minimum lithographic groundrule limit of 0.25 microns, planar surface areas occupied which can form, wire and supply power to 1 transistor can be as small as 0.8 square microns, 2 times that (1.6 square microns) for 2 transistors, 3 times that (2.4 square microns) for 3 transistors, 4 times that (3.2 square microns) for 4 transistors, 5 times that (4.0 square microns) for 5 transistors, or 6 times that (4.8 square microns) for 6 transistors. Hence, planar surface areas occupied which can form, wire and power 1 conventional transistor can be as small as 0.8 square microns, 2 times that for 2 transistors, 3 times that for 3 transistors, 4 times that for 4 transistors, 5 times that for 5 transistors, or 6 times that for 6 transistors. Non-optical lithographic fabrication techniques can permit smaller minimum lithographic groundrule limits, with the dimensions of various sized features being proportionally reduced, or "scaled down", and planar surface areas occupied by the aforementioned examples of transistors, wiring and power distribution scaling down with the reduction in the square of the minimum lithographic groundrule limit. As before, here and in the following discussion "lithographic" is used to refer to the complete range of various techniques available to transfer patterns to the surfaces of integrated circuits being fabricated, so as to allow fabrication of a complete integrated circuit. Likewise, the minimum lithographic feature sizes discussed here and in the following discussion refer to the minimum dimensions at which complete circuitry can be fabricated (components, wiring and power connections), not to the minimum dimension for a feature on a single surface such as might be produced by a single mask or the writing of a beam.

With the aforementioned pillar circuits shown as memory cells, a 0.25 micron lithographic groundrule limit allows a minimum dimension for the smallest structure feature shown which is lithographically patterned, in this case the A trenches or pillar widths in the narrower axis, to be 0.25 microns. As in the figures such as FIG. 455, the pillar pitch in the narrower planar axis would be 13/6 times that, or 0.54 microns, and the pillar pitch in the wider planar axis would be 10/3 times that, or 0.83 microns. This results in a planar surface area of 0.54(0.83=0.45 square microns for the area taken up by the pillar pitch. It will be noted that the structure shown forms, wires and supplies power to 1, 2, 3, 4, 5, and even 6 transistors within this 0.45 square micron total planar surface area. It will be further noted that this is an improvement over the aforementioned 0.8 square microns for 1 transistor to 4.8 square microns for 6 transistors power connected by conventional methods.

Availability of optical and other lithographic methods which allow smaller groundrules allow capabilities to place from 1 to 6 transistors in less planar surface area. For smaller lithographic groundrule limits, minimum planar surface areas which can form, wire and supply power to 1, 2, 3, 4, 5 or 6 conventional transistor structures can be scaled down from the aforementioned 0.8 to 4.8 square microns, and likewise pillar pitches in each of the two planar axes can also be scaled down with the lithographic groundrule limit. For example, particularly for iterated structures, using rounded numbers and scaling down by the ratio of the square of the minimum lithographic groundrule dimension, for the following groundrules, 1, 2, 3, 4, 5 and 6 conventional transistors could be formed, wired and powered in as little as the following planar surface areas:

Table: M Planar Surface Areas for 1 to 6 Conventional Transistors vs. Minimum Groundrule Dimensions (MIN GRD)

| MIN GRD | 1 TRANS | 2 TRANS | 3 TRANS |
|---|---|---|---|
| 0.25 μm | 0.8 $\mu m^2$ | 1.6 $\mu m^2$ | 2.4 $\mu m^2$ |
| 0.18 μm | 0.41 $\mu m^2$ | 0.83 $\mu m^2$ | 1.24 $\mu m^2$ |
| 0.10 μm | 0.13 $\mu m^2$ | 0.26 $\mu m^2$ | 0.38 $\mu m^2$ |
| 0.075 μm | 0.07 $\mu m^2$ | 0.14 $\mu m^2$ | 0.22 $\mu m^2$ |
| 0.05 μm | 0.032 $\mu m^2$ | 0.064 $\mu m^2$ | 0.10 $\mu m^2$ |
| MIN GRD | 4 TRANS | 5 TRANS | 6 TRANS |
| 0.25 μm | 3.2 $\mu m^2$ | 4.0 $\mu m^2$ | 4.8 $\mu m^2$ |
| 0.18 μm | 1.66 $\mu m^2$ | 2.07 $\mu m^2$ | 2.48 $\mu m^2$ |
| 0.10 μm | 0.51 $\mu m^2$ | 0.64 $\mu m^2$ | 0.76 $\mu m^2$ |
| 0.075 μm | 0.29 $\mu m^2$ | 0.36 $\mu m^2$ | 0.44 $\mu m^2$ |
| 0.05 μm | 0.13 $\mu m^2$ | 0.16 $\mu m^2$ | 0.20 $\mu m^2$ |

Groundrules—Pillar Pitches

For the pillar circuits as in the figures, 0.25, 0.18, 0.10, 0.075 or 0.05 micron groundrules allow these same A trench widths and pillar widths in the narrower dimension, and the aforementioned wider pillar pitches would be reduced proportionally. These widths allow 0.83, 0.60, 0.33, 0.25 or 0.17 micron pitches, respectively, in the wider pitch dimension (groundrule (10/3). These widths allow 0.54, 0.39, 0.22, 0.16 or 0.11 micron pitches, respectively, in the narrower pitch dimension (groundrule (13/6). The products of these respective widths (wider times narrower width) result in the following respective planar surface areas taken up by the formed, wired and powered transistor structures: 0.45, 0.23, 0.073, 0.040 or 0.019 square microns. Hence, 1, 2, 3, 4, 5 or 6 transistors can be formed, wired and powered within each of these planar surface areas.

For dimensions and lithographic limits in between those listed, the results would be calculable intermediately between these results by like calculations, as they would be for dimensions and lithographic limits greater or less than the ranges listed. If pillars or trenches are narrower than shown, then this will result in further reductions in planar surface area. Improvements in planar surface area for the aforementioned dimensions and lithographic limits will be apparent with these examples. Additional stacked transistors formed, wired and powered by the previously discussed method will have additional improvement in planar surface area per transistor.

Hence, it is possible with the aforementioned methods and structures to form, wire and supply power for 1, 2, 3, 4, 5, 6 or more transistors within or within less than the dimensions described for the aforementioned planar surface areas using the aforementioned pillar circuit fabrication techniques. In this manner, regions not included in this planar surface area can be made available for other uses such as other circuitry or components, or for size reduction.

Scaling Down of Periphery to Cell Array Interface

As described earlier in the process descriptions for the previously discussed periphery to cell array interface (see FIGS. 570 and 571 (PER58A and B) through FIGS. 573 and 574 (PER60B and C) and the figures and supporting text which led to and describes these figures), an interface is created which interconnects smaller scale conductive traces (memory cell control lines in this case) which may be fabricated below the lithographic groundrule limit to larger scale circuitry (peripheral circuitry in this case) which may be fabricated at or above the lithographic groundrule limit.

With conventional optical lithographic fabrication techniques with the capability of forming, wiring and providing power to transistors at a minimum lithographic groundrule limit of 0.25 microns, the larger scale conductive traces can be formed side-by-side on as little as 0.50 micron centers. Non-optical lithographic fabrication techniques can permit smaller such minimum lithographic groundrule limits, with the widths of conductive lines and separating insulating lines being proportionally reduced, or "scaled down." As before, here and in the following discussion "lithographic" is used to refer to the complete range of various techniques available to transfer patterns to the surfaces of integrated circuits being fabricated, so as to allow fabrication of a complete integrated circuit. Likewise, the minimum lithographic feature sizes discussed here and in the following discussion refer to the minimum dimensions at which complete circuitry can be fabricated (components, wiring and power connections) which would make effective use of such an interface, not to the minimum dimension for a feature on a single surface such as might be produced by a single mask or the writing of a beam.

Availability of optical and other lithographic methods which allow smaller groundrules allow capabilities to form the larger scale conductive traces side-by-side on less than 0.50 micron centers (0.50 pitch).

Groundrules—Conventional Line Pitches

For example, groundrules of 0.25, 0.18, 0.10, 0.075 or 0.05 microns would permit the formation of the larger scale conductive traces side-by-side on pitches of 0.50, 0.36, 0.20, 0.15 or 0.10 microns, respectively.

In the structures shown (see FIGS. 570 and 571 (PER58A and B) through FIGS. 573 and 574 (PER60B and C) and the figures and supporting text which led to and describes these figures, including the END and FAN coded figures) 4 smaller scale conductive traces can be fit within the width of one minimum groundrule width line (in accordance with the width of P3D 1.1 of FIG. 477 (P3D1) and supporting text, which is the mask source of the eventual trench structure which contains the 4 smaller scale conductive traces). In this case, the aforementioned smaller scale (potentially sub-lithographic) line pitches are scaled at ¼ the lithographic groundrule limit. The following table shows (in rounded numbers) the improvement of the line pitches (S. PITCH) of these smaller scaled conductive traces over the line pitches (C. PITCH) of the conventional traces scaled at the aforementioned minimum groundrules (MIN GR):

Table: Smaller Pitches (C. Pitch) and Conventional Pitches (C. Pitch) vs. Minimum Groundrules (MIN GR)

| MIN GR. | C. PITCH | S. PITCH |
|---|---|---|
| 0.25 μm | 0.50 μm | 0.063 μm |
| 0.18 μm | 0.36 μm | 0.045 μm |
| 0.10 μm | 0.20 μm | 0.025 μm |
| 0.075 μm | 0.15 μm | 0.019 μm |
| 0.05 μm | 0.10 μm | 0.013 μm |

For dimensions and lithographic limits in between those listed, the results would be calculable intermediately between these results by like calculations, as they would be for dimensions and lithographic limits greater or less than the ranges listed. Improvements in conductive line pitches (including insulator separation) for the aforementioned lithographic limits will be apparent with these examples. Additional (or fewer) conductive lines (including insulator separation) formed by obvious extension of the previously discussed method will have additional improvement in line pitch reduction.

Hence, it is possible with the aforementioned methods and structures to create 4 or more conductive lines separated by insulator within or within less than the pitch dimensions described for the aforementioned lithographic groundrules (including those groundrules which are capable of fabricating completely formed, wired and powered transistors) using the aforementioned fabrication techniques. In this manner, it is possible to electrically interface up to 4 or more conductive lines separated by insulator (which connect to circuitry such as a cell array) to other circuitry (such as lithographic circuitry which can be a memory array periphery) when such conductive lines and separations are scaled at or below the aforementioned pitch dimensions.

Scaling Down of Cross-Over Circuit Interconnections

As described earlier in the process descriptions for the previously discussed folded-over 11-layer variation on the 20-layer memory cell, a cross-over interconnection is created which interconnects opposing sides of a pair of adjacent pillars (see FIGS. 708, 709 and 710 (XF2.H, DC and BA), FIG. 711 (XFX) and preceding figures and associated descriptive text). This described pair of interconnective linkages serves the schematic equivalent function of an "X" wiring interconnection. In a top view, this "X" connection electrically connects a first region to a second region down and to the left of the first region (a first interconnective link), and then also electrically connects a third region to the left of the first region to a fourth region down and to the right of the third region (a second interconnective link) while insulating these two interconnective links from each other. The equivalent of this schematic is accomplished by the structure of the aforementioned figures, and this structure electrically interconnects formed, wired and powered transistors below it. This cross-over interconnection or "X" equivalent is formed within the planar surface area taken up by the pitch in each of the two planar axes of each pair of the aforementioned adjacent pillars. As before, here and in the following discussion the phrase "planar surface area" is used to refer to the area of the vertical projection of the cross-over interconnection under discussion onto the planar surface of the wafer (or the die if the wafer has been cut).

Conventional optical lithographic fabrication techniques are capable of a minimum lithographic groundrule limit of 0.25 microns. The planar surface area occupied to make the aforementioned cross-over ("X") connection including a minimum stand-off or border between it and adjacent circuitry would be greater than 2.123 square microns using conventional technology at this groundrule. The planar surface area occupied to make only the aforementioned cross-over ("X") connection itself would be greater than 0.916 square microns using conventional technology at this groundrule when only considering the cross-over linkages themselves which form the "X," and not considering the minimum width any electrical and spatial isolation border running around the cross-over linkages which form the "X."

Non-optical lithographic fabrication techniques can permit smaller minimum lithographic groundrule limits, with the dimensions of various sized features being proportionally reduced, or "scaled down," and planar surface areas occupied by the aforementioned cross-over interconnection example scaling down with the reduction in the square of the minimum lithographic groundrule limit. As before, here and in the following discussion "lithographic" is used to refer to the complete range of various techniques available to transfer patterns to the surfaces of integrated circuits being fabricated, so as to allow fabrication of a complete integrated circuit. Likewise, the minimum lithographic feature sizes discussed here and in the following discussion refer to the minimum dimensions at which complete circuitry can be fabricated (transistors, wiring and power connections), not to the minimum dimension for a feature on a single surface such as might be produced by a single mask or the writing of a beam.

As noted earlier, with the aforementioned pillar integrated circuits shown as memory cells, a 0.25 micron lithographic groundrule limit allows a minimum dimension for the smallest structure feature shown, in this case the A trenches or pillar widths in the narrower axis, to be 0.25 microns. As discussed in the supporting text for the fabrication sequence and structures leading to the cross-over connection (linkage) shown in FIGS. 708, 709 and 710 (XF2.H, .DC and .BA), FIG. 711 (XFX) and the preceding figures, this cross-over connection (linkage) is intended to be fabricated on the tops of paired 11-layer half-pillar sections analogous to the lower sections of the 20-layer pillar circuit previously described. In FIG. 708 (XF2.H), the pillars with the silicon nitride coating are shown as 6 by 10 plotting measurement units, the A trenches at 6 units wide, the B trenches at 8 units wide, the C trenches at 10 units wide, and the D trenches are described as 16 units wide (rather than the 12 unit width shown in the schematic representation) to facilitate processing (complete closing-out) of the C trenches. The 6 unit measurement which is the width of the A trenches and the width of the pillars in the narrower axis corresponds to the minimum lithographic groundrule required to form the pillars here, as in the prior downscaling discussions. Hence, the greater aforementioned unit dimensions for the larger pillar width, B, C, and D trenches are the proportional multiples of this minimum lithographic groundrule, which with conventional lithography could be as small as 0.25 microns.

For the paired pillars shown in FIG. 708 (XF2.H), a 0.25 micron groundrule therefore results in a pillar pitch of 46 units or 46/6 units times 0.25 microns, or 1.917 microns pitch in the larger total cell pitch axis, and 13/6 units times 0.25 microns, or 0.542 microns pitch in the narrower total cell pitch axis. Thus, 1.917(0.542=1.039 square microns planar surface area are occupied by the total insulated (stood off or otherwise bordered) cross-over structure, when implemented with the rest of the formed, wired and powered pillar circuitry. It will be noted that this is an improvement over the aforementioned 2.123 square microns for a conventionally fabricated cross-over connection when the cross-over linkages which form the "X" are electrically and spatially isolated from the surrounding circuitry which is on the same interconnective planes as the cross-over circuitry.

For the paired pillars shown in FIG. 708 (XF2.H), a 0.25 micron groundrule results in the wiring ring surrounding the pair of pillars occupying 10 by 32 measurement units in the figure when the width of the A trench or the narrower width of the silicon nitride coated pillar is 6 units. This equates to 10/6 units times 0.25 microns, or 0.417 microns in the narrower planar width axis, and 32/6 units times 0.25 microns, or 1.333 microns in the larger planar width axis. Thus, 0.417(1.333 microns gives a planar surface area of 0.556 square microns occupied by the wiring ring which encloses the cross-over connection. It will be noted that this is an improvement over the aforementioned 0.916 square microns for a conventionally fabricated cross-over connection, not counting the additional area available for other purposes such as electrical and spatial isolation.

Availability of optical and other lithographic methods which allow smaller groundrules allow capabilities to form such cross-over connections in less planar surface area. For smaller lithographic groundrule limits, minimum planar surface areas to fabricate such cross-over connections while forming, wiring and powering conventional transistor structures can be scaled down from the aforementioned 2.123 or 0.916 square microns previously discussed, and likewise pitches for pairs of pillars in each of the two planar axes can also be scaled down with the lithographic groundrule limit. For example, particularly for iterated structures, using rounded numbers and scaling down by the ratio of the square of the minimum lithographic groundrule dimension, for the following groundrules capable of fabricating formed, wired and powered transistors, the following planar surface areas would be occupied by conventional lithographic cross-over connection structures, compared with the planar surface areas occupied by the cross-over connection structures of this invention:

Table: Conventional (Conv) and Pillar (PLR X) Cross-Over, with Min. Surrounding Standoff Border, vs. Groundrules (MIN GRD)

| MIN GRD | CONV | PLR X |
|---|---|---|
| 0.25 μm | 2.123 $\mu m^2$ | 1.039 $\mu m^2$ |
| 0.18 μm | 1.101 $\mu m^2$ | 0.539 $\mu m^2$ |
| 0.10 μm | 0.340 $\mu m^2$ | 0.166 $\mu m^2$ |
| 0.075 μm | 0.191 $\mu m^2$ | 0.094 $\mu m^2$ |
| 0.05 μm | 0.085 $\mu m^2$ | 0.042 $\mu m^2$ |

Table: Conventional (CONV) and Pillar (PLR X) Cross-Over, with No Surrounding Standoff Border, vs. Groundrules (MIN GRD)

| MIN GRD | CONV | PLR X |
|---|---|---|
| 0.25 μm | 0.916 $\mu m^2$ | 0.556 $\mu m^2$ |
| 0.18 μm | 0.475 $\mu m^2$ | 0.288 $\mu m^2$ |
| 0.10 μm | 0.147 $\mu m^2$ | 0.089 $\mu m^2$ |
| 0.075 μm | 0.082 $\mu m^2$ | 0.050 $\mu m^2$ |
| 0.05 μm | 0.037 $\mu m^2$ | 0.022 $\mu m^2$ |

For dimensions and lithographic limits in between those listed, the results would be calculable intermediately between these results by like calculations, as they would be for dimensions and lithographic limits greater or less than the ranges listed. If pillars or trenches are narrower than shown, then this will result in further reductions in planar surface area. Improvements in planar surface area for the aforementioned dimensions and lithographic limits will be apparent with these examples.

Hence, it is possible with the aforementioned methods and structures to fabricate a cross-over connection with or without a surrounding standoff border within or within less than the dimensions described for the aforementioned planar surface areas using the aforementioned pillar fabrication techniques. In this manner, regions not included in this planar surface area can be made available for other uses such as other circuitry or components, or for size reduction.

VIII. CUSP REDUCTION

In the aforementioned processing of trenches with Parylene levels (pistons) set at various heights (such as discussed in FIGS. 157 through 201 (B1–B45) or FIGS. 232 through 269 (A1–A42) for the B and A trenches, respectively), it will be obvious to those skilled in the art that cusps occur at the upper surfaces when the Parylene is closed out. It will also be obvious that these cusps are reduced by not immediately stopping the deposition process when close-out first occurs, by reflow, or by a combination of such further deposition with reflow. It will also be obvious to those familiar with these techniques that conventional use of liquid photoresist pistons provides an alternative way to eliminate cusps, as does conventional use of liquid photoresist as a planarization medium above existing cusps. It is well known that photoresist will etch in oxygen RIE with the Parylene.

There is also some cusping on the sides of the B and A trenches before the silicon nitride coating of FIG. 136 (LW9.1) is deposited. This cusping can be reduced prior to the silicon nitride deposition by partially closing out the B and A trenches with Parylene (leaving a gap in both), etching away most of the tops and bottoms of this Parylene so as to leave at least a slight protective plug at each of the bottoms, then completing the close-out with a selectable second material such as tungsten, copper, gold, etc. Once this second material has been closed out in the B and A trenches while remaining gapped in any wider trench such as the C trench in the 20-layer cell version, it is then etched back from the exposed tops and sides so as to leave partitions in the B and A trenches. This etch-back process operates on the second material coating which is thinner than the Parylene only close-out coating discussed originally for the B and A trenches. Thus, the etch-back of this coating does not cause the cusp region to indent as deeply between the pillars in the B and A trenches as the original etch back of the thicker Parylene-only coating which had to be etched back all the way to expose the pillar sides in the wider (such as C) trenches, rather than to just remove the thickness of the final close-out. After this second material etch-back, then Parylene close-out, with reflow and planarization if desired, of the remaining open trenches is performed, followed by etching the Parylene down to near the bottoms of these partitions, followed by close-out between the sides of these partitions and the pillars with Parylene, followed by etch-back of this Parylene to expose the pillar walls along the C trench. Alternatively, after the aforementioned second material etch-back, the exposed Parylene layer (notably in the wider, such as C, trenches) is omni-directionally etched back enough to expose the pillar walls in the wider (such as C) trenches, leaving Parylene between the second material partitions and the adjacent pillar walls in the B and A trenches. This is followed by re-deposition of a layer of Parylene to leave the wider (such as C) trenches gapped, followed by a second etch-back of the exposed Parylene down to the pillar wall surfaces in the wider (such as C) trenches which creates a surface along the wider (such as C) trenches between pillars with reduced excursion (waviness). This alternative approach leaves Parylene adding additional side support to the second material partitions at all times. This creates a means of filling the B and A trench gaps between pillars, with less cusping on the sides facing into the wider (such as C) open trenches. The selectable partitions may be removed when desired in accordance with engineering preference by selective etch. (All the depositions and etches for the aforementioned side cusp reduction technique are omni-directional, as with the original depositions and etches used for these B and A trench fills.)

This aforementioned technique for reducing side cusping can be further improved, depending on actual trench widths chosen based on engineering preference, by first depositing a much thinner coating of Parylene, then a thinner coating of the second material, then more Parylene to close out in the B and A trenches. This second Parylene coating is then etched-back on the tops and sides so as to expose the second material, which is then also etched away from the open (such as C) trench walls. This leaves the second material sides for these newly created partitions less recessed into the interstices between the pillars than the prior second material side cusps. Subsequent deposition of additional Parylene followed by close-out of the B and A trenches with the second material is then followed by etch-back of the Parylene and second material as in the prior example. In this case, the indentation into the B and A trench interstices along the open wider (such as C) trench walls is reduced. When either of these partition techniques is used prior to coating the C trench walls with a material such as the silicon nitride shown in FIG. 136 (LW9.1), this coating has less excursion into the B and A trench pillar interstice regions.

IX. SUB-LITHOGRAPHIC CAPABILITIES

A primary described tool for sub-lithographic fabrication in this specification is the use of thin depositions on sides of pillar structures. By placing the thin depositions on the outsides of the pillars, rather than in holes as in other publicly known examples, the ability to reduce the number of masked groundrule squares for a given structure is enhanced.

Since these structures need to meet conventional commercial requirements such as competitive cost, their not sacrificing planar surface area for a less effective configuration is important. By placing the depositions on the outsides of the pillars, when a pillar is manufactured with a one groundrule wide cross-section, then surrounded by a one groundrule wide trench, this pillar can be spatially described by a mask in as little as two-by-two groundrule squares. This would apply if the minimum groundrule lines were generated by a lithographic or by a sub-lithographic masking method. As a comparison, a structure with holes inside, which are defined by a masking groundrule limit, would typically require one groundrule square for the hole, one plus one for each side of the surrounding structure, and one more for the first of the two intervening trenches. Squaring the sums of these groundrule distances in each axis leads to a much larger total number of groundrule squares used up per circuit (16 in this example) when fabricating based on a minimum groundrule limit.

The commercial requirements of speed and power are not sacrificed in the pillar structure, as they are in the hole structure example just discussed, since gate width is not restricted as much in the externally coated pillar type of structure.

It will be apparent that these advantages apply to any number of transistors which comprise the pillar, even to a single transistor.

X. Improved Substrate Isolation.

It is possible to improve the isolation between the substrate and the bottoms of the pillar structures by using an insulator rather than a diode isolation technique as follows: The surface of a wafer (silicon in this example) is ribbon masked in a first axis so as to make trenches which are continuous for a limited distance. These trenches are similar to those previously described with the ribbon mask example, but in this case masking is also done so as to interrupt the continuous progression of the trench. The masks for these trenches may be conventional or whatever kinds of masks are desired, not just the ribbon masks of the type previously discussed, although those ribbon masks could be used in a second orthogonal axis as before, but at a decreased spatial frequency (farther apart), to create the interruptions desired in the first orthogonal axis. In any event, the engineer may select a preferred means of masking with a single mask, or with combinations of masks.

By subsequently processing these trenches in the first axis before pillars are formed by masking in a second orthogonal axis, an insulated region can be created at the bottom of what will subsequently become a row (or rows) of pillars, as follows: A first selectable material (such as silicon dioxide) is deposited on the walls of the trench above a second selectable piston material (such as Parylene or resist), and the tops and bottoms of the sleeve deposition are removed by vertical directional etching as discussed earlier, leaving a sleeve as in the earlier examples. The second selectable piston material is then etched down to a slightly lower height, exposing the sides of what will become the bottoms of the pillars. As long as the trenches do not extend for too long a distance (i.e. interrupted soon enough), then the intervening lamellae of pillar material will be adequately supported at both ends, so as to permit the following operation. By next omni-directionally selectively etching away the exposed bottoms of the lamellae of pillar material, the lamellae can be made to be suspended freely between their supporting ends, where the interrupting mask pattern limited the length of the trenches.

An insulative material can then be applied so as to fill the open regions below the suspended lamellae. By applying a liquid such as resist which is subsequently hardened, and then etching it down in the manner of a piston as previously described, the remaining hardened liquid can form an insulative region below the lamellae, thereby electrically isolating them from the lower substrate, while at the same time providing them with a means of mechanical support at their bottoms. Once this has been accomplished, the lamellae can then be masked and etched in an axis orthogonal to the first trenches, leaving pillars of whatever preferred long or short length, where these pillars can be mechanically free standing (or subsequently wired or otherwise supplemented) while remaining insulated from the substrate.

Lamellae can also be masked so as to allow filling the trenches between pairs of lamellae with a selectable support material, a closed-out deposited material for example (such as Parylene, or other deposited materials mentioned earlier, or otherwise in common use) or a liquid which can be solidified (a polymer such as resist, etc.). This support material can be kept in place by masking or etch selectability against the other exposed materials, and then later removed by conventional selective etchants, or by conventional masking and using a conventional etchant to trench etch the support material against the mask. This allows the lamellae to be made much longer where desired.

Here, and elsewhere in this specification, resist (microlithographic photoresist) is mentioned as an example of a liquid phase deposited polymer material that can be solidified, which is publicly known to be used in these types of applications for reasons other than photolithographic patterning purposes. Readers not skilled in this art should be aware that the resists are used because they are polymers that are adaptable to these types of applications, not because they can be patterned by masked light.

XI. Clarifications and Supplemental Techniques.

The preceding and subsequent disclosures are illustrative of general methods and structures which are not specific to the applications shown. The invention is not limited to the specific details of these illustrative examples. All materials called out are intended to be illustrative, and substitute materials can be used where desired in accordance with engineering preference.

NON-SILICON-BASED SEMICONDUCTOR MATERIALS: Illustrative structures shown herein have used silicon based semiconductor technology because of its widespread use and familiarity. Application of these structures to other semiconductor materials such as germanium, silicon-germanium, gallium arsenide, other III–V compounds, II–VI compounds, etc., will be obvious—and in many cases desirable—in accordance with engineering requirements.

BIPOLAR TRANSISTORS: Pillar and other transistors shown herein can obviously also be doped suitably to form bipolar transistors. In such cases the gate structures can obviously be deleted and the transistors treated as emitter-base-collector sequences. In such cases gate contacts would contact the base material instead. Since the disclosures herein are illustrative of general methods and structures which are not specific to the applications shown, normal conventional engineering modifications to facilitate conversion from FET to bipolar usage will obviously be appropriate.

INCREASED SPEED AND POWER: Pillar planar cross-sections may be extended in either or both axes to increase channel current, and hence the power that the vertical transistor can handle. It is conventional to use serpentine (convolved) and other planar patterns to increase effective lengths of structures such as power transistors. Folding single axis planar extensions of pillars back and forth in serpentine or other patterns can provide a way to increase the effective width of pillar FETs, and hence the effective width of gate/channel structures which are formed on the sides of such pillar FETs. Such planar patterning can create effectively very wide gates on such FETs, hence creating very wide channels with respect to the channel length. This technique can be used to increase speed and/or power capabilities of the FET. Round, rectangular or otherwise repetitively angled spiral patterns may also be used for such a purpose, for example. Where serpentine patterns are used, one end of the serpentine pattern may be extended so as to follow around just outside the periphery of the main pattern so as to link with the other end, if desired. However, some means of electrically connecting to the bulk region near the channel should be provided. Gaps can be masked and etched into the gate regions to provide access for such contacts. Wall-insulated vias can also reach the bulk region from the top, for example.

"CHEMICAL-MECHANICAL POLISHING": Where discussed herein, the term "chemical-mechanical polishing" is used literally to describe any combination of chemical and/or mechanical polishing methods which are known to achieve the desired material removal result, so as to reduce heights of structures or structural artifacts being planarized. Alternative conventional planarization techniques (such as those based on low dielectric spin-on or CVD materials, etc.) may also be used instead.

ATOMIC LAYER EPITAXY (ALE) depositions may be used as substitutes for other required omni-directional depositions wherever the atomic layer epitaxy deposited materials can serve the functions of the materials for which they substitute, particularly where very thin coatings are desired.

PISTON MATERIALS: Pistons in piston-and-sleeve fabrication techniques are typically called out as Parylene depositions, which preferably are reflowed Parylene depositions wherever practical. Parylene was called out particularly because of its convenient etch selectivity against the other materials present. Other conventional materials—particularly insulators if left in the structure—may be used for pistons as long as available etchants can adequately select them for the application intended.

"U" STRAPS: When two pillar structures are intended to be linked into a single common circuit structure along the general type of layout described above, it is also possible to conductively link adjacent layers at the same height by depositing conductive (such as tungsten) "U" structures of the same type and piston and sleeve processing described in the C trench, where these "U" structures may extend vertically no higher than the height of a single layer, but where the lower portion of the "U" extends horizontally across the trench between the adjacent layers which are of the same height, thereby wiring them together.

THRESHOLD ADJUSTMENT METHODS: Where desired, gate threshold adjustment on vertical FETs can be accomplished by diffusion from a diffusion source layer in the manner previously described for diffusion of wells and transistor component regions. Alternatively, ion implantation can be performed at an angle where the vertical mask gap to the adjacent pillar is wide enough to permit a workable implantation angle, or where the FET where the implantation is desired is otherwise high enough on the pillar. Alternatively, an epitaxial deposition, with the appropriate doping level desired for the threshold level sought, may be deposited on the side of the FET where the channel is to be, and then this added epitaxial deposition can be cut away by the aforementioned vertical masking and etching techniques wherever it is not desired for the channel structure, or for structures being created. This technique may also be used in combination with the previously discussed source and/or drain to bulk region isolation techniques, where such isolation techniques may be implemented on the opposite sides of each FET.

DIFFUSED PILLAR TRANSISTOR STRUCTURES: Piston and sleeve techniques (as previously discussed) can be used to etch single or multiple vertical gaps (gaps perpendicular to the pillar wall) in coatings deposited on the sides of pillars as shown in the A trench operations of FIGS. 244 through 246. In these operations an overlying coating was so etched, and then an underlying coating was etched by gaps in the overlying coating, where the overlying coating was used as a mask for the underlying coating. When such gaps are etched in a coating of a suitable diffusion masking material such as silicon dioxide or silicon nitride, then diffusion doping can be performed on the pillar sidewalls, as follows: A suitable coating which is appropriately doped so as to be a source of dopants for the underlying pillar regions is deposited so as to overlie the silicon dioxide mask. Doped silicon or polysilicon, or phosphosilicate glass (as a phosphorous source) or other glasses with different dopants are available as such dopant source coatings, for example. Using such vertical masks and dopant source coatings, doped wells can be diffused (by heating) into the side of a suitably doped (or minimally doped) pillar at vertical locations selected by the openings in the mask. (All material which is not sufficiently heat resistant, such as Parylene or hardened polymer, should be removed before any such operation, and then subsequently replaced if necessary of course.) Re-masking can then facilitate doping selected locations in or out of such wells for source and/or drain, or lightly doped drain regions, for example, where the locations of these features are selected by appropriately placed gaps in the masking. As an additional option, portions of the pillar may be suitably doped to match the doping concentration which would have been in the aforementioned wells, thereby negating the need for the wells. This also negates the need for counter (reversed) doping of the wells with the resulting increasing dopant concentrations.

VERTICAL WIRING SPLICES: In FIG. 194 a conductive deposition (tungsten in this case) is shown as deposited over other conductive underlying depositions of other tungsten layer extensions, as adjacent to 7N and 10P for example, and over a polysilicon layer, as adjacent to 13N for example. If such a conductive deposition extends beyond (above or below here) the underlying conductive layer, it provides extended wiring linkage to the underlying conductive layer. This technique can be used to "splice" an overlying layer to an underlying layer later in a fabrication process where desired, and in such a situation a piston determining the height of the lower end of the overlying splice layer can be set part way up the length of the underlying layer, or near the upper end of it. The vertical wiring of such a splice can then continue as far up or down as desired, so as to electrically link the splice to structures elsewhere.

FOLDED HALF-HEIGHT PILLAR STRUCTURES: It will be apparent that the vertical wiring shown on each side of the pillar in FIG. 457 from layer 11N down to layer 2P is a topological reflection of the wiring pattern extending up on the opposite side of the pillar from layer 11N to layer 20P. Therefore, if two pillars which equate to lower portions of the pillar shown (from layers 11N down to layer 2P and also 1N) are placed side by side (with A trench wiring on the same sides and B trench wiring on the opposite sides of such a pair of half-height pillars), then all elements of the original single vertical pillar and its wiring are present except for the continuation linkage of the wiring going up one side of one pillar, where the wiring must link and continue down the opposite side of the adjacent pillar in the pair. If a cap of an insulative deposition (such as silicon dioxide or silicon nitride) is patterned by conventional masking onto the top of the pillar (above the middle of layer 11N), then, using the splice technique described herein for example, the vertical wiring on the opposing sides of each pillar in the pair above layer 11N can be extended upward to the height of the thickness of such a top insulative layer. The top of the whole structure can then be planarized or chemically-mechanically polished as necessary so as to leave 4 wiring contact points exposed at the top of the pair of pillars. When the intervening trenches are filled with a suitable material (such as hardened liquid polymer for example), then conventional or other patterning means (such as the cross-connect means described herein) can be used to deposit an "X" or topologically equivalent cross-over cross-connection, so as to complete the pillar pair wiring structure to the equivalent of that in FIG. 457. This can be used in conjunction with the C trench processing previously described for the C trench at and below layer 11N. As an option, portions of the layer 11N to 2P structure can be deleted during fabrication by simply not including any undesired layers, and also bypassing, shortening, or otherwise modifying processing for their adjacent features. By deleting transistors in this manner, the structure can be reduced to a 4 transistor SRAM cell structure, but without the normal pull-up resistors included at this point. These pull-up resistors can be constructed by conventional planar fabrication or other processing means at the top of the structure, and linked down to desired wiring points by the aforementioned splice technique, where the splice wiring creates upper contact points for these resistors.

SUB-LITHOGRAPHIC CROSS-CONNECTIONS. Cross-connections which electrically form an "X" linkage can be constructed for such purposes as linking the tops of pillars where such a connection is desired, without lithography or sub-lithographically, as follows:

In the following step sequence, materials A and B are materials which are selectable from one another using selective etchants of engineering preference. Columnar or other directional sputtering of gold (A) and tungsten (B) is assumed for the directional depositions, and CVD of tungsten is assumed for the omni-directional box depositions in the following step sequence. If A is gold and B is tungsten, this will work particularly well with conventional selective wet etchants, for example. If the trench is made shallower, this can enhance the removal of wet etchants: roughly comparable face height to trench width ratio, for example. Vapor or RIE etchants may also be used, particularly where conventional methods of varying thicknesses of depositions are used to compensate for etch selectivity rates. As elsewhere, materials other than A and B may be varied according to engineering preference.

At any subsequent sequence step where depositions leave unwanted depositions on bottom regions, or lesser depositions on any exposed side surfaces, brief back etches may be used to vertically etch any unwanted materials from bottoms, or to remove any unwanted materials from any exposed walls/faces.

FIG. 712 depicts two pairs of co-planar faces CC3B and CC4A, and CC1A and CC2B, respectively, of two pairs of side-by-side pillars, where each pair of pillar faces confronts the other pair across an intervening trench. This intervening trench would typically extend further to the sides, so as to intervene between subsequent additional pairs of like pillar faces.

FIG. 713 depicts the pair of co-planar pillar faces CC3B with CC4A previously shown in FIG. 712, with levels CCL1 through CCL11 depicted by horizontal dotted lines to show piston and/or sleeve heights to be subsequently discussed in the following step sequence. In FIG. 713, first hatched sections CC5 and CC6 depict discontinuities (openings) in a silicon dioxide coating which covers continuous conductive regions or layers on each pillar face behind the oxide. The first exposed portion of this continuous conductive region (opening CC5) is between levels CCL3 and CCL4, and the other exposed portion of this continuous conductive region (opening CC6) is between levels CCL8 and CCL9. Such a continuous conductive region behind the oxide may be a conductive coating, or the pillar itself. In the following step sequence example it is assumed to be a doped polysilicon coating on the faces shown, where the pillar behind this coating has been fully coated with insulative material, such as silicon dioxide. Such a continuous conductive region behind the oxide would extend down below the shown features, so as to connect with vertical wiring or other conductive regions extending upward from lower (not shown) structures created earlier, such as additional (lower) co-planar pillar faces.

Note that in the following step sequence, the bottom of the intervening trench is either created of an etch selectable material, or piston height settings must not be lowered to the nominal bottom of the trench, rather than totally removing the piston where material below such piston heights needs to be protected.

The fabrication step sequence is as follows:

Prepare Selectable Face Contacts:

- Liquid fill pillar interstices: The trench between pillar faces CC1A and CC2B and pillar faces CC3B and CC4A is filled with hardened liquid polymer as follows: First the trench regions are filled with hardened liquid polymer. Then the planar region above pillar faces CC1A and CC2B, and also above faces CC3B and CC4A, is masked with a planar silicon nitride mask (which may be sub-lithographic). The hardened liquid polymer is then vertically etched down by such means as selective RIE or chemical milling, so as to leave hardened liquid polymer between the pillars faced by CC1A and CC2B, and also CC3B and CC4A. The silicon nitride mask may then be removed.
- Angle deposit A on CC3B & CC4A: A directional deposition of material A (gold) is made at a backward angle down and toward pillar face CC3B and pillar face CC4A, then back etching can be implemented so as to subsequently clear any unwanted lesser deposition on any exposed sides.
- Angle deposit B on CC1A & CC2B: A directional deposition of material B (tungsten) is made at a forward angle down and toward pillar face CC1A and pillar face CC2B, then back etching can be implemented so as to subsequently clear any unwanted lesser deposition on any exposed sides.
- Liquid fill: The trench between pillar faces CC1A and CC2B and pillar faces CC3B and CC4A is filled with hardened liquid polymer.

Planarization of hardened liquid polymer: Here, and elsewhere where hardened liquid polymer is used, the liquid may be filled to a height above the top surface, planarized if desired, and then etched back down to a height even with the pillar tops to make the height of the trench fill more accurate.

- Mask right side: The planar region above pillar faces CC2B and CC4A (but not above faces CC1A and CC3B) is masked with a narrow planar silicon nitride mask. This mask may be sub-lithographic.
- Open left side: The hardened liquid polymer in the trench below the gapped (open) portion of the planar silicon nitride mask is then vertically directionally etched by such means as oxygen RIE or selective ion milling, so as to leave the polymer substantially below the silicon nitride mask, but not below the unmasked regions which are to the sides of the silicon nitride mask.
- Selectively strip A: The exposed material A (gold) deposition coating pillar face 3B is then selectively etched away.
- Selectively strip B: The exposed material B (tungsten) deposition coating pillar face 1A is then selectively etched away.
- Remove the masks: The silicon nitride mask and hardened liquid polymer are then selectively etched away.
- Liquid fill pillar interstices: The trench between pillar faces CC1A and CC2B and pillar faces CC3B and CC4A is filled with hardened liquid polymer as follows: First the trench regions are filled with hardened liquid polymer. Then the planar region above the pillars incorporating faces CC1A and CC2B, and also above the pillars incorporating faces CC3B and CC4A, is masked with a planar silicon nitride mask (which may be sub-lithographic). The hardened liquid polymer is then vertically etched down by such means as selective RIE or chemical milling, so as to leave hardened liquid polymer between the paired pillars faced by regions CC1A and CC2B, and also between the pair of pillars faced by regions CC3B and CC4A. The silicon nitride mask may then be removed. The trench may then be refilled with hardened liquid polymer as required to facilitate subsequent steps.
- Mask right side (wider): The planar region above pillar faces 2B and 4A is masked with a planar silicon nitride mask which is slightly wider than the prior mask over this region. This mask may be sub-lithographic.
- Open left side: The hardened liquid polymer in the trench below the planar silicon nitride mask is then vertically etched by such means as oxygen RIE or selective ion milling so as to leave the polymer substantially below the silicon nitride mask, but not below the unmasked regions which are to the sides of the silicon nitride mask.
- Angle deposition of B on CC3B: A directional deposition of material B (tungsten) is made at a backward angle down and toward pillar face CC3B, then back etching can be implemented so as to subsequently clear any unwanted lesser deposition on the sides.
- Angle deposition of A on CC1A: A directional deposition of material A (gold) is made at a forward angle down and toward pillar face CC1A, then back etching can be implemented so as to subsequently clear any unwanted lesser deposition on the sides.
- Remove the masks: The masking of hardened liquid polymer and silicon nitride (as created earlier) is then etched away.
- Liquid fill pillar interstices: The trench between pillar faces CC1A and CC2B and pillar faces CC3B and CC4A is filled with hardened liquid polymer as follows: First the trench regions are filled with hardened liquid polymer. Then the planar regions above the tops of the pillars with faces CC1A and CC2B, and also above the tops of the pillars with faces CC3B and CC4A, are masked with planar silicon nitride (optionally with sub-lithographic masking). The hardened liquid polymer is then vertically etched down by such means as selective RIE, so as to leave hardened liquid polymer between the pillars faced by CC1A and CC2B, and also between the pillars faced by CC3B and CC4A, but with the hardened liquid polymer absent in the intervening trench extending between pillar faces CC3B and CC1A, and likewise between pillar faces CC4A and CC2B (this trench continuing also across the intervening region between these two regions). The silicon nitride mask may then be removed.

Set Up Lower Cross-Connect:

Sleeve the top: The upper sidewall region (all 4 faces) is then sleeved below level CCL7, or optionally level CCL6, with a deposition of silicon nitride so as to expose the lower section (all 4 faces) below level CCL7 or CCL6.

Selectively strip A and B from mid-height: A hardened liquid polymer piston is set at level CCL5, and the exposed vertical faces etched so as to remove materials A (gold) and B (tungsten) from between the bottom of the silicon nitride sleeve at level CCL7, and the top of this piston at level CCL5. The hardened liquid polymer piston is then removed.

Selectively strip B: Material B (tungsten) below the silicon nitride sleeve is then selectively etched away, so as to strip away the results of the two directional material B angular depositions made during the two prior material B angular deposition steps.

(optional): The silicon nitride sleeve may optionally be removed at this point.

Sleeve the top (lower sleeve): The top (all 4 faces) is then sleeved with silicon nitride, so as to leave the lower section (all 4 faces) below level CCL2 exposed, thus exposing the bottom of conductive interconnect CC7 and its counterpart (not shown) on face CC1A. Interconnect CC7 will extend downward to level CCL1 or below, depending on where the bottom height controlling the piston was set when interconnect CC7 was created. The lower portion of interconnect CC7 will subsequently be linked with an analogous interconnect structure (not shown) on pillar face CC1A, to thereby electrically link pillar faces CC4A and CC 1A.

Complete Lower Cross-Connect:

Set box bottom height: A hardened liquid polymer piston is set at (or below) level CCL1.

Make tungsten box: An omni-directional coating of tungsten is deposited so as to make a "box" between the side walls and end walls and the piston height (level CCL1 or below) at the bottom of the open trench region. (This box structure may be created by leaving filled the regions past the ends of the trench shown at the left and right ends of the FIG. 712 structure. These regions are kept filled by keeping them protected by appropriate masking during etching down of fill material in the box's interior region.)

Remove upper extension of box: A piston of hardened liquid polymer is set at or below level CCL2, and the tops cleared (selectively etched) of tungsten (but not the silicon nitride), so as to leave the bottom of the box with cross-connecting contacts at pillar face CC4A and pillar face CC1A. Optionally, if the described box structure has not been created, then one or more subsequent masking and vertical etching (RIE, etc.) steps may be used to protectively mask the pillars (whose faces are shown) and intervening trench area shown in FIG. 712, but leaving openings in the mask over the regions to the left and right of the structure shown in FIG. 712. Subsequent vertical etching of these unmasked regions by such means as RIE or ion milling where desired can then sever any conductive traces extending to the left or right of the FIG. 712 structure in such a situation.

Set Up Upper Cross-Connect:

Set up for to clear upper sleeve: A piston of hardened liquid polymer is set at piston to level CCL5, or optionally level CCL6, this piston being above the remaining lower box just formed, where this remaining lower box is to be saved as a conductive linkage cross-connecting the material A (gold) conductive interconnects CC7 (and other interconnect contact not shown) on the lower CC4A and CC1A faces.

Clear upper sleeve: The silicon nitride upper protective sleeve is then removed, so as to leave a gap of silicon nitride between the lower box and upper box to be formed.

Selectively strip A: The exposed material A (gold) above the piston is then selectively etched away, leaving only the material B (tungsten) interconnect contacts on CC3B and CC2B for future use.

Complete Upper Cross-Connect:

Set up bottom of upper box: A piston of hardened liquid polymer is set at a level CCL10, this level being notably higher than the piston level of the prior piston step.

Make upper box: An omni-directional coating of tungsten is deposited, so as to leave the bottom of a second and higher tungsten box, where the lower portion of this box is to be saved as a conductive linkage cross-connecting the material B (tungsten) conductive interconnects CC8 (and other interconnect contact not shown) on the upper CC3B and CC2B faces.

Remove upper extension of box: A piston of hardened liquid polymer is then set at level CCL11, and the regions of tungsten above the piston are selectively etched away, so as to leave the lower portion of this box saved as a conductive linkage cross-connecting the material B (tungsten) conductive interconnects CC8 (and other interconnect contact not shown) on the upper CC3B and CC2B faces.

When desired, truncation of the left and right ends of the now completed structure of FIGS. 712 and 713 may now be accomplished by using such means as a protective mask overlying the shown region of FIGS. 712 and 713. Gaps in this masking exist on the tops of the regions to the left and right of the ends of this extension of the region of FIGS. 712 and 713. Vertical directional etching away of the regions to the left and right of the protective mask by such means as RIE or ion milling then removes the structural regions below these exposed (mask gap) regions to the depth desired. The resulting trenches thereby created then truncate the left and right ends of the region indicated by the extension shown for the structure of FIGS. 712 and 713. These trenches may be closed out with an insulator such as silicon dioxide or silicon nitride, followed by removal of the top (planar) deposition portions of this coating where desired. Or, they may be filled with a flow on material such as hardened liquid polymer or spin-on-glass, for example.

In the foregoing step sequence, the use of tungsten and gold can be reversed for the vertical conductive interconnects, or reversed or substituted for the box structures where desired, or other conductive materials may be used.

ALTERNATIVE STRUCTURE WITH CROSS-OVER CONNECTIONS: The pillar side wiring and related sidewall structures shown for the A and B trenches leading to the structure of FIGS. 455, 456 and 457 can also be fabricated inside of trench etch created vertical holes using the same process step sequences. For such a case, a pillar can be masked so as to trench etch holes which extend vertically down from its planar top surface into the interior region of the pillar. It will be noted that the wiring and insulation overlay pattern that runs up and down a face of a pillar, such as that shown for the A or B trenches, was formed by first processing the side walls of a vertical trench etched hole, such as the unmasked or exposed hole of the A trench or hole of the B trench. Thus, alternatively, holes trench etched into the interior region of a pillar can be sequentially unmasked and processed following the A or B vertical trench etched hole process step sequences shown, thereby resulting in a wiring and insulator pattern inside each such vertical trench etched hole (in a pillar which contains one or more such holes) which matches the interconnectivity and function performed by the sidewall wiring shown in FIG. 457 for the A or B trenches. When a pillar is fabricated with one such internal corresponding vertical trench etched hole for the A trench wiring, and an additional such internal corresponding vertical trench etched hole for the B trench wiring, and if such a pillar is layered with dopings to match the FIGS. 456 and 457 pillar layers, then such a pillar is wired inside its interior region equivalently to the side wiring shown for the pillar of FIG. 457. In such a case where the word lines end up formed enclosed by their respective internal (hence non-extending) vertical trench etched holes, they can be wired (connected) up to the top surface by adding a splice connection (as described elsewhere herein) which contacts the non-extending word line structure. The upper ends of such word line splice connections can then be connected to conventional planar word lines by conventional masking and via connections. The top of the highest layer in the pillar (the upper bit line layer) can be contacted by conventional masking and via connections to conventional bit lines. C trench "U" shaped wiring and insulating stacked layers can be formed following the fabrication sequence described for the C trench processing which led to the C trench structures shown in FIG. 456. However, in this internally wired pillar example, the C trench can be treated as surrounding the pillar on all sides, rather than extending in a single axis. In such a case, where the C trench surrounds all four pillar sides, the lower bit line will be unable to extend outside the region of the bottom of the pillar. An additional hole trench etched in the top surface of the pillar can extend down to reach this bit line layer (2P in this case), and an insulated splice connection (a described elsewhere herein) can contact this bit line layer, and then extend up to the top surface of the pillar where the conductive portion of the splice can be connected to conventional bit lines by conventional masking and via interconnection methods. Conventional planar lithographic techniques can be used to contact the tops of various upward extending conductors. Alternatively, fabrication processing for the word line structures can be deleted from the aforementioned A and B internal pillar vertical trench etched holes, and fabricated instead in their own respective additional vertical trench etched holes which are etched down from the top surface of the pillar. Particularly in the case of the lower word line connection (at layer 3N here), adding an additional vertical trench etched hole can remove the word line splice contact upper wiring extension from undesirably overlapping the other structures along the vertical extension of the pillar. However, in the prior example where word line and bit line shared the same vertical trench etched hole and such overlapping was the case, sufficient standoff insulation deposited and appropriately patterned underlying the splice conductive wiring can prevent electrical interaction between such word line splice wiring and the underlying structures (such as bit lines or FET gates). If upper and lower word line gate control structures are fabricated in the same vertical trench etched hole, then a splice connection can link both of these gate control structures together before continuing to extend up to a top surface contact.

A pillar cell structure with internally wired vertical trench etched holes can be constructed in a planar layout configuration where its vertical trench etched holes are laterally positioned one after the other, in a line. Thus, a pillar can be configured where its planar axis width is just wide enough to accommodate a single vertical trench etched hole, while its planar axis length is extended sufficiently to accommodate multiple vertical trench etched holes. When such a pillar incorporates four internal vertical trench etched holes in a line (planar view), then one such vertical trench etched hole can be used for the aforementioned A trench vertical wiring, one for B trench vertical wiring, one for bit line vertical wiring, and one for word line vertical wiring.

As described elsewhere herein, the pillar cell shown in FIGS. 455, 456 and 457 can be effectively "folded" into two separate pillars by configuring one such pillar as shown for the bottom half of the FIGS. 455 through 457 group structure, and configuring a second adjacent pillar as the top half of the FIGS. 455 through 457 group structure, but where this top half is inverted. In such a paired pillar structure, layer 11N thus becomes the top layer in each new shorter adjacent pillar of the pair, and bit line layers 2P and 20P are on the bottoms. Such a paired pillar structure can be configured in this alternative internally wired vertical trench etched hole variation. A valuable variant of this occurs where such a pillar pair is configured with the aforementioned four vertical trench etched holes in each pillar of the pair, where in each pillar these four vertical trench etched holes respectively incorporate the A trench, B trench, bit line and word line vertical wiring. In this variant, the pillars are paired along their planar extension (longer) axis in planar view, so that many pillars can be laid out in a line whose planar view pattern is one vertical trench etched hole wide, but many multiples of pairs of four vertical trench etched holes long. In this example, the vertical hole sequence for the first pillar in each pair is word line, bit line, B trench, then A trench, followed by the hole sequence for the adjacent pillar of the pair in topological reflection being A trench, B trench, bit line, then word line. This one hole wide four (4) plus four (4) hole sequence length pattern is then continually repeated along the line of extension as many times as desired, thus creating a one vertical trench etched hole wide line of paired pillars, with this line extended with as many pillar pairs as desired for the circuit being constructed. Such lines of pillars are then laid side by side, so that the respective bit line, word line, B trench corresponding and A trench corresponding vertical holes are aligned in lines, where such respective lines all extend in parallel to one another, and where each such respective line is orthogonal to the aforementioned repeated pillar pair line of extension.

When interconnecting such structures from above, a coating of insulative material is deposited and patterned on the tops of the pillars, so that the insulated upward wiring in the vertical trench etched hole can be contacted by such means as conventional vias.

In such a planar view layout configuration, when such structures are constructed with dimensions larger than the lithographic groundrule, then bit lines can be fabricated by using conventional via contacts to the bit line source/drain contact wiring in the bit line related vertical trench etched holes, and then conventionally fabricating planar bit line runs in the previously indicated side-by-side repetition axis of bit line holes. Or, bit line vias can simply contact source/drain material when it is located at the top semiconductive layer of the pillar structure without the use of a hole.

In a similar manner, word lines can be fabricated using conventional via contacts to the word line gate contact wiring in the word line related vertical trench etched holes, with word line runs contacting such vias, where such word line runs extend orthogonally to the bit lines, i.e. in the pillar pair line of extension. Since the word line related vertical trench etched holes in this example are directly adjacent to one another, at the ends of the pillar pair vertical trench etched hole sequences, they may be lithographically strapped or linked together, thus allowing a single via which reaches down to contact such a strap to link simultaneously to a word line contact of both a preceding and a following pillar pair along the pillar pair line of extension. Use of such a single via can maximize the intervening space between such word line vias for use of this space in the orthogonal axis by bit lines. Such bit lines can be formed by conventional lithographic techniques in a side-by-side configuration, or alternatively above one another using additional conventional layered fabrication techniques, such as CMP. If such vertically stacked bit lines are positioned so that each line has a portion which vertically overlies its associated line of bit line vertical trench etched hole contact regions, then conventional vias which reach down to such contact regions can themselves be contacted at the via tops by such bit lines which overlie such vias and contact regions. Respective bit line runs in such vertically stacked bit line pairs may be laterally offset from each other in the planar axis, orthogonal to the axis of bit line extension, thereby reducing the effective proximity of one bit line to the other by more than just the vertical spacing between such lines. In this manner capacitive interaction between such bit lines can be further reduced. The word line runs extending orthogonally to the bit line run axis may also be placed similarly above their laterally sequential rows of via contacts, such contacts extending up between the bit lines for example, thereby having higher word lines offset from lower word lines in a manner similar to the aforementioned bit line relationship.

In cases where contacts (such as the aforementioned A and B trench corresponding hole contacts) are not arranged directly adjacent to one-another, such as the in-line pillar pair vertical trench etched hole sequence described above, then such contacts can be linked as desired by conventional lithographic methods. Alternatively, in cases such as the above, such contacts can also be linked sub-lithographically. In the above pillar pair case, at least one first contact requires linkage to another second contact which is positioned on the far side of one or more intervening contacts, where such linkage effectively bypasses the intervening contacts. Preferably such a bypass will add minimal additional area to the planar layout. Such a bypass can be formed without lithography, and hence potentially sub-lithographically as with other non-lithographic structures described herein, as in part or all of the following double bypass example:

FIG. 714 depicts a back wall and bottom of a trench with interconnect features, with its left and right ends defined, for example, by orthogonal trenches. The structures forming the back wall (and front wall not shown) would typically be repeated many times, to the left and right, in the direction of the trench, with adjacent structures always separated by orthogonal trenches. The structures would also be repeated many times in the forward and backward directions.

The interconnect features of FIG. 714 are fabricated in a trench, the walls and bottom of which are covered with a selectable insulating material, such as silicon nitride, or otherwise coated with a deposition of such an insulator, so as to prevent electrical contact to adjacent and underlying electrical structures in any location where such electrical contact is not intended. For the purpose of the following fabrication step sequence, the trench of FIG. 714 ends at the left and right ends as shown, where these ends are formed by reference structures such as orthogonal trenches of equal depth to the main trench. The ends of the trench can be used as spatial references for further fabrication processes.

A piston of hardened liquid polymer is set in a trench at a height CV3 as shown on far wall CV1.

A deposition of a first selectable conductive material CV4, such as doped polysilicon (or optionally gold) in this case, is omni-directionally deposited over all exposed surfaces by such means as CVD.

Vertical directional etching by such means as RIE or ion milling is used to remove the exposed polysilicon coating CV4 from the horizontal surfaces.

The polymer piston may now be selectively etched away, if desired, so as to expose the trench bottom CV2, leaving polysilicon coating CV4 coating the far wall as shown, as well as the near wall at the same height (not shown), and the side walls (not shown) which will be subsequently etched away when this structure is truncated at its left and right ends.

The trench is now filled to the top with hardened liquid polymer, using conventional flow on and planarization techniques.

A suitably high vertically sided mask trace of a selectable material such as silicon dioxide is deposited and patterned by conventional or sub-lithographic techniques, so as to extend across the left end of the trench (and further across any adjacent trenches being fabricated before or behind this trench), this mask trace covering the region immediately to the left of the trench, but leaving the trench itself unmasked. The edge of this mask trace is directly over the left edge of conductive link CV5.

Repetitive Loop:

The hardened liquid polymer in the trench is selectively vertically etched down anisotropically, so as to expose the bottom of the trench to the right of the vertical etch wall thereby created. Here and as follows, this process can be supplemented by using the hardened liquid polymer with appropriate photo-sensitizer, and exposing it to illuminating radiation, so as to leave the polymer under the mask resistant to the etchant, but leaving the exposed polymer etchable.

A directional deposition of a second selectable conductor, such as tungsten in this case, is then directionally deposited angled down and toward the far (rear) wall CV1 of the trench, so as to be shadowed by the top of the near wall (which is not shown here), thereby beginning the deposition region at a point CV6 which is a short distance offset away from the bottom of the near wall, and with this deposition extending back across the rest of the trench bottom CV2 and up and over the top of the far wall CV1.

The trench is now filled to the top of the mask trace with hardened liquid polymer, using conventional flow on and planarization techniques.

The polymer fill is selectively vertically anisotropically etched down to the height of the bottom of the mask trace.

An angular directional deposition of silicon dioxide, or a selectable alternative material is then deposited so as to coat the side of the silicon dioxide mask trace, so as to increase its width to make its new edge directly above the right edge of conductive link CV5, then the exposed horizontal surfaces of this deposition are vertically etched away.

The polymer fill is selectively vertically anisotropically etched down so as to expose the trench bottom CV2.

The remaining exposed tungsten coating to the right is then selectively etched away, leaving conductive link CV5 and any sidewall artifact (not illustrated) associated with any off axis depositions of the tungsten. The placement of conductive link CV5 is selected so as to overlie the first vertical trench etched hole in a sequence to be connected by a bypassing or "C" linkage. (Where any sidewall artifact is created, the normally minimal thickness of such coating can be removed by a timed omni-directional selective back etch.)

The silicon dioxide mask trace is then expanded again by angular deposition on the sidewall and vertical etching, so as to place the new mask edge directly over the left edge of conductive link CV7.

End of repetitive loop.

The preceding repetitive loop steps are then repeated again, but with the directional deposition coming down and from the opposing trench wall direction, so as to be shadowed by the top of far wall CV1, and to deposit on the trench bottom beyond point CV8 and on the exposed side of the near trench wall (not shown), etc. This creates conductive link CV7 which overlies a next contact point in the progression along trench bottom CV 2, which in this case is also to be linked with a second bypassing or "C" linkage.

The preceding repetitive loop steps are then repeated again, but with the directional deposition coming down and toward the far wall again, so as to be shadowed by the top of the near wall (not shown), and so as to deposit on the trench bottom beyond point CV10 and on the exposed side of the far trench wall CV1, etc. This creates conductive link CV9 which overlies a next contact point in the progression along trench bottom CV2, which in this case is the other end of a first bypassing or "C" linkage.

The preceding repetitive loop steps are then repeated again, but with the directional deposition coming down and from the opposing side direction, so as to be shadowed by the top of the far wall CV1, and to deposit on the trench bottom beyond point CV12 and on the exposed side of the near trench wall (not shown), etc. This creates conductive link CV11 which overlies a next contact point in the progression along trench bottom CV2, which in this case is also to be linked with a second bypassing or "C" linkage.

The preceding four loop repetitions thus complete two interleaved bypassing or "C" linkages consisting of the conductive regions CV5 and CV9 connected to the conductive region CV4 on the back wall of the trench, the other such linkage consisting of the regions CV7 and CV11 connected to the counterpart regions to region CV4 on the (not shown) front wall) of the trench. These linkages serve an analogous purpose to the cross-over or "X" type linkages described elsewhere herein in other "folded-over" pillar examples.

Truncation of the left and right ends of the now completed structure of FIG. 714 can now be accomplished by using such means as a protective mask overlying the shown region of FIG. 714. Gaps in this masking exist on the tops of the regions to the left and right of the ends of this shown region of FIG. 714. Vertical directional etching away of the regions to the left and right of the protective mask by such means as RIE or ion milling then removes the structural regions below these exposed (mask gap) regions to the depth desired. The resulting trenches thereby created then truncate the left and right ends of the region shown for the structure of FIG. 714. These trenches may be closed out with an insulator such as silicon dioxide or silicon nitride, followed by removal of the top (planar) deposition portions of this coating where desired. Or, they may be filled with a flow on material such as hardened liquid polymer or spin-on-glass, for example.

A and B trench corresponding hole contacts on pillars which lie beside one another in the axis orthogonal to the axis of pillar pair extension can be connected so as to configure these pillars as side-by-side pairs, rather than as end-to-end pairs such as those previously discussed which extend in the aforementioned axis of pillar pair extension. In this side-by-side case, the A trench corresponding holes and B trench corresponding holes will lie beside one another in the bit line extension axis. Conventional lithography can be used to form cross-over or "X" connections to link such side-by-side pillars together, thereby pairing them in what is in this case the bit line axis, rather than in the aforementioned axis of pillar pair extension. Alternatively, sub-lithographic techniques, such as the cross-over ("X") interconnection methods described elsewhere herein, can be used to make such an interconnection if the portion of the pillar (or intervening regions between pillars) in the vicinity of such a connection has been appropriately extended and insulated in accordance with the nature of the cross-over connection method selected, using conventional or sub-lithographic patterning techniques, for example.

In the foregoing pillar structures with internal vertical holes, it should be noted that adding extra height to the top pillar layer can facilitate fabrication of selective plugs in the pillar tops. Such plugs can be formed by closed out depositions of different selectable materials, thereby allowing processing of a desired vertical trench etched hole, but while not processing one or more other vertical trench etched holes, where such processing is accomplished by selectively etching away a particular material capping a particular vertical trench etched hole. The various selectable materials described near the beginning of this specification can be used in this manner, for example. Also, such other materials as aluminum oxide or diamond like carbon may be used for this purpose. Where selective ion milling is used to remove a cap, use of sub-diamond carbon depositions deposited by conventional means can provide a useful low etch rate selectivity difference.

Vertical holes which are trench etched down in pillar tops can be laid out in other patterns besides the ones previously described, in accordance with engineering preference.

It is also useful to fabricate "folded-over" pillar types (as in the preceding discussion) with two-transistor-high pillars, rather than three-transistor-high pillars. In this case pull-up resistors may be spliced down to desired conventional circuit junction locations using additional holes and the splice techniques described elsewhere herein. Alternatively, such splice connections can be made using concentric splices, where the outer concentric splice conductors contact lower conductive depositions above the planar surface, and the middle splice conductors contact progressively higher conductive depositions above the planar surface. Such conductive depositions would of course be spaced apart with insulative depositions. Conventional or sub-lithographic patterning methods can be used to make progressively smaller holes in the progressively higher insulative layers, so that only the smaller cross-section concentric conductors are progressively contacted by progessively smaller concentric stacked vias.

GATES: The circuit of the pillar structure of FIGS. 455, 456 and 457 can be modified to form various other circuit types by changing the vertical wiring, C trench wiring, and any other desired variations in the transistor sequence. An example of such a modification would be any of various logic circuits, such as the following NOR gate structural variation.

The pillar structure of FIGS. 455, 456 and 457 may be shortened to comprise just layers 6P through 13N. The vertical wiring of the A trench may then be modified using the various vertical wiring and splice techniques discussed elsewhere, so as to place gate structures next to layers 7N and 12P, and then to link these gates together with a splice or similar vertical wiring connection. B trench wiring may be modified in a similar manner, so as to place gate structures next to layers 7N and 10P, and then linking these gates together in the same manner as the linkage connecting the gates just described in the A trench. In this example, the lowest layer 6P would be part of the substrate which would be grounded, and the highest layer 13N would be connected to B+, either through C trench wiring which would exist on one side of the pillar only (by lithographically or sub-lithographically masking so as to make only every other C trench unmasked for processing, for example), or through lithographically connected wiring at the top surface. If wiring in the A and B trenches is processed as in the steps leading to FIGS. 455, 456 and 457 so as to etch it back from the sides, thereby leaving it not abutting or shorting to the trenches (such as the C trench) on either side of the pillar, then bus wiring can be placed in the C trench (C1) on one side, and a C-like trench (C2) on the opposite side may be used for an additional splice or vertical wiring link. If this approach is used, then both of these trenches (C1 and C2) may be filled with a removable filler structure such as that shown in the steps leading to the structure shown for FIG. 271, thereby allowing processing of the A and B trenches as separate vertical trench etched holes. These holes may be selected for processing by capping and uncapping as shown for the A and B trench processing prior to FIG. 271, or by opening an closing the tops of these holes by lithography or by alternative sub-lithographic techniques. Likewise, the trenches C1 and C2 may be opened and closed for processing by masking, such as lithographic or sub-lithographic masking, so as to make them selectably available for processing as well. When the C2 trench wiring link is desired, it would be wired so as to ohmically contact both layers 8P and 9N, and then connect them to the top surface for additional connection by lithography or other means to provide a gate output connection. Splices or other vertical wiring links to the A and B trench vertical wiring, respectively, provide NOR gate input connections to the top surface, which in turn may be contacted by lithographic or sub-lithographic means, for example.

Alternatively, the above NOR gate can be fabricated using the variation on the structure of FIGS. 455, 456 and 457 described elsewhere herein, where the vertical wiring for the A and B trenches is constructed inside two separate vertical trench etched holes etched into a pillar. In this case a third vertical trench etched hole can be used for the vertical wiring described above for trench C2. For such a pillar structure with three vertical wiring holes, C trench bus wiring can be formed around the perimeter of the pillar, or this perimeter region can be filled with insulator and the B+ contact made to layer 13N at the top by lithographic (or sub-lithographic) means. The vertical wiring in such three vertical trench etched holes in the middle of the pillar can be contacted at the top by lithographic means or other means described elsewhere herein. Other gate types, as described below for example, can also be constructed by this alternative holes-within-a-pillar approach, as well.

If the dopings of layers 6P through 13N are changed to the opposite types (i.e. the layers then become 6N through 13P, and if the B+ and ground contacts are reversed (or if the structure is layered out in an inverted configuration), then the NOR gate structure described above can serve a NAND gate function. Alternatively, both NAND and NOR gates can be fabricated near one another on the same wafer or die by adding an extra layer at the top (or alternatively an extra bottom layer version can also be configured), where this extra layer is of the opposite dopant type of the layer below it. In such a case, wiring for the NOR gates can be on the lower group of layers as before, but with a splice or other wiring structure to connect to B+ at layer 13N. Wiring for NAND gates can be offset one layer up, so as to create the equivalent NAND gate wiring pattern as described above, but with an appropriate splice linking to layer 7N for its power connection, for example. As an alternative approach, separate layer groups or sub-groups can be dedicated to different logic structures, where desired according to engineering preference.

MEMORY PERIPHERY COMPONENTS, LINE DRIVERS: If pillars at the periphery of a cell array are initially masked so that their planar cross-sectional aspect ratio is increased in the axis extending away from the array, then transistors on such pillars will be able to conduct significantly increased power. When it is desired to fabricate line drive transistors at a fine or sub-lithographic pitch which corresponds to and aligns with the pitch of the pillars in a fine or sub-lithographically pitched cell array, transistors (particularly the upper transistors) of such aspect ratio increased pillars may be used for this purpose. Once gates are fabricated on such pillars by the same techniques where FET gates are fabricated elsewhere in this disclosure, then splice and other mentioned vertical wiring techniques can be used to link to such FET gate layers on one narrow face end of the laterally extended pillar, and to link to a lower source/drain layer at the other narrow face end of the laterally extended pillar, while the mid-region of the exposed top of the laterally extended pillar is exposed for a third electrical contact. If a top layer of insulator is used to extend such splice end contacts upward, then this top layer can be masked and etched away in the mid-region of the top of the extended pillar so as to expose the conductive source/drain material beneath it. Once these three contact regions have been created at each end and in the middle of the top of the extended pillar, then parallel planar lithographic lines running orthogonal to the extension axis of the pillar can extend across many successive extended pillars, so as to contact gates, sources and drains of all the extended pillars in a side-by-side group. Where the trench regions between the adjacent laterally extended pillars' faces are filled with planarized insulator, then this sequence of contacts can successfully link a large group of laterally extended pillars which are above the lithographic limit in the lateral extension axis, but below the lithographic limit in the non-extended (narrower) lateral extension axis. Any in line (over and under) single axis wiring which extends in the pillar lateral extension axis can be severed along its length in the orthogonal axis by any sub-lithographic masking and etching techniques used to fabricate the pillars. When FET gates are formed only on the wide side or sides of the pillar using the side (horizontal) etch-back techniques which led to the wiring structures of FIG. 457 (as with FIGS. 292 through 301, for example), then the prior C trench type wiring or splice techniques may be used on one of the remaining narrow faces, and extended to or repeated on subsequent adjacent narrow faces, so as to provide electrical contact for sub-channel bulk regions in such FETs. Such driver pillar structures can be fabricated, above the lithographic limit in at least one axis for example, at varying pillar widths, and then linked (with splice techniques described elsewhere herein for example) so as to amplify one another, in cascade relationships for example.

Using the pillar internal vertical trench etched hole configuration described for the internal vertical hole pillar variation described elsewhere herein, laterally extended holes inside laterally extended pillars can be used for an analogous surface area increasing—and hence power increasing—effect. Additional supplemental vertical holes added within such a pillar structure can be used for splice contacts to lower layers where desired, in a similar manner to other internal vertical hole pillar structure bit and word line splice contact examples described elsewhere herein.

MEMORY PERIPHERY COMPONENTS, SENSE AMPLIFIERS: It will be noted that the circuit structural layout described in FIG. 2 and embodied in the FIGS. 455, 456 and 457 group contains most of the elements of a signal sense amplifier. If the CMOS latch sub-structure in the middle of the greater structure is appropriately precharged in a conventional manner, then enabling the upper and lower access transistors can cause the latch portion of the circuit to assume the state of charge of the first signal to which it is exposed, in the conventional manner of a conventional bi-stable signal sense amplifier for a semiconductor memory. If no other cells on a bit line are selected, then application of appropriate pre-charge signals to the bit lines (from structures such as the line driver structures described above) can pre-charge such a latch structure, where its access transistors can connect it to such a pre-charged bit line when desired. Subsequent selection of a cell on the bit line can cause it to place its signal on the bit line so as to cause this sense amplifier latch structure to assume the state of the selected cell, according to the polarity of the signal from the cell. Pillars for such latch structures may be laterally (planar axes) lengthened or narrowed for electrical effect according to engineering preference.

MEMORY PERIPHERY COMPONENTS, LINE SELECTION DECODING: In some cases rows and columns of pillar cells will have lateral (planar axes) dimensions greater than or equal to half the available minimum feature size (lithographic groundrule associated resolution limit). Often lithographic location precision (registration) is considerably better than this resolution groundrule. In such cases, adjacent rows or columns patterned at the lithographic limit will typically be spaced apart at twice the pillar width, due to the need to pattern intervening trenches between pillars. In such cases, lithographic lines which are at the lithographic limit may be placed over a row or column of cells where the pillars and trenches are each sized greater than or equal to half the lithographic limit. In such cases, where these lithographic lines are centered over a row or column of pillars, then each such line will overlap half a trench width to either side of the row or column of pillars. Because of this, patterning at the lithographic limit can be used in such a case to resolve selection of a desired row or column. Therefore, in such a case, masking for selection of underlying contact points for decoder line coding and selection can be accomplished with available lithography. Row or column pillars and trenches may be somewhat less in width than half the lithographic resolution limit. In such cases, sidewall deposition masks (as with the ribbon group masking structures described elsewhere herein) can be used to achieve finer effective resolution for creating image type masking for line encoding and selection of lines and traces or features, where such sidewall depositions are on otherwise sufficiently accurately registered lithographic mask lines which have vertical sidewalls.

VERTICAL WIRING SPLICE AND "U" BASED ALTERNATIVE INTERCONNECTS: Linkages can be configured to electrically connect regions at one height on a trench wall to other regions farther away, such as regions at similar or different heights across a trench. In the fabrication of decoders and other structures, vertical wiring splice structures (as discussed elsewhere herein) can be used to link lower sources or drains of vertical transistors up to higher connection points closer to—or at—the planar surface. This is a particularly useful method to implement where such vertical transistors are already located conveniently near the planar surface. Insulative and conductive depositions for such splice structures can be directionally deposited at an angle, so as to deposit on the sidewall of one transistor on one side of a trench, but so as to not deposit on (to be shadowed by) the sidewall of the adjacent transistor on the opposite side of the trench. This can be done using the directional deposition shadowing techniques described elsewhere herein. The higher ends of such vertical splice connections can then be laterally linked on the uninsulated side of the splice to the shadowed and hence uninsulated side (conductively exposed) sources or drains of adjacent transistors, where such linkage points are above a chosen piston height. This can be done by such means as fabrication of "U" shaped conductive linkage structures formed above suitably high polymer pistons for example, or by other means in accordance with engineering preference, so as to link such vertical transistors and their associated vertical wiring circuitry laterally in a planar axis to an electrical contact point to the side of the splice wiring. ("U" shaped linkages by themselves inherently link regions across a trench, where these regions are at or within a range of comparable heights.) Any extensions of such "U" shaped linkages—or other conductive structural artifacts—must of course subsequently be severed by such means as vertical trench etching in the axis orthogonal to the extensions of such "U" structures, so as to prevent shorting to other conductive structures located to the sides. When vertical transistors formed and connected in the foregoing manner are laterally displaced from one another at a minimal planar pitch, the use of such "planar dense" vertical transistors and vertical wiring in this manner creates an unusually high lateral (planar) density of functioning transistors along such a comparatively short circuit linkage path.

SHORTENING TRANSISTOR FEATURES: Masks made from sub-lithographic side depositions (such as the aforementioned ribbon masks) may be used to define features in the planar axes where these features are below the lithographic limit. This allows defining gate lengths which are unusually short (in a first axis) or unusually narrow (in a second orthogonal axis), or defining sides or ends of sources and drains which can make these structures unusually short as well. One technique for accomplishing this is to use selected spacings in a ribbon mask (with the ribbon thicknesses selected according to engineering preference for the size of the underlying structure), where these open spacings define trenches to be etched below. These trenches then limit the extremities of the dimensions (the widths or lengths) of the features which underlie the masking ribbon, while using the masking ribbon to protect the underlying structure. Trenches (which can be filled later with insulator) are then etched between the protective mask ribbons, where these trenches are located so as to cut off the ends of the underlying structure at the selected points. In this manner, a source and/or drain can be shortened (at the ends of the transistor, in the length axis) below the previously available feature definition size, or portions of a transistor can be cut off in an orthogonal (width) axis so as to narrow it below the previously available feature dimension. These techniques allow reducing gate length with respect to width so as to reduce channel resistance, or reducing source and drain footprint dimensions so as to reduce source and drain diode surface area in a well, for example.

TRANSISTOR PLANAR LAYOUT: When transistors are fabricated with the above technique, they can be arranged in convenient repetitive patterns which allow more convenient contact to subsequently added planar wiring structures. For example, 6-transistor SRAM cells (as in FIG. 1) may be conveniently laid out with the four latch transistors in a close-packed 2×2 arrangement (i.e. two side-by-side above two more side-by side) with all transistors extending source-gate-drain in a first (nominally vertical) orthogonal axis (sources can be exchanged for drains if desired). This layout may be combined with axis transistors extending out to the sides in a second (nominally horizontal) orthogonal axis, where these axis transistors may extend out and away from the nominally vertical (planar axis) midpoint of the first 2×2 transistor arrangement in accordance with engineering preference. Such an arrangement permits wider bit lines to then be patterned, where these bit lines run nominally vertically (planar axis) while contacting the axis transistors at the nominally left and right extremities of each cell layout. Nominally horizontal word lines can also be patterned to extend nominally horizontally above the middle of the cell layout. Selection of other layout patterns for these or other structural layout and wiring configurations can then be made for variations on this theme, or for other circuit types, in a similar manner, as desired according to engineering preference.

FOLDED PILLAR TRANSISTOR: Vertical pillar transistor N—P—N or P—N—P structural sequences can also be folded into “U” shaped structures, using only two active alternating dopant layers (not counting any substrate diode blocking where used). In this structural type, in an N—P—N example, an N over P pillar can be partially cut down the middle so as to sever the upper portion into two smaller side-by-side N pillars, where such severing extends down past the N—P junction somewhat into the lower P layer. (The reverse would be true for a P—N—P example.) Using RIE trench etching techniques to cut into the pillar as described, conventional selection of gas mixtures, etc. can be chosen so as to cause the bottom of the middle of the “U” structure being formed to be more rounded or more angular in character. A more rounded structure here can have advantages in controlling fringe field effects in a gate subsequently formed in this middle notch of the “U,” where this is desired in accordance with engineering preference. Such a gate can be formed by thermal oxidation of this region, followed by deposition of conductive gate layer material such as doped polysilicon, followed by any of the previously described piston-and-sleeve fabrication methods of creating insulators and vertical wiring, as desired in accordance with engineering preference. In the N-P-N example this would leave an N source and an N drain on top, and either an exposed conductive middle gate region, or such a gate region connected to vertical wiring which in turn would be contacted from above.

3-D SOI TRANSISTOR STRUCTURES: As in the “Improved Substrate Isolation” example discussed elsewhere herein, pillar transistors can be isolated from one another by vertical repetition of the cut-away and insulator-fill isolation process discussed elsewhere, or in a variation as follows. The intervening gap region between two pillars should first be filled with a selectable material, for example a hardened liquid polymer. As another alternative, the intervening trench walls (and typically the trench bottom) may be coated with some other more durable selectable material, such as silicon dioxide or silicon nitride as in the prior C trench examples (see FIG. 136 and subsequent), and then filled with hardened liquid polymer or Parylene or some other material with a high etch selectivity. When the surface above these pillars and gap fills is masked, and the wafer processed, so as to etch or open trenches (by any selected conventional means) on the exposed sides of the pillars which are not abutting the intervening gap region fill material, then the sides of the pillars in these open trenches are exposed and available for masking by the aforementioned sidewall masking techniques (such as in FIGS. 244 through 246). The vertically extending gaps in such sidewall masks can then be used to etch gaps or cut-aways into the side of the pillar. When such an etch continues all the way through the pillar, certain alternately doped regions may be isolated from other alternately doped regions. In this manner, alternately doped groups forming source, channel region and drain, emitter-base-collector, or other semiconductor doping structure sequences can be fully electrically isolated from one another in the manner associated conventionally with SOI (silicon-on-insulator). Among the other benefits of SOI structures possessed by these now isolated doping structure sequences, when these doping structure sequences form the sources, channel regions and drains of CMOS transistors, then latch-up conditions are inherently eliminated between such CMOS transistor doping structure sequences. This type of processing can be done multiple times, at multiple heights, for multiple transistors or groups of transistors.

SOURCES AND DRAINS WITH REDUCED CAPACITANCE: Using the preceding pillar transistor isolation methodology, pillar transistors may also be modified so as to reduce the junction contact area between sources and/or drains and the alternately doped bulk region which incorporates the channel region in an FET. By cutting partially through the horizontal junctions separating source or drain from the bulk region in a vertical transistor, such junction contact area can be reduced proportionally to the depth of the cut. Alternatively, a single mask opening can be used to expose the source side of the junction, this mask opening then continuing on (up or down) to the drain side of the other junction in the FET, for a similar effect as long as the cut is not so deep as to unsuitably cut too deep into and degrade the channel region. Subsequent to these operations, a second intervening fill support region (of a similar type to the first intervening fill which is currently holding the transistors in place) must then be created in the open region where these cutting (etching) processes occurred, and then the first intervening fill must be removed so as to facilitate further processing of the then exposed gate regions, etc.

HEAT REMOVAL: Cooling for transistor circuit structures can be enhanced by depositing thermally conductive material (such as aluminum) in the interstices of trenches, in the manner of the aforementioned vertical wiring, but with sufficient thickness to suitably thermally conduct the desired heat flow vertically up or down out of any trench region which contains this "vertical wiring" type thermally conductive material. Alternatively, as described in the following discussion, Peltier cooling techniques can be used to carry the thermal energy up or down so as to cool the region near the Peltier cooling junction, and release the heat at the related Peltier heating junctions higher or lower on the wafer where it can cause less of a problem. Peltier cooling junctions can be formed using bismuth telluride, or with semiconductor materials such as the silicon used in the structure examples in this disclosure. Metals such as the tungsten or aluminum depositions used previously can be used here as well. Such metals can be deposited in the manner of the previously described vertical wiring, where the vertical wiring contacts to the subsequently described "U" shaped pillar tops, for example, to act as Peltier metal-to-semiconductor heating junctions.

Where two adjacent semiconductor (such as silicon) pillars (or portions of such pillars) are formed by partially etching a trench in the middle of what would otherwise have been a single pillar, this can create a "U" shaped pair of pillar-like structures which are connected at the bottom. When this initial structure is suitably doped to form one side of a Peltier junction, then a portion of the pillar-like structure on one vertical extension of the "U" or the other can be processed by pillar vertical mask diffusion techniques so as to cause it to attain suitable doping to function as the opposite doped portion of the Peltier junction structure now being formed. When suitable Peltier metal contacts are made at the top extensions of such a "U" (as previously described for example), then the thus created lower junction can serve as a heat sink for the hot junction of the Peltier cooling arrangement, and the upper metal junctions can serve similarly as Peltier cooling arrangements.

If a substrate and pillars are doped so as to be the same doping type, P for example, then the upper portions of such pillars can be doped during their epitaxial fabrication, or alternatively by pillar sidewall diffusion techniques, so as to make the upper portions of such pillars of the opposite doping type (N in this case). Using the diffusion method, trenches next to different pillars can be selected by such means as lithographic masking and unmasking, or other techniques discussed herein, so as to allow setting the opposite dopant type (N here) diffusion masks at different heights, thereby allowing Peltier cooling junctions to cool in different locations at different heights where desired. Metal Peltier heating junction contacts must be added at the upper ends as previously described to enable the Peltier effect there. Where the substrate is the same dopant type as the lower portion of the pillars, then metalization on the lower portion of the substrate can serve as a Peltier heating junction. If the substrate is not the same dopant type, or otherwise not linked to the lower portions of the pillars, then vertical wiring type metal junctions can be fabricated at the bottoms of the pillars to form Peltier heating junctions there as well. Such an arrangement can redirect heat to different levels in the upper wafer structures where it can be dissipated more effectively than at the heat source. Where the substrate is of the dopant type to act as the lower portion of the Peltier junction structure, forming the Peltier cooling junction at the bottom of the pillar can place it very low in the structure (in this case the metal contact would be at the bottom of the substrate). Metal contacts at the tops of the pillars can be by simple deposition when only the tops of the pillars are exposed (as a result of masking and unmasking techniques, for example).

Pillars can be extended upward further above the wafer surface by adding additional layering of appropriately doped silicon to facilitate the Peltier effect (such as epitaxy, selective epitaxy or polysilicon) and patterning such material by conventional methods, or various of the other techniques described herein.

Pillars can be subjected to opposite dopant diffusion by the sidewall diffusion methods discussed herein, by masking so as to make vertically elongated diffusions of an opposite dopant type, where these diffusions extend vertically up and down the pillar. This creates a vertical junction running up and down the middle of the pillar. Where the top of the pillar was covered by a dopant resistant mask (for example silicon dioxide) during the diffusion process, then either side of the Peltier junction exists and can be contacted at the top of the pillar, rather than further down it, by the vertical wiring type junction contact technique, thus placing Peltier heating junction contacts as high on the pillar as possible. Cooling in this case occurs down the Peltier junction below the top heating junctions. Vertically trench etching down the middle of this pillar along the Peltier junction can lower the cooling region further down the pillar, below the bottom of such a trench.

Pillars described here for use in Peltier cooling can be fabricated so as to extend horizontally as walls, or as geometric wall patterns, as desired in accordance with engineering requirements.

LIQUID PISTONS: Where pistons are set to prescribed heights, materials which can be deposited as flowed-on liquids may also be used, and may be sufficiently more convenient to use so as to be preferred by the fabricator. An example of such a suitable liquid piston material would be the conventional "SU-8" material used commonly for photolithographic masking in micromachining applications, but in this case preferably without the photosensitizer included in it for simplification of the fabrication process. Thinning this material enhances its ability to more quickly penetrate small trench holes in the structures described herein. Extreme or "ultra" thinning is preferred where the trench structures are very small. This material levels well and typically eliminates any of its own bubbles during baking. Solvents of low volatility are preferred, such as gamma butyrolactone (commonly called "GBL") or N methylpyrollodine (commonly called "NMP"). Such a flow-on piston material is preferably used by: (1) conventional resist flow-on type of application, (2) conventional baking, and (3) selective omni-directional etching sufficiently to etch the resulting piston structures down to their intended heights. Later removal of the pistons is by use of conventional selective etchants for removing such photoresists. Such a hardened (baked) liquid polymer material may be used in applications called out herein where pistons are defining masking or other height related operations, where other top-to-bottom fills with Parylene are called out, or where liquid fill operations are otherwise called out.

SUB-LITHOGRAPHIC MASKING: Several techniques are described herein which allow fabrication of gate structures below the lithographic limit. Such structures can facilitate fabrication of gates which are shorter, and hence wider in aspect ratio, than otherwise possible by conventional lithographic methods. Such short (and hence "wide") planar gates can be patterned with a masking line whose width defines the short axis of the gate, where such a masking line is formed in the manner of the ribbon group mask structures described elsewhere herein. In such cases, the thickness of the mask line portion of the ribbon groups is selected to match the underlying gate structure to be patterned. Such thicknesses of mask lines in ribbon groups can be selected so as to overlie ends of sources and drains or other transistor structures in a second orthogonal axis so as to shorten or narrow them below the lithographic limit. Such sublithographic planar structures can also be defined by depositions which are deposited at an angle on one side only of conventional planar lithographic mask lines. Such depositions are created by angular depositions (by columnar or long throw sputtering, for example) directed (at 45 degrees, for example) so as to coat one side of a selectably removable vertically sided masking line (made of photoresist, for example), but so as to shadow the other side of the removable masking line, followed by vertically etching away the exposed top and bottom horizontal surfaces of the deposition, before selectively etching away the removable masking line.

SELECTIVE ION MILLING: When performing vertical single directional etches, selective ion milling can provide an alternative to other methods such as reactive ion etching (RIE) when appropriate materials for this purpose have been chosen. For example, carbon depositions etch very slowly in typical ion milling situations. Si and silicon dioxide, for example, normally etch 5 to 10 times faster. GaAs typically etches faster yet. Pb and Sb typically etch about 10 times the rate of Si. Bi etches almost 3 times faster yet. Depositions of these materials can be used where a slower etching material masks a faster etching material, thereby providing a means of masking for vertically directional dry etching. Such selective ion milling techniques can be used where appropriate as an alternative to other masking and vertical etching techniques called out in this disclosure, and for other applications for semiconductor or other structures as well.

FLOATING GATE STRUCTURAL VARIATIONS: For applications such as flash memory, floating gate field effect transistor structural variations can be constructed by modifying the side wall gate FET structures disclosed herein. When a polysilicon vertical side wall gate layer is patterned by means described elsewhere herein, this layer may be deposited thick enough to allow for further thermal oxidation on the exposed side of the layer. This thermal oxidation (and also the initial thermal oxidation below the polysilicon layer) is performed so as to create insulative layers of appropriate thickness above and below said polysilicon layer. This is done so as to permit said polysilicon layer to serve as a floating gate, once the top, bottom and sides of each such floating gate layer has been patterned by the gate layer vertical and side patterning techniques described elsewhere herein. The shape of such floating gate layer can be the same as the shape of the control gate structure to be formed above it, or it can be of an alternative shape according to engineering preference, where, for example, a variety of conventional floating gate to control gate layout relationships are used in different flash memory applications. (Alternatively, an omni-directional deposition of a selectable insulator such as silicon dioxide can be used instead of the thermal creation of the oxide insulation layer.)

Alternatively, another type of conductive gate layer deposition such as tungsten can be deposited instead of the aforementioned polysilicon layer. In such a case, other methods of insulator deposition such as CVD or ALD can be used to create gate insulation layers instead of the thermal oxide, where desired according to engineering preference. Patterning of such an alternative layer is by conventional selective etching means equivalent to means used to pattern the polysilicon.

Such a floating gate structure is completed by the aforementioned control gate layer structure being fabricated above it by similar fabrication means. This control gate may be fabricated from polysilicon, or from an alternative conductive material such as tungsten (as described above). The shape of such a control gate can be the shape of a gate layer described for a transistor elsewhere herein, or the shape may be chosen in accordance with engineering preference where, for example, a variety of conventional floating gate to control gate layout relationships are used in different flash memory applications, as previously indicated.

LIGHT PIPES: Buried side wall structures are described elsewhere herein which serve as conductive word lines. Buried in-trench structures are also described elsewhere herein which serve as conductive power busses (B+ and B−), where such structures are formed in the C-trenches and extend horizontally along said C-trenches at different vertical levels. As an alternative, the conductors of such side wall and in-trench structures can be replaced with a transparent material such as silicon dioxide or Parylene, for example Such silicon dioxide structures can be surrounded by opaque or reflective materials such as tungsten or aluminum, such materials replacing or cladding the surrounding materials called out in the descriptions of such side wall or in-trench structures. This creates horizontally extending transparent strips along the trench side walls, or U-shaped strips within the trenches, where these strips are surrounded with material which will confine any light present to the transparent material composing said strips. The combination of each such cladding and each such inner transparent material comprises a light pipe. Openings in such cladding at ends or along such light pipes provide access regions where light can enter and leave such a light pipe. If such light pipe structures are fabricated adjacent to P—N junctions or other semiconductor structures fabricated by conventional means so as to emit light when active, then such light can enter such access regions. Alternatively, placing such access regions next to semiconductor laser structures can also perform this function. Such access regions can be placed next to conventional silicon light sensing structures which can sense when such light emitting means are active or not. In this manner, such light pipes can conduct light signals below the planar surface of the semiconductor wafer. Such light pipes can be stacked above one another in the manner of the vertically stacked word lines and power busses described elsewhere herein.

SELECTIVE TUNGSTEN SIDE WALL WIRING: When the vertical transistor structures described elsewhere herein are fabricated on the side walls of holes (rather than on pillars), then vertical wiring for one (or more if vertically stacked) transistor(s) can be formed by creating a conductive plug in the middle of such a hole once windows have been opened at desired locations in an insulative wall coating (as described elsewhere herein). Such a conductive plug can be formed by first directionally depositing a selective material such as tungsten vertically down the hole (by such means as collimator sputtering), so as to coat the bottom of the hole as well as the side walls. Setting a piston of Parylene or of flow-on-polymer (FOP) (as described elsewhere herein) near the bottom of the hole, followed by selectively etching back the tungsten above this piston, can then be followed by growing selective tungsten up from this seed plug. (Selective tungsten processing is such as commercially available from Ulvac Technologies Inc., 401 Griffin Brook Drive, Methuen, Mass. 01844—Japanese product.) This creates a tungsten plug which extends from the bottom of the hole to the top, where this plug provides vertical wiring of any side wall region(s) where window(s) have been etched in the insulative wall coating.

In a hole which has been created between two pillars, this same technique can be used to vertically wire between windows on both opposing pillar faces simultaneously. Alternatively, a "U" of a first selectable material such as Parylene can be deposited so as to coat the sides and bottoms of a trench or hole, and the exposed horizontal surfaces of this coating vertically etched away. The inner portion of this "U" is then omni-directionally coated with a selectable insulator such as silicon dioxide, where this coating is in turn filled with a material such as FOP. This FOP is then etched down slightly, followed by depositing additional selectable insulator material (silicon dioxide in this case) to close out in the FOP recess, and then vertically etching away the exposed silicon dioxide layer which is coating the other top surfaces, but not all of the closed out plugs. Subsequently etching away all (or the upper part) of the now top exposed vertical Parylene coating then opens trenches or holes (depending on the starting configuration) which can be processed by the foregoing tungsten seed plugs and following selective tungsten plugs, thereby vertically wiring the respective sides of the trench VERY FINE WIRES: A very thin layer of conductive material (doped polysilicon or tungsten for example) is deposited on a planar surface of insulator (silicon dioxide for example). Or alternatively, a very thin layer of doped crystalline silicon may be grown over a planar insulator surface such as sapphire or ion impregnated silicon dioxide (SIMOX). Ribbon group masks are then formed (as described elsewhere herein) above such conductive material from selectable material pairs such as Parylene and silicon dioxide, for example. The ribbon group masks comprise alternating very thin layers of the chosen selectable materials. One of the selectable materials in the ribbon group masks is then selectively etched away, leaving the other ribbon group mask material layers standing. These standing ribbon group layers serve as a mask which is then used to vertically etch the very thin layer of conductive material below this mask. This leaves a pattern of very thin parallel conductive wiring traces extending horizontally below the aforementioned mask, after which the mask may be selectively etched away. Ribbon group material may be deposited by such means as CVD, or atomic layer deposition (ALD) techniques to achieve extremely thin layers.

MAGNETIC AND PILLAR MASKING APPLICATIONS: A very thin layer of magnetic material, such as a conventional iron oxide layer of the type used on magnetic disk surfaces, is deposited on a planar surface. Conventional alloys of iron and platinum or cobalt and samarium are examples of alternative magnetic disk materials for deposition on said planar surface. Such magnetic material may be selected for magneto-resistive, giant magneto-resistive, spin valve, or other memory storage enhancing characteristics, but in any event is a medium which relies on changes of magnetic state as a factor in such memory storage. Such states in small local regions are accessed and written or read by a sensor, where said sensor may be scanned over the surface by conventional means, so as to access a plurality of such regions on the surface.

A first patterning option is as follows: Ribbon groups are then fabricated on top of this surface of magnetic material, where the strips of such ribbon groups extend in parallel straight lines which extend in a single axis. When the intervening ribbon group material is etched away so as to leave a ribbon group mask composed of the remaining ribbon group material, then the ribbon group can serve as a mask made up of strips which extend in a first axis. Vertical etching of the exposed planar surface by such means as ion milling or RIE then transfers the pattern of this ribbon group mask down to said magnetic material layer on said planar surface. The ribbon group mask is then removed by such means as selective etching or chemical-mechanical polishing, leaving said lower magnetic material layer patterned according to the pattern of said ribbon group. The magnetic material layer may be partially etched, or etched through entirely. This leaves strips of said magnetic material which form lines. When the strips of these ribbon groups are of sub-lithographic width, then these lines of magnetic material are also of sub-lithographic width. Small regions of these lines may then be written to or read from by said sensor.

This first patterning option can also be used to form a mask over a material which need not be magnetic. Such a material (aluminum oxide, silicon nitride, silicon dioxide, FOP or Parylene, for example) can be used as a mask below which silicon wall structures can be created by trench etching.

A second patterning option is as follows: A second upper layer of ribbon groups may be fabricated on top of the aforementioned (hence first or lower layer) ribbon groups, where said second (upper) layer ribbon groups extend in an axis orthogonal to said first (lower) layer ribbon groups. When the intervening ribbon group material is etched away so as to leave a ribbon group mask composed of the remaining ribbon group material, then the combined orthogonally extending ribbon groups can serve as a mask made up of strips which extend in orthogonal axes. Vertical etching of the exposed planar surface by such means as ion milling or RIE then transfers the combined pattern of this ribbon group masking down to said magnetic material layer on said planar surface. The ribbon group masking is then removed by such means as selective etching or chemical-mechanical polishing, leaving said lower magnetic material layer patterned according to the pattern of said combined ribbon group masking. The magnetic material layer may be partially etched, or etched through entirely. This leaves small square or rectangular regions of said magnetic material which form an array or matrix of such small regions. When the strips of one or both ribbon groups are of sub-lithographic width, then these small regions of magnetic material are also of sub-lithographic width in one or both axes. These small local regions may then be written to or read from by said sensor.

This second patterning option can also be used to form a mask over a material which need not be magnetic. Such a material (aluminum oxide, silicon nitride, silicon dioxide, FOP or Parylene, for example) can be used as a mask below which silicon pillar structures can be created by trench etching.

A third patterning option is as follows: The ribbon groups of the first patterning option can be fabricated in a disk shaped pattern of concentric planar rings, rather than extending in a single planar axis (in straight lines). In this patterning option, concentric planar rings are created by lithography, and then the ribbon groups are fabricated on the sides of these rings. By using the same step sequence as in the first patterning option which created ribbon groups on the sides of lithographic single axis extending lines, in this third patterning option these ribbon groups are thus formed in the pattern of concentric rings. By continuing the steps of the first patterning option for this new concentric ring pattern, this leaves strips of said magnetic material patterned in concentric rings. When the strips of the ribbon groups are of sub-lithographic width, then these strips of magnetic material are also of sub-lithographic width. Small local regions along these strips may then be written to or read from by said sensor, where said sensor can remain temporarily stationary over a given ring, and the planar surface can be rotated below the sensor around the center point of the concentric rings.

A fourth patterning option is as follows: A second layer of ribbon groups may be fabricated on top of the aforementioned (hence first or lower layer) ribbon groups described for the third patterning option. The ribbon groups of this second layer extend radially outward from the center point of the lower layer's concentric rings, although they preferably are not continuous from said center point to the outer periphery of the overall pattern. Preferably, such radial lines are themselves grouped in a plurality of concentric rings. The outer such upper layer concentric ring preferably contains many more radial lines than the inner such concentric ring. In this patterning option, concentric rings of radial traces are first created by lithography, and then the ribbon groups are fabricated on the sides of these radial traces. By using the same step sequence as in the second patterning option which created ribbon groups on the sides of lithographic single axis extending lines, in this fourth patterning option these ribbon groups are thus formed in the pattern of concentric rings of radial traces. By continuing the steps of the first patterning option for this new pattern of rings of radial traces, this leaves said magnetic material patterned in concentric rings of radially interrupted traces. When the strips of the ribbon groups are of sub-lithographic width in one or both axes, then these radially interrupted concentric rings of magnetic material are also of sub-lithographic width in one or both axes. Small local regions along these radially interrupted concentric rings may then be written to or read from by said sensor, where said sensor can remain temporarily stationary over a given ring, and the planar surface can be rotated below the sensor around the center point of the concentric rings. Lithographic patterning and etching may used to etch thin concentric rings which remove the aforementioned pattern where ribbon groups loop around between ends of radial lines pairs, if it desired to remove these regions. When the small local regions are sufficiently small so as to be the size of one such concentric ring between two adjacent radial divisions, particularly where the aforementioned ribbon structures are fabricated significantly below the contemporary lithographic limit, then these small local regions of magnetic material can benefit from reduced susceptibility to superparamagnetic effect.

Other pattern variations besides the aforementioned straight lines, concentric rings, and their orthogonal and sectoring supplemented cross-patterns can be fabricated as well. However, these are the preferred patterns.

Ribbon groups for these magnetic layer structures, as well as for other applications, may be formed by atomic layer deposition techniques and materials to create thinner layers. Likewise, thin thermal oxidations of silicon depositions can be used to create thinner side wall vertical layers, although such side wall layers are preferably not closed out, but instead closed out with a material other than thermal oxide. For example, after the tops and bottoms of a thermal oxide layer have been etched away in the step sequence creating a ribbon group, the region between opposed thermal oxide side wall layers can then be closed out with a fill of flow-on polymer (FOP). Alternatively, a further omni-directional deposition of a non-thermal oxide selectable material such as silicon or Parylene may used, for example, or other deposited materials may be used according to engineering preferrence.

Stencil-type masking structure and method: As an alternative fabrication option, a layer of selectively etchable material such as silicon may be coated with a thin layer of further selectively etchable material such as Parylene. (A thin layer FOP is another option, for example.) Patterning means such as discussed in the aforementioned four patterning options can then be fabricated on top of this Parylene. In this case the patterning structure (patterning means) should include interspersed wider structures additional to the patterning option features previously described, these wider structures being defined by the original masking on the sides of which the ribbon groups were created. For example, the orthogonal patterns previously described for the first and second patterning options can include additional wider solid lithographically defined traces at regular intervals in each orthogonal axis. Or, the circular patterns described for the third and fourth patterning means can include additional wider solid lithographically defined concentric ring traces at regular intervals, these rings being centered on the common center point for the previously described concentric rings. Associated with these rings, additional wide radial traces can extend out from the center point, as well. These wider structures can be thickened by protectively masking the thinner ribbon group structures with photoresist, then depositing additional material over said wider structures exposed in gaps photolithographically created in this masking, then lithographically patterning this additional thicker material so as to vertically thicken these wider structural regions. These wider structures can enhance structural support.

Once such a patterning structure has been created, then the underlying Parylene (in this example) layer will be exposed on the top through the gaps in the top ribbon group patterning. The patterning structure is preferably connected by such means as common deposition material to a secondary mechanical means of support, such as a surrounding mechanical ring which is resting on the lower surface below the Parylene. The Parylene is then exposed to a selective, preferably gaseous, onmi-directional etchant such as isotropic oxygen RIE. This Parylene then etches away first under the thinner patterning, before it subsequently etches further under the wider patterned structural support regions. This then allows the Parylene to be etched away entirely where it is under the general vicinity of the thinner patterning, but only to be etched in a little from the sides into the regions under the wider structural support patterning. A selective, preferably gaseous, omni-directional conventional etchant selective for silicon then etches away the exposed tops and sides of the silicon below the Parylene. This frees the upper patterning structure from the lower surfaces, but with the Parylene still coating the bottom of this patterning structure to serve as a standoff layer. This creates a stencil-type planar masking structure comprising the earlier mentioned thinner patterning which is spaced above any lower surface by the thickness of the Parylene standoff layer.

This stencil-type masking structure is then positioned by suitable mechanical means over a surface to be patterned, such as a silicon dioxide coated silicon wafer, or a magnetic surface layer as previously described. If the stencil-type masking structure is constructed from silicon dioxide, then when a vertical directional deposition of a suitable selectable material such as silicon is deposited down toward the masking structure, then this deposition will coat primarily the tops of the masking structure and the regions below the mask openings in the pattern previously described for the selected one of the four patterning options. This depostion should be of a thickness less than the thickness of the Parylene standoff layer. The stencil-type masking structure can then be mechanically removed from the surface being coated, and subsequently cleaned with a conventional selective etch to remove the unwanted silicon deposition remaining on it. This leaves islands of silicon on top of the lower layer which can subsequently serve as a vertical etch (such as RIE or ion milling) mask of the lower layer material. Patterning the lower material in this manner creates a similar effect to one of the aforementioned four patterning options. The silicon islands may either be eroded away in the process of the vertical etch, or may be subsequently removed by a conventional selective etchant. The stencil-type masking structure may then be reused.

The pattern produced by such a stencil-type mask can be converted to a negative image, as follows. The islands produced below such a mask (silicon islands in this case) can be covered with a hardenable liquid coating such as FOP or spin-on glass (SOG), where this coating is then etched down to a height which exposes the tops of the islands. The islands are then selectively etched away leaving the surrounding material which has holes now where the islands originally were. This new coating now takes the form of a negative image of the original mask image.

A stencil-type structure of this type can also be used as a filter, for example, to filter photoresist used in the fabrication of integrated circuit structures such as those mentioned herein. Dimensions of holes in such a filter can be determined by control of the relative thicknesses of open interstices between walls of the stacked ribbon groups. The pattern of such a structure can alternatively be transferred down to a lower layer of material, where such structure is initially used as a stencil-type mask as previously described. This pattern image may be made negative as previously described, as desired. The deposition or other coating thus patterned can be used to as a mask, or to etch holes in a lower layer to be used as a mask, where such lower layer may be formed over an etch selectable layer beneath it, such as a Parylene layer. Such lower Parylene can be etched away in the manner previously described, thereby releasing the patterned layer above for use for a desired purpose, such as a filter.

POWER TRANSISTOR VARIATION: Pillar transistor structures are described elsewhere herein with planar cross-sections which are rectangular, although they may also have circular cross-sections with gates surrounding the circumference of the pillar. As well as by fabricating parallel gates on opposite sides of a single pillar while sharing common source and drain, gate width can be increased by extending a pillar's rectangular cross-sections in one axis. Gate width can be increased further by patterning the pillar planar cross-section in convolved shapes, or fingered shapes such as an "E" shape. When using sublithographic patterning techniques it is possible to expand gate width by patterning an array of pillars with an "E" shaped cross-section, as follows:

A first ribbon mask is created in a first axis where masking lines are created over the three (in this example; more or less can be used) lateral extensions of what will become an "E" shaped cross-section. A second ribbon mask is created above said first mask, this second mask extending in a second orthogonal axis, where masking lines are created over what will become the uprights of the "E" shaped cross-section. Before the intervening layers of the aforementioned two ribbon masks are etched away to create the gaps for etching between the masking lines, a supplemental pair of ribbon mask layers is deposited above the first two mask layers, these two additional ribbon masks being created as follows: The first of these supplemental masks has openings extending between the various "Es" is the first axis. The second mask has openings extending between the various Es" in the second axis. These two supplemental masks are then used to vertically etch the lower two stacked ribbon masks by such means as ion milling, thereby patterning these lower masks as an array of "E" shaped masks. If the upper two masks are made of appropriate selectable materials, then the lower masks can be etched by such means as RIE. These lower "E" shaped masks are then used to etch vertically stacked source, bulk and drain layers into "E" shaped planar cross-sections. Preferably the top source or drain layer is coated with a metal such as tungsten to reduce resistance between distant locations around the "E" shape. Likewise, the bottom layer is preferably severed by a further etch down from the upper mask pair pattern, where below a diode block (as described elsewhere herein) has been created above the bottom of such an etch down. Further processing of these "E" shaped structures then proceeds as with the rectangular pillar structures to create transistors.

The "E" shaped cross-sections of the preceding structures are preferably fabricated with thick uprights and fingers which are subsequently etched back so as to encourage rounding of the corners, thereby reducing potential for fringe fields at corners. The preceding "E" shaped structures can be modified so that the fingers of the "Es" extend to opposite sides of the "E" upright, rather than just to one side as described above by configuring the ribbon masks accordingly.

CMOS VERTICALLY-STACKED PILLAR TRANSISTORS: Vertically stacked source, bulk, drain and lower diode block layers are described elsewhere herein as being created from alternately doped epitaxial layers. When such layers are fabricated into first groups of parallel or otherwise interleavable walls which will be subsequently processed to become pillar transistors, second groups of walls can be created such that a second wall is created in each trench between each of the first walls. These second walls can be created such that the stacked layers comprising these second walls are of opposite doping patterns, or of other doping patterns alternative to the adjacent first walls. In a configuration where such first walls are, for example, 4 microns high by 1 micron wide with a thin silicon dioxide protective capping layer on the tops of the walls, and with intervening trenches 4 microns wide, then different walls can be created in these trenches as follows: A 1 micron deposition of epitaxial silicon of a dopant type opposite that of the substrate is grown over the exposed wall tops and sides and trench bottoms. The interstices of the remaining open trench regions are then filled with FOP which is etched so as to leave the tops of the wall epitaxial coatings exposed, but the trenches filled. Selectively vertically trench etching down the exposed vertically extending silicon side wall epitaxial coatings, followed by any necessary omni-directional overetch to ensure complete removal of such side wall coatings, followed by selective etching away of the FOP, leaves a bottom layer protruding up from the middle of each trench. Each such bottom layer is to become the bottom of a wall being built up by further processing. Subsequent repetitions of this epitaxial deposition, fill and etching sequence add successively higher layers to the growing wall. (Each vertical trench etch continues down as low as the original vertical trench etch.) When these epitaxial layers are of the same thickness as the layers of the original walls, and when they are also of opposite doping polarity to the layers of the original wall, then they can be used to form the initial pillar structures of complementary transistors to those formed from the original walls. In such a case, subsequent processing of the sides of both wall types at the same time can be used to fabricate gate layers and wiring on such transistors.

Alternatively, the aforementioned trenches can be coated with a deposition of silicon dioxide, for example, and the exposed tops and bottoms of this coating etched away, leaving the additional protective top caps of silicon dioxide not entirely etched through, these top caps being thick enough to support this. Successive selective epitaxial layers can then be grown up, seeded from the trench bottom, in a pattern similar to the preceding pattern, for a similar result. The silicon dioxide side wall and top coatings can then be selectively etched out so as to separate the new and old walls from each other. Thicker silicon dioxide side wall and top coatings facilitate achieving the previously described wall dimensions.

With either of the above alternative approaches, fewer vertically stacked epitaxial layers can be used than previously discussed, followed by side wall diffusion techniques for creating sources and drains above and below gates and underlying bulk regions, as described elsewhere herein. Multiple such structures can be stacked, where each successively higher structure is of opposite doping type to the structure just below it.

SUB-LITHOGRAPHIC CONTROL OF ACCESS TO SELECTABLE HOLES: Pillar structures containing one or more vertically wired internal holes are described elsewhere herein. The cross-section of such a pillar can be disproportionately extended in one planar axis. More than one such hole can be located in one (or more) line(s), where such line(s) of holes extend along this pillar axis of extension. Before creation of the subsequently described wall and before vertically wiring, these holes are filled with a selectable hardenable liquid such as a flow-on polymer (FOP), such as photoresist or a similar material. This FOP is planarized even with the hole tops.

A vertical wall of a highly selectable material such as aluminum oxide is fabricated next to the top of such a line of holes, such that the bottom of this wall is approximately at the height of the tops of one or more pillars. This wall extends in a planar axis orthogonal to the aforementioned axis of extension of pillars and holes. This wall can be fabricated by lithography, or by coating the side wall of a lithographic trace with aluminum oxide by such deposition means as directional sputtering directed at an angle down and toward the side of the trace wall. Any remaining aluminum oxide coating the exposed horizontal surfaces is then vertically etched away. Etching of the aluminum oxide can be by such vertical etch means as ion milling.

The exposed FOP in the holes is etched down to a first height, which will typically be shallow with respect to the overall depth of the holes. The now empty tops of these holes are then filled with a vertical directional deposition of an etch selectable material, silicon dioxide in this case, deposited by such means as long throw or collimator sputtering. The vertically measured thickness of this deposition is such that the material in the hole tops is even with the tops of the holes. Supplemental aluminum oxide side wall deposition step: An omni-directional deposition of a selectable material such as additional aluminum oxide is deposited (by ALE or other conventional means), and the exposed tops and bottoms of this deposition are vertically etched away, so as to leave a supplemental vertical wall of aluminum oxide on the side of the aluminum oxide wall. The position of the original aluminum oxide wall and the thickness of this additional aluminum oxide deposition are chosen such that the bottom of this resulting supplemental aluminum oxide wall coating covers the top of the first hole to the side of the aluminum oxide wall.

Silicon dioxide hole top cap step: The silicon dioxide now exposed to the side of this supplemental aluminum oxide vertical wall coating is then selectively etched away from the tops of the pillars and from within the tops of the exposed holes. The now exposed FOP in the remaining holes is then selectively etched down a little more. The now empty tops of these holes are then filled with a vertical directional deposition of an etch selectable material, silicon dioxide in this case, deposited by such means as long throw or collimator sputtering. The vertically measured thickness of this deposition is such that the material in the hole tops is even with the tops of the holes.

The prior supplemental aluminum oxide side wall deposition step, and subsequent silicon dioxide hole top cap step, can then be sequentially repeated until each successive hole is capped with a successively deeper silicon dioxide top cap.

The original aluminum oxide wall, supplemental aluminum oxide side wall coatings, and accumulated silicon dioxide residual top coatings beneath the supplemental aluminum oxide are then removed. Removal may be by coating with a hardenable liquid such as FOP, planarizing this liquid by such means as CMP, followed by ion milling the top structures down to the height of the pillar tops. Alternatively, the top structures may be planarized by polishing with chemical supplement where desired. (Either of these planarization techniques may typically be used wherever planarization or CMP for this purpose is required elsewhere herein.)

Subsequent selective etching of the top cap material (silicon dioxide here) first exposes the lower fill in the hole with the shallowest top cap. This exposed hole is then processed, to create vertical wiring for example. Hole processing is completed by filling the hole with a selectable material such as FOP which has been planarized and etched down to the height of the top of the hole. This FOP is then etched down to a height which is lower than the depth of any of the prior silicon dioxide top caps. Each such exposed hole is then top capped in the manner of the aforementioned silicon dioxide hole top cap step, but this time with a deeper top cap (due to the lower FOP hole fill height) than any of the original top caps formed in the earlier step sequence, this deeper top cap designating this hole as completed, followed by planarizing the top to remove the silicon dioxide above the hole as before.

Process loop: Selective etching of the top cap material (silicon dioxide here) subsequently exposes the lower fill in each pillar hole with the next shallowest top cap. This exposed hole is then processed, to create vertical wiring for example. Processing of this next hole is completed as with the prior hole, by filling the hole with a selectable material such as FOP which has been planarized and etched down to the height of the top of the hole. This FOP is then etched down to the same height as in the prior completed hole. Each such exposed hole is then top capped in the manner of the aforementioned silicon dioxide hole top cap step, but this time with a deeper top cap (due to the lower FOP hole fill height) than any of the original top caps formed in the earlier step sequence. Planarizing the top to remove the silicon dioxide above the hole is done as before.

These process loop steps can then be sequentially repeated until each successive hole is processed and capped with a deep silicon dioxide top cap. If the top surface was not planarized to remove the extra silicon dioxide after each oxide deposition step, it can then be planarized at this point by such as the previously indicated means, down to a height just below these deeper top caps, thereby exposing the vertical wiring or other structures beneath.

An alternative method is as follows: The original wall (aluminum oxide in the preceding steps) is created. Prior to the first supplemental aluminum oxide side wall coating being created, all holes whose tops are still exposed are processed together (identically) to create the internal hole structure desired for the next hole to the side of the current wall side. After this processing these holes are filled with FOP, and this FOP is planarized down to the tops of the pillars as before. Then the following process loop is performed:

Process loop: The next supplemental aluminum oxide side wall coating is added. Then the remaining holes are etched open and the internal structures selectively etched away from the side walls of the holes. These remaining holes are then processed to create the structures desired for the next hole to the side of the extended width of the aluminum oxide wall. After this processing these holes are filled with FOP, and this FOP is planarized down to the tops of the pillars as before. This process loop is then repeated until all the successive holes are processed as desired.

SELF-ALIGNED VERTICAL TRANSISTORS: As described elsewhere herein, pillar structures can be fabricated which contain one or more stacked vertical transistors. The pillar layers with different epitaxial dopings for each such transistor can be separate layers for source, bulk and drain regions. Alternatively, in the following sel-aligned example, a region which is a single uniformly epitaxially doped pillar layer can be created and used for each such complete transistor, with a doped such region (layer) of alternate dopant type for each such successively stacked complementary CMOS transistor, for example. In such a case, each such uniformly doped pillar layer can serve a function analogous to a conventional planar doped well structure, where source and drain regions of opposite dopant type to such uniformly doped region are diffused into the side of said pillar. (Such diffusion can also be performed into the sides of such regions on the sides of holes formed within pillars, where this optional structural variation is used.) Side wall doping of such a uniformly doped region by diffusion can be accomplished for applications where such uniformly doped region is exposed either on the side or sides of a rectangular pillar, on the exterior surround of a round pillar, or on the interior surround of a hole within a pillar. The following example describes such structures for diffusion doping and associated functions:

Gate structure: The side wall is thermally oxidized to a suitably thin thickness for a gate insulator, and a layer of conductor such as polysilicon (tungsten is an option) is omni-directionally deposited over this thermal oxide. A thick outer layer of silicon dioxide is then omni-directionally deposited by such means as CVD (or optionally created by thermal oxidation of the polysilicon), so as to coat the exposed outer side wall. Piston and sleeve masking (as described elsewhere herein) is used to vertically mask and etch this outer silicon dioxide layer and underlying polysilicon layer. This masking is located so that the resulting segment of these two layers then extends just above and just below the desired top and bottom ends of a first underlying gate conductor being formed (using FOP piston with silicon nitride sleeve, for example). Additional higher up gate conductors can subsequently be formed if desired An omni-directional selective etch of the exposed upper and lower ends of the thus sandwiched polysilicon layer is then performed, while the gate insulator silicon dioxide layer protects the other surfaces. A thin omni-directional deposition of silicon dioxide is then deposited so as to close-out in the newly created gap where the ends of the polysilicon layer was etched back between the inner and outer silicon dioxide layers. Silicon dioxide is then etched back by timed etch, so as to remove the non-closed out portions of this new layer, while also removing the thermal oxide gate insulation layer extension, where it is not underlying the polysilicon gate layer or the closed out regions just added. (Alternatively, the exposed ends of the polysilicon gate conductor layer can be thermally oxidized to achieve the effect of the aforementioned close-out) This leaves the thermal oxide gate insulation layer under the gate and under the etch-protected closed-out segments in the gap region where the etched back polysilicon ends had been. Also, these closed-out segments, the gate polysilicon conductor layer, and the outer silicon dioxide layer covering them remain as well. Multiple gate structures of this type (preferably increasingly higher up the stack) can be masked and otherwise patterned by piston and sleeve just after the initial gate structure polysilicon and outer silicon dioxide coatings are patterned, followed by the subsequent steps which create the closed out gap regions, etc. The following step sequences then start on the vertical region where, in the case of a vertical stack of transistors, it is desired to form the lowest transistor, and progress upward to higher transistors:

Create vertical window masking for drain and source diffusion: At this point in the fabrication sequence, a gate structure coated with silicon dioxide exists, roughly vertically centered, on the side wall of each differently doped layer where a transistor is to be formed. The silicon dioxide of these gate structures can be used as vertical diffusion masking. When this vertical diffusion masking is supplemented by additional silicon dioxide vertical masking between these gate structures, then windows (vertical gaps) between said gate structures and said supplemental silicon dioxide vertical masking can serve as diffusion mask openings. These diffusion mask openings are then used to locate diffusions from various diffusion source layer segments, where these layer segments are fabricated so as to overlie said mask openings, as follows:

A layer of silicon nitride (the "inner" layer) is omni-directionally deposited, so as to protectively coat the side wall and the gate structures along it. This silicon nitride layer is then patterned from bottom to top by such means as piston and sleeve masking (FOP piston, silicon dioxide sleeve for example), so as to leave silicon nitride layer segments over the gate structures. These layer segments are patterned so as to extend just above and just below the upper and lower ends of each gate structure on the side wall. An outer layer of silicon dioxide is then omni-directionally deposited, so as to coat the side wall and the now silicon nitride coated gate structures along it. An outer layer of silicon nitride is then omni-directionally deposited, so as to coat said silicon dioxide outer layer. This outer layer of silicon nitride is then patterned from bottom to top by such means as piston and sleeve masking (FOP piston, silicon dioxide sleeve for example). This outer silicon nitride layer is patterned so as to create protective layer (masking) segments which overlie portions of the outer silicon dioxide layer, where these outer silicon dioxide layer portions will become the aforementioned supplemental vertical masking between the gate structures, located appropriately so as to create the previously described diffusion windows. The portions of the outer silicon dioxide layer exposed by the gaps in the outer silicon nitride layer mask are then selectively etched away. The exposed outer silicon nitride layer portions remaining over the now created supplemental silicon dioxide vertical masking segments, and also the now exposed inner silicon nitride layer portions protecting the silicon dioxide coated gate structures, are then selectively etched away. This leaves the previously discussed gate structures and intervening supplemental silicon dioxide vertical masking segments on the side wall. The windows (vertical gaps) between these alternating gate structures and masking segments are thus available for use as diffusion mask openings as previously described.

Drain (or source) preparatory step sequence (i.e. the drain or source structure abutting the lower end of the gate): A layer of silicon nitride is omni-directionally deposited, so as to coat the side wall. This silicon nitride layer is then vertically patterned, repeatedly from the lowest to highest same type transistor, by such means as piston and sleeve (FOP piston, silicon dioxide sleeve for example). This patterning is such that, for each transistor being patterned, a short window extends downward below the gate structure, this window being of the height desired for each drain (or source) being formed for the current step group dopant type and amount. The upper end of said window starts a little below the lower end of said polysilicon gate conductor, and the rest of such window continues further down to create a mask opening of suitable height to diffuse the drain (or source) being formed in subsequent steps. A layer of a suitable dopant source, such as phosphosilicate glass (PSG) or borosilicate glass (BSG), is deposited so as to coat the exposed side wall. This dopant source layer is then vertically patterned from bottom to top by such means as piston and sleeve (FOP piston, silicon nitride sleeve for example). This patterning is performed so as to leave layer segments contacting the silicon side wall through the open windows (vertical gaps) in the silicon dioxide, and in the supplementary masking overlying silicon nitride layers. The silicon nitride sleeve and now exposed silicon nitride layer portions which were beneath the dopant source layer are selectively etched away.

Source (or drain) preparatory step sequence (i.e. the source or drain structure abutting the upper end of the gate): A layer of silicon nitride is omni-directionally deposited, so as to coat the side wall. This silicon nitride layer is then vertically patterned, repeatedly from the lowest to highest same type transistor, by such means as piston and sleeve (FOP piston, silicon dioxide sleeve for example). This patterning is such that, for each transistor being patterned, a short window extends upward above the gate structure, this window being of the height desired for each source (or drain) being formed for the current step group dopant type and amount. The lower end of said window starts a little above the upper end of said polysilicon gate conductor, and the rest of such window continues further upward to create a mask opening of suitable height to diffuse the source (or drain) being formed in subsequent steps. A layer of a suitable dopant source, such as phosphosilicate glass (PSG) or borosilicate glass (BSG), is deposited so as to coat the exposed side wall. This dopant source layer is then vertically patterned from bottom to top by such means as piston and sleeve (FOP piston, silicon nitride sleeve for example). This patterning is performed so as to leave layer segments contacting the silicon side wall through the open windows (vertical gaps) in the silicon dioxide, and in the supplementary masking overlying silicon nitride layers. Unless this is the last dopant source layer deposited before diffusion, then the silicon nitride sleeve and now exposed silicon nitride layer portions which were beneath the dopant source layer are selectively etched away.

The preceding drain/source and source/drain step sequences are repeatable for higher transistors up a stack. Appropriate opposite dopant types for opposite epitaxially doped bulk layers higher up such a stack are used as required.

Diffusion: At this point any high temperature sensitive material such as FOP is ensured etched away. The structure is then heated suitably so as to cause the desired diffusion of dopant, from the PSG/BSG dopant drain and source layer segments, into the portions of the pillar, through the aforementioned short windows, so as to create the desired drains and sources next to and underneath the gates. Said dopant drain and source layer segments are then selectively timed etched away, leaving one or more complete vertical transistors.

Vertical wiring: Vertical masking by such means as piston and sleeve (FOP piston, nitride sleeve for example) can then be used to open windows in the silicon dioxide coating over the gate conductor layers of successively higher transistor gates. Vertical wiring techniques can then be used to contact such now exposed gate conductor layers, as well as the now exposed drain and source regions.

ETCH TIMING: Note that all etches herein should be timed as necessary to produce the indicated results.

LITHOGRAPHIC CROSS-CONNECTIONS: When the sides of a pair of rectangular side-by-side pillars face the respective sides of another pair of orthogonally adjacent side-by-side pillars across an intervening trench, and when each side of each such pillar which faces the trench has an insulated vertical wiring trace extending up such side to the top of each such pillar, then when the tops of said pillars are themselves coated with insulator, the upward extending vertical wiring traces can be selectively contacted by conventional lithographic planar wiring fabricated on and above the pillar tops. A particularly useful connection of this type is a cross-connection, or "X." The first trace of such a connection connects the vertical trace on the side of a first pillar face of a pair across the filled and planarized trench, over to the vertical trace which is on the pillar face opposite the pillar paried with the first pillar. A second trace, above and insulated from the first trace connects the other two pillars' vertical wiring traces across the trench in a similar manner. Vias may be used to allow such a second trace to reach down to contact the exposed tops of the vertical wiring traces.

Alternatively, such a cross-connection can be fabricated sublithographically.

PISTON RESHAPING: Under some etching conditions pistons used for defining vertical features can develop "U" shaped meniscus-like upper surfaces. Such surface deformations can reduce the precision of reference for subsequent etching.

When the tops of such pistons are reasonably near the top of a trench (especially when exposed wall height is less than the trench width), the tops of such pistons can be subjected to angular etching by material (piston) selective RIE (or selective ion milling), where such etching is directed off the vertical axis it can then have a more perpendicular angle of incidence to one side or the other of such a "U" shaped piston top. Such angular etching can be used to remove upward extending sides of such "U's." Tops of trench walls can be used to shadow such directional etches so as to shield the relatively flat middle portion of such "U's" from etching, further concentrating the etchant toward the sides of the piston tops. Such shadowed directional etching can further be used to cause the sides of the pistons to be lower than the centers of the pistons.

"U" shaped piston tops in deeper trenches can be exposed to directional deposition (such as by sputtering) of a selectable material vertically down the trench. Such a deposition will typically coat the sidewalls and the bottom of the trench. More deposition can result in the middle of the bottom of the trench than on the walls, where necked-in upper wall coatings can cause the side regions of the piston top to shadow more than the middle. Subsequent timed omni-directional etch back can leave a remainder of such deposited material in the middle of the "U." Subsequent selective etching of the piston material can then leave the middle of the piston masked by the deposition, but with the sides of the piston top etched by the etchant so as to etch away at the "U" upward extending sidewalls, thus leaving a flatter piston top with closer to orthogonal junctions with the trench walls. Also, when vertically directionally coating the interior of a "U" in a trench, more deposition can be made to occur in the middle of the "U" due to an orthogonal angle of incidence, rather than on the sides of the "U" due to a lower angle of incidence on such sides. Such an uneven deposition pattern can then be omni-directionally timed etched back to leave a similar remainder of material in the middle of the "U." The aforementioned following steps can then be performed to flatten the piston top using such a deposition remainder as a mask in a similar manner as the above step sequence.

PILLARS WITH HOLES, CLARIFICATION AND EXPANSION: The pillar side wiring and related sidewall structures shown for the A and B trenches leading to the structure of FIGS. 455, 456 and 457 can also be fabricated inside of trench etch created vertical holes using the same process step sequences. For such a case, a pillar can be masked so as to trench etch holes which extend vertically down from its planar top surface into the interior region of the pillar. It will be noted that the wiring and insulation overlay pattern that runs up and down a face of a pillar, such as that shown for the A or B trenches, was formed by first processing the side walls of a vertcial hole, such as the unmasked or exposed hole of the A trench or hole of the B trench. Thus, alternatively, holes trench etched into the interior region of a pillar can be sequentially unmasked and processed following the A or B trench hole shown process step sequences, thereby resulting in a wiring and insulator pattern inside each such vertical hole (in a pillar which contains one or more such holes) which matches the interconnectivity and function performed by the sidewall wirng shown in FIG. 457 for the A or B trenches. When a pillar is fabricated with one such internal corresponding vertical hole for the A trench wiring, and an additional such internal corresponding vertical hole for the B trench wiring, and if such a pillar is layered with dopings to match the FIGS. 456 and 457 pillar layers, then such a pillar is wired inside its interior region equivalently to the side wiring shown for the pillar of FIG. 457. In such a case where the word lines end up formed enclosed by their respective internal (hence non-extending) vertical holes, they can be wired (connected) up to the top surface by adding a splice connection (as described elsewhere herein) which contacts the non-extending word line structure. The upper ends of such word line splice connections can then be connected to conventional planar word lines by conventional masking and via connections. The top of the highest layer in the pillar (the upper bit line layer) can be contacted by conventional masking and via connections to conventional bit lines. C trench "U" shaped wiring and insulating stacked layers can be formed following the fabrication sequence described for the C trench processing which led to the C trench structures shown in FIG. 456. However, in this internally wired pillar example, the C trench can be treated as surrounding the pillar on all sides, rather than extending in a single axis. In such a case, where the C trench surrounds all four pillar sides, the lower bit line will be unable to extend outside the region of the bottom of the pillar. An additional hole trench etched in the top surface of the pillar can extend down to reach this bit line layer (2P in this case), and an insulated splice connection (a described elsewhere herein) can contact this bit line layer, and then extend up to the top surface of the pillar where the conductive portion of the splice can be connected to conventional bit lines by conventional masking and via interconnection methods. Conventional planar lithographic techniques can be used to contact the tops of various upward extending conductors. Alternatively, fabrication processing for the word line structures can be deleted from the aforementioned A and B internal pillar vertical holes, and fabricated instead in their own respective additional trench holes which are etched down from the top surface of the pillar. Particularly in the case of the lower word line connection (at layer 3N here), adding an additional vertical hole can remove the word line splice contact upper wiring extension from undesirably overlapping the other structures along the vertical extension of the pillar. However, in the prior example where word line and bit line might have shared the same vertical hole and such overlapping was the case, sufficient standoff insulation deposited and appropriately patterned underlying the splice conductive wiring can prevent electrical interaction between such word line splice wiring and the underlying structures (such as bit lines or FET gates). If upper and lower word line gate control structures are fabricated in the same vertical hole, then a splice connection can link both of these gate control structures together before continuing to extend up to a top surface contact.

A pillar cell structure with internally wired vertical holes can be constructed in a planar layout configuration where its vertical holes are laterally positioned one after the other, in a line. Thus, a pillar can be configured where its planar axis width is just wide enough to accommodate a single vertical hole, while its planar axis length is extended sufficiently to accommodate multiple vertical holes. When such a pillar incorporates four internal vertical holes in a line (planar view), then one such trench etched vertical hole can be used for the aforementioned A trench vertical wiring, one for B trench vertical wiring, one for bit line vertical wiring, and one for word line vertical wiring.

INCREASED GATE FIELD: In the previous pillar transistor discussion regarding "Sources And Drains With Reduced Capacitance," a vertically extending etched out region ("cut") was described. This cut region was fabricated by conventional means such as timed etch, etching the pillar material exposed by a single mask opening which started at the source side of the junction between the source and channel/bulk region, with this mask opening then continuing on (up or down along the axis of the pillar) along the sub-channel bulk region, and on to the drain side of the other junction of the FET pillar transistor. This cut was preferably not so deep as to unsuitably cut too deep into and degrade the channel region. When the underside of a transistor (i.e. what is traditionally thought of as the bottom of a planar transistor, but in this case actually the far side of the pillar from the gate region on a vertical pillar structure) is cut away in this manner, then the bulk region below the region where the channel is formed can be effectively removed, leaving only a thin layer in which the channel will form between source and drain regions when said channel is created by appropriate electrical signals. Such a transistor structure thus has a minimally thin channel region combined with the benefit of thicker remaining source and drain regions which hence have substantially lower resistance than they would if they were as thin as the channel region.

Gate insulation layers may be oxidized or deposited so as to suitably cover the exposed remaining bulk region where channels will be formed on each side (i.e. both sides) of the remaining bulk pillar portion, and gate structures can be then fabricated over these insulation layers by means such as described elsewhere herein. When such second etched out region is near enough to the other (first side) channel region (i.e. the remaining intervening channel section of the pillar is sufficiently thin), then under appropriate electrical conditions, electrical activation of such gate structures on either side of said intervening pillar section can draw up channels which will superimpose on one another to varying degrees, depending on such considerations as the gate voltage and/or the channel region thickness, for example. Such opposed and hence supplemental gate structures can increase the gate induced field along the channel. By thinning the intervening channel region to the point where the two channels substantially superimpose, then the resulting “single” channel can be brought up under more desirable electrical conditions such as reduced voltages, for example.

Electrical connection to the bulk region “fourth FET terminal”: If gate conductor structures are fabricated from etch-selectable different materials from the bulk material (tungsten, for example), then when the non-gate, non-wired sides of the pillars of such pillar transistors are exposed along the sides of a trench, such as exposed to the C-trench shown in FIG. 16 to the left of the pillar structure, then the gate conductor materials can be etched back from these sides, along with the exposed sides of any associated etch-selectable wiring, where desired, as described elsewhere herein for etch-back of side wiring. Filling these selected etched-out side-facing voids with closed-out insulator, followed by selectively etching back the subsequently exposed such insulator on the sidewalls of such intervening trench as described elsewhere herein, then exposes the gate side rather than the gate area (both sides if such trenches are on both sides) of the aforementioned channel region material (i.e. the bulk remaining between the source and drain portions of the transistor is exposed). Such exposed channel region (bulk) material can then be electrically contacted by structures such as the C-trench U-shaped power distribution traces shown completed in FIG. 351 by means analogous to those shown for that figure, suitably connected to appropriate power polarity. Alternatively, splice wiring fabrication techniques described elsewhere herein can extend connections to such channel region bulk material extensions up or down the pillar, and such wiring can be separated by lithographic or aforementioned sub-lithographic patterns trench etched down from masking on top of the wafer. Alternatively, such bulk regions can remain electrically floating (i.e. with “no fourth terminal”).

This double-gated type of structure can also be fabricated by alternative means. For example, the pillar containing the transistor can be etched from a top mask that is thin enough in the channel depth axis to make the whole pillar as thin as the previously described channel region (preferably this would be a sub-lithographic mask). By exposing the source and drain regions to gaps in vertical masks of the masking types previously described, thin source and drain regions on such a pillar can be grown larger by selective epitaxial deposition. Alternatively, layer depositions of polysilicon can coat sources and/or drains, such layers effectively thickening such source and/or drain regions, and then these polysilicon layers can be patterned by vertical patterning techniques described elsewhere herein.

Pillars containing one or more transistors can also be fabricated using top masking for the pillar cross-section, where this cross-section is thin (as above) in both planar axes, rather than thin in just one planar axis. Such a thin pillar structure can have gates formed in full-surround rather than just on one or two sides of the pillar. In such a case, source and drain regions would preferably be made larger/thicker by the aforementioned source and drain expanding techniques.

Temporary trench fill support regions as described elsewhere herein may be used on opposite sides of pillars being processed as above to contribute supplemental support to pillar structures being fabricated.

MAGNETIC PILLAR STRUCTURE VARIATIONS: The access transistors shown in FIG. 457 at 20P-19N-18P and 4P-3N-2P, along with associated bit and word lines, can be used in various controlled electronic access applications. One example of this would be to place the structure associated with 4P-3N-2P below a memory element, for example a magnetic memory element, as follows:

The lower layers which become the pillars can be limited to just layers 1N through 4P. Pillar transistors comprising just the 4P-3N-2P pillar layers and the associated horizontally adjacent structures shown in FIGS. 455, 456 and 457 can then be constructed in accordance with the disclosed fabrication steps associated with just those structures. An additional top layer of a fill material (such as a conveniently etch-selectable insulator like Parylene, or alternatively silicon dioxide or silicon nitride) can then be deposited to a suitable thickness so as to facilitate the following structures. This insulator is then masked and patterned (with conventional silicon dioxide masking, and ion milling or directional oxygen RIE, for example in this case) so as to create trenches in this insulator which run along the tops of the aforementioned lower pillar structures in one of the two orthogonal trench axes of the pillar pattern. One wall of such a trench (the wall for deposition) is aligned with one side of the pillar. The other opposing trench wall may be offset from the opposing side of the pillar so as to facilitate sufficient deposition angle for the following directional deposition. A coating of a material suitable for the exchange layer of a conventional spin valve sensor (such as FeMn as used in magnetic disk drive heads) is then directionally deposited to a suitable Parylene trench sidewall thickness (110 Angstroms for example) at an angle, by such means as collimated or long throw sputtering via such means as DC magnetron. Then the exposed horizontal surfaces of this coating are vertically directionally etched away by directional etch such as ion milling. This exchange layer is deposited suitably so as to magnetize the adjacent pinned layer (which is to be subsequently deposited) in a direction that is 90 degrees to the subsequent operational current flow in this magnetic spin valve element being created. This trench sidewall angle deposition and vertical etch away process is then repeated for subsequent layers of materials suitable to form a spin valve conductive structure analogous to that of a spin valve disk head. In this example, a subsequent pinned layer of Co (22 Angstroms thickness for example), then an intervening non-magnetic electrically conductive layer such as Cu (25 Angstroms thickness for example; a conventional insulator, preferably thinner, can be used as an option to permit conduction by tunneling instead), followed by a thin layer (10 to 200 Angstroms for example)

of ferromagnetic material suitable to disk drive media, such as CoCrTa, CoPtCr, or CoPtNi, or related conventional alloys incorporating Pt, Ta, Ir or Sm, or other suitable materials for similar effect.

The tops (upper exposed edges) of these layered coatings are then vertically directionally coated with an insulator such as silicon dioxide (by such means as collimator or long throw sputtering, or equivalent effect means here and wherever this effect is called out in this document). Each such deposition is typically followed by a clean-up etch-back of extra deposition on the side walls where such extra undesired deposition occurs. A linking directional deposition of the ferromagnetic material is then deposited at an angle so as to coat the top of this insulator top coating, and also link it to the side of the exposed top of the ferromagnetic coating which continues further down, but shadowed by the top of the adjacent wall so as to not deposit too far down the pillar. The upper surface is then masked so as to protect each pillar's upward extension which form a spin valve memory sensor, but so as to divide these (cut them apart) between adjacent pillars, with a gap between each such spin valve element. These spin valve sensor extensions are then etched (cut apart) so as to divide them in this manner. Alternatively, if the aforementioned spin valve sensor structure layers are deposited in reverse order (ferromagnetic first, exchange last), then the trench fill material can be removed, and the ferromagnetic link coating directed toward the sensor layer group side opposite the side just previously described (and shadowed on the far side, or the far side can be filled and patterned) so as to link to a ferromagnetic layer formed on such opposite side.

The trenches are filled with flow-on polymer and planarized so as to leave the tops of the pillars (which are now ferromagnetic material) exposed. The top surface of the pillared substrate is then coated with additional ferromagnetic material with a rectangular hysterisis loop, and patterned so as to extend the pillars further upward with extensions of this material. The sides of these pillars are then coated by deposition of thin insulator such as silicon dioxide. Word-type lines (which write by carrying current in opposite directions on opposite sides of the ferromagnetic layer extension) can then be fabricated in a first axis on both sides of this ferromagnetic upward pillar extension, as with the example which created the word lines associated with pillar layer 19P of FIGS. 456, 457. This process is then repeated so as to construct orthogonal axis write lines at a higher level. Alternatively, multiple such write lines can be formed at various heights along the upward extension of the ferromagnetic layers by repeating the step sequence for forming the word lines at subsequently increasing heights. Write lines, when suitably activated so as to be carrying current in each axis, in one direction on one side of the pillar, and in the other direction on the other side of the pillar, provide a magnetic field in a direction up or down the pillar of just sufficient strength (when both orthogonal axes are in combination) to reverse the magnetic flux of the aforementioned adjacent ferromagnetic pillar upward extensions, hence writing binary information to the magnetic upward pillar extensions, which then magnetically link to the lower created magnetic spin valve variable resistance elements. (Line conduction in one axis only generates an insufficient magnetic field to reverse the magnetic flux direction of such pillar extensions.)

An electrically conductive, non-magnetic top coating is deposited over the top surfaces contacting the tops of the ferromagnetic pillar upward extensions. An electrical signal applied to this top coating then follows a conduction path down through the ferromagnetic upward extension, then through the spin valve sensing element, and then through the transistor of layers 4P-3N-2P, when the word line associated with 3N is suitably activated. Activation of this word line allows current to flow out onto the bit line associated with 2P. This current varies as a result of prior writing, as a function of the variation in spin valve sensing element resistance.

The preceding structure leaves the previously described vertically layered spin valve resistance region of this pillar structure unencumbered by word lines on its side. If the exchange layer is not deposited before the subsequent layers, then this leaves the ferromagnetic and pinned layers conveniently accessible for further modification as follows: For example, if these two layers are originally made thicker, then they can be subsequently indented at sequential vertical heights on each side of this structural section by etching through successively higher vertical windows. The thickness of these layers is picked so that their thicknesses at the indents are comparable to their earlier preferred thicknesses, but so that the succession of combined vertical indents makes them appear corrugated (in side view). The exchange layer is then angle deposited on the pinned layer side above a masking piston, followed by vertically etching away its horizontal surfaces, and then etching off its upward extension using a vertical window mask. Or the ferromagnetic layer can be patterned, and the pinned layer left unpatterned. This resulting structure can then modify and increase the lengths of the available divergent paths that the electrons can take when they are proceeding ahead with spin antiparallel to the magnetic direction of whichever layer they are currently in when such layers are currently programmed for opposing magnetic directions. When such divergent paths are increased, then the effective resistance of overall path can be increased.

Or, as another option, alternating horizontal thin layers of ferromagnetic material and electrical insulator (thick enough to avoid tunneling) can be sequentially deposited above the top of the 4P layer, for example, before the trenches between the pillars are etched when the pillars are first formed. Then the pillars are etched vertically (by ion milling for example) including these layers above each 4P section. The three spin valve element main sequential vertical layers (ferromagnetic, intervening and pinned) are then directionally deposited as before, but on the side of this layered upward pillar extension. (Interstices between adjacent pillars are filled with FOP and patterned so as to make a wall first; later the spin valve layers are cut apart as in the prior example; or, the lower pillar sections can be patterned first, and then the upper structures cut apart together at the same later time.) This gives the effect of the ferromagnetic layer having horizontal lamellae which are considerably more pronounced than the corrugations of the earlier example. If the trench to the side of the pinned layer is left unmasked (open somewhat to the side of pinned layer wall, but preferably with this trench not wide enough to reach the next adjacent memory element structure) and the pinned layer is appropriately thick, then the sides of the pinned layer may be corrugated and exchange layer coated as in the earlier example if desired.

Alternatively, if the trench to the side of the original style last deposited ferromagnetic layer is left unmasked (open somewhat to the side of ferromagnetic layer wall, but preferably with this trench not wide enough to reach the next adjacent memory element structure) and the ferromagnetic layer is of the original preferred minimal thickness, then the open trench can be exposed to vertical (straight down)

directional deposition from bottom to top along the side of the vertical extension of the ferromagnetic layer, where repeated alternations of ferromagnetic layer material is horizontally layered in the trench, followed by an intervening electrical insulator layer material. Each such deposition (by such means as collimator or long throw sputtering, or equivalent effect means here and wherever this effect is called out in this document) is typically followed by a clean-up etch back of extra deposition on the side walls where such extra undesired deposition occurs. This sequence of clean-up depositions creates alternating layers which become horizontal lamellae similar to those in the prior example. Optionally, such vertically deposited lamella layers can be similarly deposited using the pinned material rather than the ferromagnetic material, and thereby create pinned lamellae in a similarly opened (unmasked) trench on the pinned layer side as well. Once the preceding example has been completed for the pinned layer side however, the subsequent coating with the exchange layer must be deposited. This is done most effectively where the underlying horizontal lamella pattern has been selected to permit optimal exposure of the lamellae (or horizontally shorter, vertically elongated protrusions) so as to cause sufficient pinning.

SIDEWALL MASK COATINGS: It should be noted herein that vertical sidewall masking coatings described elsewhere herein can typically tolerate pinholes to a degree to which these coatings are still useful. Therefore, typically such coatings can be made by techniques which are not perfectly pinhole free. This creates many opportunities where such deposition means as sputtering or other more pinhole prone methods may be used as an alternative to such typically pinhole free methods like ALD.

What is claimed is:

1. A method of fabrication for creating a plurality of adjacent lines, (a) each line of each said plurality of adjacent lines extending primarily along the path of a single axis on a plane which lies parallel to the predominant plane of a coincident or contiguous substrate, said predominant plane being considered nominally horizontal and the axis perpendicular to said predominant plane being considered nominally vertical, (b) each said plurality of adjacent lines being bounded on at least one side by the adjacent continuous edge of, optionally, material between trenches, additional pluralities of adjacent lines, or another trench or continuous structure, (c) where the location of each such adjacent continuous edge was previously the location of a trench reference sidewall, and said trench reference sidewall either was the edge of a previous associated patterning line which was a feature of a pattern defining a two-dimensional image which was transferred from a source not previously connected to the substrate, or said trench reference sidewall was trench etched down from the edge of a previous associated patterning line extending on a plane parallel to said predominant plane, (d) where said plurality of adjacent lines are created subsequent to, and at a higher spatial frequency than, patterning lines previously extending on a plane parallel to said predominant plane, (e) where, during the fabrication process, each said previous associated patterning line either was a trench, or was bounded on at least one side by a trench opening, (f) and where the horizontal location of at least one vertical sidewall of each such adjacent line in said plurality of adjacent lines is determined by a sequence of depositions forming an interlamination of layers which each have a deposited thickness which is substantially uniform where the lamination is laying horizontally, or substantially uniform where it is laying vertically, each such layer being of consistent vertical height where laying vertically, said layers being formed so as to be only conformal to the surface topography, (g) said layers being built up from and extending horizontally parallel to a single sidewall, said layers having continuous regions along this horizontal parallel extension which are vertically straight and vertically parallel to said single sidewall, each such layer covering all of any vertical face of its preceding layer or said single sidewall, the location of the face of said single sidewall coinciding with the face location of said trench reference sidewall.

2. A method of fabrication where a first plurality of adjacent lines is created as in claim 1, followed by creation of a second such plurality of adjacent lines, where these second adjacent lines cross the original locations of said first lines when viewed from above the nominally horizontal planes in which each plurality of adjacent lines extends, and where crossing trench locations between said first and second pluralities of adjacent lines are used to define locations of additional structures which are subsequently created on an adjacent plane.

* * * * *